US012243583B2

(12) United States Patent
Kimura et al.

(10) Patent No.: US 12,243,583 B2
(45) Date of Patent: Mar. 4, 2025

(54) SEMICONDUCTOR DEVICE ELECTRONIC DEVICE

(71) Applicant: SEMICONDUCTOR ENERGY LABORATORY CO., LTD., Atsugi (JP)

(72) Inventors: Hajime Kimura, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 229 days.

(21) Appl. No.: 18/011,712

(22) PCT Filed: Jul. 6, 2021

(86) PCT No.: PCT/IB2021/056024
§ 371 (c)(1),
(2) Date: Dec. 20, 2022

(87) PCT Pub. No.: WO2022/013680
PCT Pub. Date: Jan. 20, 2022

(65) Prior Publication Data

US 2023/0253034 A1 Aug. 10, 2023

(30) Foreign Application Priority Data

Jul. 17, 2020 (JP) ................................ 2020-122594

(51) Int. Cl.
*G11C 11/417* (2006.01)
*G11C 5/10* (2006.01)

(52) U.S. Cl.
CPC .............. *G11C 11/417* (2013.01); *G11C 5/10* (2013.01)

(58) Field of Classification Search
CPC ....... G11C 11/417; G11C 5/10; G11C 11/419; G11C 11/54; G11C 7/1006; G11C 11/405;
(Continued)

(56) References Cited

U.S. PATENT DOCUMENTS 6,462,584 B1 * 10/2002 Proebsting ............... G11C 7/22 365/204
6,462,998 B1 * 10/2002 Proebsting ............ G11C 7/065 365/194
(Continued)

FOREIGN PATENT DOCUMENTS

JP 2018-109968 A 7/2018
JP 2019-003464 A 1/2019

OTHER PUBLICATIONS

International Search Report (Application No. PCT/IB2021/056024) Dated Oct. 19, 2021.
(Continued)

*Primary Examiner* — Michael T Tran
(74) *Attorney, Agent, or Firm* — NIXON PEABODY LLP; Jeffrey L. Costellia

(57) ABSTRACT

A semiconductor device capable of convolutional processing with low power consumption is provided. In the semiconductor device, a first circuit includes a first holding portion and a first transistor, and a second circuit includes a second holding portion and a second transistor. The first and second circuits are electrically connected to first and second input wirings and first and second wirings. The first holding portion has a function of holding a first current flowing through the first transistor, and the second holding portion has a function of holding a second current flowing through the second transistor. The first and second currents are determined by a filter value used for convolutional processing. When a potential corresponding to image data subjected to convolutional processing is input to the first and second input wirings, the first circuit outputs a current to one of the first wiring and the second wiring and the second circuit outputs a current to the other of the first wiring and the second wiring. The amount of current output from the first
(Continued)

and second circuits to the first wiring or the second wiring is determined by the filter value and the image data.

9 Claims, 85 Drawing Sheets

(58) Field of Classification Search
CPC ... G06G 7/14; G06G 7/16; G06G 7/60; H01L 21/8234; H01L 27/06; H01L 27/088; G06N 3/063
USPC ............................................. 365/154, 189.05
See application file for complete search history.

(56) References Cited

U.S. PATENT DOCUMENTS

| | | | | |
|---|---|---|---|---|
| 11,074,877 | B1 * | 7/2021 | Nakanishi | G06T 5/70 |
| 11,195,088 | B2 | 12/2021 | Ikeda | |
| 2016/0379576 | A1 * | 12/2016 | Shin | G09G 3/3685 345/694 |
| 2017/0061234 | A1 * | 3/2017 | Lim | G06T 3/40 |
| 2017/0061847 | A1 * | 3/2017 | Kim | G09G 3/3607 |
| 2018/0174053 | A1 * | 6/2018 | Lin | G06N 3/049 |
| 2018/0181862 | A1 | 6/2018 | Ikeda | |
| 2018/0240392 | A1 * | 8/2018 | Chen | G09G 3/3677 |
| 2018/0286325 | A1 * | 10/2018 | Koudo | G06T 5/70 |
| 2019/0042909 | A1 * | 2/2019 | Sumbul | G06N 3/08 |
| 2019/0042915 | A1 * | 2/2019 | Akin | G06N 3/065 |
| 2019/0042920 | A1 * | 2/2019 | Akin | G06N 3/049 |
| 2020/0012924 | A1 * | 1/2020 | Ma | G06V 10/764 |
| 2020/0192970 | A1 * | 6/2020 | Ma | G06N 3/044 |
| 2021/0374546 | A1 * | 12/2021 | Tsai | G11C 13/0069 |
| 2024/0005832 | A1 * | 1/2024 | Park | G09G 3/3233 |

OTHER PUBLICATIONS

Written Opinion (Application No. PCT/IB2021/056024) Dated Oct. 19, 2021.
Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.
Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.
Agrawal.A et al., "X-SRAM: Enabling In-Memory Boolean Computations in CMOS Static Random Access Memories", IEEE Transactions on Circuits and Systems, Jul. 2, 2018, pp. 1-14.
Akyel.K et al., "DRC2: Dynamically Reconfigurable Computing Circuit based on memory architecture", IEEE International Conference on Rebooting Computing, Oct. 17, 2016, pp. 1-8pages.
Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.
Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.

* cited by examiner

FIG. 82A
Intermediate state
New crystalline phase
| Amorphous | Crystalline | Crystal |
|---|---|---|
| ・completely amorphous | ・CAAC<br>・nc<br>・CAC<br>excluding single crystal and poly crystal | ・single crystal<br>・poly crystal |
FIG. 82B
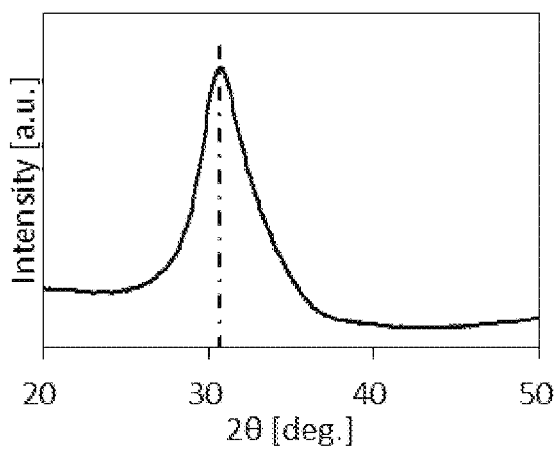
FIG. 82C
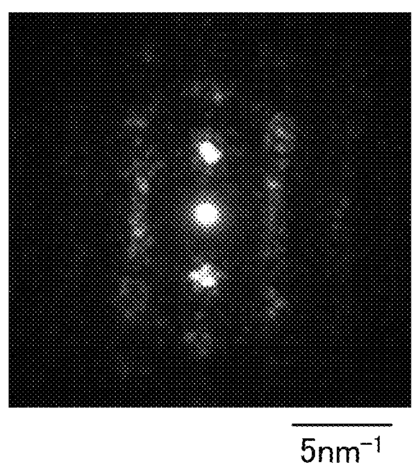

SEMICONDUCTOR DEVICE ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). For example, Non-Patent Document 1 and Non-Patent Document 2 each disclose an arithmetic device including an artificial neural network constructed using an SRAM (Static Random Access Memory).

REFERENCE

Non-Patent Document

[Non-Patent Document 1] M. Kang et al., "IEEE Journal Of Solid-State Circuits", 2018, Volume 53, No. 2, pp. 642-655.

[Non-Patent Document 2] J. Zhang et al., "IEEE Journal Of Solid-State Circuits", 2017, Volume 52, No. 4, pp. 915-924.

SUMMARY OF THE INVENTION

Problems to be Solved by the Invention

An artificial neural network performs calculations in which the connection strength (sometimes referred to as weight coefficient) of a synapse that connects two neurons is multiplied by a signal transmitted between the two neurons. In particular, in a hierarchical artificial neural network, the connection strength of synapses between a plurality of first neurons in a first layer and one of second neurons in a second layer and signals input from the plurality of first neurons in the first layer to the one of the second neurons in the second layer need to be multiplied and summed (i.e., need to be subjected to product-sum operation); for example, the number of connection strengths and the number of parameters indicating the signals are determined in accordance with the scale of the artificial neural network. The second neuron performs operation with an activation function by using the result of the product-sum operation of the connection strength of synapses and the signals output from the first neurons, and outputs the arithmetic operation result as a signal to a third neuron in a third layer. That is, in the artificial neural network, as the number of layers, the number of neurons, and the like increase, the number of circuits corresponding to the "neurons" and "synapses" also increases, which sometimes makes the amount of arithmetic operation enormous. Thus, in some cases, power consumption of the circuits is increased, and the amount of heat generated from the circuits is also increased.

There are a variety of artificial neural network models; an example of a model used for image analysis is a convolutional neural network (CNN). A convolutional neural network is a kind of neural network that achieves excellent performance in the field of image recognition, and the amount of arithmetic operation depends on the resolution of images, the size of filters, and the like. Specifically, for example, as the resolution of an image becomes higher, as the size of a filter becomes larger, or as the stride becomes smaller, the amount of arithmetic operation in a convolutional neural network increases; thus, the power consumption of the circuits might be increased.

As the number of circuits included in a chip increases, the power consumption increases and the amount of heat generated when a device is driven also increases. In particular, a larger amount of heat generation is more likely to affect the characteristics of circuit elements included in a chip; thus, a circuit constituting the chip preferably includes circuit elements that are less affected by temperature. In addition, variations in characteristics of transistors, current sources, or the like included in a chip lead to variations in arithmetic operation results.

An object of one embodiment of the present invention is to provide a semiconductor device and the like that perform product-sum operation and/or arithmetic operation with a function. Another object of one embodiment of the present invention is to provide a semiconductor device and the like that perform convolutional processing. Another object of one embodiment of the present invention is to provide a semiconductor device and the like intended for AI. Another object of one embodiment of the present invention is to provide a semiconductor device and the like intended for a DNN. Another object of one embodiment of the present invention is to provide a semiconductor device and the like with low power consumption. Another object of one embodiment of the present invention is to provide a semiconductor device and the like that are less affected by environmental temperature. Another object of one embodiment of the present invention is to provide a semiconductor device and the like that are less affected by variations in characteristics of transistors. Another object of one embodiment of the present invention is to provide a semiconductor device and the like that are less affected by variations in characteristics of current sources. Another object of one embodiment of the present invention is to provide a novel semiconductor device and the like.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first circuit and a second circuit. The first circuit includes a first holding portion and a first driving transistor. The second circuit includes a second holding portion and a second driving transistor. The first circuit is electrically connected to a first input wiring, a second input wiring, a first wiring, and a second wiring. The second circuit is electrically connected to the first input wiring, the second input wiring, the first wiring, and the second wiring. The first holding portion has a function of holding a first potential corresponding to a first current flowing between a source and a drain of the first driving transistor from the first wiring. The second holding portion has a function of holding a second potential corresponding to a second current flowing between a source and a drain of the second driving transistor from the second wiring. The first circuit has a function of outputting the first current to the first wiring when a first-level potential is input to the first input wiring and a second-level potential is input to the second input wiring; a function of outputting the first current to the second wiring when the second-level potential is input to the first input wiring and the first-level potential is input to the second input wiring; and a function of not outputting the first current to the first wiring and the second wiring when the second-level potential is input to the first input wiring and the second-level potential is input to the second input wiring. The second circuit has a function of outputting the second current to the second wiring when the first-level potential is input to the first input wiring and the second-level potential is input to the second input wiring; a function of outputting the second current to the first wiring when the second-level potential is input to the first input wiring and the first-level potential is input to the second input wiring; and a function of not outputting the second current to the first wiring and the second wiring when the second-level potential is input to the first input wiring and the second-level potential is input to the second input wiring. A current amount of each of the first current and the second current corresponds to a filter value included in a filter used for convolutional processing. The first-level potential and the second-level potential that are input to the first input wiring and the second input wiring are determined in accordance with image data subjected to the convolutional processing.

(2)

Another embodiment of the present invention is a semiconductor device that includes a first circuit and a second circuit and differs from the above (1) in some components. The first circuit includes a first holding portion and a first driving transistor. The second circuit includes a second holding portion and a second driving transistor. The first circuit is electrically connected to a first input wiring, a second input wiring, a first wiring, and a second wiring. The second circuit is electrically connected to the first input wiring, the second input wiring, the first wiring, and the second wiring. The first holding portion has a function of holding a first potential corresponding to a first current flowing between a source and a drain of the first driving transistor from the first wiring. The second holding portion has a function of holding a second potential corresponding to a second current flowing between a source and a drain of the second driving transistor from the second wiring. The first driving transistor has a function of making the first current corresponding to the held first potential flow between the source and the drain of the first driving transistor. The second driving transistor has a function of making the second current corresponding to the held second potential flow between the source and the drain of the second driving transistor. The first circuit has a function of outputting the first current to the first wiring in a first period when a first-level potential is input to the first input wiring and a second-level potential is input to the second input wiring; a function of outputting the first current to the second wiring in the first period when the second-level potential is input to the first input wiring and the first-level potential is input to the second input wiring; and a function of not outputting the first current to the first wiring and the second wiring in the first period when the second-level potential is input to the first input wiring and the second-level potential is input to the second input wiring. The second circuit has a function of outputting the second current to the second wiring in the first period when the first-level potential is input to the first input wiring and the second-level potential is input to the second input wiring; a function of outputting the second current to the first wiring in the first period when the second-level potential is input to the first input wiring and the first-level potential is input to the second input wiring; and a function of not outputting the second current to the first wiring and the second wiring in the first period when the second-level potential is input to the first input wiring and the second-level potential is input to the second input wiring. A current amount of each of the first current and the second current corresponds to a filter value included in a filter used for convolutional processing. The first-level potential and the second-level potential that are input to the first input wiring and the second input wiring and the length of the first period are determined in accordance with image data subjected to the convolutional processing.

(3)

In one embodiment of the present invention, the first period may include a second period and a third period in the above structure (2). Specifically, the first input wiring has a function of supplying the first-level potential or the second-level potential to both the first circuit and the second circuit in the second period. The second input wiring has a function of supplying the first-level potential or the second-level potential to both the first circuit and the second circuit in the second period. The first input wiring has a function of supplying the first-level potential or the second-level potential to both the first circuit and the second circuit in the third period. The second input wiring has a function of outputting the first-level potential or the second-level potential to both the first circuit and the second circuit in the third period. Note that the length of the third period is preferably greater than or equal to 1.8 times and less than or equal to 2.2 times the length of the second period.

(4)

In one embodiment of the present invention according to any one of the above (1) to (3), the first circuit may include a first transistor, a second transistor, a third transistor, and a first capacitor, and the second circuit may include a fourth transistor, a fifth transistor, a sixth transistor, and a second capacitor. Specifically, the first holding portion includes the first transistor and the first capacitor, and the second holding portion includes the fourth transistor and the second capacitor. A first terminal of the first transistor is electrically connected to a first terminal of the first capacitor and a gate of the first driving transistor. A second terminal of the first transistor is electrically connected to the first wiring. A first terminal of the first driving transistor is electrically connected to a first terminal of the second transistor and a first terminal of the third transistor. A second terminal of the second transistor is electrically connected to the first wiring. A gate of the second transistor is electrically connected to the first input wiring. A second terminal of the third transistor is electrically connected to the second wiring. A gate of the third transistor is electrically connected to the second input wiring. A first terminal of the fourth transistor is electrically connected to a first terminal of the second capacitor and a gate of the second driving transistor. A second terminal of the fourth transistor is electrically connected to the second wiring. A first terminal of the second driving transistor is electrically connected to a first terminal of the fifth transistor and a first terminal of the sixth transistor. A second terminal of the fifth transistor is electrically connected to the second wiring. A gate of the fifth transistor is electrically connected to the first input wiring. A second terminal of the sixth transistor is electrically connected to the first wiring. A gate of the sixth transistor is electrically connected to the second input wiring.

(5)

In one embodiment of the present invention according to the above (4), the first circuit may include a seventh transistor and the second circuit may include an eighth transistor. Specifically, a first terminal of the seventh transistor is electrically connected to the first terminal of the first driving transistor, the first terminal of the second transistor, and the first terminal of the third transistor. A second terminal of the seventh transistor is electrically connected to one of the first terminal and the second terminal of the first transistor. A first terminal of the eighth transistor is electrically connected to the first terminal of the second driving transistor, the first terminal of the fifth transistor, and the first terminal of the sixth transistor. A second terminal of the eighth transistor is electrically connected to one of the first terminal and the second terminal of the fourth transistor. A gate of the first transistor is electrically connected to a gate of the fourth transistor, a gate of the seventh transistor, and a gate of the eighth transistor.

(6)

In one embodiment of the present invention according to any one of the above (1) to (3), the first circuit may include a first transistor, a second transistor, a third transistor, and a first capacitor, and the second circuit may include a fourth transistor, a fifth transistor, a sixth transistor, and a second capacitor. Specifically, the first holding portion includes the first transistor and the first capacitor, and the second holding portion includes the fourth transistor and the second capacitor. A first terminal of the first transistor is electrically connected to a first terminal of the first capacitor and a gate of the first driving transistor. A first terminal of the first driving transistor is electrically connected to a second terminal of the first transistor, a first terminal of the second transistor, and a first terminal of the third transistor. A second terminal of the second transistor is electrically connected to the first wiring. A gate of the second transistor is electrically connected to the first input wiring. A second terminal of the third transistor is electrically connected to the second wiring. A gate of the third transistor is electrically connected to the second input wiring. A first terminal of the fourth transistor is electrically connected to a first terminal of the second capacitor and a gate of the second driving transistor. A first terminal of the second driving transistor is electrically connected to a second terminal of the fourth transistor, a first terminal of the fifth transistor, and a first terminal of the sixth transistor. A second terminal of the fifth transistor is electrically connected to the second wiring. A gate of the fifth transistor is electrically connected to the first input wiring. A second terminal of the sixth transistor is electrically connected to the first wiring. A gate of the sixth transistor is electrically connected to the second input wiring.

(7)

In one embodiment of the present invention according to any one of the above (1) to (3), the first circuit may include a third holding portion and a third driving transistor, and the second circuit may include a fourth holding portion and a fourth driving transistor. Specifically, the first circuit is electrically connected to a third wiring, and the second circuit is electrically connected to the third wiring. The third holding portion has a function of holding a third potential corresponding to a third current flowing between a source and a drain of the third driving transistor from the first wiring. The fourth holding portion has a function of holding a fourth potential corresponding to a fourth current flowing between a source and a drain of the fourth driving transistor from the second wiring. The third driving transistor has a function of making the third current corresponding to the held third potential flow between the source and the drain of the third driving transistor. The fourth driving transistor has a function of making the fourth current corresponding to the held fourth potential flow between the source and the drain of the fourth driving transistor. The semiconductor device has a function of switching the first current flowing through one of the first wiring and the second wiring to the third current and switching the second current flowing through the other of the first wiring and the second wiring to the fourth current, in accordance with a signal input to the third wiring.

(8)

One embodiment of the present invention according to any one of the above (1) to (7) may include a third circuit, a fourth circuit, and a fifth circuit. The third circuit has a function of supplying the first current corresponding to the filter value, to the first circuit through the first wiring; and a function of supplying the second current corresponding to the filter value, to the second circuit through the second wiring. The fourth circuit has a function of inputting the first-level potential or the second-level potential to the first input wiring in accordance with the image data; and a function of inputting the first-level potential or the second-level potential to the second input wiring in accordance with the image data. The fifth circuit has a function of comparing currents flowing from the first wiring and the second wiring, and outputting a potential corresponding to a product of the filter value and the image data from an output terminal of the fifth circuit.

(9)

Another embodiment of the present invention is an electronic device including the semiconductor device according to any one of the above (1) to (8) and a housing. In the electronic device, image feature extraction may be performed by the convolutional processing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, an electronic component including a chip in a package, and the like are examples of the semiconductor device. Moreover, a memory device, a display device, a light-emitting device, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9\Omega$.

In this specification and the like, a "capacitor" can be, for example, a circuit element having an electrostatic capacitance higher than 0 F, a region of a wiring having an electrostatic capacitance value, parasitic capacitance, or gate capacitance of a transistor. Thus, in this specification and the like, the terms "capacitor", "parasitic capacitance", "gate capacitance", and the like can be replaced with the term "capacitance" or the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where a switch includes two or more transistors which are electrically connected to each other in series and whose gates are electrically connected to each other.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean the case where a plurality of "electrodes", "wirings", or the like are formed in an integrated manner, for example. For example, a "terminal" is used as part of a "wiring," an "electrode," or the like in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment can provide a semiconductor device and the like that perform product-sum operation and/or arithmetic operation with a function. Another embodiment of the present invention can provide a semiconductor device and the like that perform convolutional processing. Another embodiment of the present invention can provide a semiconductor device and the like with low power consumption. Another embodiment of the present invention can provide a semiconductor device and the like that are less affected by environmental temperature. Another embodiment of the present invention can provide a semiconductor device and the like that are less affected by variations in characteristics of transistors. Another embodiment of the present invention can provide a semiconductor device and the like that are less affected by variations in characteristics of current sources. Another embodiment of the present invention can provide a novel semiconductor device and the like.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 82A is a diagram showing classification of crystal structures of IGZO, FIG. 82B is a diagram showing an XRD spectrum of crystalline IGZO, and FIG. 82C is a diagram showing a nanobeam electron diffraction pattern of crystalline IGZO.

MODE FOR CARRYING OUT THE INVENTION

Figure 1A:
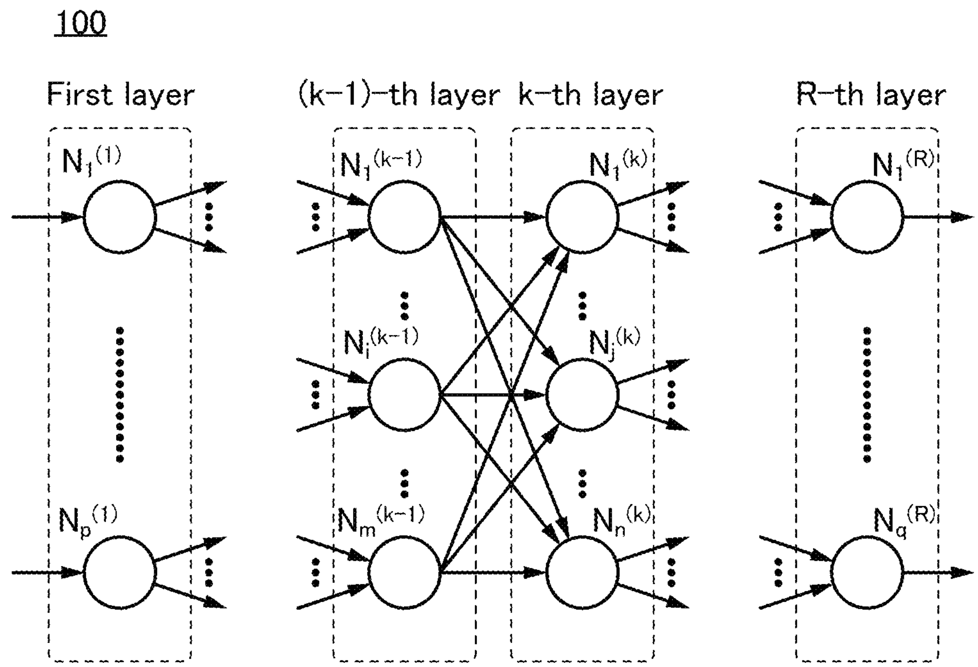
FIG. 1A and FIG. 1B are diagrams illustrating a hierarchical neural network.

In an artificial neural network (hereinafter referred to as a neural network), the connection strength between synapses can be changed when existing information is given to the neural network. The processing for determining a connection strength by providing a neural network with existing information in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield type and a hierarchical type. In particular, a neural network with a multilayer structure is called a "deep neural network" (DNN) and machine learning using a deep neural network is called "deep learning" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

This embodiment describes an arithmetic circuit that is a semiconductor device of one embodiment of the present invention and performs product-sum operation and/or arithmetic operation with a function.

<Hierarchical Neural Network>

First, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 1A shows one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 1A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 1A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k-1)}$ to a neuron $N_m^{(k-1)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 1A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 1B:
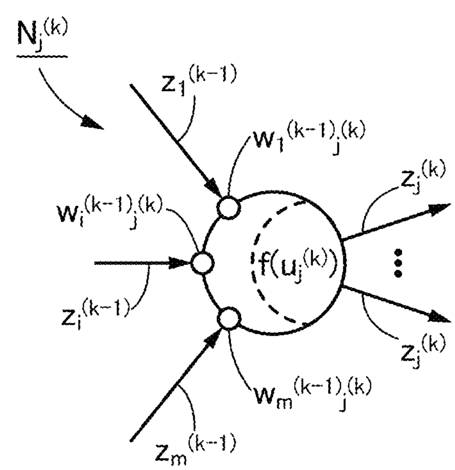

FIG. 1B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)}j^{(k)}$, a signal input to the neuron $N_j^{(k)}$ in the k-th layer can be expressed by Formula (1.1).

[Formula 1]

$$w_i^{(k-1)}j^{(k)} \cdot z_i^{(k-1)} \tag{1.1}$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the corresponding weight coefficients $w_1^{(k-1)}j^{(k)}$ to $w_m^{(k-1)}j^{(k)}$. Then, $w_1^{(k-1)}j^{(k)} \cdot z_1^{(k-1)}$ to $w_m^{(k-1)}j^{(k)} \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (1.2).

[Formula 2]

$$u_j^{(k)} = \sum_{i=1}^{m} w_i^{(k-1)}{}_j^{(k)} \cdot z_i^{(k-1)} \tag{1.2}$$

In addition, a bias may be added to the product-sum result of the weight coefficients $w_1^{(k-1)}j^{(k)}$ to $w_m^{(k-1)}j^{(k)}$ and the signals $z_1^{(k-1)}$ to $z_m^{(k-1)}$ of the neurons. When the bias is denoted by b, Formula (1.2) can be rewritten as the following formula.

[Formula 3]

$$u_j^{(k)} = \sum_{i=1}^{m} w_i^{(k-1)(k)}{}_j \cdot z_i^{(k-1)} + b \quad (1.3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 4]

$$z_j^{(k)}=f(u_j^{(k)}) \quad (1.4)$$

A function $f(u_j^{(k)})$ is an activation function in a hierarchical neural network, and a step function, a ramp function (ReLU function), a sigmoid function, a tan h function, a softmax function, or the like can be used. Note that the activation function may be the same or different among all neurons. In addition, the neuron activation function may be the same or different between the layers.

Signals output from the neurons in the layers, the weight coefficients w, or the bias b may be an analog value or a digital value. For example, a binary or ternary digital value may be used. A value having a larger number of bits may be used. In the case of an analog value, for example, a linear ramp function, a sigmoid function, or the like is used as an activation function. In the case of a binary digital value, for example, a step function with an output of −1 or 1 or an output of 0 or 1 is used. Alternatively, the neurons in the layers may each output a ternary or higher-level signal; for example, as an activation function for outputting three levels, a step function with an output of −1, 0, or 1 or a step function with an output of 0, 1, or 2 is used, for example. Furthermore, as an activation function for outputting five levels, a step function with an output of −2, −1, 0, 1, or 2 may be used, for example. The use of a digital value as at least one of the signals output from the neurons in the layers, the weight coefficient w, and the bias b enables a reduction of the circuit scale, a reduction of power consumption, or an increase of arithmetic operation speed, for example. Furthermore, the use of an analog value as at least one of the signals output from the neurons in the layers, the weight coefficient w, and the bias b can improve the arithmetic operation accuracy.

The neural network 100 performs operation in which by input of an input signal to the first layer (the input layer), output signals are sequentially generated in the layers from the first layer (the input layer) to the last layer (the output layer) according to Formula (1.1), Formula (1.2) (or Formula (1.3)), and Formula (1.4) on the basis of the signals input from the previous layers, and the output signals are output to the subsequent layers. The signal output from the last layer (the output layer) corresponds to the calculation results of the neural network 100.

<Configuration Examples of Arithmetic Circuits>

Described here is an example of an arithmetic circuit that is capable of performing the arithmetic operation of Formula (1.2) (or Formula (1.3)) and Formula (1.4) in the above-described neural network 100. Note that in the arithmetic circuit, for example, a weight coefficient of a synapse circuit of the neural network 100 has two levels (e.g., a combination of "−1" and "+1" or a combination of "0" and "+1"), three levels (e.g., a combination of "−1", "0", and "1"), or multiple levels of four or more levels (e.g., in the case of five levels, a combination of "−2", "−1", "0", "1", and "2"), and a neuron activation function is a function that outputs two levels (e.g., a combination of "−1" and "+1" or a combination of "0" and "+1"), three levels (e.g., a combination of "−1", "0", and "1"), or multiple levels of four or more levels (e.g., in the case of four levels, a combination of "0", "1", "2", and "3"). In this specification and the like, one of a weight coefficient and a value of a signal (sometimes referred to as an arithmetic value) input from a neuron in one layer to a neuron in the subsequent layer is referred to as first data, and the other is referred to as second data in some cases. Note that the arithmetic value and the weight coefficient of the synapse circuit of the neural network 100 are not limited to digital values, and an analog value can be used as at least one of them.

Figure 2:
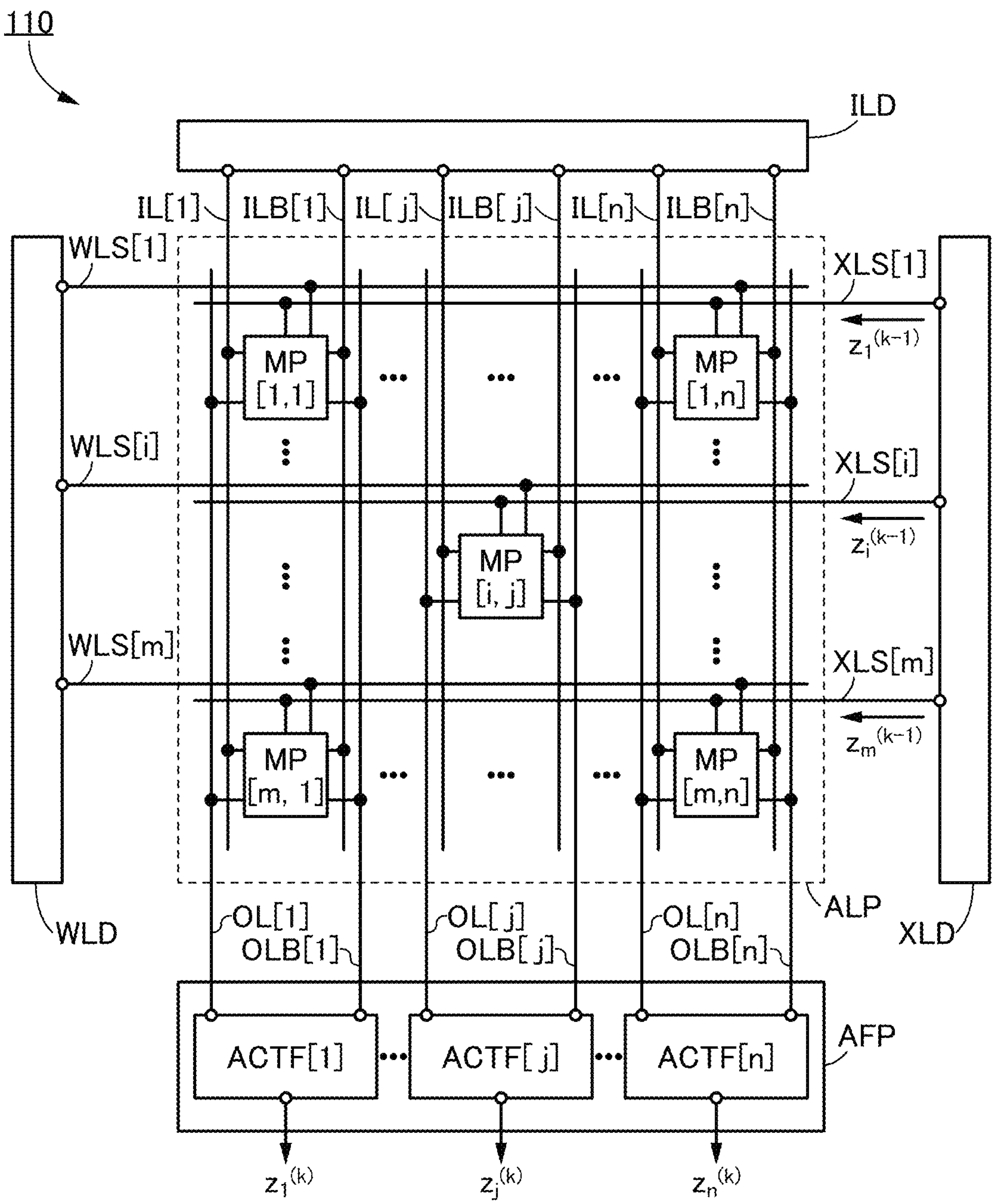
FIG. 2 is a circuit diagram illustrating a configuration example of a semiconductor device.

An arithmetic circuit 110 illustrated in FIG. 2 is a semiconductor device including an array portion ALP, a circuit ILD, a circuit WLD, a circuit XLD, and a circuit AFP, for example. The arithmetic circuit 110 is a circuit that processes the signals $z_1^{(k-1)}$ to $z_m^{(k-1)}$ input to the neuron $N_1^{(k)}$ to the neuron $N_n^{(k)}$ in the k-th layer in FIG. 1A and FIG. 1B and generates signals $z_1^{(k)}$ to $z_n^{(k)}$ respectively output from the neuron $N_1^{(k)}$ to the neuron $N_n^{(k)}$.

Note that the whole or part of the arithmetic circuit 110 may be used for applications other than a neural network, AI, and the like. For example, in the case where product-sum operation processing, matrix operation processing, or the like is performed in calculation for graphics (e.g., convolutional processing for performing image feature extraction), scientific calculation, or the like, the processing may be performed using the whole or part of the arithmetic circuit 110. In other words, the whole or part of the arithmetic circuit 110 may be used for not only calculation for AI but also general calculation.

The circuit ILD is electrically connected to a wiring IL[1] to a wiring IL[n] and a wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The array portion ALP includes m×n circuits MP, for example. The circuits MP are arranged in a matrix of m rows and n columns in the array portion ALP, for example. Note that in FIG. 2, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 2 illustrates only the circuit MP[1,1], the circuit MP[m,1], the circuit MP[i,j], the circuit MP[1,*n*], and the circuit MP[m,n] and does not illustrate the other circuits MP.

The circuit MP[i,j] is electrically connected to the wiring IL[j], the wiring ILB[j], the wiring WLS[i], the wiring XLS[i], the wiring OL[j], and the wiring OLB[j], for example.

The circuit MP[i,j] has a function of holding a weight coefficient between the neuron $N_i^{(k-1)}$ and the neuron $N_j^{(k)}$ (sometimes referred to as one of the first data and the second data, and here referred to as the first data), for example. Specifically, the circuit MP[i,j] holds information (e.g., a potential, a resistance value, or a current value) corresponding to the first data (a weight coefficient) input from the wiring IL[j] and the wiring ILB[j]. In addition, the circuit MP[i,j] has a function of outputting the product of a signal $z_1^{(k-1)}$ output from the neuron $N_i^{(k-1)}$ (sometimes referred to as the other of the first data and the second data, and here referred to as the second data) and the first data. As a specific example, when the second data $z_i^{(k-1)}$ is input from the wiring XLS[i], the circuit MP[i,j] outputs, to the wiring OL[j] and the wiring OLB[j], information (e.g., a current or a voltage) corresponding to the product of the first data and the second data or information (e.g., a current or a voltage) related to the product of the first data and the second data. Note that although an example of the case where the wiring IL[j] and the wiring ILB[1] are provided is described, one embodiment of the present invention is not limited thereto. Only one of the wiring IL[j] and the wiring ILB[1] may be provided.

<<Circuit ILD>>

The circuit ILD has a function of inputting, to the circuit MP[1,1] to the circuit MP[m,n], information (e.g., a potential, a resistance value, or a current value) corresponding to first data $w_1^{(k-1)}1^{(k)}$ to $w_m^{(k-1)}n^{(k)}$ that are weight coefficients, through the wiring IL[1] to the wiring IL[n] and the wiring ILB[1] to the wiring ILB[n], for example. As a specific example, the circuit ILD supplies, to the circuit MP[i,j], information (e.g., a potential, a resistance value, or a current value) corresponding to the first data $w_i^{(k-1)}j^{(k)}$ that is a weight coefficient, through the wiring IL[j] and the wiring ILB[j].

<<Circuit XLD>>

Figure 3:
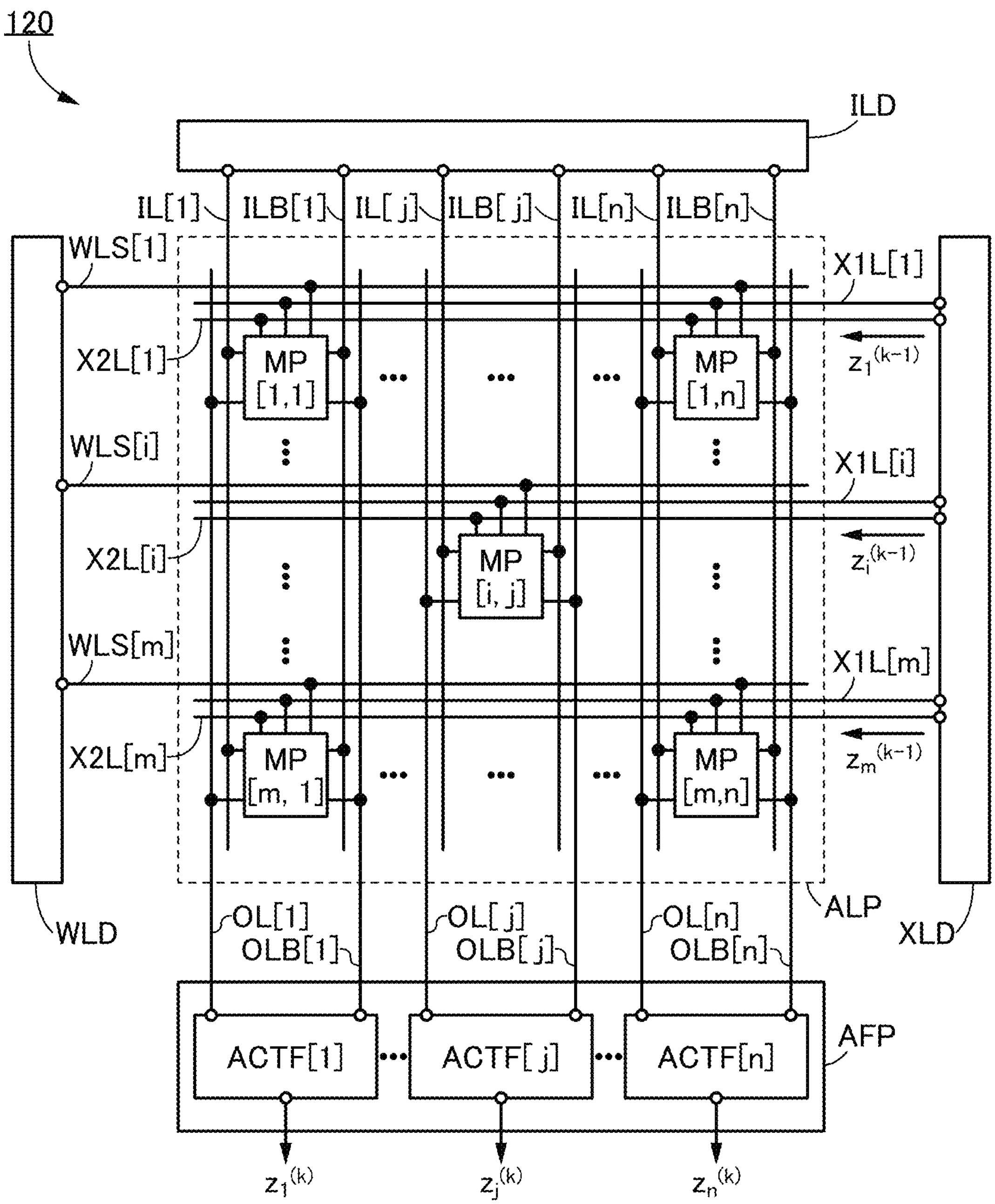
FIG. 3 is a circuit diagram illustrating a configuration example of a semiconductor device.

The circuit XLD has a function of supplying, to the circuit MP[1,1] to the circuit MP[m,n], the second data $z_1^{(k-1)}$ to $z_m^{(k-1)}$ corresponding to arithmetic values output from the neuron $N_1^{(k-1)}$ to a neuron $N_m^{(k-1)}$, through the wiring XLS[1] to the wiring XLS[m], for example. Specifically, the circuit XLD supplies, to the circuit MP[i,1] to the circuit MP[i,n], information (e.g., a potential or a current value) corresponding to the second data $z_i^{(k-1)}$ output from the neuron $N_i^{(k-1)}$, through the wiring XLS[i]. Although an example of the case where the wiring XLS[i] is provided is described, one embodiment of the present invention is not limited thereto. For example, in the arithmetic circuit 110 in FIG. 2, the wiring XLS[i] may be a plurality of wirings. As a specific example, FIG. 3 illustrates an arithmetic circuit 120 having a configuration in which the wiring XLS[i] electrically connected to the circuit MP[i,j] of the arithmetic circuit 110 is replaced with two wirings: a wiring X1L and a wiring X2L. Although an example of the case where the wiring XLS[i] is provided is described, one embodiment of the present invention is not limited thereto. For example, in addition to the wiring XLS[i], a wiring transmitting an inverted signal of a signal input to the wiring XLS[i] may be additionally provided.

<<Circuit WLD>>

The circuit WLD has a function of selecting the circuit MP to which information (e.g., a potential, a resistance value, or a current value) corresponding to the first data input from the circuit ILD is to be written, for example. In the case where information (e.g., a potential, a resistance value, or a current value) is written to the circuit MP[i,1] to the circuit MP[i,n] positioned in the i-th row of the array portion ALP, for example, the circuit WLD supplies, to the wiring WLS[i], a signal for turning on or off writing switching elements included in the circuit MP[i,1] to the circuit MP[i,n], and supplies, to the other wirings WLS, a potential for turning off writing switching elements included in the circuits MP in rows other than the i-th row, for example. Although an example of the case where the wiring WLS[i] is provided is described, one embodiment of the present invention is not limited thereto. For example, in addition to the wiring WLS[i], a wiring transmitting an inverted signal of a signal input to the wiring WLS[i] may be additionally provided.

Although FIG. 2 shows a configuration example of the arithmetic circuit 110 provided with the wiring WLS[i], one embodiment of the present invention is not limited thereto. For example, the wiring WLS[i] may be replaced with a plurality of wirings. Alternatively, the wiring X1L[i] of the arithmetic circuit 120 in FIG. 3 may also be used as a selection signal line for writing information to the circuit MP[i,1] to the circuit MP[i,n], for example. Specifically, as in an arithmetic circuit 130 illustrated in FIG. 4, the wiring X1L[i] of the arithmetic circuit 120 may be replaced with a wiring WX1L[i] and the wiring WX1L may be electrically connected to the circuit WLD and the circuit XLD. Note that in the case where a signal for turning on or off the writing switching elements included in the circuit MP[i,1] to the circuit MP[i,n] is supplied from the circuit WLD to the wiring WX1L[i], the circuit XLD preferably has a function of establishing a non-conduction state between the circuit XLD and the wiring WX1L. In addition, in the case where signals of the second data $z_1^{(k-1)}$ to $z_m^{(k-1)}$ corresponding to the arithmetic values output from the neuron $N_1^{(k-1)}$ to the neuron $N_m^{(k-1)}$ are supplied from the circuit XLD to the circuit MP[i,1] to the circuit MP[i,n] through the wiring WX1L[i], the circuit WLD preferably has a function of establishing a non-conduction state between the circuit WLD and the wiring WX1L.

<<Circuit AFP>>

The circuit AFP includes a circuit ACTF[1] to a circuit ACTF[n], for example. The circuit ACTF[j] is electrically connected to the wiring OL[j] and the wiring OLB[j], for example. The circuit ACTF[j] generates, for example, a signal corresponding to information (e.g., a potential or a current value) input from the wiring OL[j] and the wiring OLB[j]. For example, information input from the wiring OL[j] and information input from the wiring OLB[j] (e.g., potentials or current values) are compared and a signal based on the comparison result is generated. The signal corresponds to the signal $z_j^{(k)}$ output from the neuron $N_j^{(k)}$. That is, the circuit ACTF[1] to the circuit ACTF[n] function as circuits that perform arithmetic operation of an activation function of the above-described neural network, for example. However, one embodiment of the present invention is not limited thereto. For example, the circuit ACTF[1] to the circuit ACTF[n] may have a function of converting an analog signal into a digital signal. As another example, the circuit ACTF[1] to the circuit ACTF[n] may have a function of amplifying an analog signal and outputting the amplified signal, i.e., a function of converting output impedance. As another example, the circuit ACTF[1] to the circuit ACTF[n] may have a function of converting a current or a charge into a voltage. As another example, the circuit ACTF[j] may have a function of initializing potentials of the wiring OL[j] and the wiring OLB[j].

Figure 4:
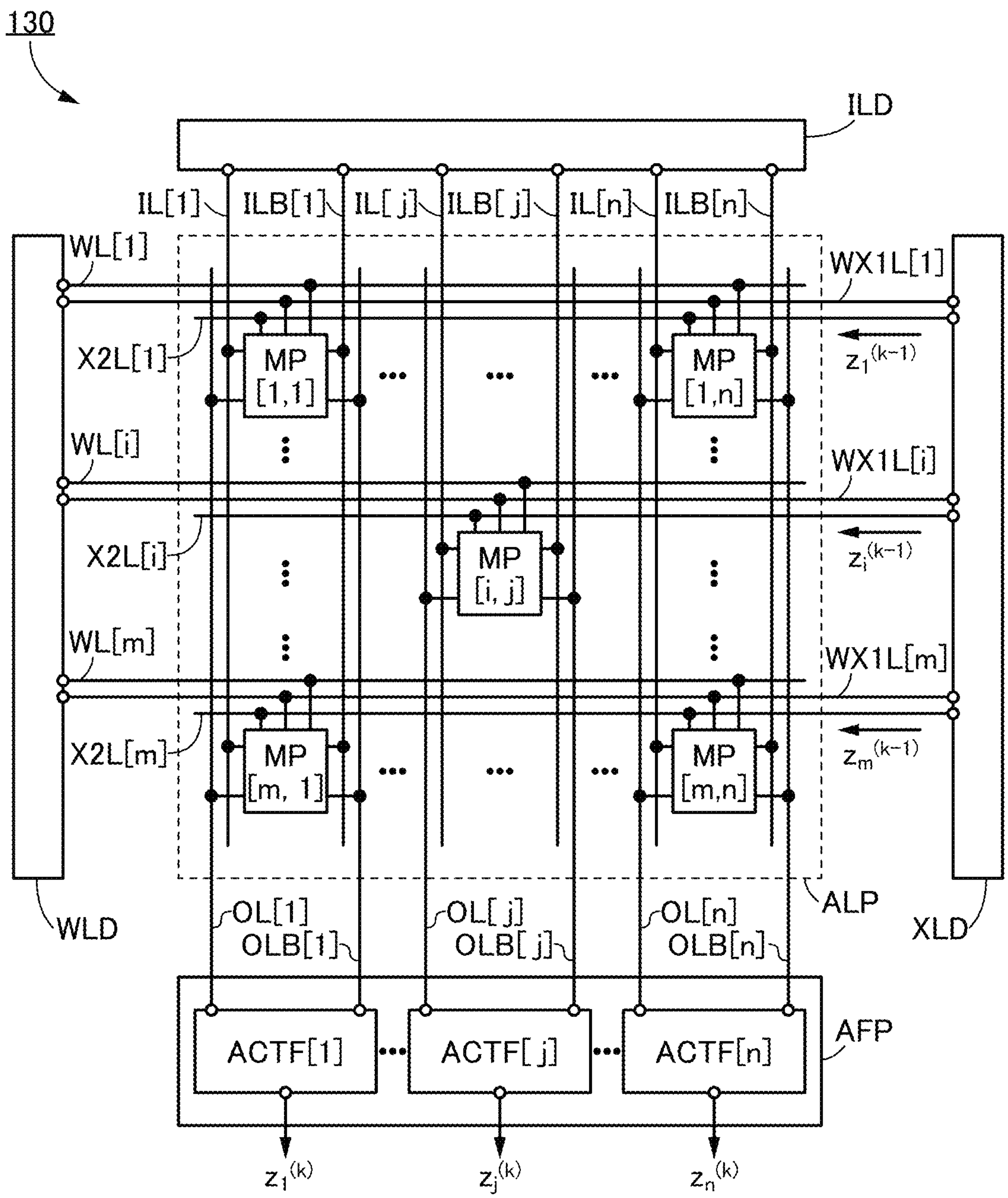
FIG. 4 is a circuit diagram illustrating a configuration example of a semiconductor device.

Although the arithmetic circuit 110, the arithmetic circuit 120, and the arithmetic circuit 130 illustrated in FIG. 2 to FIG. 4 each show an example of the case where the circuit ACTF is provided, one embodiment of the present invention is not limited thereto. For example, the circuit ACTF is not necessarily provided in the circuit AFP.

Figure 5A:
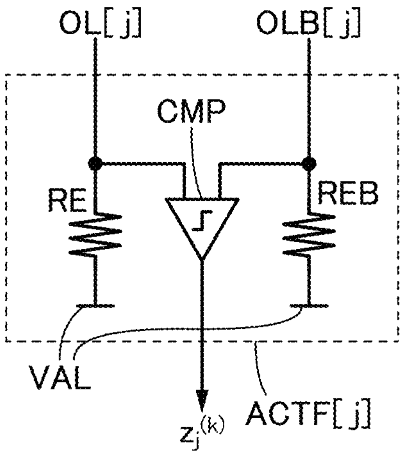
FIG. 5A to FIG. 5F are circuit diagrams each illustrating a configuration example of a circuit included in a semiconductor device.

Next, the circuit ACTF[1] to the circuit ACTF[n] are described. The circuit ACTF[1] to the circuit ACTF[n] can have a circuit configuration shown in FIG. 5A, for example. FIG. 5A shows a circuit that generates the signal $z_j^{(k)}$ in accordance with currents input from the wiring OL[j] and the wiring OLB[j], for example. Specifically, FIG. 5A illustrates an example of a circuit that performs arithmetic operation of an activation function and outputs the output signal $z_j^{(k)}$ expressed by a binary value.

In FIG. 5A, the circuit ACTF[j] includes a resistor RE, a resistor REB, and a comparator CMP, for example. The resistor RE and the resistor REB have a function of converting a current into a voltage. Therefore, without limitation to the resistor, an element or a circuit can be used as long as it has a function of converting a current into a voltage. The wiring OL[j] is electrically connected to a first terminal of the resistor RE and a first input terminal of the comparator CMP, and the wiring OLB[j] is electrically connected to a first terminal of the resistor REB and a second input terminal of the comparator CMP. A second terminal of the resistor RE is electrically connected to a wiring VAL, and a second terminal of the resistor REB is electrically connected to the wiring VAL. Note that the second terminal of the resistor RE and the second terminal of the resistor REB may be connected to the same wiring. Alternatively, they may be connected to different wirings having the same potential.

The resistance values of the resistor RE and the resistor REB are preferably equal to each other. For example, the difference between the resistance values of the resistor RE and the resistor REB is desirably within 10%, further preferably within 5% of the resistance value of the resistor RE. However, one embodiment of the present invention is not limited thereto. Depending on the case or according to circumstances, the resistance values of the resistor RE and the resistor REB may be different values.

The wiring VAL functions as a wiring for supplying a constant voltage, for example. The constant voltage can be VDD that is a high-level potential, VSS that is a low-level potential, or a ground potential (GND), for example. The constant voltage is preferably set as appropriate in accordance with the configuration of the circuit MP. Alternatively, the wiring VAL may be supplied with not a constant voltage but a pulse signal, for example.

A voltage between the first terminal and the second terminal of the resistor RE is determined in accordance with a current flowing from the wiring OL[j]. Thus, a voltage based on the resistance value of the resistor RE and the current is input to the first input terminal of the comparator CMP. Similarly, a voltage between the first terminal and the second terminal of the resistor REB is determined in accordance with a current flowing from the wiring OLB[j]. Thus, a voltage based on the resistance value of the resistor REB and the current is input to the second input terminal of the comparator CMP.

The comparator CMP has a function of, for example, comparing voltages input to the first input terminal and the second input terminal and outputting a signal from an output terminal of the comparator CMP on the basis of the comparison result. For example, the comparator CMP can output a high-level potential from the output terminal of the comparator CMP in the case where the voltage input to the second input terminal is higher than the voltage input to the first input terminal, and can output a low-level potential from the output terminal of the comparator CMP in the case where the voltage input to the first input terminal is higher than the voltage input to the second input terminal. In other words, since a potential output from the output terminal of the comparator CMP is either a high-level potential or a low-level potential, the circuit ACTF[j] can output the binary output signal $z_j^{(k)}$. For example, the high-level potential and the low-level potential output from the output terminal of the comparator CMP can correspond to "+1" and "−1" of the output signal $z_j^{(k)}$, respectively. Depending on the case, the high-level potential and the low-level potential output from the output terminal of the comparator CMP may correspond to "+1" and "0" of the output signal $z_j^{(k)}$, respectively.

Figure 5B:
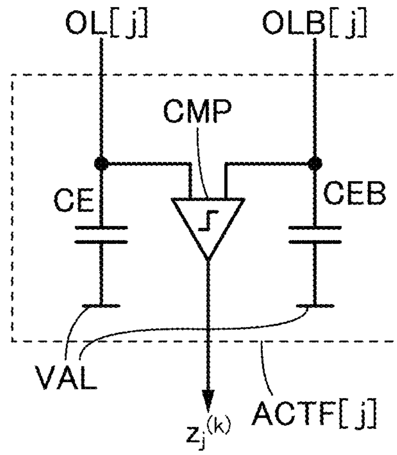
Figure 5C:
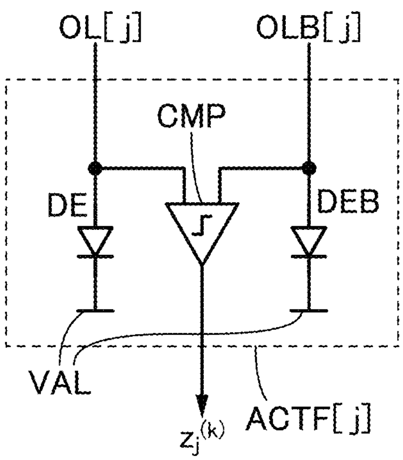

Although the resistor RE and the resistor REB are used for the circuit ACTF[j] in FIG. 5A, without limitation to the resistor, an element or a circuit can be used as long as it has a function of converting a current into a voltage. Thus, each of the resistor RE and the resistor REB of the circuit ACTF[j] in FIG. 5A can be replaced with another circuit element. For example, the circuit ACTF[j] illustrated in FIG. 5B is a circuit in which the resistor RE and the resistor REB included in the circuit ACTF[j] in FIG. 5A are replaced with a capacitor CE and a capacitor CEB, and can perform operation substantially the same as that of the circuit ACTF [j] in FIG. 5A. Note that the electrostatic capacitance values of the capacitor CE and the capacitor CEB are preferably equal to each other. For example, the difference between the electrostatic capacitance values of the capacitor CE and the capacitor CEB is desirably within 10%, further preferably within 5% of the electrostatic capacitance value of the capacitor CE. However, one embodiment of the present invention is not limited thereto. A circuit for initializing charge accumulated in the capacitor CE and the capacitor CEB may be provided. For example, a switch may be provided in parallel to the capacitor CE. In other words, a second terminal of the switch may be connected to the wiring VAL, and a first terminal of the switch may be connected to a first terminal of the capacitor CE, the wiring OL[j], and the first input terminal of the comparator CMP. Alternatively, the second terminal of the switch may be connected to a wiring different from the wiring VAL, and the first terminal of the switch may be connected to the first terminal of the capacitor CE, the wiring OL[j], and the first input terminal of the comparator CMP. In addition, the circuit ACTF[j] illustrated in FIG. 5C is a circuit in which the resistor RE and the resistor REB included in the circuit ACTF[j] in FIG. 5A are replaced with a diode element DE and a diode element DEB, and can perform operation substantially the same as that of the circuit ACTF[j] in FIG. 5A. The directions of the diode element DE and the diode element DEB (connection portions of an anode and a cathode) are desirably changed as appropriate in accordance with the level of a potential of the wiring VAL.

Figure 5D:
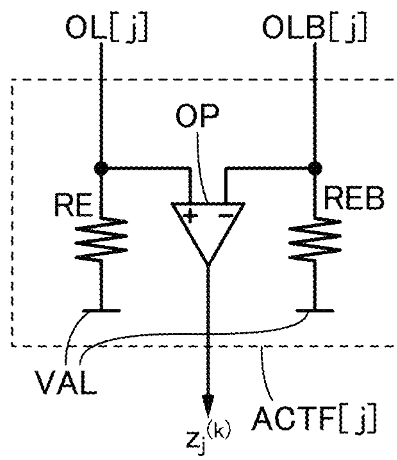

The comparator CMP included in each of the circuits ACTF[j] in FIG. 5A to FIG. 5C can be replaced with an operational amplifier OP, for example. FIG. 5D is a circuit diagram illustrating the circuit ACTF[h] in which the comparator CMP of the circuit ACTF[j] in FIG. 5A is replaced with the operational amplifier OP.

Figure 5E:
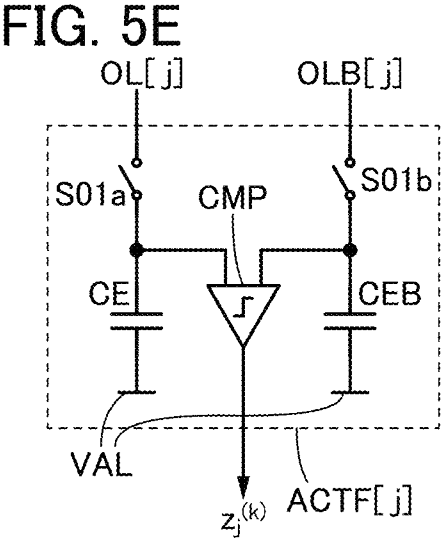

A switch S01*a* and a switch S01*b* may be provided in the circuit ACTF[j] in FIG. 5B. Thus, the circuit ACTF[j] can hold, in the capacitor CE and the capacitor CEB, potentials corresponding to currents input from the wiring OL[j] and the wiring OLB[j]. As a specific circuit example, a configuration may be employed in which the wiring OL[j] is electrically connected to a first terminal of the switch S01*a*, the first terminal of the capacitor CE and the first input terminal of the comparator CMP are electrically connected to a second terminal of the switch S01*a*, the wiring OLB[j] is electrically connected to a first terminal of the switch S01*b*, and a first terminal of the capacitor CEB and the second input terminal of the comparator CMP are electrically connected to a second terminal of the switch S01*b*, as illustrated in FIG. 5E. In the circuit ACTF[j] in FIG. 5E, the potentials of the wiring OL[j] and the wiring OLB[j] can be respectively input to the first input terminal and the second input terminal of the comparator CMP by turning on the switch S01*a* and the switch S01*b*. Then, by turning off the switch S01*a* and the switch S01*b*, the potentials input to the first input terminal and the second input terminal of the comparator CMP can be held in the capacitor CE and the capacitor CEB. Note that as each of the switch S01*a* and the switch S01*b*, an electrical switch such as an analog switch or a transistor can be used, for example. As another example, a mechanical switch may be used as each of the switch S01*a* and the switch S01*b*. Note that in the case of using a transistor as each of the switch S01*a* and the switch S01*b*, the transistor can be an OS transistor or a transistor containing silicon in a channel formation region (hereinafter referred to as a Si transistor). Moreover, by controlling the on-state periods of the switch S01*a* and the switch S01*b*, the voltage values of the capacitor CE and the capacitor CEB can be controlled. For example, in the case where the values of currents flowing through the capacitor CE and the capacitor CEB are large, the on-state periods of the switch S01*a* and the switch S01*b* are set short, whereby the voltage values of the capacitor CE and the capacitor CEB can be prevented from being too large.

Figure 5F:
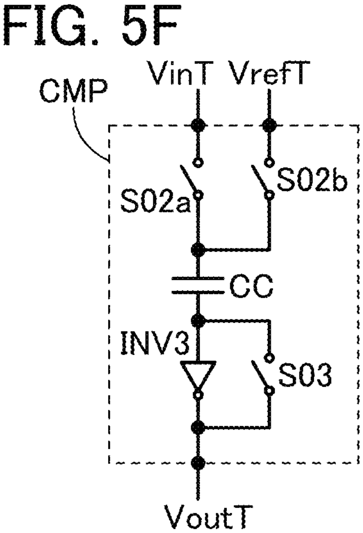

The comparator CMP included in each of the circuits ACTF[j] in FIG. 5A to FIG. 5C and FIG. 5E can be a chopper comparator, for example. The comparator CMP illustrated in FIG. 5F is a chopper comparator, and the comparator CMP includes a switch S02*a*, a switch S02*b*, a switch S03, a capacitor CC, and an inverter circuit INV3. Like the above-described switch S01*a* and switch S01*b*, each of the switch S02*a*, the switch S02*b*, and the switch S03 can be a mechanical switch or a transistor such as an OS transistor or a Si transistor.

A first terminal of the switch S02*a* is electrically connected to a terminal VinT, a first terminal of the switch S02*b* is electrically connected to a terminal VrefT, and a second terminal of the switch S02*a* is electrically connected to a second terminal of the switch S02*b* and a first terminal of the capacitor CC. A second terminal of the capacitor CC is electrically connected to an input terminal of the inverter circuit INV3 and a first terminal of the switch S03. A terminal VoutT is electrically connected to an output terminal of the inverter circuit INV3 and a second terminal of the switch S03.

The terminal VinT functions as a terminal for inputting an input potential to the comparator CMP, the terminal VrefT functions as a terminal for inputting a reference potential to the comparator CMP, and the terminal VoutT functions as a terminal for outputting an output potential from the comparator CMP. Note that the terminal VinT can correspond to one of the first terminal and the second terminal of each of the comparators CMP in FIG. 5A to FIG. 5C and FIG. 5E, and the terminal VrefT can correspond to the other of the first terminal and the second terminal of each of the comparators CMP in FIG. 5A to FIG. 5C and FIG. 5E.

Although the circuits ACTF[j] in FIG. 5A to FIG. 5E are each a circuit that performs arithmetic operation of an activation function and outputs the output signal $z_j^{(k)}$ expressed by a binary value, the circuit ACTF[j] may output the output signal $z_j^{(k)}$ as a ternary or higher-level signal or an analog value.

FIG. 6A to FIG. 6F show examples of a circuit that generates the signal $z_j^{(k)}$ in accordance with currents input from the wiring OL[j] and the wiring OLB[j] and is a circuit that performs arithmetic operation of an activation function and outputs the output signal $z_j^{(k)}$ expressed by a ternary value.

Figure 6A:
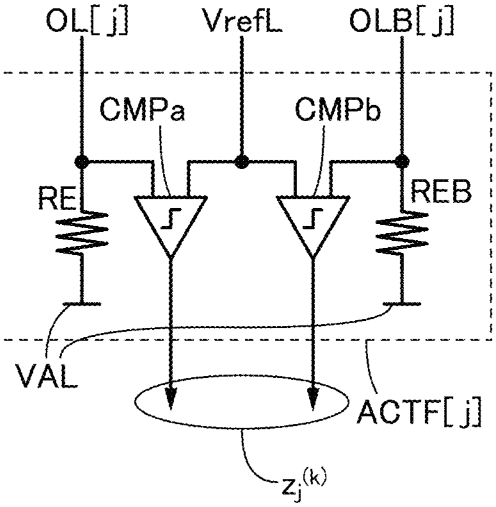
FIG. 6A to FIG. 6F are circuit diagrams each illustrating a configuration example of a circuit included in a semiconductor device.

The circuit ACTF[j] illustrated in FIG. 6A includes the resistor RE, the resistor REB, a comparator CMPa, and a comparator CMPb. The wiring OL[j] is electrically connected to the first terminal of the resistor RE and a first input terminal of the comparator CMPa, and the wiring OLB[j] is electrically connected to the first terminal of the resistor REB and a first input terminal of the comparator CMPb. A second input terminal of the comparator CMPa and a second input terminal of the comparator CMPb are electrically connected to a wiring VrefL. Furthermore, the second terminal of the resistor RE is electrically connected to the wiring VAL, and the second terminal of the resistor REB is electrically connected to the wiring VAL.

The wiring VrefL functions as a voltage line for supplying a constant voltage $V_{ref}$, and $V_{ref}$ is preferably higher than or equal to GND and lower than or equal to VDD, for example. According to circumstances, $V_{ref}$ may be a potential lower than GND or a potential higher than VDD. Note that $V_{ref}$ is used as a reference potential (potential for comparison) in the comparator CMPa and the comparator CMPb.

A voltage between the first terminal and the second terminal of the resistor RE is determined in accordance with a current flowing from the wiring OL[j]. Thus, a voltage based on the resistance value of the resistor RE and the current is input to the first input terminal of the comparator CMPa. Similarly, a voltage between the first terminal and the second terminal of the resistor REB is determined in accordance with a current flowing from the wiring OLB[j]. Thus, a voltage based on the resistance value of the resistor REB and the current is input to the first input terminal of the comparator CMPb.

The comparator CMPa compares voltages input to the first input terminal and the second input terminal and outputs a signal from an output terminal of the comparator CMPa on the basis of the comparison result. For example, the comparator CMPa can output a high-level potential from the output terminal of the comparator CMPa in the case where the voltage ($V_{ref}$) input to the second input terminal is higher than the voltage input to the first input terminal, and can output a low-level potential from the output terminal of the comparator CMPa in the case where the voltage input to the first input terminal is higher than the voltage ($V_{ref}$) input to the second input terminal.

Like the comparator CMPa, the comparator CMPb compares voltages input to the first input terminal and the second input terminal and outputs a signal from an output terminal of the comparator CMPb on the basis of the comparison result. For example, the comparator CMPb can output a high-level potential from the output terminal of the comparator CMPb in the case where the voltage ($V_{ref}$) input to the second input terminal is higher than the voltage input to the first input terminal, and can output a low-level potential from the output terminal of the comparator CMPb in the case where the voltage input to the first input terminal is higher than the voltage ($V_{ref}$) input to the second input terminal.

At this time, the potentials output from the output terminals of the comparator CMPa and the comparator CMPb can each be expressed as the ternary output signal $z_j^{(k)}$, for example. For example, the output signal $z_j^{(k)}$ can be "+1" in the case where a high-level potential is output from the output terminal of the comparator CMPa and a low-level potential is output from the output terminal of the comparator CMPb; the output signal $z_j^{(k)}$ can be "−1" in the case where a low-level potential is output from the output terminal of the comparator CMPa and a high-level potential is output from the output terminal of the comparator CMPb; and the output signal $z_j^{(k)}$ can be "0" in the case where a low-level potential is output from the output terminal of the comparator CMPa and a low-level potential is output from the output terminal of the comparator CMPb.

Figure 6B:
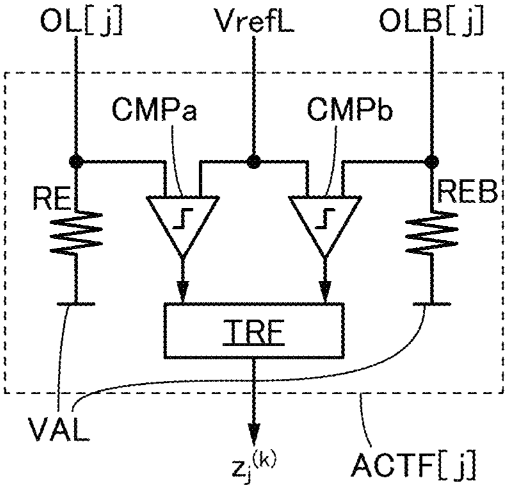

The circuit configuration of the circuit ACTF[j] is not limited to that illustrated in FIG. 6A and can be changed according to circumstances. For example, in the case where two output results of the comparator CMPa and the comparator CMPb are to be combined into one signal in the circuit ACTF[j] in FIG. 6A, a converter circuit TRF can be provided in the circuit ACTF[j]. FIG. 6B shows a configuration example of the circuit ACTF[j] in which the converter circuit TRF is provided in the circuit ACTF[j] in FIG. 6A, and the output terminals of the comparator CMPa and the comparator CMPb are electrically connected to input terminals of the converter circuit TRF. A specific example of the converter circuit TRF can be a digital-to-analog converter circuit (in this case, the signal $z_j^{(k)}$ is an analog value) or the like.

For example, the wiring VrefL electrically connected to the second input terminals of the comparator CMPa and the comparator CMPb in FIG. 6A may be replaced with separate wirings: a wiring Vref1L and a wiring Vref2L. In the circuit ACTF[j] in FIG. 6C, the second input terminal of the comparator CMPa included in the circuit ACTF[j] in FIG. 6A is electrically connected to not the wiring VrefL but the wiring Vref1L, and the second input terminal of the comparator CMPb is electrically connected to not the wiring VrefL but the wiring Vref2L. When potentials input to the wiring Vref1L and the wiring Vref2L have different values, reference potentials in the comparator CMPa and the comparator CMPb can be set independently.

Figure 6C:
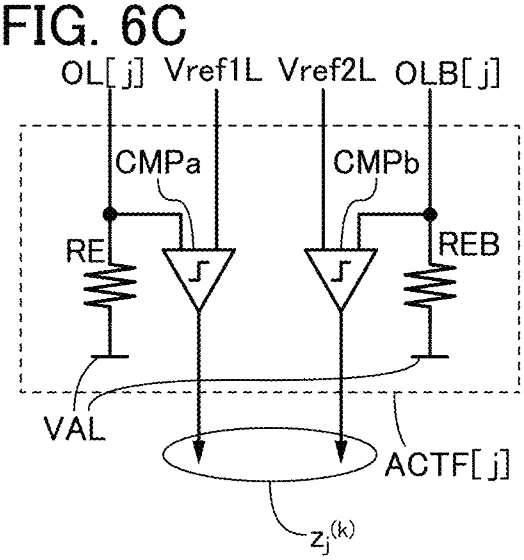

As another example, as a component different from the circuits ACTF[j] in FIG. 6A to FIG. 6C, an amplifier circuit, an impedance converter circuit, or the like may be used. For example, the circuit ACTF[j] illustrated in FIG. 6D can be used for the circuit AFP of the arithmetic circuit 110 in FIG. 2. The circuit ACTF[j] in FIG. 6D includes the resistor RE, the resistor REB, an operational amplifier OPa, and an operational amplifier OPb, and functions as an amplifier circuit.

The wiring OL[j] is electrically connected to the first terminal of the resistor RE and a non-inverting input terminal of the operational amplifier OPa, and the wiring OLB[j] is electrically connected to the first terminal of the resistor REB and a non-inverting input terminal of the operational amplifier OPb. An inverting input terminal of the operational amplifier OPa is electrically connected to an output terminal of the operational amplifier OPa, and an inverting input terminal of the operational amplifier OPb is electrically connected to an output terminal of the operational amplifier OPb. Furthermore, the second terminal of the resistor RE is electrically connected to the wiring VAL, and the second terminal of the resistor REB is electrically connected to the wiring VAL.

Figure 6D:
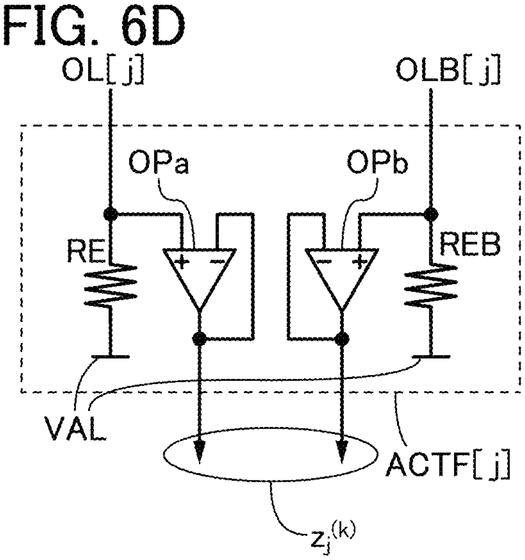

That is, the operational amplifier OPa and the operational amplifier OPb included in the circuit ACTF[j] in FIG. 6D have a connection configuration of a voltage follower. Accordingly, a potential output from the output terminal of the operational amplifier OPa is almost equal to a potential input to the non-inverting input terminal of the operational amplifier OPa, and a potential output from the output terminal of the operational amplifier OPb is almost equal to a potential input to the non-inverting input terminal of the operational amplifier OPb. In this case, the output signal $z_j^{(k)}$ is output from the circuit ACTF[j] as two analog values. Note that the output terminal of the operational amplifier OPa and the output terminal of the operational amplifier OPb may be connected to the input terminals of the comparator CMP. Then, output from the comparator CMP may be the output signal $z_j^{(k)}$.

As another example, as a component different from the circuits ACTF[j] in FIG. 6A to FIG. 6D, an integrator circuit, a current-to-voltage converter circuit, or the like may be used. Furthermore, an integrator circuit or a current-to-voltage converter circuit may be formed using an operational amplifier. For example, the circuit ACTF[j] illustrated in FIG. 6E can be used for the circuit AFP of the arithmetic circuit 110 in FIG. 2. The circuit ACTF[j] in FIG. 6E includes the operational amplifier OPa, the operational amplifier OPb, a load LEa, and a load LEb.

The wiring OL[j] is electrically connected to a first input terminal (e.g., the inverting input terminal) of the operational amplifier OPa and a first terminal of the load LEa, and the wiring OLB[j] is electrically connected to a first input terminal (e.g., the inverting input terminal) of the operational amplifier OPb and a first terminal of the load LEb. Moreover, a second input terminal (e.g., the non-inverting input terminal) of the operational amplifier OPa is electrically connected to the wiring Vref1L, and a second input terminal (e.g., the non-inverting input terminal) of the operational amplifier OPb is electrically connected to the wiring Vref2L. A second terminal of the load LEa is electrically connected to the output terminal of the operational amplifier OPa, and a second terminal of the load LEb is electrically connected to the output terminal of the operational amplifier OPb.

Note that the wiring Vref1L and the wiring Vref2L function as wirings that supply voltages equal to or different from each other. Thus, the wiring Vref1L and the wiring Vref2L can be combined into one wiring in some cases.

Figure 6E:
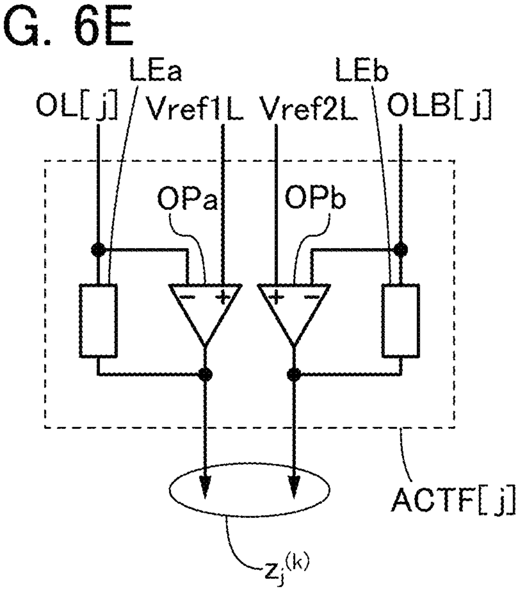

The load LEa and the load LEb of the circuit ACTF[j] in FIG. 6E can each be a resistor or a capacitor, for example. In particular, when a capacitor is used as each of the load LEa and the load LEb, a combination of the operational amplifier OPa and the load LEa and a combination of the operational amplifier OPb and the load LEb each function as an integrator circuit. In other words, charge is accumulated in each of the capacitors (the load LEa and the load LEb) in accordance with the amount of current flowing through the wiring OL[j] or the wiring OLB[j]. That is, the amount of current flowing from the wiring OL[j] and the wiring OLB[j] is integrated by the integrator circuit, the integrated amount of current is converted into a voltage, and the voltage is output as the signal $z_j^{(k)}$. Note that the output terminal of the operational amplifier OPa and the output terminal of the operational amplifier OPb may be connected to the input terminals of the comparator CMP. Then, output from the comparator CMP may be the output signal $z_j^{(k)}$. Note that a circuit for initializing charge accumulated in the load LEa and the load LEb that are the capacitors may be provided. For example, a switch may be provided in parallel to the load LEa (the capacitor). In other words, a second terminal of the switch may be connected to the output terminal of the operational amplifier OPa, and a first terminal of the switch may be connected to the wiring OL[j] and the first input terminal (e.g., the inverting input terminal) of the operational amplifier OPa.

In the circuit ACTF[j] in FIG. 6E, in the case where currents flowing from the wiring OL[j] and the wiring OLB[j] are each to be converted into a voltage to be output, a resistor can be used instead of a capacitor as each of the load LEa and the load LEb.

Figure 6F:
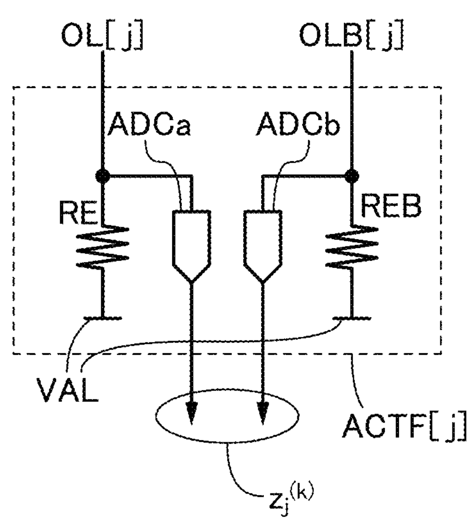

As another example, as a component different from the circuits ACTF[j] in FIG. 6A to FIG. 6E, the circuit ACTF[j]

illustrated in FIG. 6F can be used for the circuit AFP of the arithmetic circuit 110 in FIG. 2. The circuit ACTF[j] in FIG. 6F includes the resistor RE, the resistor REB, an analog-to-digital converter circuit ADCa, and an analog-to-digital converter circuit ADCb.

The wiring OL[j] is electrically connected to an input terminal of the analog-to-digital converter circuit ADCa and the first terminal of the resistor RE, and the wiring OLB[j] is electrically connected to an input terminal of the analog-to-digital converter circuit ADCb and the first terminal of the resistor REB. The second terminal of the resistor RE is electrically connected to the wiring VAL, and the second terminal of the resistor REB is electrically connected to the wiring VAL.

In the circuit ACTF[j] in FIG. 6F, the potentials of the first terminals of the resistor RE and the resistor REB are determined in accordance with currents flowing from the wirings OL[j] and OLB[j]. The circuit ACTF[j] has a function of converting the potential that is an analog value into a binary, ternary, or higher-level (e.g. 256-level) digital value by the analog-to-digital converter circuit ADCa and the analog-to-digital converter circuit ADCb and outputting the digital value as the signal $z_j^{(k)}$.

Note that as in FIG. 5B and FIG. 5C, the resistor RE and the resistor REB illustrated in FIG. 6A to FIG. 6D and FIG. 6F can be replaced with the capacitor CE and the capacitor CEB or the diode element DE and the diode element DEB. Specifically, in the case where the resistor RE and the resistor REB illustrated in FIG. 6A to FIG. 6D and FIG. 6F are replaced with the capacitor CE and the capacitor CEB, further providing the switch S01*a* and the switch S01*b* as in FIG. 5E allows potentials input from the wiring OL[j] and the wiring OLB[j] to be held.

Figure 7:
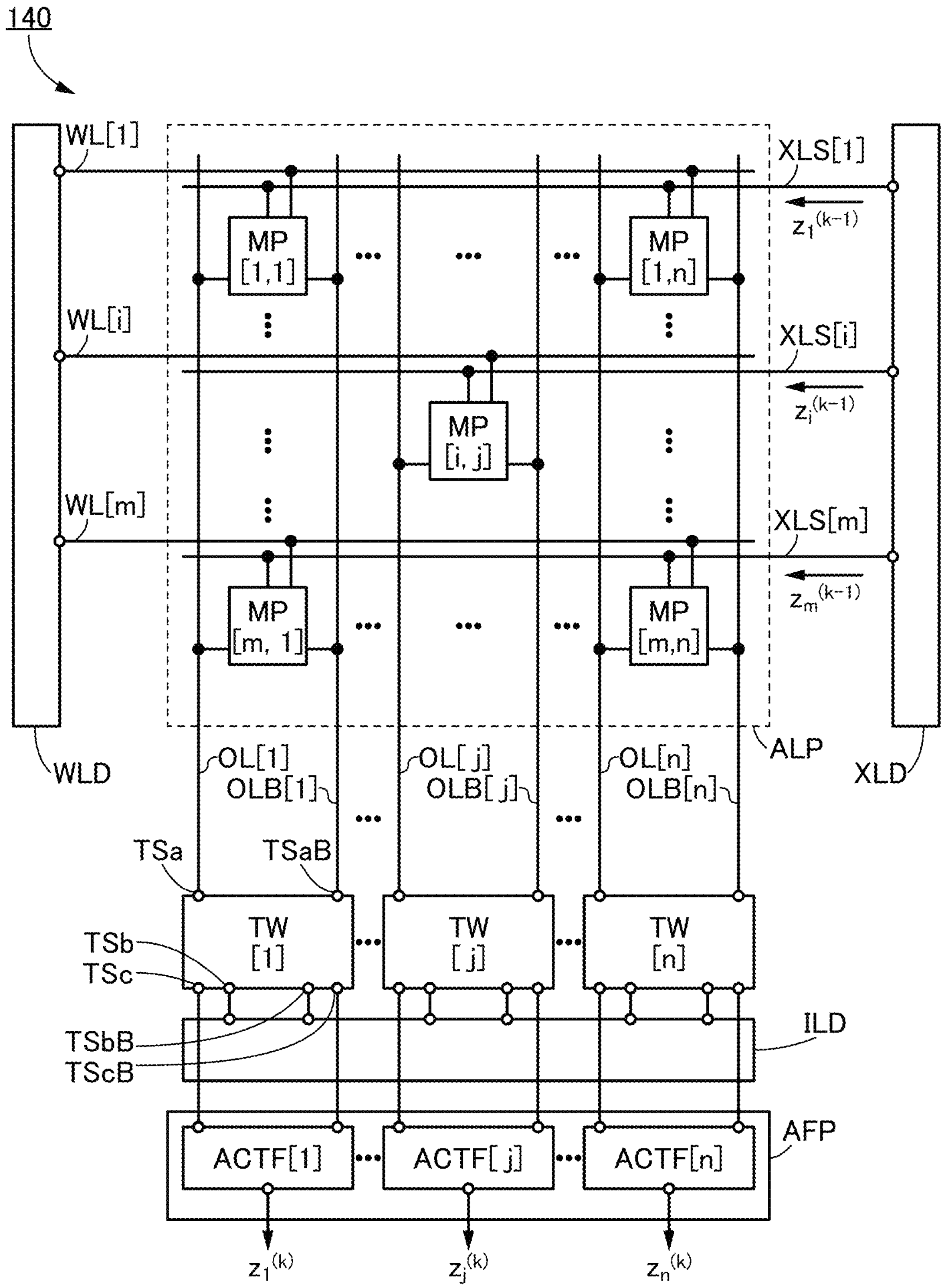
FIG. 7 is a circuit diagram illustrating a configuration example of a semiconductor device.

Although the arithmetic circuit 110, the arithmetic circuit 120, and the arithmetic circuit 130 illustrated in FIG. 2 to FIG. 4 each show an example of the case where the wiring IL, the wiring ILB, the wiring OL, and the wiring OLB are provided, one embodiment of the present invention is not limited thereto. For example, the arithmetic circuit 110, the arithmetic circuit 120, and the arithmetic circuit 130 may each have a configuration in which the wiring IL and the wiring OL are combined into one wiring and the wiring ILB and the wiring OLB are combined into one wiring. FIG. 7 shows a specific configuration in that case. An arithmetic circuit 140 illustrated in FIG. 7 includes a switching circuit TW[1] to a switching circuit TW[n].

The switching circuit TW[1] to the switching circuit TW[n] each include a terminal TSa, a terminal TSaB, a terminal TSb, a terminal TSbB, a terminal TSc, and a terminal TScB.

The terminal TSa is electrically connected to the wiring OL[j], the terminal TSb is electrically connected to the circuit ILD, and the terminal TSc is electrically connected to the circuit ACTF[j]. The terminal TSaB is electrically connected to the wiring OLB[j], the terminal TSbB is electrically connected to the circuit ILD, and the terminal TScB is electrically connected to the circuit ACTF[j].

The switching circuit TW[j] has a function of establishing electrical continuity between the terminal TSa and one of the terminal TSb and the terminal TSc, and breaking electrical continuity between the terminal TSa and the other of the terminal TSb and the terminal TSc. In addition, the switching circuit TW[j] has a function of establishing electrical continuity between the terminal TSaB and one of the terminal TSbB and the terminal TScB, and breaking electrical continuity between the terminal TSaB and the other of the terminal TSbB and the terminal TScB.

That is, in the case where information (e.g., a potential, a resistance value, or a current value) corresponding to the first data $w_1{}^{(k-1)}{}_l{}^{(k)}$ to $w_m{}^{(k-1)}{}_n{}^{(k)}$ that are weight coefficients is to be input to any one of the circuit MP[1,*j*] to the circuit MP[m,j], electrical continuity is established between the terminal TSa and the terminal TSb and electrical continuity is established between the terminal TSaB and the terminal TSbB in the switching circuit TW[j], whereby information (e.g., a potential, a resistance value, or a current value) corresponding to the first data $w_1{}^{(k-1)}{}_l{}^{(k)}$ to $w_m{}^{(k-1)}{}_n{}^{(k)}$ can be supplied from the circuit ILD to any one of the circuit MP[1,*j*] to the circuit MP[m,j] through the wiring OL[j] or the wiring OLB[j].

In the case where the circuit ACTF[j] needs to obtain the sum result of the products (Formula (1.2)) of the weight coefficients and the signals of neurons calculated by the circuit MP[1,*j*] to the circuit MP[m,j], electrical continuity is established between the terminal TSa and the terminal TSc and electrical continuity is established between the terminal TSaB and the terminal TScB in the switching circuit TW[j], whereby information (e.g., a potential, a resistance value, or a current value) corresponding to the product-sum result can be supplied from the wiring OL[j] and the wiring OLB[j] to the circuit ACTF[j]. Then, the value of the activation function is calculated from the input product-sum result in the circuit ACTF[j], whereby the signal $z_j^{(k)}$ can be obtained as the output signal of the neuron.

Figure 8A:
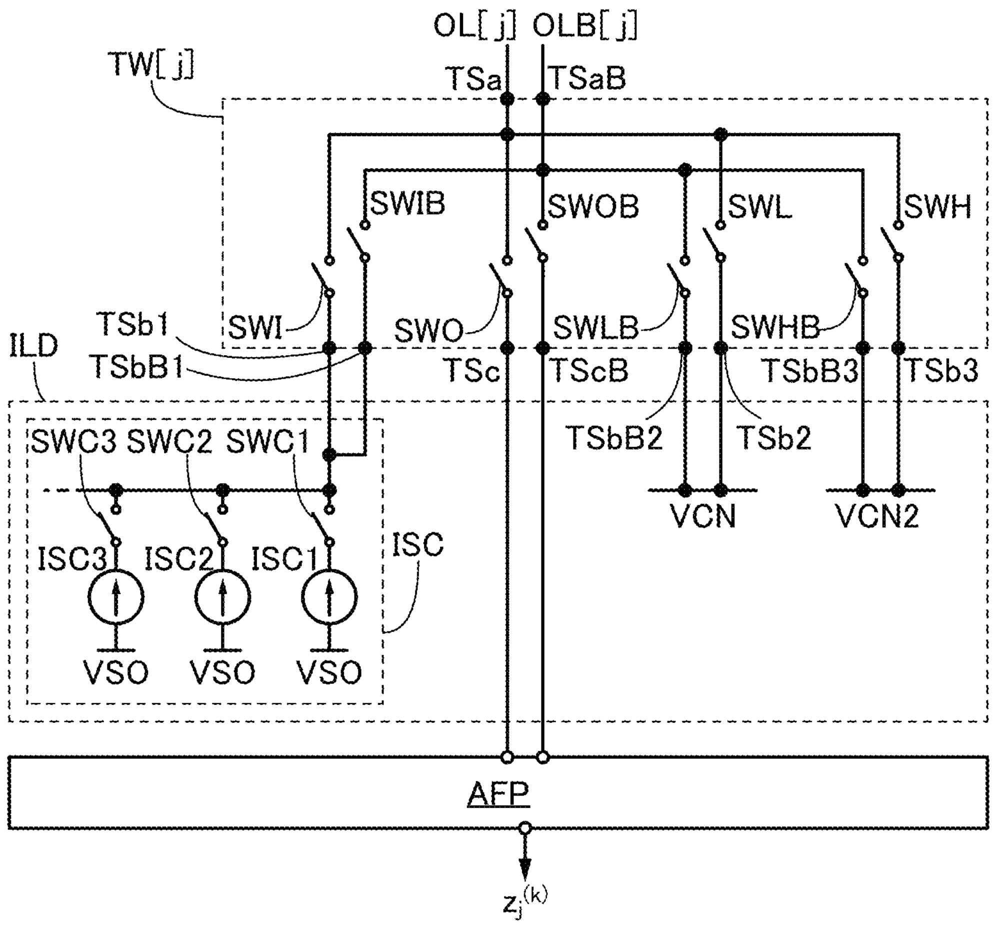
FIG. 8A to FIG. 8D are circuit diagrams each illustrating a configuration example of a circuit included in a semiconductor device.

Next, the switching circuit TW[j] and the circuit ILD that are included in the arithmetic circuit 140 are described. FIG. 8A shows configuration examples of the switching circuit TW[j] and the circuit ILD that can be applied to the arithmetic circuit 140. Note that FIG. 8A illustrates the wiring OL[j], the wiring OLB[j], and the circuit AFP to show an electrical connection configuration of the switching circuit TW[j] and the circuit ILD.

The switching circuit TW[j] includes a switch SWI, a switch SWIB, a switch SWO, a switch SWOB, a switch SWL, a switch SWLB, a switch SWH, and a switch SWHB, for example.

The circuit ILD includes a current source circuit ISC, for example. However, one embodiment of the present invention is not limited thereto. For example, a voltage source circuit may be provided instead of the current source circuit ISC. The current source circuit ISC has a function of supplying, to the wiring OL[j] and/or the wiring OLB[j], a current corresponding to a weight coefficient (the first data) to be input to the circuit MP. Note that at least one current source circuit ISC as a circuit for the wiring OL[j] and at least one current source circuit ISC as a circuit for the wiring OLB[j] may be separately provided. Alternatively, as illustrated in FIG. 8A, at least one current source circuit ISC may be provided for a set of wirings of the wiring OL[j] and the wiring OLB[j].

The current source circuit ISC includes one or a plurality of constant current sources; for example, a constant current source circuit ISC1, a constant current source circuit ISC2, and a constant current source circuit ISC3 are included as the plurality of constant current sources in FIG. 8A. In addition, the current source circuit ISC includes a plurality of switches for selecting the plurality of constant current sources, for example; a switch SWC1, a switch SWC2, and a switch SWC3 are included as the plurality of switches in FIG. 8A. Note that in the case where the current source circuit ISC includes only one constant current source, the current source circuit ISC does not necessarily include the switch. In the case where the constant current source circuit ISC1, the constant current source circuit ISC2, and the constant current source circuit ISC3 each have a function of controlling whether or not to output a current, the switch SWC1, the switch SWC2, and the switch SWC3 are not necessarily provided.

Note that currents flowing to the wiring OL[j] and the wiring OLB[j] are preferably generated in the same current source circuit ISC, as shown in FIG. 8A. In the case where currents supplied to the wiring OL[j] and the wiring OLB[j] are generated in different current source circuits, variations in the transistor characteristics due to the manufacturing process of the transistors or the like might occur; thus, a difference in the performance may arise with the different current source circuits. On the other hand, in the case where the same current source circuit is used, the same amount of current can be supplied to the wiring OL[j] and the wiring OLB[j], leading to higher arithmetic operation accuracy.

Note that as each of the switch SWI, the switch SWIB, the switch SWO, the switch SWOB, the switch SWL, the switch SWLB, the switch SWH, the switch SWHB, the switch SWC1, the switch SWC2, and the switch SWC3 illustrated in FIG. 8A, an electrical switch such as an analog switch or a transistor, a mechanical switch, or the like can be used, as in the case of the switch S01*a* and the switch S01*b*.

In an example of the switching circuit TW[j], the terminal TSa is electrically connected to a first terminal of the switch SWI, a first terminal of the switch SWO, a first terminal of the switch SWL, and a first terminal of the switch SWH. The terminal TSaB is electrically connected to a first terminal of the switch SWIB, a first terminal of the switch SWOB, a first terminal of the switch SWLB, and a first terminal of the switch SWHB. A second terminal of the switch SWI is electrically connected to a terminal TSb1. A second terminal of the switch SWIB is electrically connected to a terminal TSbB1. A second terminal of the switch SWO is electrically connected to the terminal TSc. A second terminal of the switch SWOB is electrically connected to the terminal TScB. A second terminal of the switch SWL is electrically connected to a terminal TSb2. A second terminal of the switch SWLB is electrically connected to a terminal TSbB2. A second terminal of the switch SWH is electrically connected to a terminal TSb3. A second terminal of the switch SWHB is electrically connected to a terminal TSbB3.

The terminal TSb1, the terminal TSb2, and the terminal TSb3 illustrated in FIG. 8A correspond to the terminal TSb illustrated in FIG. 7. The terminal TSbB1, the terminal TSbB2, and the terminal TSbB3 illustrated in FIG. 8A correspond to the terminal TSbB illustrated in FIG. 7.

In the current source circuit ISC included in the circuit ILD, the terminal TSb1 is electrically connected to a first terminal of the switch SWC1, a first terminal of the switch SWC2, and a first terminal of the switch SWC3. The terminal TSbB1 is electrically connected to the first terminal of the switch SWC1, the first terminal of the switch SWC2, and the first terminal of the switch SWC3. A second terminal of the switch SWC1 is electrically connected to an output terminal of the constant current source circuit ISC1, a second terminal of the switch SWC2 is electrically connected to an output terminal of the constant current source circuit ISC2, and a second terminal of the switch SWC3 is electrically connected to an output terminal of the constant current source circuit ISC3. An input terminal of the constant current source circuit ISC1, an input terminal of the constant current source circuit ISC2, and an input terminal of the constant current source circuit ISC3 are electrically connected to a wiring VSO.

FIG. 8A employs a configuration in which the output terminal of each of the constant current source circuit ISC1, the constant current source circuit ISC2, and the constant current source circuit ISC3 is electrically connected to the terminal of the corresponding switch and the input terminal is electrically connected to the wiring VSO; however, one embodiment of the present invention is not limited thereto. For example, a configuration may be employed in which the input terminal of each of the constant current source circuit ISC1, the constant current source circuit ISC2, and the constant current source circuit ISC3 is electrically connected to the terminal of the corresponding switch and the output terminal is electrically connected to the wiring VSO. Note that a wiring VCN2 may be provided in order to input a constant potential to the wiring OL[j] and the wiring OLB[j] before the circuit MP outputs a current. The wiring VCN2 is connected to the wiring OL[j] through the switch SWH. In addition, the wiring VCN2 is connected to the wiring OLB[j] through the switch SWHB. The wiring VCN2 can supply a potential different from a potential that an after-mentioned wiring VCN supplies. For example, in the case where VSS or a ground potential is supplied to the wiring VCN, VDD or the like may be supplied to the wiring VCN2. By supplying the constant potential of the wiring VCN2 to the wiring OL[j] and the wiring OLB[j], the constant potential can be supplied to the circuit elements included in the circuit MP.

Figure 8B:
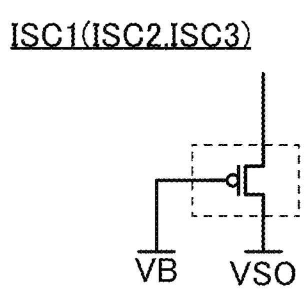
Figure 8C:
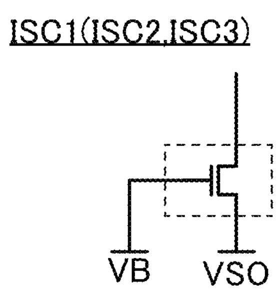

FIG. 8B and FIG. 8C show specific configuration examples of the constant current source circuit ISC1, the constant current source circuit ISC2, and the constant current source circuit ISC3. The constant current source circuit ISC1 (the constant current source circuit ISC2 or the constant current source circuit ISC3) illustrated in FIG. 8B includes a p-channel transistor. A first terminal of the transistor is electrically connected to the wiring VSO, a second terminal of the transistor is electrically connected to the second terminal of the switch SWC1 (the switch SWC2 or the switch SWC3), and a gate of the transistor is electrically connected to a wiring VB. The constant current source circuit ISC1 (the constant current source circuit ISC2 or the constant current source circuit ISC3) illustrated in FIG. 8C includes an n-channel transistor. A first terminal of the transistor is electrically connected to the wiring VSO, a second terminal of the transistor is electrically connected to the second terminal of the switch SWC1 (the switch SWC2 or the switch SWC3), and a gate of the transistor is electrically connected to the wiring VB. In the constant current source circuit ISC1 (the constant current source circuit ISC2 or the constant current source circuit ISC3) in each of FIG. 8B and FIG. 8C, the wiring VB functions as a wiring for inputting a bias voltage to the gate of the transistor. Note that a pulse signal may be supplied to the wiring VB. This makes it possible to control whether to output a current from the constant current source circuit. In that case, the switch SWC1, the switch SWC2, and the switch SWC3 are not necessarily provided. Alternatively, an analog voltage may be supplied to the wiring VB. This makes it possible to supply an analog current from the constant current source circuit.

The wiring VSO functions as a wiring for supplying a constant voltage to the constant current source circuit ISC1, the constant current source circuit ISC2, and the constant current source circuit ISC3. For example, in the case where a current is supplied from the circuit ILD to the wiring OL or the wiring OLB through the switching circuit TW[j], the constant voltage is preferably a potential higher than a ground potential (e.g., VDD), and it is further preferable to use the constant current source circuit ISC1 (the constant current source circuit ISC2 or the constant current source circuit ISC3) illustrated in FIG. 8B. Alternatively, for example, in the case where a current is supplied from the circuit ILD to the wiring OL or the wiring OLB through the switching circuit TW[j], the constant voltage is preferably a ground potential, a potential higher than a ground potential and lower than the high-level potential, or the like, and it is further preferable to use the constant current source circuit ISC1 (the constant current source circuit ISC2 or the constant current source circuit ISC3) illustrated in FIG. 8C. Note that in this specification, a current flowing from the circuit ILD to the wiring OL or the wiring OLB through the switching circuit TW[j] is referred to as a positive current in some cases. Thus, a current flowing from the wiring OL or the wiring OLB to the circuit ILD through the switching circuit TW[j] is referred to as a negative current in some cases.

Figure 8D:
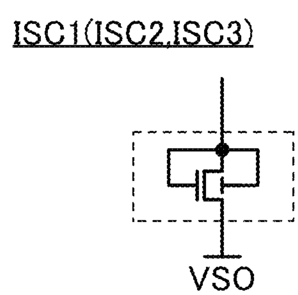

Other than the circuits in FIG. 8B and FIG. 8C, a circuit configuration illustrated in FIG. 8D, for example, is applicable to the constant current source circuit ISC1, the constant current source circuit ISC2, and the constant current source circuit ISC3. The constant current source circuit ISC1 (the constant current source circuit ISC2 or the constant current source circuit ISC3) illustrated in FIG. 8D includes an n-channel transistor having a back gate. A first terminal of the transistor is electrically connected to the wiring VSO, and a second terminal of the transistor is electrically connected to a gate and the back gate of the transistor and the second terminal of the switch SWC1 (the switch SWC2 or the switch SWC3).

Here, when a constant voltage supplied from the wiring VSO is a high-level potential, the high-level potential is input to the first terminal of the transistor illustrated in FIG. 8D. The potential of the second terminal of the transistor is lower than the high-level potential. At this time, the first terminal of the transistor functions as a drain, and the second terminal of the transistor functions as a source. Since the gate and the second terminal of the transistor are electrically connected to each other, the gate-source voltage of the transistor becomes 0 V. Therefore, in the case where the threshold voltage of the transistor is within an appropriate range, the transistor operates in the subthreshold region and a current in the subthreshold region (a drain current) flows between the first terminal and the second terminal of the transistor. The amount of the current is preferably smaller than or equal to $1.0\times10^{-8}$ A, further preferably smaller than or equal to $1.0\times10^{-12}$ A, still further preferably smaller than or equal to $1.0\times10^{-15}$ A, for example, when the transistor is an OS transistor. For example, the current is further preferably within a range where the current exponentially increases with respect to the gate-source voltage. That is, the transistor functions as a current source for supplying a current within a current range where the transistor operates in the subthreshold region.

Alternatively, in the case of FIG. 8B, given that the terminal on the wiring VSO side is the source in the transistor in FIG. 8B, the potential of the wiring VB may be the same as the potential of the wiring VSO or higher than the potential of the wiring VSO. That is, the transistor can operate in the subthreshold region by decreasing the absolute value of the gate-source voltage. Alternatively, the transistor can operate in the subthreshold region by setting the gate-source voltage to a positive value or a voltage higher than the threshold voltage. Note that one embodiment of the present invention is not limited thereto. For example, the transistor illustrated in FIG. 8B may operate in the saturation region. Alternatively, the transistor illustrated in FIG. 8B may operate around the boundary between the saturation region and the subthreshold region.

In this specification and the like, when the threshold voltage of the transistor is denoted as $V_{th}$, "around the boundary between the saturation region and the subthreshold region" includes the case where the gate-source voltage is higher than or equal to $V_{th}-1.0$ V, higher than or equal to $V_{th}-0.5$ V, or higher than or equal to $V_{th}-0.1$ V and lower than or equal to $V_{th}+0.1$ V, lower than or equal to $V_{th}+0.5$ V, or lower than or equal to $V_{th}+1.0$ V, for example. Note that any of the lower limits and the upper limits described above can be combined with each other.

The case of FIG. 8C is similar to the case of FIG. 8B. That is, in the case of FIG. 8C, given that the terminal on the wiring VSO side is the source in the transistor in FIG. 8C, the potential of the wiring VB may be the same as the potential of the wiring VSO or lower than the potential of the wiring VSO. That is, the transistor can operate in the subthreshold region by decreasing the absolute value of the gate-source voltage. Alternatively, the transistor can operate in the subthreshold region by setting the gate-source voltage to a negative value or a voltage lower than the threshold voltage. Note that one embodiment of the present invention is not limited thereto. For example, the transistor illustrated in FIG. 8C may operate in the saturation region. Alternatively, the transistor illustrated in FIG. 8C may operate around the boundary between the saturation region and the subthreshold region.

When a current flowing from the constant current source circuit ISC1 has $I_{ut}$, a current flowing from the constant current source circuit ISC2 preferably has $2I_{ut}$ and a current flowing from the constant current source circuit ISC3 preferably has $4I_{ut}$, for example. That is, in the case where the current source circuit ISC includes P constant current sources (P is an integer greater than or equal to 1), a current flowing from the p-th constant current source (p is an integer greater than or equal to 1 and less than or equal to P) preferably has $2^{(p-1)}\times I_{ut}$. The amount of current flowing from the current source circuit ISC can be changed in this manner.

For example, the number of constant current sources in the current source circuit ISC is set to three (P=3). In the case where a current of ut is to flow to the wiring OL[j], the switch SWI is turned on and the switch SWIB is turned off, and then the switch SWC1 is turned on and the switch SWC2 and the switch SWC3 are turned off. In the case where a current of $5I_{ut}$ is to flow to the wiring OL[j], the switch SWC1 and the switch SWC3 are turned on and the switch SWC2 is turned off. That is, the current source circuit ISC can output a current having any one of eight levels ("0", "$I_{ut}$", "$2I_{ut}$", "$3I_{ut}$", "$4I_{ut}$", "$5I_{ut}$", "$6I_{ut}$", and "$7I_{ut}$"). Note that in the case where a current with larger than eight levels is to be output, the number of constant current sources is set to four or more. Similarly, by turning off the switch SWI and turning on the switch SWIB, a current having any one of the eight levels can flow to the wiring OLB[j]. Note that in the case where the current source circuit ISC does not output a current, the switch SWI and the switch SWIB of the switching circuit TW may be turned off without turning off the switch SWC1 to the switch SWC3 of the current source circuit ISC. By providing a plurality of constant current sources in this manner, the current source circuit ISC can output a current amount corresponding to a control signal (a digital value) for switching the on state and the off state of each switch. In other words, the current source circuit ISC performs digital-to-analog (DA) conversion of the control signal into the current amount. Note that the current source circuit may be configured to freely change a current value output from the current source circuit as an analog value, and the circuit ILD may include only one current source circuit with that configuration.

Note that in the above example, a current flowing from the p-th constant current source has $2^{(p-1)}\times I_{ut}$ in the case where the current source circuit ISC includes P constant current sources; however, one embodiment of the present invention is not limited thereto. For example, a current flowing from the constant current source circuit ISC1, a current flowing from the constant current source circuit ISC2, and a current flowing from the constant current source circuit ISC3 may all have the same amount. For example, in the case where the current output from the current source circuit ISC has eight levels, the amount of current output from the current source circuit ISC may be controlled in the following manner: the number of constant current sources in the current source circuit ISC is seven (P=7), currents from the constant current sources in the current source circuit ISC are all set to have the same amount, and how many current sources will output a current is controlled.

In the circuit ILD, the terminal TSb2 is electrically connected to the wiring VCN and the terminal TSbB2 is electrically connected to the wiring VCN.

The wiring VCN functions as a wiring for supplying a constant voltage to the wiring OL[j] and/or the wiring OLB[j]. In the case where a current (positive current) is supplied from the circuit ILD to the wiring OL or the wiring OLB through the switching circuit TW[j], for example, a constant voltage supplied from the wiring VCN is preferably a low-level potential (e.g., VSS). In the case where a current (negative current) is supplied from the wiring OL or the wiring OLB to the circuit ILD through the switching circuit TW[j], for example, a constant potential supplied from the wiring VCN is preferably a high-level potential. Note that in the case where a capacitor C3 is connected to a source terminal of a transistor M1 or the like and the source terminal is not connected to a power supply line or the like as illustrated in FIG. 42 to FIG. 45 and the like that will be described later, a constant voltage supplied from the wiring VCN is preferably a high-level potential (e.g., VDD) when a positive current is supplied from the circuit ILD to the wiring OL or the wiring OLB through the switching circuit TW[j]. That is, when a constant voltage is supplied from the wiring VCN, a potential difference between both ends of the capacitor C3 is desirably close to zero. In other words, a potential that does not allow a circuit MC to output a current is desirably supplied to the wiring VCN.

In the circuit ILD, the terminal TSb3 is electrically connected to the wiring VCN2 and the terminal TSbB3 is electrically connected to the wiring VCN2.

The wiring VCN2 functions as a wiring for supplying a constant voltage to the wiring OL[j] and/or the wiring OLB[j]. In the case where a current (positive current) is supplied from the circuit ILD to the wiring OL or the wiring OLB through the switching circuit TW[j], for example, a constant voltage supplied from the wiring VCN is preferably a high-level potential (e.g., VDD). In the case where a current (negative current) is supplied from the wiring OL or the wiring OLB to the circuit ILD through the switching circuit TW[j], for example, a constant potential supplied from the wiring VCN is preferably a low-level potential.

By switching the on state and the off state of each of the switch SWI, the switch SWIB, the switch SWO, the switch SWOB, the switch SWL, the switch SWLB, the switch SWH, and the switch SWHB, the switching circuit TW[j] can change a circuit that establishes electrical continuity with the wiring OL[j] and the wiring OLB[j].

Here, a weight coefficient input to the circuit MP is described.

When a positive weight coefficient is to be input to the circuit MP, a current corresponding to the weight coefficient is input to the wiring OL[j] and a constant potential supplied from the wiring VCN is input to the wiring OLB[j]. For example, electrical continuity is established between the current source circuit ISC and the wiring OL[j], electrical continuity is not established between the current source circuit ISC and the wiring OLB[j], electrical continuity is not established between the circuit AFP and the wiring OL[j], electrical continuity is not established between the circuit AFP and the wiring OLB[j], electrical continuity is not established between the wiring VCN and the wiring OL[j], electrical continuity is established between the wiring VCN and the wiring OLB[j], electrical continuity is not established between the wiring VCN2 and the wiring OL[j], and electrical continuity is not established between the wiring VCN2 and the wiring OLB[j]. That is, in the switching circuit TW[j], the switches SWI and SWLB are turned on, and the switch SWIB, the switch SWO, the switch SWOB, the switch SWL, the switch SWH, and the switch SWHB are turned off. Accordingly, electrical continuity is established between the current source circuit ISC and the wiring OL[j], so that a current can flow from the current source circuit ISC to the circuit MP through the wiring OL[j]. When the number of constant current sources in the current source circuit ISC is P, the current has any one of $2^P-1$ levels (zero current is not included). Since the positive weight coefficient input to the circuit MP is determined in accordance with the current, the weight coefficient can have any one of $2^P-1$ values. In addition, electrical continuity is established between the wiring VCN and the wiring OLB[j], so that a constant voltage is input from the wiring VCN to the wiring OLB[j].

When a negative weight coefficient is to be input to the circuit MP, a current corresponding to the weight coefficient is input to the wiring OLB[j] and a constant potential supplied from the wiring VCN is input to the wiring OL[j]. For example, electrical continuity is not established between the current source circuit ISC and the wiring OL[j], electrical continuity is established between the current source circuit ISC and the wiring OLB[j], electrical continuity is not established between the circuit AFP and the wiring OL[j], electrical continuity is not established between the circuit AFP and the wiring OLB[j], electrical continuity is established between the wiring VCN and the wiring OL[j], electrical continuity is not established between the wiring VCN and the wiring OLB[j], electrical continuity is not established between the wiring VCN2 and the wiring OL[j], and electrical continuity is not established between the wiring VCN2 and the wiring OLB[j]. That is, in the switching circuit TW[j], the switch SWIB and the switch SWL are turned on, and the switch SWI, the switch SWO, the switch SWOB, the switch SWLB, the switch SWH, and the switch SWHB are turned off. Accordingly, electrical continuity is established between the current source circuit ISC and the wiring OLB[j], so that a current can flow from the current source circuit ISC to the circuit MP through the wiring OLB[j]. When the number of constant current sources in the current source circuit ISC is P, the current has any one of $2^P-1$ levels (zero current is not included). Since the negative weight coefficient input to the circuit MP is determined in accordance with the current, the weight coefficient can have any one of $2^P-1$ values. In addition, electrical continuity is established between the wiring VCN and the wiring OL[j], so that a constant voltage is input from the wiring VCN to the wiring OL[j].

When a weight coefficient of 0 is to be input to the circuit MP, a constant potential supplied from the wiring VCN is input to each of the wiring OL[j] and the wiring OLB[j]. For example, electrical continuity is not established between the current source circuit ISC and the wiring OL[j], electrical continuity is not established between the current source circuit ISC and the wiring OLB[j], electrical continuity is not established between the circuit AFP and the wiring OL[j], electrical continuity is not established between the circuit AFP and the wiring OLB[j], electrical continuity is established between the wiring VCN and the wiring OL[j], electrical continuity is established between the wiring VCN and the wiring OLB[j], electrical continuity is not established between the wiring VCN2 and the wiring OL[j], and electrical continuity is not established between the wiring VCN2 and the wiring OLB[j]. That is, in the switching circuit TW[j], the switch SWL and the switch SWLB are turned on, and the switch SWI, the switch SWIB, the switch SWO, the switch SWOB, the switch SWH, and the switch SWHB are turned off. Accordingly, electrical continuity is established between the wiring VCN and the wiring OL[j] and electrical continuity is established between the wiring VCN and the wiring OLB[j], so that a constant voltage is input from the wiring VCN to the wirings OL[j] and OLB[j].

That is, when the number of constant current sources in the current source circuit ISC is P, the number of weight coefficients (a positive weight coefficient, a negative weight coefficient, and a weight coefficient of 0) that can be input to the circuit MP is $2^{P+1}-1$.

Next, the case where information (e.g., a potential or a current) is supplied from the circuit MP to the circuit AFP is described.

Before information (e.g., a potential or a current) is supplied from the circuit MP to the circuit AFP, the wiring OL[j] and the wiring OLB[j] are preferably set to have a predetermined potential. For example, in the case where a positive current flows from the circuit AFP to the circuit MP through the wiring OL or the wiring OLB, the predetermined potential is preferably a high-level potential. As another example, in the case where a positive current flows from the circuit MP to the circuit AFP through the wiring OL or the wiring OLB, the predetermined potential is preferably a low-level potential. Thus, before information (e.g., a potential or a current) is supplied from the circuit MP to the circuit AFP, for example, electrical continuity is not established between the current source circuit ISC and the wiring OL[j], electrical continuity is not established between the current source circuit ISC and the wiring OLB[j], electrical continuity is not established between the circuit AFP and the wiring OL[j], electrical continuity is not established between the circuit AFP and the wiring OLB[j], electrical continuity is not established between the wiring VCN and the wiring OL[j], electrical continuity is not established between the wiring VCN and the wiring OLB[j], electrical continuity is established between the wiring VCN2 and the wiring OL[j], and electrical continuity is established between the wiring VCN2 and the wiring OLB[j]. That is, in the switching circuit TW[j], the switch SWH and the switch SWHB are turned on, and the switch SWI, the switch SWIB, the switch SWO, the switch SWOB, the switch SWL, and the switch SWLB are turned off. Accordingly, electrical continuity is established between the wiring OL[j] and the wiring VCN2 and electrical continuity is established between the wiring OLB[j] and the wiring VCN2, so that a constant voltage is input from the wiring VCN2 to the wiring OL[j] and the wiring OLB[j].

When information (e.g., a potential or a current) is supplied from the circuit MP[i,j] to the circuit AFP, for example, electrical continuity is not established between the current source circuit ISC and the wiring OL[j], electrical continuity is not established between the current source circuit ISC and the wiring OLB[j], electrical continuity is established between the circuit AFP and the wiring OL[j], electrical continuity is established between the circuit AFP and the wiring OLB[j], electrical continuity is not established between the wiring VCN and the wiring OL[j], electrical continuity is not established between the wiring VCN and the wiring OLB[j], electrical continuity is not established between the wiring VCN2 and the wiring OL[j], and electrical continuity is not established between the wiring VCN2 and the wiring OLB[j]. That is, in the switching circuit TW[j], the switch SWO and the switch SWOB are turned on, and the switch SWI, the switch SWIB, the switch SWL, the switch SWLB, the switch SWH, and the switch SWHB are turned off. Accordingly, electrical continuity is established between the circuit AFP and the circuit MP[i,j], so that information (e.g., a potential or a current) can be supplied from the circuit MP[i,j] to the circuit AFP.

As described above, with the circuit ILD and the switching circuit TW[j] having the configurations illustrated in FIG. 8A, the same current source circuit ISC can be used to make a predetermined current flow to the wiring OL[j] and the wiring OLB[j]; thus, influences of variations in characteristics of current sources on the wiring OL[j] and the wiring OLB[j] can be reduced.

<<Circuit MP>>

Next, configuration examples of the circuit MP[i,j] included in the arithmetic circuit 110, the arithmetic circuit 120, the arithmetic circuit 130, and the arithmetic circuit 140 are described.

Figure 9A:
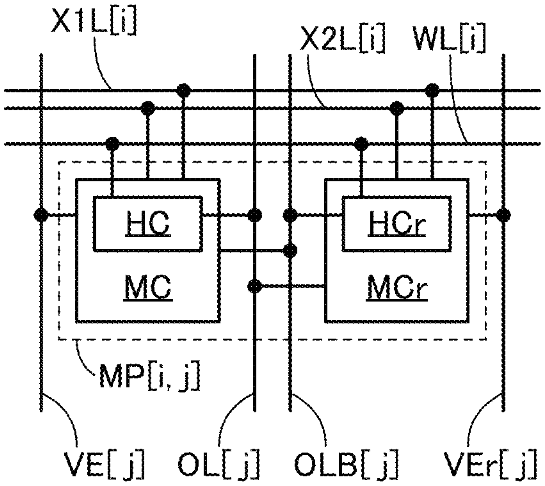
FIG. 9A to FIG. 9F are circuit diagrams each illustrating a configuration example of a circuit included in a semiconductor device.

FIG. 9A shows a configuration example of the circuit MP[i,j] that can be used for the arithmetic circuit 140, and the circuit MP[i,j] includes the circuit MC and a circuit MCr, for example. The circuit MC and the circuit MCr are circuits that calculate the product of a weight coefficient and an input signal from a neuron (an arithmetic value) in the circuit MP. The circuit MC can have a configuration similar to that of the circuit MCr or a configuration different from that of the circuit MCr. Thus, "r" is added to the reference numeral to differentiate the circuit MCr from the circuit MC. In addition, "r" is added to the reference numerals of after-mentioned circuit elements included in the circuit MCr.

The circuit MC includes a circuit HC and the circuit MCr includes a circuit HCr, for example. The circuit HC and the circuit HCr each have a function of holding information (e.g., a potential, a resistance value, or a current value). Note that the first data $w_i^{(k-1)}{}_j^{(k)}$ set in the circuit MP[i,j] is determined in accordance with information (e.g., a potential, a resistance value, or a current value) held in the circuit HC and the circuit HCr. Therefore, the circuit HC and the circuit HCr are electrically connected to the wiring OL[j] and the wiring OLB[j] that supply information (e.g., a potential, a resistance value, or a current value) corresponding to the first data $w_i^{(k-1)}{}_j^{(k)}$.

In FIG. 9A, the circuit MP[i,j] is electrically connected to a wiring VE[j] and a wiring VEr[j]. The wiring VE[j] and the wiring VEr[j] each function as a wiring for supplying a constant voltage. The wiring VE[j] also functions as a wiring for releasing a current from the wiring OL through the circuit MC. The wiring VEr[j] also functions as a wiring for releasing a current from the wiring OLB through the circuit MCr.

A wiring WL[i] illustrated in FIG. 9A corresponds to the wiring WL[i] in FIG. 7. The wiring WL[i] is electrically connected to the circuit HC and the circuit HCr. To write information (e.g., a potential, a resistance value, or a current value) corresponding to the first data $w_i^{(k-1)}{}_j^{(k)}$ to the circuit HC and the circuit HCr included in the circuit MP[i,j], a predetermined potential is supplied to the wiring WL[i] so that electrical continuity is established between the wiring OL[j] and the circuit HC and electrical continuity is established between the wiring OLB[j] and the circuit HCr. Then, the potential or the like corresponding to the first data $w_i^{(k-1)}{}_j^{(k)}$ is supplied to each of the wirings OL[j] and OLB[j], whereby the potential or the like can be input to the circuit HC and the circuit HCr. After that, a predetermined potential is supplied to the wiring WL[i], so that electrical continuity between the wiring OL[j] and the circuit HC is broken and electrical continuity between the wiring OLB[j] and the circuit HCr is broken. Thus, the current or the like corresponding to the first data $w_i^{(k-1)}{}_j^{(k)}$ is held in the circuit HC and the circuit HCr.

The case where the first data $w_i^{(k-1)}{}_j^{(k)}$ has any one of three levels "−1", "0", and "1" is considered, for example. In the case where the first data $w_i^{(k-1)}{}_j^{(k)}$ is "1", for example, a predetermined potential is held in the circuit HC so that a current corresponding to "1" flows from the wiring OL[j] to the wiring VE[j] through the circuit MC, and a potential $V_0$ is held in the circuit HCr so that a current does not flow from the wiring OLB[j] to the wiring VEr[j] through the circuit MCr. In the case where the first data $w_i^{(k-1)}{}_j^{(k)}$ is "−1", for example, the potential $V_0$ is held in the circuit HC so that a current does not flow from the wiring OL[j] to the wiring VE[j] through the circuit MC, and a predetermined potential is held in the circuit HCr so that a current corresponding to "−1" flows from the wiring OLB[j] to the wiring VEr[j] through the circuit MCr. In the case where the first data $w_i^{(k-1)}{}_j^{(k)}$ is "0", for example, the potential $V_0$ is held in the circuit HC so that a current does not flow from the wiring OL[j] to the wiring VE[j] through the circuit MC, and the potential $V_0$ is held in the circuit HCr so that a current does not flow from the wiring OLB[j] to the wiring VEr[j] through the circuit MCr. Note that the potential $V_0$ can be a potential supplied from the wiring VCN in the description of FIG. 8A.

As another example, the case where the first data $w_i^{(k-1)}{}_j^{(k)}$ is an analog value, specifically, a "negative analog value", "0", or a "positive analog value" is considered. In the case where the first data $w_i^{(k-1)}{}_j^{(k)}$ is a "positive analog value", for example, a predetermined potential is held in the circuit HC so that an analog current corresponding to the "positive analog value" flows from the wiring OL[j] to the wiring VE[j] through the circuit MC, and the potential $V_0$ is held in the circuit HCr so that a current does not flow from the wiring OLB[j] to the wiring VEr[j] through the circuit MCr. In the case where the first data $w_i^{(k-1)}{}_j^{(k)}$ is a "negative analog value", for example, the potential $V_0$ is held in the circuit HC so that a current does not flow from the wiring OL[j] to the wiring VE[j] through the circuit MC, and a predetermined potential is held in the circuit HCr so that an analog current corresponding to the "negative analog value" flows from the wiring OLB[j] to the wiring VEr[j] through the circuit MCr. In the case where the first data $w_i^{(k-1)}{}_j^{(k)}$ is "0", for example, the potential $V_0$ is held in the circuit HC so that a current does not flow from the wiring OL[j] to the wiring VE[j] through the circuit MC, and the potential $V_0$ is held in the circuit HCr so that a current does not flow from the wiring OLB[j] to the wiring VEr[j] through the circuit MCr. Note that as in the above example, the potential $V_0$ can be a potential supplied from the wiring VCN in the description of FIG. 8A.

In addition, for example, the circuit MC has a function of outputting a current or the like corresponding to information (e.g., a potential, a resistance value, or a current value) held in the circuit HC to one of the wiring OL[j] and the wiring OLB[j], and the circuit MCr has a function of outputting a current or the like corresponding to information (e.g., a potential, a resistance value, or a current value) held in the circuit HCr to the other of the wiring OL[j] and the wiring OLB[j]. For example, in the case where a first potential is held in the circuit HC, the circuit MC supplies a current having a first current value from the wiring OL[j] or the wiring OLB[j] to the wiring VE, and in the case where a second potential is held in the circuit HC, the circuit MC supplies a current having a second current value from the wiring OL[j] or the wiring OLB[j] to the wiring VE. Similarly, in the case where the first potential is held in the circuit HCr, the circuit MCr supplies a current having the first current value from the wiring OL[j] or the wiring OLB[j] to the wiring VEr, and in the case where the second potential is held in the circuit HCr, the circuit MCr supplies a current having the second current value from the wiring OL[j] or the wiring OLB[j] to the wiring VEr. Note that the levels of the first current value and the second current value are each determined in accordance with the value of the first data $w_i^{(k-1)}{}_j^{(k)}$. For example, the first current value may be larger than or smaller than the second current value. In addition, for example, one of the first current value and the second current value may be zero current; that is, the current value may be 0. Moreover, the direction in which current flows may be different between a current having the first current value and a current having the second current value.

In particular, in the case where the first data $w_i^{(k-1)}{}_j^{(k)}$ has any one of three levels "−1", "0", and "1", the circuit MC and the circuit MCr are preferably configured so that one of the first current value and the second current value is 0. Note that in the case where the first data $w_i^{(k-1)}{}_j^{(k)}$ is an analog value, e.g., a "negative analog value", "0", or a "positive analog value", the first current value or the second current value can be an analog value, for example.

In the case where a current flowing from the wiring OL[j] or the wiring OLB[j] to the wiring VE through the circuit MC and a current flowing from the wiring OL[j] or the wiring OLB[j] to the wiring VEr through the circuit MCr are made equal to each other, a potential held in the circuit MC and a potential held in the circuit MCr might not be equal to each other because transistors therein sometimes have variations in their characteristics caused in a fabrication process or the like of the transistors. In the semiconductor device of one embodiment of the present invention, the amount of current flowing from the wiring OL[j] or the wiring OLB[j] to the wiring VE through the circuit MC can be almost equal to the amount of current flowing from the wiring OL[j] or the wiring OLB[j] to the wiring VEr through the circuit MCr, even when there are variations in characteristics of the transistors.

Note that in this specification and the like, a current, a voltage, or the like corresponding to information (e.g., a potential, a resistance value, or a current value) held in the circuit HC and the circuit HCr may be a positive current, voltage, or the like, may be a negative current, voltage, or the like, or may be zero current, zero voltage, or the like; alternatively, a positive one, a negative one, and 0 may be mixed. That is, for example, the above description "the circuit MC has a function of outputting a current, a voltage, or the like corresponding to information (e.g., a potential, a resistance value, or a current value) held in the circuit HC to one of the wiring OL[j] and the wiring OLB[j], and the circuit MCr has a function of outputting a current, a voltage, or the like corresponding to information (e.g., a potential, a resistance value, or a current value) held in the circuit HCr to the other of the wiring OL[j] and the wiring OLB[j]" can be rephrased as a description "the circuit MC has a function of releasing a current, a voltage, or the like corresponding to information (e.g., a potential, a resistance value, or a current value) held in the circuit HC from one of the wiring OL[j] and the wiring OLB[j], and the circuit MCr has a function of releasing a current corresponding to information (e.g., a potential, a resistance value, or a current value) held in the circuit HCr from the other of the wiring OL[j] and the wiring OLB[j]".

The wiring X1L[i] and a wiring X2L[i] illustrated in FIG. 9A correspond to the wiring XLS[i] in FIG. 7. Note that for example, the second data $z_i^{(k-1)}$ input to the circuit MP[i,j] is determined in accordance with the potentials, currents, or the like of the wiring X1L[i] and the wiring X2L[i]. Thus, potentials corresponding to the second data $z_i^{(k-1)}$ are input to the circuit MC and the circuit MCr through the wiring X1L[i] and the wiring X2L[i], for example.

The circuit MC is electrically connected to the wiring OL[j] and the wiring OLB[j], and the circuit MCr is electrically connected to the wiring OL[j] and the wiring OLB [j]. The circuit MC and the circuit MCr output currents, potentials, or the like corresponding to the product of the first data $w_i^{(k-1)}{}_j^{(k)}$ and the second data $z_i^{(k-1)}$ to the wiring OL[j] and the wiring OLB[j] in accordance with potentials, currents, or the like input to the wiring X1L[i] and the wiring X2L[i], for example. As a specific example, the destinations of the currents output from the circuit MC and the circuit MCr are determined in accordance with the potentials of the wiring X1L[i] and the wiring X2L[i]. For example, the circuit MC and the circuit MCr have a circuit configuration in which a current output from the circuit MC flows to one of the wiring OL[j] and the wiring OLB[j], and a current output from the circuit MCr flows to the other of the wiring OL[j] and the wiring OLB[j]. That is, the currents output from the circuit MC and the circuit MCr flow to not the same wiring but different wirings. Note that for example, the currents from the circuit MC and the circuit MCr flow to neither the wiring OL[j] nor the wiring OLB[j] in some cases.

The case where the second data $z_i^{(k-1)}$ has any one of three levels "−1", "0", and "1" is considered, for example. In the case where the second data $z_i^{(k-1)}$ is "1", for example, the circuit MP establishes electrical continuity between the circuit MC and the wiring OL[j] and establishes electrical continuity between the circuit MCr and the wiring OLB[j]. In the case where the second data $z_i^{(k-1)}$ is "−1", for example, the circuit MP establishes electrical continuity between the circuit MC and the wiring OLB[j] and establishes electrical continuity between the circuit MCr and the wiring OL[j]. In the case where the second data $z_i^{(k-1)}$ is "0", for example, the circuit MP breaks electrical continuity between the circuit MC and the wiring OL[j] and between the circuit MC and the wiring OLB[j] and breaks electrical continuity between the circuit MCr and the wiring OL[j] and between the circuit MC and the wiring OLB[j] so that currents output from the circuit MC and the circuit MCr flow to neither the wiring OL[j] nor the wiring OLB[j].

An example in which the above-described operations are combined is shown. In the case where the first data $w_i^{(k-1)}{}_j^{(k)}$ is "1", a current flows from the wiring OL[j] or the wiring OLB[j] to the wiring VE[j] through the circuit MC in some cases, and a current does not flow from the wiring OL[j] or the wiring OLB[j] to the wiring VEr[j] through the circuit MCr. In the case where the first data $w_i^{(k-1)}{}_j^{(k)}$ is "−1", a current does not flow from the wiring OL[j] or the wiring OLB[j] to the wiring VE[j] through the circuit MC, and a current flows from the wiring OL[j] or the wiring OLB[j] to the wiring VEr[j] through the circuit MCr in some cases. In the case where the second data $z_i^{(k-1)}$ is "1", electrical continuity is established between the circuit MC and the wiring OL[j] and between the circuit MCr and the wiring OLB[j]. In the case where the second data $z_i^{(k-1)}$ is "−1", electrical continuity is established between the circuit MC and the wiring OLB[j] and between the circuit MCr and the wiring OL[j]. From the above, in the case where the product of the first data $w_i^{(k-1)}{}_j^{(k)}$ and the second data $z_i^{(k-1)}$ is a positive value, a current flows from the wiring OL[j] to the wiring VE[j] through the circuit MC or a current flows from the wiring OL[j] to the wiring VEr[j] through the circuit MCr. In the case where the product of the first data $w_i^{(k-1)}{}_j^{(k)}$ and the second data $z_i^{(k-1)}$ is a negative value, a current flows from the wiring OL[j] to the wiring VEr[j] through the circuit MCr or a current flows from the wiring OLB[j] to the wiring VE[j] through the circuit MC. In the case where the product of the first data $w_i^{(k-1)}{}_j^{(k)}$ and the second data $z_i^{(k-1)}$ is a value of 0, a current does not flow from the wiring OL[j] or the wiring OLB[j] to the wiring VE[j] and a current does not flow from the wiring OL[j] or the wiring OLB[j] to the wiring VEr[j].

Specific examples of the above-described example is as follows: in the case where the first data $w_i^{(k-1)}{}_j^{(k)}$ is "1" and the second data $z_i^{(k-1)}$ is "1", a current I1[*i,j*] having the first current value flows from the circuit MC to the wiring OL[j] and a current I2[*i,j*] having the second current value flows from the circuit MCr to the wiring OLB[j], for example. Here, the second current value is zero, for example. In the case where the first data $w_i^{(k-1)}{}_j^{(k)}$ is "−1" and the second data $z_i^{(k-1)}$ is "1", the current I1[*i,j*] having the second current value flows from the circuit MC to the wiring OL[j] and the current I2[*i,j*] having the first current value flows from the circuit MCr to the wiring OLB[j], for example. Here, the second current value is zero, for example. In the case where the first data $w_i^{(k-1)}{}_j^{(k)}$ is "0" and the second data $z_i^{(k-1)}$ is "1", the current I1[*i,j*] having the second current value flows from the circuit MC to the wiring OL[j] and the current I2[*i,j*] having the second current value flows from the circuit MCr to the wiring OLB[j]. Here, the second current value is zero, for example.

In the case where the first data $w_i^{(k-1)}{}_j^{(k)}$ is "1" and the second data $z_i^{(k-1)}$ is "−1", the current I1[*i,j*] having the first current value flows from the circuit MC to the wiring OLB[j] and the current I2[*i,j*] having the second current value flows from the circuit MCr to the wiring OL[j]. Here, the second current value is zero, for example. In the case where the first data $w_i^{(k-1)}{}_j^{(k)}$ is "−1" and the second data $z_i^{(k-1)}$ is "−1", the current I1[*i,j*] having the second current value flows from the circuit MC to the wiring OLB[j] and the current I2[*i,j*] having the first current value flows from the circuit MCr to the wiring OL[j]. Here, the second current value is zero, for example. In the case where the first data $w_i^{(k-1)}{}_j^{(k)}$ is "0" and the second data $z_i^{(k-1)}$ is "−1", the current I1[*i,j*] having the second current value flows from the circuit MC to the wiring OLB[j] and the current I2[*i,j*] having the second current value flows from the circuit MCr to the wiring OL[j]. Here, the second current value is zero, for example.

In the case where the second data $z_i^{(k-1)}$ is "0", electrical continuity is not established between the circuit MC and the wiring OL[j] and between the circuit MC and the wiring OLB[j], for example. Similarly, electrical continuity is not established between the circuit MCr and the wiring OL[j] and between the circuit MCr and the wiring OLB[j]. Therefore, regardless of the value of the first data $w_i^{(k-1)}{}_j^{(k)}$, a current is not output from the circuit MC and the circuit MCr to the wiring OL[j] and the wiring OLB[j].

As described above, in the case where the product value of the first data $w_i^{(k-1)}{}_j^{(k)}$ and the second data $z_i^{(k-1)}$ is a positive value, for example, a current flows from the circuit MC or the circuit MCr to the wiring OL[j]. Here, in the case where the first data $w_i^{(k-1)}{}_j^{(k)}$ is a positive value, a current flows from the circuit MC to the wiring OL[j], and in the case where the first data $w_i^{(k-1)}{}_j^{(k)}$ is a negative value, a current flows from the circuit MCr to the wiring OL[j]. By contrast, in the case where the product value of the first data $w_i^{(k-1)}{}_j^{(k)}$ and the second data $z_i^{(k-1)}$ is a negative value, a current flows from the circuit MC or the circuit MCr to the wiring OLB[j]. Here, in the case where the first data $w_i^{(k-1)}{}_j^{(k)}$ is a positive value, a current flows from the circuit MC to the wiring OLB[j], and in the case where the first data $w_i^{(k-1)}{}_j^{(k)}$ is a negative value, a current flows from the circuit MCr to the wiring OLB[j]. Accordingly, the total amount of current output from a plurality of circuits MC or a plurality of circuits MCr connected to the wiring OL[j] flows to the wiring OL[j]. That is, a current having a value that is the sum of positive values flows through the wiring OL[j]. By contrast, the total amount of current output from a plurality of circuits MC or a plurality of circuits MCr connected to the wiring OLB[j] flows to the wiring OLB[j]. That is, a current having a value that is the sum of negative values flows through the wiring OLB[j]. As a result of the above-described operation, product-sum operation processing can be performed by utilizing the total value of the current flowing through the wiring OL[j], that is, the sum total of positive values, and the total value of the current flowing through the wiring OLB[j], that is, the sum total of negative values. For example, in the case where the total value of the current flowing through the wiring OL[j] is larger than the total value of the current flowing through the wiring OLB[j], it can be determined that the product-sum operation result has a positive value. In the case where the total value of the current flowing through the wiring OL[j] is smaller than the total value of the current flowing through the wiring OLB[j], it can be determined that the product-sum operation result has a negative value. In the case where the total value of the current flowing through the wiring OL[j] is almost equal to the total value of the current flowing through the wiring OLB[j], it can be determined that the product-sum operation result has a value of 0.

Note that also in the case where the second data $z_i^{(k-1)}$ has any two levels among "−1", "0", and "1", for example, two levels "−1" and "1" or two levels "0" and "1", operation can be performed in a similar manner. Similarly, in the case where the first data $w_i^{(k-1)}{}_j^{(k)}$ has any two levels among "−1", "0", and "1", for example, two levels "−1" and "1" or two levels "0" and "1", operation can be performed in a similar manner.

Note that the first data $w_i^{(k-1)}{}_j^{(k)}$ may be an analog value or a multi-bit (multilevel) digital value. As a specific example, "−1" may be replaced with a "negative analog value", and "1" may be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Next, a modification example of the circuit MP[i,j] in FIG. 9A is described. Note that in the modification example of the circuit MP[i,j], differences from the circuit MP[i,j] in FIG. 9A are mainly described and the description of portions common to the circuit MP[i,j] in FIG. 9A is sometimes omitted.

Figure 9B:
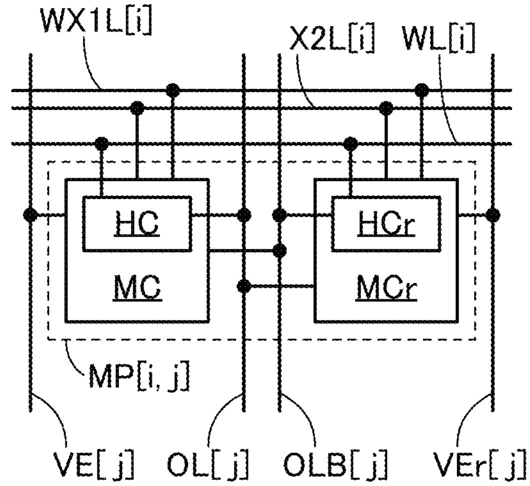

The circuit MP[i,j] illustrated in FIG. 9B has a configuration in which the wiring X1L is replaced with the wiring WX1L. That is, in the circuit MP[i,j] in FIG. 9B, the wiring WX1L and the wiring WL each function as a wiring for supplying a predetermined potential to switch electrical continuity and electrical discontinuity between the wiring OL[j] and the circuit HC and to switch electrical continuity and electrical discontinuity between the wiring OLB[j] and the circuit HCr. In addition, in the circuit MP[i,j] in FIG. 9B, the wiring WX1L and the wiring X2L each function as a wiring for supplying a current, a voltage, or the like corresponding to the second data $z_i^{(k-1)}$ to be input to the circuit MP[i,j].

The circuit MP[i,j] in FIG. 9B can be used for an arithmetic circuit that includes the wiring WX1L like the arithmetic circuit 130 illustrated in FIG. 4 and does not include the wiring IL and the wiring ILB like the arithmetic circuit 140 illustrated in FIG. 7. Specifically, for example, the circuit MP[i,j] in FIG. 9B can be used as the circuit MP[i,j] of an arithmetic circuit 150 illustrated in FIG. 11.

Figure 9C:
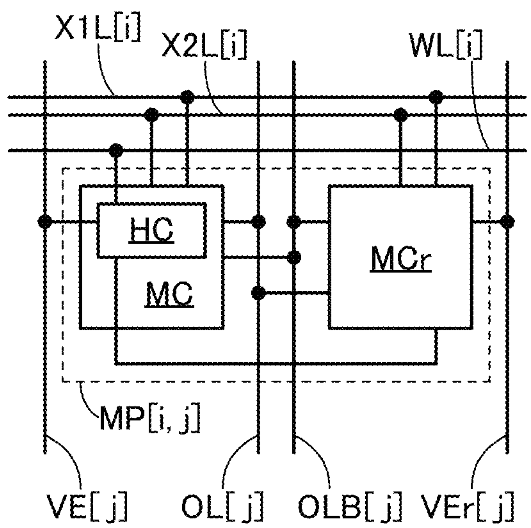

Next, a modification example of the circuit MP[i,j] in FIG. 9A, which is different from that in FIG. 9B, is described. The circuit MP[i,j] illustrated in FIG. 9C is a modification example of the circuit MP[i,j] in FIG. 9A. The circuit MP[i,j] in FIG. 9C includes the circuit MC and the circuit MCr like the circuit MP[i,j] in FIG. 9A. Note that the circuit MP[i,j] in FIG. 9C is different from the circuit MP[i,j] in FIG. 9A in that the circuit HCr is not included in the circuit MCr.

Since the circuit MCr does not include the circuit HCr, an arithmetic circuit using the circuit MP[i,j] in FIG. 9C does not necessarily include the wiring ILB[j] for supplying a potential to be held in the circuit HCr. In addition, the circuit MCr is not necessarily electrically connected to the wiring WL[i].

In the circuit MP[i,j] in FIG. 9C, the circuit HC included in the circuit MC is electrically connected to the circuit MCr. That is, the circuit MP[i,j] in FIG. 9C is configured so that the circuit MCr and the circuit MC share the circuit HC. An inverted signal of a signal held in the circuit HC can be supplied from the circuit HC to the circuit MCr, for example. Accordingly, the circuit MC and the circuit MCr can perform different operations. Alternatively, the circuit MC and the circuit MCr can have different internal circuit configurations so that the circuit MC and the circuit MCr output different amounts of current in response to the same signal held in the circuit HC. Here, when a potential corresponding to the first data $w_i^{(k-1)}{}_j^{(k)}$ is held in the circuit HC and a potential corresponding to the second data $z_i^{(k-1)}$ is supplied to the wiring X1L[i] and the wiring X2L[i], the circuit MP[i,j] can output, to the wiring OL[j] and the wiring OLB[j], a current corresponding to the product of the first data $w_i^{(k-1)}{}_j^{(k)}$ and the second data $z_i^{(k-1)}$.

Note that the circuit configuration of the arithmetic circuit 110 using the circuit MP in FIG. 9C can be changed into that of the arithmetic circuit 140 illustrated in FIG. 7, for example.

Figure 9D:
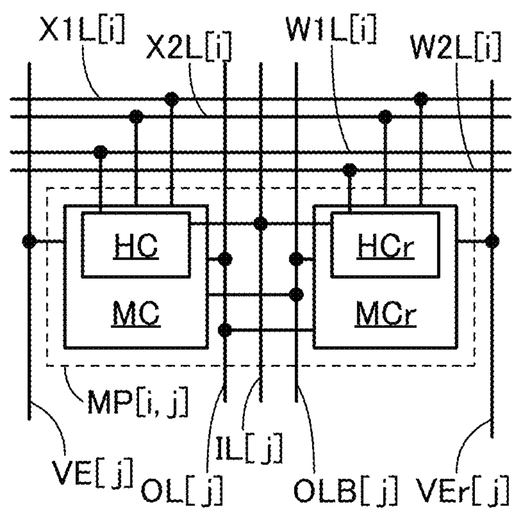
Figure 12:
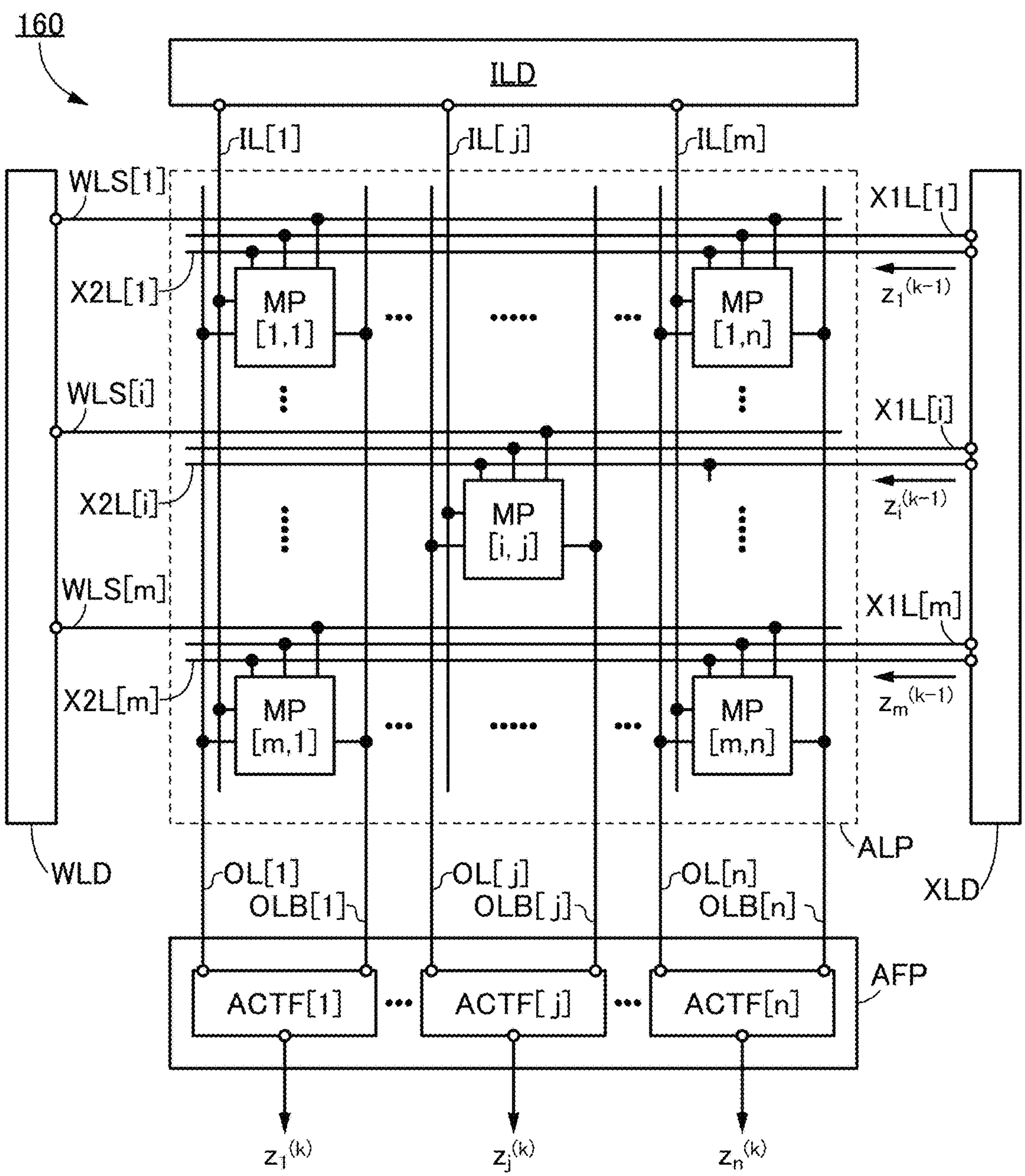
FIG. 12 is a circuit diagram illustrating a configuration example of a semiconductor device.

The circuit MP[i,j] illustrated in FIG. 9D is a modification example of the circuit MP[i,j] in FIG. 9A, and is specifically a configuration example of the circuit MP[i,j] that can be used for an after-mentioned arithmetic circuit 160 in FIG. 12. Note that the arithmetic circuit 160 has a configuration in which the wiring ILB[1] to the wiring ILB[n] are removed from the arithmetic circuit 110 in FIG. 2. The circuit MP[i,j] in FIG. 9D includes the circuit MC and the circuit MCr like the circuit MP[i,j] in FIG. 9A. Note that the circuit MP[i,j] in FIG. 9D and the circuit MP[i,j] in FIG. 9A differ in the electrical connection configuration of wirings.

The wiring W1L[i] and a wiring W2L[i] illustrated in FIG. 9D correspond to the wiring WLS[i] in FIG. 12. The wiring W1L[i] is electrically connected to the circuit HC, and the wiring W2L[i] is electrically connected to the circuit HCr.

The wiring IL[j] is electrically connected to the circuit HC and the circuit HCr.

In the case where the circuit HC and the circuit HCr of the circuit MP[i,j] in FIG. 9D hold different information (e.g., voltages, resistance values, or currents), operations for holding the information in the circuit HC and the circuit HCr are preferably performed not concurrently but sequentially. The case is considered where the first data $w_i^{(k-1)}{}_j^{(k)}$ of the circuit MP[i,j] can be expressed when the circuit HC holds first information and the circuit HCr holds second information, for example. First, a predetermined potential is supplied to the wiring W1L[i] and the wiring W2L[i] so that electrical continuity is established between the circuit HC and the wiring IL[j] and electrical continuity is not established between the circuit HCr and the wiring IL[j]. Next, a current, a voltage, or the like corresponding to the first information is supplied to the wiring IL[j], whereby the first information can be supplied to the circuit HC. After that, a predetermined potential is supplied to the wiring W1L[i] and the wiring W2L[i] so that electrical continuity is not established between the circuit HC and the wiring IL[j] and electrical continuity is established between the circuit HCr and the wiring IL[j]. Then, a current, a voltage, or the like corresponding to the second information is supplied to the wiring IL[j], whereby the second information can be supplied to the circuit HCr. Thus, the circuit MP[i,j] can set $w_i^{(k-1)}{}_j^{(k)}$ as the first data.

Note that in the case where the circuit HC and the circuit HCr hold substantially the same information (e.g., a voltage, a resistance value, or a current) (in the case where the first data $w_i^{(k-1)}{}_j^{(k)}$ of the circuit MP[i,j] is set when the circuit HC and the circuit HCr hold substantially the same information), a predetermined potential is supplied to the wiring W1L[i] and the wiring W2L[i] so that electrical continuity is established between the circuit HC and the wiring IL[j] and electrical continuity is established between the circuit HCr and the wiring IL[j], and then a current, a voltage, or the like corresponding to the information is supplied from the wiring IL[j] to the circuit HC and the circuit HCr.

When a potential corresponding to the first data $w_i^{(k-1)}{}_j^{(k)}$ is held in the circuit HC and the circuit HCr and a potential corresponding to the second data $z_i^{(k-1)}$ is supplied to the wiring X1L[i] and the wiring X2L[i], the circuit MP[i,j] in FIG. 9D can output, to the wiring OL[j] and the wiring OLB[j], a current corresponding to the product of the first data $w_i^{(k-1)}{}_j^{(k)}$ and the second data $z_1^{(k-1)}$, like the circuit MVP[i,j] in FIG. 9A.

Figure 9E:
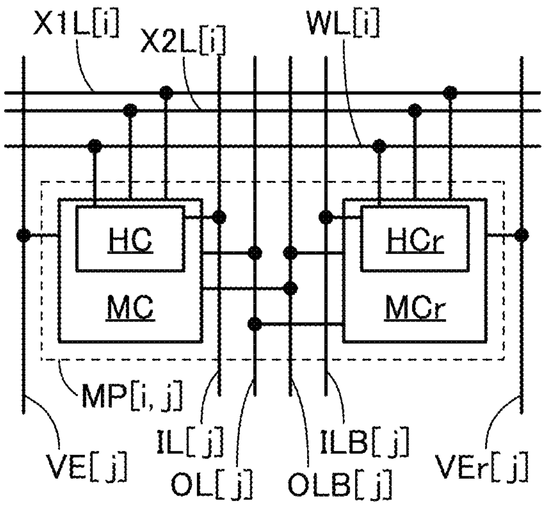

The circuit MP[i,j] illustrated in FIG. 9E is a modification example of the circuit MP[i,j] in FIG. 9D. The circuit MP[i,j] in FIG. 9E includes the circuit MC and the circuit MCr like the circuit MP[i,j] in FIG. 9D. Note that the circuit MP[i,j] in FIG. 9E and the circuit MP[i,j] in FIG. 9D differ in the electrical connection configuration of wirings.

Specifically, the circuit MP in FIG. 9E has a configuration in which the wiring ILB[j] is added to the circuit MP in FIG. 9D and the wiring W1L[i] and the wiring W2L[i] that are electrically connected to the circuit MP in FIG. 9D are replaced with the wiring WL[i].

In the circuit MP in FIG. 9E, the wiring IL[j] is electrically connected to the circuit HC and the wiring ILB[j] is electrically connected to the circuit HCr. That is, in the circuit MP in FIG. 9D, the wiring IL[j] functions as a wiring for supplying a current, a voltage, or the like corresponding to information (e.g., a voltage, a resistance value, or a current) to each of the circuit HC and the circuit HCr; meanwhile, in the circuit MP in FIG. 9E, the wiring IL[j] functions as a wiring for supplying a current, a voltage, or the like corresponding to information to the circuit HC and the wiring ILB[j] functions as a wiring for supplying a current, a voltage, or the like corresponding to information to the circuit HCr.

Moreover, in the circuit MP in FIG. 9E, the wiring IL[j] and the wiring ILB[j] are electrically connected respectively to the circuit HC and the circuit HCr, and thus a current, a voltage, or the like corresponding to information (e.g., a voltage, a resistance value, or a current) can be supplied to the circuit HC and the circuit HCr concurrently. Hence, switching of electrical continuity and electrical discontinuity between the circuit HC and the wiring IL[j] and switching of electrical continuity and electrical discontinuity between the circuit HCr and the wiring ILB[j] can be performed concurrently. In the circuit MP in FIG. 9D, the wiring W1L[i] is illustrated as a wiring for controlling switching of electrical continuity and electrical discontinuity between the circuit HC and the wiring IL[j], and the wiring W2L[i] is illustrated as a wiring for controlling switching of electrical continuity and electrical discontinuity between the circuit HCr and the wiring ILB[j]; meanwhile, in the circuit MP in FIG. 9E, the wiring WL[i] is illustrated as a wiring obtained by combining the wiring W1L[i] and the wiring W2L[i].

Note that the circuit MP in FIG. 9E can be used for the arithmetic circuit 110 in FIG. 2 and the arithmetic circuit 120 in FIG. 3, for example.

Figure 9F:
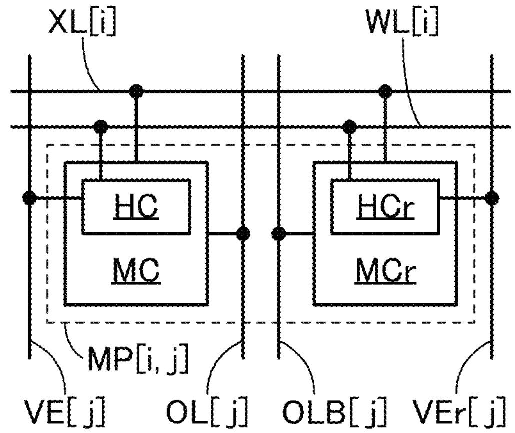

The circuit MP[i,j] illustrated in FIG. 9F is a modification example of the circuit MP[i,j] in FIG. 9A. The circuit MP[i,j] in FIG. 9F includes the circuit MC and the circuit MCr like the circuit MP[i,j] in FIG. 9A. Note that the circuit MP[i,j] in FIG. 9F is different from the circuit MP[i,j] in FIG. 9A in that the circuit MC is not electrically connected to the wiring OLB[j] and the circuit MCr is not electrically connected to the wiring OL[j].

The wiring WL[i] illustrated in FIG. 9F is electrically connected to the circuit HC and the circuit HCr. In addition, a wiring XL[i] illustrated in FIG. 9F is electrically connected to the circuit MC and the circuit MCr.

As described above, the circuit MC is not electrically connected to the wiring OLB[j] and the circuit MCr is not electrically connected to the wiring OL[j] in the circuit MP[i,j] in FIG. 9F. That is, unlike in the circuits MP[i,j] in FIG. 9A to FIG. 9E, a current output from the circuit MC does not flow to the wiring OLB[j] and a current output from the circuit MCr does not flow to the wiring OL[j] in the circuit MP[i,j] in FIG. 9F.

Thus, the circuit MP[i,j] in FIG. 9F is preferably used for an arithmetic circuit in the case where the second data $z_i^{(k-1)}$ has any one of two levels "0" and "1". In the case where the second data $z_1^{(k-1)}$ is "1", for example, the circuit MP establishes electrical continuity between the circuit MC and the wiring OL[j] and establishes electrical continuity between the circuit MCr and the wiring OLB[j]. In the case where the second data $z_1^{(k-1)}$ is "0", for example, the circuit MP breaks electrical continuity between the circuit MC and the wiring OL[j] and between the circuit MC and the wiring OLB[j] and breaks electrical continuity between the circuit MCr and the wiring OL[j] and between the circuit MCr and the wiring OLB[j] so that currents output from the circuit MC and the circuit MCr flow to neither the wiring OL[j] nor the wiring OLB[j].

When used for the arithmetic circuit 110, the circuit MP[i,j] in FIG. 9F can perform, for example, arithmetic operation of the case where the first data $w_i^{(k-1)}{}_j^{(k)}$ has any one of three levels "−1", "0", and "1" and the second data $z_i^{(k-1)}$ has two levels "0" and "1". Note that even in the case where the first data $w_i^{(k-1)}{}_j^{(k)}$ has any two levels among "−1", "0", and "1", for example, two levels "−1" and "1" or two levels "0" and "1", operation can be performed. Note that the first data $w_i^{(k-1)}{}_j^{(k)}$ may be an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Figure 10A:
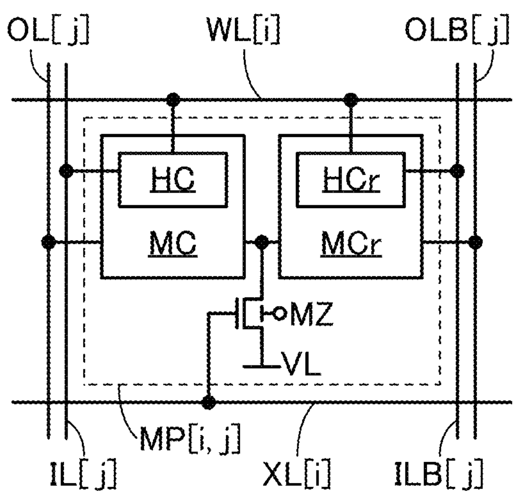
FIG. 10A and FIG. 10B are circuit diagrams each illustrating a configuration example of a circuit included in a semiconductor device.

As in FIG. 9A, the circuit MP[i,j] illustrated in FIG. 10A is a circuit that can output a current corresponding to the product of the first data $w_i^{(k-1)}{}_j^{(k)}$ and the second data $z_i^{(k-1)}$ to the wiring OL[j] and the wiring OLB[j]. Note that the circuit MP[i,j] in FIG. 10A can be used for the arithmetic circuit 110 in FIG. 2, for example.

The circuit MP[i,j] in FIG. 10A includes a transistor MZ in addition to the circuit MC and the circuit MCr.

A first terminal of the transistor MZ is electrically connected to a first terminal of the circuit MC and a first terminal of the circuit MCr. A second terminal of the transistor MZ is electrically connected to a wiring VL. A gate of the transistor MZ is electrically connected to the wiring XL[i].

The wiring VL functions as a wiring for supplying a constant voltage, for example. The constant voltage is preferably determined in accordance with the configuration of the circuit MP[i,j], the arithmetic circuit 110, or the like. The constant voltage can be, for example, a high-level potential VDD, a low-level potential VSS, a ground potential, or the like.

The wiring WL[i] illustrated in FIG. 10A corresponds to the wiring WLS[i] in the arithmetic circuit 110 in FIG. 2. The wiring WL[i] is electrically connected to the circuit HC and the circuit HCr.

The wiring OL[j] is electrically connected to a second terminal of the circuit MC. The wiring OLB[j] is electrically connected to a second terminal of the circuit MCr.

The wiring IL[j] is electrically connected to the circuit HC, and the wiring ILB[j] is electrically connected to the circuit HCr.

For the operation of the case where a potential corresponding to the first data is held in each of the circuit HC and the circuit HCr of the circuit MP[i,j] in FIG. 10A, the description of the operation for holding a potential corresponding to the first data in the circuit MP[i,j] in FIG. 9A is referred to.

In the circuit MP[i,j] in FIG. 10A, the circuit MC has a function of making a current corresponding to the potential held in the circuit HC flow between the first terminal and the second terminal of the circuit MC while the constant voltage supplied from the wiring VL is supplied to the first terminal of the circuit MC. The circuit MCr has a function of making a current corresponding to the potential held in the circuit HCr flow between the first terminal and the second terminal of the circuit MCr while the constant voltage supplied from the wiring VL is supplied to the first terminal of the circuit MC. That is, by holding a potential corresponding to the first data $w_i^{(k-1)}{}_j^{(k)}$ in each of the circuit HC and the circuit HCr of the circuit MP[i,j], the amount of current flowing between the first terminal and the second terminal of the circuit MC and the amount of current flowing between the first terminal and the second terminal of the circuit MCr can be determined. Note that in the case where the constant voltage supplied from the wiring VL is not supplied to the first terminal of the circuit MC (the circuit MCr), the circuit MC (the circuit MCr) does not necessarily make a current flow between the first terminal and the second terminal of the circuit MC (the circuit MCr), for example.

In the case where a potential corresponding to the first data $w_i^{(k-1)}{}_j^{(k)}$ of "1" is held in each of the circuit HC and the circuit HCr, for example, the circuit MC makes a predetermined current flow between the first terminal and the second terminal of the circuit MC when the constant voltage supplied from the wiring VL is supplied to the circuit MC. Thus, a current flows between the circuit MC and the wiring OL. Note that at this time, the circuit MCr does not make a current flow between the first terminal and the second terminal of the circuit MCr. Thus, a current does not flow between the circuit MCr and the wiring OLB. Moreover, in the case where a potential corresponding to the first data $w_i^{(k-1)}{}_j^{(k)}$ of "−1" is held in each of the circuit HC and the circuit HCr, for example, the circuit MCr makes a predetermined current flow between the first terminal and the second terminal of the circuit MCr when the constant voltage supplied from the wiring VL is supplied to the circuit MC. Thus, a current flows between the circuit MCr and the wiring OLB. Note that at this time, the circuit MC does not make a current flow between the first terminal and the second terminal of the circuit MC. Thus, a current does not flow between the circuit MC and the wiring OL. In the case where a potential corresponding to the first data $w_i^{(k-1)}{}_j^{(k)}$ of "0" is held in each of the circuit HC and the circuit HCr, for example, the circuit MC does not make a current flow between the first terminal and the second terminal of the circuit MC and the circuit MCr does not make a current flow between the first terminal and the second terminal of the circuit MCr regardless of whether the constant voltage from the wiring VL is supplied to the circuit MC and the circuit MCr. That is, a current does not flow between the circuit MC and the wiring OL and a current does not flow between the circuit MCr and the wiring OLB.

Note that for a specific example of the potential corresponding to the first data $w_i^{(k-1)}{}_j^{(k)}$ that is held in the circuit HC and the circuit HCr in the circuit MP[i,j] in FIG. 10A, the description of the circuit MP[i,j] in FIG. 9A is referred to. In the circuit MP[i,j] in FIG. 10A, the circuit HC and the circuit HCr may have a function of holding not a potential but information such as a current or a resistance value and the circuit MC and the circuit MCr may have a function of making a current corresponding to the information flow, as in the circuit MP[i,j] in FIG. 9A.

The wiring XL[i] illustrated in FIG. 10A corresponds to the wiring XLS[i] in the arithmetic circuit 110 in FIG. 2. Note that for example, the second data $z_i^{(k-1)}$ input to the circuit MP[i,j] is determined in accordance with the potential, current, or the like of the wiring XL[i]. Thus, the potential corresponding to the second data $z_1^{(k-1)}$ is input to the gate of the transistor MZ through the wiring XL[i], for example.

The case where the second data $z_i^{(k-1)}$ has one of two levels "0" and "1" is considered, for example. In the case where the second data $z_i^{(k-1)}$ is "1", for example, a high-level potential is supplied to the wiring XL[i]. At this time, the transistor MZ is turned on; thus, the circuit MP establishes electrical continuity between the wiring VL and the first terminal of the circuit MC and establishes electrical continuity between the wiring VL and the first terminal of the circuit MCr. That is, in the case where the second data $z_i^{(k-1)}$ is "1", the constant voltage from the wiring VL is supplied to the circuit MC and the circuit MCr. Moreover, in the case where the second data $z_i^{(k-1)}$ is "0", for example, a low-level potential is supplied to the wiring XL[i]. At this time, the circuit MP does not establish electrical continuity between the circuit MC and the wiring OLB[j] and does not establish electrical continuity between the circuit MCr and the wiring OL[j]. That is, in the case where the second data $z_i^{(k-1)}$ is "0", the constant voltage from the wiring VL is not supplied to the circuit MC and the circuit MCr.

Here, in the case where the first data $w_i^{(k-1)}{}_j^{(k)}$ is "1" and the second data $z_i^{(k-1)}$ is "1", for example, the result is that a current flows between the circuit MC and the wiring OL and a current does not flow between the circuit MCr and the wiring OLB. In the case where the first data $w_i^{(k-1)}{}_j^{(k)}$ is "−1" and the second data $z_i^{(k-1)}$ is "1", for example, the result is that a current does not flow between the circuit MC and the wiring OL and a current flows between the circuit MCr and the wiring OLB. In the case where the first data $w_i^{(k-1)}{}_j^{(k)}$ is "0" and the second data $z_i^{(k-1)}$ is "1", for example, the result is that a current does not flow between the circuit MC and the wiring OL and between the circuit MCr and the wiring OLB. In the case where the second data $z_i^{(k-1)}$ is "0", for example, the result is that a current does not flow between the circuit MC and the wiring OL and between the circuit MCr and the wiring OLB even when the first data $w_i^{(k-1)}{}_j^{(k)}$ is any one of "−1", "0", and "1".

That is, like the circuit MP[i,j] in FIG. 9F, the circuit MP[i,j] in FIG. 10A can perform, for example, arithmetic operation of the case where the first data $w_i^{(k-1)}{}_j^{(k)}$ has any one of three levels "−1", "0", and "1" and the second data $z_i^{(k-1)}$ has two levels "0" and "1". In addition, also in the case where the first data $w_i^{(k-1)}{}_j^{(k)}$ has any two levels among "−1", "0", and "1", for example, two levels "−1" and "1" or two levels "0" and "1", the circuit MP[i,j] in FIG. 10A can perform operation like the circuit MP[i,j] in FIG. 9F. Note that the first data $w_i^{(k-1)}{}_j^{(k)}$ may be an analog value or a multi-bit (multilevel) digital value. As a specific example, "−1" can be replaced with a "negative analog value", and "1" can be replaced with a "positive analog value". In this case, the amount of current flowing from the circuit MC or the circuit MCr is, for example, an analog value corresponding to the absolute value of the value of the first data $w_i^{(k-1)}{}_j^{(k)}$.

Figure 10B:
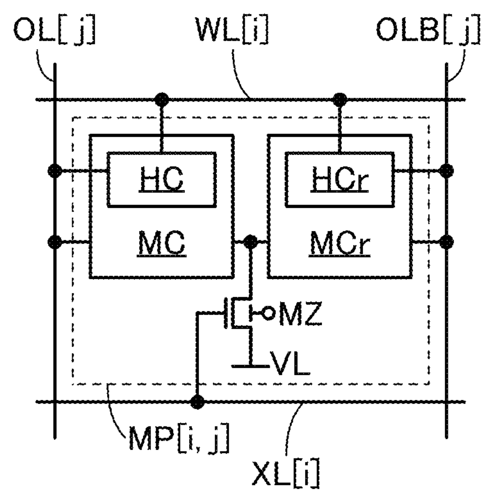

Note that the circuit MP[i,j] illustrated in FIG. 10A may be configured such that the wiring IL[j] and the wiring OL[j] are combined into one wiring OL[j] and the wiring ILB[j] and the wiring OLB[j] are combined into one wiring OLB[j] as in the circuit MP[i,j] illustrated in FIG. 10B.

<Operation Example of Arithmetic Circuit>

Next, an operation example of the arithmetic circuit 140 in FIG. 7 is described. Note that in the description of this operation example, the arithmetic circuit 140 illustrated in FIG. 13 is used as an example.

Figure 13:
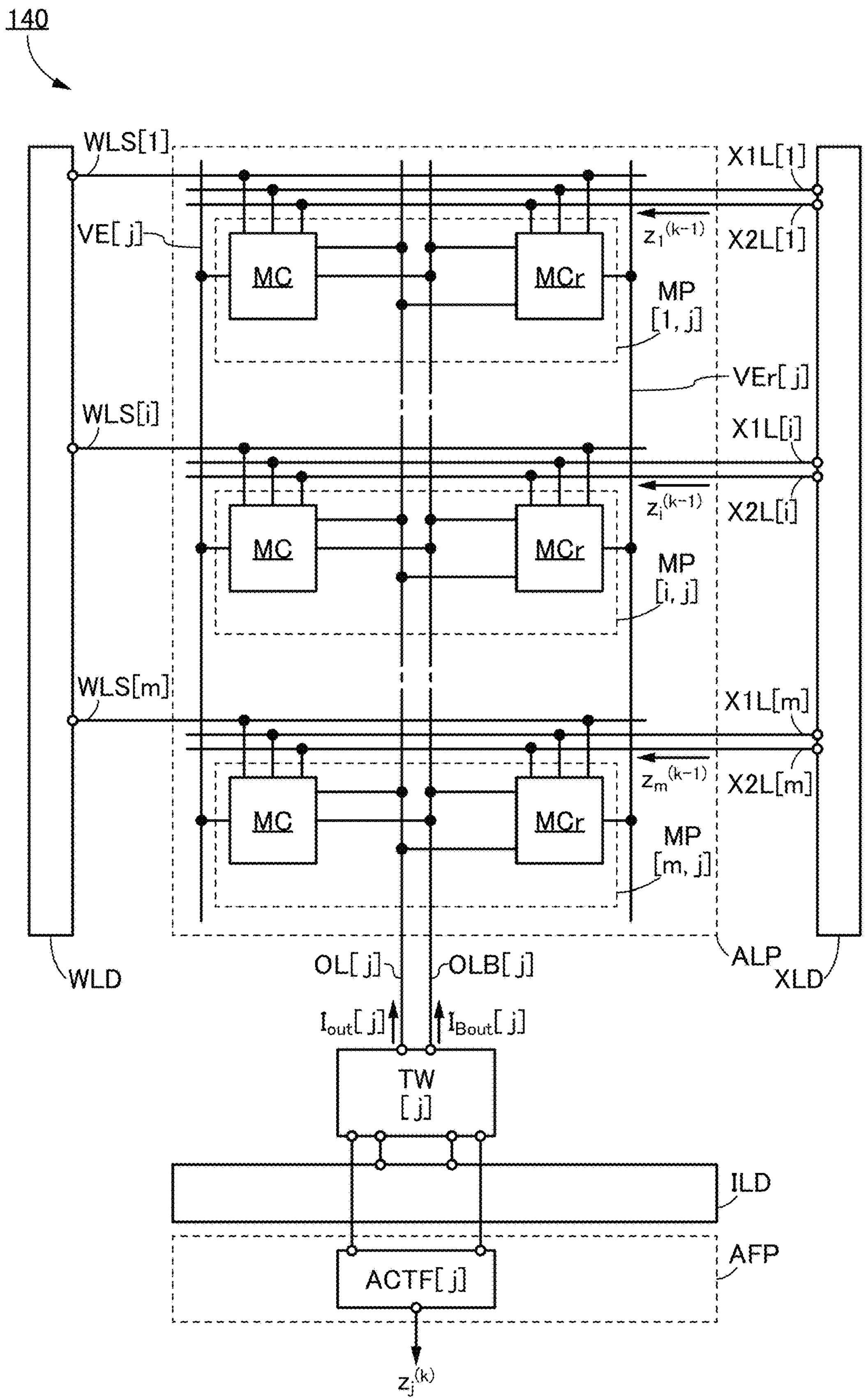
FIG. 13 is a circuit diagram illustrating a configuration example of a semiconductor device.

The arithmetic circuit 140 in FIG. 13 is illustrated focusing on a circuit positioned in the j-th column of the arithmetic circuit 140 in FIG. 7. That is, the arithmetic circuit 140 in FIG. 13 corresponds to a circuit that performs product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ input from the neuron $N_1^{(k-1)}$ to the neuron $N_m^{(k-1)}$ to the neuron $N_j^{(k)}$ in the neural network 100 illustrated in FIG. 1A and arithmetic operation of an activation function using the result of the product-sum operation. Furthermore, the circuit MP in FIG. 9B is used as the circuit MP included in the array portion ALP of the arithmetic circuit 140 in FIG. 13.

First, in the arithmetic circuit 140, the first data $w_1^{(k-1)}{}_j^{(k)}$ to $w_m^{(k-1)}{}_j^{(k)}$ are set in the circuit MP[1,j] to the circuit MP[m,j]. The first data $w_i^{(k-1)}{}_j^{(k)}$ is set in the following manner: a predetermined potential is input to the wiring WLS[1] to the wiring WLS[m] sequentially by the circuit WLD to select the circuit MP[1,j] to the circuit MP[m,j] sequentially, and a potential, a current, or the like corresponding to the first data is supplied from the circuit ILD through the switching circuit TW[j], the wiring OL[j], and the wiring OLB[j] to the circuit HC of the circuit MC and the circuit HCr of the circuit MCr that are included in each of the selected circuits MP. After the supply of the potential, the current, or the like, the circuit WLD makes the circuit MP[1,j] to the circuit MP[m,j] unselected, so that the potential, the current, or the like corresponding to the first data $w_1^{(k-1)}{}_j^{(k)}$ to $w_m^{(k-1)}{}_j^{(k)}$ can be held in the circuit HC of the circuit MC and the circuit HCr of the circuit MCr that are included in each of the circuit MP[1,j] to the circuit MP[m, j]. For example, in the case where the first data $w_1^{(k-1)}{}_j^{(k)}$ to $w_m^{(k-1)}{}_j^{(k)}$ each be a positive value, a value corresponding to the positive value is input to the circuit HC and a value corresponding to zero is input to the circuit HCr. In contrast, in the case where the first data $w_1^{(k-1)}{}_j^{(k)}$ to $w_m^{(k-1)}{}_j^{(k)}$ each be a negative value, a value corresponding to zero is input to the circuit HC and a value corresponding to the absolute value of the negative value is input to the circuit HCr.

Next, the second data $z_1^{(k-1)}$ to $z_m^{(k-1)}$ are supplied to the wiring X1L[1] to the wiring X1L[m] and the wiring X2L[1] to the wiring X2L[m] by the circuit XLD. As a specific example, the second data $z_i^{(k-1)}$ is supplied to the wiring X1L[i] and the wiring X2L[i]. Note that the wiring X1L[i] and the wiring X2L[i] correspond to the wiring XLS[i] of the arithmetic circuit 140 illustrated in FIG. 7.

Electrical continuity between the circuit MC and the circuit MCr included in each of the circuit MP[1,j] to the circuit MP[m,j] and the wiring OL[j] and the wiring OLB[j] is determined in accordance with the second data $z_1^{(k-1)}$ to $z_m^{(k-1)}$ input respectively to the circuit MP[1,j] to the circuit MP[m,j]. As a specific example, in accordance with the second data $z_i^{(k-1)}$, the circuit MP[i,j] is in any one of a state where "electrical continuity is established between the circuit MC and the wiring OL[j] and electrical continuity is established between the circuit MCr and the wiring OLB[j]", a state where "electrical continuity is established between the circuit MC and the wiring OLB[j] and electrical continuity is established between the circuit MCr and the wiring OL[j]", and a state where "electrical continuity between each of the circuit MC and the circuit MCr and the wiring OL[j] and the wiring OLB[j] is not established". For example, in the case where the second data $z_i^{(k-1)}$ has a positive value, a value with which electrical continuity can be established between the circuit MC and the wiring OL[j] and electrical continuity can be established between the circuit MCr and the wiring OLB[j] is input to the wiring X1L[1]. Then, a value with which electrical continuity cannot be established between the circuit MC and the wiring OLB[j] and electrical continuity cannot be established between the circuit MCr and the wiring OL[j] is input to the wiring X2L[1]. In the case where the second data $z_i^{(k-1)}$ has a negative value, a value with which electrical continuity can be established between the circuit MC and the wiring OLB[j] and electrical continuity can be established between the circuit MCr and the wiring OL[j] is input to the wiring X1L[1]. Then, a value with which electrical continuity cannot be established between the circuit MC and the wiring OL[j] and electrical continuity cannot be established between the circuit MCr and the wiring OLB[j] is input to the wiring X2L[1]. In the case where the second data $z_i^{(k-1)}$ has a value of 0, a value with which electrical continuity cannot be established between the circuit MC and the wiring OLB[j] and electrical continuity cannot be established between the circuit MCr and the wiring OL[j] is input to the wiring X1L[1]. Then, a value with which electrical continuity cannot be established between the circuit MC and the wiring OL[j] and electrical continuity cannot be established between the circuit MCr and the wiring OLB[j] is input to the wiring X2L[1].

Electrical continuity or electrical discontinuity between the circuit MC and the circuit MCr that are included in the circuit MP[i,j] and the wiring OL[j] and the wiring OLB[j] is determined in accordance with the second data $z_i^{(k-1)}$ input to the circuit MP[i,j], whereby currents are input and output between the circuit MC and the circuit MCr and the wiring OL[j] and the wiring OLB[j]. Furthermore, the amount of the currents is determined in accordance with the first data $w_i^{(k-1)}{}_j^{(k)}$ and/or the second data $z_i^{(k-1)}$ set in the circuit MP[i,j].

For example, in the circuit MP[i,j], a current flowing from the wiring OL[j] to the circuit MC or the circuit MCr is I[i,j], and a current flowing from the wiring OLB[j] to the circuit MC or the circuit MCr is $I_B$[i,j]. When a current flowing from the circuit ACTF[j] to the wiring OL[j] is $I_{out}$[j] and a current flowing from the wiring OLB[j] to the circuit ACTF [j] is $I_{Bout}$[j], $I_{out}$[j] and $I_{Bout}$[j] can be expressed by the following formulae.

[Formula 5]

$$I_{out}[j] = \sum_{i=1}^{m} I[i, j] \tag{1.5}$$

$$I_{Bout}[j] = \sum_{i=1}^{m} I_B[i, j] \tag{1.6}$$

In the circuit MP[i,j], the circuit MC releases I(+1) and the circuit MCr releases I(−1) in the case where the first data $w_i^{(k-1)}{}_j^{(k)}$ is "+1", the circuit MC releases I(−1) and the circuit MCr releases I(+1) in the case where the first data $w_i^{(k-1)}{}_j^{(k)}$ is "−1", and the circuit MC releases I(−1) and the circuit MCr releases I(−1) in the case where the first data $w_i^{(k-1)}{}_j^{(k)}$ is "0", for example.

Furthermore, the circuit MP[i,j] is in a state where "electrical continuity is established between the circuit MC and the wiring OL[j], electrical continuity is established between the circuit MCr and the wiring OLB[j], electrical continuity is broken between the circuit MC and the wiring OLB[j], and electrical continuity is broken between the circuit MCr and the wiring OL[j]" in the case where the second data $z_i^{(k-1)}$ is "+1"; the circuit MP[i,j] is in a state where "electrical continuity is established between the circuit MC and the wiring OLB[j], electrical continuity is established between the circuit MCr and the wiring OL[j], electrical continuity is broken between the circuit MC and the wiring OL[j], and electrical continuity is broken between the circuit MCr and the wiring OLB[j]" in the case where the second data $z_i^{(k-1)}$ is "−1"; and the circuit MP[i,j] is in a state where "electrical continuity is broken between the circuit MC and the wiring OL[j] and between the circuit MC and the wiring OLB[j], electrical continuity is broken between the circuit MCr and the wiring OL[j] and between the circuit MCr and the wiring OLB[j], and electrical continuity is broken between the circuit MCr and the wiring OL[j] and between the circuit MCr and OLB[j]" in the case where the second data $z_i^{(k-1)}$ is "0".

In this case, in the circuit MP[i,j], the current I[i,j] flowing from the wiring OL[j] to the circuit MC or the circuit MCr and the current $I_B$[i,j] flowing from the wiring OLB[j] to the circuit MC or the circuit MCr are as shown in the following table. Note that depending on the case, the circuit MP[i,j] may be configured such that the amount of current I(−1) is 0. Note that the current I[i,j] may be a current flowing from the circuit MC or the circuit MCr to the wiring OL[j]. Similarly, the current $I_B$[i,j] may be a current flowing from the circuit MC or the circuit MCr to the wiring OLB[j].

TABLE 1

| $w_i^{(k-1)}{}_j^{(k)}$ | $z_i^{(k-1)}$ | I[i, j] | $I_B$[i, j] |
|---|---|---|---|
| 0 | +1 | I(−1) | I(−1) |
| +1 | +1 | I(+1) | I(−1) |
| −1 | +1 | I(−1) | I(+1) |
| 0 | −1 | I(−1) | I(−1) |
| +1 | −1 | I(−1) | I(+1) |
| −1 | −1 | I(+1) | I(−1) |
| 0 | 0 | 0 | 0 |
| +1 | 0 | 0 | 0 |
| −1 | 0 | 0 | 0 |

Then, $I_{out}$[j] and $I_{Bout}$[j] respectively flowing from the wiring OL[j] and the wiring OLB[j] are input to the circuit ACTF[j], and the circuit ACTF[j] compares $I_{out}$[j] and $I_{Bout}$[j], for example. On the basis of the comparison result, the circuit ACTF[j] outputs the signal $z_j^{(k)}$ to be transmitted from the neuron $N_j^{(k)}$ to a neuron in the (k+1)-th layer, for example.

The arithmetic circuit 140 in FIG. 13 can perform, for example, product-sum operation of the weight coefficients $w_i^{(k-1)}{}_j^{(k)}$ to $w_m^{(k-1)}{}_j^{(k)}$ and the signals $z_i^{(k-1)}$ to $z_m^{(k-1)}$ input from the neuron $N_i^{(k-1)}$ to the neuron $N_m^{(k-1)}$ to the neuron $N_j^{(k)}$ and arithmetic operation of an activation function using the result of the product-sum operation. Furthermore, a circuit comparable to the arithmetic circuit 140 in FIG. 7 can be formed by providing the circuits MP in n columns in the array portion ALP of the arithmetic circuit in FIG. 13. In other words, with the arithmetic circuit 140 in FIG. 7, the product-sum operation and the arithmetic operation of an activation function using the result of the product-sum operation can be performed in the neuron $N_1^{(k)}$ to the neuron $N_n^{(k)}$ concurrently.

<<Modification Example of Circuit or the Like Included in Arithmetic Circuit>>

The arithmetic circuit 110, the arithmetic circuit 120, the arithmetic circuit 130, the arithmetic circuit 140, the arithmetic circuit 150, and the arithmetic circuit 160 that are described above can each be changed into a circuit that performs not the arithmetic operation of Formula (1.2) but the arithmetic operation of Formula (1.3). Formula (1.3) corresponds to arithmetic operation in which a bias is applied to the product-sum result of Formula (1.2). Thus, a circuit for applying a bias value to the wiring OL and the wiring OLB may be provided in each of the arithmetic circuit 110, the arithmetic circuit 120, the arithmetic circuit 130, the arithmetic circuit 140, the arithmetic circuit 150, and the arithmetic circuit 160.

Figure 11:
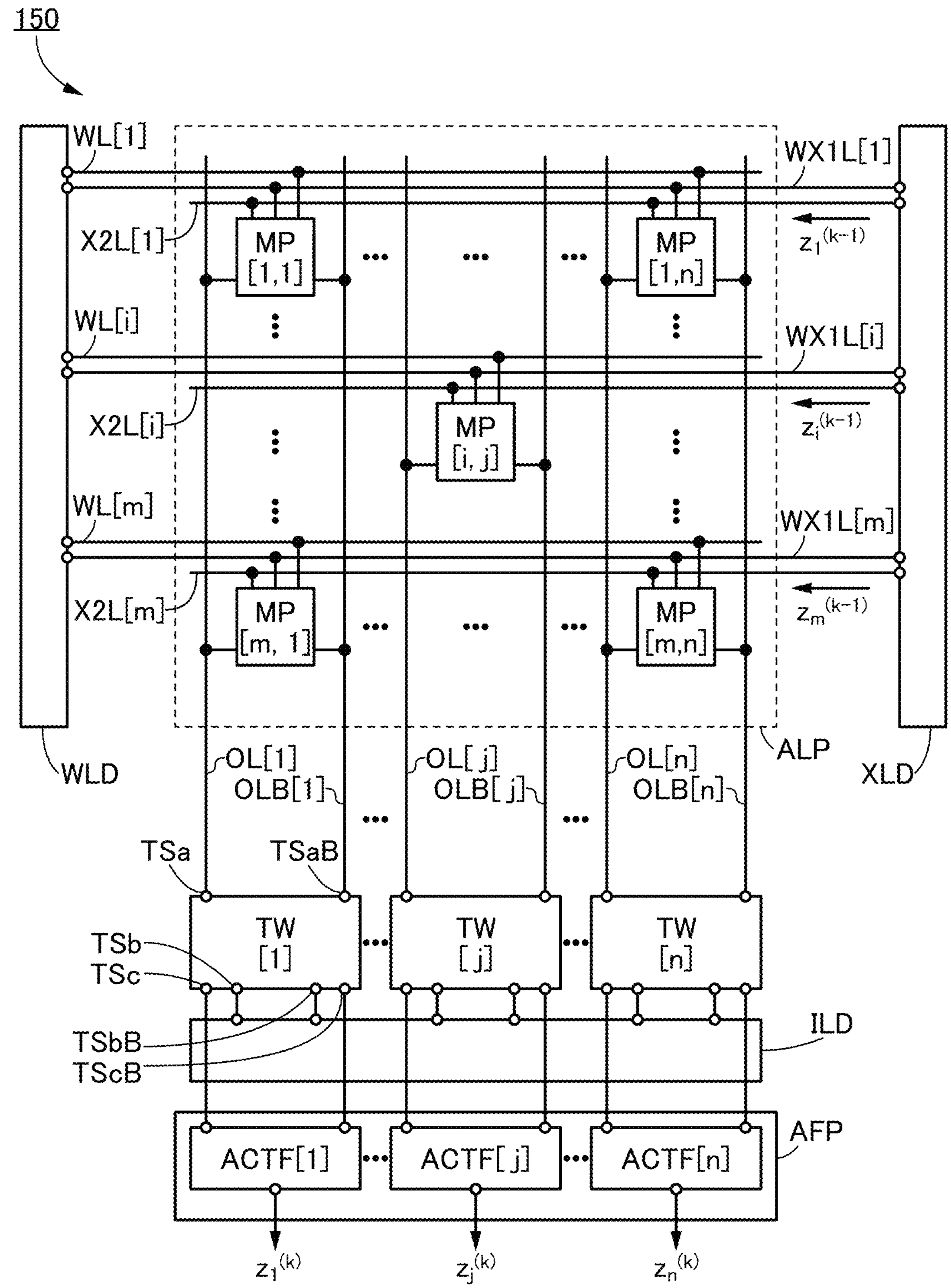
FIG. 11 is a circuit diagram illustrating a configuration example of a semiconductor device.
Figure 14:
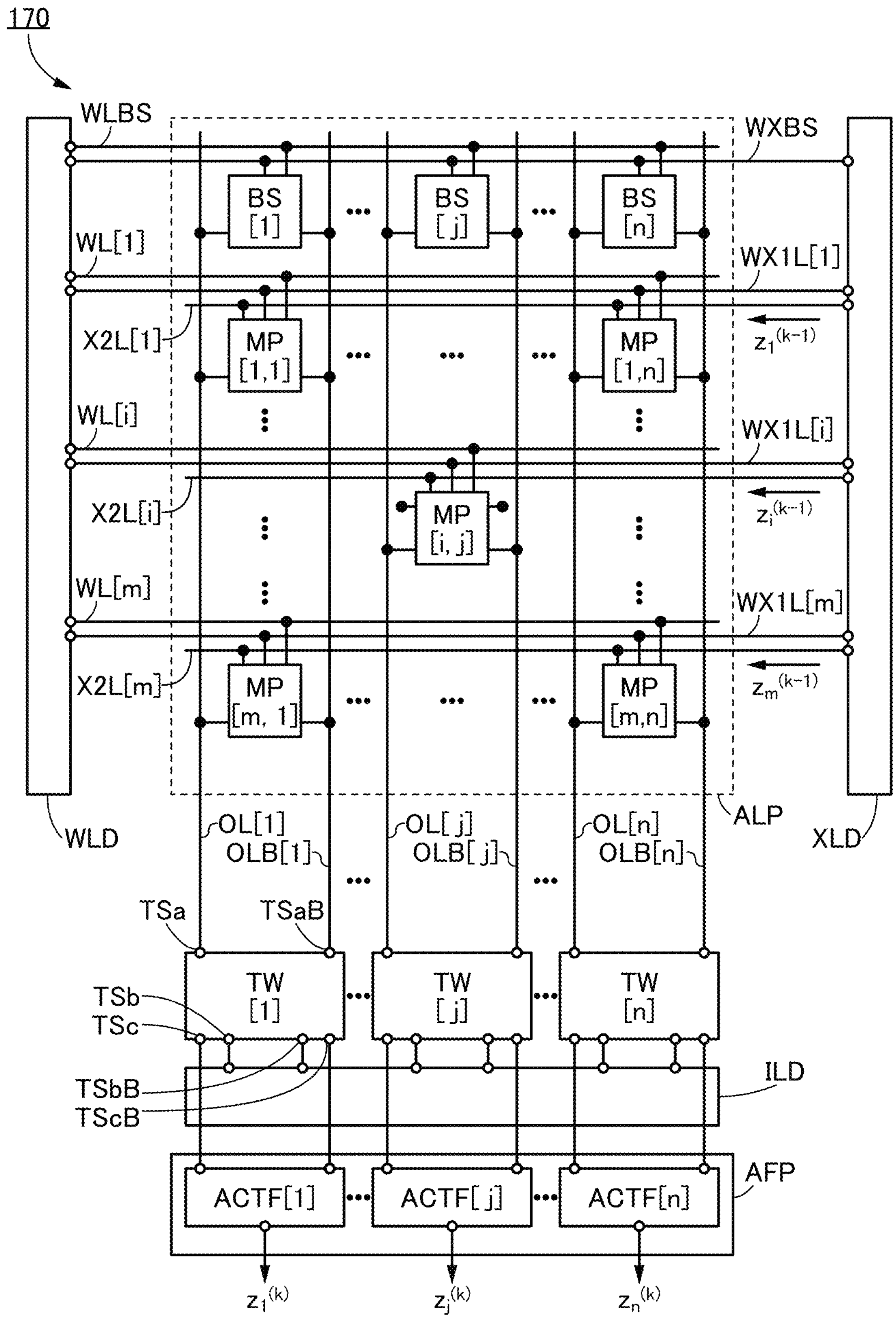
FIG. 14 is a circuit diagram illustrating a configuration example of a semiconductor device.

An arithmetic circuit 170 illustrated in FIG. 14 has a circuit configuration in which a circuit BS[1] to a circuit BS[n] are added to the array portion ALP of the arithmetic circuit 150 in FIG. 11.

The circuit BS[j] is electrically connected to the wiring OL[j], the wiring OLB[j], a wiring WLBS, and a wiring WXBS.

Like the wiring WLS[1] to the wiring WLS[m] of the arithmetic circuit 110 in FIG. 2, for example, and the wiring WL[1] to the wiring WL[m] of the arithmetic circuit 140 in FIG. 7, for example, the wiring WLBS functions as a wiring for supplying a signal that turns on or off writing switching elements included in the circuit BS[1] to the circuit BS[n]. Thus, the signal can be supplied from the circuit WLD to the wiring WLBS when the wiring WLBS is electrically connected to the circuit WLD.

Like the wiring XLS[1] to the wiring XLS[m] of the arithmetic circuit 110 in FIG. 2, for example, the wiring WXBS functions as a wiring for supplying, to the circuit BS[1] to the circuit BS[n], information (e.g., a potential or a current value) corresponding to the second data $z_i^{(k-1)}$ output from the neuron $N_i^{(k-1)}$. Thus, the information can be supplied from the circuit XLD to the wiring WXBS when the wiring WXBS is electrically connected to the circuit XLD.

In addition, like the wiring WX1L[1] to the wiring WX1L[n] of the arithmetic circuit 140 in FIG. 7, for example, the wiring WXBS may also be used as a selection signal line for writing information to the circuit BS[1] to the circuit BS[n]. The arithmetic circuit 170 in FIG. 14 shows an example in which the wiring WXBS is electrically connected to the circuit WLD. In the case of such a configuration, the circuit WLD can supply, to each of the wiring WLBS and the wiring WXBS, a signal for turning on or off the writing switching elements included in the circuit BS[1] to the circuit BS[n].

In the j-th column of the array portion ALP of the arithmetic circuit 170, the amount of current flowing from the circuit MP[1,j] to the circuit MP[m,j] to the wiring OL[j] and the wiring OLB[j] can be expressed by Formula (1.5) and Formula (1.6). Since the wiring OL[j] and the wiring OLB[j] are electrically connected to the circuit BS[j], when a current flowing from the circuit BS[j] to the wiring OL[j] is $I_{BIAS}[j]$ and a current flowing from the circuit BS[j] to the wiring OLB[j] is $I_{BIASB}[j]$, Formula (1.5) and Formula (1.6) can be rewritten as the following formulae.

[Formula 6]

$$I_{out}[j] = \sum_{i=1}^{m} I[i, j] + I_{BIAS}[j] \tag{1.7}$$

$$I_{Bout}[j] = \sum_{i=1}^{m} I_B[i, j] + I_{BIASB}[j] \tag{1.8}$$

Accordingly, $I_{out}[j]$ and $I_{Bout}[j]$ each including a bias can be generated as the arithmetic operation of Formula (1.3). In addition, when $I_{out}[j]$ and $I_{Bout}[j]$ each including a bias are input to the circuit ACTF[j], the biased output signal $z_j^{(k)}$ from the neuron $N_j^{(k)}$ can be generated.

Although the arithmetic circuit 170 in FIG. 14 has a configuration in which the circuit BS[1] to the circuit BS[n] are provided for one row in the array portion ALP, one embodiment of the present invention is not limited thereto. For example, the circuit BS[1] to the circuit BS[n] may be provided for two or more rows in the array portion ALP.

Some or all of the transistors included in the above-described array portion ALP, circuit ILD, circuit WLD, circuit XLD, circuit AFP, circuit MP, switching circuit TW, and the like are preferably OS transistors, for example. For example, a transistor whose off-state current is desired to be low, specifically, a transistor having a function of holding charge accumulated in a capacitor or the like is preferably an OS transistor. In particular, in the case where an OS transistor is used as the transistor, the OS transistor preferably has a transistor structure described particularly in Embodiment 5. For a metal oxide included in a channel formation region of the OS transistor, one or more materials selected from indium, an element M (the element M is aluminum, gallium, yttrium, or tin), and zinc can be used, for example. In particular, a metal oxide containing indium, gallium, and zinc is an intrinsic (also referred to as i-type) or substantially intrinsic semiconductor that has a wide band gap, and the carrier concentration of the metal oxide is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. The off-state current per micrometer of channel width of the OS transistor including the metal oxide in the channel formation region can be lower than or equal to 10 aA ($1\times10^{-17}$ A), preferably lower than or equal to 1 aA ($1\times10^{-18}$ A), further preferably lower than or equal to 10 zA ($1\times10^{-20}$ A), still further preferably lower than or equal to 1 zA ($1\times10^{-21}$ A), yet further preferably lower than or equal to 100 yA ($1\times10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

Note that one embodiment of the present invention is not limited to the above, and the transistors included in the array portion ALP, the circuit ILD, the circuit WLD, the circuit XLD, the circuit AFP, the circuit MP, the switching circuit TW, and the like are not necessarily OS transistors. Other than the OS transistor, a transistor containing silicon in a channel formation region (a Si transistor) may be used, for example. As silicon, single crystal silicon, amorphous silicon (sometimes referred to as hydrogenated amorphous silicon), microcrystalline silicon, or polycrystalline silicon can be used, for example. Other than the OS transistor and the Si transistor, it is possible to use, for example, a transistor containing Ge or the like in a channel formation region, a transistor containing a compound semiconductor such as ZnSe, CdS, GaAs, InP, GaN, or SiGe in a channel formation region, a transistor containing a carbon nanotube in a channel formation region, or a transistor containing an organic semiconductor in a channel formation region.

Note that for the metal oxides in the semiconductor layers of OS transistors, n-type semiconductors of a metal oxide containing indium (e.g., In oxide) and a metal oxide containing zinc (e.g., Zn oxide) have been manufactured, but p-type semiconductors thereof are difficult to manufacture in terms of mobility and reliability in some cases. For that reason, in the arithmetic circuit 110, the arithmetic circuit 120, the arithmetic circuit 130, the arithmetic circuit 140, the arithmetic circuit 150, the arithmetic circuit 160, and the arithmetic circuit 170, OS transistors may be used as n-channel transistors included in the array portion ALP, the circuit ILD, the circuit WLD, the circuit XLD, the circuit AFP, the circuit MP, and the like, and Si transistors may be used as p-channel transistors.

Note that this embodiment can be combined with any of the other embodiments in this specification as appropriate.

Embodiment 2

This embodiment describes specific configuration examples of the circuit MP described in Embodiment 1.

Note that in Embodiment 1, [1,1], [i,j], [m,n], or the like that indicates a position in the array portion ALP is added to the reference numeral of the circuit MP; however, in this embodiment, the addition of [1,1], [i,j], [m,n], or the like to the reference numeral of the circuit MP is omitted unless otherwise specified.

Configuration Example 1

Figure 15A:
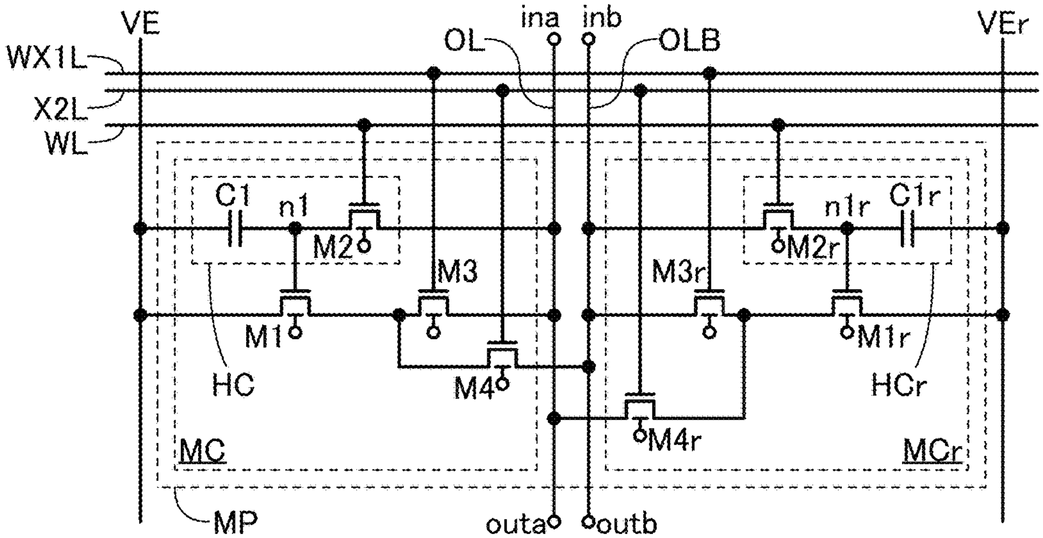
FIG. 15A to FIG. 15C are circuit diagrams each illustrating a configuration example of a circuit included in a semiconductor device.

First, an example of a circuit configuration that can be applied to the circuit MP in FIG. 9B is described. The circuit MP illustrated in FIG. 15A is an example of the configuration of the circuit MP in FIG. 9B, and the circuit MC included in the circuit MP in FIG. 15A includes the transistor M1 to a transistor M4 and a capacitor C1, for example. Note that for example, the includes the transistor M2 and the capacitor C1 configure the circuit HC.

In the circuit MP in FIG. 15A, the circuit MCr has substantially the same circuit configuration as the circuit MC. Thus, "r" is added to the reference numerals of the circuit elements and the like included in the circuit MCr to differentiate them from the circuit elements and the like included in the circuit MC.

Figure 15B:
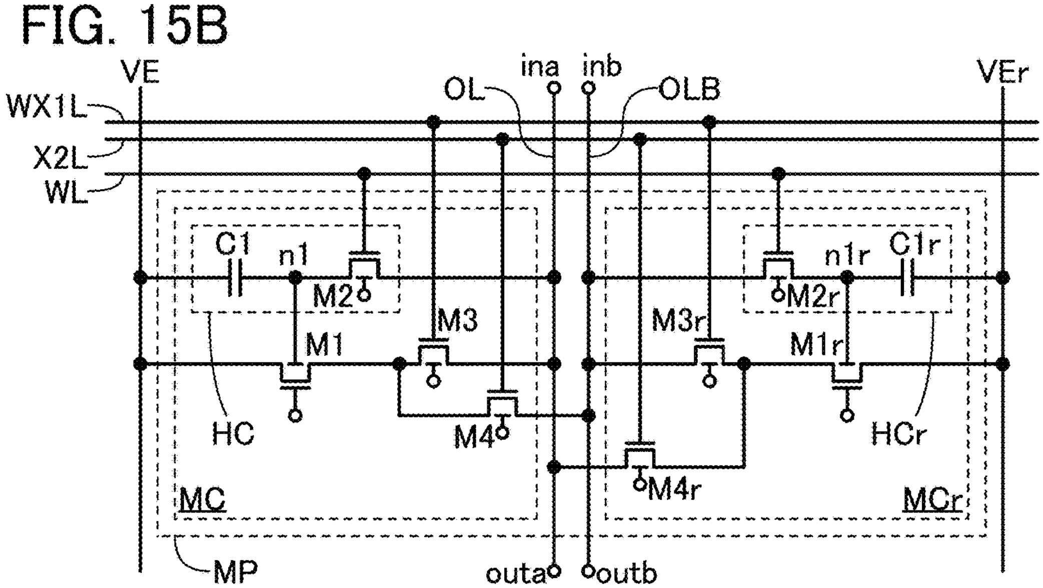

The transistor M1 to the transistor M4 illustrated in FIG. 15A are each an n-channel transistor having a multi-gate structure including gates over and under a channel, and the transistor M1 to the transistor M4 each include a first gate and a second gate. In particular, the sizes of the transistor M3 and the transistor M4 are preferably equal to each other, for example. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection configuration in which "a gate is electrically connected to a first wiring and a back gate is electrically connected to a second wiring" can be replaced with a connection configuration in which "a back gate is electrically connected to a first wiring and a gate is electrically connected to a second wiring". For example, as illustrated in FIG. 15B, the back gate of the transistor M1 may be electrically connected to a first terminal of the capacitor C1 and a first terminal of the transistor M2.

The semiconductor device of one embodiment of the present invention does not depend on the connection configuration of aback gate of a transistor. In the transistor M1 to the transistor M4 illustrated in FIG. 15A, the back gate is illustrated and the connection configuration of the back gate is not illustrated; however, a target to which the back gate is electrically connected can be determined at the design stage. For example, in a transistor including a back gate, a gate and the back gate may be electrically connected to each other to increase the on-state current of the transistor. In other words, the gate and the back gate of a transistor M2 may be electrically connected to each other, for example. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to that in FIG. 15A.

Figure 15C:
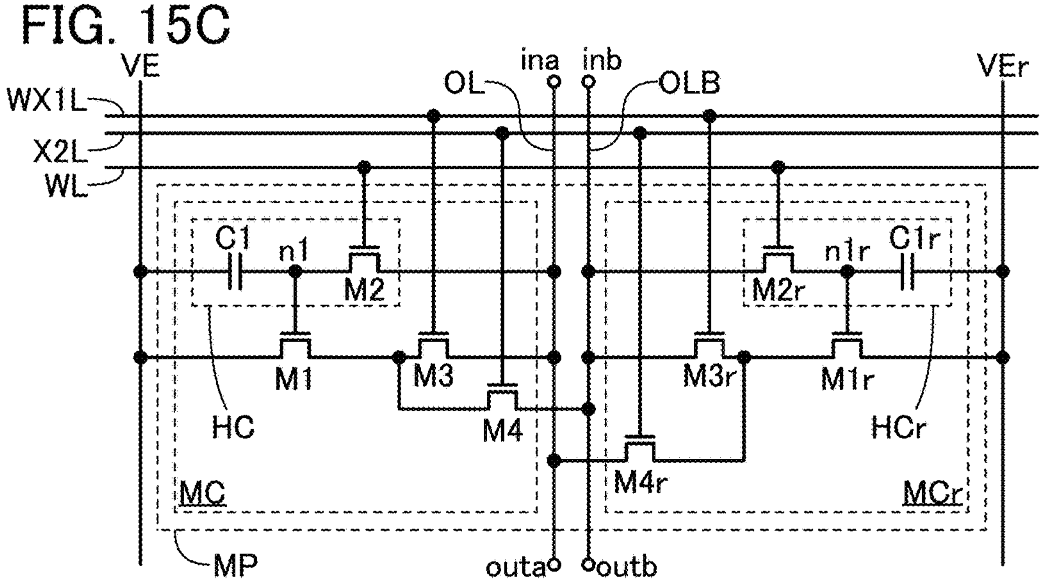

The semiconductor device of one embodiment of the present invention does not depend on the structure of a transistor included in the semiconductor device. For example, the transistor M1 to the transistor M4 illustrated in FIG. 15A may be a transistor having a structure not including a back gate, that is, a single-gate structure as illustrated in FIG. 15C. It is also possible that some transistors have a structure including a back gate and the other transistors have a structure not including a back gate. Note that the same applies to a transistor described in other parts of the specification and a transistor illustrated in other drawings, not only to that in the circuit diagram illustrated in FIG. 15A.

In this specification and the like, transistors with a variety of structures can be used as a transistor. Thus, there is no limitation on the type of transistors used. Examples of the transistor include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a lower temperature than the case of using single crystal silicon, manufacturing costs can be reduced or a larger manufacturing apparatus can be used. Since a larger manufacturing apparatus can be used, TFTs can be manufactured over a large substrate. This enables a large number of display devices to be manufactured at a time, resulting in low cost manufacturing. Alternatively, a low manufacturing temperature allows the use of a low heat-resistance substrate. Thus, transistors can be manufactured over a light-transmitting substrate. Alternatively, transmission of light in a display element can be controlled using the transistor over a light-transmitting substrate. Alternatively, some of the films included in the transistor can transmit light because the transistor is thin. Accordingly, the aperture ratio can be increased.

For example, a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used. Alternatively, a thin film transistor including a thin film of such a compound semiconductor or oxide semiconductor can be used, for example. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example, a transistor formed by an inkjet method or a printing method can be used. The transistor can be manufactured at room temperature, manufactured at a low vacuum degree, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted as compared with a manufacturing method by which etching is performed after the film is formed over the entire surface; thus, the cost can be reduced.

As another example, a transistor containing an organic semiconductor, a carbon nanotube, or the like can be used. Thus, a transistor can be formed over a bendable substrate. A device using a transistor containing an organic semiconductor, a carbon nanotube, or the like can be highly resistant to impact.

Note that a transistor with any of a variety of other structures can also be used. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

As another example, it is possible to use a transistor having a structure in which gate electrodes are placed over and under an active layer. With the structure in which the gate electrodes are placed over and under the active layer, a circuit configuration is such that a plurality of transistors are connected in parallel. Thus, a channel formation region is increased, so that the amount of current can be increased. Alternatively, with the structure in which the gate electrodes are placed over and under the active layer, a depletion layer can be easily formed, so that subthreshold swing can be improved.

As another example, it is possible to use a transistor having a structure in which a gate electrode is placed over an active layer, a structure in which a gate electrode is placed under an active layer, a staggered structure, an inverted staggered structure, a structure in which a channel region is divided into a plurality of regions, a structure in which active layers are connected in parallel, a structure in which active layers are connected in series, or the like. Alternatively, a transistor can have a variety of structures such as a planar type, a FIN-type, a TRI-GATE type, a top-gate type, a bottom-gate type, and a double-gate type (with gates placed over and under a channel).

As another example, it is possible to use a transistor having a structure in which at least one of a source electrode and a drain electrode overlaps with an active layer (or part thereof). Employing the structure in which at least one of the source electrode and the drain electrode overlaps with the active layer (or part thereof) can prevent unstable operation due to charge accumulation in part of the active layer.

As another example, it is possible to use a transistor having a structure in which an LDD region is provided. By providing the LDD region, it is possible to achieve a reduction in off-state current or an increase in withstand voltage (an improvement in reliability) of the transistor. Alternatively, by providing the LDD region, in the case of operation in a saturation region, the drain current does not change much even if the drain-source voltage changes, and thus the voltage-current characteristics having a flat slope can be obtained.

In this specification and the like, a transistor can be formed using a variety of substrates, for example. The type of the substrate is not limited to a certain type. Examples of the substrate include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. The examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate, and a transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred to even a substrate having low heat resistance, a flexible substrate, or the like. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate; thus, the transistor may be positioned over another substrate. Examples of the substrate to which the transistor is transferred include, in addition to the above-described substrates where the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, or an SOI substrate). In this manner, the cost can be reduced by a reduction in the number of components or the reliability can be improved by a reduction in the number of connection points to circuit components.

Note that it is possible that not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed on a single crystal substrate (or an SOI substrate). The single crystal substrate where the other part of the circuits necessary to achieve the predetermined function is formed (also referred to as an IC chip) can be connected to the glass substrate by COG (Chip On Glass), and the IC chip can be placed over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

In the circuit MP in FIG. 15A, a first terminal of the transistor M1 is electrically connected to the wiring VE. A second terminal of the transistor M1 is electrically connected to a first terminal of the transistor M3 and a first terminal of the transistor M4. A gate of the transistor M1 is electrically connected to the first terminal of the capacitor C1 and the first terminal of the transistor M2. A second terminal of the capacitor C1 is electrically connected to the wiring VE. A second terminal of the transistor M2 is electrically connected to the wiring OL. A gate of the transistor M2 is electrically connected to the wiring WL. A second terminal of the transistor M3 is electrically connected to the wiring OL, and a gate of the transistor M3 is electrically connected to the wiring WX1L. A second terminal of the transistor M4 is electrically connected to the wiring OLB, and a gate of the transistor M4 is electrically connected to the wiring X2L.

The connection configuration of the circuit MCr different from that of the circuit MC is described. A second terminal of a transistor M3*r* is electrically connected to not the wiring OL but the wiring OLB, and a second terminal of a transistor M4*r* is electrically connected to not the wiring OLB but the wiring OL. A first terminal of a transistor M1*r* and a first terminal of a capacitor C1*r* are electrically connected to the wiring VEr.

Figure 16A:
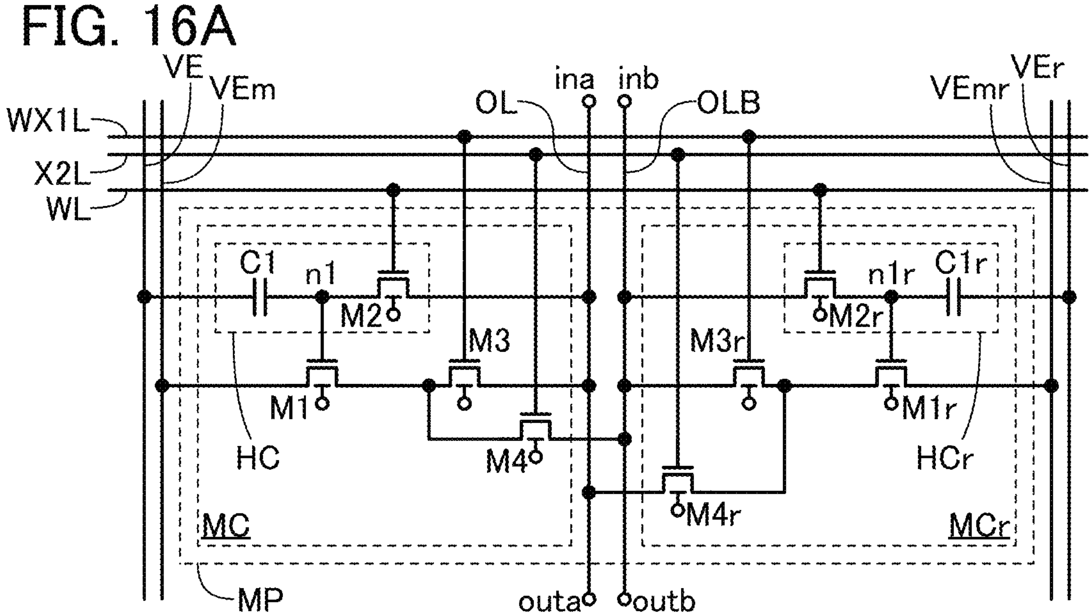
FIG. 16A and FIG. 16B are circuit diagrams each illustrating a configuration example of a circuit included in a semiconductor device.

Note that as illustrated in FIG. 16A, the first terminal of the transistor M1 may be electrically connected to not the wiring VE but another wiring VEm. Similarly, the first terminal of the transistor M1*r* may be electrically connected to not the wiring VEr but another wiring VEmr. Note that the first terminal of the transistor M1 may be electrically connected to not the wiring VE but another wiring VEm, and/or the first terminal of the transistor M1*r* may be electrically connected to not the wiring VEr but another wiring VEmr, not only in FIG. 16A but also in a circuit diagram in another drawing.

Note that in the circuit HC illustrated in FIG. 15A, an electrical connection point of the gate of the transistor M1, the first terminal of the capacitor C1, and the first terminal of the transistor M2 is a node n1.

As described in Embodiment 1, the circuit HC has a function of holding a potential corresponding to the first data, for example. The potential is held in the circuit HC included in the circuit MC in FIG. 15A in the following manner: when the transistor M2 and the transistor M3 are turned on, the potential is input from the wiring OL and written to the capacitor C1, and then the transistor M2 is turned off. Thus, the potential of the node n1 can be held as the potential corresponding to the first data. At this time, a current is input from the wiring OL and a potential having a level corresponding to the amount of current can be held in the capacitor C1. Hence, the influence of variations in current characteristics of the transistor M1 can be reduced.

As the transistor M1, a transistor with a low off-state current is preferably used to hold the potential of the node n1 for a long time. As the transistor with a low off-state current, an OS transistor can be used, for example. Alternatively, a transistor including aback gate may be used as the transistor M1, and an off-state current may be reduced by applying a low-level potential to the back gate to shift the threshold voltage to the positive side.

In order to simply describe a current input to or output from the circuit MP in an operation example described below, both ends of the wiring OL illustrated in FIG. 15A are referred to as a node ina and a node outa and both ends of the wiring OLB are referred to as a node inb and a node outb.

The wiring VE functions as a wiring for supplying a constant voltage, for example. In the case where the transistor M3, the transistor M3*r*, the transistor M4, or the transistor M4*r* is an n-channel transistor and/or in the case where a potential supplied from the wiring VSO is a high-level potential in FIG. 8A to FIG. 8D, the constant voltage can be the low-level potential VSS, a ground potential, or a low-level potential other than those, for example. In addition, the wiring VEm, the wiring VEr, and the wiring VEmr each function as a voltage line for supplying a constant voltage like the wiring VE, and the constant voltage can be the low-level potential VSS, a low-level potential other than VSS, a ground potential, or the like. Alternatively, the constant voltage may be the high-level potential VDD. Here, in the case where any of FIG. 5A to FIG. 5E, FIG. 6A to FIG. 6D, and FIG. 6F is employed for the circuit ACTF[1] to the circuit ACTF[n] of each of the arithmetic circuit 110, the arithmetic circuit 120, the arithmetic circuit 130, the arithmetic circuit 140, the arithmetic circuit 150, and the arithmetic circuit 160, a constant voltage supplied from the wiring VAL electrically connected to the circuit ACTF[1] to the circuit ACTF[n] is preferably a potential higher than the potential VDD supplied from the wiring VE and the wiring VEr.

Figure 16B:
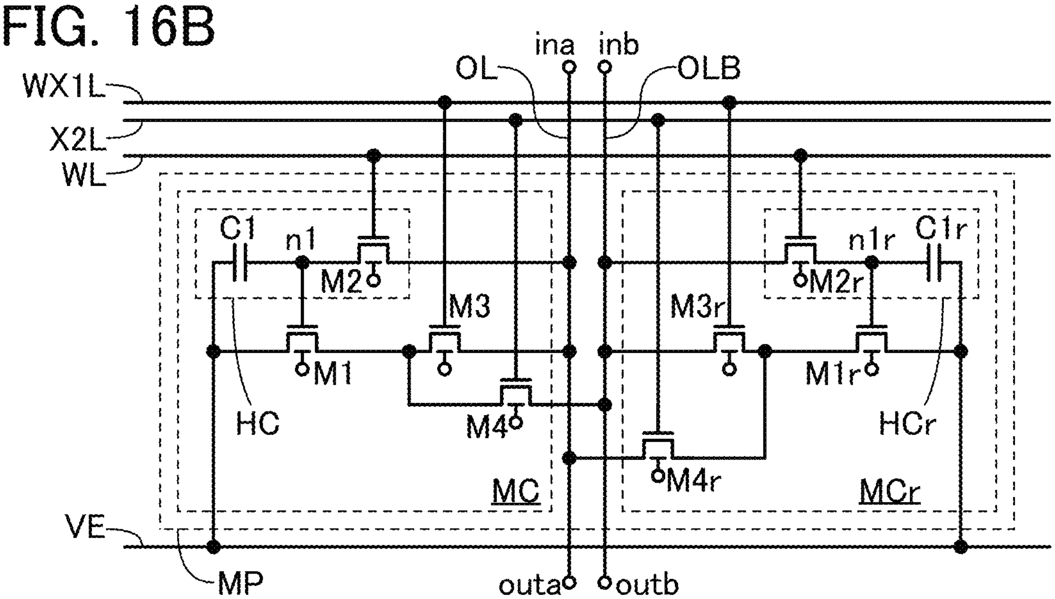

The constant voltages supplied from the wiring VE, the wiring VEm, the wiring VEr, and the wiring VEmr may be different from each other, or some or all of them may be the same. In the case where the voltages supplied from the wirings are the same, the wirings can be selected and combined into one wiring. For example, in the case where the constant voltages supplied from the wiring VE, the wiring VEm, the wiring VEr, and the wiring VEmr are almost equal to each other, the wiring VEm, the wiring VEr, and the wiring VEmr can be combined with the wiring VE, as in the circuit MP in FIG. 16B. Alternatively, for example, in the case where the constant voltages supplied from the wiring VE and the wiring VEr are almost equal to each other, the wiring VE and the wiring VEr can be combined into one wiring. Alternatively, for example, in the case where the constant voltages supplied from the wiring VEm and the wiring VEmr are almost equal to each other, the wiring VEm and the wiring VEmr can be combined into one wiring. Similarly, also in FIG. 16A, for example, the wiring VE and the wiring VEr may be combined into one wiring and the wiring VEm and the wiring VEmr may be combined into one wiring. Alternatively, for example, the wiring VE and the wiring VEmr may be combined into one wiring and the wiring VEm and the wiring VEr may be combined into one wiring.

Figure 17A:
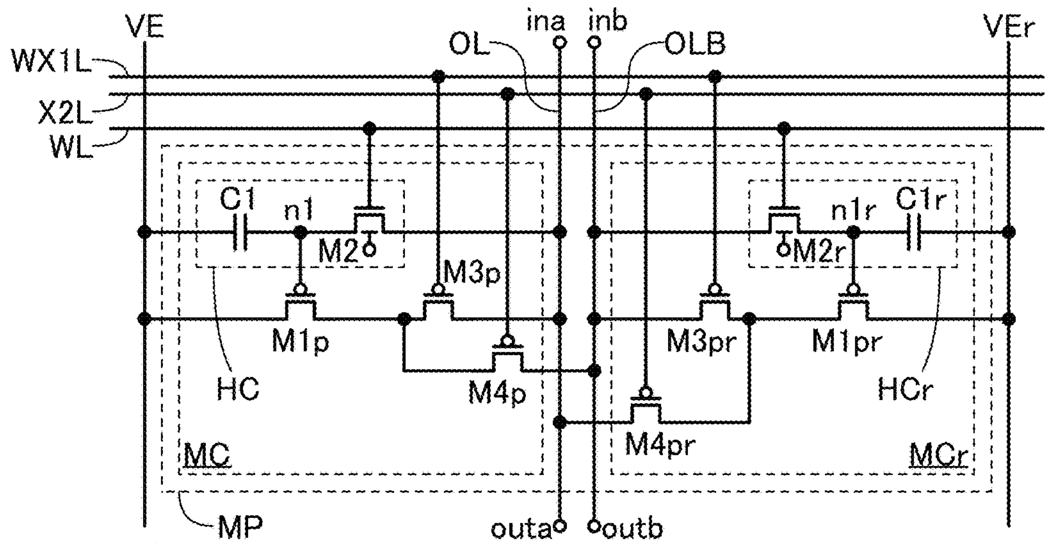
FIG. 17A to FIG. 17C are circuit diagrams each illustrating a configuration example of a circuit included in a semiconductor device.

The configuration of the circuit MP in FIG. 15A can be changed according to circumstances. For example, as illustrated in FIG. 17A, the transistor M1, the transistor M1*r*, the transistor M3, the transistor M3*r*, the transistor M4, and the transistor M4*r* of the circuit MP in FIG. 15A are respectively replaced with a transistor M1*p*, a transistor M1*pr*, a transistor M3*p*, a transistor M3*pr*, a transistor M4*p*, and a transistor M4*pr*, which are p-channel transistors. As the transistor M3*p*, the transistor M3*pr*, the transistor M4*p*, and the transistor M4*pr*, p-channel transistors having an SOI (Silicon On Insulator) structure can be used, for example. In this case, the constant voltages supplied from the wiring VE and the wiring VEr are each preferably the high-level potential VDD. As well as this case, in the case where any of FIG. 5A to FIG. 5E, FIG. 6A to FIG. 6D, and FIG. 6F is employed for the circuit ACTF[1] to the circuit ACTF[n] of each of the arithmetic circuit 110, the arithmetic circuit 120, the arithmetic circuit 130, the arithmetic circuit 140, the arithmetic circuit 150, and the arithmetic circuit 160, the constant voltage supplied from the wiring VAL electrically connected to the circuit ACTF[1] to the circuit ACTF[n] is preferably a ground potential or VSS. When the potential of the wiring is changed as described above, the direction in which a current flows is also changed.

Similarly, the transistor M2 may also be replaced with a p-channel transistor (not illustrated).

Figure 17B:
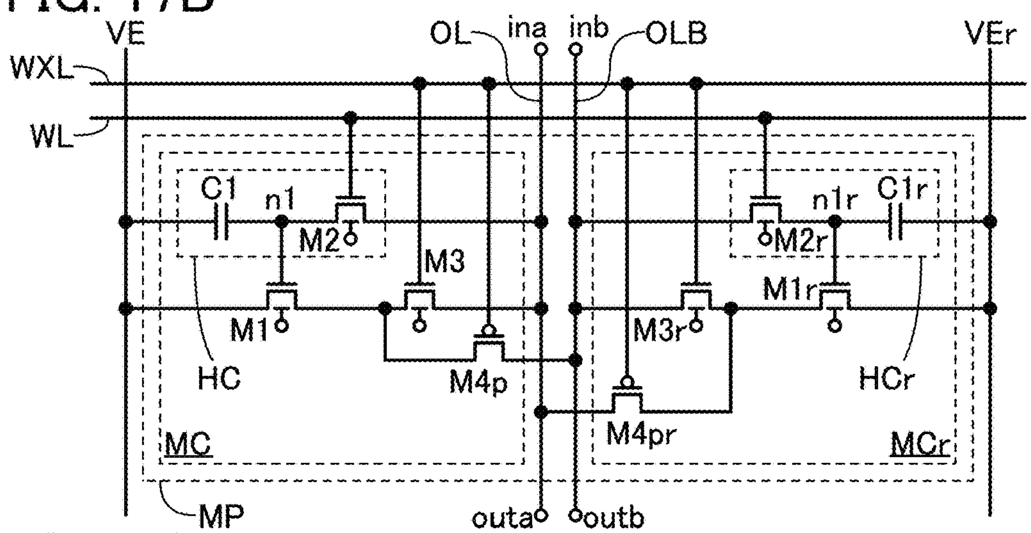

Alternatively, as illustrated in FIG. 17B, the transistors M4 and M4*r* of the circuit MP in FIG. 15A may be replaced with the transistors M4*p* and M4*pr*, which are p-channel transistors, for example. In addition, by combining the wirings connected to the gates of the transistor M3, the transistor M3*r*, the transistor M4*p*, and the transistor M4*pr* into one wiring WXL, the circuit MP can hold the first data (e.g., a weight coefficient) other than 0.

Figure 17C:
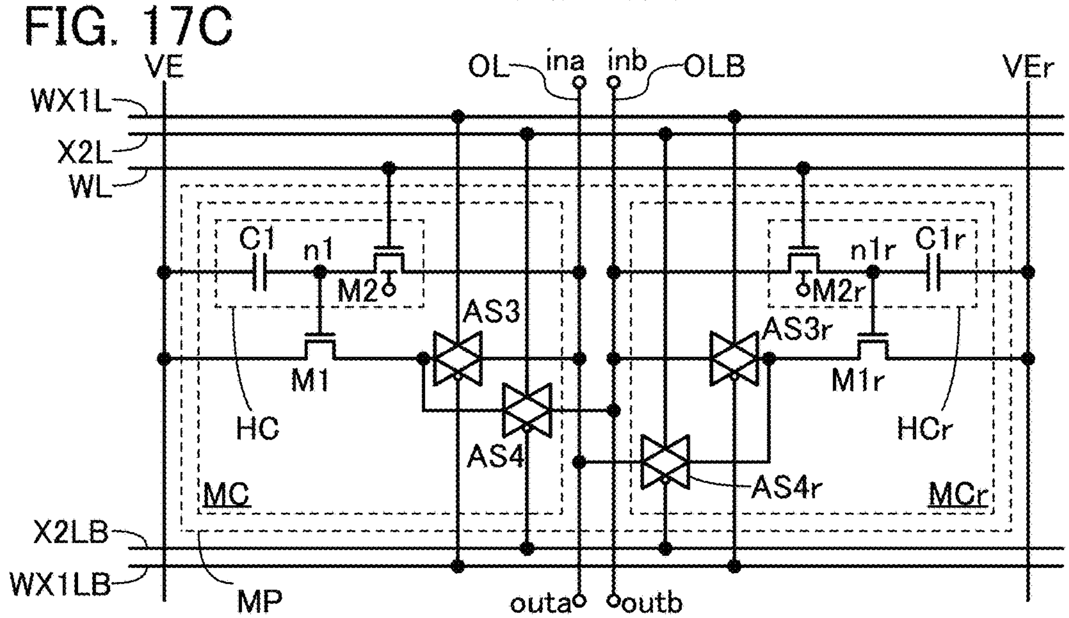

Alternatively, as illustrated in FIG. 17C, the transistor M3, the transistor M3*r*, the transistor M4, and the transistor M4*r* of the circuit MP in FIG. 15A may be replaced with an analog switch AS3, an analog switch AS4, an analog switch AS3*r*, and an analog switch AS4*r*, for example. Note that FIG. 17C also illustrates a wiring WX1LB and a wiring X2LB for driving the analog switch AS3, the analog switch AS4, the analog switch AS3*r*, and the analog switch AS4*r*. The wiring WX1LB is electrically connected to the analog switch AS3 and the analog switch AS3*r*, and the wiring X2LB is electrically connected to the analog switch AS4 and the analog switch AS4*r*. An inverted signal of a signal input to the wiring WX1L is input to the wiring WX1LB, and an inverted signal of a signal input to the wiring X2L is input to the wiring X2LB. The wiring WX1L and the wiring X2L may be combined into one wiring, and the wiring WX1LB and the wiring X2LB may be combined into one wiring (not illustrated). Note that for example, a CMOS structure in which an n-channel transistor and a p-channel transistor are used may be employed for the analog switch AS3, the analog switch AS4, the analog switch AS3*r*, and the analog switch AS4*r*.

It is preferable that the sizes, e.g., the channel lengths and the channel widths, of the transistor M3, the transistor M3*r*, the transistor M4, and the transistor M4*r* illustrated in FIG. 15A to FIG. 15C, FIG. 16A, and FIG. 16B be equal to each other. Such a circuit configuration might enable efficient layout. In addition, currents flowing through the transistor M3, the transistor M3*r*, the transistor M4, and the transistor M4*r* can possibly be equal to each other. Similarly, it is preferable that the sizes of the transistor M1 and the transistor M1*r* illustrated in FIG. 15A to FIG. 15C, FIG. 16A, and FIG. 16B be equal to each other. Similarly, it is preferable that the sizes of the transistor M2 and the transistor M2*r* illustrated in FIG. 15A to FIG. 15C, FIG. 16A, and FIG. 16B be equal to each other. Similarly, it is preferable that the sizes of the transistor M1*p* and the transistor M1*pr* illustrated in FIG. 17A be equal to each other. Similarly, it is preferable that the sizes of the transistor M3*p*, the transistor M3*pr*, the transistor M4*p*, and the transistor M4*pr* illustrated in FIG. 17A be equal to each other.

<<Operation Example>>

Next, operation examples of the circuit MP illustrated in FIG. 15A are described. Each of FIG. 18A to FIG. 18C, FIG. 19A to FIG. 19C, and FIG. 20A to FIG. 20C is a timing chart showing an operation example of the circuit MP, and shows changes in the potentials of the wiring WL, the wiring WX1L, the wiring X2L, the node n1, and the node n1*r*. Note that "high" shown in FIG. 18A to FIG. 18C, FIG. 19A to FIG. 19C, and FIG. 20A to FIG. 20C represents a high-level potential, and "low" represents a low-level potential. In this operation example, the amount of current output from the wiring OL to the node outa (or from the node outa to the wiring OL) is denoted by $I_{OL}$. In addition, the amount of current output from the wiring OLB to the node outb (or from the node outb to the wiring OLB) is denoted by IOLB. The timing charts in FIG. 18A to FIG. 18C, FIG. 19A to FIG. 19C, and FIG. 20A to FIG. 20C also show the amount of change in IOL and IOLB.

In this operation example, the constant voltage supplied by each of the wiring VE and the wiring VEr is VSS (a low-level potential). In this case, in FIG. 8A to FIG. 8D, a high-level potential is supplied to the wiring VSO and a current flows from the wiring VSO to the wiring VE or the wiring VEr through the switching circuit TW and the wiring OL. Similarly, a current flows from the wiring VSO to the wiring VE or the wiring VEr through the switching circuit TW and the wiring OLB.

In this operation example, a potential supplied from the wiring VCN in FIG. 8A is VSS. When electrical continuity is established between the wiring VCN and the second terminal of the transistor M1, VSS is supplied to the second terminal of the transistor M1. The potential of the gate of the transistor M1 also becomes VSS at this time, and accordingly the transistor M1 is turned off, which will be described in detail later. Similarly, the potentials of a second terminal and a gate of the transistor M1*r* become VSS when electrical continuity is established between the wiring VCN and the second terminal of the transistor M1*r*, and accordingly the transistor M1*r* is turned off.

In the circuit MP illustrated in FIG. 15A, the transistor M1 has a diode-connected configuration when the transistor M2 and the transistor M3 are in an on state. Thus, when a current flows from the wiring OL to the circuit MC, the potentials of the second terminal of the transistor M1 and the gate of the transistor M1 become almost equal to each other. The potentials are determined in accordance with the amount of current flowing from the wiring OL to the circuit MC, the potential (here, VSS) of the first terminal of the transistor M1, and the like. Here, when the potential of the gate of the transistor M1 is held in the capacitor C1 and then the transistor M2 is turned off, the transistor M1 functions as a current source that supplies a current corresponding to the potential of the gate of the transistor M1. Thus, the influence of variations in current characteristics of the transistor M1 can be reduced.

When a current amount of $I_1$ is supplied from the wiring OL to the wiring VE through the circuit MC while the transistor M2 and the transistor M3 are in an off state, the potential of the gate of the transistor M1 (the node n1) becomes $V_1$. Here, the transistor M2 is turned off, so that V1 is held in the circuit HC. Accordingly, the transistor M1 can make $I_1$, which is the current amount corresponding to the potential VSS of the first terminal of the transistor M1 and the potential V1 of the gate of the transistor M1, flow between a source and a drain of the transistor M1. In this specification and the like, such an operation is expressed as "the transistor M1 is set such that the current amount of $I_1$ is supplied between the source and the drain of the transistor M1", or "the transistor M1 is programmed such that the current amount of $I_1$ is supplied between the source and the drain of the transistor M1", for example.

In this operation example, the amount of current flowing from the wiring OL to the circuit MC has three levels of 0, $I_1$, and $I_2$. Accordingly, the amount of current set in the transistor M1 has the three levels of 0, $I_1$, and $I_2$. For example, when the potential of the gate of the transistor M1 held in the circuit HC is VSS, the potentials of the first terminal and the second terminal of the transistor M1 are each VSS, and thus the transistor M1 is turned off when the threshold voltage of the transistor M1 is higher than 0. In this case, a current does not flow between the source and the drain of the transistor M1, which can be said that the amount of current flowing between the source and the drain of the transistor M1 is set to 0. As another example, when the potential of the gate of the transistor M1 held in the circuit HC is $V_1$ and the threshold voltage of the transistor M1 is lower than $V_1$-VSS, the transistor M1 is turned on. Here, the amount of current flowing through the transistor M1 is $I_1$. Thus, when the potential of the gate of the transistor M1 is $V_1$, it can be said that the amount of current flowing between the source and the drain of the transistor M1 is set to $I_1$. As another example, when the potential of the gate of the transistor M1 held in the circuit HC is $V_2$ and the threshold voltage of the transistor M1 is lower than $V_2$-VSS, the transistor M1 is turned on. Here, the amount of current flowing through the transistor M1 is 12. Thus, when the potential of the gate of the transistor M1 is $V_2$, it can be said that the amount of current flowing between the source and the drain of the transistor M1 is set to $I_2$.

Note that the current amount $I_1$ is larger than 0 and smaller than $I_2$. The potential $V_1$ is higher than VSS and lower than $V_2$. The threshold voltage of the transistor M1 is higher than 0 and lower than $V_1$-VSS. Furthermore, $I_1$ can be replaced with $I_{ut}$ generated by the constant current source circuit ISC1 in the description of FIG. 8A, for example, and $I_2$ can be replaced with $2I_{ut}$ generated by the constant current source circuit ISC2 in the description of FIG. 8A, for example.

Before the description of the operation example, the first data (e.g., a weight coefficient here) held in the circuit MP is defined as follows. When VSS is held at the node n1 of the circuit HC and VSS is held at the node n1*r* of the circuit HCr, the circuit MP holds "0" as the first data (a weight coefficient). When $V_1$ is held at the node n1 of the circuit HC and VSS is held at the node n1*r* of the circuit HCr, the circuit MP holds "+1" as the first data (a weight coefficient). When $V_2$ is held at the node n1 of the circuit HC and VSS is held at the node n1*r* of the circuit HCr, the circuit MP holds "+2" as the first data (a weight coefficient). When VSS is held at the node n1 of the circuit HC and $V_1$ is held at the node n1*r* of the circuit HCr, the circuit MP holds "−1" as the first data (a weight coefficient). When VSS is held at the node n1 of the circuit HC and $V_2$ is held at the node n1*r* of the circuit HCr, the circuit MP holds "−2" as the first data (a weight coefficient).

In addition, the second data (e.g., a value of a signal of a neuron (an arithmetic value) here) input to the circuit MP is defined as follows, for example. When a high-level potential is applied to the wiring WX1L and a low-level potential is applied to the wiring X2L, "+1" is input to the circuit MP as the second data (a value of a signal of a neuron). When a low-level potential is applied to the wiring WX1L and a high-level potential is applied to the wiring X2L, "−1" is input to the circuit MP as the second data (a value of a signal of a neuron). When a low-level potential is applied to the wiring WX1L and a low-level potential is applied to the wiring X2L, "0" is input to the circuit MP as the second data (a value of a signal of a neuron). Note that the high-level potential is, for example, VDD or a potential higher than VDD by 10% or more or 20% or more.

In this specification and the like, unless otherwise specified, the transistor M1 and the transistor M1*r* in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. The transistor M1 and the transistor M1*r* may operate in a linear region so that the amplitude value of a voltage to be supplied is decreased. To reduce the amount of current flowing through the transistor M1 and the transistor M1*r*, the transistor M1 and the transistor M1*r* may operate in a subthreshold region. Alternatively, the transistor M1 and the transistor M1*r* may operate around the boundary between the saturation region and the subthreshold region. Note that in the case where the first data (a weight coefficient) is an analog value, for example, the transistor M1 and the transistor M1*r* may operate in the linear region, the saturation region, and the subthreshold region depending on the cases in accordance with the magnitude of the first data (weight coefficient). Alternatively, the transistor M1 and the transistor M1*r* may operate in both the linear region and the saturation region, may operate in both the subthreshold region and the linear region, or may operate in both the saturation region and the subthreshold region.

In this specification and the like, unless otherwise specified, the transistor M2, the transistor M2*r*, the transistor M3, the transistor M3*r*, the transistor M4, and the transistor M4*r* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M2, the transistor M2*r*, the transistor M3, the transistor M3*r*, the transistor M4, and the transistor M4*r* in an on state may operate in a saturation region or may operate in a subthreshold region. Alternatively, the transistor M2, the transistor M2*r*, the transistor M3, the transistor M3*r*, the transistor M4, and the transistor M4*r* may operate around the boundary between the saturation region and the subthreshold region. Alternatively, the transistor M2, the transistor M2*r*, the transistor M3, the transistor M3*r*, the transistor M4, and the transistor M4*r* may operate in both the linear region and the saturation region, may operate in both the saturation region and the subthreshold region, may operate in both the subthreshold region and the linear region, or may operate in the linear region, the saturation region, and the subthreshold region.

Hereinafter, operation examples of the circuit MP are described for each combination of values that the first data (e.g., a weight coefficient below) and the second data (e.g., a value of a signal of a neuron (an arithmetic value) below) can have.

[Condition 1]

Figure 18A:
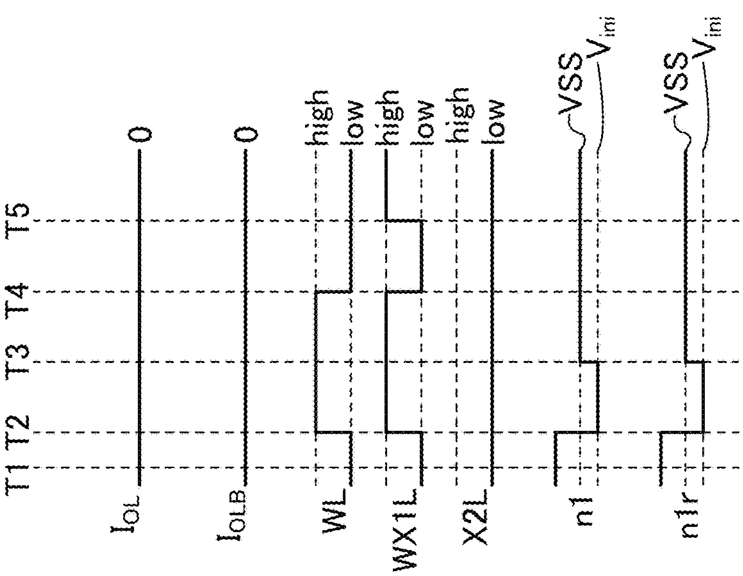
FIG. 18A to FIG. 18C are timing charts showing operation examples of a semiconductor device.

First, as an example, the case is considered where the first data (a weight coefficient) is "0" and the second data (a value of a signal of a neuron (an arithmetic value)) input to the circuit MP is "+1". FIG. 18A is a timing chart of the circuit MP in this case.

From Time T1 to Time T2, an initial potential is held in the circuit HC and the circuit HCr. In FIG. 18A, a potential higher than the potential VSS is held at the node n1 and the node n1*r* as the initial potential, for example.

In addition, a low-level potential is applied to the wiring WL, the wiring WX1L, and the wiring X2L. Accordingly, the low-level potential is input to the gates of the transistor M2, the transistor M2*r*, the transistor M3, the transistor M3*r*, the transistor M4, and the transistor M4*r*; thus, the transistor M2, the transistor M2*r*, the transistor M3, the transistor M3*r*, the transistor M4, and the transistor M4*r* are turned off.

From Time T2 to Time T3, a high-level potential is applied to the wiring WL and the wiring WX1L. Accordingly, the high-level potential is input to the gates of the transistor M2, the transistor M2*r*, the transistor M3, and the transistor M3*r*; thus, the transistor M2, the transistor M2*r*, the transistor M3, and the transistor M3*r* are turned on.

Although not shown in FIG. 18A, an initialization potential $V_{ini}$ is applied to the wiring OL and the wiring OLB. Since the transistor M2, the transistor M2*r*, the transistor M3, and the transistor M3*r* are in an on state, the potentials of the node n1 of the circuit HC and the node n1*r* of the circuit HCr each become $V_{ini}$. That is, from Time T2 to Time T3, the potentials of the node n1 of the circuit HC and the node n1*r* of the circuit HCr are initialized.

Note that the initialization potential $V_{ini}$ is preferably a ground potential, for example. Alternatively, the initialization potential $V_{ini}$ may be VSS, a potential higher than a ground potential, or a potential lower than a ground potential. In addition, the initialization potentials $V_{ini}$ supplied to the wiring OL and the wiring OLB may be potentials different from each other. Note that the initialization potential $V_{ini}$ is not necessarily input to the wiring OL and the wiring OLB. Note that the period from Time T2 to Time T3 is not necessarily provided. In addition, initialization is not necessarily performed from Time T2 to Time T3.

From Time T3 to Time T4, the potential VSS is input from the wiring OL to the circuit MC and the potential VSS is input from the wiring OLB to the circuit MCr. This is performed by turning on the switch SWL and the switch SWLB and turning off the switch SWI, the switch SWIB, the switch SWO, the switch SWOB, the switch SWH, and the switch SWHB in FIG. 8A. Hence, the potential of the node n1 of the circuit HC becomes VSS and the potential of the node n1*r* of the circuit HCr becomes VSS. Accordingly, the transistor M1 in the circuit MC is set such that the current amount of 0 is supplied, and thus a current does not flow from the wiring OL to the wiring VE through the circuit MC. In addition, the transistor M1*r* in the circuit MCr is set such that the current amount of 0 is supplied, and thus a current does not flow from the wiring OLB to the wiring VEr through the circuit MCr. In other words, from Time T3 to Time T4, the transistor M1 and the transistor M1*r* are in an off state; hence, electrical continuity is not established between the wiring OL and the wiring VE and electrical continuity is not established between the wiring OLB and the wiring VEr.

From Time T4 to Time T5, a low-level potential is applied to the wiring WL and the wiring WX1L. Accordingly, the low-level potential is input to the gates of the transistor M2, the transistor M2*r*, the transistor M3, and the transistor M3*r*; thus, the transistor M2, the transistor M2*r*, the transistor M3, and the transistor M3*r* are turned off. When the transistor M2 and the transistor M2*r* are turned off, the potential VSS of the node n1 of the circuit HC is held and the potential VSS of the node n1*r* of the circuit HCr is held. In addition, when the transistor M3 is turned off, a current does not flow from the wiring OL to the wiring VE through the circuit MC. Similarly, when the transistor M3*r* is turned off, a current does not flow from the wiring OLB to the wiring VEr through the circuit MCr.

By the operation from Time T1 to Time T5, "0" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8A may be turned off. Note that after the weight coefficient is set in the circuit MP (e.g., in a period between Time T4 and Time T5), the switch SWH and the switch SWHB may be turned on so that the potentials of the wiring OL and the wiring OLB may be precharged to the potential supplied from the wiring VCN2 (which can be a high-level potential, for example). After the potentials of the wiring OL and the wiring OLB are precharged to the high-level potential, the switch SWH and the switch SWHB may be turned off.

After Time T5, as "+1" that is a signal of a neuron (an arithmetic value) input to the circuit MP, a high-level potential and a low-level potential are input to the wiring WX1L and the wiring X2L, respectively. At this time, the high-level potential is input to the gates of the transistor M3 and the transistor M3*r*, and the low-level potential is input to the gates of the transistor M4 and the transistor M4*r*. Thus, the transistor M3 and the transistor M3*r* are turned on and the transistor M4 and the transistor M4*r* are turned off. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, in FIG. 8A, the switch SWO and the switch SWOB are turned on and the switch SWI, the switch SWIB, the switch SWL, the switch SWLB, the switch SWH, and the switch SWHB are turned off so that electrical continuity is established between the circuit AFP and each of the wiring OL and the wiring OLB. Since the transistor M1 is in an off state (is set such that the current amount of 0 is supplied), a current does not flow between the wiring VE and each of the wiring OL and the wiring OLB in the circuit MC. Similarly, since the transistor M1*r* is in an off state (is set such that the current amount of 0 is supplied), a current does not flow between the wiring VEr and each of the wiring OL and the wiring OLB in the circuit MCr. Accordingly, the current $I_{OL}$ output from the node outa of the wiring OL and the current $I_{OLB}$ output from the node outb of the wiring OLB do not change before and after Time T5. Consequently, the current $I_{OL}$ does not flow between the circuit AFP and the wiring OL, and the current $I_{OLB}$ does not flow between the circuit AFP and the wiring OLB.

Since the first data (a weight coefficient) is "0" and the second data (a value of a signal of a neuron (an arithmetic value)) input to the circuit MP is "+1" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where each of the current $I_{OL}$ and the current $I_{OLB}$ does not change after Time T5 in the operation of the circuit MP. The result that the product of the first data (a weight coefficient) and the second data (a value of a signal of a neuron) is "0" is output as the signal $z_j^{(k)}$ from the circuit AFP in FIG. 8A.

Note that processing of a plurality of product-sum operations can be performed in such a manner that only the second data (a value of a signal of a neuron, an arithmetic value, or the like) is changed while the first data (e.g., a weight coefficient) once input is not updated. In this case, the update of the first data (a weight coefficient) is unnecessary, so that power consumption can be reduced. For less frequent update of the first data (a weight coefficient), the first data (a weight coefficient) needs to be held for a long time. In this case, the use of an OS transistor with a low off-state current enables the first data (a weight coefficient) to be held for a long time, for example.

[Condition 2]

Figure 18B:
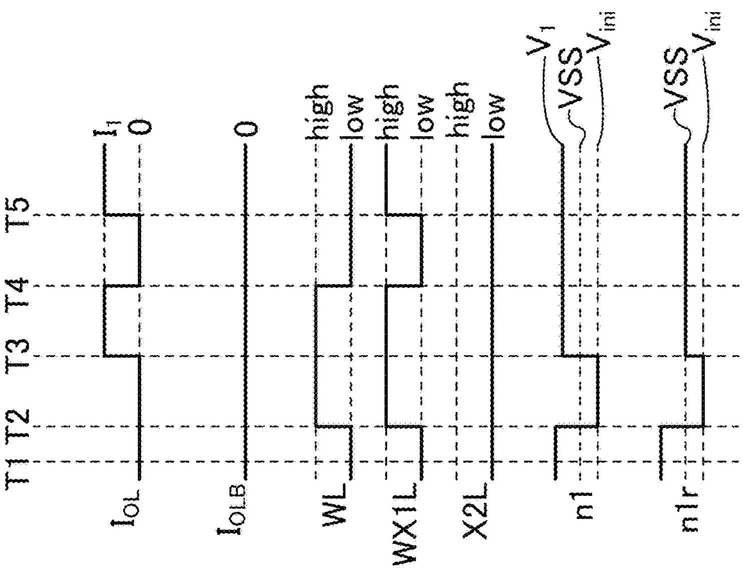

Next, as an example, the case is considered where the first data (a weight coefficient) is "+1" and the second data (a value of a signal of a neuron (an arithmetic value)) input to the circuit MP is "+1". FIG. 18B is a timing chart of the circuit MP in this case.

For operation from Time T1 to Time T3, which is similar to the operation from Time T1 to Time T3 in Condition 1, the description of the operation from Time T1 to Time T3 in Condition 1 is referred to.

From Time T3 to Time T4, the current amount of $I_1$ is input from the wiring OL to the circuit MC and the potential VSS is input from the wiring OLB to the circuit MCr. This is performed by turning on the switch SWI and the switch SWLB and turning off the switch SWIB, the switch SWO, the switch SWOB, the switch SWLB, the switch SWH, and the switch SWHB in FIG. 8A. Hence, the potential of the node n1 of the circuit HC becomes $V_1$ and the potential of the node n1*r* of the circuit HCr becomes VSS. Accordingly, the transistor M1 is set such that the current amount of $I_1$ is supplied in the circuit MC, and thus the current amount of $I_1$ is supplied from the wiring OL to the wiring VE through the circuit MC. In addition, the transistor Mir in the circuit MCr is set such that the current amount of 0 is supplied, and thus a current does not flow from the wiring OLB to the wiring VEr through the circuit MCr.

From Time T4 to Time T5, a low-level potential is applied to the wiring WL and the wiring WX1L. Accordingly, the low-level potential is input to the gates of the transistor M2, the transistor M2*r*, the transistor M3, and the transistor M3*r*; thus, the transistor M2, the transistor M2*r*, the transistor M3, and the transistor M3*r* are turned off. When the transistor M2 and the transistor M2*r* are turned off, the potential $V_1$ of the node n1 of the circuit HC is held and the potential VSS of the node n1*r* of the circuit HCr is held. In addition, when the transistor M3 is turned off, a current does not flow from the wiring OL to the wiring VE through the circuit MC. Similarly, when the transistor M3*r* is turned off, a current does not flow from the wiring OLB to the wiring VEr through the circuit MCr.

By the operation from Time T1 to Time T5, "+1" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8A may be turned off. Note that after the first data (weight coefficient) is set in the circuit MP, the switch SWH and the switch SWHB may be turned on so that the potentials of the wiring OL and the wiring OLB may be precharged to the potential supplied from the wiring VCN2 (which can be a high-level potential, for example). After the potentials of the wiring OL and the wiring OLB are precharged to the high-level potential, the switch SWH and the switch SWHB may be turned off.

After Time T5, as "+1" that is the second data (a signal of a neuron (an arithmetic value)) input to the circuit MP, a high-level potential and a low-level potential are input to the wiring WX1L and the wiring X2L, respectively. At this time, the high-level potential is input to the gates of the transistor M3 and the transistor M3*r*, and the low-level potential is input to the gates of the transistor M4 and the transistor M4*r*. Thus, the transistor M3 and the transistor M3*r* are turned on and the transistor M4 and the transistor M4*r* are turned off. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, in FIG. 8A, the switch SWO and the switch SWOB are turned on and the switch SWI, the switch SWIB, the switch SWL, the switch SWLB, the switch SWH, and the switch SWHB are turned off so that electrical continuity is established between the circuit AFP and each of the wiring OL and the wiring OLB. In the circuit MC, the transistor M3 is turned on and the transistor M1 is turned on (the transistor M1 is set such that the current amount $I_1$ is supplied and the potential of the wiring OL is input to the second terminal of the transistor M1); hence, a current flows between the wiring OL and the wiring VE. In addition, since the transistor M4 is in an off state in the circuit MC, a current does not flow between the wiring OLB and the wiring VE. Meanwhile, since the transistor M3*r* is in an on state and the transistor M1*r* is in an off state (is set such that the current amount of 0 is supplied) in the circuit MCr, a current does not flow between the wiring OLB and the wiring VEr. Furthermore, since the transistor M4*r* is in an off state in the circuit MCr, a current does not flow between the wiring OL and the wiring VEr. As described above, the current $I_{OL}$ output from the node outa of the wiring OL increases by $I_1$ after Time T5, and the current $I_{OLB}$ output from the node outb of the wiring OLB does not change before and after Time T5. Thus, the current $I_{OL}$ having the current amount of $I_1$ flows between the circuit AFP and the wiring OL, and the current $I_{OLB}$ does not flow between the circuit AFP and the wiring OLB.

Since the first data (a weight coefficient) is "+1" and the second data (a value of a signal of a neuron) input to the circuit MP is "+1" in this condition, the product of the first data (a weight coefficient) and the second data (a value of a signal of a neuron) obtained using Formula (1.1) is "+1". The result that the product of the first data (a weight coefficient) and the second data (a value of a signal of a neuron) is "+1" corresponds to the case where the current $I_{OL}$ increases by $I_1$ and the current $I_{OLB}$ does not change after Time T5 in the operation of the circuit MP. The result that the product of the first data (a weight coefficient) and the second data (a value of a signal of a neuron) is "+1" is output as the signal $z_j^{(k)}$ from the circuit AFP in FIG. 8A.

When the current flowing from the wiring OL to the circuit MC is set to not $I_1$ but 12 from Time T3 to Time T4 in this condition, $V_2$ can be held in the circuit HC, for example. Accordingly, "+2" is set as the first data (a weight coefficient) of the circuit MP. When the first data (a weight coefficient) is "+2" and the signal of a neuron input to the circuit MP is "+1", the product of the first data (a weight coefficient) and the second data (a value of the signal of a neuron) obtained using Formula (1.1) is "+2". The result that the product of the first data (a weight coefficient) and the second data (a value of the signal of a neuron) is "+2" corresponds to the case where the current $I_{OL}$ increases by $I_2$ and the current $I_{OLB}$ does not change after Time T5 in the operation of the circuit MP. By holding VSS in the circuit HCr of the circuit MCr and setting a current amount other than $I_1$ in the circuit MC in the above manner, a positive value other than "+1" can be set as the first data (a weight coefficient) of the circuit MP.

[Condition 3]

Figure 18C:
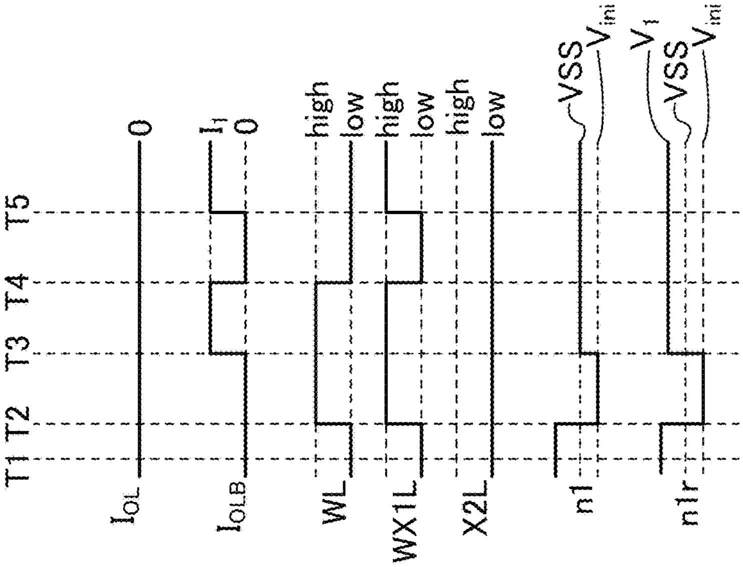

Next, as an example, the case is considered where the first data (a weight coefficient) is "−1" and the second data (a value of a signal of a neuron (an arithmetic value)) input to the circuit MP is "+1". FIG. 18C is a timing chart of the circuit MP in this case.

For operation from Time T1 to Time T3, which is similar to the operation from Time T1 to Time T3 in Condition 1, the description of the operation from Time T1 to Time T3 in Condition 1 is referred to.

From Time T3 to Time T4, the potential VSS is input from the wiring OL to the circuit MC and the current amount of $I_1$ is input from the wiring OLB to the circuit MCr. This is performed by turning on the switch SWIB and the switch SWL and turning off the switch SWI, the switch SWO, the switch SWOB, the switch SWLB, the switch SWH, and the switch SWHB in FIG. 8A. Hence, the potential of the node n1 of the circuit HC becomes VSS and the potential of the node n1*r* of the circuit HCr becomes $V_1$. Accordingly, the transistor M1 in the circuit MC is set such that current with the amount of 0 is supplied, and thus a current does not flow from the wiring OL to the wiring VE through the circuit MC. In addition, the transistor Mir in the circuit MCr is set such that the current amount of $I_1$ is supplied, and thus the current amount of $I_1$ is supplied from the wiring OLB to the wiring VEr through the circuit MCr.

From Time T4 to Time T5, a low-level potential is applied to the wiring WL and the wiring WX1L. Accordingly, the low-level potential is input to the gates of the transistor M2, the transistor M2*r*, the transistor M3, and the transistor M3*r*; thus, the transistor M2, the transistor M2*r*, the transistor M3, and the transistor M3*r* are turned off. When the transistor M2 and the transistor M2*r* are turned off, the potential VSS of the node n1 of the circuit HC is held and the potential $V_1$ of the node n1*r* of the circuit HCr is held. In addition, when the transistor M3 is turned off, a current does not flow from the wiring OL to the wiring VE through the circuit MC. Similarly, when the transistor M3*r* is turned off, a current does not flow from the wiring OLB to the wiring VEr through the circuit MCr.

By the operation from Time T1 to Time T5, "−1" is set as the first data (a weight coefficient) of the circuit MP. Moreover, after the first data (a weight coefficient) is set in the circuit MP, the switch SWI, the switch SWIB, the switch SWO, the switch SWOB, the switch SWL, and the switch SWLB in FIG. 8A may be turned off. Note that after the first data (weight coefficient) is set in the circuit MP, the switch SWH and the switch SWHB may be turned on so that the potentials of the wiring OL and the wiring OLB may be precharged to the potential supplied from the wiring VCN2 (which can be a high-level potential, for example). After the potentials of the wiring OL and the wiring OLB are precharged to the high-level potential, the switch SWH and the switch SWHB may be turned off.

After Time T5, as "+1" that is the second data (a signal of a neuron (an arithmetic value)) input to the circuit MP, a high-level potential and a low-level potential are input to the wiring WX1L and the wiring X2L, respectively. At this time, the high-level potential is input to the gates of the transistor M3 and the transistor M3*r*, and the low-level potential is input to the gates of the transistor M4 and the transistor M4*r*. Thus, the transistor M3 and the transistor M3*r* are turned on and the transistor M4 and the transistor M4*r* are turned off. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, in FIG. 8A, the switch SWO and the switch SWOB are turned on and the switch SWI, the switch SWIB, the switch SWL, the switch SWLB, the switch SWH, and the switch SWHB are turned off so that electrical continuity is established between the circuit AFP and each of the wiring OL and the wiring OLB. Since the transistor M3 is in an on state and the transistor M1 is in an off state (is set such that the current amount of 0 is supplied) in the circuit MC, a current does not flow between the wiring OL and the wiring VE. In addition, since the transistor M4 is in an off state in the circuit MC, a current does not flow between the wiring OLB and the wiring VE. Meanwhile, since the transistor M3*r* is turned on and the transistor M1*r* is turned on (the transistor M1*r* is set such that the current amount $I_1$ is supplied and the potential of the wiring OLB is input to the second terminal of the transistor M1*r*) in the circuit MCr, a current flows between the wiring OLB and the wiring VEr. Furthermore, since the transistor M4*r* is in an off state in the circuit MCr, a current does not flow between the wiring OL and the wiring VEr. As described above, the current $I_{OL}$ output from the node outa of the wiring OL does not change before and after Time T5, and the current $I_{OLB}$ output from the node outb of the wiring OLB increases by $I_1$ after Time T5. Thus, the current $I_{OL}$ does not flow between the circuit AFP and the wiring OL, and the current $I_{OLB}$ having the current amount of $I_1$ flows between the circuit AFP and the wiring OLB.

Since the first data (a weight coefficient) is "−1" and the second data (a value of a signal of a neuron (an arithmetic value)) input to the circuit MP is "+1" in this condition, the product of the first data (a weight coefficient) and the second data (a value of a signal of a neuron) obtained using Formula (1.1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ after Time T5 in the operation of the circuit MP. The result that the product of the first data (a weight coefficient) and the second data (a value of a signal of a neuron) is "−1" is output as the signal $z_j^{(k)}$ from the circuit AFP in FIG. 8A.

When the current flowing from the wiring OLB to the circuit MCr is set to not $I_1$ but $I_2$, for example, from Time T3 to Time T4 in this condition, $V_2$ can be held in the circuit HCr. Accordingly, "−2" is set as the first data (a weight coefficient) of the circuit MP. When the first data (a weight coefficient) is set to "−2" and the second data (a value of a signal of a neuron) input to the circuit MP is set to "+1", the product of the first data (a weight coefficient) and the second data (a value of a signal of a neuron) obtained using Formula (1.1) is "−2". The result that the product of the first data (a weight coefficient) and the second data (a value of a signal of a neuron) is "−2" corresponds to the case where the current $I_{OL}$ does not change and the current $I_{OLB}$ increases by $I_2$ after Time T5 in the operation of the circuit MP. By holding VSS in the circuit HC of the circuit MC and setting a current amount other than $I_1$ in the circuit MCr in the above manner, a negative value other than "−1" can be set as the weight coefficient of the circuit MP.

[Condition 4]

Figure 19A:
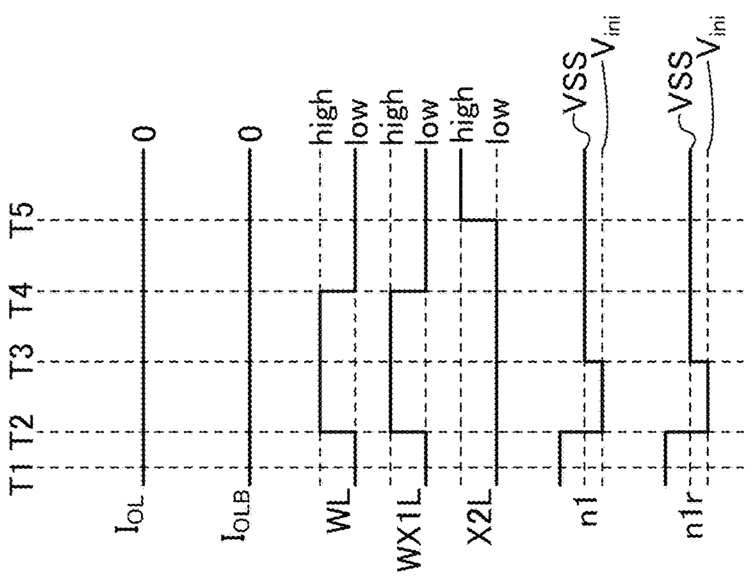
FIG. 19A to FIG. 19C are timing charts showing operation examples of a semiconductor device.

In this condition, as an example, the operation of the circuit MP in the case where the first data (a weight coefficient) is "0" and the second data (a value of a signal of a neuron (an arithmetic value)) input to the circuit MP is "−1" is considered. FIG. 19A is a timing chart of the circuit MP in this case.

For operation from Time T1 to Time T5, which is similar to the operation from Time T1 to Time T5 in Condition 1, the description of the operation from Time T1 to Time T5 in Condition 1 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3*r*, and the high-level potential is input to the gates of the transistor M4 and the transistor M4*r*. Accordingly, the transistor M3 and the transistor M3*r* are turned off and the transistor M4 and the transistor M4*r* are turned on. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

At this time, in FIG. 8A, the switch SWO and the switch SWOB are turned on and the switch SWI, the switch SWIB, the switch SWL, and the switch SWLB are turned off so that electrical continuity is established between the circuit AFP and each of the wiring OL and the wiring OLB. Since the transistor M1 is in an off state (is set such that the current amount of 0 is supplied), a current does not flow between the wiring VE and each of the wiring OL and the wiring OLB in the circuit MC. In other words, the current $I_{OL}$ output from the node outa of the wiring OL and the current $I_{OLB}$ output from the node outb of the wiring OLB do not change before and after Time T5. Similarly, since the transistor M1*r* is in an off state (is set such that the current amount of 0 is supplied), a current does not flow between the wiring VEr and each of the wiring OL and the wiring OLB in the circuit MCr. In other words, the current $I_{OL}$ output from the node outa of the wiring OL and the current $I_{OLB}$ output from the node outb of the wiring OLB do not change before and after Time T5. Consequently, the current $I_{OL}$ does not flow between the circuit AFP and the wiring OL, and the current $I_{OLB}$ does not flow between the circuit AFP and the wiring OLB.

Since the first data (a weight coefficient) is "0" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the result of the circuit operation in Condition 1. The result that the product of the first data (a weight coefficient) and the second data (a value of a signal of a neuron) is "0" is output as the signal $z_j^{(k)}$ from the circuit AFP in FIG. 8A, as in Condition 1.

[Condition 5]

Figure 19B:
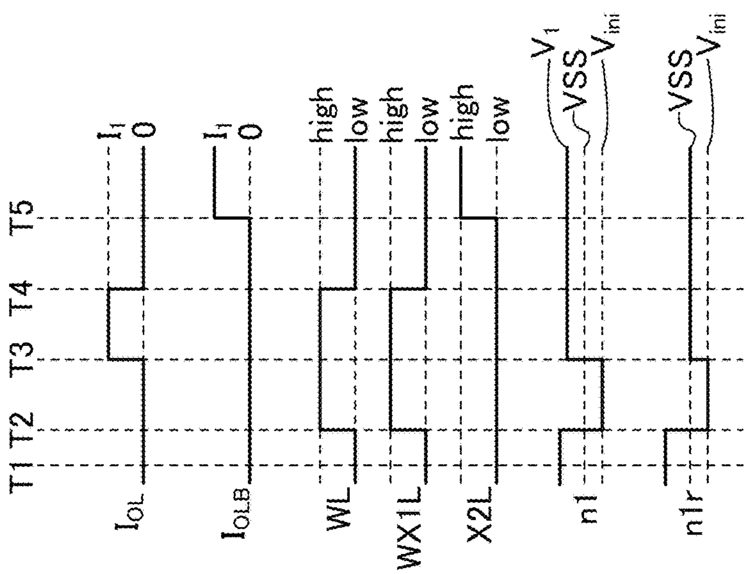

In this condition, as an example, the operation of the circuit MP in the case where the first data (a weight coefficient) is "+1" and the second data (a value of a signal of a neuron (an arithmetic value)) input to the circuit MP is "−1" is considered. FIG. 19B is a timing chart of the circuit MP in this case.

For operation from Time T1 to Time T5, which is similar to the operation from Time T1 to Time T5 in Condition 2, the description of the operation from Time T1 to Time T5 in Condition 2 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3*r*, and the high-level potential is input to the gates of the transistor M4 and the transistor M4*r*. Accordingly, the transistor M3 and the transistor M3*r* are turned off and the transistor M4 and the transistor M4*r* are turned on. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

At this time, in FIG. 8A, the switch SWO and the switch SWOB are turned on and the switch SWI, the switch SWIB, the switch SWL, the switch SWLB, the switch SWH, and the switch SWHB are turned off so that electrical continuity is established between the circuit AFP and each of the wiring OL and the wiring OLB. Since the transistor M3 is in an off state in the circuit MC, a current does not flow between the wiring OL and the wiring VE. In addition, since the transistor M4 is turned on and the transistor M1 is turned on (the transistor M1 is set such that the current amount $I_1$ is supplied and the potential of the wiring OL is input to the second terminal of the transistor M1) in the circuit MC, a current flows between the wiring OLB and the wiring VE. Meanwhile, since the transistor M3*r* is in an off state in the circuit MCr, a current does not flow between the wiring OLB and the wiring VEr. In addition, since the transistor M4*r* is in an on state and the transistor Mir is in an off state (is set such that the current amount of 0 is supplied) in the circuit MCr, a current does not flow between the wiring OL and the wiring VEr. As described above, the current $I_{OL}$ output from the node outa of the wiring OL does not change before and after Time T5, and the current $I_{OLB}$ output from the node outb of the wiring OLB increases by $I_1$ after Time T5. Thus, the current $I_{OL}$ does not flow between the circuit AFP and the wiring OL, and the current $I_{OLB}$ having the current amount of $I_1$ flows between the circuit AFP and the wiring OLB.

Since the first data (a weight coefficient) is "+1" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ after Time T5 in the operation of the circuit MP, which agrees with the result of the circuit operation in Condition 3. The result that the product of the first data (a weight coefficient) and the second data (a value of a signal of a neuron) is "−1" is output as the signal $z_j^{(k)}$ from the circuit AFP in FIG. 8A, as in Condition 3.

Note that as described in Condition 2, from Time T3 to Time T4 in this condition, the current flowing from the wiring OL to the circuit MC may be set to not $I_1$ but $I_2$ to hold $V_2$ in the circuit HC, for example. Accordingly, "+2" is set as the first data (a weight coefficient) of the circuit MP. When the first data (a weight coefficient) is "+2" and the signal of a neuron input to the circuit MP is "−1", the product of the first data (a weight coefficient) and the second data (a value of the signal of a neuron) obtained using Formula (1.1) is "−2". The result that the product of the first data (a weight coefficient) and the second data (a value of a signal of a neuron) is "−2" corresponds to the case where the current $I_{OL}$ does not change and the current $I_{OLB}$ increases by $I_2$ after Time T5 in the operation of the circuit MP. By holding VSS in the circuit HCr of the circuit MCr and setting a current amount other than $I_1$ in the circuit MC in the above manner, a positive value other than "+1" can be set as the weight coefficient of the circuit MP.

[Condition 6]

Figure 19C:
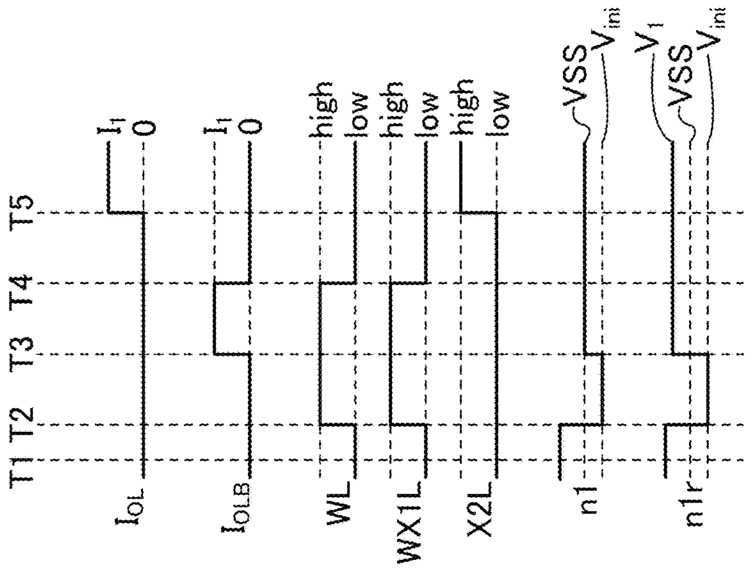

In this condition, as an example, the operation of the circuit MP in the case where the first data (a weight coefficient) is "−1" and the second data (a value of a signal of a neuron (an arithmetic value)) input to the circuit MP is "−1" is considered. FIG. 19C is a timing chart of the circuit MP in this case.

For operation from Time T1 to Time T5, which is similar to the operation from Time T1 to Time T5 in Condition 3, the description of the operation from Time T1 to Time T5 in Condition 3 is referred to.

After Time T5, as "−1" that is the second data (a signal of a neuron (an arithmetic value)) input to the circuit MP, a low-level potential and a high-level potential are input to the wiring WX1L and the wiring X2L, respectively. At this time, the low-level potential is input to the gates of the transistor M3 and the transistor M3*r*, and the high-level potential is input to the gates of the transistor M4 and the transistor M4*r*. Accordingly, the transistor M3 and the transistor M3*r* are turned off and the transistor M4 and the transistor M4*r* are turned on. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

At this time, in FIG. 8A, the switch SWO and the switch SWOB are turned on and the switch SWI, the switch SWIB, the switch SWL, the switch SWLB, the switch SWH, and the switch SWHB are turned off so that electrical continuity is established between the circuit AFP and each of the wiring OL and the wiring OLB. Since the transistor M3 is in an off state in the circuit MC, a current does not flow between the wiring OL and the wiring VE. In addition, since the transistor M4 is in an on state and the transistor M1 is in an off state (is set such that the current amount of 0 is supplied) in the circuit MC, a current does not flow between the wiring OLB and the wiring VE. Meanwhile, since the transistor M3*r* is in an off state in the circuit MCr, a current does not flow between the wiring OLB and the wiring VEr. In addition, since the transistor M4*r* is turned on and the transistor M1*r* is turned on (the transistor M1*r* is set such that the current amount $I_1$ is supplied and the potential of the wiring OLB is input to the second terminal of the transistor M1*r*) in the circuit MCr, a current flows between the wiring OL and the wiring VEr. As described above, the current $I_{OL}$ output from the node outa of the wiring OL increases by $I_1$ after Time T5, and the current $I_{OLB}$ output from the node outb of the wiring OLB does not change before and after Time T5. Thus, the current $I_{OL}$ having the current amount of $I_1$ flows between the circuit AFP and the wiring OL, and the current $I_{OLB}$ does not flow between the circuit AFP and the wiring OLB.

Since the first data (a weight coefficient) is "−1" and the second data (a value of a signal of a neuron (an arithmetic value)) input to the circuit MP is "−1" in this condition, the product of the first data (a weight coefficient) and the second data (a value of a signal of a neuron) obtained using Formula (1.1) is "+1". The result that the product of the first data (a weight coefficient) and the second data (a value of a signal of a neuron) is "+1" corresponds to the case where the current $I_{OL}$ changes and the current $I_{OLB}$ does not change after Time T5 in the operation of the circuit MP, which agrees with the result of the circuit operation in Condition 2. The result that the product of the first data (a weight coefficient) and the second data (a value of a signal of a neuron) is "+1" is output as the signal $z_j^{(k)}$ from the circuit AFP in FIG. 8A, as in Condition 2.

Note that as described in Condition 3, from Time T3 to Time T4 in this condition, the current flowing from the wiring OLB to the circuit MCr may be set to not $I_1$ but $I_2$ to hold $V_2$ in the circuit HCr, for example. Accordingly, "−2" is set as the first data (a weight coefficient) of the circuit MP. When the first data (a weight coefficient) is "−2" and the second data (a value of a signal of a neuron) input to the circuit MP is "−1", the product of the first data (a weight coefficient) and the second data (a value of a signal of a neuron) obtained using Formula (1.1) is "+2". The result that the product of the first data (a weight coefficient) and the second data (a value of a signal of a neuron) is "+2" corresponds to the case where the current $I_{OL}$ does not change and the current $I_{OLB}$ increases by $I_2$ after Time T5 in the operation of the circuit MP. By holding VSS in the circuit HC of the circuit MC and setting a current amount other than $I_1$ in the circuit MCr in the above manner, a negative value other than "−1" can be set as the weight coefficient of the circuit MP.

[Condition 7]

Figure 20A:
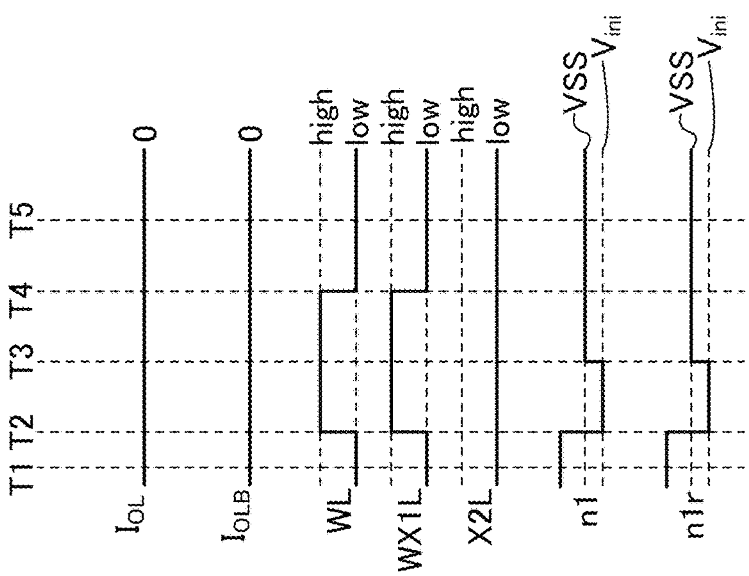
FIG. 20A to FIG. 20C are timing charts showing operation examples of a semiconductor device.

In this condition, as an example, the operation of the circuit MP is considered using Condition 7 where the first data (a weight coefficient) is "0" and the second data (a value of a signal of a neuron (an arithmetic value)) input to the circuit MP is "0". FIG. 20A is a timing chart of the circuit MP in this case.

For operation from Time T1 to Time T5, which is similar to the operation from Time T1 to Time T5 in Condition 1, the description of the operation from Time T1 to Time T5 in Condition 1 is referred to.

After Time T5, as "0" that is the second data (a signal of a neuron (an arithmetic value)) input to the circuit MP, a low-level potential is input to the wiring WX1L and a low-level potential is input to the wiring X2L. At this time, the low-level potentials are input to the gates of the transistor M3, the transistor M3*r*, the transistor M4, and the transistor M4*r*. Accordingly, the transistor M3, the transistor M3*r*, the transistor M4, and the transistor M4*r* are turned off. That is, by this operation, electrical continuity between the circuit MC and the wiring OL, between the circuit MCr and the wiring OLB, between the circuit MC and the wiring OLB, and between the circuit MCr and the wiring OL is broken.

Thus, in the circuit MC, a current does not flow between the wiring OL and one of the wiring VE and the wiring VEr regardless of the set amount of current flowing through the transistor M1. Similarly, in the circuit MCr, a current does not flow between the wiring OLB and the other of the wiring VE and the wiring VEr regardless of the set amount of current flowing through the transistor Mir. In other words, the current $I_{OL}$ output from the node outa of the wiring OL and the current $I_{OLB}$ output from the node outb of the wiring OLB do not change before and after Time T5.

In this case, even when electrical continuity is established between the circuit AFP and each of the wiring OL and the wiring OLB by turning on the switch SWO and the switch SWOB and turning off the switch SWI, the switch SWIB, the switch SWL, the switch SWLB, the switch SWH, and the switch SWHB in FIG. 8A, the current $I_{OL}$ does not flow between the circuit AFP and the wiring OL and the current $I_{OLB}$ does not flow between the circuit AFP and the wiring OLB, as described above.

Since the first data (a weight coefficient) is "0" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the results of the circuit operations in Condition 1 and Condition 4. The result that the product of the first data (a weight coefficient) and the second data (a value of a signal of a neuron) is "0" is output as the signal $z_j^{(k)}$ from the circuit AFP in FIG. 8A, as in Condition 1 and Condition 4.

[Condition 8]

Figure 20B:
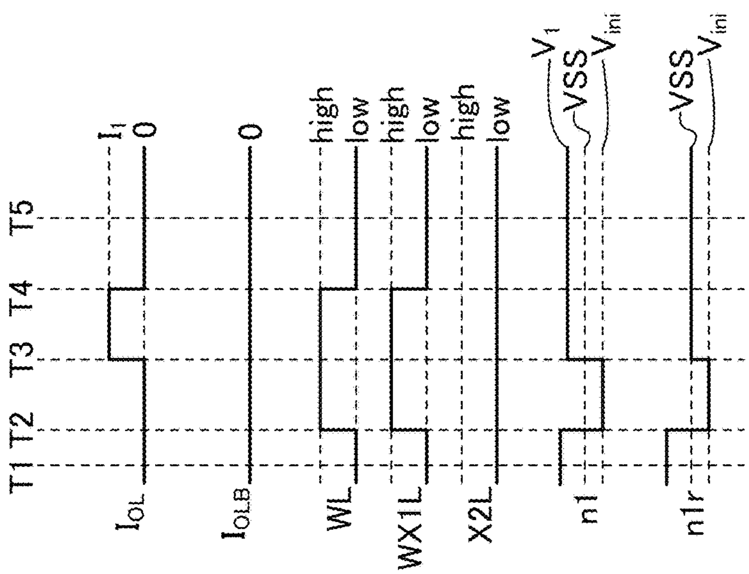

In this condition, as an example, the operation of the circuit MP is considered using Condition 8 where the first data (a weight coefficient) is "+1" and the second data (a value of a signal of a neuron (an arithmetic value)) input to the circuit MP is "0". FIG. 20B is a timing chart of the circuit MP in this case.

For operation from Time T1 to Time T5, which is similar to the operation from Time T1 to Time T5 in Condition 2, the description of the operation from Time T1 to Time T5 in Condition 2 is referred to.

After Time T5, as "0" that is the second data (a signal of a neuron (an arithmetic value)) input to the circuit MP, a low-level potential is input to the wiring WX1L and a low-level potential is input to the wiring X2L. At this time, the low-level potentials are input to the gates of the transistor M3, the transistor M3*r*, the transistor M4, and the transistor M4*r*. Accordingly, the transistor M3, the transistor M3*r*, the transistor M4, and the transistor M4*r* are turned off. That is, by this operation, electrical continuity between the circuit MC and the wiring OL, between the circuit MCr and the wiring OLB, between the circuit MC and the wiring OLB, and between the circuit MCr and the wiring OL is broken regardless of the set amount of current flowing through the transistor M1 and the transistor M1*r*, as in Condition 7. Consequently, a current does not flow between the wiring OL and one of the wiring VE and the wiring VEr and a current does not flow between the wiring OLB and the other of the wiring VE and the wiring VEr; thus, the current $I_{OL}$ output from the node outa of the wiring OL and the current $I_{OLB}$ output from the node outb of the wiring OLB do not change before and after Time T5.

In this case, even when electrical continuity is established between the circuit AFP and each of the wiring OL and the wiring OLB by turning on the switch SWO and the switch SWOB and turning off the switch SWI, the switch SWIB, the switch SWL, and the switch SWLB in FIG. 8A, the current $I_{OL}$ does not flow between the circuit AFP and the wiring OL and the current $I_{OLB}$ does not flow between the circuit AFP and the wiring OLB, as described above.

Since the first data (a weight coefficient) is "+1" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the results of the circuit operations in Condition 1, Condition 4, and Condition 7. The result that the product of the first data (a weight coefficient) and the second data (a value of a signal of a neuron) is "0" is output as the signal $z_j^{(k)}$ from the circuit AFP in FIG. 8A, as in Condition 1, Condition 4, and Condition 7.

[Condition 9]

Figure 20C:
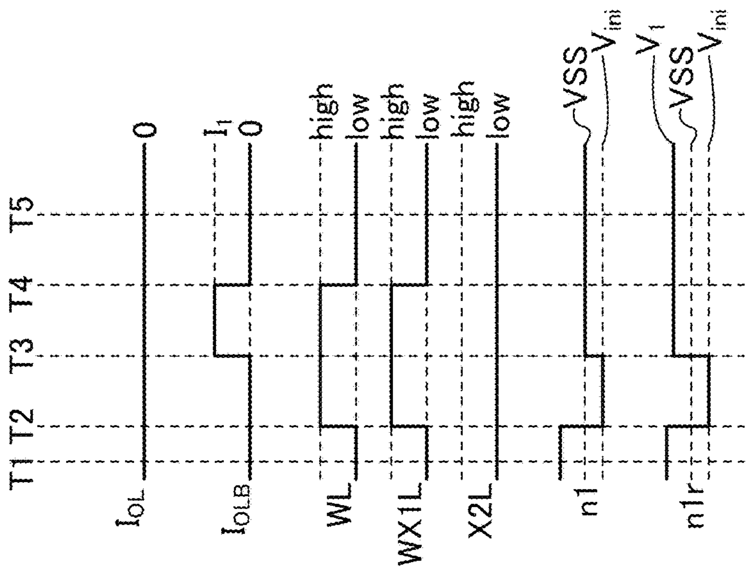

In this condition, as an example, the operation of the circuit MP is considered using Condition 9 where the first data (a weight coefficient) is "−1" and the second data (a value of a signal of a neuron (an arithmetic value)) input to the circuit MP is "0". FIG. 20C is a timing chart of the circuit MP in this case.

For operation from Time T1 to Time T5, which is similar to the operation from Time T1 to Time T5 in Condition 3, the description of the operation from Time T1 to Time T5 in Condition 3 is referred to.

After Time T5, as "0" that is the second data (a signal of a neuron (an arithmetic value)) input to the circuit MP, a low-level potential is input to the wiring WX1L and a low-level potential is input to the wiring X2L. At this time, the low-level potentials are input to the gates of the transistor M3, the transistor M3*r*, the transistor M4, and the transistor M4*r*. Accordingly, the transistor M3, the transistor M3*r*, the transistor M4, and the transistor M4*r* are turned off. That is, by this operation, electrical continuity between the circuit MC and the wiring OL, between the circuit MCr and the wiring OLB, between the circuit MC and the wiring OLB, and between the circuit MCr and the wiring OL is broken regardless of the set amount of current flowing through the transistor M1 and the transistor Mir, as in Condition 7. In this case, a current does not flow between the wiring OL and one of the wiring VE and the wiring VEr and a current does not flow between the wiring OLB and the other of the wiring VE and the wiring VEr; thus, the current $I_{OL}$ output from the node outa of the wiring OL and the current $I_{OLB}$ output from the node outb of the wiring OLB do not change before and after Time T5.

In this case, even when electrical continuity is established between the circuit AFP and each of the wiring OL and the wiring OLB by turning on the switch SWO and the switch SWOB and turning off the switch SWI, the switch SWIB, the switch SWL, the switch SWLB, the switch SWH, and the switch SWHB in FIG. 8A, the current $I_{OL}$ does not flow between the circuit AFP and the wiring OL and the current $I_{OLB}$ does not flow between the circuit AFP and the wiring OLB, as described above.

Since the first data (a weight coefficient) is "−1" and the second data (a value of a signal of a neuron (an arithmetic value)) input to the circuit MP is "0" in this condition, the product of the first data (a weight coefficient) and the second data (a value of a signal of a neuron) obtained using Formula (1.1) is "0". The result that the product of the first data (a weight coefficient) and the second data (a value of a signal of a neuron) is "0" corresponds to the case where the current $I_{OL}$ and the current $I_{OLB}$ do not change after Time T5 in the operation of the circuit MP, which agrees with the results of the circuit operations in Condition 1, Condition 4, Condition 7, and Condition 8. The result that the product of the first data (a weight coefficient) and the second data (a value of a signal of a neuron) is "0" is output as the signal $z_j^{(k)}$ from the circuit AFP in FIG. 8A, as in Condition 1, Condition 4, Condition 7, and Condition 8.

The results of the operation examples under Condition 1 to Condition 9 described above are listed in the following table. Note that in the following table, a high-level potential is denoted by high and a low-level potential is denoted by low.

neuron) having only two levels "+1" and "−1" is performed, the circuit MP can perform operation similar to that of an exclusive NOR circuit (coincidence circuit).

In the operation of the circuit MP, when calculation using the first data (a weight coefficient) having only two levels "+1" and "0" and the second data (a value of a signal of a neuron) having only two levels "+1" and "0" is performed, the circuit MP can perform operation similar to that of a logical product circuit.

In this operation example, a potential held in the circuit HC and the circuit HCr included in the circuit MC and the circuit MCr of the circuit MP represents a multilevel value of VSS, $V_1$, or $V_2$, for example; however, a potential representing a binary value or an analog value may be held in the circuit HC and the circuit HCr. For example, in the case where the first data (a weight coefficient) is a "positive analog value", a high-level analog potential is held at the node n1 of the circuit HC and a low-level potential is held at the node n1*r* of the circuit HCr. In the case where the first data (a weight coefficient) is a "negative analog value", a low-level potential is held at the node n1 of the circuit HC and a high-level analog potential is held at the node n1*r* of the circuit HCr, for example. The amount of the current $I_{OL}$ and the current $I_{OLB}$ becomes an amount corresponding to the analog potential. A potential representing an analog value may also be held in the circuit HC and the circuit HCr in other circuits MP described in this specification and the like without limitation to the operation example of the circuit MP in FIG. 15A.

Note that this configuration example can be combined with any of the other configuration examples and the like described in this specification as appropriate.

TABLE 2

| Condition | Weight coefficient | n1 | n1r | Signal | X1L | X2L | Weight coeffi- cient × Signal | Change amount of $I_{OL}$ | Change amount of $I_{OLB}$ |
|---|---|---|---|---|---|---|---|---|---|
| Condition 1 | 0 | VSS | VSS | +1 | high | low | 0 | 0 | 0 |
| Condition 2 | +1 | $V_1$ | VSS | +1 | high | low | +1 | $I_1$ | 0 |
| Condition 3 | −1 | VSS | $V_1$ | +1 | high | low | −1 | 0 | $I_1$ |
| Condition 4 | 0 | VSS | VSS | −1 | low | high | 0 | 0 | 0 |
| Condition 5 | +1 | $V_1$ | VSS | −1 | low | high | −1 | 0 | $I_1$ |
| Condition 6 | −1 | VSS | $V_1$ | −1 | low | high | +1 | $I_1$ | 0 |
| Condition 7 | 0 | VSS | VSS | 0 | low | low | 0 | 0 | 0 |
| Condition 8 | +1 | $V_1$ | VSS | 0 | low | low | 0 | 0 | 0 |
| Condition 9 | −1 | VSS | $V_1$ | 0 | low | low | 0 | 0 | 0 |

Here, the case where one circuit MC and one circuit MCr are connected to the wiring OL and the wiring OLB is shown as an example. In the case where a plurality of circuits MC and a plurality of circuits MCr are connected to the wiring OL and the wiring OLB as illustrated in FIG. 2, FIG. 3, FIG. 4, FIG. 7, FIG. 11, FIG. 12, FIG. 14, and the like, currents output from the circuits MC and the circuits MCr are added in accordance with Kirchhoff s current law. Consequently, sum operation is performed. In other words, the product operation is performed in the circuits MC and the circuits MCr, and the sum operation is performed by adding the currents from the plurality of circuits MC and the plurality of circuits MCr. As a result of the above, product-sum operation processing is performed.

In the operation of the circuit MP, when calculation using the first data (a weight coefficient) having only two levels "+1" and "−1" and the second data (a value of a signal of a

Configuration Example 2

Next, examples of a circuit configuration that can be applied to the circuit MP illustrated in FIG. 9B and is different from the circuit configurations of FIG. 15A to FIG. 15C, FIG. 16A, and FIG. 16B are described.

Figure 21A:
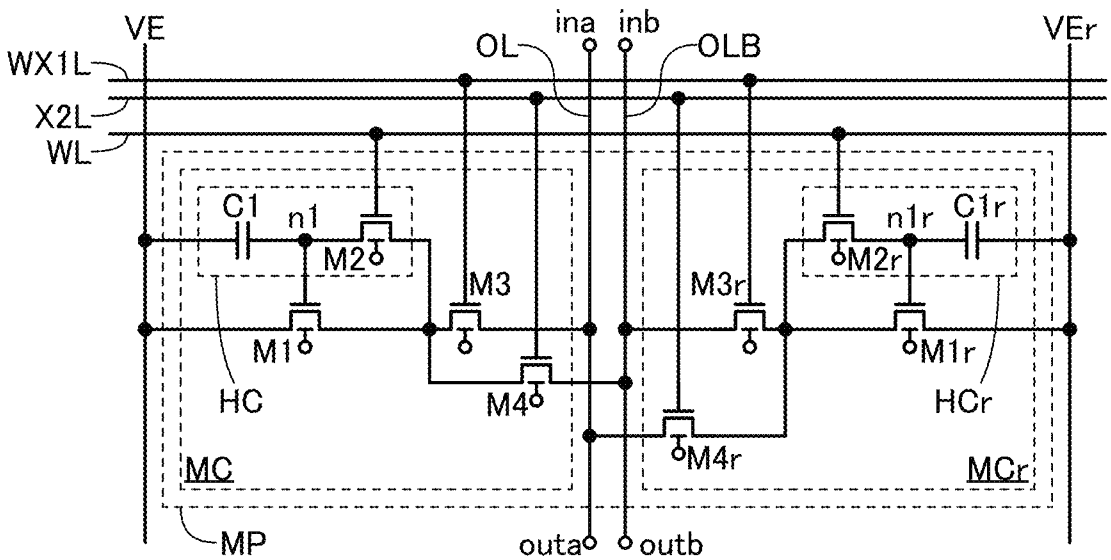
FIG. 21A and FIG. 21B are circuit diagrams each illustrating a configuration example of a circuit included in a semiconductor device.

The circuit MP illustrated in FIG. 21A shows a configuration example of the circuit MP in FIG. 9B, and is different from the circuit MP in FIG. 15A in that the second terminal of the transistor M2 is electrically connected to not the wiring OL but the second terminal of the transistor M1, the first terminal of the transistor M3, and the first terminal of the transistor M4, and that the second terminal of the transistor M2*r* is electrically connected to not the wiring OLB but the second terminal of the transistor M1*r*, a first terminal of the transistor M3*r*, and a first terminal of the transistor M4*r*.

The circuit MP in FIG. 21A can operate in a manner similar to that of the circuit MP in FIG. 15A.

Another example of a circuit configuration that can be applied to the circuit MP illustrated in FIG. 9B and is different from that in FIG. 21A is described. The circuit MP illustrated in FIG. 21B shows a configuration example of the circuit MP in FIG. 9B, and is different from the circuit MP in FIG. 15A in that a transistor M1*c* is included in the circuit MC and the first terminal of the transistor M4 is electrically connected to not the second terminal of the transistor M1 and the second terminal of the transistor M3 but the transistor M1*c*, and that a transistor M1*cr* is included in the circuit MCr and the first terminal of the transistor M4*r* is electrically connected to not the second terminal of the transistor M1*r* and the second terminal of the transistor M3*r* but the transistor M1*cr*.

Note that in this specification and the like, unless otherwise specified, the transistor M1*c* and the transistor M1*cr* in an on state may operate in a saturation region in the end. In other words, the gate voltage, the source voltage, and the drain voltage of each of the above transistors may be appropriately biased to voltages in the range where the transistor operates in the linear region. However, one embodiment of the present invention is not limited thereto. The transistor M1*c* and the transistor M1*cr* may operate in a linear region so that the amplitude value of a voltage to be supplied is decreased. To reduce the amount of current flowing through the transistor M1*c* and the transistor M1*cr*, the transistor M1*c* and the transistor M1*cr* may operate in a subthreshold region. Alternatively, they may operate around the boundary between the saturation region and the subthreshold region. Note that in the case where the first data (e.g., a weight coefficient here) is an analog value, for example, the transistor M1*c* and the transistor M1*cr* may operate in the linear region, the saturation region, and the subthreshold region depending on the cases in accordance with the magnitude of the first data (weight coefficient). Alternatively, the transistor M1*c* and the transistor M1*cr* may operate in both the linear region and the saturation region, may operate in both the subthreshold region and the linear region, or may operate in both the saturation region and the subthreshold region.

Figure 21B:
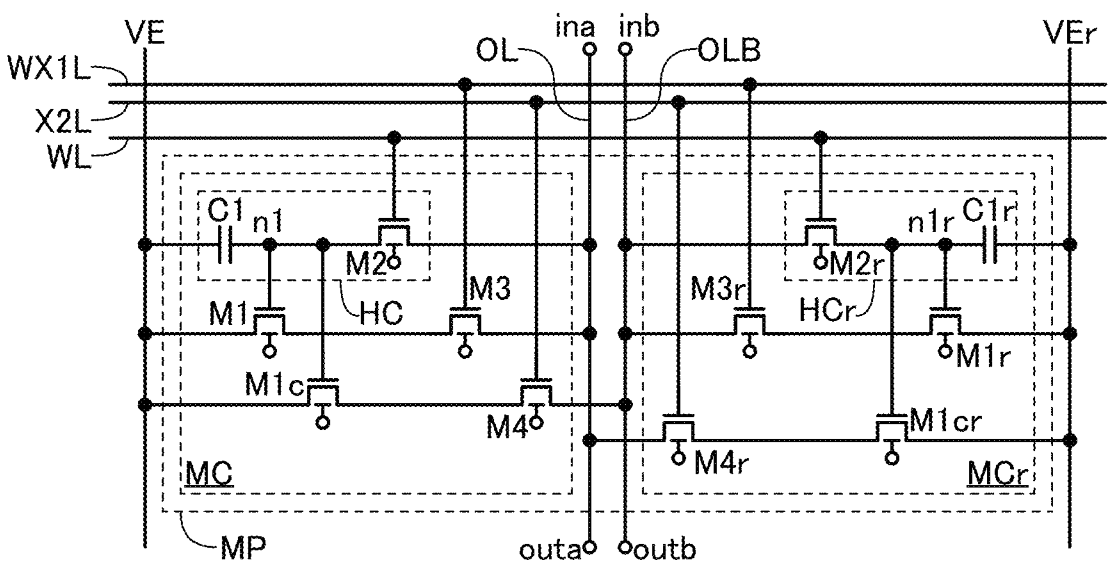

In the circuit MP in FIG. 21B, a first terminal of the transistor M1*c* is electrically connected to the wiring VE. A gate of the transistor M1*c* is electrically connected to the gate of the transistor M1, the first terminal of the transistor M2, and the first terminal of the capacitor C1. A second terminal of the transistor M1*c* is electrically connected to the first terminal of the transistor M4.

Note that in the circuit MP in FIG. 21B, the circuit MCr has substantially the same circuit configuration as the circuit MC. Thus, "r" is added to the reference numerals of the circuit elements and the like included in the circuit MCr to differentiate them from the circuit elements and the like included in the circuit MC.

The description of a portion of the circuit MP in FIG. 21B having a connection configuration similar to that of the circuit MP in FIG. 15A is omitted.

In the circuit MP in FIG. 21B, currents flowing through the transistor M3 and the transistor M4 are determined in accordance with the potentials of the gates of the transistor M1 and the transistor M1*c*. The sizes, e.g., the channel lengths and the channel widths, of the transistor M1 and the transistor M1*c* are preferably equal to each other, for example. Such a circuit configuration might enable efficient layout. In addition, there is a possibility that currents flowing through the transistor M3 and the transistor M4 can be equal to each other.

The circuit MP in FIG. 21B can operate in a manner similar to that of the circuit MP in FIG. 15A.

Note that this configuration example can be combined with any of the other configuration examples and the like described in this specification as appropriate.

Configuration Example 3

Next, examples of a circuit configuration that can be applied to the circuit MP illustrated in FIG. 9E are described.

Figure 22A:
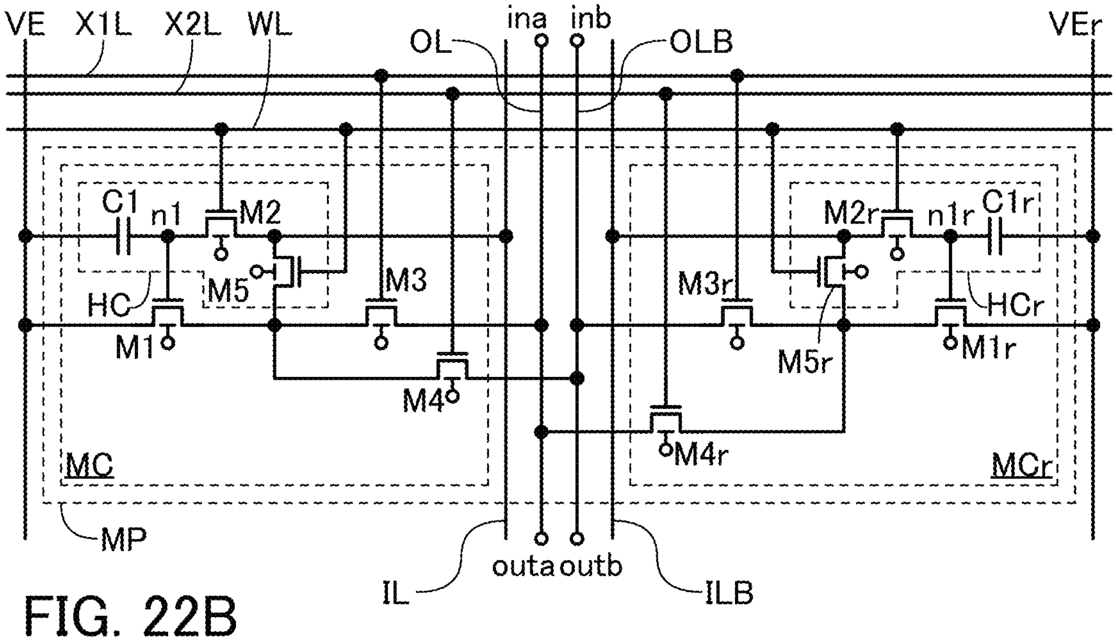
FIG. 22A and FIG. 22B are circuit diagrams each illustrating a configuration example of a circuit included in a semiconductor device.

The circuit MP illustrated in FIG. 22A shows a configuration example of the circuit MP in FIG. 9E, and is different from the circuit MP in FIG. 15A in that a transistor M5 is included in the circuit MC and a transistor M5*r* is included in the circuit MCr, and that the circuit MP is electrically connected to the wiring IL and the wiring ILB.

Note that in this specification and the like, unless otherwise specified, the transistor M5 and the transistor M5*r* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. The transistor M5 and the transistor M5*r* may operate in a saturation region or may operate in a subthreshold region. Alternatively, they may operate around the boundary between the saturation region and the subthreshold region. Alternatively, for example, the transistor M5 and the transistor M5*r* may operate in the linear region, the saturation region, and the subthreshold region depending on the cases. Alternatively, the transistor M5 and the transistor M5*r* may operate in both the linear region and the saturation region, may operate in both the saturation region and the subthreshold region, or may operate in both the subthreshold region and the linear region.

In the circuit MP in FIG. 22A, a first terminal of the transistor M5 is electrically connected to the second terminal of the transistor M2 and the wiring IL. A second terminal of the transistor M5 is electrically connected to the second terminal of the transistor M1, the first terminal of the transistor M3, and the first terminal of the transistor M4. A gate of the transistor M5 is electrically connected to the wiring WL.

Note that in the circuit MP in FIG. 22A, the circuit MCr has substantially the same circuit configuration as the circuit MC. Thus, "r" is added to the reference numerals of the circuit elements and the like included in the circuit MCr to differentiate them from the circuit elements and the like included in the circuit MC.

The description of a portion of the circuit MP in FIG. 22A having a connection configuration similar to that of the circuit MP in FIG. 15A is omitted.

In the circuit MP in FIG. 22A, as in Configuration example 1 and Configuration example 2, the sizes, e.g., the channel lengths and the channel widths, of the transistor M1, the transistor M2, the transistor M3, and the transistor M4 are preferably equal to the sizes of the transistor M1*r*, the transistor M2*r*, the transistor M3*r*, and the transistor M4*r*. Such a circuit configuration might enable efficient layout. In addition, the size of the transistor M5 is preferably equal to the size of the transistor M5*r*.

A current is set in the circuit MC and the circuit MCr by supplying a high-level potential to the wiring WL so that the transistor M2, the transistor M2*r*, the transistor M5, and the transistor M5*r* are turned on. After the current is set in the circuit MC and the circuit MCr, in order to hold the set potential in the circuit HC and the circuit HCr, a low-level potential is supplied to the wiring WL so that the transistor M2, the transistor M2*r*, the transistor M5, and the transistor M5*r* are turned off.

In the circuit MP described in Configuration example 1 and Configuration example 2, a wiring for transmitting the second data (e.g., a value of a signal of a neuron here) and a wiring for supplying or holding information (e.g., a voltage or a current) corresponding to the first data (e.g., a weight coefficient here) to or in the circuit MP are combined into the wiring WX1L; however, when the circuit MP employs the configuration in FIG. 22A, the wiring for transmitting the second data (a value of a signal of a neuron) can be the wiring X1L and the wiring for supplying or holding information (e.g., a voltage or a current) corresponding to the first data (a weight coefficient) to or in the circuit MP can be the wiring WL. That is, it can be said that the circuit MP in FIG. 22A has a configuration in which the wiring WX1L of the circuit MP in Configuration example 1 and Configuration example 2 is divided according to the functions.

Figure 22B:
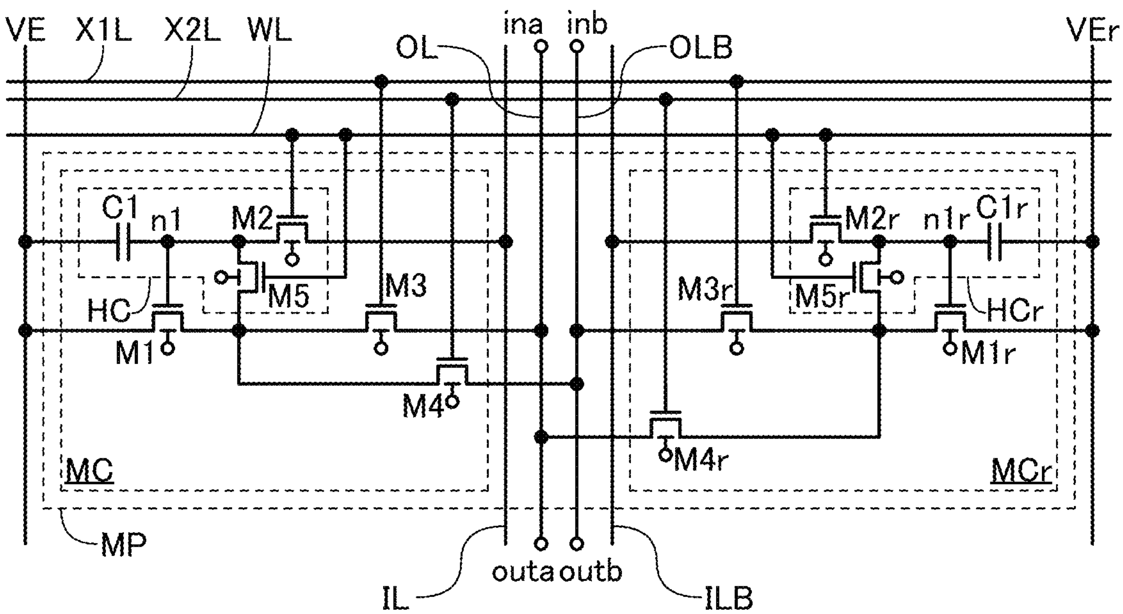

FIG. 22B shows a circuit configuration different from that of the circuit MP in FIG. 22A.

The circuit MP illustrated in FIG. 22B has a configuration in which the electrical connections of the first terminals of the transistor M5 and transistor M5*r* are changed from those of the circuit MP in FIG. 22A. Specifically, in the circuit MP in FIG. 22B, the first terminal of the transistor M5 is electrically connected to the first terminal of the transistor M2, the gate of the transistor M1, and the first terminal of the capacitor C1.

With the configuration illustrated in FIG. 22B, the circuit MP operates in substantially the same manner as the circuit MP in FIG. 22A.

Figure 23A:
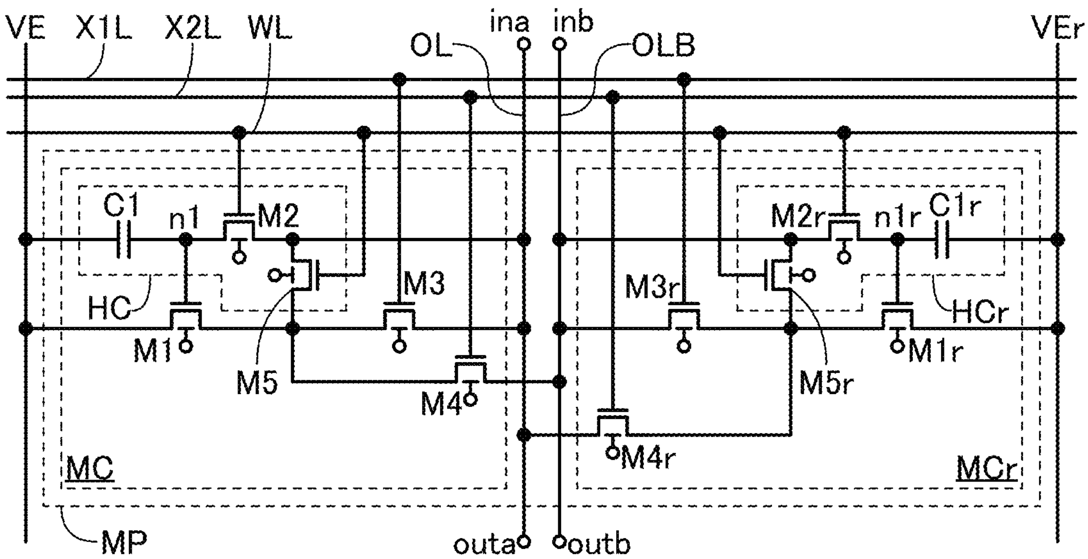
FIG. 23A and FIG. 23B are circuit diagrams each illustrating a configuration example of a circuit included in a semiconductor device.
Figure 23B:
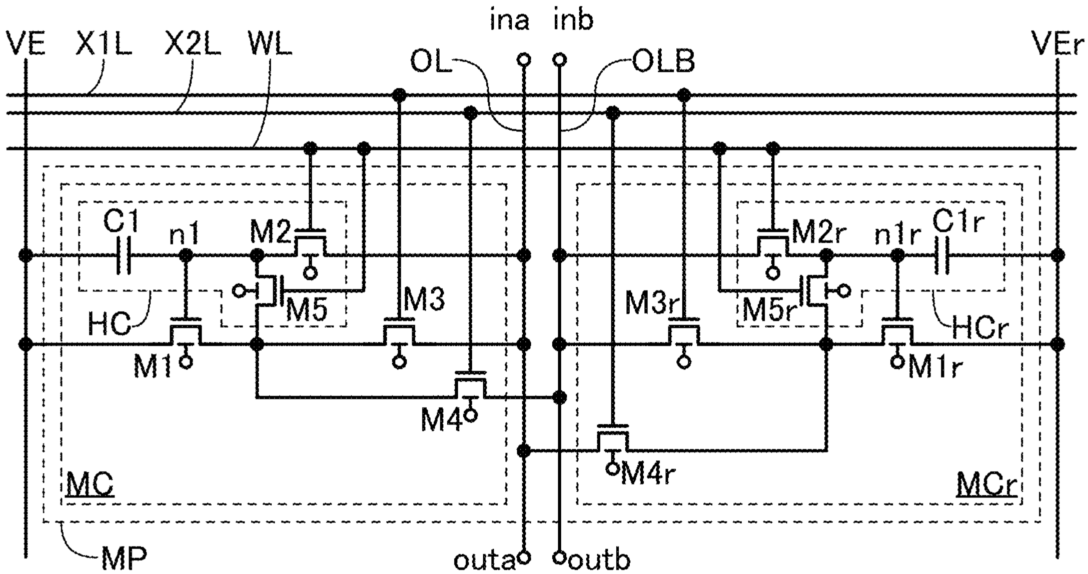

Note that the circuits MP illustrated in FIG. 22A and FIG. 22B may each have a configuration in which the wiring IL is combined into the wiring OL and the wiring ILB is combined into the wiring OLB. For example, by combining the wiring IL into the wiring OL and combining the wiring ILB into the wiring OLB in the circuit MP illustrated in FIG. 22A, the circuit MP having the configuration shown in FIG. 23A can be obtained. As another example, by combining the wiring IL into the wiring OL and combining the wiring ILB into the wiring OLB in the circuit MP illustrated in FIG. 22B, the circuit MP having the configuration shown in FIG. 23B can be obtained. Note that the circuits MP in FIG. 23A and FIG. 23B each have a circuit configuration that can be applied to the circuit MP illustrated in FIG. 9A, and the description of the operation of the circuit MP in FIG. 15A is referred to for the operations of the circuits MP in FIG. 23A and FIG. 23B.

Note that this configuration example can be combined with any of the other configuration examples and the like described in this specification as appropriate.

Configuration Example 4

Figure 24:
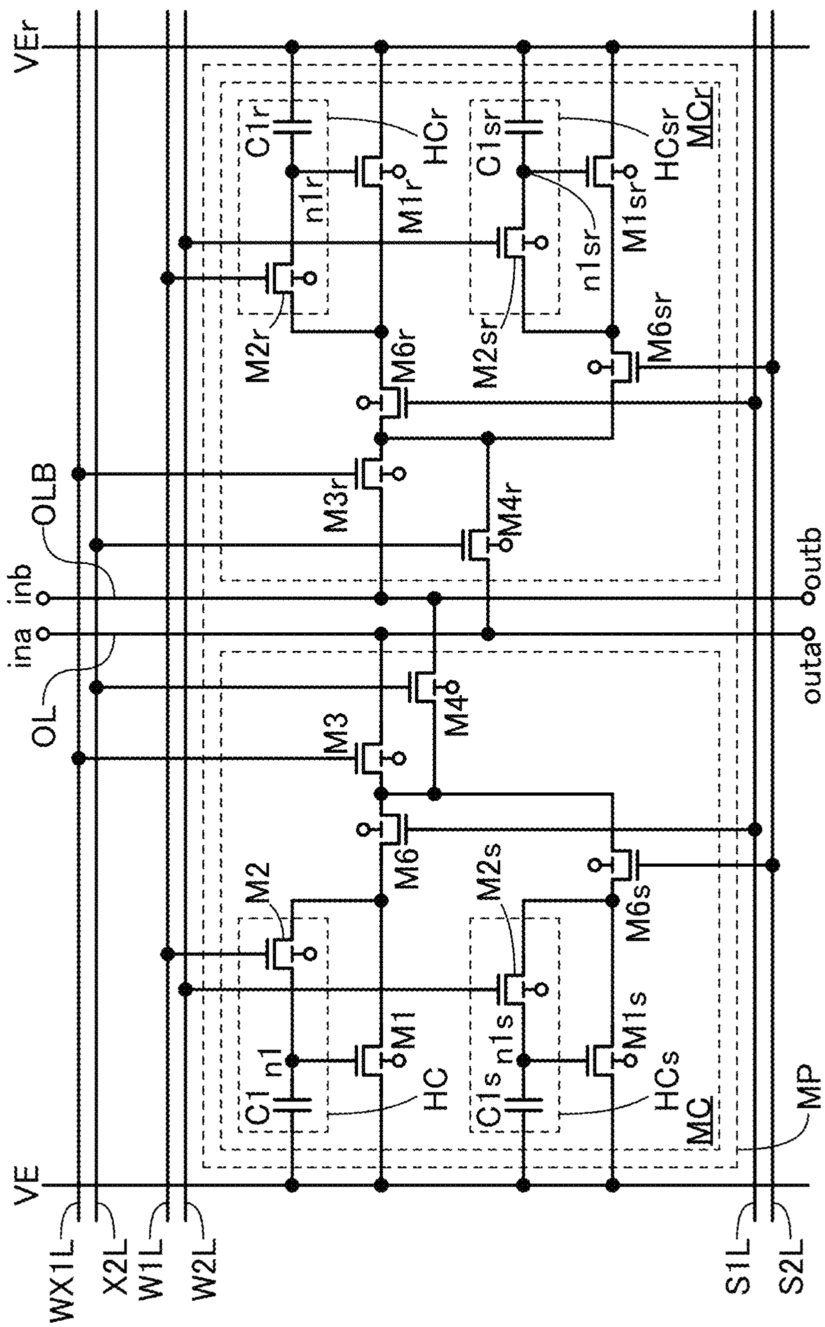
FIG. 24 is a circuit diagram illustrating a configuration example of a circuit included in a semiconductor device.

The circuit MP illustrated in FIG. 24 is an example of a circuit including a circuit HCs and a circuit HCsr in addition to the circuit HC and the circuit HCr, unlike the circuit MP in FIG. 15A.

The circuit MC included in the circuit MP in FIG. 24 includes a transistor M1*s*, a transistor M2*s*, a transistor M6, a transistor M6*s*, and a capacitor C1*s* in addition to the circuit elements included in the circuit MP in FIG. 21A. The circuit MCr included in the circuit MP in FIG. 24 includes circuit elements similar to those of the circuit MC, and thus includes a transistor M1*sr*, a transistor M2*sr*, a transistor M6*r*, a transistor M6*sr*, and a capacitor C1*sr* corresponding to the transistor M1*s*, the transistor M2*s*, the transistor M6, the transistor M6*s*, and the capacitor C1*s* of the circuit MC, respectively. Note that the transistor M2*s* and the capacitor C1*s* are included in the circuit HCs and the transistor M2*sr* and the capacitor C1*sr* are included in the circuit HCsr.

Note that in this specification and the like, unless otherwise specified, the transistor M1*s* and the transistor M1*sr* in an on state may operate in a saturation region in the end, like the transistor M1 and the transistor Mir. In other words, the gate voltage, the source voltage, and the drain voltage of each of the above transistors may be appropriately biased to voltages in the range where the transistor operates in a saturation region. However, one embodiment of the present invention is not limited thereto. The transistor M1*s* and the transistor M1*sr* may operate in a linear region so that the amplitude value of a voltage to be supplied is decreased. To reduce the amount of current flowing through the transistor M1*s* and the transistor M1*sr*, the transistor M1*s* and the transistor M1*sr* may operate in a subthreshold region. Alternatively, they may operate around the boundary between the saturation region and the subthreshold region. Note that in the case where the first data (a weight coefficient) is an analog value, for example, the transistor M1*s* and the transistor M1*sr* may operate in the linear region, the saturation region, and the subthreshold region depending on the cases in accordance with the magnitude of the first data (weight coefficient). Alternatively, the transistor M1*s* and the transistor M1*sr* may operate in both the linear region and the saturation region, may operate in both the subthreshold region and the linear region, or may operate in both the saturation region and the subthreshold region.

In this specification and the like, unless otherwise specified, the transistor M2*s*, the transistor M2*sr*, the transistor M6, the transistor M6*s*, the transistor M6*r*, and the transistor M6*sr* in an on state may operate in a linear region in the end, like the transistor M2, the transistor M3, the transistor M4, and the like. In other words, the gate voltage, the source voltage, and the drain voltage of each of the above transistors may be appropriately biased to voltages in the range where the transistor operates in the linear region. However, one embodiment of the present invention is not limited thereto. For example, the transistor M2*s*, the transistor M2*sr*, the transistor M6, the transistor M6*s*, the transistor M6*r*, and the transistor M6*sr* in an on state may operate in a saturation region or may operate in a subthreshold region. Alternatively, the transistor M2*s*, the transistor M2*sr*, the transistor M6, the transistor M6*s*, the transistor M6*r*, and the transistor M6*sr* may operate around the boundary between the saturation region and the subthreshold region. Alternatively, the transistor M2*s*, the transistor M2*sr*, the transistor M6, the transistor M6*s*, the transistor M6*r*, and the transistor M6*sr* may operate in both the linear region and the saturation region, may operate in both the saturation region and the subthreshold region, may operate in both the subthreshold region and the linear region, or may operate in the linear region, the saturation region, and the subthreshold region.

Next, the configuration of the circuit MP in FIG. 24 is described. Note that the description of a portion of the circuit MP in FIG. 24 having a configuration similar to that of the circuit MP in FIG. 21A is omitted.

In the circuit MP in FIG. 24, the second terminal of the transistor M1 is electrically connected to the second terminal of the transistor M2 and a first terminal of the transistor M6.

A second terminal of the transistor M6 is electrically connected to the first terminal of the transistor M3 and the first terminal of the transistor M4. A gate of the transistor M6 is electrically connected to a wiring S1L. A first terminal of the transistor M1*s* is electrically connected to the wiring VE. A second terminal of the transistor M1*s* is electrically connected to a first terminal of the transistor M6*s*. A gate of the transistor M1*s* is electrically connected to a first terminal of the capacitor C1*s* and a first terminal of the transistor M2*s*. A second terminal of the capacitor C1*s* is electrically connected to the wiring VE. A second terminal of the transistor M2*s* is electrically connected to the second terminal of the transistor M1*s* and the first terminal of the transistor M6*s*. A second terminal of the transistor M6*s* is electrically connected to the first terminal of the transistor M3 and the first terminal of the transistor M4. A gate of the transistor M6*s* is electrically connected to a wiring S2L.

In the circuit MP in FIG. 24, the circuit MCr has substantially the same circuit configuration as the circuit MC. Thus, "r" is added to the reference numerals of the circuit elements and the like included in the circuit MCr to differentiate them from the circuit elements and the like included in the circuit MC.

The wiring S1L functions as a voltage line for supplying a potential for turning on or off the transistor M6 and the transistor M6*r*, and the wiring S2L functions as a voltage line for supplying a potential for turning on or off the transistor M6*s* and the transistor M6*sr*.

In the circuit MP in FIG. 24, the sizes, e.g., the channel lengths and the channel widths, of the transistor M6, the transistor M6*s*, the transistor M6*r*, and the transistor M6*sr* are preferably equal to each other. Such a circuit configuration might enable efficient layout.

For example, by applying the configuration of the circuit MP illustrated in FIG. 24 to the arithmetic circuit 150 illustrated in FIG. 11, the circuit MP of the arithmetic circuit 150 can hold two pieces of first data (e.g., weight coefficients here). Specifically, the circuit MP in FIG. 24 can hold a potential corresponding to a first piece of first data (a weight coefficient) in the circuit HC of the circuit MC and the circuit HCr of the circuit MCr, and can hold a potential corresponding to a second piece of first data (a weight coefficient) in the circuit HCs of the circuit MC and the circuit HCsr of the circuit MCr. In addition, the circuit MP in FIG. 24 can switch the first data (weight coefficients) used for arithmetic operation in accordance with potentials supplied from the wiring S1L and the wiring S2L. For example, potentials corresponding to the first data (weight coefficients) $w_i{}^{(k-1)}{}_j{}^{(k)}$ to $w_m{}^{(k-1)}{}_h{}^{(k)}$ are held in the circuit HC and the circuit HCr included in each of the circuit MP[1,*j*] to the circuit MP[m,j] of the arithmetic circuit 150, potentials corresponding to the first data (weight coefficients) $w_i{}^{(k-1)}{}_j{}^{(k)}$ to $w_m{}^{(k-1)}{}_h{}^{(k)}$ (here, h is an integer that is greater than or equal to 1 and not j) are held in the circuit HCs and the circuit HCsr included in each of the circuit MP[1,*j*] to the circuit MP[m,j] of the arithmetic circuit 150, and potentials corresponding to the signals $z_i{}^{(k-1)}$ to $z_m{}^{(k-1)}$ are input to the wiring XLS[1] to the wiring XLS[m] (the wiring WX1L and the wiring X2L of the circuit MP in FIG. 24). At this time, a high-level potential is applied to the wiring S1L to turn on the transistor M6 and the transistor M6*r* and a low-level potential is applied to the wiring S2L to turn off the transistor M6*s* and the transistor M6*sr*, whereby the circuit MP[1,*j*] to the circuit MP[m,j] of the arithmetic circuit 150 can perform arithmetic operation of the sum of products of the weight coefficients $w_i{}^{(k-1)}{}_j{}^{(k)}$ to $w_m{}^{(k-1)}{}_j{}^{(k)}$ and the signals $z_i{}^{(k-1)}$ to $z_m{}^{(k-1)}$ and an activation function. Moreover, a low-level potential is applied to the wiring S1L to turn off the transistor M6 and the transistor M6*r* and a high-level potential is applied to the wiring S2L to turn on the transistor M6*s* and the transistor M6*sr*, whereby the circuit MP[1,*j*] to the circuit MP[m,j] of the arithmetic circuit 150 can perform arithmetic operation of the sum of products of the weight coefficients $w_i{}^{(k-1)}{}_h{}^{(k)}$ to $w_m{}^{(k-1)}{}_h{}^{(k)}$ and the signals $z_i{}^{(k-1)}$ to $z_m{}^{(k-1)}$ and an activation function.

As described above, the arithmetic circuit 150 using the circuit MP in FIG. 24 can hold two weight coefficients and can perform arithmetic operation of the sum of products and an activation function by switching the weight coefficients. The arithmetic circuit 150 including the circuit MP in FIG. 24 is effective in the case where the number of neurons in the k-th layer is greater than n or in the case where arithmetic operation is performed in an intermediate layer different from the k-th layer, for example. In addition, although the circuit MC and the circuit MCr each include two holding portions in the circuit MP in FIG. 24, the circuit MC and the circuit MCr may each include three or more holding portions according to circumstances.

The circuit MP included in the semiconductor device of one embodiment of the present invention is not limited to the circuit MP in FIG. 24. For the circuit MP in the semiconductor device of one embodiment of the present invention, the circuit configuration of the circuit MP in FIG. 24 can be changed according to circumstances.

Figure 25:
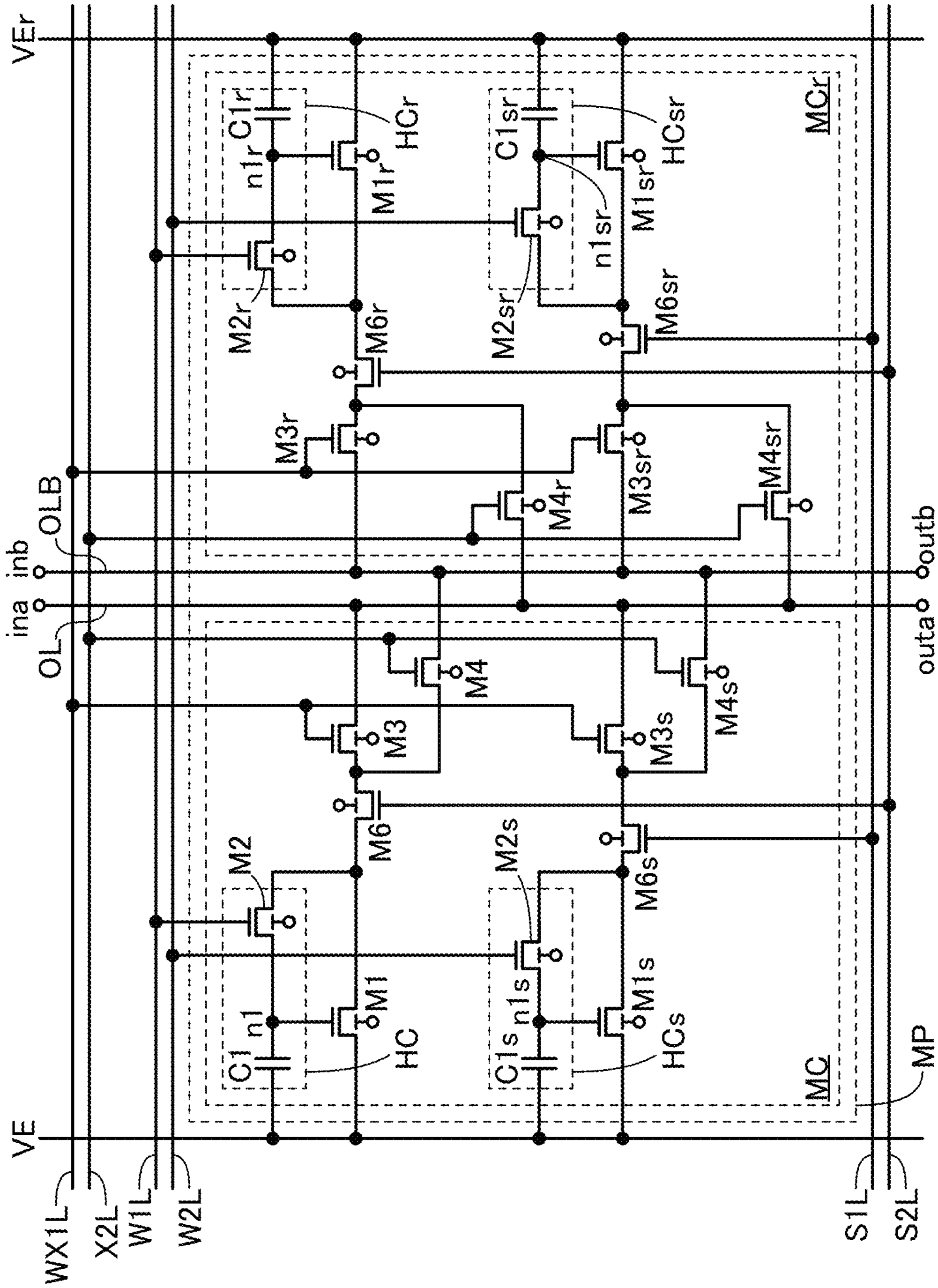
FIG. 25 is a circuit diagram illustrating a configuration example of a circuit included in a semiconductor device.

For example, the circuit MP illustrated in FIG. 25 has a circuit configuration changed from that of the circuit MP in FIG. 24. Specifically, in the circuit MP in FIG. 25, a transistor M3*s*, a transistor M4*s*, a transistor M3*sr*, and a transistor M4*sr* are added to the circuit MP in FIG. 24 and the electrical connections are changed. A first terminal of the transistor M3*s* is electrically connected to the second terminal of the transistor M6*s* and a first terminal of the transistor M4*s*, a second terminal of the transistor M3*s* is electrically connected to the wiring OL, and a gate of the transistor M3*s* is electrically connected to the wiring WX1L. A second terminal of the transistor M4*s* is electrically connected to the wiring OLB, and a gate of the transistor M4*s* is electrically connected to the wiring X2L.

Note that in the circuit MP in FIG. 25, the circuit MCr has substantially the same circuit configuration as the circuit MC. Thus, "r" is added to the reference numerals of the circuit elements and the like included in the circuit MCr to differentiate them from the circuit elements and the like included in the circuit MC. In addition, in the circuit MCr, a second terminal of the transistor M3*sr* is electrically connected to the wiring OLB, and a second terminal of the transistor M4*sr* is electrically connected to the wiring OL.

In the circuit MP in FIG. 25, the sizes, e.g., the channel lengths and the channel widths, of the transistor M3, the transistor M3*s*, the transistor M3*r*, the transistor M3*sr*, the transistor M4, the transistor M4*s*, the transistor M4*r*, and the transistor M4*sr* are preferably equal to each other. Such a circuit configuration might enable efficient layout.

By performing operation similar to that of the circuit MP in FIG. 24, the circuit MP in FIG. 25 can hold two pieces of first data (weight coefficients) and can perform arithmetic operation of the sum of the products and an activation function by switching the first data (weight coefficients). In addition, although the circuit MC and the circuit MCr each include two holding portions in the circuit MP in FIG. 25, the circuit MC and the circuit MCr may each include three or more holding portions according to circumstances.

Note that this configuration example can be combined with any of the other configuration examples and the like described in this specification as appropriate.

Configuration Example 5

Figure 26:
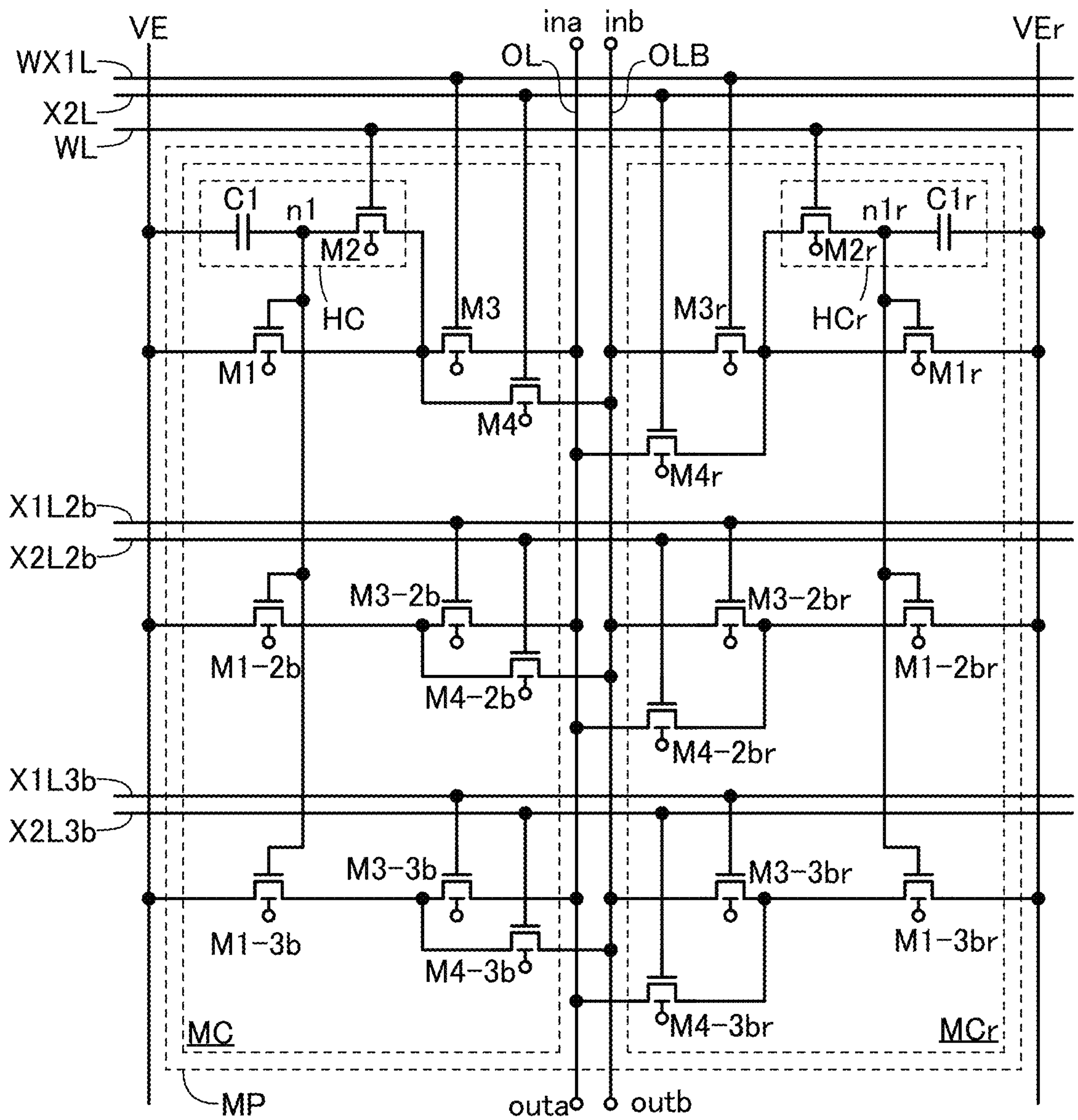
FIG. 26 is a circuit diagram illustrating a configuration example of a circuit included in a semiconductor device.

The circuit MP illustrated in FIG. 26 is different from the circuit MP in FIG. 21A in that the circuit MC includes the transistor M1, a transistor M1-2*b*, and a transistor M1-3*b* which differ in the ratio of the channel width (hereinafter referred to as W length) to the channel length (hereinafter referred to as L length), for example. Note that more transistors may be included in addition to the transistor M1, the transistor M1-2*b*, and the transistor M1-3*b*, or the transistor M1-3*b*, the transistor M1-2*b*, or the like is not necessarily included.

The circuit MC included in the circuit MP in FIG. 26 further includes a transistor M3-2*b*, a transistor M4-2*b*, a transistor M3-3*b*, and a transistor M4-3*b* in addition to the circuit elements included in the circuit MP in FIG. 21A.

In this specification and the like, unless otherwise specified, the transistor M1-2*b* and the transistor M1-3*b* in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor M1-2*b* and the transistor M1-3*b* may operate in a linear region so that the amplitude value of a voltage to be supplied is decreased. To reduce the amount of current flowing through the transistor M1-2*b* and the transistor M1-3*b*, the transistor M1-2*b* and the transistor M1-3*b* may operate in a subthreshold region. Alternatively, they may operate around the boundary between the saturation region and the subthreshold region. Note that in the case where the first data (e.g., a weight coefficient here) is an analog value, for example, the transistor M1-2*b* and the transistor M1-3*b* may operate in the linear region, the saturation region, and the subthreshold region depending on the cases in accordance with the magnitude of the first data (weight coefficient). Alternatively, the transistor M1-2*b* and the transistor M1-3*b* may operate in both the linear region and the saturation region, may operate in both the subthreshold region and the linear region, or may operate in both the saturation region and the subthreshold region.

In this specification and the like, unless otherwise specified, the transistor M3-2*b*, the transistor M4-2*b*, the transistor M3-3*b*, and the transistor M4-3*b* in an on state may operate in a linear region in the end, like the transistor M3 and the transistor M4. In other words, the gate voltage, the source voltage, and the drain voltage of each of the above transistors may be appropriately biased to voltages in the range where the transistor operates in the linear region. However, one embodiment of the present invention is not limited thereto. For example, the transistor M3-2*b*, the transistor M4-2*b*, the transistor M3-3*b*, and the transistor M4-3*b* in an on state may operate in a saturation region or may operate in a subthreshold region. Alternatively, the transistor M3-2*b*, the transistor M4-2*b*, the transistor M3-3*b*, and the transistor M4-3*b* may operate around the boundary between the saturation region and the subthreshold region. Alternatively, the transistor M3-2*b*, the transistor M4-2*b*, the transistor M3-3*b*, and the transistor M4-3*b* may operate in both the linear region and the saturation region, may operate in both the saturation region and the subthreshold region, may operate in both the subthreshold region and the linear region, or may operate in the linear region, the saturation region, and the subthreshold region.

Next, the configuration of the circuit MP in FIG. 26 is described. Note that the description of a portion of the circuit MP in FIG. 26 having a configuration similar to that of the circuit MP in FIG. 21A is omitted.

In the circuit MC of the circuit MP in FIG. 26, a first terminal of the transistor M1-2*b* is electrically connected to the wiring VE. A second terminal of the transistor M1-2*b* is electrically connected to a first terminal of the transistor M3-2*b* and a first terminal of the transistor M4-2*b*. A gate of the transistor M1-2*b* is electrically connected to the first terminal of the transistor M2 and the first terminal of the capacitor C1. A second terminal of the transistor M3-2*b* is electrically connected to the wiring OL. A gate of the transistor M3-2*b* is electrically connected to a wiring X1L2*b*. A second terminal of the transistor M4-2*b* is electrically connected to the wiring OLB. A gate of the transistor M4-2*b* is electrically connected to a wiring X2L2*b*. A first terminal of the transistor M1-3*b* is electrically connected to the wiring VE. A second terminal of the transistor M1-3*b* is electrically connected to a first terminal of the transistor M3-3*b* and a first terminal of the transistor M4-3*b*. A gate of the transistor M1-3*b* is electrically connected to the first terminal of the transistor M2 and the first terminal of the capacitor C1. A second terminal of the transistor M3-3*b* is electrically connected to the wiring OL. A gate of the transistor M3-3*b* is electrically connected to a wiring X1L3*b*. A second terminal of the transistor M4-3*b* is electrically connected to the wiring OLB. A gate of the transistor M4-3*b* is electrically connected to a wiring X2L3*b*.

Note that in the circuit MP in FIG. 26, the circuit MCr has substantially the same circuit configuration as the circuit MC. Thus, "r" is added to the reference numerals of the circuit elements and the like included in the circuit MCr to differentiate them from the circuit elements and the like included in the circuit MC. In addition, a second terminal of a transistor M3-2*br* is electrically connected to the wiring OLB, a second terminal of a transistor M4-2*br* is electrically connected to the wiring OL, a second terminal of a transistor M3-3*br* is electrically connected to the wiring OLB, and a second terminal of a transistor M4-3*br* is electrically connected to the wiring OL.

In the circuit MP in FIG. 26, the sizes, e.g., the channel lengths and the channel widths, of the transistor M3, the transistor M3-2*b*, the transistor M3-3*b*, the transistor M3*r*, the transistor M3-2*br*, the transistor M3-3*br*, the transistor M4, the transistor M4-2*b*, the transistor M4-3*b*, the transistor M4*r*, the transistor M4-2*br*, and the transistor M4-3*br* are preferably equal to each other. Such a circuit configuration might enable efficient layout.

The wiring X1L2*b* is a wiring for switching the on state and the off state of the transistor M3-2*b* and the transistor M3-2*br*; the wiring X2L2*b* is a wiring for switching the on state and the off state of the transistor M4-2*b* and the transistor M4-2*br*; the wiring X1L3*b* is a wiring for switching the on state and the off state of the transistor M3-3*b* and the transistor M3-3*br*; and the wiring X2L3*b* is a wiring for switching the on state and the off state of the transistor M4-3*b* and the transistor M4-3*br*.

When the ratio of the W length to the L length of the transistor M1 is W/L, the ratio of the W length to the L length of the transistor M1-2*b* is preferably 2×W/L and the ratio of the W length to the L length of the transistor M1-3*b* is preferably 4×W/L. Since a current flowing between a source and a drain of a transistor is proportional to the ratio of the channel width to the channel length, in the case where the transistor M1, the transistor M1-2b, and the transistor M1-3b have the same structure, structure condition, and the like other than the ratio of the channel width to the channel length, a current flowing through the transistor M1-2b and a current flowing through the transistor M1-3b are respectively about twice and four times as large as the current flowing through the transistor M1. That is, the ratio of the amounts of currents flowing through the transistor M1, the transistor M1-2b, and the transistor M1-3b is approximately 1:2:4. Here, the case is considered where the circuit MC included in the circuit MP in FIG. 26 includes Q transistors (Q is an integer greater than or equal to 4), for example, as transistors corresponding to the transistor M1. Given that a first transistor is the transistor M1, a second transistor is the transistor M1-2b, a third transistor is the transistor M1-3b, and the ratio of the W length to the L length of a q-th transistor (q is an integer greater than or equal to 4 and less than or equal to Q) is $2^{(q-1)}$ times as high as the ratio of the W length to the L length of the transistor M1, the ratio of the amounts of currents flowing through the first transistor, the second transistor, the third transistor, and the q-th transistor is $1:2:4:2^{(q-1)}$. That is, the circuit MC included in the circuit MP in FIG. 26 may include Q transistors so that the ratio of the amounts of currents flowing through the transistors becomes a power of two.

For example, when the amount of current flowing between the source and the drain of the transistor M1 is $I_{ut}$, from the above-described ratios of the channel widths to the channel lengths of the transistor M1, the transistor M1-2b, and the transistor M1-3b, the amounts of currents flowing through the transistor M1-2b and the transistor M1-3b are $2I_{ut}$ and $4I_{ut}$, respectively.

Furthermore, the ratio of the W length to the L length of the transistor M1r is preferably equal to the ratio of the W length to the L length of the transistor M1, the ratio of the W length to the L length of the transistor M1-2br is preferably equal to the ratio of the W length to the L length of the transistor M1-2b, and the ratio of the W length to the L length of the transistor M1-3br is preferably equal to the ratio of the W length to the L length of the transistor M1-3b.

Here, the amount of current flowing from the wiring OL to the circuit MC is considered. In this case, the positive first data (a positive weight coefficient) is set in the circuit MP, at least one of the transistor M3, the transistor M3-2b, and the transistor M3-3b is turned on, and at least one of the transistor M4, the transistor M4-2b, and the transistor M4-3b is turned off. At this time, the amount of current flowing from the wiring OL to the circuit MC changes depending on the combination of the on state and the off state of the transistor M3, the transistor M3-2b, and the transistor M3-3b.

For example, when the amount of current flowing between the source and the drain of the transistor M1 is set to $I_{ut}$, the amount of current flowing through the transistor M1-2b is $2I_{ut}$ and the amount of current flowing through the transistor M1-3b is $4I_{ut}$. Here, when a high-level potential is applied to the wiring WX1L, a low-level potential is applied to the wiring X2L, and a low-level potential is applied to the wiring X1L2b, the wiring X2L2b, the wiring X1L3b, and the wiring X2L3b, the transistor M3 can be turned on and the transistor M3-2b, the transistor M3-3b, the transistor M4, the transistor M4-2b, and the transistor M4-3b can be turned off. At this time, the amount of current flowing from the wiring OL to the circuit MC is $I_{ut}$. As another example, the amount of current flowing between the source and the drain of the transistor M1 is set to $I_{ut}$, a high-level potential is applied to the wiring WX1L and the wiring X1L2b, a low-level potential is applied to the wiring X2L and the wiring X2L2b, and furthermore, a low-level potential is applied to the wiring X1L3b and the wiring X2L3b. At this time, the transistor M3 and the transistor M3-2b can be turned on and the transistor M3-3b, the transistor M4, the transistor M4-2b, and the transistor M4-3b can be turned off, so that the amount of current flowing from the wiring OL to the circuit MC is $3I_{ut}$. As another example, the amount of current flowing between the source and the drain of the transistor M1 is set to $I_{ut}$, a high-level potential is applied to the wiring X1L2b and the wiring X1L3b, a low-level potential is applied to the wiring X2L2b and the wiring X2L3b, and furthermore, a low-level potential is applied to the wiring WX1L and the wiring X2L. At this time, the transistor M3-2b and the transistor M3-3b can be turned on and the transistor M3, the transistor M4, the transistor M4-2b, and the transistor M4-3b can be turned off, so that the amount of current flowing from the wiring OL to the circuit MC is $6I_{ut}$.

As another example, when the amount of current flowing between the source and the drain of the transistor M1 is set to $2I_{ut}$, the amount of current flowing through the transistor M1-2b is $4I_{ut}$ and the amount of current flowing through the transistor M1-3b is $8I_{ut}$. Here, when a high-level potential is applied to the wiring WX1L, a low-level potential is applied to the wiring X2L, and furthermore, a low-level potential is applied to the wiring X1L2b, the wiring X2L2b, the wiring X1L3b, and the wiring X2L3b, the transistor M3 can be turned on and the transistor M3-2b, the transistor M3-3b, the transistor M4, the transistor M4-2b, and the transistor M4-3b can be turned off. At this time, the amount of current flowing from the wiring OL to the circuit MC is $2I_{ut}$. As another example, the amount of current flowing between the source and the drain of the transistor M1 is set to $2I_{ut}$, a high-level potential is applied to the wiring WX1L and the wiring X1L2b, a low-level potential is applied to the wiring X2L and the wiring X2L2b, and furthermore, a low-level potential is applied to the wiring X1L3b and the wiring X2L3b. At this time, the transistor M3 and the transistor M3-2b can be turned on and the transistor M3-3b, the transistor M4, the transistor M4-2b, and the transistor M4-3b can be turned off, so that the amount of current flowing from the wiring OL to the circuit MC is $6I_{u}$. As another example, the amount of current flowing between the source and the drain of the transistor M1 is set to $2I_{ut}$, a high-level potential is applied to the wiring X1L2b and the wiring X1L3b, a low-level potential is applied to the wiring X2L2b and the wiring X2L3b, and furthermore, a low-level potential is applied to the wiring WX1L and the wiring X2L. At this time, the transistor M3-2b and the transistor M3-3b can be turned on and the transistor M3, the transistor M4, the transistor M4-2b, and the transistor M4-3b can be turned off, so that the amount of current flowing from the wiring OL to the circuit MC is $12I_{ut}$.

That is, the circuit MP in FIG. 26 has a function of multiplying the current set between the source and the drain of the transistor M1 by approximately an integer in accordance with the potentials of the wiring WX1L, the wiring X1L2b, and the wiring X1L3b and making the current multiplied by an integer flow from the wiring OL to the circuit MC. Note that by changing the ratio of the W length to the L length of each of the transistor M1, the transistor M1-2b, and the transistor M1-3b, the current set between the source and the drain of the transistor M1 can be made to flow from the wiring OL to the circuit MC after multiplied by a real number, not by an integer.

Although the amount of current flowing from the wiring OL to the circuit MC is described in the above example, the amount of current flowing from the wiring OLB to the circuit MC can be considered in a similar manner. In this case, the positive first data (a positive weight coefficient) is set in the circuit MP, at least one of the transistor M4, the transistor M4-2*b*, and the transistor M4-3*b* is turned on, and at least one of the transistor M3, the transistor M3-2*b*, and the transistor M3-3*b* is turned off. At this time, the amount of current flowing from the wiring OLB to the circuit MC changes depending on the combination of the on state and the off state of the transistor M4, the transistor M4-2*b*, and the transistor M4-3*b*. In addition, the current flowing from the wiring OLB to the circuit MCr can be considered in a similar manner. In this case, the negative first data (a negative weight coefficient) is set in the circuit MP, at least one of the transistor M3*r*, the transistor M3-2*br*, and the transistor M3-3*br* is turned on, and at least one of the transistor M4*r*, the transistor M4-2*br*, and the transistor M4-3*br* is turned off. At this time, the amount of current flowing from the wiring OLB to the circuit MCr changes depending on the combination of the on state and the off state of the transistor M3*r*, the transistor M3-2*br*, and the transistor M3-3*br*. Furthermore, a current flowing from the wiring OL to the circuit MCr can be considered in a similar manner. In this case, the negative first data (a negative weight coefficient) is set in the circuit MP, at least one of the transistor M4*r*, the transistor M4-2*br*, and the transistor M4-3*br* is turned on, and at least one of the transistor M3*r*, the transistor M3-2*br*, and the transistor M3-3*br* is turned off. At this time, the amount of current flowing from the wiring OL to the circuit MCr changes depending on the combination of the on state and the off state of the transistor M4*r*, the transistor M4-2*br*, and the transistor M4-3*br*.

As described above, the circuit MP in FIG. 26 can multiply the set amount of current by an integer (by a real number) in accordance with the potentials of the wiring WX1L, the wiring X2L, the wiring X1L2*b*, the wiring X2L2*b*, the wiring X1L3*b*, and the wiring X2L3*b*, and can supply the current from the wiring OL to the circuit MC or the circuit MCr or supply the current from the wiring OLB to the circuit MC or the circuit MCr. Here, by determining the second data (e.g., a value of a signal of a neuron here) depending on the combination of the potentials of the wiring WX1L, the wiring X2L, the wiring X1L2*b*, the wiring X2L2*b*, the wiring X1L3*b*, and the wiring X2L3*b*, the second data (a value of a signal of a neuron) can be processed as a multilevel value (15-level value in the configuration of the circuit MP in FIG. 26). That is, the circuit MP in FIG. 26 can be a circuit that can calculate the product of the multilevel first data (a weight coefficient) and the multilevel second data (a signal of a neuron).

Given that the first data (a weight coefficient) set in the circuit MP is "+1" (the set amount of current between the source and the drain of the transistor M1 is $I_{ut}$ and the set amount of current between the source and the drain of the transistor M1*r* is 0. Note that the potential of the node n1 of the circuit HC is $V_1$ and the potential of the node n1*r* of the circuit HCr is VSS), the following table shows the changes in current amounts of the current $I_{OL}$ flowing from the wiring OL to the circuit MC or the circuit MCr and the current $I_{OLB}$ flowing from the wiring OLB to the circuit MC or the circuit MCr when the potentials of the wiring WX1L, the wiring X2L, the wiring X1L2*b*, the wiring X2L2*b*, the wiring X1L3*b*, and the wiring X2L3*b*, which correspond to the second data (a value of a signal of a neuron), are input to the circuit MP. Note that in the following table, a high-level potential is denoted by high and a low-level potential is denoted by low.

TABLE 3

| Weight coefficient | n1 | n1r | Signal | WX1L | X2L | X1L2b | X2L2b | X1L3b | X2L3b | Weight coefficient × Signal | Change amount of $I_{OL}$ | Change amount of $I_{OLB}$ |
|---|---|---|---|---|---|---|---|---|---|---|---|---|
| +1 | $V_1$ | VSS | 0 | low | low | low | low | low | low | 0 | 0 | 0 |
| +1 | $V_1$ | VSS | +1 | high | low | low | low | low | low | +1 | $I_{ut}$ | 0 |
| +1 | $V_1$ | VSS | +2 | low | low | high | low | low | low | +2 | $2I_{ut}$ | 0 |
| +1 | $V_1$ | VSS | +3 | high | low | high | low | low | low | +3 | $3I_{ut}$ | 0 |
| +1 | $V_1$ | VSS | +4 | low | low | low | low | high | low | +4 | $4I_{ut}$ | 0 |
| +1 | $V_1$ | VSS | +5 | high | low | low | low | high | low | +5 | $5I_{ut}$ | 0 |
| +1 | $V_1$ | VSS | +6 | low | low | high | low | high | low | +6 | $6I_{ut}$ | 0 |
| +1 | $V_1$ | VSS | +7 | high | low | high | low | high | low | +7 | $7I_{ut}$ | 0 |
| +1 | $V_1$ | VSS | −1 | low | high | low | low | low | low | −1 | 0 | $I_{ut}$ |
| +1 | $V_1$ | VSS | −2 | low | low | low | high | low | low | −2 | 0 | $2I_{ut}$ |
| +1 | $V_1$ | VSS | −3 | low | high | low | high | low | low | −3 | 0 | $3I_{ut}$ |
| +1 | $V_1$ | VSS | −4 | low | low | low | low | low | high | −4 | 0 | $4I_{ut}$ |
| +1 | $V_1$ | VSS | −5 | low | high | low | low | low | high | −5 | 0 | $5I_{ut}$ |
| +1 | $V_1$ | VSS | −6 | low | low | low | high | low | high | −6 | 0 | $6I_{ut}$ |
| +1 | $V_1$ | VSS | −7 | low | high | low | high | low | high | −7 | 0 | $7I_{ut}$ |

Given that the first data (a weight coefficient) set in the circuit MP is "−1" (the set amount of current between the source and the drain of the transistor M1 is 0 and the set amount of current between the source and the drain of the transistor M1*r* is $I_{ut}$. Note that the potential of the node n1 of the circuit HC is VSS and the potential of the node n1*r* of the circuit HCr is $V_1$), the following table shows the changes in current amounts of the current $I_{OL}$ flowing from the wiring OL to the circuit MC or the circuit MCr and the current $I_{OLB}$ flowing from the wiring OLB to the circuit MC or the circuit MCr when the potentials of the wiring WX1L, the wiring X2L, the wiring X1L2*b*, the wiring X2L2*b*, the wiring X1L3*b*, and the wiring X2L3*b*, which correspond to the second data (a value of a signal of a neuron), are input to the circuit MP. Note that in the following table, a high-level potential is denoted by high and a low-level potential is denoted by low.

TABLE 4

| Weight coefficient | n1 | n1r | Signal | WX1L | X2L | X1L2b | X2L2b | X1L3b | X2L3b | Weight coeffi-cient × Signal | Change amount of $I_{OL}$ | Change amount of $I_{OLB}$ |
|---|---|---|---|---|---|---|---|---|---|---|---|---|
| −1 | VSS | $V_1$ | 0 | low | low | low | low | low | low | 0 | 0 | 0 |
| −1 | VSS | $V_1$ | +1 | high | low | low | low | low | low | −1 | 0 | $I_{ut}$ |
| −1 | VSS | $V_1$ | +2 | low | low | high | low | low | low | −2 | 0 | $2I_{ut}$ |
| −1 | VSS | $V_1$ | +3 | high | low | high | low | low | low | −3 | 0 | $3I_{ut}$ |
| −1 | VSS | $V_1$ | +4 | low | low | low | low | high | low | −4 | 0 | $4I_{ut}$ |
| −1 | VSS | $V_1$ | +5 | high | low | low | low | high | low | −5 | 0 | $5I_{ut}$ |
| −1 | VSS | $V_1$ | +6 | low | low | high | low | high | low | −6 | 0 | $6I_{ut}$ |
| −1 | VSS | $V_1$ | +7 | high | low | high | low | high | low | −7 | 0 | $7I_{ut}$ |
| −1 | VSS | $V_1$ | −1 | low | high | low | low | low | low | +1 | $I_{ut}$ | 0 |
| −1 | VSS | $V_1$ | −2 | low | low | low | high | low | low | +2 | $2I_{ut}$ | 0 |
| −1 | VSS | $V_1$ | −3 | low | high | low | high | low | low | +3 | $3I_{ut}$ | 0 |
| −1 | VSS | $V_1$ | −4 | low | low | low | low | low | high | +4 | $4I_{ut}$ | 0 |
| −1 | VSS | $V_1$ | −5 | low | high | low | low | low | high | +5 | $5I_{ut}$ | 0 |
| −1 | VSS | $V_1$ | −6 | low | low | low | high | low | high | +6 | $6I_{ut}$ | 0 |
| −1 | VSS | $V_1$ | −7 | low | high | low | high | low | high | +7 | $7I_{ut}$ | 0 |

When the amount of current flowing between the source and the drain of the transistor M1 is 0, the potential of the node n1 is VSS, for example. In this case, the amount of current flowing between the sources and the drains of the transistor M1-2*b* and the transistor M1-3*b* as well as the transistor M1 can also be 0. Thus, a current does not flow from the wiring OL or the wiring OLB to the circuit MC regardless of the on state or the off state of the transistor M3, the transistor M3-2*b*, the transistor M3-3*b*, the transistor M4, the transistor M4-2*b*, and the transistor M4-3*b*.

As described above, by setting each of the wiring WX1L, the wiring X2L, the wiring X1L2*b*, the wiring X2L2*b*, the wiring X1L3*b*, and the wiring X2L3*b* to a low-level potential or a high-level potential, the circuit MIP in FIG. 26 can express the second data (a value of a signal of a neuron) as a 15-level value and can calculate the product of the multilevel first data (a weight coefficient) and the multilevel second data (a value of a signal of a neuron).

The circuit MP included in the semiconductor device of one embodiment of the present invention is not limited to the circuit MP in FIG. 26. For the circuit MP in the semiconductor device of one embodiment of the present invention, the circuit configuration of the circuit MP in FIG. 26 can be changed according to circumstances.

Figure 27:
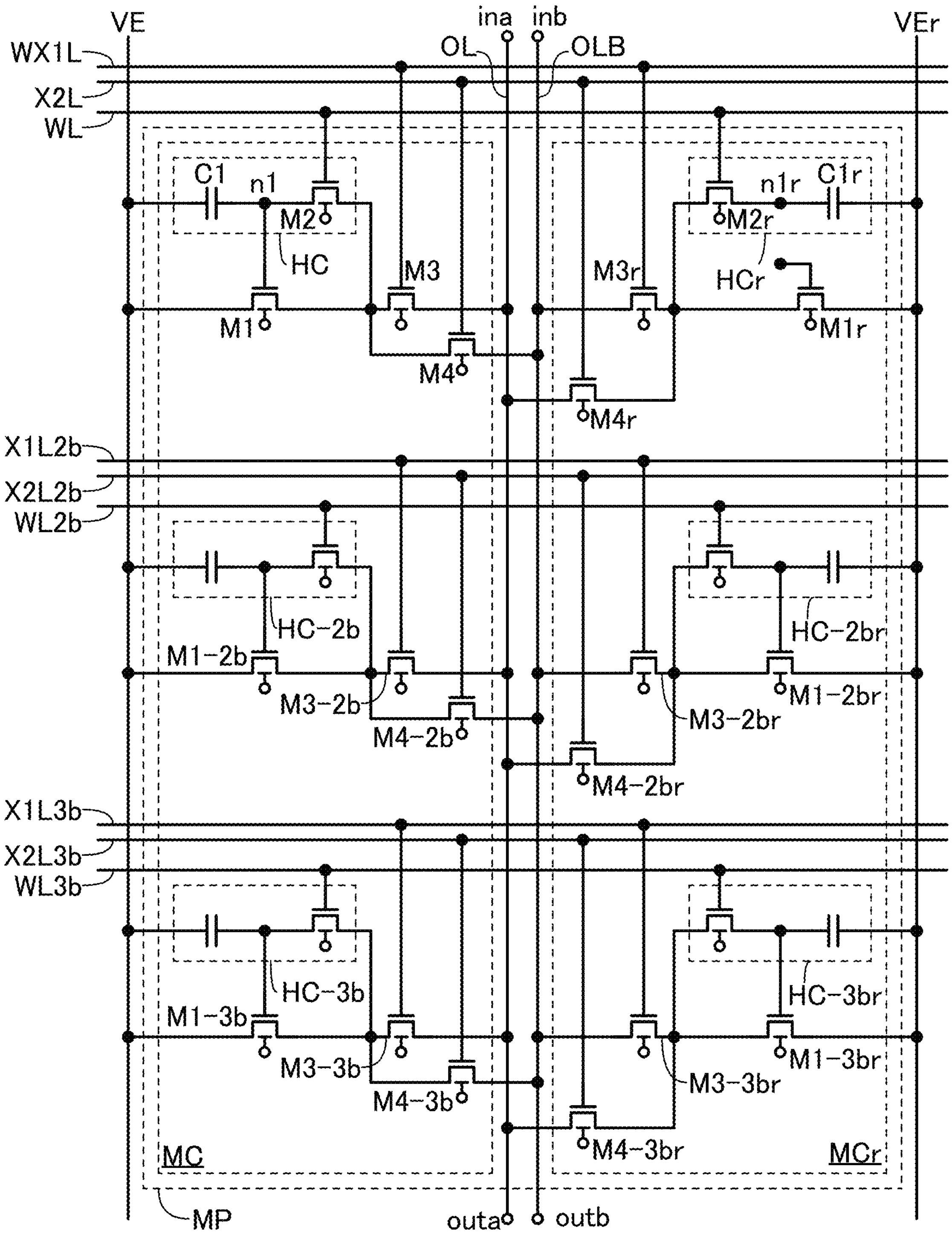
FIG. 27 is a circuit diagram illustrating a configuration example of a circuit included in a semiconductor device.

For example, the circuit MP illustrated in FIG. 27 has a circuit configuration changed from that of the circuit MP in FIG. 26. Specifically, the circuit MP in FIG. 27 has a configuration in which a circuit HC-2*b*, a circuit HC-3*b*, a circuit HC-2*br*, and a circuit HC-3*br* are added to the circuit MP in FIG. 26. The configurations of the circuit HC-2*b*, the circuit HC-3*b*, the circuit HC-2*br*, and the circuit HC-3*br* are similar to the configurations of the circuit HC and the circuit HCr; therefore, the description of the circuit HC and the circuit HCr is referred to for them.

In the circuit MC, the electrical connection configuration around the transistor M1-2*b*, the transistor M3-2*b*, the transistor M4-2*b*, and the circuit HC-2*b* is similar to the electrical connection configuration around the transistor M1, the transistor M3, the transistor M4, and the circuit HC. In addition, the electrical connection configuration around the transistor M1-3*b*, the transistor M3-3*b*, the transistor M4-3*b*, and the circuit HC-3*b* is similar to the electrical connection configuration around the transistor M1, the transistor M3, the transistor M4, and the circuit HC. In the circuit MCr, the electrical connection configuration around the transistor M1-2*br*, the transistor M3-2*br*, the transistor M4-2*br*, and the circuit HC-2*br* is similar to the electrical connection configuration around the transistor M1*r*, the transistor M3*r*, the transistor M4*r*, and the circuit HCr. In addition, the electrical connection configuration around the transistor M1-3*br*, the transistor M3-3*br*, the transistor M4-3*br*, and the circuit HC-3*br* is similar to the electrical connection configuration around the transistor M1*r*, the transistor M3*r*, the transistor M4*r*, and the circuit HCr.

Furthermore, the circuit HC-2*b* is electrically connected to a wiring WL2*b*, the circuit HC-3*b* is electrically connected to a wiring WL3*b*, the circuit HC-2*br* is electrically connected to the wiring WL2*b*, and the circuit HC-3*br* is electrically connected to the wiring WL3*b*.

The circuit MP in FIG. 27 can operate in a manner similar to that of the circuit MP in FIG. 26 by, for example, setting the ratios of the W lengths to the L lengths of the transistor M1, the transistor M1-2*b*, and the transistor M1-3*b* to W/L, 2×W/L, and 4×W/L, respectively; holding in the circuit HC a potential with which the amount of current flowing between the source and the drain of the transistor M1 is set to $I_{ut}$; and holding in the circuit HC-2*b* and the circuit HC-3*b* a potential almost equal to the potential, as in the circuit MP in FIG. 26.

Almost equal potentials are written to the circuit HC, the circuit HC-2*b*, and the circuit HC-3*b*, and thus the wiring WL, the wiring WL2*b*, and the wiring WL3*b* may be combined into one wiring (not illustrated).

Alternatively, for example, in the case where the ratios of the W lengths to the L lengths of the transistor M1, the transistor M1-2*b*, and the transistor M1-3*b* are set to be equal to each other and the amount of current flowing between the source and the drain of the transistor M1 is set to I, the operation can be similar to that of the circuit MP in FIG. 26 by setting the amount of current flowing between the source and the drain of the transistor M1-2*b* to 2I and setting the amount of current flowing between the source and the drain of the transistor M1-3*b* to 4I.

Figure 28:
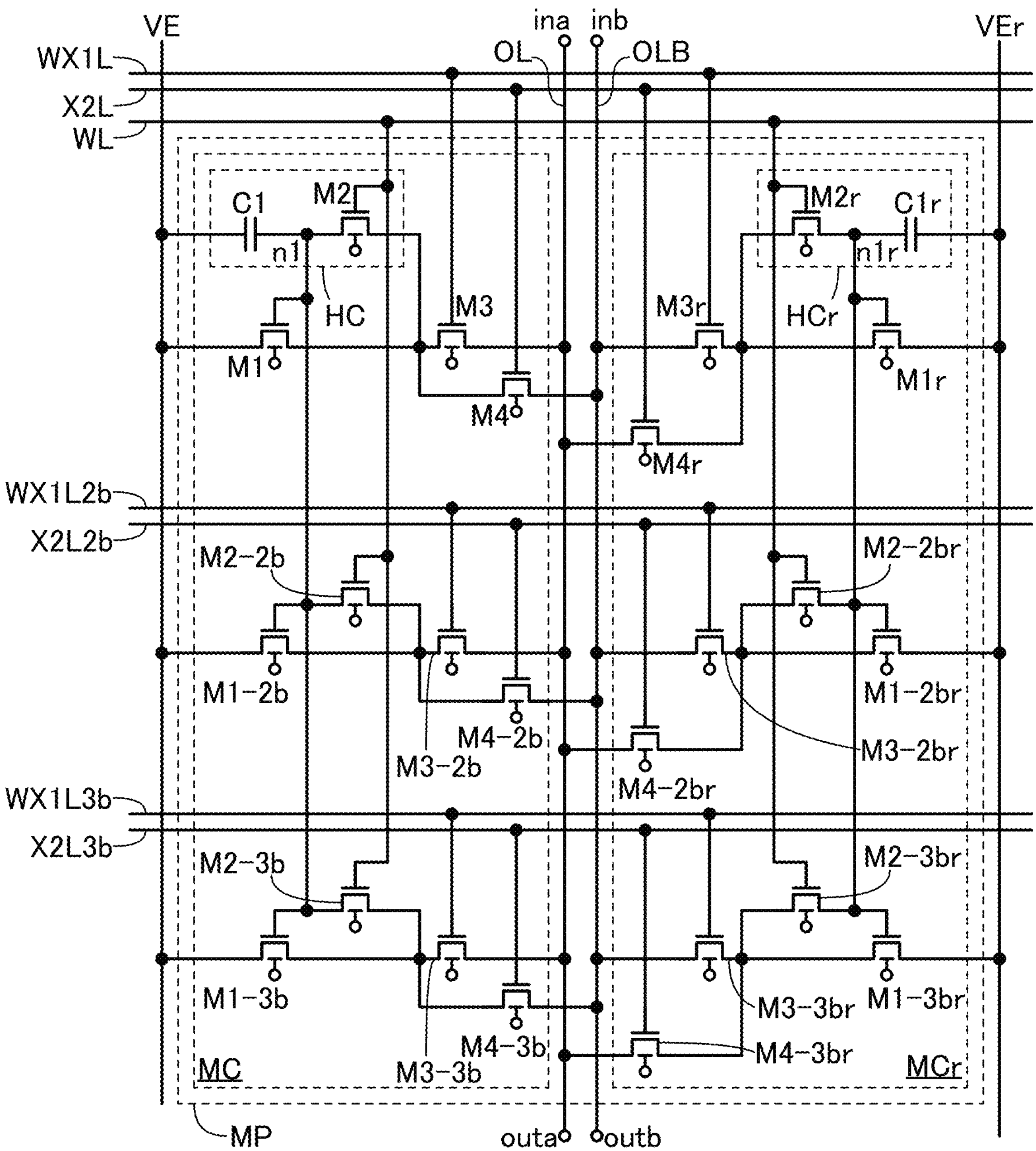
FIG. 28 is a circuit diagram illustrating a configuration example of a circuit included in a semiconductor device.

As a circuit configuration that is changed from that of the circuit MP in FIG. 26 and different from that of the circuit MP in FIG. 27, the circuit MP illustrated in FIG. 28 may be employed. The circuit MP in FIG. 28 has a configuration in which a transistor M2-2*b*, a transistor M2-3*b*, a transistor M2-2*br*, and a transistor M2-3*br* are added to the circuit MP in FIG. 26. Note that the ratios of the W lengths to the L lengths of the transistor M1, the transistor M1-2*b*, and the transistor M1-3*b* are respectively W/L, 2×W/L, and 4×W/L as in FIG. 26, for example. Note that the amount of current is determined by the set amount and does not depend on the W length and the L length in some cases. Thus, the ratios of the W lengths to the L lengths of the transistor M1, the transistor M1-2*b*, and the transistor M1-3*b* may be the same. However, in that case, the gate potentials of the transistors may be different from each other depending on the amount of current. In the case where the gate potentials of the transistors are to be almost equal to each other, the ratios of the W lengths to the L lengths are desirably W/L, 2×W/L, and 4×W/L.

In this specification and the like, unless otherwise specified, the transistor M2-2*b*, the transistor M2-3*b*, the transistor M2-2*br*, and the transistor M2-3*br* may operate in the linear region in the end, like the transistor M2 and the transistor M2*r*. In other words, the gate voltage, the source voltage, and the drain voltage of each of the above transistors may be appropriately biased to voltages in the range where the transistor operates in the linear region. However, one embodiment of the present invention is not limited thereto. For example, the transistor M2-2*b*, the transistor M2-3*b*, the transistor M2-2*br*, and the transistor M2-3*br* in an on state may operate in a saturation region or may operate in a subthreshold region. Alternatively, the transistor M2-2*b*, the transistor M2-3*b*, the transistor M2-2*br*, and the transistor M2-3*br* may operate around the boundary between the saturation region and the subthreshold region. Alternatively, the transistor M2-2*b*, the transistor M2-3*b*, the transistor M2-2*br*, and the transistor M2-3*br* may operate in both the linear region and the saturation region, may operate in both the saturation region and the subthreshold region, may operate in both the subthreshold region and the linear region, or may operate in the linear region, the saturation region, and the subthreshold region.

In the circuit MC, a first terminal of the transistor M2-2*b* is electrically connected to a first terminal of the transistor M2-3*b*, the first terminal of the transistor M2, the gate of the transistor M1, the gate of the transistor M1-2*b*, the gate of the transistor M1-3*b*, and the first terminal of the capacitor C1. A second terminal of the transistor M2-2*b* is electrically connected to the second terminal of the transistor M1-2*b*, the first terminal of the transistor M3-2*b*, and the first terminal of the transistor M4-2*b*. A second terminal of the transistor M2-3*b* is electrically connected to the second terminal of the transistor M1-3*b*, the first terminal of the transistor M3-3*b*, and the first terminal of the transistor M4-3*b*. A gate of the transistor M2-2*b* and a gate of the transistor M2-3*b* are electrically connected to the wiring WL.

Similarly, in the circuit MCr, a first terminal of the transistor M2-2*br* is electrically connected to a first terminal of the transistor M2-3*br*, a first terminal of the transistor M2*r*, the gate of the transistor M1*r*, a gate of the transistor M1-2*br*, a gate of the transistor M1-3*br*, and the first terminal of the capacitor C1. A second terminal of the transistor M2-2*br* is electrically connected to a second terminal of the transistor M1-2*br*, a first terminal of the transistor M3-2*br*, and a first terminal of the transistor M4-2*br*. A second terminal of the transistor M2-3*br* is electrically connected to the second terminal of the transistor M1-3*br*, a first terminal of the transistor M3-3*br*, and a first terminal of the transistor M4-3*br*. A gate of the transistor M2-2*br* and a gate of the transistor M2-3*br* are electrically connected to the wiring WL.

The wiring WX1L2*b* and the wiring WX1L3*b* illustrated in FIG. 28 correspond to the wiring X1L2*b* and the wiring X1L3*b*, respectively, of the circuit MP in FIG. 26.

To set currents flowing through the transistor M1, the transistor M1-2*b*, the transistor M1-3*b*, the transistor M1*r*, the transistor M1-2*br*, and the transistor M1-3*br*, a high-level potential is input to the wiring WL, the wiring WX1L, the wiring WX1L2*b*, and the wiring WX1L3*b* so that the transistor M2, the transistor M2-2*b*, the transistor M2-3*b*, the transistor M3, the transistor M3-2*b*, and the transistor M3-3*b* are turned on. Furthermore, a low-level potential is input to the wiring X2L, the wiring X2L2*b*, and the wiring X2L3*b* so that the transistor M4, the transistor M4-2*b*, the transistor M4-3*b*, the transistor M4*r*, the transistor M4-2*br*, and the transistor M4-3*br* are turned off.

At this time, the total sum of the currents to be set in the transistor M1, the transistor M1-2*b*, and the transistor M1-3*b*, e.g., $7I_{ut}$, is supplied from the wiring OL to the circuit MC, so that the node n1 of the circuit HC has a predetermined potential. Here, a low-level potential is input to the wiring WL so that the transistor M2 is turned off, whereby the predetermined potential is held at the node n1 of the circuit HC. Accordingly, currents of $I_{ut}$, $2I_{ut}$, and $4I_{ut}$ are set to flow between the sources and the drains of the transistor M1, the transistor M1-2*b*, and the transistor M1-3*b*, respectively.

Similarly, the total sum of the currents to be set in the transistor M1*r*, the transistor M1-2*br*, and the transistor M1-3*br*, e.g., $7I_{ut}$, is supplied from the wiring OLB to the circuit MCr, so that the node n1*r* of the circuit HCr has a predetermined potential. Then, a low-level potential is input to the wiring WL so that the predetermined potential is held at the node n1*r* of the circuit HCr, whereby currents of $I_{ut}$, $2I_{ut}$, and $4I_{ut}$ are set to flow between the sources and the drains of the transistor M1*r*, the transistor M1-2*br*, and the transistor M1-3*br*, respectively.

The circuit MP having the configuration in FIG. 28 can operate in a manner similar to that of the circuit MP in FIG. 26. Furthermore, in the circuit MP having the configuration in FIG. 28, the influence of structure variations caused at the time of forming the transistor M1, the transistor M1-2*b*, and the transistor M1-3*b* can be reduced in the circuit MC. Similarly, the influence of structure variations caused at the time of forming the transistor M1*r*, the transistor M1-2*br*, and the transistor M1-3*br* can be reduced in the circuit MCr.

As another modification example of the circuit MP in FIG. 26, the circuit HC and the circuit HCr may have different configurations. The circuit MP illustrated in FIG. 29 has a configuration in which the circuit HC and the circuit HCr included in the circuit MP in FIG. 26 are replaced with a circuit HCS and a circuit HCSr, respectively. Note that the ratios of the W lengths to the L lengths of the transistor M1, the transistor M1-2*b*, and the transistor M1-3*b* are W/L, 2×W/L, and 4×W/L, respectively, as in FIG. 26.

The circuit HCS is electrically connected to the wiring OL and the wiring OLB, for example. The circuit HCS has a function of receiving information (a potential, a current, or the like) input from one or both of the wiring OL and the wiring OLB and holding a potential corresponding to the information. In addition, the circuit HCS is electrically connected to the gates of the transistor M1, the transistor M1-2*b*, and the transistor M1-3*b*. The circuit HCS has a function of applying the held potential to the gates of the transistor M1, the transistor M1-2*b*, and the transistor M1-3*b*. Thus, a source-drain current based on the potential supplied from the circuit HCS and the ratio of the W length to the L length flows through each of the transistor M1, the transistor M1-2*b*, and the transistor M1-3*b*. Note that the circuit HCSr has functions similar to those of the circuit HCS, and a source-drain current based on the potential supplied from the circuit HCSr and the ratio of the W length to the L length flows through each of the transistor M1*r*, the transistor M1-2*br*, and the transistor M1-3*br*.

Figure 29:
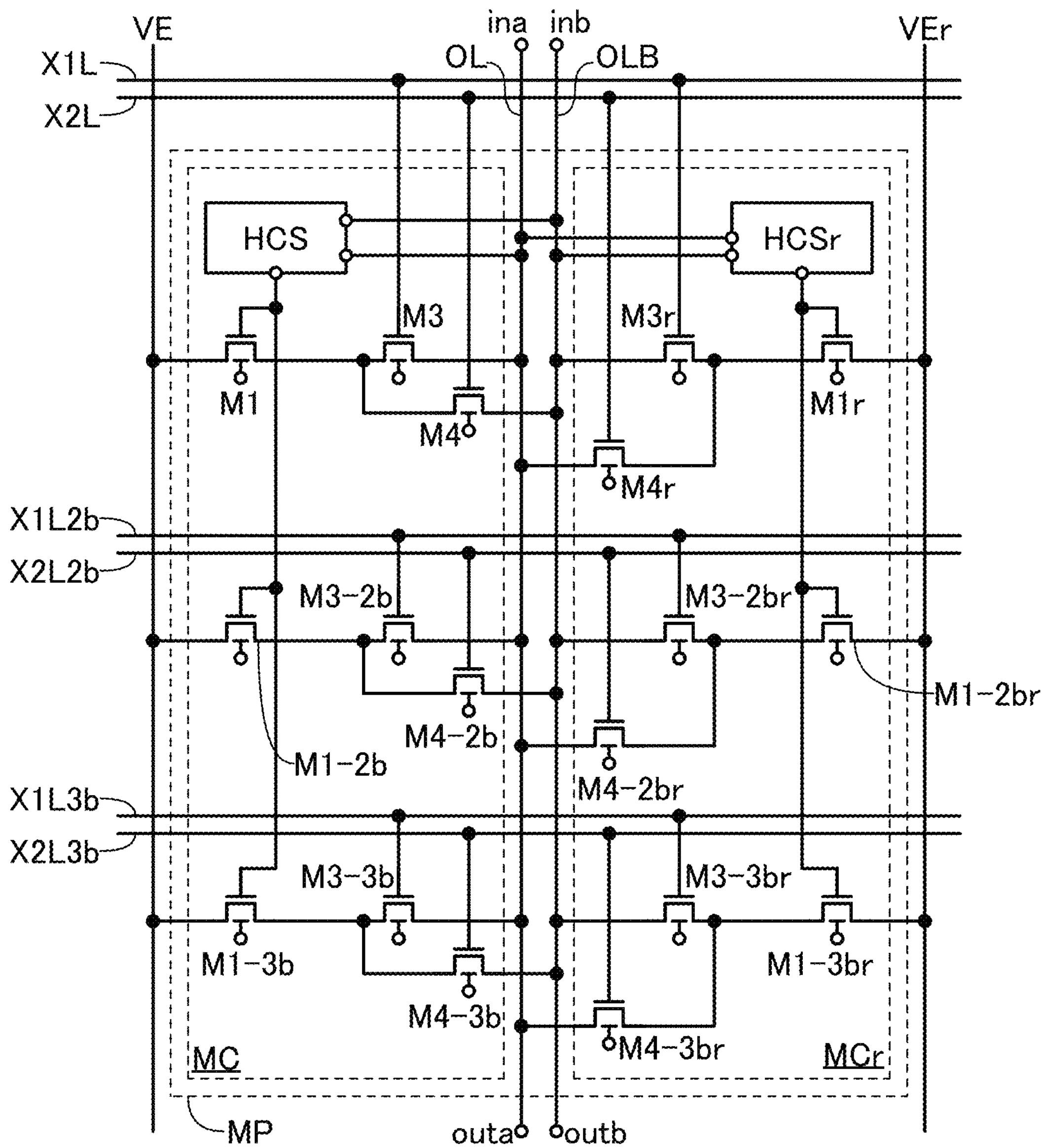
FIG. 29 is a circuit diagram illustrating a configuration example of a circuit included in a semiconductor device.
Figure 30A:
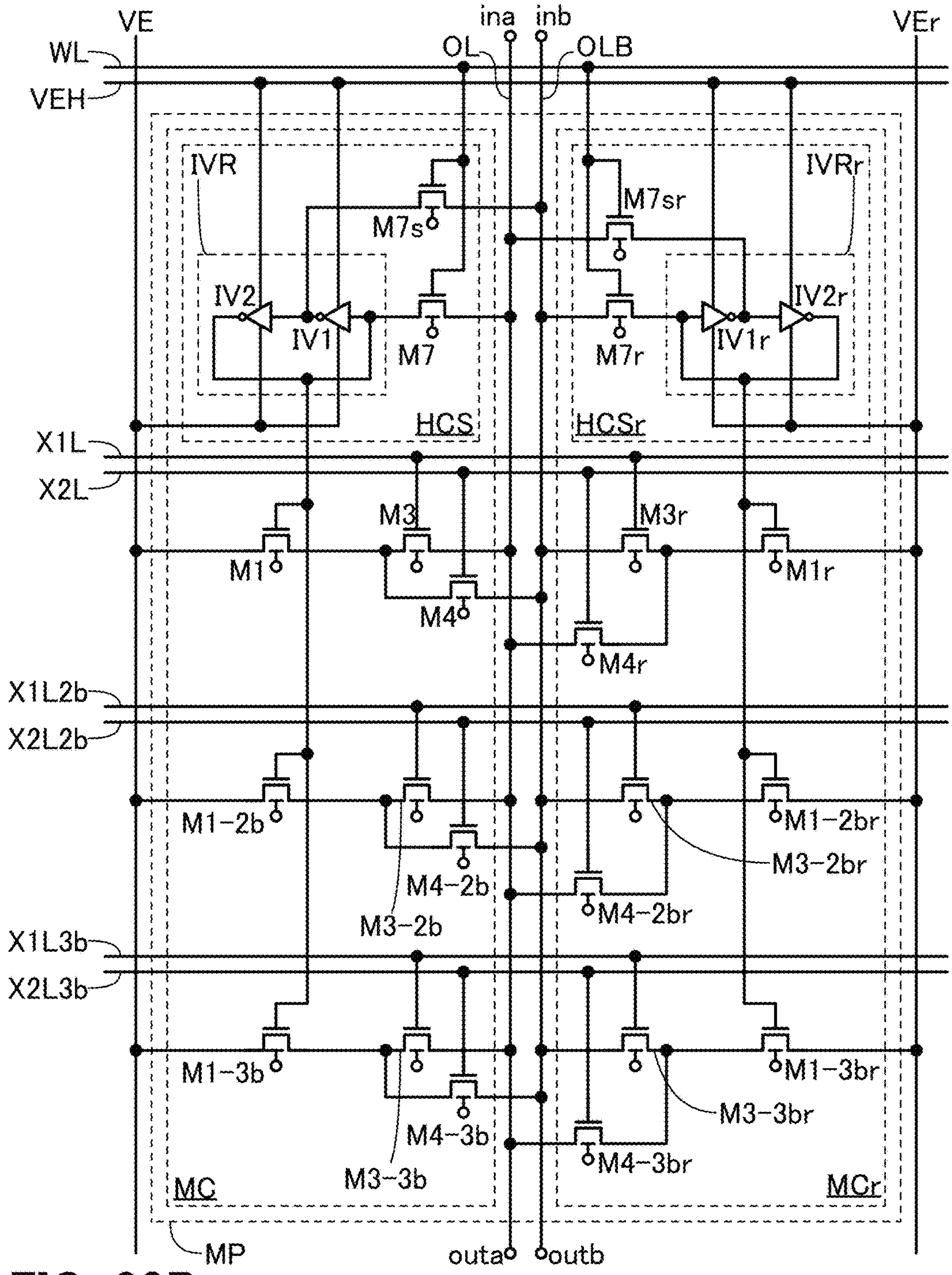
FIG. 30A and FIG. 30B are circuit diagrams each illustrating a configuration example of a circuit included in a semiconductor device.

FIG. 30A illustrates specific examples of the circuit HCS and the circuit HCSr included in the circuit MP illustrated in FIG. 29. The circuit HCS and the circuit HCSr illustrated in FIG. 30A each have a configuration including an SRAM (Static Random Access Memory), for example. Note that FIG. 30A illustrates the whole circuit MP to show the electrical connection configuration of the circuit elements included in the circuit HCS and the circuit HCSr.

Note that in the case where the circuit HCS and the circuit HCSr each have a configuration including an SRAM, the SRAM holds one of a high-level potential and a low-level potential; thus, the first data (a weight coefficient) set in the circuit MP is limited to having two levels (e.g., a combination of "−1" and "+1") or three levels (e.g., a combination of "−1", "0", and "+1"), for example. For example, when the first data (a weight coefficient) set in the circuit MP is "+1", a high-level potential is held in the circuit HCS and a low-level potential is held in the circuit HCSr. As another example, when the first data (a weight coefficient) set in the circuit MP is "−1", a low-level potential is held in the circuit HCS and a high-level potential is held in the circuit HCSr. As another example, when the first data (a weight coefficient) set in the circuit MP is "0", a low-level potential is held in the circuit HCS and a low-level potential is held in the circuit HCSr.

The circuit HCS includes a transistor M7, a transistor M7*s*, and an inverter loop circuit IVR. The inverter loop circuit IVR includes an inverter circuit IV1 and an inverter circuit IV2.

In this specification and the like, unless otherwise specified, the transistor M7 and the transistor M7*s* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M7 and the transistor M7*s* in an on state may operate in a saturation region or may operate in a subthreshold region. Alternatively, the transistor M7 and the transistor M7*s* may operate around the boundary between the saturation region and the subthreshold region. Alternatively, the transistor M7 and the transistor M7*s* may operate in both the linear region and the saturation region, may operate in both the saturation region and the subthreshold region, may operate in both the subthreshold region and the linear region, or may operate in the linear region, the saturation region, and the subthreshold region.

Figure 30B:
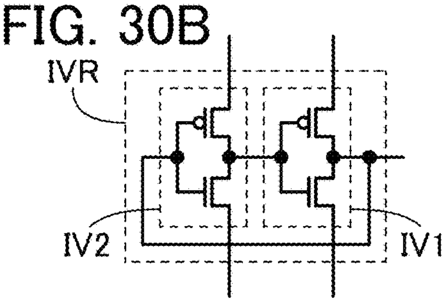

The inverter circuit IV1 and the inverter circuit IV2 each have a function of outputting, from its output terminal, an inverted signal of an input signal that is input to an input terminal. Thus, an inverter circuit can be used as each of the inverter circuit IV1 and the inverter circuit IV2, for example. FIG. 30B shows configuration examples of the inverter circuit IV1 and the inverter circuit IV2. As shown in FIG. 30B, the inverter circuit IV1 and the inverter circuit IV2 can each be configured as a CMOS (Complementary MOS) circuit. However, one embodiment of the present invention is not limited thereto, and for example, a single-polarity circuit formed of only n-channel transistors or only p-channel transistors may be used instead of a CMOS circuit.

Alternatively, the inverter circuit IV1 and the inverter circuit IV2 can each be a NAND circuit, a NOR circuit, an XOR circuit, or a circuit in which these are combined, for example. Specifically, in the case where the inverter circuit is replaced with a NAND circuit, a high-level potential is input to one of two input terminals of the NAND circuit as a fixed potential, so that the NAND circuit can function as an inverter circuit. In the case where the inverter circuit is replaced with a NOR circuit, a low-level potential is input to one of two input terminals of the NOR circuit as a fixed potential, so that the NOR circuit can function as an inverter circuit. In the case where the inverter circuit is replaced with an XOR circuit, a high-level potential is input to one of two input terminals of the XOR circuit as a fixed potential, so that the XOR circuit can function as an inverter circuit.

As described above, an inverter circuit described in this specification and the like can be replaced with a logic circuit such as a NAND circuit, a NOR circuit, an XOR circuit, or a circuit in which these are combined. Thus, in this specification and the like, the term "inverter circuit" can be referred to as a "logic circuit".

A first terminal of the transistor M7 is electrically connected to the wiring OL; a second terminal of the transistor M7 is electrically connected to the input terminal of the inverter circuit IV1, the output terminal of the inverter circuit IV2, the gate of the transistor M1, the gate of the transistor M1-2*b*, and the gate of the transistor M1-3*b*; and agate of the transistor M7 is electrically connected to the wiring WL. A first terminal of the transistor M7*s* is electrically connected to the wiring OLB, a second terminal of the transistor M7*s* is electrically connected to the output terminal of the inverter circuit IV1 and the input terminal of the inverter circuit IV2, and a gate of the transistor M7*s* is electrically connected to the wiring WL. A wiring VEH is electrically connected to high power supply potential input terminals of the inverter circuit IV1 and the inverter circuit IV2, and the wiring VE is electrically connected to low power supply potential input terminals of the inverter circuit IV1 and the inverter circuit IV2.

The wiring VEH functions as a wiring for supplying a constant voltage, for example. The constant voltage can be, for example, VDD that is a high-level potential, or VDDL that is a potential higher than the low-level potential VSS and lower than VDD. The constant voltage is preferably set as appropriate in accordance with the configuration of the circuit MP. Alternatively, the wiring VAL may be supplied with not a constant voltage but a pulse signal, for example. Note that in the description of this configuration example, the wiring VEH functions as a wiring for supplying the potential VDD.

Note that in the circuit MP in FIG. 30A, the circuit HCS has substantially the same circuit configuration as the circuit HCSr. Thus, "r" is added to the reference numerals of the circuit elements included in the circuit HCSr to differentiate them from the circuit elements included in the circuit HCS. In addition, a first terminal of a transistor M7*r* is electrically connected to the wiring OLB and a first terminal of a transistor M7*sr* is electrically connected to the wiring OL.

When information (e.g., a potential or a current) is written to the circuit HCS and the circuit HCSr, a high-level potential is applied to the wiring WL so that the transistor M7, the transistor M7*s*, the transistor M7*r*, and the transistor M7*sr* are turned on. After that, one of a high-level potential and a low-level potential is input to the wiring OL and the other of the high-level potential and the low-level potential is input to the wiring OLB. It is particularly preferable that the high-level potential be almost equal to a potential supplied from the wiring VEH. Here, the high-level potential is described as the potential VDDL and the low-level potential is described as the potential VSS, for example.

After one of VDDL and VSS is written to the circuit HCS and the other of VDDL and VSS is written to the circuit HCSr, a low-level potential is applied to the wiring WL so that the transistor M7, the transistor M7*s*, the transistor M7*r*, and the transistor M7*sr* are turned off. Accordingly, the circuit HCS can hold one of VDDL and VSS in the inverter loop circuit IVR and the circuit HCSr can hold the other of VDDL and VSS in an inverter loop circuit IVRr.

After a predetermined potential is held in each of the circuit HCS and the circuit HCSr, as in the circuit MP in FIG. 26, the amount of current flowing from the circuit MC or the circuit MCr to the wiring OL or the wiring OLB can be processed as the product of the binary or ternary first data (a weight coefficient) and the multilevel (15-level in the configuration example in FIG. 30A) second data (a value of a signal of a neuron) in accordance with a combination of potentials input to the wiring X1L (the wiring WX1L in FIG. 26), the wiring X2L, the wiring X1L2*b*, the wiring X2L2*b*, the wiring X1L3*b*, and the wiring X2L3*b*.

Figure 31:
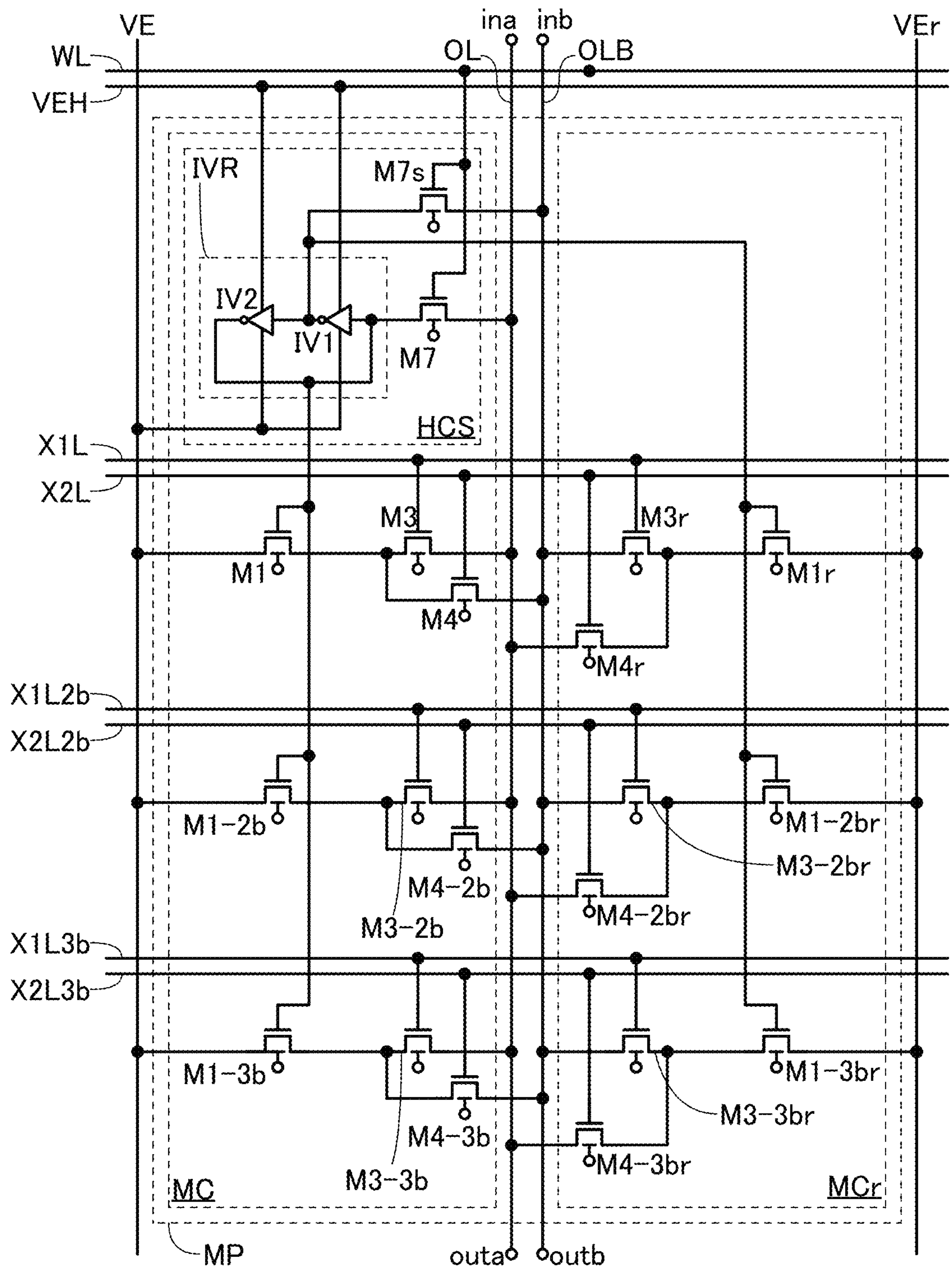
FIG. 31 is a circuit diagram illustrating a configuration example of a circuit included in a semiconductor device.

The circuit MP in FIG. 30A can be changed into the circuit MP illustrated in FIG. 31, for example. The circuit MP in FIG. 31 has a configuration in which the circuit HCSr is removed from the circuit MP in FIG. 30A. As a specific configuration, the output terminal of the inverter circuit IV1 included in the inverter loop circuit IVR is electrically connected to the gate of the transistor M1*r* of the circuit MCr, the gate of the transistor M1-2*br* of the circuit MCr, and the gate of the transistor M1-3*br* of the circuit MCr.

The circuit MP having the configuration in FIG. 31 can operate in a manner similar to that of the circuit MP in FIG. 30A. Since the circuit MP in FIG. 31 has a configuration in which the circuit HCSr is removed from the circuit MP in FIG. 30A, the power consumption can be lower than that of the circuit MP in FIG. 30A.

Figure 32:
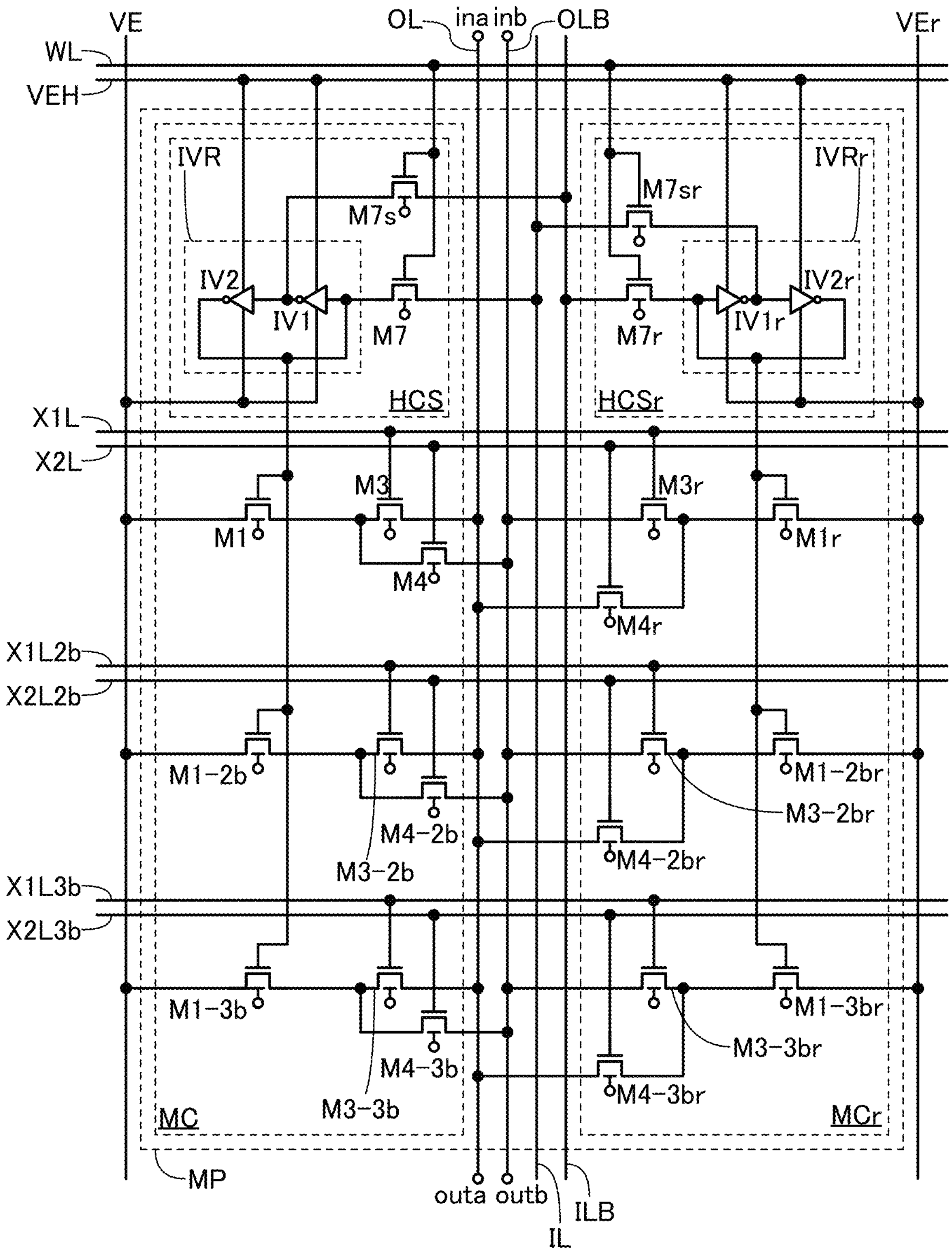
FIG. 32 is a circuit diagram illustrating a configuration example of a circuit included in a semiconductor device.

The circuit MP in FIG. 30A can be changed into the circuit MP illustrated in FIG. 32, for example. The circuit MP in FIG. 32 has a configuration in which the wiring IL and the wiring ILB are added to the circuit MP in FIG. 30A, like the circuits MP in FIG. 22A and FIG. 22B.

The circuit MP in FIG. 32 has a configuration in which the wiring OL and the wiring OLB of the circuit MP in FIG. 30A are each divided according to the functions.

Specifically, the wiring OL of the circuit MP in FIG. 30A functions as a wiring for inputting a high-level potential or a low-level potential to the circuit HCS, functions as a wiring for supplying a current to the wiring VE through the circuit MC, and functions as a wiring for supplying a current to the wiring VEr through the circuit MCr. In addition, the wiring OLB of the circuit MP in FIG. 30A functions as a wiring for inputting a high-level potential or a low-level potential to the circuit HCSr, functions as a wiring for supplying a current to the wiring VE through the circuit MC, and functions as a wiring for supplying a current to the wiring VEr through the circuit MCr.

In contrast, the wiring OL of the circuit MP in FIG. 32 functions as a wiring for supplying a current to the wiring VE through the circuit MC and functions as a wiring for supplying a current to the wiring VEr through the circuit MCr. The wiring OLB of the circuit MP in FIG. 32 functions as a wiring for supplying a current to the wiring VE through the circuit MC and functions as a wiring for supplying a current to the wiring VEr through the circuit MCr. The wiring IL of the circuit MP in FIG. 32 functions as a wiring for inputting one of a high-level potential and a low-level potential to the circuit HCS, and the wiring ILB of the circuit MP in FIG. 32 functions as a wiring for inputting the other of the high-level potential and the low-level potential to the circuit HCSr.

The circuit MP having the configuration in FIG. 32 can operate in a manner similar to that of the circuit MP in FIG. 30A.

Figure 33:
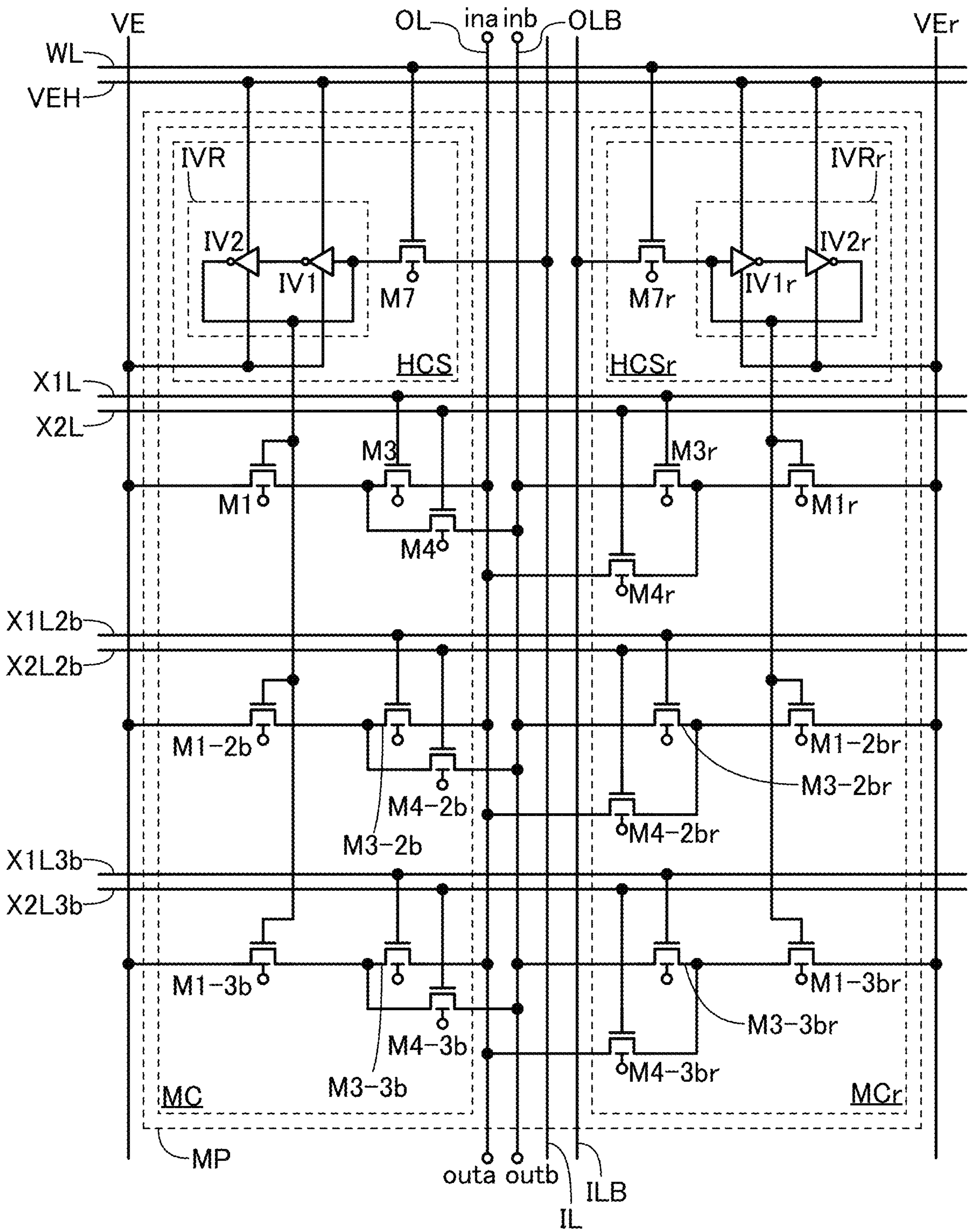
FIG. 33 is a circuit diagram illustrating a configuration example of a circuit included in a semiconductor device.

In the case where the configuration of the circuit MP in FIG. 32 is applied to the arithmetic circuit 110 in FIG. 2 or the arithmetic circuit 120 in FIG. 3, the circuit MP in FIG. 32 may have a configuration in which the transistor M7*s* and the transistor M7*sr* are removed as in the circuit MP illustrated in FIG. 33, for example. The circuit MP having the configuration in FIG. 33 can operate in a manner similar to that of the circuit MP in FIG. 30A.

Figure 34:
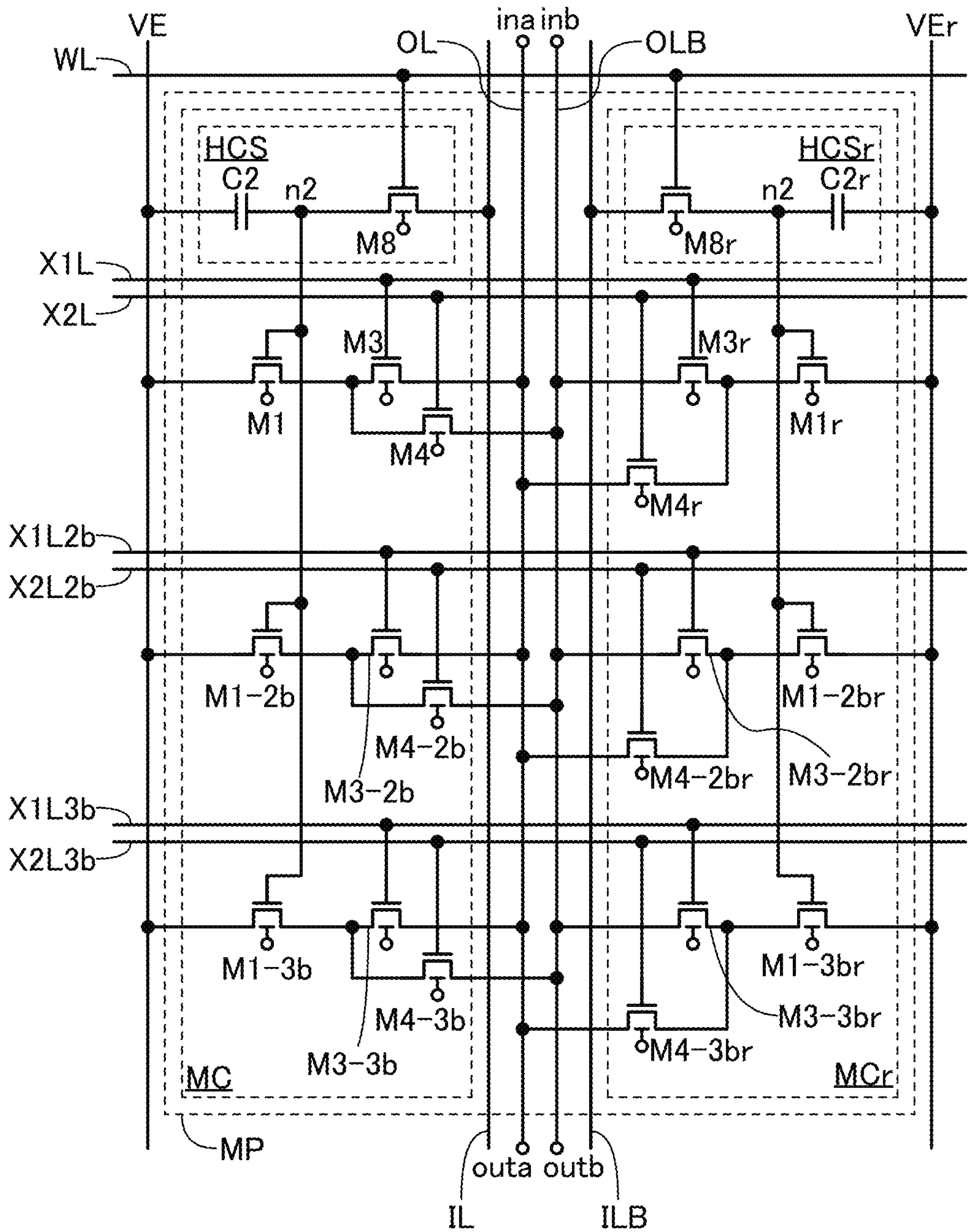
FIG. 34 is a circuit diagram illustrating a configuration example of a circuit included in a semiconductor device.

FIG. 34 shows specific examples of the circuit HCS and the circuit HCSr included in the circuit MP illustrated in FIG. 29, which are different from those in FIG. 30A. The circuit MP illustrated in FIG. 34 has a configuration including a memory circuit called a NOSRAM (Nonvolatile Oxide Semiconductor Random Access Memory) (registered trademark). Note that FIG. 34 illustrates the whole circuit MP to show the electrical connection configuration of the circuit elements included in the circuit HCS and the circuit HCSr.

The circuit HCS includes a transistor M8 and a capacitor C2.

In this specification and the like, unless otherwise specified, the transistor M8 in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M8 in an on state may operate in a saturation region or may operate in a subthreshold region. Alternatively, the transistor M8 may operate around the boundary between the saturation region and the subthreshold region. Alternatively, the transistor M8 may operate in both the linear region and the saturation region, may operate in both the saturation region and the subthreshold region, may operate in both the subthreshold region and the linear region, or may operate in the linear region, the saturation region, and the subthreshold region.

A first terminal of the transistor M8 is electrically connected to the wiring IL; a second terminal of the transistor M8 is electrically connected to a first terminal of the capacitor C2, the gate of the transistor M1, the gate of the transistor M1-2*b*, and the gate of the transistor M1-3*b*; and a gate of the transistor M8 is electrically connected to the wiring WL. A second terminal of the capacitor C2 is electrically connected to the wiring VE.

Note that in the circuit HCS illustrated in FIG. 34, an electrical connection point of the second terminal of the transistor M8 and the first terminal of the capacitor C2 is a node n2.

In the circuit MP in FIG. 34, the circuit HCSr has substantially the same circuit configuration as the circuit HCS. Thus, "r" is added to the reference numerals of the circuit elements and the like included in the circuit HCSr to differentiate them from the circuit elements and the like included in the circuit HCS. A first terminal of a transistor M8*r* is electrically connected to the wiring ILB.

Note that in the case where the circuit HCS and the circuit HCSr each have a configuration including a NOSRAM, one of a high-level potential and a low-level potential can be held in each of the circuit HCS and the circuit HCSr. Thus, the first data (a weight coefficient) set in the circuit MP is limited to having two levels (e.g., "−1" and "+1") or three levels (e.g., "−1", "0", and "+1"), for example. For example, when the first data (a weight coefficient) set in the circuit MP is "+1", a high-level potential is held in the circuit HCS and a low-level potential is held in the circuit HCSr. As another example, when the first data (a weight coefficient) set in the circuit MP is "−1", a low-level potential is held in the circuit HCS and a high-level potential is held in the circuit HCSr. As another example, when the first data (a weight coefficient) set in the circuit MP is "0", a low-level potential is held in the circuit HCS and a low-level potential is held in the circuit HCSr. Note that instead of a binary value (a digital value) of a high-level potential or a low-level potential, a ternary or higher-level digital value or an analog value may be held in the circuit HCS and the circuit HCSr.

When information (a potential here) is written to the circuit HCS and the circuit HCSr, a high-level potential is applied to the wiring WL so that the transistor M8 and the transistor M8*r* are turned on. After that, one of a high-level potential and a low-level potential is input to the wiring IL and the other of the high-level potential and the low-level potential is input to the wiring ILB. Here, the high-level potential is described as the potential VDDL and the low-level potential is described as the potential VSS, for example.

After one of VDDL and VSS is written to the first terminal of the capacitor C2 of the circuit HCS and the other of VDDL and VSS is written to a first terminal of a capacitor C2*r* of the circuit HCSr, a low-level potential is applied to the wiring WL so that the transistor M8 and the transistor M8*r* are turned off. Accordingly, the circuit HCS can hold one of VDDL and VSS at the node n2 and the circuit HCSr can hold the other of VDDL and VSS at the node n2*r*.

After a predetermined potential is held in each of the circuit HCS and the circuit HCSr, as in the circuit MP in FIG. 26, the amount of current flowing from the circuit MC or the circuit MCr to the wiring OL or the wiring OLB can be processed as 3-bit data in accordance with a combination of potentials input to the wiring X1L (the wiring WX1L in FIG. 26), the wiring X2L, the wiring X1L2*b*, the wiring X2L2*b*, the wiring X1L3*b*, and the wiring X2L3*b*.

The circuit MP having the configuration in FIG. 34 can operate in a manner similar to that of the circuit MP in FIG. 30A.

Although the circuits MP illustrated in FIG. 29 to FIG. 34 each have a configuration including one circuit HCS and one circuit HCSr, the circuit MP may have a configuration including a plurality of circuits HCS and a plurality of circuits HCSr.

Figure 35:
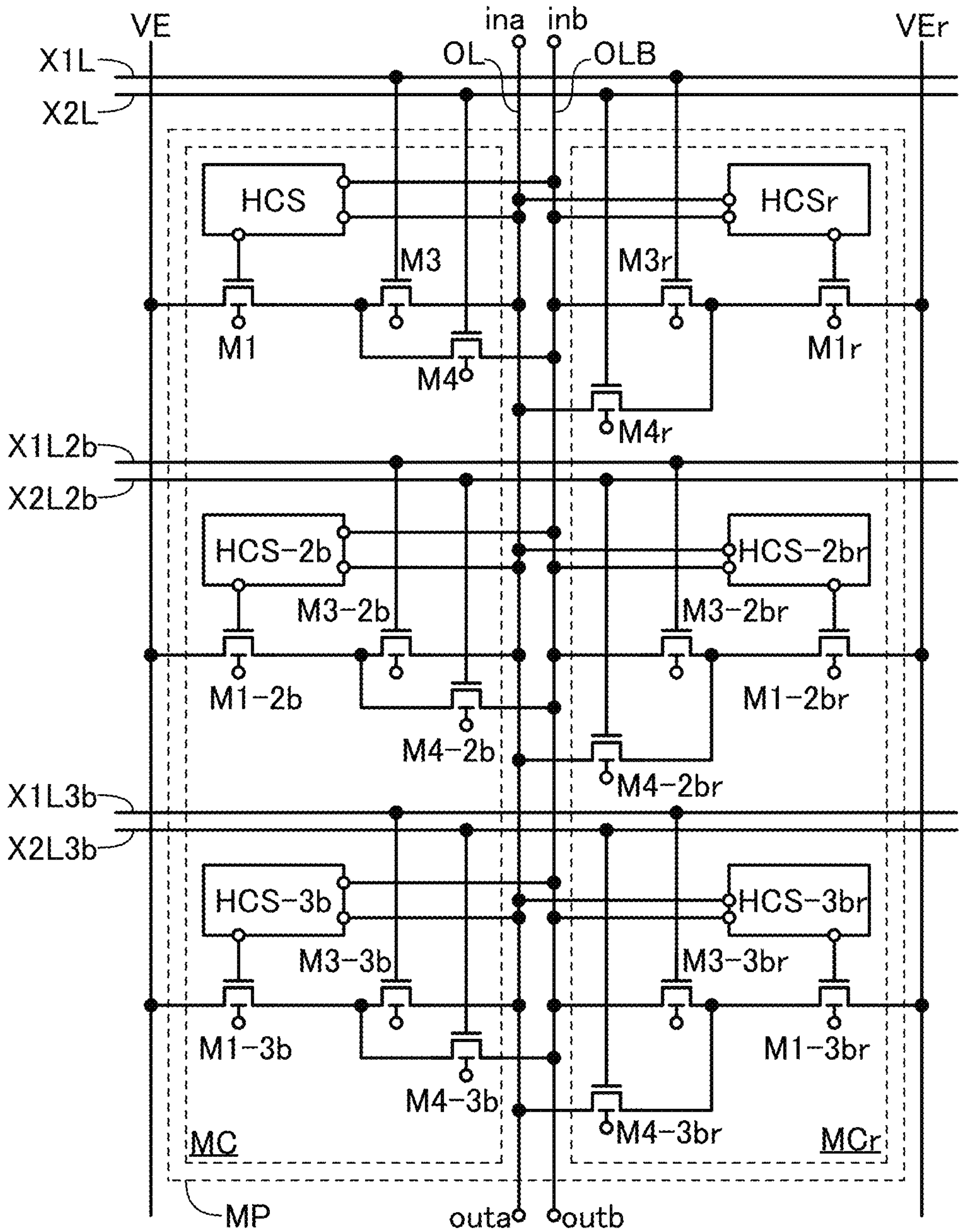
FIG. 35 is a circuit diagram illustrating a configuration example of a circuit included in a semiconductor device.

The circuit MP illustrated in FIG. 35 includes a circuit HCS-2*b* and a circuit HCS-3*b* having a function similar to that of the circuit HCS, and a circuit HCS-2*br* and a circuit HCS-3*br* having a function similar to that of the circuit HCSr. Specifically, the circuit HCS-2*b*, the circuit HCS-3*b*, the circuit HCS-2*br*, and the circuit HCS-3*br* have a function of receiving information (a potential, a current, or the like) input from one or both of the wiring OL and the wiring OLB and holding a potential corresponding to the information. In particular, the circuit HCS-2*b* has a function of applying the held potential to the gate of the transistor M1-2*b*, the circuit HCS-3*b* has a function of applying the held potential to the gate of the transistor M1-3*b*, the circuit HCS-2*br* has a function of applying the held potential to the gate of the transistor M1-2*br*, and the circuit HCS-3*br* has a function of applying the held potential to the gate of the transistor M1-3*br*.

The circuit HCS, the circuit HCS-2*b*, the circuit HCS-3*b*, the circuit HCSr, the circuit HCS-2*br*, and the circuit HCS-3*br* may all have a configuration including an SRAM or a configuration including a NOSRAM, for example. Alternatively, one or more circuits selected from the circuit HCS, the circuit HCS-2*b*, the circuit HCS-3*b*, the circuit HCSr, the circuit HCS-2*br*, and the circuit HCS-3*br* may have a configuration including an SRAM and the other circuits may have a configuration including a NOSRAM.

Although the circuit HCS, the circuit HCS-2*b*, the circuit HCS-3*b*, the circuit HCSr, the circuit HCS-2*br*, and the circuit HCS-3*br* included in the circuit MP in FIG. 35 are electrically connected to the wiring OL and the wiring OLB, the configuration of the circuit MP of one embodiment of the present invention is not limited thereto. For example, in the circuit MP in FIG. 35, the wirings IL and ILB may be provided and the circuit HCS, the circuit HCS-2*b*, and HCS-3*b* may be electrically connected to the wiring IL and the wiring ILB, as in the circuit MP in FIG. 32. Alternatively, for example, in the circuit MP in FIG. 35, the wiring IL and the wiring ILB may be provided; the circuit HCS, the circuit HCS-2*b*, and HCS-3*b* may be electrically connected to the wiring IL; and the circuit HCSr, the circuit HCS-2*br*, and the circuit HCS-3*br* may be electrically connected to the wiring ILB, as in the circuits MP in FIG. 33 and FIG. 34.

Note that this configuration example can be combined with any of the other configuration examples and the like described in this specification as appropriate.

Configuration Example 6

Figure 36:
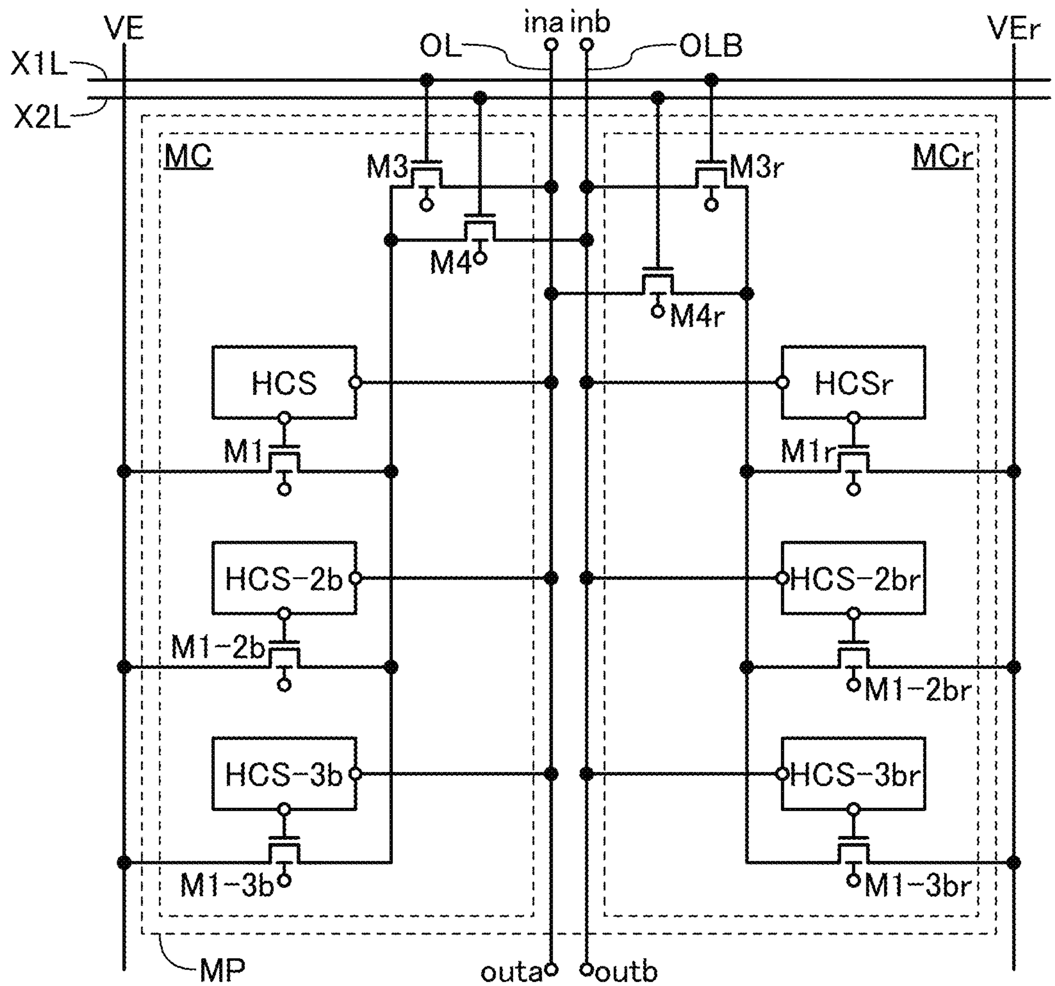
FIG. 36 is a circuit diagram illustrating a configuration example of a circuit included in a semiconductor device.

FIG. 36 shows an example of the circuit MP that includes the circuit HCS, the circuit HCS-2*b*, the circuit HCS-3*b*, the circuit HCSr, the circuit HCS-2*br*, and the circuit HCS-3*br* as a plurality of holding portions and has a circuit configuration different from that of the circuit MP in FIG. 35.

When the ratio of the W length to the L length of the transistor M1 included in the circuit MP in FIG. 36 is W/L, the ratio of the W length to the L length of the transistor M1-2*b* is preferably 2×W/L and the ratio of the W length to the L length of the transistor M1-3*b* is preferably 4×W/L. Furthermore, the size of the transistor M1*r* is preferably equal to that of the transistor M1, the size of the transistor M1-2*br* is preferably equal to that of the transistor M1-2*b*, and the size of the transistor M1-3*br* is preferably equal to that of the transistor M1-3*b*.

The circuit HCS is electrically connected to the wiring OL and the gate of the transistor M1, the circuit HCS-2*b* is electrically connected to the wiring OL and the gate of the transistor M1-2*b*, and the circuit HCS-3*b* is electrically connected to the wiring OL and the gate of the transistor M1-3*b*.

The first terminals of the transistor M1, the transistor M1-2*b*, and the transistor M1-3*b* are electrically connected to the wiring VE, and the first terminal of the transistor M3 is electrically connected to the first terminal of the transistor M4 and the second terminals of the transistor M1, the transistor M1-2*b*, and the transistor M1-3*b*. The second terminal of the transistor M3 is electrically connected to the wiring OL, and the gate of the transistor M3 is electrically connected to the wiring X1L. The second terminal of the transistor M4 is electrically connected to the wiring OLB, and the gate of the transistor M4 is electrically connected to the wiring X2L.

In the circuit MP in FIG. 36, the circuit MCr has substantially the same circuit configuration as the circuit MC. Thus, "r" is added to the reference numerals of the circuit elements and the like included in the circuit MCr to differentiate them from the circuit elements and the like included in the circuit MC. The second terminal of the transistor M3*r* is electrically connected to the wiring OLB, and the second terminal of the transistor M4*r* is electrically connected to the wiring OL.

When a low-level potential, e.g., VSS, is held in the circuit HCSr, the circuit HCS-2*br*, and the circuit HCS-3*br* included in the circuit MCr, the transistor M1*r*, the transistor M1-2*br*, and the transistor M1-3*br* can be turned off. Here, when a high-level potential or a low-level potential is held in each of the circuit HCS, the circuit HCS-2*b*, and the circuit HCS-3*b* included in the circuit MC, the amounts of currents flowing through the transistor M1, the transistor M1-2*b*, and the transistor M1-3*b* are determined in accordance with the potentials held in the circuit HCS, the circuit HCS-2*b*, and the circuit HCS-3*b*, respectively. After that, the currents can flow from the wiring OL to the wiring VE through the circuit MC by turning on the transistor M3 and turning off the transistor M4. Alternatively, the currents can flow from the wiring OLB to the wiring VE through the circuit MC by turning off the transistor M3 and turning on the transistor M4.

When a low-level potential, e.g., VSS, is held in the circuit HCS, the circuit HCS-2*b*, and the circuit HCS-3*b* included in the circuit MC, the transistor M1, the transistor M1-2*b*, and the transistor M1-3*b* can be turned off. Here, when a high-level potential or a low-level potential is held in each of the circuit HCSr, the circuit HCS-2*br*, and the circuit HCS-3*br* included in the circuit MCr, the amounts of currents flowing through the transistor M1*r*, the transistor M1-2*br*, and the transistor M1-3*br* are determined in accordance with the potentials held in the circuit HCSr, the circuit HCS-2*br*, and the circuit HCS-3*br*, respectively. After that, the currents can flow from the wiring OLB to the wiring VEr through the circuit MCr by turning on the transistor M3*r* and turning off the transistor M4*r*. Alternatively, the currents can flow from the wiring OL to the wiring VEr through the circuit MCr by turning off the transistor M3*r* and turning on the transistor M4*r*.

In the case where the positive first data (e.g., a weight coefficient here) is held in the circuit MP in FIG. 36, for example, a low-level potential is held in the circuit HCSr, the circuit HCS-2*br*, and the circuit HCS-3*br*, and a combination of potentials corresponding to the positive first data (a weight coefficient) is held in each of the circuit HCS, the circuit HCS-2*b*, and the circuit HCS-3*b*. In the case where the negative first data (a weight coefficient) is held in the circuit MP in FIG. 36, for example, a low-level potential is held in the circuit HCS, the circuit HCS-2*b*, and the circuit HCS-3*b*, and a combination of potentials corresponding to the negative first data (a weight coefficient) is held in each of the circuit HCSr, the circuit HCS-2*br*, and the circuit HCS-3*br*.

Figure 37:
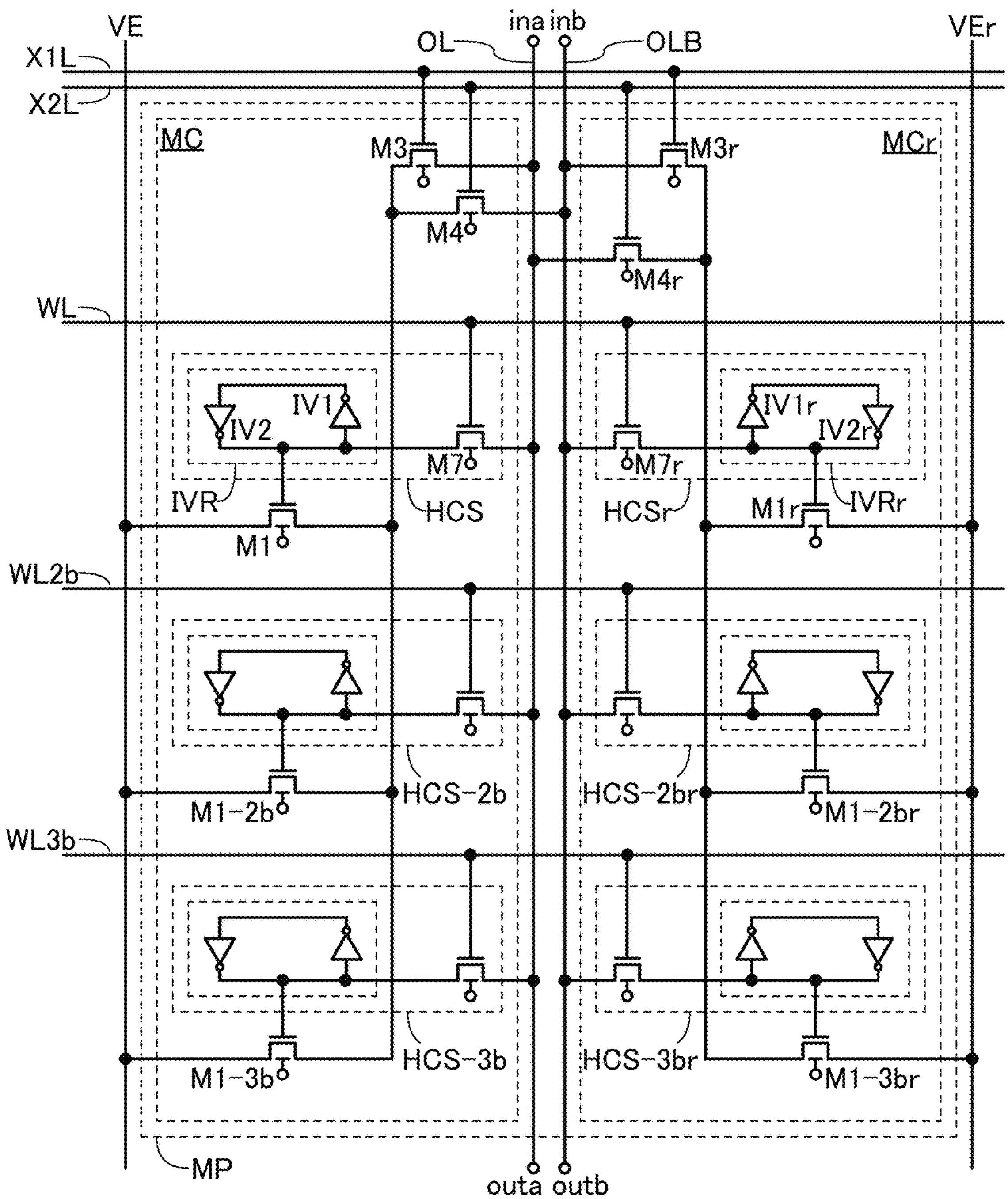
FIG. 37 is a circuit diagram illustrating a configuration example of a circuit included in a semiconductor device.

FIG. 37 shows specific examples of the circuit HCS, the circuit HCS-2*b*, the circuit HCS-3*b*, the circuit HCSr, the circuit HCS-2*br*, and the circuit HCS-3*br* included in the circuit MP illustrated in FIG. 36. The circuit HCS, the circuit HCS-2*b*, the circuit HCS-3*b*, the circuit HCSr, the circuit HCS-2*br*, and the circuit HCS-3*br* illustrated in FIG. 37 each have a configuration including an SRAM. Note that the high power supply potential input terminals and the low power supply potential input terminals of the inverter circuit IV1 and the inverter circuit IV2 are not illustrated in FIG. 37. In addition, for the configurations of the circuit HCS, the circuit HCS-2*b*, the circuit HCS-3*b*, the circuit HCSr, the circuit HCS-2*br*, and the circuit HCS-3*br* illustrated in FIG. 37, the description of the circuit HCS and the circuit HCSr included in the circuit MP in FIG. 30A is referred to.

Figure 38:
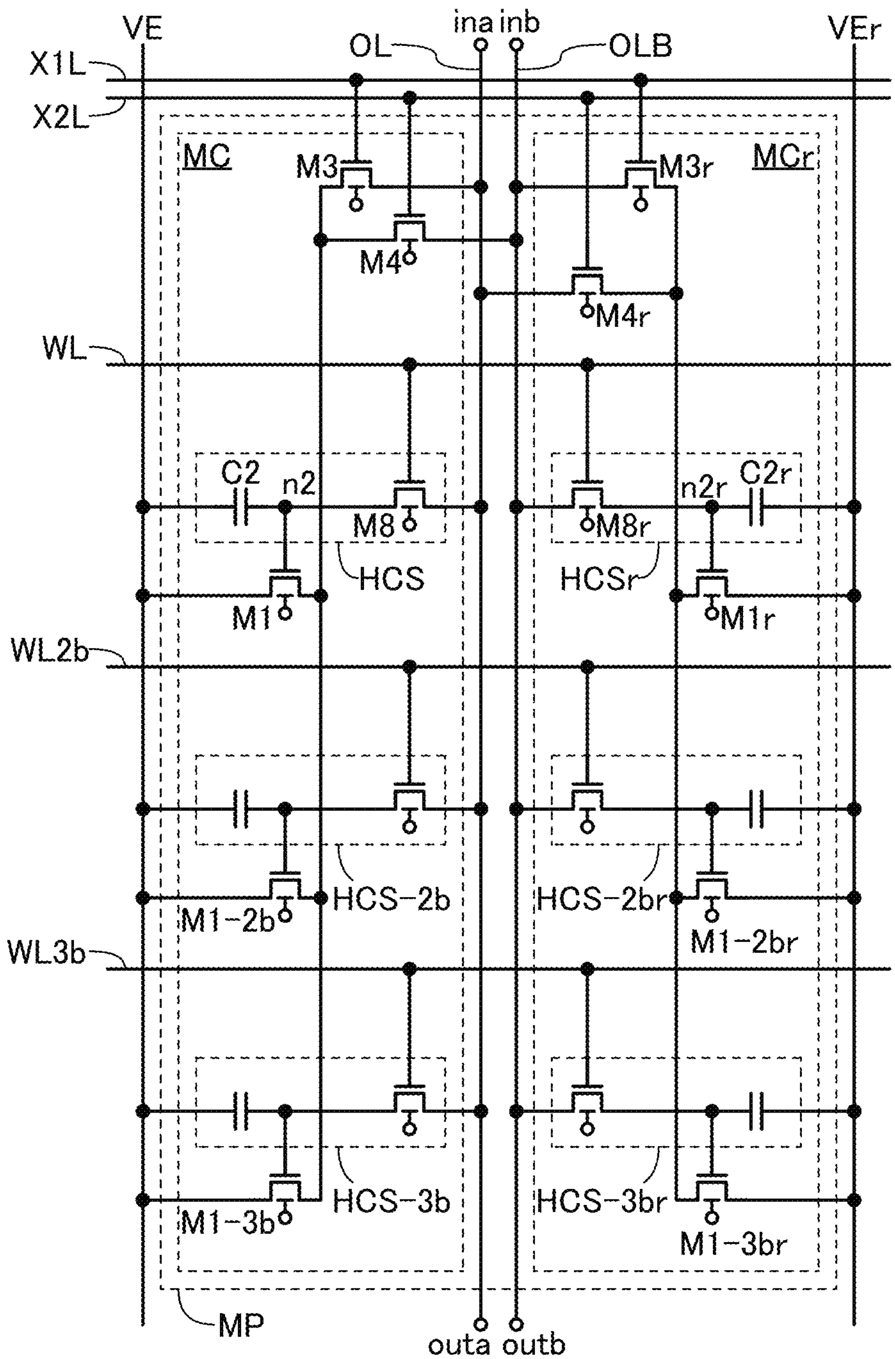
FIG. 38 is a circuit diagram illustrating a configuration example of a circuit included in a semiconductor device.

As a specific example different from that in FIG. 37, the circuit HCS, the circuit HCS-2*b*, the circuit HCS-3*b*, the circuit HCSr, the circuit HCS-2*br*, and the circuit HCS-3*br* included in the circuit MP illustrated in FIG. 36 may each have a configuration including a NOSRAM, as illustrated in FIG. 38. Note that for the configurations of the circuit HCS, the circuit HCS-2*b*, the circuit HCS-3*b*, the circuit HCSr, the circuit HCS-2*br*, and the circuit HCS-3*br* illustrated in FIG. 38, the description of the circuit HCS and the circuit HCSr included in the circuit MP in FIG. 34 is referred to.

Figure 39:
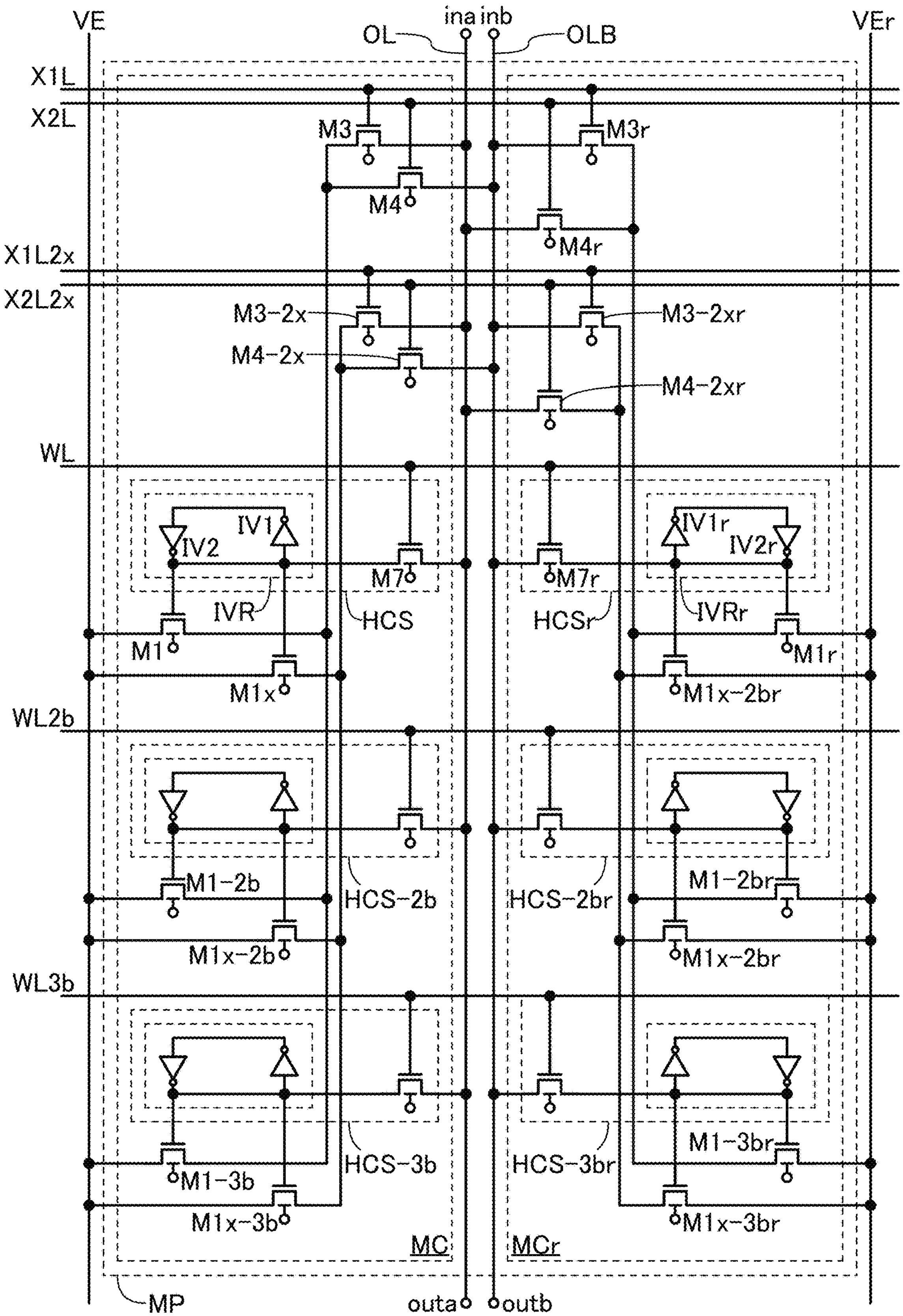
FIG. 39 is a circuit diagram illustrating a configuration example of a circuit included in a semiconductor device.

The circuit MP in FIG. 36 can be changed into the circuit MP illustrated in FIG. 39, for example. The circuit MP in FIG. 39 is a circuit that can process the multilevel second data (e.g., a value of a signal of a neuron (an arithmetic value) here), like the circuits MP illustrated in FIG. 26 to FIG. 35. The circuit MP in FIG. 39 has a configuration in which a transistor M3-2*x*, a transistor M4-2*x*, a transistor Mix, a transistor M1*x*-2*b*, and a transistor M1*x*-3*b* are added to the circuit MC included in the circuit MP in FIG. 36. As an example, the circuit HCS, the circuit HCS-2*b*, the circuit HCS-3*b*, the circuit HCSr, the circuit HCS-2*br*, and the circuit HCS-3*br* included in the circuit MP in FIG. 39 each have a configuration including an SRAM, as illustrated in FIG. 37.

In this specification and the like, unless otherwise specified, the transistor Mix, the transistor M1*x*-2*b*, and the transistor M1*x*-3*b* in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor Mix, the transistor M1*x*-2*b*, and the transistor M1*x*-3*b* may operate in a linear region to reduce the amplitude value of a voltage to be supplied. To reduce the amount of current flowing through the transistor Mix, the transistor Mix-2*b*, and the transistor Mix-3*b*, the transistor Mix, the transistor Mix-2*b*, and the transistor Mix-3*b* may operate in a subthreshold region. Alternatively, the transistor Mix, the transistor Mix-2*b*, and the transistor Mix-3*b* may operate around the boundary between the saturation region and the subthreshold region. Note that in the case where the first data (a weight coefficient) is an analog value, for example, the transistor Mix, the transistor Mix-2*b*, and the transistor Mix-3*b* may operate in the linear region, the saturation region, and the subthreshold region depending on the cases in accordance with the magnitude of the first data (weight coefficient). Alternatively, the transistor Mix, the transistor Mix-2*b*, and the transistor Mix-3*b* may operate in both the linear region and the saturation region, may operate in both the subthreshold region and the linear region, or may operate in both the saturation region and the subthreshold region.

In this specification and the like, unless otherwise specified, the transistor M3-2*x* and the transistor M4-2*x* in an on state may operate in a saturation region in the end, like the transistor M3 and the transistor M4. In other words, the gate voltage, the source voltage, and the drain voltage of each of the above transistors may be appropriately biased to voltages in the range where the transistor operates in the linear region. However, one embodiment of the present invention is not limited thereto. For example, the transistor M3-2*x* and the transistor M4-2*x* in an on state may operate in a saturation region or may operate in a subthreshold region. Alternatively, the transistor M3-2*x* and the transistor M4-2*x* may operate around the boundary between the saturation region and the subthreshold region. Alternatively, the transistor M3-2$x$ and the transistor M4-2$x$ may operate in both the linear region and the saturation region, may operate in both the saturation region and the subthreshold region, may operate in both the subthreshold region and the linear region, or may operate in the linear region, the saturation region, and the subthreshold region.

The ratio of the W length to the L length of the transistor Mix included in the circuit MP in FIG. 39 is preferably 2×W/L. The ratio of the W length to the L length of the transistor Mix-2$b$ is preferably 4×W/L. The ratio of the W length to the L length of the transistor M1$x$-3$b$ is preferably 8×W/L. In the case of providing more transistors, the ratio of the W length to the L length can be increased to be a power of two in a similar manner.

First terminals of the transistor Mix, the transistor M1$x$-2$b$, and the transistor M1$x$-3$b$ are electrically connected to the wiring VE. Agate of the transistor Mix is electrically connected to the circuit HCS, a gate of the transistor M1$x$-2$b$ is electrically connected to the circuit HCS-2$b$, and a gate of the transistor M1$x$-3$b$ is electrically connected to the circuit HCS-3$b$. A first terminal of the transistor M3-2$x$ is electrically connected to a first terminal of the transistor M4-2$x$ and second terminals of the transistor Mix, the transistor M1$x$-2$b$, and the transistor M1$x$-3$b$. A second terminal of the transistor M3-2$x$ is electrically connected to the wiring OL, and a gate of the transistor M3-2$x$ is electrically connected to a wiring X1L2$x$. A second terminal of the transistor M4-2$x$ is electrically connected to the wiring OLB, and a gate of the transistor M4-2$x$ is electrically connected to a wiring X2L2$x$.

Note that in the circuit MP in FIG. 39, the circuit HCSr has substantially the same circuit configuration as the circuit HCS. Thus, "r" is added to the reference numerals of the circuit elements and the like included in the circuit HCSr to differentiate them from the circuit elements and the like included in the circuit HCS. In addition, a second terminal of a transistor M3-2$xr$ is electrically connected to the wiring OLB, and a second terminal of a transistor M4-2$xr$ is electrically connected to the wiring OL.

The wiring X1L2$x$ is a wiring for switching the on state and the off state of the transistor M3-2$x$ and the transistor M3-2$xr$, and the wiring X2L2$x$ is a wiring for switching the on state and the off state of the transistors M4-2$x$ and M4-2$xr$.

When a high-level potential, e.g., VDDL, is held in the circuit HCS, the current amount of ut is supplied between the source and the drain of the transistor M1. Here, when a high-level potential, e.g., VDDL, is held in the circuit HCS-2$b$, the amount of current flowing between the source and the drain of the transistor M1-2$b$ is $2I_{ut}$ because the ratio of the W length to the L length of the transistor M1-2$b$ is twice as high as the ratio of the W length to the L length of the transistor M1. When a high-level potential, e.g., VDDL, is held in the circuit HCS-3$b$, the amount of current flowing between the source and the drain of the transistor M1-3$b$ is $4I_{ut}$ because the ratio of the W length to the L length of the transistor M1-3$b$ is four times as high as the ratio of the W length to the L length of the transistor M1.

That is, a current flowing from the electrical connection point of the first terminal of the transistor M3 and the first terminal of the transistor M4 to the wiring VE through the circuit MC change from 0 to $7I_{ut}$ in steps of ut, in accordance with the potentials held in the circuit HCS, the circuit HCS-2$b$, and the circuit HCS-3$b$. Here, the amount of the current is referred to as $I_{X1}$.

When a high-level potential, e.g., VDDL, is held in the circuit HCS, the current amount of $2I_{ut}$ is supplied between the source and the drain of the transistor Mix because the ratio of the W length to the L length of the transistor Mix is twice as high as the ratio of the W length to the L length of the transistor M1. When a high-level potential, e.g., VDDL, is held in the circuit HCS-2$b$, the amount of current flowing between the source and the drain of the transistor M1$x$-2$b$ is $4I_{ut}$ because the ratio of the W length to the L length of the transistor M1$x$-2$b$ is four times as high as the ratio of the W length to the L length of the transistor M1. When a high-level potential, e.g., VDDL, is held in the circuit HCS-3$b$, the amount of current flowing between the source and the drain of the transistor M1$x$-3$b$ is $8I_{ut}$ because the ratio of the W length to the L length of the transistor M1$x$-3$b$ is eight times as high as the ratio of the W length to the L length of the transistor M1.

That is, currents flowing from the electrical connection point of the first terminal of the transistor M3-2$x$ and the first terminal of the transistor M4-2$x$ to the wiring VE through the circuit MC change from 0 to $14I_{ut}$ in steps of $2I_{ut}$, in accordance with the potentials held in the circuit HCS, the circuit HCS-2$b$, and the circuit HCS-3$b$. Here, the amount of the current is referred to as $I_{X2}$. That is, $I_{X2}=2I_{X1}$ is satisfied.

Here, the case is considered where a high-level potential or a low-level potential is supplied to each of the wiring X1L, the wiring X2L, the wiring X1L2$x$, and the wiring X2L2$x$ when the positive first data (a weight coefficient) is set in the circuit MP in FIG. 39.

When a low-level potential is supplied to the wiring X1L, the wiring X2L, the wiring X1L2$x$, and the wiring X2L2$x$, the transistor M3, the transistor M3-2$x$, the transistor M4, and the transistor M4-2$x$ are turned off in the circuit MC. At this time, a current does not flow from the wiring OL to the wiring VE through the circuit MC.

When a high-level potential is supplied to the wiring X1L and a low-level potential is supplied to the wiring X2L, the wiring X1L2$x$, and the wiring X2L2$x$, the transistor M3 is turned on and the transistor M3-2$x$, the transistor M4, and the transistor M4-2$x$ are turned off in the circuit MC. At this time, the current amount of $I_{X1}$ is supplied from the wiring OL to the wiring VE through the circuit MC.

When a high-level potential is supplied to the wiring X2L and a low-level potential is supplied to the wiring X1L, the wiring X1L2$x$, and the wiring X2L2$x$, the transistor M4 is turned on and the transistor M3, the transistor M3-2$x$, and the transistor M4-2$x$ are turned off in the circuit MC. At this time, the current amount of $I_{X1}$ is supplied from the wiring OLB to the wiring VE through the circuit MC.

When a high-level potential is supplied to the wiring X1L2$x$ and a low-level potential is supplied to the wiring X1L, the wiring X2L, and the wiring X2L2$x$, the transistor M3-2$x$ is turned on and the transistor M3, the transistor M4, and the transistor M4-2$x$ are turned off in the circuit MC. At this time, the current amount of $I_{X2}=2I_{X1}$ is supplied from the wiring OL to the wiring VE through the circuit MC.

When a high-level potential is supplied to the wiring X2L2$x$ and a low-level potential is supplied to each of the wiring X1L, the wiring X1L2$x$, and the wiring X2L, the transistor M4-2$x$ is turned on and the transistor M3, the transistor M4, and the transistor M3-2$x$ are turned off in the circuit MC. At this time, the current amount of $I_{X2}=2I_{X1}$ is supplied from the wiring OLB to the wiring VE through the circuit MC.

When a high-level potential is supplied to the wiring X1L and the wiring X1L2$x$ and a low-level potential is supplied to the wiring X2L and the wiring X2L2$x$, the transistor M3 and the transistor M3-2$x$ are turned on and the transistor M4 and the transistor M4-2$x$ are turned off in the circuit MC. At this time, the current amount of $I_{X1}+I_{X2}=3I_{X1}$ is supplied from the wiring OL to the wiring VE through the circuit MC.

Similarly, when a high-level potential is supplied to the wiring X2L and the wiring X2L2$x$ and a low-level potential is supplied to the wiring X1L and the wiring X1L2$x$, the transistor M4 and the transistor M4-2$x$ are turned on and the transistor M3 and the transistor M3-2$x$ are turned off in the circuit MC. At this time, the current amount of $I_{X1}+I_{X2}=3I_{X1}$ is supplied from the wiring OLB to the wiring VE through the circuit MC.

As described above, the circuit MC included in the circuit MP in FIG. 39 can make a current corresponding to the potentials held in the circuit HCS, the circuit HCS-2$b$, and the circuit HCS-3$b$ flow from the wiring OL or the wiring OLB to the wiring VE through the circuit MC, and can output the current after multiplication by 0, 1, 2, or 3 in accordance with the potentials input to the wiring X1L, the wiring X2L, the wiring X1L2$x$, and the wiring X2L2$x$.

Although an example in which the positive first data (a weight coefficient) is set in the circuit MP in FIG. 39 is described above, also in the case where the negative first data (a weight coefficient) is set in the circuit MP in FIG. 39, the circuit MP can make a current flow from the wiring OL or the wiring OLB to the wiring VEr through the circuit MCr, and can output the current after multiplication by 0, 1, 2, or 3 in accordance with the potentials input to the wiring X1L, the wiring X2L, the wiring X1L2$x$, and the wiring X2L2$x$.

In the case where the first data (a weight coefficient) of 0 is set in the circuit MP in FIG. 39, a low-level potential, e.g., VSS, is supplied to the circuit HCS, the circuit HCS-2$b$, the circuit HCS-3$b$, the circuit HCSr, the circuit HCS-2$br$, and the circuit HCS-3$br$. Accordingly, the amounts of currents flowing between the sources and the drains of the transistor M1, the transistor M1-2$b$, the transistor M1-3$b$, the transistor M1$r$, the transistor M1-2$br$, the transistor M1-3$br$, the transistor Mix, the transistor M1$x$-2$b$, the transistor M1$x$-3$b$, a transistor M1$xr$, a transistor Mix-2$br$, and a transistor M1$x$-3$br$ can each be set to 0. Thus, a current flows from the wiring OL to neither the circuit MC nor the circuit MCr, and a current flows from the wiring OLB to neither the circuit MC nor the circuit MCr, regardless of the potentials supplied from the wiring X1L, the wiring X2L, the wiring X1L2$x$, and the wiring X2L2$x$.

As described above, in the circuit MP in FIG. 39, by setting the potentials held in the circuit HCS, the circuit HCS-2$b$, and the circuit HCS-3$b$ to potentials corresponding to the first data (a weight coefficient) and setting the potentials input to the wiring X1L, the wiring X2L, the wiring X1L2$x$, and the wiring X2L2$x$ to potentials corresponding to the second data (a value of a signal of a neuron), the amount of current flowing from the wiring OL or the wiring OLB to the wiring VE through the circuit MC can be processed as a product of the first data (a weight coefficient) and the second data (a value of a signal of a neuron).

Note that this configuration example can be combined with any of the other configuration examples and the like described in this specification as appropriate.

Configuration Example 7

Configuration example 1 to Configuration example 6 each describe the circuit MP that can calculate a product of the first data (e.g., a weight coefficient here) that is a "positive multilevel value", "0", or a "negative multilevel value" held in the circuit MP and the second data (e.g., a value of a signal of a neuron here); meanwhile, this configuration example describes the circuit MP that can calculate a product of the first data (a weight coefficient) that is a "positive multilevel value", "0", or a "negative multilevel value" and the second data (a value of a signal of a neuron) having two levels "+1" and "0", for example.

Figure 40:
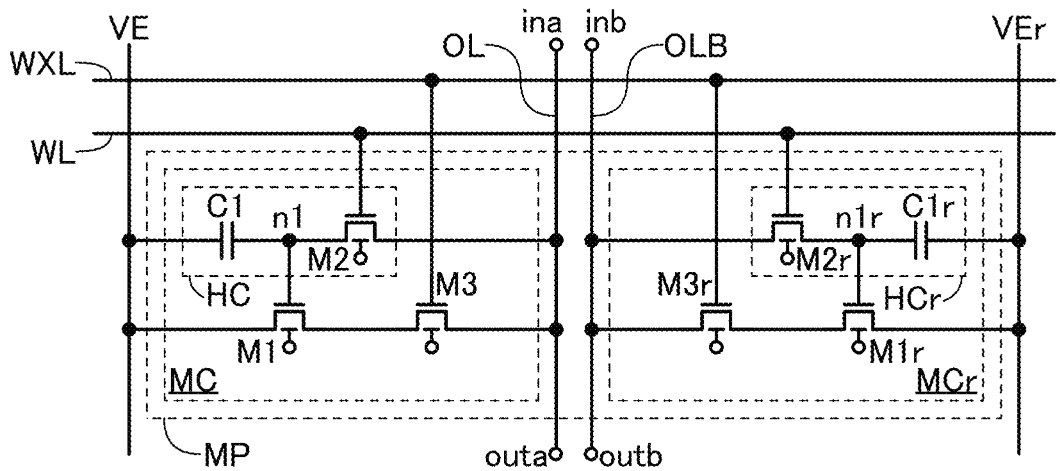
FIG. 40 is a circuit diagram illustrating a configuration example of a circuit included in a semiconductor device.

The circuit MP illustrated in FIG. 40 is a circuit in which the transistor M4 and the transistor M4$r$ are removed from the circuit MP in FIG. 16A. In addition, since the transistor M4 and the transistor M4$r$ are removed, the wiring X2L for inputting a potential to the gates of the transistor M4 and the transistor M4$r$ is also removed in FIG. 40. Furthermore, a wiring corresponding to the wiring X1L is shown as the wiring WXL in FIG. 40. Although FIG. 40 illustrates an example in which the circuit MC and the circuit MCr are provided, one embodiment of the present invention is not limited thereto. For example, at least one of the circuit MC and the circuit MCr may be omitted in the case where a negative value is not used as a weight, the case where a positive value is not used as a weight, or the like. Although an example of application to FIG. 16A is shown here, one embodiment of the present invention is not limited thereto. The transistor M4 and the transistor M4$r$ can be removed in a similar manner in other drawings.

The first data (a weight coefficient) set in the circuit MP in FIG. 40 is similar to the first data (a weight coefficient) set in the circuit MP in FIG. 15A. Thus, for the first data (a weight coefficient) set in the circuit MP in FIG. 40, the description of the circuit MP in FIG. 15A is referred to. The first data (a weight coefficient) can be "−2", "−1", "0", "+1", or "+2", for example.

The second data (a value of a signal of a neuron) input to the circuit MP in FIG. 40 is "+1" when a high-level potential is applied to the wiring WXL and "0" when a low-level potential is applied to the wiring WXL.

For the operation of the circuit MP in FIG. 40, the description of the operation example in Configuration example 1 is referred to.

In the case where the first data (a weight coefficient) and the second data (a value of a signal of a neuron) to be input are defined as described above in the circuit MP in FIG. 40, the current $I_{OL}$ output from the node outa of the wiring OL changes or does not change and the current $I_{OLB}$ output from the node outb of the wiring OLB changes or does not change as in the following table, depending on the combination of the weight coefficient and the second data (a value of a signal of a neuron) input to the circuit MP. Note that in the following table, a high-level potential is denoted by high and a low-level potential is denoted by low.

TABLE 5

| Weight coefficient | n1 | n1r | Signal | WXL | Weight coefficient × Signal | Change amount of $I_{OL}$ | Change amount of $I_{OLB}$ |
|---|---|---|---|---|---|---|---|
| −2 | VSS | $V_2$ | +1 | high | −2 | 0 | $I_2$ |
| −1 | VSS | $V_1$ | +1 | high | −1 | 0 | $I_1$ |
| 0 | VSS | VSS | +1 | high | 0 | 0 | 0 |
| +1 | $V_1$ | VSS | +1 | high | +1 | $I_1$ | 0 |
| +2 | $V_2$ | VSS | +1 | high | +2 | $I_2$ | 0 |
| −2 | VSS | $V_2$ | 0 | low | 0 | 0 | 0 |
| −1 | VSS | $V_1$ | 0 | low | 0 | 0 | 0 |
| 0 | VSS | VSS | 0 | low | 0 | 0 | 0 |
| +1 | $V_1$ | VSS | 0 | low | 0 | 0 | 0 |
| +2 | $V_2$ | VSS | 0 | low | 0 | 0 | 0 |

As shown in the above table, the circuit MP in FIG. 40 can calculate the product of the first data (a weight coefficient) that is a positive multilevel value or a negative multilevel value and the second data (a value of a signal of a neuron) that has two levels "+1" and "0". Note that the first data (a weight coefficient) is not limited to having five levels, and may have two levels or multiple levels other than five levels. Two levels may be, for example, two levels "+1" and "0" or two levels "+1" and "−1". Alternatively, the first data (a weight coefficient) may be an analog value or a multibit (multilevel) digital value, for example.

Although a current set in each of the circuit HC of the circuit MC and the circuit HCr of the circuit MCr in the circuit MP has a multilevel value in this operation example, the set current may have an analog value. For example, in the case where the first data (a weight coefficient) is a "positive analog value", a current having an analog value is set at the node n1 of the circuit HC, a potential corresponding to the current is held at the node n1, and a low-level potential is held at the node n1*r* of the circuit HCr. In the case where the first data (a weight coefficient) is a "negative analog value", for example, a low-level potential is held at the node n1 of the circuit HC, a current having an analog value is set at the node n1*r* of the circuit HCr, and a potential corresponding to the current is held at the node n1*r*. The amount of the current $I_{OL}$ and the current $I_{OLB}$ becomes an amount corresponding to the analog potential.

Note that this configuration example can be combined with any of the other configuration examples and the like described in this specification as appropriate.

Configuration Example 8

Next, a configuration example of the circuit MP in the case where a transistor included in the circuit ILD and a transistor included in the circuit MP have the same polarity is described.

Described here is the configuration example of the circuit MP in which all of the included transistors are n-channel transistors in the case where the constant current source circuit ISC1 (the constant current source circuit ISC2 or the constant current source circuit ISC3) included in the current source circuit ISC of the circuit ILD has a configuration including the n-channel transistor in FIG. 8C.

Figure 41A:
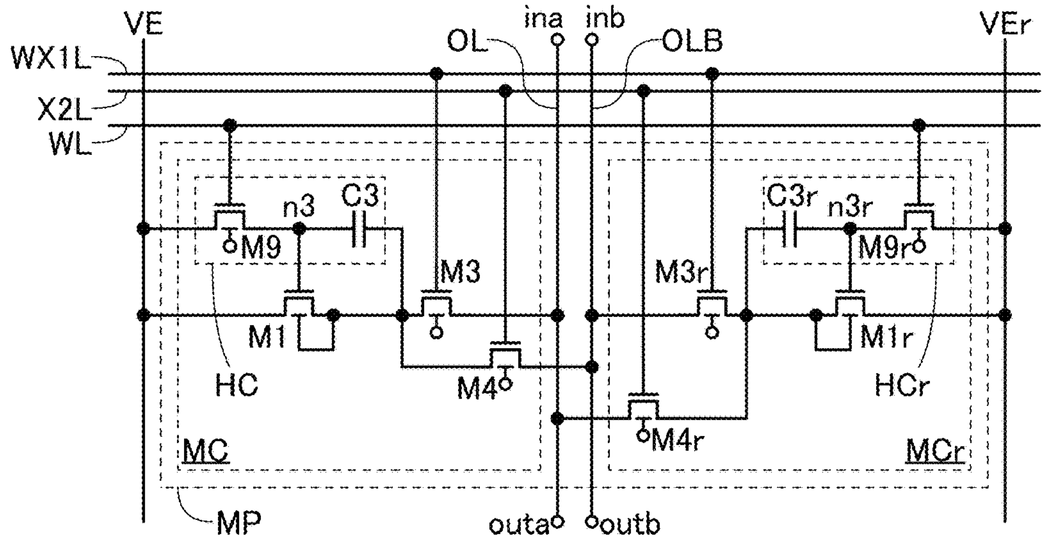
FIG. 41A to FIG. 41C are circuit diagrams each illustrating a configuration example of a circuit included in a semiconductor device.

The circuit MP illustrated in FIG. 41A is a circuit having a configuration changed from that of the circuit MP in FIG. 21A, and the circuit MP in FIG. 41A is different from the circuit MP in FIG. 21A in the configuration of the circuit HC and the target to which the back gate of the transistor M1 is connected. Thus, the description of a portion of the circuit MP in FIG. 41A having a connection configuration similar to that of the circuit MP in FIG. 21A is omitted.

In the circuit MP in FIG. 41A, the circuit HC includes a transistor M9 and the capacitor C3.

In this specification and the like, unless otherwise specified, the transistor M9 in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M9 in an on state may operate in a saturation region or may operate in a subthreshold region. Alternatively, the transistor M9 may operate in both the linear region and the saturation region, may operate in both the saturation region and the subthreshold region, may operate in both the subthreshold region and the linear region, or may operate in the linear region, the saturation region, and the subthreshold region.

The gate of the transistor M1 is electrically connected to a first terminal of the transistor M9 and a first terminal of the capacitor C3. A second terminal of the transistor M9 is electrically connected to the wiring VE. The back gate of the transistor M1 is electrically connected to the second terminal of the transistor M1, a second terminal of the capacitor C3, the first terminal of the transistor M3, and the first terminal of the transistor M4.

When the back gate of the transistor M1 and the second terminal of the transistor M1 are electrically connected to each other and a high-level potential is supplied to the first terminal of the transistor M1, the transistor M1 can increase the threshold voltage of the transistor M1 in some cases. Note that the semiconductor device of one embodiment of the present invention is not limited thereto; for example, the circuit MP in FIG. 41A may have a configuration in which the back gate of the transistor M1 is electrically connected to a wiring for supplying a low-level potential. As another example, the circuit MP in FIG. 41A may have a configuration in which the transistor M1 does not include a back gate.

In the circuit HC illustrated in FIG. 41A, the electrical connection point of the gate of the transistor M1, the first terminal of the transistor M9, and the first terminal of the capacitor C3 is a node n3.

In the circuit MP in FIG. 41A, the circuit MCr has substantially the same circuit configuration as the circuit MC. Thus, "r" is added to the reference numerals of the circuit elements and the like included in the circuit MCr to differentiate them from the circuit elements and the like included in the circuit MC.

In the circuit MP in FIG. 41A, potentials supplied from the wiring VE and the wiring VEr are each preferably a high-level potential, for example. Since the wiring VSO has a low-level potential in the constant current source circuit ISC1 (the constant current source circuit ISC2 or the constant current source circuit ISC3) illustrated in FIG. 8C, a current can be made to flow from the circuit MC or the circuit MCr to the circuit ILD through the wiring OL or the circuit OLB when potentials supplied from the wiring VE or the wiring VEr are each a high-level potential. Here, the potentials supplied from the wiring VE and the wiring VEr are each described as VDD.

When a current flowing between the source and the drain of the transistor M1 is set in the circuit MC in FIG. 41A (when the first data (e.g., a weight coefficient here) is set), a high-level potential is supplied to the wiring WX1L and the wiring WL so that the transistor M3 and the transistor M9 are turned on. Accordingly, a potential of the node n3 of the circuit HC becomes VDD. After that, a current is generated in the current source circuit ISC in FIG. 8A, whereby the current flows from the wiring VE to the current source circuit ISC through the source and the drain of the transistor M1, the source and the drain of the transistor M3 of the circuit MC, and the wiring OL. At this time, the potential of the second terminal of the capacitor C3 (the potential of the second terminal of the transistor M1) is determined by the current. Here, a low-level potential is supplied to the wiring WX1L and the wiring WL so that the transistor M3 and the transistor M9 are turned off, whereby the capacitor C3 can hold a voltage between the gate of the transistor M1 and the second terminal of the transistor M1. Thus, the current can be set between the source and the drain of the transistor M1. After that, a predetermined potential is supplied to each of the wiring WX1L and the wiring X2L so that one of the transistor M3 and the transistor M4 is turned on and the other of the transistor M3 and the transistor M4 is turned off, whereby the set current can be made to flow from the wiring VE to the wiring OL or the wiring OLB through the circuit MC.

Figure 41B:
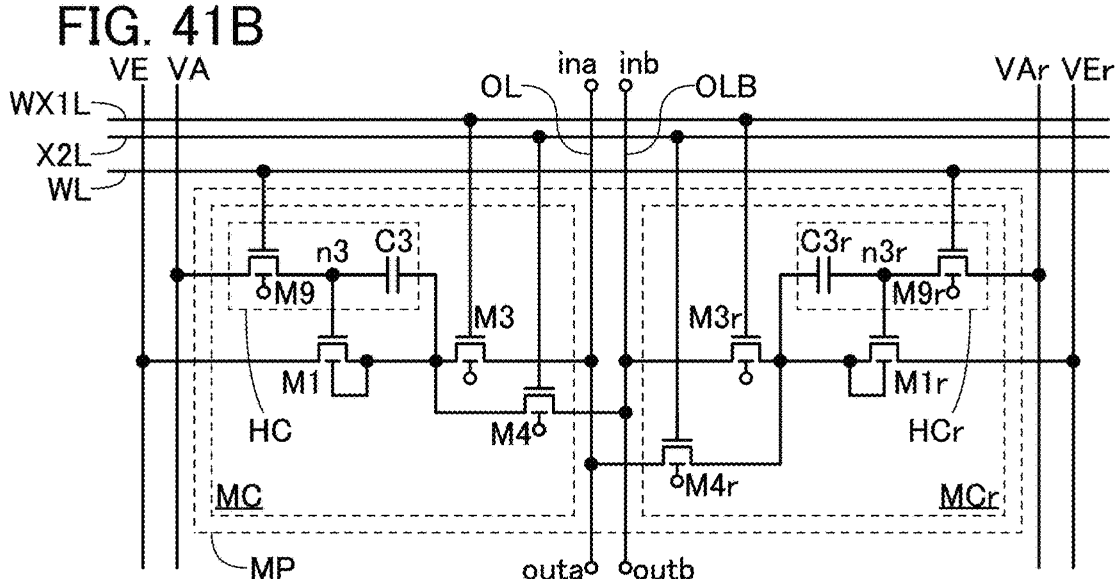

FIG. 41B shows a modification example of the configuration of the circuit MP in FIG. 41A. The circuit MP in FIG. 41B is different from the circuit MP in FIG. 41A in that the second terminal of the transistor M9 is electrically connected to not the wiring VE but the wiring VA, and a second terminal of a transistor M9*r* is electrically connected to not the wiring VEr but a wiring VAr.

The wiring VA functions as a wiring for supplying a constant voltage, for example. It is particularly preferable that the constant voltage be a ground potential, a low-level potential, or a potential higher than VSS and lower than VDD, which is the high-level potential supplied from the wiring VE. Here, the constant voltage supplied from the wiring VA is denoted as VM, and the potential VM is a ground potential, a low-level potential, or a potential higher than VSS and lower than VDD, which is the high-level potential supplied from the wiring VE.

When the potential of the second terminal of the transistor M1 is denoted as $V_S$ in the circuit MP in FIG. 41B, the source-drain voltage of the transistor M1 is VDD−$V_S$. In the case where VM is input to the gate of the transistor M1, the gate-source voltage of the transistor M1 is VM−$V_S$. In order to make the transistor M1 operate in a saturation region, when the threshold voltage of the transistor M1 is denoted as $V_{th}$, the relation of $VDD-V_S>VM-V_S-V_{th}$ is satisfied. In the case where the transistor M1 has normally-on characteristics, the transistor M1 can operate in a saturation region because the gate-source voltage VDD−$V_S$ is a positive value even when the gate-source voltage VM−$V_S$ is a negative value.

Note that "normally-on characteristics" means a state where a channel exists without application of a voltage to a gate of a transistor and a current flows through the transistor.

In the circuit MP in FIG. 41B, the wiring VA and the wiring VAr may be combined into one wiring. For example, as in the circuit MP illustrated in FIG. 41C, the wiring VA and the wiring VAr may be combined into one wiring VA that is provided along the column direction. Note that the wiring VA may be provided along not the column direction but the row direction (not illustrated).

Figure 41C:
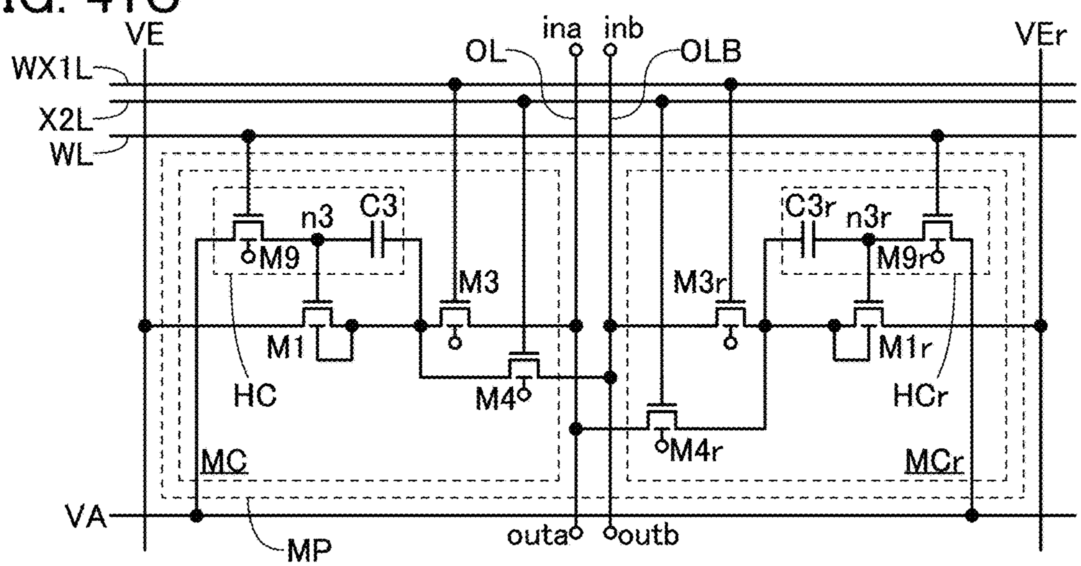

Next, a configuration example of the circuit MP, which is different from those in FIG. 41A to FIG. 41C, in the case where the constant current source circuit ISC1 (the constant current source circuit ISC2 or the constant current source circuit ISC3) and the circuit MP are each a single-polarity circuit of n-channel transistors is described.

Figure 42:
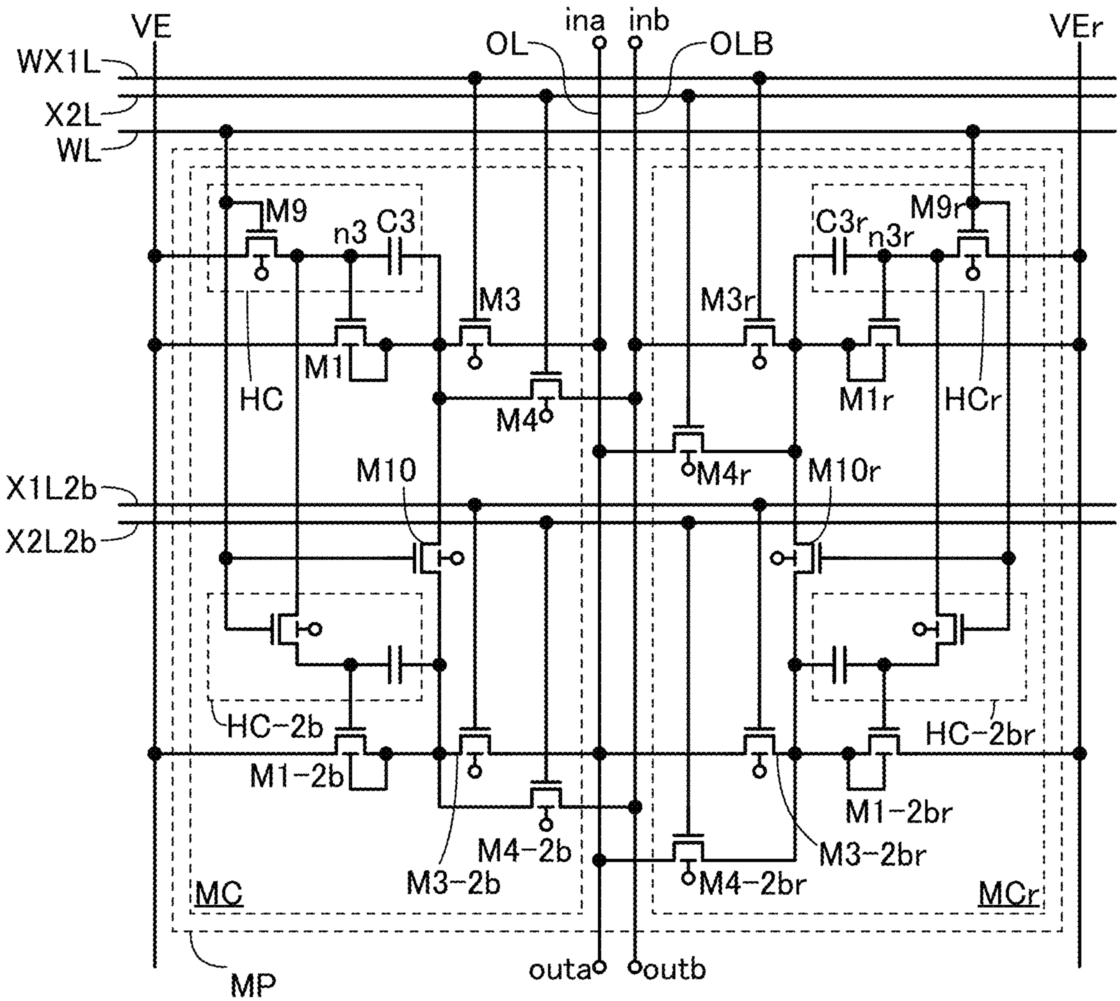
FIG. 42 is a circuit diagram illustrating a configuration example of a circuit included in a semiconductor device.

The circuit MP illustrated in FIG. 42 is a circuit obtained by modifying the circuit MP in FIG. 41A so that the multilevel second data (e.g., a value of a signal of a neuron (an arithmetic value) here) can be processed.

The circuit MC included in the circuit MP in FIG. 42 includes the transistor M1-2*b*, the transistor M3-2*b*, the transistor M4-2*b*, a transistor M10, and the circuit HC-2*b* in addition to the circuit elements included in the circuit MP in FIG. 41A.

In this specification and the like, unless otherwise specified, the transistor M1-2*b* in an on state may operate in a saturation region in the end, like the transistor M1. In other words, the gate voltage, the source voltage, and the drain voltage of each of the above transistors may be appropriately biased to voltages in the range where the transistor operates in a saturation region. However, one embodiment of the present invention is not limited thereto. The transistor M1-2*b* may operate in a linear region so that the amplitude value of a voltage to be supplied is decreased. To reduce the amount of current flowing through the transistor M1-2*b*, the transistor M1-2*b* may operate in a subthreshold region. Alternatively, the transistor M1-2*b* may operate around the boundary between the saturation region and the subthreshold region. Note that in the case where the first data (a weight coefficient) is an analog value, for example, the transistor M1-2*b* may operate in the linear region, the saturation region, and the subthreshold region depending on the cases in accordance with the magnitude of the first data (weight coefficient). Alternatively, the transistor M1-2*b* may operate in both the linear region and the saturation region, may operate in both the subthreshold region and the linear region, or may operate in both the saturation region and the subthreshold region.

In this specification and the like, unless otherwise specified, the transistor M3-2*b*, the transistor M4-2*b*, and the transistor M10 in an on state may operate in a saturation region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M3-2*b*, the transistor M4-2*b*, and the transistor M10 in an on state may operate in a saturation region or may operate in a subthreshold region. Alternatively, they may operate around the boundary between the saturation region and the subthreshold region. Alternatively, the transistor M3-2*b*, the transistor M4-2*b*, and the transistor M10 may operate in both the linear region and the saturation region, may operate in both the saturation region and the subthreshold region, may operate in both the subthreshold region and the linear region, or may operate in the linear region, the saturation region, and the subthreshold region.

Next, the configuration of the circuit MP in FIG. 42 is described. Note that the description of a portion of the circuit MP in FIG. 42 having a configuration similar to that of the circuit MP in FIG. 41A is omitted.

The circuit HC-2*b* has a configuration similar to that of the circuit HC. Thus, in the description of the circuit elements and the like included in the circuit HC-2*b*, the description is made using the reference numerals of the circuit elements included in the circuit HC in some cases.

In the circuit MC of the circuit MP in FIG. 42, the first terminal of the transistor M1-2*b* is electrically connected to the wiring VE. The second terminal of the transistor M1-2*b* is electrically connected to a back gate of the transistor M1-2*b*, the first terminal of the transistor M3-2*b*, and the first terminal of the transistor M4-2*b*. The gate of the transistor M1-2*b* is electrically connected to the first terminal of the transistor M9 of the circuit HC-2*b* and the first terminal of the capacitor C3 of the circuit HC-2*b*. The second terminal of the capacitor C3 of the circuit HC-2*b* is electrically connected to a first terminal of the transistor M10 and the second terminal of the transistor M1-2*b*. The second terminal of the transistor M3-2*b* is electrically connected to the wiring OL. The gate of the transistor M3-2*b* is electrically connected to the wiring X1L2*b*. The second terminal of the transistor M4-2*b* is electrically connected to the wiring OLB. The gate of the transistor M4-2*b* is electrically connected to the wiring X2L2*b*. A second terminal of the transistor M10 is electrically connected to the second terminal of the transistor M1, the first terminal of the transistor M3, the first terminal of the transistor M4, and the second terminal of the capacitor C3 of the circuit HC. The second terminal of the transistor M9 of the circuit HC-2*b* is electrically connected to the first terminal of the transistor M9 of the circuit HC. The gate of the transistor M9 of the circuit HC-2*b* and a gate of the transistor M10 are electrically connected to the wiring WL.

Note that the circuit MCr of the circuit MP in FIG. 42 has substantially the same circuit configuration as the circuit MC. Thus, "r" is added to the reference numerals of the circuit elements and the like included in the circuit MCr to differentiate them from the circuit elements and the like included in the circuit MC. A second terminal of the transistor M3-2*br* is electrically connected to the wiring OLB, and a second terminal of the transistor M4-2*br* is electrically connected to the wiring OL.

In the circuit MP in FIG. 42, the sizes, e.g., the channel lengths and the channel widths, of the transistor M3, the transistor M3-2*b*, the transistor M3*r*, the transistor M3-2*br*, the transistor M4, the transistor M4-2*b*, the transistor M4*r*, and the transistor M4-2*br* are preferably equal to each other. Such a circuit configuration might enable efficient layout.

In addition, in the circuit MP in FIG. 42, the sizes, e.g., the channel lengths and the channel widths, of the transistors M9*r* included in the circuit HCr and the circuit HC-2*br* are preferably equal to those of the transistors M9 included in the circuit HC and the circuit HC-2*b*. Furthermore, the size of the transistor M10*r* is preferably equal to that of the transistor M10.

When the ratio of the W length to the L length of the transistor M1 is W/L, the ratio of the W length to the L length of the transistor M1-2*b* is preferably 2 W/L. In addition, the size of the transistor M1*r* is preferably equal to that of the transistor M1, and the size of the transistor M1-2*br* is preferably equal to that of the transistor M1-2*b*.

The wiring X1L2*b* is a wiring for switching the on state and the off state of the transistor M3-2*b* and the transistor M3-2*br*, and the wiring X2L2*b* is a wiring for switching the on state and the off state of the transistor M4-2*b* and the transistor M4-2*br*.

Next, a method for setting a current (a method for setting the first data (a weight coefficient)) in the circuit MP in FIG. 42 is described.

First, a high-level potential is supplied to the wiring WX1L and the wiring WL so that the transistor M3, the transistor M10, the transistor M9 of the circuit HC, and the transistor M9 of the circuit HC-2*b* are turned on. Accordingly, the potential of the node n3 of the circuit HC becomes VDD and the potential of the node n3 of the circuit HC-2*b* becomes VDD. After that, a current having the current amount of $3I_{ut}$ is generated in the current source circuit ISC in FIG. 8A, whereby different currents from the wiring VE flow between the source and the drain of the transistor M1 and between the source and the drain of the transistor M1-2*b*. Specifically, since the ratio of the W length to the L length of the transistor M1-2*b* is twice as high as the ratio of the W length to the L length of the transistor M1, the amount of current flowing between the source and the drain of the transistor M1 is $I_{ut}$ and the amount of current flowing between the source and the drain of the transistor M1-2*b* is $2I_{ut}$. The currents flowing between the sources and the drains of the transistor M1 and the transistor M1-2*b* flow to the current source circuit ISC through the source and the drain of the transistor M3 and the wiring OL. At this time, the potential of the second terminal of the capacitor C3 of the circuit HC (the potential of the second terminal of the transistor M1) is determined in accordance with the current flowing between the source and the drain of the transistor M1, and the potential of the second terminal of the capacitor C3 of the circuit HC-2*b* (the potential of the second terminal of the transistor M1-2*b*) is determined in accordance with the current flowing between the source and the drain of the transistor M1-2*b*. Here, a low-level potential is supplied to the wiring WX1L and the wiring WL so that the transistor M3, the transistor M10, the transistor M9 of the circuit HC, and the transistor M9 of the circuit HC-2*b* are turned off, whereby the capacitor C3 of the circuit HC can hold a voltage between the gate of the transistor M1 and the second terminal of the transistor M1 and the capacitor C3 of the circuit HC-2*b* can hold a voltage between the gate of the transistor M1-2*b* and the second terminal of the transistor M1-2*b*. In this manner, the amount of current flowing between the source and the drain of the transistor M1 can be set to $I_{ut}$ and the amount of current flowing between the source and the drain of the transistor M1-2*b* can be set to $2I_{ut}$.

After that, a predetermined potential is supplied to each of the wiring WX1L, the wiring X2L, the wiring X1L2*b*, and the wiring X2L2*b* in accordance with the second data (a value of a signal of a neuron), whereby the circuit MP can calculate the product of the set first data (a weight coefficient) and the second data (a value of a signal of a neuron). Note that the calculation of the product of the multilevel first data (a weight coefficient) and the multilevel second data (a value of a signal of a neuron) are described in detail in Configuration example 5.

Figure 43:
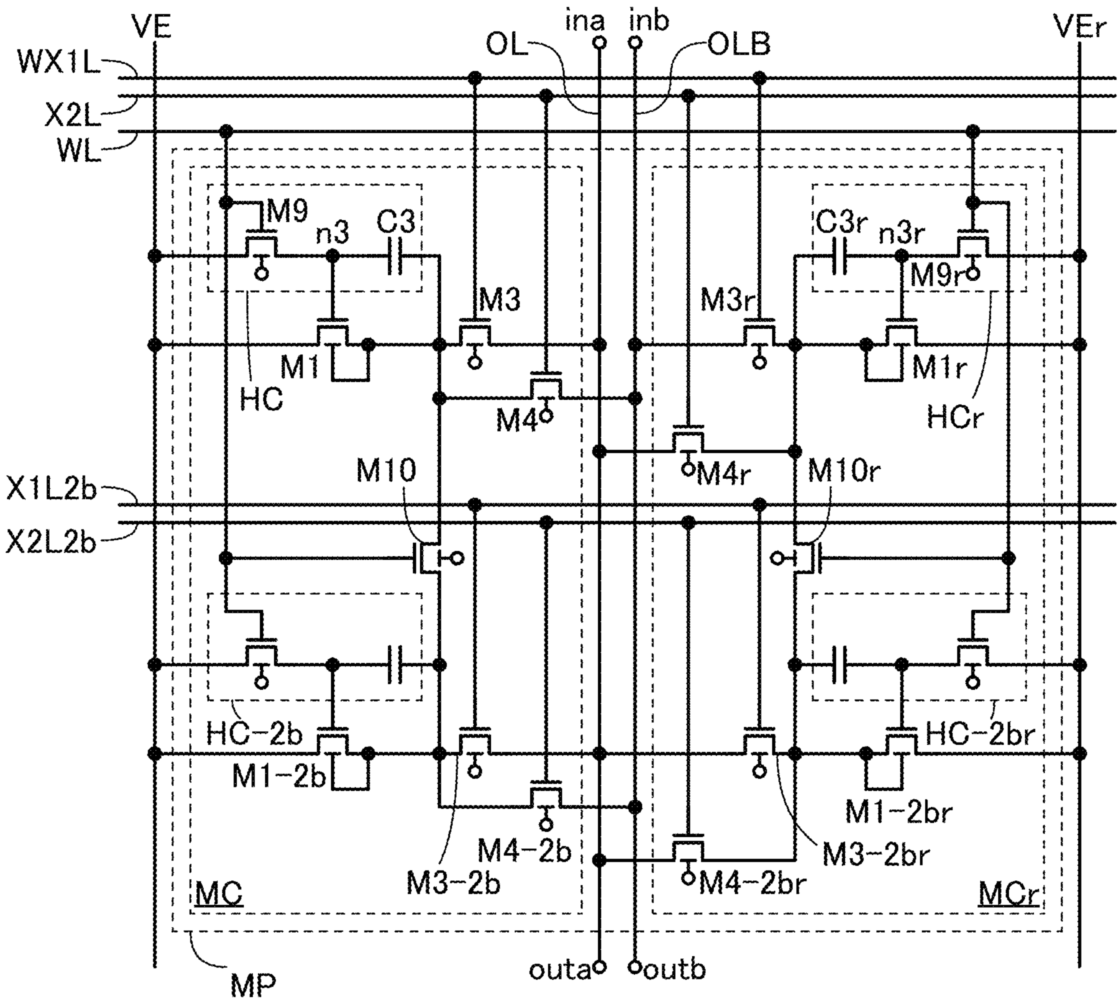
FIG. 43 is a circuit diagram illustrating a configuration example of a circuit included in a semiconductor device.

Note that the configuration of the circuit MP in FIG. 42 can be changed into that of the circuit MP in FIG. 43. The configuration of the circuit MP in FIG. 43 corresponds to a configuration where the target to which the second terminal of the transistor M9 of the circuit HC-2*b* is connected is changed from the first terminal of the transistor M9 of the circuit HC to the wiring VE, and the target to which the second terminal of the transistor M9*r* of the circuit HC-2*br* is connected is changed from the first terminal of the transistor M9*r* of the circuit HCr to the wiring VEr, in the circuit MP in FIG. 42. The circuit MP in FIG. 43 can operate in a manner similar to that of the circuit MP in FIG. 42.

In the circuit MP in FIG. 42 and the circuit MP in FIG. 43, the wiring VE may be divided into the wiring VE and the wiring VA and the wiring VEr may be divided into the wiring VEr and the wiring VAr, as in the circuit MP in FIG. 41B. The circuit MP illustrated in FIG. 44 has a configuration in which the wiring VE is divided into the wiring VE and the wiring VA in the circuit MP in FIG. 42, and the circuit MP illustrated in FIG. 45 has a configuration in which the wiring VE is divided into the wiring VE and the wiring VA in the circuit MP in FIG. 43.

Figure 44:
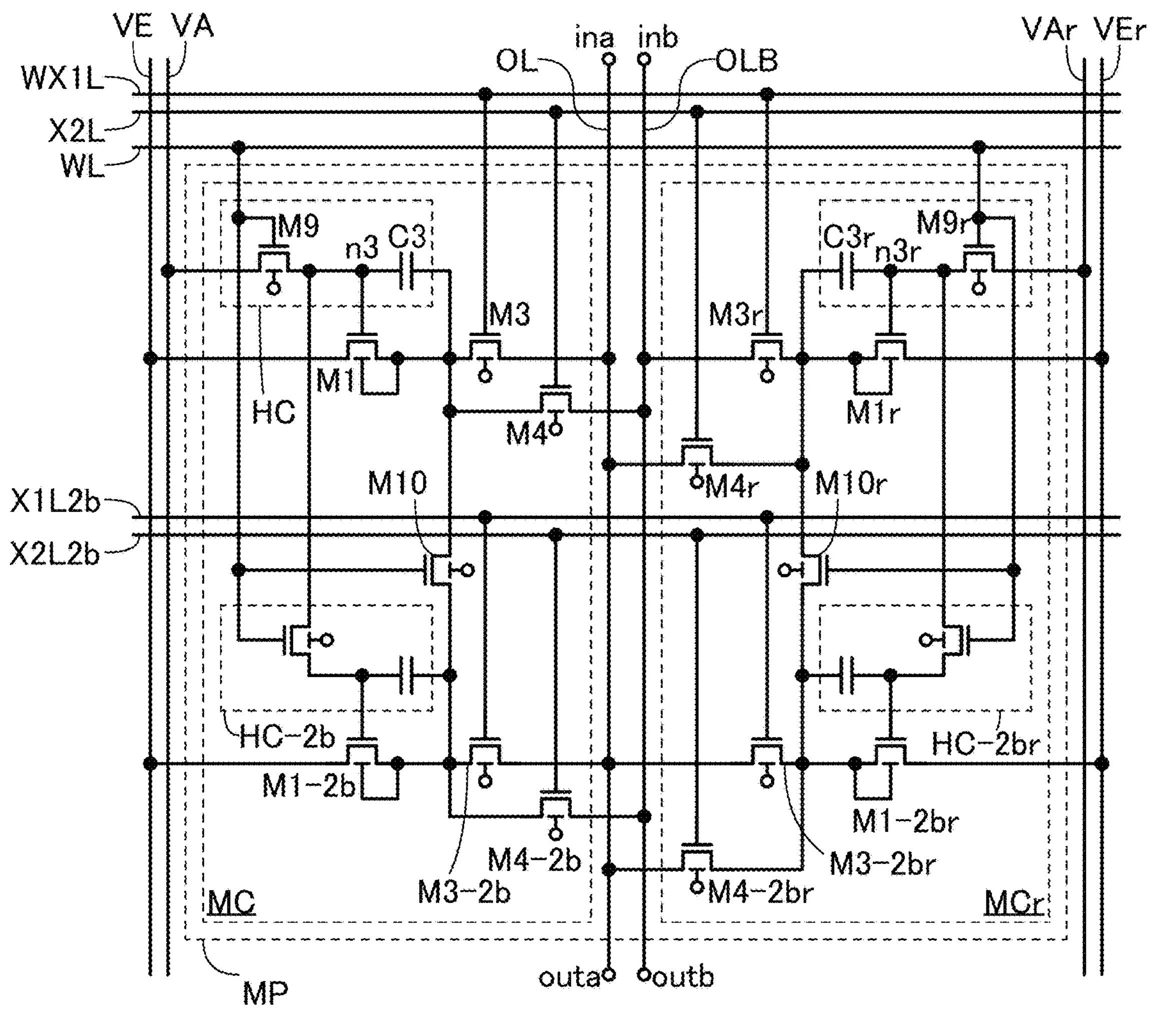
FIG. 44 is a circuit diagram illustrating a structure example of a circuit included in a semiconductor device.
Figure 45:
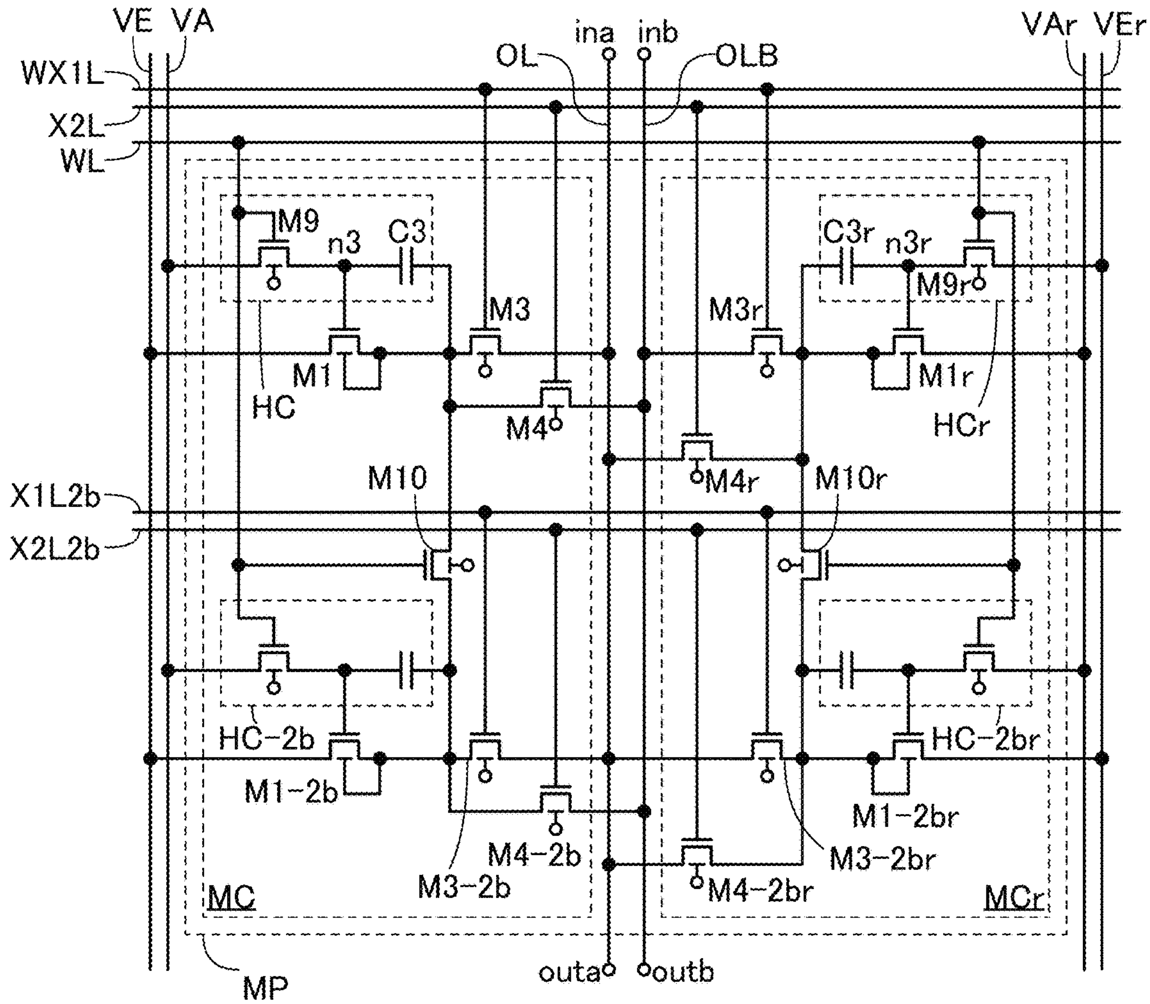
FIG. 45 is a circuit diagram illustrating a configuration example of a circuit included in a semiconductor device.

The circuit MP in FIG. 44 and the circuit MP in FIG. 45 can operate in a manner similar to those of the circuits MP in FIG. 42 and FIG. 43. In the case where the capacitor C3 is connected to the source terminal of the transistor M1 and the like, the source terminal is not connected to a power supply line or the like, and the drain terminal is connected to the power supply line or the like as illustrated in FIG. 42 to FIG. 45 and the like, a constant voltage supplied from the wiring VCN is preferably a voltage supplied to the wiring VE, the wiring VA, or the like, e.g., a high-level potential (e.g., VDD), when a positive current is supplied from the circuit ILD to the wiring OL or the wiring OLB through the switching circuit TW[j]. That is, when a constant voltage is supplied from the wiring VCN, a potential difference between both ends of the capacitor C3 is desirably close to zero. That is, the transistor M1 is desirably turned off. In other words, a potential that does not allow the circuit MC to output a current is desirably supplied to the wiring VCN. In contrast, a low-level potential such as VSS or a ground potential is desirably supplied to the wiring VCN2. By appropriately setting the potentials supplied from the wiring VCN and the wiring VCN2, a current can be made to flow from the circuit MP to the wiring OL and/or the wiring OLB.

Note that this configuration example can be combined with any of the other configuration examples and the like described in this specification as appropriate.

Configuration Example 9

Figure 46:
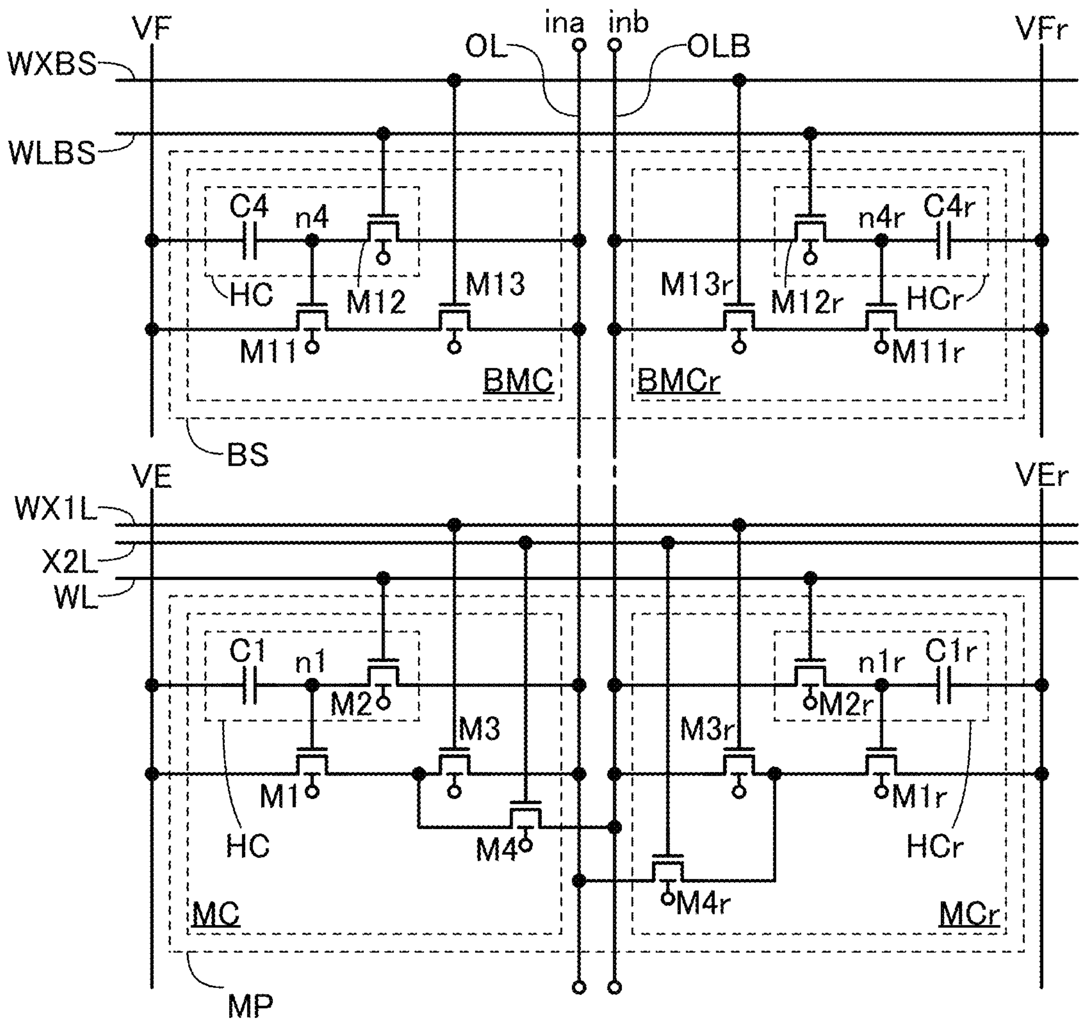
FIG. 46 is a circuit diagram illustrating a configuration example of a circuit included in a semiconductor device.

FIG. 46 shows examples of the circuit BS and the circuit MP that can be used for the arithmetic circuit 170 in FIG. 14.

As shown in FIG. 46, the circuit MP in FIG. 40 can be used as the circuit BS, for example. A circuit BMC corresponds to the circuit MC of the circuit MP in FIG. 40, and a circuit BMCr corresponds to the circuit MCr of the circuit MP in FIG. 40. A transistor M11 corresponds to the transistor M1 of the circuit MP in FIG. 40, a transistor M12 corresponds to the transistor M2 of the circuit MP in FIG. 40, a transistor M13 corresponds to the transistor M3 of the circuit MP in FIG. 40, a capacitor C4 corresponds to the capacitor C1 of the circuit MP in FIG. 40, and a node n4 corresponds to the node n1 of the circuit MP in FIG. 40. The wiring WXBS corresponds to the wiring WXL of the circuit MP in FIG. 40, the wiring WLBS corresponds to the wiring WL of the circuit MP in FIG. 40, and a wiring VF corresponds to the wiring VE of the circuit MP in FIG. 40. Thus, for the configuration of the circuit BS illustrated in FIG. 46, the description of the circuit MP in FIG. 40 is referred to.

As shown in FIG. 46, the circuit MP in FIG. 15A can be used as the circuit MP, for example. Thus, for the configuration of the circuit MP illustrated in FIG. 46, the description of the circuit MP in FIG. 15A is referred to.

In the circuit BS in FIG. 46, the circuit BMCr has substantially the same circuit configuration as the circuit BMC. In the circuit MP, the circuit MCr has substantially the same circuit configuration as the circuit MC. Thus, "r" is added to the reference numerals of the circuit elements and the like included in the circuit BMCr to differentiate them from the circuit elements and the like included in the circuit BMC, and "r" is added to the reference numerals of the circuit elements and the like included in the circuit MCr to differentiate them from the circuit elements and the like included in the circuit MC.

When a "positive bias" is set in the circuit BS, a high-level potential is supplied to the wiring WXBS and the wiring WLBS so that the transistor M12, the transistor M13, a transistor M12*r*, and a transistor M13*r* are turned on, as in the operation of the circuit MP in FIG. 40. After that, a current corresponding to the bias is selected in the current source circuit ISC in FIG. 8A, and electrical continuity is established between the wiring OL and the current source circuit ISC. Accordingly, the current flows from the current source circuit ISC to the wiring VF through the wiring OL and the circuit BMC, so that the potential of the node n4 becomes a potential corresponding to the current. At this time, electrical continuity is established between the wiring OLB and the wiring VCN, so that the potential VSS is supplied from the wiring VCN to a node n4*r* on the circuit BMCr side and thus, the potential of the node n4*r* becomes VSS. After that, a low-level potential is supplied to the wiring WXBS and the wiring WLBS so that the transistor M12, the transistor M13, the transistor M12*r*, and the transistor M13*r* are turned off, whereby the potentials of the node n4 and the node n4*r* can be held. Accordingly, the "positive bias" can be set in the circuit BS.

When a "negative bias" is set in the circuit BS, a high-level potential is supplied to the wiring WXBS and the wiring WLBS so that the transistor M12, the transistor M13, the transistor M12*r*, and the transistor M13*r* are turned on. After that, a current corresponding to the bias is selected in the current source circuit ISC in FIG. 8A, and electrical continuity is established between the wiring OLB and the current source circuit ISC. Accordingly, the current flows from the current source circuit ISC to a wiring VFr through the wiring OLB and the circuit BMCr, so that the potential of the node n4*r* becomes a potential corresponding to the current. At this time, electrical continuity is established between the wiring OL and the wiring VCN, so that the potential VSS is supplied from the wiring VCN to the node n4 on the circuit BMC side and thus, the potential of the node n4 becomes VSS. After that, a low-level potential is supplied to the wiring WXBS and the wiring WLBS so that the transistor M12, the transistor M13, the transistor M12*r*, and the transistor M13*r* are turned off, whereby the potentials of the node n4 and the node n4*r* can be held. Accordingly, the "negative bias" can be set in the circuit BS.

When a "bias of 0" is set in the circuit BS, a high-level potential is supplied to the wiring WXBS and the wiring WLBS so that the transistor M12, the transistor M13, the transistor M12*r*, and the transistor M13*r* are turned on, electrical continuity is established between the wiring VCN and each of the wiring OL and the wiring OLB, and the potentials of the nodes n4 and n4*r* become VSS. After that, a low-level potential is supplied to the wiring WXBS and the wiring WLBS so that the transistor M12, the transistor M13, the transistor M12*r*, and the transistor M13*r* are turned off, and the potentials VSS of the node n4 and the node n4*r* are held, whereby the "bias of 0" can be set in the circuit BS.

Depending on the case, a potential other than VSS may be supplied to each of the node n4 and the node n4*r* when a bias is set in the circuit BS.

After a bias is set in the circuit BS, the first data (e.g., a weight coefficient here) is held in the circuit MP and the second data (e.g., a value of a signal of a neuron) is supplied to the circuit MP. Specifically, a current corresponding to the weight coefficient is set in the circuit MP, and a potential corresponding to the second data (a value of a signal of a neuron) is supplied from each of the wiring WX1L and the wiring X2L to the circuit MP. Furthermore, the wiring WXBS is set to have a high-level potential in the circuit BS, so that the bias set in the circuit BS can be applied to the product of the first data (a weight coefficient) and the second data (a value of a signal of a neuron), which is calculated in the circuit MP.

Alternatively, it is also possible to hold the first data (a weight coefficient) in the circuit MP in advance, calculate the product of the first data (a weight coefficient) and the second data (a value of a signal of a neuron) in the circuit MP once, and then set a bias in the circuit BS on the basis of the calculation result and perform arithmetic operation again. That is, operation for changing a bias may be performed as appropriate on the basis of the arithmetic operation result.

Although the wiring VF, the wiring VFr, the wiring VE, and the wiring VEr are illustrated in the configuration example in FIG. 46, one embodiment of the present invention is not limited thereto. For example, in the configuration in FIG. 46, the wiring VF and the wiring VE may be combined into one wiring and the wiring VFr and the wiring VEr may be combined into one wiring. As another example, in the configuration in FIG. 46, the wiring VF and the wiring VFr may be combined into one wiring and the wiring VE and the wiring VEr may be combined into one wiring, as in the circuit MP in FIG. 16B. As another example, in the configuration in FIG. 46, the wiring VF, the wiring VFr, the wiring VE, and the wiring VEr may be combined into one wiring. For example, in the configuration in FIG. 46, two or more wirings selected from the wiring VF, the wiring VFr, the wiring VE, and the wiring VEr may be combined into one wiring.

Note that this configuration example can be combined with any of the other configuration examples and the like described in this specification as appropriate.

Configuration Example 10

Next, an example of a circuit configuration that can be applied to the circuit MP illustrated in FIG. 10B is described.

Figure 47A:
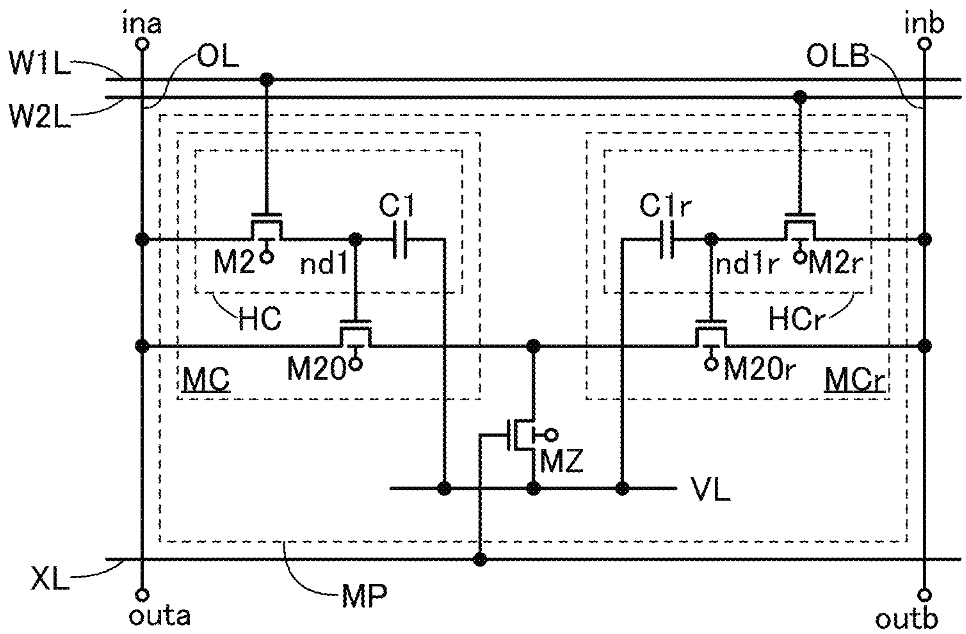
FIG. 47A and FIG. 47B are circuit diagrams each illustrating a configuration example of a circuit included in a semiconductor device.

The circuit MP illustrated in FIG. 47A shows a configuration example of the circuit MP in FIG. 10B that can be used for the arithmetic circuit 140 in FIG. 7, for example. Note that the circuit MP in FIG. 47A corresponds to a circuit in which the transistor M3 and the transistor M3*r* are combined into one transistor and the wiring VE and the wiring VEr are combined into one wiring in the circuit MP in FIG. 40. Specifically, the transistor M3 and the transistor M3*r* of the circuit MP illustrated in FIG. 40 are combined into the transistor MZ in the circuit MP in FIG. 47A, and the wiring VE and the wiring VEr of the circuit MP illustrated in FIG. 40 are combined into the wiring VL in the circuit MP in FIG. 47A.

The circuit MCr of the circuit MP in FIG. 47A has substantially the same circuit configuration as the circuit MC. Thus, "r" is added to the reference numerals of the circuit elements included in the circuit MCr to differentiate them from the circuit elements included in the circuit MC.

Note that in this specification and the like, unless otherwise specified, the transistor MZ in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor MZ in an on state may operate in a saturation region or may operate in a subthreshold region. Alternatively, it may operate around the boundary between the saturation region and the subthreshold region. Alternatively, the transistor MZ may operate in both the linear region and the saturation region, may operate in both the saturation region and the subthreshold region, may operate in both the subthreshold region and the linear region, or may operate in the linear region, the saturation region, and the subthreshold region.

The circuit MC includes the circuit HC and a transistor M20, and the circuit MCr includes the circuit HCr and a transistor M20*r*.

A first terminal of the transistor M20 is electrically connected to the first terminal of the transistor MZ, a gate of the transistor M20 is electrically connected to the second terminal of the transistor M2 and the first terminal of the capacitor C1, and a second terminal of the transistor M20 is electrically connected to the wiring OL. The second terminal of the capacitor C1 is electrically connected to the wiring VL. The first terminal of the transistor M2 is electrically connected to the wiring OL.

A first terminal of the transistor M20*r* is electrically connected to the first terminal of the transistor MZ, a gate of the transistor M20*r* is electrically connected to the second terminal of the transistor M2*r* and the first terminal of the capacitor C1*r*, and a second terminal of the transistor M20*r* is electrically connected to the wiring OLB. A second terminal of the capacitor C1*r* is electrically connected to the wiring VL. The first terminal of the transistor M2*r* is electrically connected to the wiring OLB.

The wiring VL functions as a wiring for supplying a constant voltage, for example. The constant voltage can be a low-level potential VSS or a ground potential (GND), for example.

As in the circuit HC and the circuit HCr included in the circuit MP illustrated in FIG. 15A and the like, a current amount corresponding to a weight coefficient can be set in the circuit HC and the circuit HCr included in the circuit MP in FIG. 47A. Specifically, for example, in the circuit MP, a predetermined potential is supplied to the wiring XL so that the transistor MZ is turned on, and a predetermined potential is supplied to the wiring W1L so that the transistor M2 is turned on, whereby a current with the amount corresponding to the weight coefficient is supplied from the wiring OL to the first terminal of the capacitor C1 and the second terminal of the transistor M20. At this time, the transistor M20 is diode-connected, and thus the gate-source voltage of the transistor M20 is determined in accordance with the current amount (the amount of current flowing between the source and the drain). On the assumption that the source potential of the transistor M20 is a potential supplied from the wiring VL, the gate potential of the transistor M20 is determined. By turning off the transistor M2 here, the gate potential of the transistor M20 can be held. Similarly, in the circuit HCr, a current with the amount corresponding to the weight coefficient is supplied from the wiring OLB to the first terminal of the capacitor C1*r* and the second terminal of the transistor M20*r*, whereby a potential corresponding to the current amount can be held at the gate of the transistor M20*r*.

Here, for example, the weight coefficient set in the circuit MP in FIG. 47A is "+1" when the current of $I_{ut}$ is set in the transistor M20 of the circuit MC and a current is set not to flow through the transistor M20*r* of the circuit MCr; "−1" when a current is set not to flow through the transistor M20 of the circuit MC and the current of $I_{ut}$ is set in the transistor M20*r* of the circuit MCr; and "0" when a current is set not to flow through the transistor M20 of the circuit MC and the transistor M20*r* of the circuit MCr.

When a current corresponding to a weight coefficient is set in each of the circuit HC and the circuit HCr, the gate potentials of the transistor M20 and the transistor M20*r* are determined. Here, when a potential corresponding to the value of a signal of a neuron is supplied to the wiring XL, for example, a current flowing between the circuit MP and the wiring OL and/or the wiring OLB is determined. For example, when a high-level potential is supplied as the second data of "+1" to the wiring XL, the constant voltage supplied from the wiring VL is supplied to the first terminal of the transistor M20 and the first terminal of the transistor M20*r*. Alternatively, for example, when a low-level potential is supplied as the second data of "0" to the wiring XL, the constant voltage supplied from the wiring VL is not supplied to the first terminal of the transistor M20 and the first terminal of the transistor M20*r*. That is, a current does not flow through the transistor M20 and the transistor M20*r*.

When a current with the amount $I_{ut}$ is set in the transistor M20 and a potential is supplied from the wiring VL to the source of the transistor M20, the current with the amount $I_{ut}$ flows between the first terminal and the second terminal of the transistor M20. When a current is set not to flow through the transistor M20, a current does not flow between the first terminal and the second terminal of the transistor M20 even when a potential is supplied from the wiring VL to the source of the transistor M20. Similarly, when the current with the amount $I_{ut}$ is set in the transistor M20*r* and a potential is supplied from the wiring VL to the source of the transistor M20*r*, the current with the amount $I_{ut}$ flows between the first terminal and the second terminal of the transistor M20*r*. When a current is set not to flow through the transistor M20*r*, a current does not flow between the first terminal and the second terminal of the transistor M20*r* even when a potential is supplied from the wiring VL to the source of the transistor M20*r*.

That is, the summary of the above description is as follows: when the product of a weight coefficient and a value of a signal of a neuron is "+1", the current with the amount $I_{ut}$ flows between the circuit MC and the wiring OL and a current does not flow between the circuit MCr and the wiring OLB. When the product of a weight coefficient and a value of a signal of a neuron is "−1", the current with the amount $I_{ut}$ flows between the circuit MCr and the wiring OLB and a current does not flow between the circuit MC and the wiring OL. When the product of a weight coefficient and a value of a signal of a neuron is "0", a current does not flow between the circuit MC and the wiring OL and a current does not flow between the circuit MCr and the wiring OLB.

As described above, the circuit MP in FIG. 47A can calculate the product of a weight coefficient having three levels "+1", "−1", and "0" and a signal of a neuron (an arithmetic value) having two levels "+1" and "0". In addition, like the circuit MP described in Configuration example 7, the circuit MP in FIG. 47A can calculate the product of the first data (a weight coefficient) that is a "positive multilevel value", "0", or a "negative multilevel value" and the second data (a value of a signal of a neuron) having two levels "+1" and "0", by changing the current amount set in the transistor M20 and the transistor M20*r*, for example.

Figure 47B:
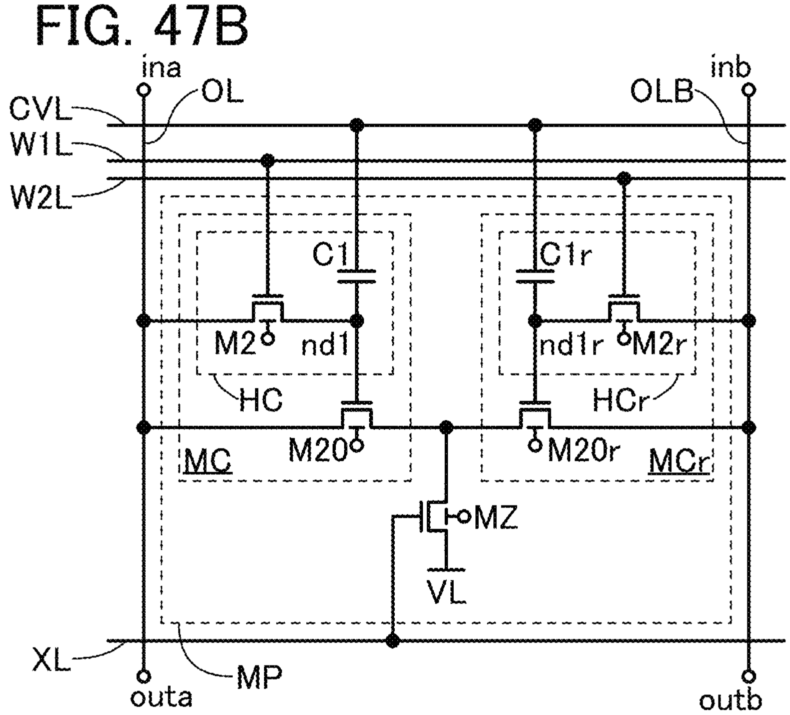
Figure 48:
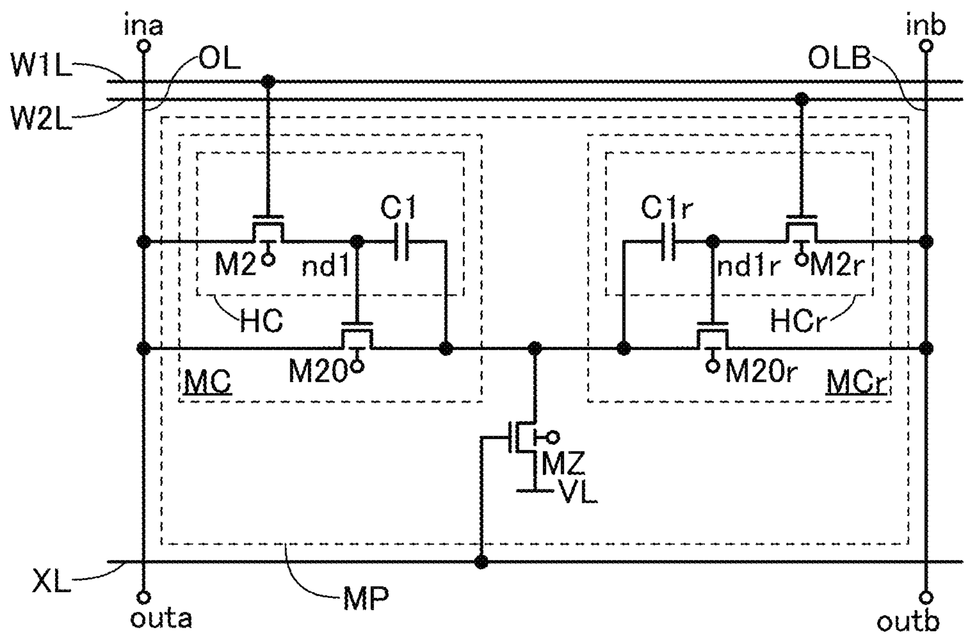
FIG. 48 is a circuit diagram illustrating a configuration example of a circuit included in a semiconductor device.

The circuit MP illustrated in FIG. 47A may be changed into the circuit MP illustrated in FIG. 47B, for example. The circuit MP illustrated in FIG. 47B is different from the circuit MP in FIG. 47A in that the second terminal of the capacitor C1 and the second terminal of the capacitor C1*r* are electrically connected to not the wiring VL but a wiring CVL. Note that the second terminal of the capacitor C1 may be connected to the first terminal of the transistor M20 or the first terminal of the transistor MZ. Similarly, the second terminal of the capacitor C1*r* may be connected to the first terminal of the transistor M20*r* or the first terminal of the transistor MZ. FIG. 48 illustrates the circuit MP in which the second terminal of the capacitor C1 is electrically connected to the first terminal of the transistor M20 and the second terminal of the capacitor C1*r* is electrically connected to the first terminal of the transistor M20*r*.

The wiring CVL functions as a wiring for supplying a constant voltage, for example. The constant voltage can be, for example, a high-level potential, a low-level potential, a ground potential, or the like.

Note that this configuration example can be combined with any of the other configuration examples and the like described in this specification as appropriate.

Note that this embodiment can be combined with any of the other embodiments in this specification as appropriate.

Embodiment 3

This embodiment describes semiconductor devices capable of product-sum operation of the multilevel first data (e.g., one of a weight coefficient and a signal of a neuron) and the multilevel second data (e.g., the other of the weight coefficient and the signal of a neuron (an arithmetic value)) and operation methods of the semiconductor devices.

Operation Method Example 1

First, described here is an operation method example of the product-sum operation of the multilevel first data (e.g., one of a weight coefficient and a signal of a neuron) and the multilevel second data (e.g., the other of the weight coefficient and the signal of a neuron (an arithmetic value)) performed using the semiconductor device described in the above embodiments, for example.

As an example, an operation method of the arithmetic circuit 150 in FIG. 11 for which the circuit MP in FIG. 21A is used is considered. To avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. For example, the circuit ACTF including an integrator circuit may have a configuration in which the load LEa and the load LEb in the circuit ACTF[j] in FIG. 6E are each a capacitor or the like.

Figures 49A, 49B, 49C:
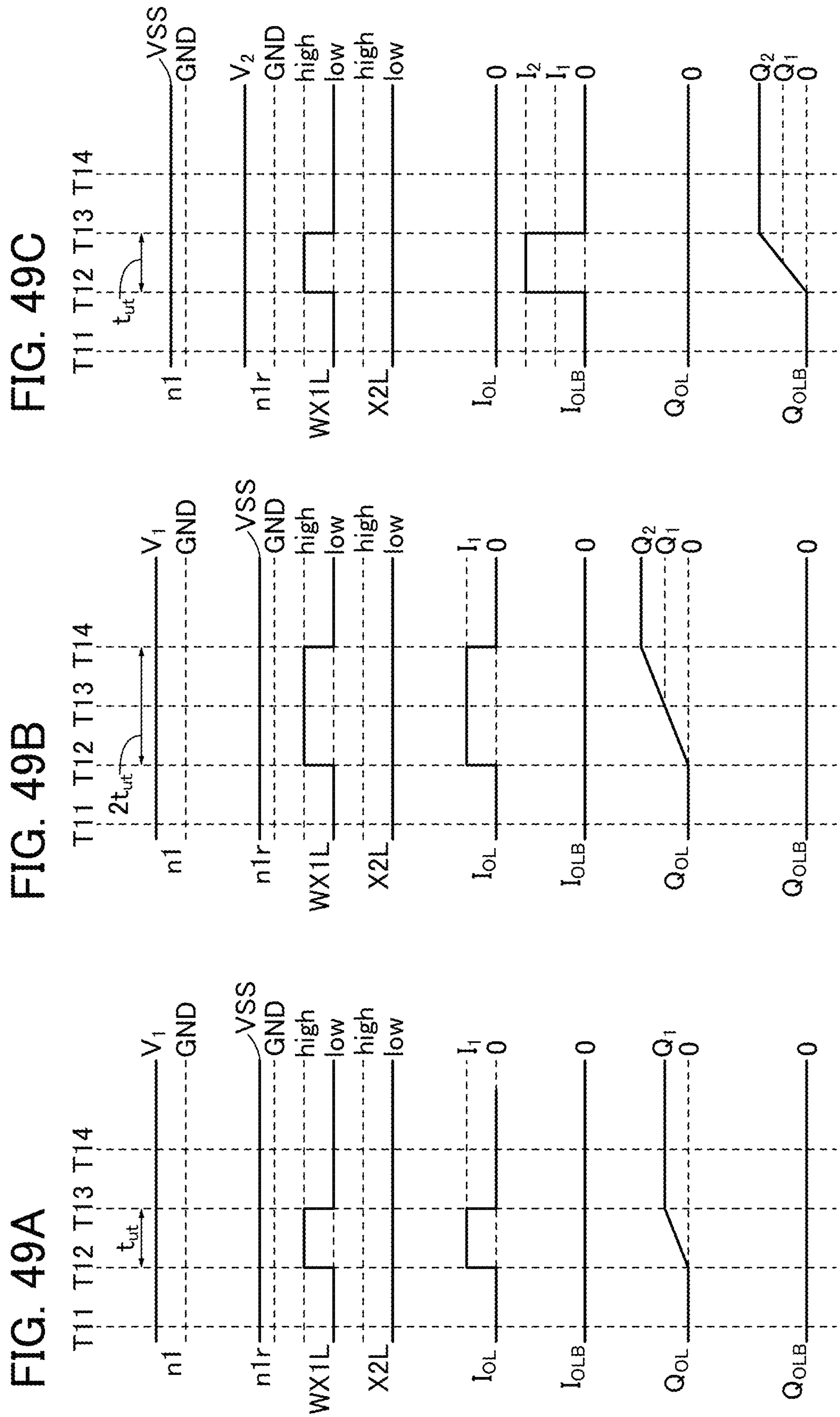
FIG. 49A to FIG. 49C are timing charts showing operation examples of a semiconductor device.

FIG. 49A is a timing chart showing the operation method example. Specifically, FIG. 49A shows changes in the potential of the node n1 of the circuit HC, the potential of the node n1*r* of the circuit HCr, the potential of the wiring WX1L, the current amount of the current $I_{OL}$ flowing through the wiring OL, the current amount of the current $I_{OLB}$ flowing through the wiring OLB, and the amount of charge accumulated in the capacitor of the integrator circuit of the circuit ACTF, from Time T11 to Time T14 and time around the period. In particular, in FIG. 49A, the amount of charge accumulated by a current flowing from the wiring OL to the capacitor of the load LEa is denoted by $Q_{OL}$, and the amount of charge accumulated by a current flowing from the wiring OLB to the capacitor of the load LEb is denoted by $Q_{OLB}$.

In the timing chart shown in FIG. 49A, a current corresponding to the multilevel first data (e.g., a weight coefficient here) is set at time before Time T11. Note that for the method for setting the current, the description in Embodiment 2 is referred to.

In the operation example of the timing chart in FIG. 49A, a weight coefficient of "+1" is set in the circuit MP in advance. Specifically, at the time before Time T11, the transistor M1 is set such that the current amount $I_1$ flows therethrough and the transistor Mir is set such that a current does not flow therethrough. Furthermore, $V_1$ is held at the node n1 of the circuit HC, and VSS is held at the node n1*r* of the circuit HCr. Note that the potential $V_1$ is a potential higher than VSS. In addition, the switch SWH and the switch SWHB are turned on and the switch SWI, the switch SWIB, the switch SWO, the switch SWOB, the switch SWL, and the switch SWLB are turned off in advance in FIG. 8A so that electrical continuity is established between the wiring VCN2 and each of the wiring OL and the wiring OLB and the potentials of the wiring OL and the wiring OLB are set to a high-level potential.

After Time T11, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB.

From Time T12 to Time T13, the second data (e.g., a value of a signal of a neuron here) is input to the circuit MP. Note that the input time from Time T12 to Time T13 is denoted by $t_{ut}$. The length of the input time corresponds to the level of the value of a signal of a neuron. That is, by changing the length of the input time, the arithmetic operation result can be changed.

In the operation example in FIG. 49A, a high-level potential is input to the wiring WX1L and a low-level potential is input to the wiring X2L as an input of the second data (a value of a signal of a neuron) to the circuit MP. Accordingly, the high-level potential is input to the gates of the transistor M3 and the transistor M3*r* and the low-level potential is input to the gates of the transistor M4 and the transistor M4*r*, so that the transistor M3 and the transistor M3*r* are turned on and the transistor M4 and the transistor M4*r* are turned off. By this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, the transistor M1 is set such that a current having the current amount of $I_1$ flows, and thus the current having the current amount of $I_1$ flows from the circuit ACTF to the wiring VE through the switching circuit TW, the wiring OL, and the circuit MC. Since the transistor M1*r* is in an off state (is set such that the current amount of 0 is supplied), a current does not flow from the circuit ACTF to the wiring VEr through the switching circuit TW, the wiring OLB, and the circuit MCr.

Here, attention is focused on the integrator circuit of the circuit ACTF. Since the second data (a value of a signal of a neuron) is input from Time T12 to Time T13, charge is continuously accumulated from Time T12 to Time T13 in the capacitor (the load LEa) of the integrator circuit included in the circuit ACTF, which has electrical continuity with the wiring OL. Ideally, charge of $t_{ut}\times I_1$ is accumulated in the capacitor at Time T13. Note that in the timing chart in FIG. 49A, the amount of charge accumulated in the capacitor from Time T12 to Time T13 is denoted by $Q_1$. In contrast, charge is not accumulated in the capacitor (the load LEb) of the integrator circuit included in the circuit ACTF, which has electrical continuity with the wiring OLB. As a result, the circuit ACTF can output the signal $z_j^{(k)}$ of a neuron, which corresponds to the charge amount $Q_1$ supplied through the wiring OL and the charge amount of 0 supplied through the wiring OLB.

Next, the case is considered where the input time of a signal of a neuron to the circuit MP in the timing chart in FIG. 49A is changed from $t_{ut}$ to $2t_{ut}$. A timing chart shown in FIG. 49B shows an operation example of the case where the input time of a signal of a neuron to the circuit MP in the timing chart in FIG. 49A is changed from $t_{ut}$ to $2t_{ut}$.

Operations before Time T12 in the timing chart in FIG. 49B are similar to those before Time T12 in the operation example of the timing chart in FIG. 49A. Thus, for the operations before Time T12 in the timing chart in FIG. 49B, the description of the operations before Time T12 in the timing chart in FIG. 49A is referred to.

From Time T12 to Time T14 in the operation example in FIG. 49B, a signal of a neuron is input to the circuit MP. As described above, the input time from Time T12 to Time T14 is $2t_{ut}$.

In the operation example in FIG. 49B, as in the operation example in FIG. 49A, a high-level potential is input to the wiring WX1L and a low-level potential is input to the wiring X2L as an input of the second data (a value of a signal of a neuron) to the circuit MP. Thus, a current having the current amount of $I_1$ flows from the circuit ACTF to the wiring VE through the switching circuit TW, the wiring OL, and the circuit MC. A current does not flow from the circuit ACTF to the wiring VEr through the switching circuit TW, the wiring OLB, and the circuit MCr.

Since the second data (a value of a signal of a neuron) is input from Time T12 to Time T14, charge is continuously accumulated from Time T12 to Time T14 in the capacitor (the load LEa) of the integrator circuit, which has electrical continuity with the wiring OL. Ideally, charge of $2t_{ut}\times I_1$ ($=2Q_1$) is accumulated in the capacitor at Time T14. Note that in the timing chart in FIG. 49B, the amount of charge accumulated in the capacitor from Time T12 to Time T14 is denoted by $Q_2$. In contrast, charge is not accumulated in the capacitor (the load LEb) of the integrator circuit included in the circuit ACTF, which has electrical continuity with the wiring OLB. As a result, the circuit ACTF can output the signal $z_j^{(k)}$ of a neuron, which corresponds to the charge amount $Q_2$ supplied through the wiring OL and the charge amount of 0 supplied through the wiring OLB.

Next, the case is considered where the weight coefficient set in the circuit MP is changed from "+1" to "−2" in the timing chart in FIG. 49A. Specifically, in the timing chart shown in FIG. 49C, preliminarily at the time before Time T11, the transistor M1 is set such that a current does not flow therethrough and the transistor M1*r* is set such that the current $I_2$ ($=2I_1$) flows therethrough. Furthermore, $V_2$ is held at the node n1*r* of the circuit HCr, and VSS is held at the node n1 of the circuit HC. Note that the potential $V_2$ is a potential higher than $V_1$ and VSS.

Operations before Time T12 in the timing chart in FIG. 49C are similar to those before Time T12 in the operation example of the timing chart in FIG. 49A. Thus, for the operations before Time T12 in the timing chart in FIG. 49C, the description of the operations before Time T12 in the timing chart in FIG. 49A is referred to.

From Time T12 to Time T13 in the operation example in FIG. 49C, a signal of a neuron is input to the circuit MP. As described above, the input time from Time T12 to Time T13 is $t_{ut}$.

In the operation example in FIG. 49C, as in the operation example in FIG. 49A, a high-level potential is input to the wiring WX1L and a low-level potential is input to the wiring X2L as an input of the second data (a value of a signal of a neuron) to the circuit MP. Thus, a current having the current amount of $I_2$ flows from the circuit ACTF to the wiring VEr through the switching circuit TW, the wiring OLB, and the circuit MCr. A current does not flow from the circuit ACTF to the wiring VE through the switching circuit TW, the wiring OL, and the circuit MC.

Since the second data (a value of a signal of a neuron) is input from Time T12 to Time T13, charge is continuously accumulated from Time T12 to Time T13 in the capacitor (the load LEb) of the integrator circuit, which has electrical continuity with the wiring OLB. Ideally, charge of $t_{ut}\times I_2$ ($=2t_{ut}\times I_1=2Q_1$) is accumulated in the capacitor at Time T13. Note that in the timing chart in FIG. 49C, the amount of charge accumulated in the capacitor from Time T12 to Time T13 is denoted by $Q_2$. In contrast, charge is not accumulated in the capacitor (the load LEa) of the integrator circuit included in the circuit ACTF, which has electrical continuity with the wiring OL. As a result, the circuit ACTF can output the signal $z_j^{(k)}$ of a neuron, which corresponds to the charge amount of 0 supplied through the wiring OL and the charge amount $Q_2$ supplied through the wiring OLB.

As described in the operation examples in FIG. 49A to FIG. 49C, the second data (a value of a signal of a neuron) can be determined in accordance with the input period of the second data to the circuit MP, and the arithmetic operation result output from the circuit ACTF is determined in accordance with the length of the input period. Thus, by defining the second data (a value of a signal of a neuron) in accordance with the length of the input period and the potentials applied to the wiring WX1L and the wiring X2L, the circuit MP can process the three or higher-level second data (a value of a signal of a neuron) and can perform the product-sum operation of the multilevel first data (a weight coefficient) and the three or higher-level second data (a value of a signal of a neuron) and/or arithmetic operation of an activation function.

In this operation example, the second data (a value of a signal of a neuron) input to the circuit MP can be defined as follows, for example. The second data (a value of a signal of a neuron) at the time when a high-level potential is input to the wiring WX1L and a low-level potential is input to the wiring X2L for an input period of $t_{ut}$ is "+1"; the second data (a value of a signal of a neuron) at the time when a high-level potential is input to the wiring WX1L and a low-level potential is input to the wiring X2L for an input period of $2t_{ut}$ is "+2"; and the second data (a value of a signal of a neuron) at the time when a high-level potential is input to the wiring WX1L and a low-level potential is input to the wiring X2L for an input period of $3t_{ut}$ is "+3". In addition, the second data (a value of a signal of a neuron) at the time when a low-level potential is input to the wiring WX1L and a high-level potential is input to the wiring X2L for an input period of $t_{ut}$ is "−1"; the second data (a value of a signal of a neuron) at the time when a low-level potential is input to the wiring WX1L and a high-level potential is input to the wiring X2L for an input period of $2t_{ut}$ is "−2"; and the second data (a value of a signal of a neuron) at the time when a low-level potential is input to the wiring WX1L and a high-level potential is input to the wiring X2L for an input period of $3t_{ut}$ is "−3". Furthermore, the second data (a value of a signal of a neuron) at the time when a low-level potential is input to the wiring WX1L and a low-level potential is input to the wiring X2L is "0".

By defining the second data (a value of a signal of a neuron) input to the circuit MP as described above, "+1" can be obtained as the product of the first data (a weight coefficient) of "+1" and the second data (a value of a signal of a neuron) of "+1" in the operation example shown in FIG. 49A. In the operation example shown in FIG. 49B, "+2" can be obtained as the product of the first data (a weight coefficient) of "+1" and the second data (a value of a signal of a neuron) of "+2". In the operation example shown in FIG. 49C, "−2" can be obtained as the product of the first data (a weight coefficient) of "−2" and the second data (a value of a signal of a neuron) of "+1". The following table shows the charge amount $Q_{OL}$ supplied through the wiring OL and the charge amount $Q_{OLB}$ supplied through the wiring OLB in the case where the first data (a weight coefficient) is any one of "−2", "−1", "0", 1, and "+2" and the second data (a value of a signal of a neuron) is any one of "−2", "−1", "0", "+1", and "+2" in this operation example. Note that in the following table, a high-level potential is denoted by high and a low-level potential is denoted by low.

TABLE 6

| | | Value of signal of neuron | | | | | | |
|---|---|---|---|---|---|---|---|---|
| | | −3 (WX1L: low, X2L: high, $3t_{ut}$) | −2 (WX1L: low, X2L: high, $2t_{ut}$) | −1 (WX1L: low, X2L: high, $t_{ut}$) | 0 (WX1L: low, X2L: low) | +1 (WX1L: high, X2L: low, $t_{ut}$) | +2 (WX1L: high, X2L: low, $2t_{ut}$) | +3 (WX1L: high, X2L: low, $3t_{ut}$) |
| Weight coefficient | −3 | $Q_{OL} = 9Q_1$, $Q_{OLB} = 0$ | $Q_{OL} = 6Q_1$, $Q_{OLB} = 0$ | $Q_{OL} = 3Q_1$, $Q_{OLB} = 0$ | $Q_{OL} = 0$, $Q_{OLB} = 0$ | $Q_{OL} = 0$, $Q_{OLB} = 3Q_1$ | $Q_{OL} = 0$, $Q_{OLB} = 6Q_1$ | $Q_{OL} = 0$, $Q_{OLB} = 9Q_1$ |
| | −2 | $Q_{OL} = 2Q_1$, $Q_{OLB} = 0$ | $Q_{OL} = 4Q_1$, $Q_{OLB} = 0$ | $Q_{OL} = 2Q_1$, $Q_{OLB} = 0$ | $Q_{OL} = 0$, $Q_{OLB} = 0$ | $Q_{OL} = 0$, $Q_{OLB} = 2Q_1$ | $Q_{OL} = 0$, $Q_{OLB} = 4Q_1$ | $Q_{OL} = 0$, $Q_{OLB} = 6Q_1$ |
| | −1 | $Q_{OL} = 3Q_1$, $Q_{OLB} = 0$ | $Q_{OL} = 2Q_1$, $Q_{OLB} = 0$ | $Q_{OL} = Q_1$, $Q_{OLB} = 0$ | $Q_{OL} = 0$, $Q_{OLB} = 0$ | $Q_{OL} = 0$, $Q_{OLB} = Q_1$ | $Q_{OL} = 0$, $Q_{OLB} = 2Q_1$ | $Q_{OL} = 0$, $Q_{OLB} = 3Q_1$ |
| | 0 | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ | $Q_{OL} = 0$, $Q_{OLB} = 0$ |
| | +1 | $Q_{OL} = 0$, $Q_{OLB} = 3Q_1$ | $Q_{OL} = 0$, $Q_{OLB} = 2Q_1$ | $Q_{OL} = 0$, $Q_{OLB} = Q_1$ | $Q_{OL} = 0$, $Q_{OLB} = 0$ | $Q_{OL} = Q_1$, $Q_{OLB} = 0$ | $Q_{OL} = 2Q_1$, $Q_{OLB} = 0$ | $Q_{OL} = 3Q_1$, $Q_{OLB} = 0$ |
| | +2 | $Q_{OL} = 0$, $Q_{OLB} = 6Q_1$ | $Q_{OL} = 0$, $Q_{OLB} = 4Q_1$ | $Q_{OL} = 0$, $Q_{OLB} = 2Q_1$ | $Q_{OL} = 0$, $Q_{OLB} = 0$ | $Q_{OL} = 2Q_1$, $Q_{OLB} = 0$ | $Q_{OL} = 4Q_1$, $Q_{OLB} = 0$ | $Q_{OL} = 6Q_1$, $Q_{OLB} = 0$ |
| | +3 | $Q_{OL} = 0$, $Q_{OLB} = 9Q_1$ | $Q_{OL} = 0$, $Q_{OLB} = 6Q_1$ | $Q_{OL} = 0$, $Q_{OLB} = 3Q_1$ | $Q_{OL} = 0$, $Q_{OLB} = 0$ | $Q_{OL} = 3Q_1$, $Q_{OLB} = 0$ | $Q_{OL} = 6Q_1$, $Q_{OLB} = 0$ | $Q_{OL} = 9Q_1$, $Q_{OLB} = 0$ |

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

Although the first data (a weight coefficient) set in the circuit MP is "+1" in the operation examples shown in FIG. 49A and FIG. 49B and the first data (a weight coefficient) set in the circuit MP is "−2" in the operation example shown in FIG. 49C, calculation may be performed using the first data (a weight coefficient) other than "+1" and "−2". As described in Embodiment 1 and Embodiment 2, an analog value or the like can be set in the circuit MP as the first data (a weight coefficient); thus, the amount of charge accumulated in the capacitor of the integrator circuit included in the circuit ACTF can also be calculated in accordance with the first data (a weight coefficient) that is an analog value or the like.

In the operation examples shown in FIG. 49A to FIG. 49C, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB. Note that in FIG. 49A to FIG. 49C, the potential of the wiring WX1L begins to change at Time T12. That is, even when the period during which the potential of the wiring WX1L is a high-level potential is different between FIG. 49A to FIG. 49C, the potential of the wiring WX1L changes from a low-level potential to a high-level potential at the same time (Time T12); however, one embodiment of the present invention is not limited thereto. For example, even when the period during which the potential of the wiring WX1L is a high-level potential is different between FIG. 49A to FIG. 49C, operation may be performed such that the potential of the wiring WX1L changes from a high-level potential to a low-level potential at the same time. Alternatively, even when the period during which the potential of the wiring WX1L is a high-level potential is different between FIG. 49A to FIG. 49C, operation may be performed such that the time in the middle of the period during which the potential of the wiring WX1L is a high-level potential is the same.

Although the arithmetic circuit 150 in FIG. 11 is used as an example in this operation example, operation similar to that of this operation example can be performed by changing the arithmetic circuit to another one according to circumstances. For example, the case is considered where the circuit MP in FIG. 47B is used for the arithmetic circuit 140 in FIG. 7 and the circuits ACTF[1] to ACTF[n] included in the circuit AFP each have a configuration of an integrator circuit (or a current-charge (IQ) converter circuit). In the case of this circuit configuration, the product of the first data that is any of a "positive multilevel value", a "negative multilevel value", and "0" and the second data that is a "positive multilevel value" or "0" can be calculated as in this operation example, by setting the amount of current flowing through the transistor M20 and the transistor M20*r* in accordance with the first data (a weight coefficient) and setting a period for supplying a high-level potential to the wiring XL in accordance with the second data (a value of a signal of a neuron). Alternatively, the calculation may be performed using an analog value as the first data and/or the second data.

Note that this operation method example can be combined with any of the other operation method examples and the like described in this specification as appropriate.

Operation Method Example 2

Next, other operation method examples different from the operation examples shown in FIG. 49A to FIG. 49C are described.

As an example, an operation method of the arithmetic circuit 150 in FIG. 11 for which the circuit MP in FIG. 21A is used is considered, as in FIG. 49A to FIG. 49C. To avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. For example, the integrator circuit may have a configuration in which the load LEa and the load LEb in the circuit ACTF[j] in FIG. 6E are each a capacitor or the like.

Figure 50C:
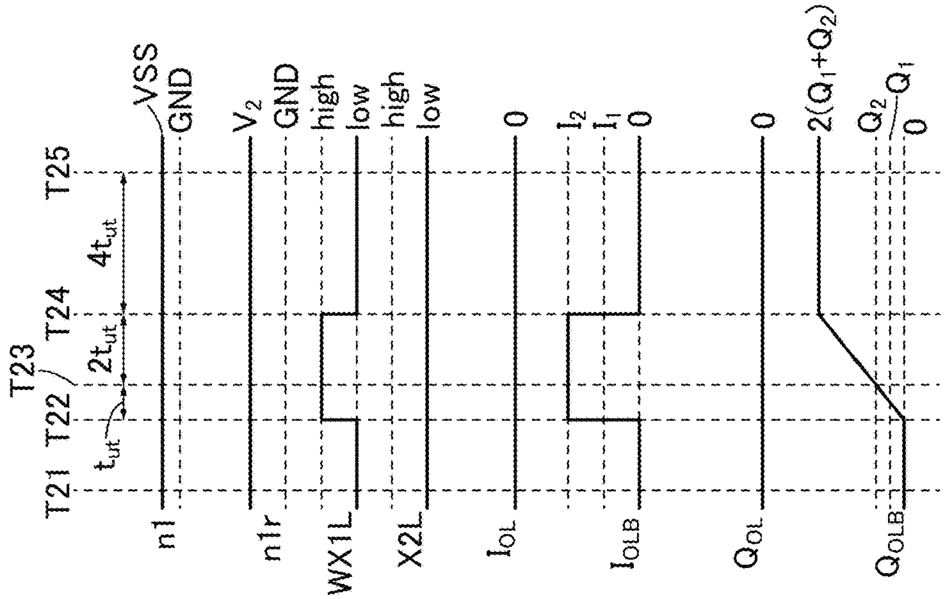
FIG. 50A to FIG. 50C are timing charts showing operation examples of a semiconductor device.
Figure 50B:
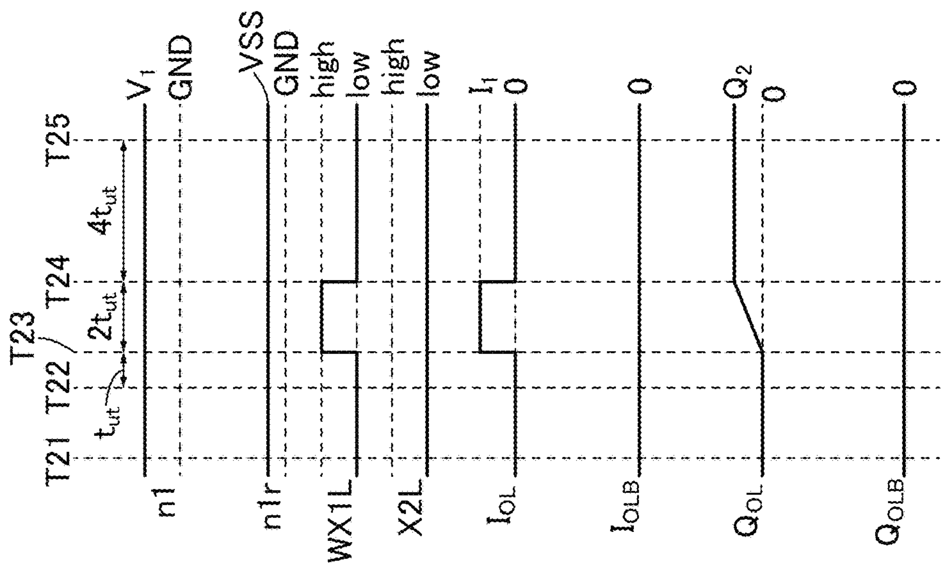
Figure 50A:
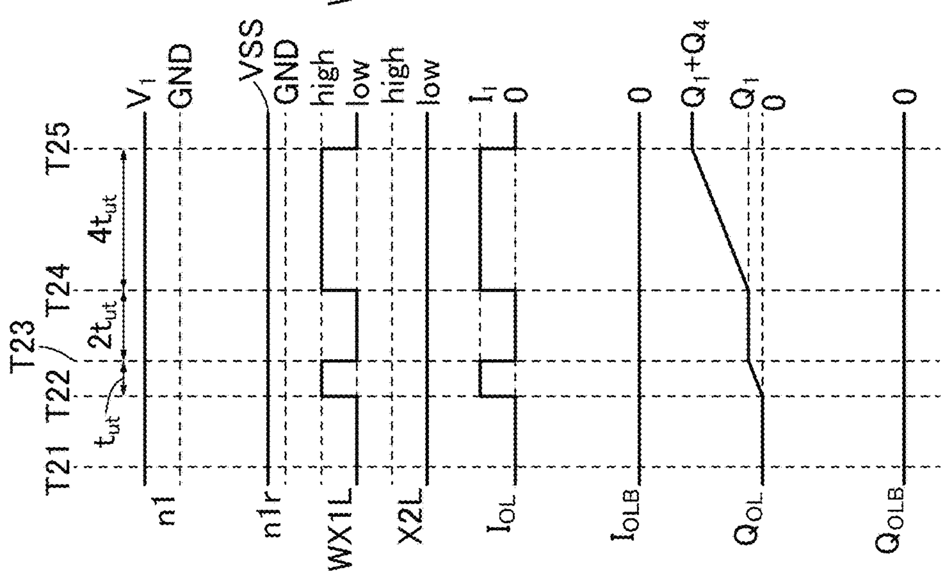

FIG. 50A is a timing chart showing the operation method example. Specifically, FIG. 50A shows changes in the potential of the node n1 of the circuit HC, the potential of the node n1*r* of the circuit HCr, the potential of the wiring WX1L, the current amount of the current $I_{OL}$ flowing through the wiring OL, the current amount of the current $I_{OLB}$ flowing through the wiring OLB, and the amount of charge accumulated in the capacitor of the integrator circuit of the circuit ACTF, from Time T21 to Time T25 and time around the period. In particular, in FIG. 50A, the amount of charge accumulated by a current flowing from the wiring OL to the capacitor of the load LEa is denoted by $Q_{OL}$, and the amount of charge accumulated by a current flowing from the wiring OLB to the capacitor of the load LEb is denoted by $Q_{OLB}$.

In the timing chart shown in FIG. 50A, a current corresponding to the multilevel first data (e.g., a weight coefficient here) is set at time before Time T21. Note that for the method for setting the current, the description in Embodiment 2 is referred to.

In the operation example of the timing chart in FIG. 50A, the first data (e.g., a weight coefficient here) of "+1" is set in the circuit MP in advance. Specifically, at the time before Time T21, the transistor M1 is set such that the current amount $I_1$ flows therethrough and the transistor M1*r* is set such that a current does not flow therethrough. Furthermore, $V_1$ is held at the node n1 of the circuit HC, and VSS is held at the node n1*r* of the circuit HCr. Note that the potential $V_1$ is a potential higher than VSS. In addition, the switch SWH and the switch SWHB are turned on and the switch SWI, the switch SWIB, the switch SWO, the switch SWOB, the switch SWL, and the switch SWLB are turned off in advance in FIG. 8A so that electrical continuity is established between the wiring VCN2 and each of the wiring OL and the wiring OLB and the potentials of the wiring OL and the wiring OLB are set to a high-level potential.

After Time T21, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB.

After Time T22, the second data (e.g., a value of a signal of a neuron here) is input to the circuit MP. Note that in the operation example in FIG. 50A, the input time of the second data (a value of a signal of a neuron) to the circuit MP is divided into a period from Time T22 to Time T23, a period from Time T23 to Time T24, and a period from Time T24 to Time T25. Specifically, the input time from Time T22 to Time T23 is $t_{ut}$, the input time from Time T23 to Time T24 is $2t_{ut}$, and the input time from Time T24 to Time T25 is $4t_{ut}$, which are respectively referred to as a first subperiod, a second subperiod, and a third subperiod in this specification and the like. The length of the second subframe is preferably 1.8 times or more or 1.9 times or more the length of the first subperiod, and is preferably 2.1 times or less or 2.2 times or less the length of the first subperiod. The length of the third subperiod is preferably 3.6 times or more or 3.8 times or more the length of the first subperiod, and is preferably 4.2 times or less or 4.4 times or less the length of the first subperiod. Note that any of the lower limits and the upper limits described above can be combined with each other.

In the operation example in FIG. 50A, a high-level potential is input to the wiring WX1L and a low-level potential is input to the wiring X2L as an input of the second data (a value of a signal of a neuron) to the circuit MP in the first subperiod and the third subperiod. Accordingly, the high-level potential is input to the gates of the transistor M3 and the transistor M3*r* and the low-level potential is input to the gates of the transistor M4 and the transistor M4*r*, so that the transistor M3 and the transistor M3*r* are turned on and the transistor M4 and the transistor M4*r* are turned off. By this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, the transistor M1 is set such that the current amount of $I_1$ is supplied, and thus a current having the current amount of $I_1$ flows from the circuit ACTF to the wiring VE through the switching circuit TW, the wiring OL, and the circuit MC in the first subperiod and the third subperiod. In the second subperiod, a low-level potential is input to the wiring WX1L and the wiring X2L and the low-level potential is input to the gates of the transistor M3, the transistor M3*r*, the transistor M4, and the transistor M4*r*; thus, the transistor M3, the transistor M3*r*, the transistor M4, and the transistor M4*r* are turned off, and a current does not flow from the circuit ACTF to the wiring VE through the switching circuit TW, the wiring OL, and the circuit MC.

Since the transistor M1*r* is in an off state (is set such that the current amount of 0 is supplied) in the first subperiod, the second subperiod, and the third subperiod, a current does not flow from the circuit ACTF to the wiring VEr through the switching circuit TW, the wiring OLB, and the circuit MCr.

Here, attention is focused on the integrator circuit of the circuit ACTF. Since the second data (a signal of a neuron) is input after Time T22, charge is continuously accumulated after Time T22 in the capacitor (the load LEa) of the integrator circuit included in the circuit ACTF, which has electrical continuity with the wiring OL. Ideally, charge of $t_{ut}\times I_1$ is accumulated in the capacitor in the first subperiod and charge of $4t_{ut}\times I_1$ is accumulated in the third subperiod. Note that in the timing chart in FIG. 50A, the amount of charge accumulated in the capacitor in the first subperiod is denoted by $Q_1$ and the amount of charge accumulated in the capacitor in the third subperiod is denoted by $Q_4$. Thus, the amount of charge accumulated in the capacitor after Time T25 is denoted by $Q_1+Q_4$. In contrast, charge is not accumulated in the capacitor (the load LEb) of the integrator circuit included in the circuit ACTF, which has electrical continuity with the wiring OLB. As a result, the circuit ACTF can output the signal $z_j^{(k)}$ of a neuron, which corresponds to the charge amount $Q_1+Q_4$ (=$5Q_1$) supplied through the wiring OL and the charge amount of 0 supplied through the wiring OLB.

Next, the case is considered where the input period of a signal of a neuron to the circuit MP in the timing chart in FIG. 50A is changed from the first subperiod and the third subperiod to the second subperiod. A timing chart shown in FIG. 50B shows an operation example of the case where the input period of a signal of a neuron to the circuit MP in the timing chart in FIG. 50A is changed from the first subperiod and the third subperiod to the second subperiod.

Operations before Time T22 in the timing chart in FIG. 50B are similar to those before Time T22 in the operation example of the timing chart in FIG. 50A. Thus, for the operations before Time T22 in the timing chart in FIG. 50B, the description of the operations before Time T22 in the timing chart in FIG. 50A is referred to.

In the operation example in FIG. 50B, a signal of a neuron is input to the circuit MP after Time T22. Specifically, a signal of a neuron is input to the circuit MP in the second subperiod, as described above.

In the operation example in FIG. 50B, a high-level potential is input to the wiring WX1L and a low-level potential is input to the wiring X2L as an input of a signal of a neuron (an arithmetic value) to the circuit MP in the second subperiod. Thus, a current having the current amount of $I_1$ flows from the circuit ACTF to the wiring VE through the switching circuit TW, the wiring OL, and the circuit MC in the second subperiod. Since a low-level potential is input to the wiring WX1L and the wiring X2L in the first subperiod and the third subperiod, the transistor M3, the transistor M3*r*, the transistor M4, and the transistor M4*r* are turned off, and a current does not flow from the circuit ACTF to the wiring VE through the switching circuit TW, the wiring OL, and the circuit MC.

Since the transistor M1*r* is in an off state (is set such that the current amount of 0 is supplied) in the first subperiod, the second subperiod, and the third subperiod, a current does not flow from the circuit ACTF to the wiring VEr through the switching circuit TW, the wiring OLB, and the circuit MCr.

Since the second data (a value of a signal of a neuron) is input after Time T22, charge is continuously accumulated after Time T22 in the capacitor (the load LEa) of the integrator circuit, which has electrical continuity with the wiring OL. Ideally, charge of $2t_{ut}\times I_1$ is accumulated in the capacitor at Time T25. Note that in the timing chart in FIG. 50B, the amount of charge accumulated in the capacitor after Time T22 is denoted by $Q_2$. In contrast, charge is not accumulated in the capacitor (the load LEb) of the integrator circuit included in the circuit ACTF, which has electrical continuity with the wiring OLB. As a result, the circuit ACTF can output the signal $z_j^{(k)}$ of a neuron, which corresponds to the charge amount $Q_2$ (=$2Q_1$) supplied through the wiring OL and the charge amount of 0 supplied through the wiring OLB.

Next, the case is considered where the weight coefficient set in the circuit MP in the timing chart in FIG. 50A is changed from "+1" to "−2" and the input period of the second data (a signal of a neuron) is changed from the first subperiod and the third subperiod to the first subperiod and the second subperiod.

In the timing chart shown in FIG. 50C, preliminarily at the time before Time T21, the transistor M1 is set such that a current does not flow therethrough and the transistor M1*r* is set such that the current $I_2$ (=$2I_1$) flows therethrough. Furthermore, VSS is held at the node n1 of the circuit HC, and $V_2$ is held at the node n1*r* of the circuit HCr. Note that the potential $V_2$ is a potential higher than $V_1$ and VSS.

Operations before Time T22 in the timing chart in FIG. 50C are similar to those before Time T22 in the operation example of the timing chart in FIG. 50A. Thus, for the operations before Time T22 in the timing chart in FIG. 50C, the description of the operations before Time T22 in the timing chart in FIG. 50A is referred to.

In the operation example in FIG. 50C, a signal of a neuron is input to the circuit MP after Time T22. As described above, a signal of a neuron is input to the circuit MP in the first subperiod and the second subperiod.

In the operation example in FIG. 50C, a high-level potential is input to the wiring WX1L and a low-level potential is input to the wiring X2L as an input of the second data (a value of a signal of a neuron) to the circuit MP in the first subperiod and the second subperiod. Thus, a current having the current amount of $I_2$ flows from the circuit ACTF to the wiring VEr through the switching circuit TW, the wiring OLB, and the circuit MCr in the first subperiod and the second subperiod. Since a low-level potential is input to the wiring WX1L and the wiring X2L in the third subperiod, the transistor M3, the transistor M3*r*, the transistor M4, and the transistor M4*r* are turned off, and a current does not flow from the circuit ACTF to the wiring VEr through the switching circuit TW, the wiring OLB, and the circuit MCr.

Since the transistor M1 is in an off state (is set such that the current amount of 0 is supplied) in the first subperiod, the second subperiod, and the third subperiod, a current does not flow from the circuit ACTF to the wiring VE through the switching circuit TW, the wiring OL, and the circuit MC.

Since the second data (a signal of a neuron) is input after Time T22, charge is continuously accumulated after Time T22 in the capacitor (the load LEb) of the integrator circuit, which has electrical continuity with the wiring OLB. Ideally, charge of $6t_{ut}\times I_1$ ($=t_{ut}\times 2I_1+2t_{ut}\times 2I_1$) is accumulated in the capacitor at Time T25. Note that in the timing chart in FIG. 50C, the amount of charge accumulated in the capacitor after Time T25 is denoted by $2(Q_1+Q_2)$. In contrast, charge is not accumulated in the capacitor (the load LEa) of the integrator circuit included in the circuit ACTF, which has electrical continuity with the wiring OL. As a result, the circuit ACTF can output the signal $z_j^{(k)}$ of a neuron, which corresponds to the charge amount of 0 supplied through the wiring OL and the charge amount $2(Q_1+Q_2)$ ($=6Q_1$) supplied through the wiring OLB.

As described in the operation examples shown in FIG. 50A to FIG. 50C, the second data (a value of a signal of a neuron) can be determined in accordance with one or more periods selected from a plurality of subperiods provided in a period during which the second data (a value of a signal of a neuron) can be input to the circuit MP, and the arithmetic operation result output from the circuit ACTF is determined in accordance with the selected period(s). Thus, by defining the second data (a value of a signal of a neuron) in accordance with the selected subperiod(s) and the potentials applied to the wiring WX1L and the wiring X2L, the circuit MP can process the three or higher-level second data (a value of a signal of a neuron) and can perform the product-sum operation of the multilevel first data (a weight coefficient) and the three or higher-level second data (a value of a signal of a neuron) and/or arithmetic operation of an activation function.

In this operation example, the second data (a value of a signal of a neuron) input to the circuit MP can be defined as follows, for example. The second data (a value of a signal of a neuron) at the time when a high-level potential is input to the wiring WX1L and a low-level potential is input to the wiring X2L only in the first subperiod is "+1"; the second data (a value of a signal of a neuron) at the time when a high-level potential is input to the wiring WX1L and a low-level potential is input to the wiring X2L only in the second subperiod is "+2"; and the second data (a value of a signal of a neuron) at the time when a high-level potential is input to the wiring WX1L and a low-level potential is input to the wiring X2L only in the third subperiod is "+4". The second data (a value of a signal of a neuron) at the time when a low-level potential is input to the wiring WX1L and a high-level potential is input to the wiring X2L only in the first subperiod is "−1"; the second data (a value of a signal of a neuron) at the time when a low-level potential is input to the wiring WX1L and a high-level potential is input to the wiring X2L only in the second subperiod is "−2"; and the second data (a value of a signal of a neuron) at the time when a low-level potential is input to the wiring WX1L and a high-level potential is input to the wiring X2L only in the third subperiod is "−4". Furthermore, the second data (a value of a signal of a neuron) at the time when a low-level potential is input to the wiring WX1L and a low-level potential is input to the wiring X2L in the first subperiod, the second subperiod, and the third subperiod is "0".

In the case where the second data (a value of a signal of a neuron) is to be "+3", a high-level potential is input to the wiring WX1L and a low-level potential is input to the wiring X2L only in the first subperiod and the second subperiod, and in the case where the second data (a value of a signal of a neuron) is to be "+5", a high-level potential is input to the wiring WX1L and a low-level potential is input to the wiring X2L in the first subperiod and the third subperiod. In the case where the second data (a value of a signal of a neuron) is to be "−6", a low-level potential is input to the wiring WX1L and a high-level potential is input to the wiring X2L only in the second subperiod and the third subperiod, and in the case where the second data (a value of a signal of a neuron) is to be "−7", a low-level potential is input to the wiring WX1L and a high-level potential is input to the wiring X2L in the first subperiod, the second subperiod, and the third subperiod.

By defining the second data (a value of a signal of a neuron) input to the circuit MP as described above, "+5" can be obtained as the product of the first data (a weight coefficient) of "+1" and the second data (a value of a signal of a neuron) of "+5" in the operation example shown in FIG. 50A. In the operation example shown in FIG. 50B, "+2" can be obtained as the product of the first data (a weight coefficient) of "+1" and the second data (a value of a signal of a neuron) of "+2". In the operation example shown in FIG. 50C, "−6" can be obtained as the product of the first data (a weight coefficient) of "−2" and the second data (a value of a signal of a neuron) of "+3".

One embodiment of the present invention is not limited to the above definition. Although the first subperiod, the second subperiod, and the third subperiod are provided as periods during which the second data (a value of a signal of a neuron) can be input in the above description, four or more subperiods may be provided. For example, a period during which the second data (a value of a signal of a neuron) can be input is divided into the first subperiod to a T-th subperiod (T is an integer greater than or equal to 4), and the length of an s-th subperiod (s is an integer greater than or equal to 4 and less than or equal to T) is set to $2^{(s-1)}\times t_{ut}$. Alternatively, for example, a period during which the second data (a value of a signal of a neuron) can be input may be divided into the first subperiod to the T-th subperiod (Tis an integer greater than or equal to 4), and the length of the s-th subperiod (s is an integer greater than or equal to 4 and less than or equal to T) may be set to $s\times t_{ut}$. Alternatively, the second data (a value of a signal of a neuron) may be defined as a real number; for example, the second data (a value of a signal of a neuron) at the time when a high-level potential is input to the wiring WX1L and a low-level potential is input to the wiring X2L only in the first subperiod may be "+0.1", the second data (a value of a signal of a neuron) at the time when a high-level potential is input to the wiring WX1L and a low-level potential is input to the wiring X2L only in the second subperiod may be "+0.2", and the second data (a value of a signal of a neuron) at the time when a high-level potential is input to the wiring WX1L and a low-level potential is input to the wiring X2L only in the third subperiod may be "+0.4".

Although the first data (a weight coefficient) set in the circuit MP is "+1" in the operation examples shown in FIG. 50A and FIG. 50B and the first data (a weight coefficient) set in the circuit MP is "+2" in the operation example shown in FIG. 50C, calculation may be performed using the first data (a weight coefficient) other than "+1" and "+2". As described in Embodiment 1 and Embodiment 2, a negative value, a multilevel value, an analog value, or the like can be set in the circuit MP as the first data (a weight coefficient); thus, the amount of charge accumulated in the capacitor of the integrator circuit included in the circuit ACTF can also be calculated in accordance with the first data (a weight coefficient) that is a negative value, a multilevel value, an analog value, or the like.

In the operation examples shown in FIG. 50A to FIG. 50C, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

In the configuration where a plurality of subperiods are provided as periods during which the second data (a value of a signal of a neuron) can be input, one or more subperiods are selected from the plurality of subperiods, and signals are input in the selected period(s) as in the operation examples in FIG. 50A to FIG. 50C, the length of each subperiod is preferably determined in advance at a circuit design stage, for example. Such a circuit configuration might enable easier and/or more efficient layout of the arithmetic circuit than the circuit configuration required for the operation examples in FIG. 49A to FIG. 49C.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 3

Figure 51:
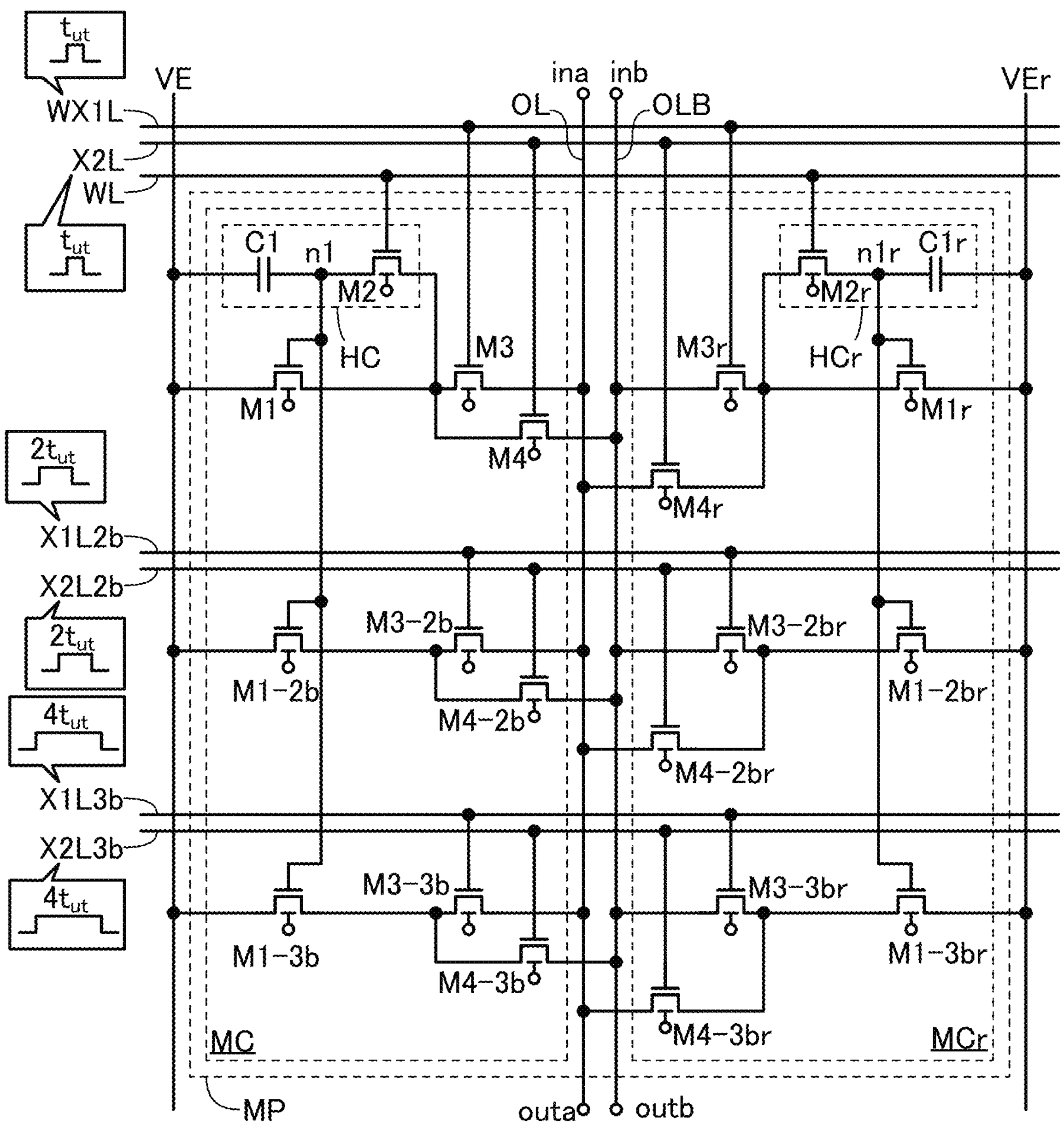
FIG. 51 is a circuit diagram illustrating a configuration example of a circuit included in a semiconductor device.

Described here is an operation method example of the arithmetic circuit 150 in FIG. 11 for which the circuit MP in FIG. 51 is used.

As in Operation method example 1 and Operation method example 2, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. For example, the circuit ACTF may have a configuration in which the load LEa and the load LEb in the circuit ACTF[j] in FIG. 6E are each a capacitor or the like.

FIG. 51 shows a circuit configuration similar to that of the circuit MP illustrated in FIG. 26. Note that the sizes, e.g., the W lengths and the L lengths, of the transistor M1, the transistor M1*r*, the transistor M1-2*b*, the transistor M1-2*br*, the transistor M1-3*b*, and the transistor M1-3*br* are preferably equal to each other. This operation method example is different from the operation example of the circuit MP in FIG. 26 described in Embodiment 2.

Specifically, in inputting the second data (e.g., a value of a signal of a neuron here) to the circuit MP, when the input time of a high-level potential to one of the wiring WX1L and the wiring X2L is $t_{ut}$, the input time of a high-level potential to one of the wiring X1L2*b* and the wiring X2L2*b* is $2t_{ut}$ and the input time of a high-level potential to one of the wiring X1L3*b* and the wiring X2L3*b* is $4t_{ut}$ in the operation. That is, the operation is performed such that when the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$ and the time during which the transistor M3-3*b* and the transistor M3-3*br* are in an on state or the transistor M4-3*b* and the transistor M4-3*br* are in an on state is $4t_{ut}$. Note that to show the difference in operation between the circuit MP in FIG. 26 and the circuit MP in FIG. 51, FIG. 51 shows schematic views of pulse voltages and the input times around the reference numerals of the wiring WX1L, the wiring X2L, the wiring X1L2*b*, the wiring X2L2*b*, the wiring X1L3*b*, and the wiring X2L3*b*.

As described in Operation method example 1 and Operation method example 2, the amount of charge flowing from the wiring OL or the wiring OLB to the wiring VE through the transistor M1 is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1*r* is determined by setting the first data (a weight coefficient) in the circuit MP and setting the time during which the transistor M3*r* or the transistor M4*r* is in an on state.

Similarly, the amount of charge flowing from the wiring OL or the wiring OLB to the wiring VE through the transistor M1-2*b* and the amount of charge flowing from the wiring OL or the wiring OLB to the wiring VEr through the transistor M1-2*br* are also determined by setting the times during which the transistor M3-2*b*, the transistor M3-2*br*, the transistor M4-2*b*, and the transistor M4-2*br* are in an on state. In addition, the amount of charge flowing from the wiring OL or the wiring OLB to the wiring VE through the transistor M1-3*b* and the amount of charge flowing from the wiring OL or the wiring OLB to the wiring VEr through the transistor M1-3*br* are also determined by setting the times during which the transistor M3-3*b*, the transistor M3-3*br*, the transistor M4-3*b*, and the transistor M4-3*br* are in an on state.

Thus, the second data (a value of a signal of a neuron) set in the circuit MP can be defined as in the following table.

TABLE 7

| Signal | WX1L ($t_{ut}$) | X2L ($t_{ut}$) | X1L2b ($2t_{ut}$) | X2L2b ($2t_{ut}$) | X1L3b ($4t_{ut}$) | X2L2b ($4t_{ut}$) |
|---|---|---|---|---|---|---|
| 0 | low | low | low | low | low | low |
| +1 | high | low | low | low | low | low |
| +2 | low | low | high | low | low | low |
| +3 | high | low | high | low | low | low |
| +4 | low | low | low | low | high | low |
| +5 | high | low | low | low | high | low |
| +6 | low | low | high | low | high | low |
| +7 | high | low | high | low | high | low |
| −1 | low | high | low | low | low | low |
| −2 | low | low | low | high | low | low |
| −3 | low | high | low | high | low | low |
| −4 | low | low | low | low | low | high |
| −5 | low | high | low | low | low | high |
| −6 | low | low | low | high | low | high |
| −7 | low | high | low | high | low | high |

Here, the first data (a weight coefficient) of "+1" is set in the circuit MIP in advance, for example. Specifically, the transistor M1 is set such that the current amount of $I_1$ is supplied, and the transistor M1*r*, the transistor M1-2*br*, and the transistor M1-3*br* are in an off state.

In the circuit MC, the sizes of the transistor M1, the transistor M1-2*b*, and the transistor M1-3*b* are equal to each other, the gates of the transistor M1, the transistor M1-2*b*, and the transistor M1-3*b* are electrically connected to the node n1 of the circuit UC, and the first terminals of the transistor M1, the transistor M1-2*b*, and the transistor M1-3*b* are electrically connected to the wiring VE; thus, almost equal currents flow between the sources and the drains of the transistor M1, the transistor M1-2*b*, and the transistor M1-3*b*. The amount of the current is denoted by $I_{ut}$.

In the case where "±7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1 is $t_{ut}\times I_{ut}$. Note that $t_{ut}\times I_{ut}=Q_{ut}$ is satisfied here. Similarly, the transistor M3-2*b* is in an on state only for the time $2t_{ut}$ and the transistor M4-2*b* is in an off state, so that the amount of charge flowing from the wiring OL to the wiring VE through the transistor M1-2*b* is $2t_{ut}\times I_{ut}=2Q_{ut}$. The transistor M3-3*b* is in an on state only for the time $4t_{ut}$ and the transistor M4-3*b* is in an off state, so that the amount of charge flowing from the wiring OL to the wiring VE through the transistor M1-3*b* is $4t_{ut}\times I_{ut}=4Q_{ut}$. Thus, the amount of charge flowing from the wiring OL to the wiring VE through the circuit MC is $Q_{ut}+2Q_{ut}+4Q_{ut}=7Q_{ut}$. Meanwhile, the amount of charge flowing from the wiring OLB to the wiring VEr through the circuit MCr is 0 because the transistor M1*r*, the transistor M1-2*br*, and the transistor M1-3*br* are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OLB to the wiring VE through the circuit MC is $Q_{ut}+2Q_{ut}+4Q_{ut}=7Q_{ut}$ and the amount of charge flowing from the wiring OL to the wiring VEr through the circuit MCr is 0.

As another example, the first data (a weight coefficient) of "−1" is set in the circuit MP in advance. Specifically, the transistor M1*r* is set such that the current amount of $I_1$ is supplied and the transistor M1, the transistor M1-2*b*, and the transistor M1-3*b* are in an off state.

In the circuit MCr, the sizes of the transistor M1*r*, the transistor M1-2*br*, and the transistor M1-3*br* are equal to each other, the gates of the transistor M1*r*, the transistor M1-2*br*, and the transistor M1-3*br* are electrically connected to the node n1*r* of the circuit HCr, and the first terminals of the transistor M1*r*, the transistor M1-2*br*, and the transistor M1-3*br* are electrically connected to the wiring VEr. Thus, almost equal currents flow between the sources and the drains of the transistor M1*r*, the transistor M1-2*br*, and the transistor M1-3*br*. Like the current flowing between the source and the drain of the transistor M1, the amount of the current is denoted by $I_{ut}$.

In the case where "+7" is input to the circuit MP as the second data (a value of a signal of a neuron), the transistor M3*r* is in an on state only for the time $t_{ut}$ and the transistor M4*r* is in an off state, so that the amount of charge flowing from the wiring OLB to the wiring VEr through the transistor M1*r* is $t_{ut}\times I_{ut}=Q_{ut}$. Similarly, the transistor M3-2*br* is in an on state only for the time $2t_{ut}$ and the transistor M4-2*br* is in an off state, so that the amount of charge flowing from the wiring OLB to the wiring VEr through the transistor M1-2*br* is $2t_{ut}\times I_{ut}=2Q_{ut}$. The transistor M3-3*br* is in an on state only for the time $4t_{ut}$ and the transistor M4-3*br* is in an off state, so that the amount of charge flowing from the wiring OLB to the wiring VEr through the transistor M1-3*br* is $4t_{ut}\times I_{ut}=4Q_{ut}$. Thus, the amount of charge flowing from the wiring OLB to the wiring VEr through the circuit MCr is $Q_{ut}+2Q_{ut}+4Q_{ut}=7Q_{ut}$. Meanwhile, the amount of charge flowing from the wiring OL to the wiring VE through the circuit MC is 0 because the transistor M1, the transistor M1-2*b*, and the transistor M1-3*b* are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OL to the wiring VEr through the circuit MCr is $Q_{ut}+2Q_{ut}+4Q_{ut}=7Q_{ut}$ and the amount of charge flowing from the wiring OLB to the wiring VE through the circuit MC is 0.

Thus, by setting the first data (a weight coefficient) of "+1" in the circuit MP and selecting one or more transistors to be turned on from the transistor M3, the transistor M3-2*b*, and the transistor M3-3*b* included in the circuit MP in accordance with the positive second data (a value of a signal of a neuron), the amount of charge flowing from the wiring OL to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VEr through the circuit MCr is 0 at this time. By setting the first data (a weight coefficient) of "−1" in the circuit MP and selecting one or more transistors to be turned on from the transistor M3*r*, the transistor M3-2*br*, and the transistor M3-3*br* included in the circuit MP in accordance with the positive second data (a value of a signal of a neuron), the amount of charge flowing from the wiring OLB to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VE through the circuit MC is 0 at this time.

By setting the first data (a weight coefficient) of "+1" in the circuit MP and selecting one or more transistors to be turned on from the transistor M4, the transistor M4-2*b*, and the transistor M4-3*b* included in the circuit MP in accordance with the negative second data (a value of a signal of a neuron), the amount of charge flowing from the wiring OLB to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VEr through the circuit MCr is 0 at this time. By setting the first data (a weight coefficient) of "−1" in the circuit MP and selecting one or more transistors to be turned on from the transistor M4*r*, the transistor M4-2*br*, and the transistor M4-3*br* included in the circuit MP in accordance with the negative second data (a value of a signal of a neuron), the amount of charge flowing from the wiring OL to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VE through the circuit MC is 0 at this time.

Assume that the first data (a weight coefficient) set in the circuit MP is changed from "+1" to "A" that is a positive integer, for example. Specifically, the transistor M1 is set such that a current amount of $I_A$ (=$\Delta I_1$) is supplied and the transistor M1*r*, the transistor M1-2*br*, and the transistor M1-3*br* are in an off state. In this case, the amount of current flowing between the sources and the drains of the transistor M1-2*b* and the transistor M1-3*b* is also $I_A$. Thus, by selecting one or more transistors to be turned on from the transistor M3, the transistor M3-2*b*, and the transistor M3-3*b* included in the circuit MP in accordance with the second data (a value of a signal of a neuron), the amount of charge flowing from the wiring OL to the wiring VE through the circuit MC becomes any one of $AQ_{ut}$, $2AQ_{ut}$, $3QA_{ut}$, $4AQ_{ut}$, $5AQ_{ut}$, $6AQ_{ut}$, and $7AQ_{ut}$. When "A" is a negative integer, the amount of charge flowing from the wiring OLB to the wiring VEr through the circuit MCr is any one of $AQ_{ut}$, $2AQ_{ut}$, $3QA_{ut}$, $4AQ_{ut}$, $5AQ_{ut}$, $6AQ_{ut}$, and $7AQ_{ut}$.

In the case where the first data (a weight coefficient) of "0" is set in the circuit MP in advance, the transistor M1 and the transistor M1*r* are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, attention is focused on the integrator circuit of the circuit ACTF. When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB. Thus, the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is "+1" or "−1" and the second data (a value of a signal of a neuron) is defined as described above.

TABLE 8

| Weight coeffi-cient | n1 | n1r | Value of signal of neuron | Weight coeffi-cient × Signal | Charge amount $Q_{OL}$ supplied through wiring OL | Charge amount $Q_{OLB}$ supplied through wiring OLB |
|---|---|---|---|---|---|---|
| +1 | $V_1$ | VSS | 0 | 0 | 0 | 0 |
| +1 | $V_1$ | VSS | +1 | +1 | $Q_{ut}$ | 0 |
| +1 | $V_1$ | VSS | +2 | +2 | $2Q_{ut}$ | 0 |
| +1 | $V_1$ | VSS | +3 | +3 | $3Q_{ut}$ | 0 |
| +1 | $V_1$ | VSS | +4 | +4 | $4Q_{ut}$ | 0 |
| +1 | $V_1$ | VSS | +5 | +5 | $5Q_{ut}$ | 0 |
| +1 | $V_1$ | VSS | +6 | +6 | $6Q_{ut}$ | 0 |
| +1 | $V_1$ | VSS | +7 | +7 | $7Q_{ut}$ | 0 |
| +1 | $V_1$ | VSS | −1 | −1 | 0 | $Q_{ut}$ |
| +1 | $V_1$ | VSS | −2 | −2 | 0 | $2Q_{ut}$ |
| +1 | $V_1$ | VSS | −3 | −3 | 0 | $3Q_{ut}$ |
| +1 | $V_1$ | VSS | −4 | −4 | 0 | $4Q_{ut}$ |
| +1 | $V_1$ | VSS | −5 | −5 | 0 | $5Q_{ut}$ |
| +1 | $V_1$ | VSS | −6 | −6 | 0 | $6Q_{ut}$ |
| +1 | $V_1$ | VSS | −7 | −7 | 0 | $7Q_{ut}$ |

TABLE 9

| Weight coeffi-cient | n1 | n1r | Value of signal of neuron | Weight coeffi-cient × Signal | Charge amount $Q_{OL}$ supplied through wiring OL | Charge amount $Q_{OLB}$ supplied through wiring OLB |
|---|---|---|---|---|---|---|
| −1 | VSS | $V_1$ | 0 | 0 | 0 | 0 |
| −1 | VSS | $V_1$ | +1 | −1 | 0 | $Q_{ut}$ |
| −1 | VSS | $V_1$ | +2 | −2 | 0 | $2Q_{ut}$ |
| −1 | VSS | $V_1$ | +3 | −3 | 0 | $3Q_{ut}$ |
| −1 | VSS | $V_1$ | +4 | −4 | 0 | $4Q_{ut}$ |
| −1 | VSS | $V_1$ | +5 | −5 | 0 | $5Q_{ut}$ |
| −1 | VSS | $V_1$ | +6 | −6 | 0 | $6Q_{ut}$ |
| −1 | VSS | $V_1$ | +7 | −7 | 0 | $7Q_{ut}$ |
| −1 | VSS | $V_1$ | −1 | +1 | $Q_{ut}$ | 0 |
| −1 | VSS | $V_1$ | −2 | +2 | $2Q_{ut}$ | 0 |
| −1 | VSS | $V_1$ | −3 | +3 | $3Q_{ut}$ | 0 |
| −1 | VSS | $V_1$ | −4 | +4 | $4Q_{ut}$ | 0 |
| −1 | VSS | $V_1$ | −5 | +5 | $5Q_{ut}$ | 0 |
| −1 | VSS | $V_1$ | −6 | +6 | $6Q_{ut}$ | 0 |
| −1 | VSS | $V_1$ | −7 | +7 | $7Q_{ut}$ | 0 |

By setting the first data (a weight coefficient) and the second data (a value of a signal of a neuron) as described above, the charge amount $Q_{OL}$ flowing from the wiring OL to the circuit MC or the circuit MCr and the charge amount $Q_{OLB}$ flowing from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ with which a current flows from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ with which a current flows from the wiring OLB to the circuit MC or the circuit MCr in the above table.

Although the first data (a weight coefficient) set in the circuit MP is "+1" or "−1" in the above operation example, the first data (a weight coefficient) of "0", an analog value, or the like may be used for calculation, for example. Thus, the circuit MP can perform the product-sum operation of the first data (a weight coefficient) that is a binary value, a multilevel value, an analog value, or the like and the second multilevel data (a value of a signal of a neuron) and/or arithmetic operation of an activation function.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

When the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$, and the time during which the transistor M3-3*b* and the transistor M3-3*br* are in an on state or the transistor M4-3*b* and the transistor M4-3*br* are in an on state is $4t_{ut}$, for example, the second data (a value of a signal of a neuron) at the time when a high-level potential is input to the wiring WX1L, a low-level potential is input to the wiring X2L, and a low-level potential is input to the wiring X1L2*b*, the wiring X2L2*b*, the wiring X1L3*b*, and the wiring X2L3*b* may be defined as not "+1" but a real number such as "+0.1".

In the semiconductor device of one embodiment of the present invention, the configuration of the circuit MP is not limited to that in FIG. 51. For example, in the circuit MP in FIG. 51, the circuit MC includes three transistors of the transistor M1, the transistor M1-2*b*, and the transistor M1-3*b*, and the circuit MCr includes three transistors of the transistor M1*r*, the transistor M1-2*br*, and the transistor M1-3*br* as transistors for setting current amounts; however, the circuit MC and the circuit MCr may each include two transistors or four or more transistors for setting current amounts.

The semiconductor device of one embodiment of the present invention and the operation method of the semiconductor device are not limited to the above. Although the sizes of the transistor M1, the transistor M1*r*, the transistor M1-2*b*, the transistor M1-2*br*, the transistor M1-3*b*, and the transistor M1-3*br* of the circuit MP in FIG. 51 are equal to each other in the above description, the ratios of the W lengths to the L lengths of the transistor M1 and the transistor M1*r* may each be W/L and the ratios of the W lengths to the L lengths of the transistor M1-2*b*, the transistor M1-2*br*, the transistor M1-3*b*, and the transistor M1-3*br* may each be 2 W/L, for example. In this case, when the transistor M1 is set such that a current having the current amount of $I_1$ flows between its source and drain, the current amount of $2I_1$ is supplied between the sources and the drains of the transistor M1-2*b* and the transistor M1-3*b* because the ratio of the W length to the L length of the transistor M1-2*b* and the ratio of the W length to the L length of the transistor M1-3*b* are each twice as high as the ratio of the W length to the L length of the transistor M1. Similarly, when the transistor M1*r* is set such that a current having the current amount of $I_1$ flows between its source and drain, the current amount of $2I_1$ is supplied between the sources and the drains of the transistor M1-2*br* and the transistor M1-3*br* because the ratio of the W length to the L length of the transistor M1-2*br* and the ratio of the W length to the L length of the transistor M1-3*br* are each twice as high as the ratio of the W length to the L length of the transistor M1*r*.

Figure 52:
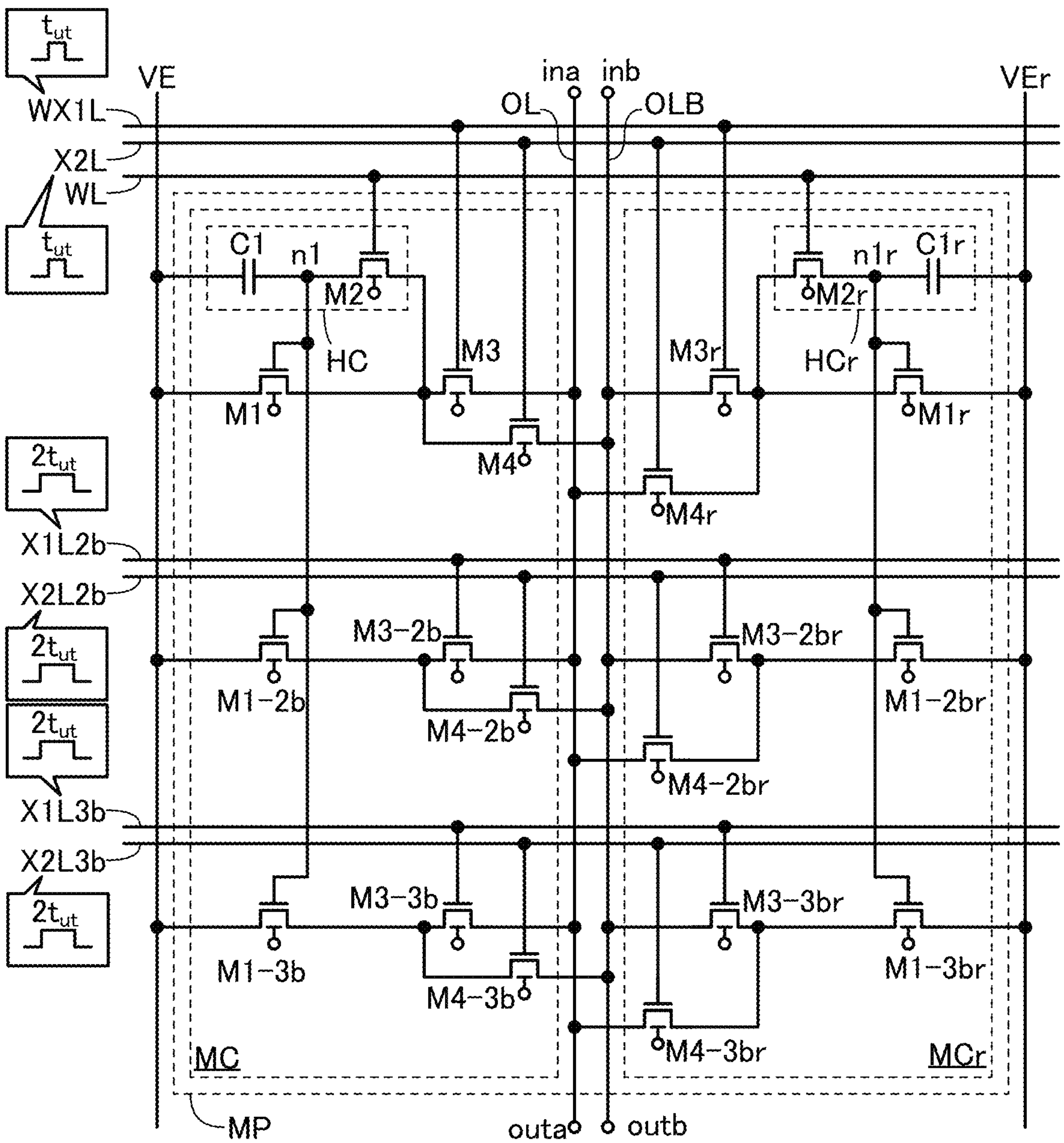
FIG. 52 is a circuit diagram illustrating a configuration example of a circuit included in a semiconductor device.

Here, the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$, and the time during which the transistor M3-3*b* and the transistor M3-3*br* are in an on state or the transistor M4-3*b* and the transistor M4-3*br* are in an on state is $2t_{ut}$. That is, in inputting the second data (a value of a signal of a neuron) to the circuit MP, the input time of a high-level potential to one of the wiring WX1L and the wiring X2L is $t_{ut}$, the input time of a high-level potential to one of the wiring X1L2*b* and the wiring X2L2*b* is $2t_{ut}$, and the input time of a high-level potential to one of the wiring X1L3*b* and the wiring X2L3*b* is $2t_{ut}$. The circuit MP in FIG. 52 shows schematic views of pulse voltages and the input times, which are different from those in FIG. 51, around the reference numerals of the wiring WX1L, the wiring X2L, the wiring X1L2*b*, the wiring X2L2*b*, the wiring X1L3*b*, and the wiring X2L3*b*.

When the transistor M1 is set such that a current having the current amount of ut flows between the source and the drain, one of the transistor M3-3*b* and the transistor M4-3*b* is in an on state only for the time $2t_{ut}$ and the other of the transistor M3-3*b* and the transistor M4-3*b* is in an off state, so that the amount of charge flowing from the wiring OL or the wiring OLB to the wiring VE through the transistor M1-3*b* is $2t_{ut} \times 2I_{ut} = 4Q_{ut}$. Note that the conditions of the amount of charge flowing from the wiring OL to the wiring VE through the transistor M1 and the amount of charge flowing from the wiring OL to the wiring VE through the transistor M1-2$b$ are the same as those of the above-described operation example, and thus the description is omitted.

When the transistor M1$r$ is set such that a current having the current amount of ut flows between the source and the drain, one of the transistor M3-3$br$ and the transistor M4-3$br$ is in an on state only for the time $2t_{ut}$ and the other of the transistor M3-3$br$ and the transistor M4-3$br$ is in an off state, so that the amount of charge flowing from the wiring OL or the wiring OLB to the wiring VEr through the transistor M1-3$br$ is $2t_{ut}\times 2I_{ut}=4Q_{ut}$. Note that the conditions of the amount of charge flowing from the wiring OL or the wiring OLB to the wiring VEr through the transistor M1$r$ and the amount of charge flowing from the wiring OL or the wiring OLB to the wiring VEr through the transistor M1-2$br$ are the same as those of the above-described operation example, and thus the description is omitted.

As described above, the sizes of the transistor M1, the transistor M1$r$, the transistor M1-2$b$, the transistor M1-2$br$, the transistor M1-3$b$, and the transistor M1-3$br$ and the input time of a high-level potential to each of the wiring WX1L, the wiring X2L, the wiring X1L2$b$, the wiring X2L2$b$, the wiring X1L3$b$, and the wiring X2L3$b$ are appropriately changed, whereby the operation can be similar to that of the operation example of the circuit MP shown in FIG. 51.

In the semiconductor device of one embodiment of the present invention, the configuration of the circuit MP is not limited to that in FIG. 51 and FIG. 52. For example, in the circuit MP in FIG. 51, the circuit MC includes three transistors of the transistor M1, the transistor M1-2$b$, and the transistor M1-3$b$, and the circuit MCr includes three transistors of the transistor M1$r$, the transistor M1-2$br$, and the transistor M1-3$br$ as transistors for setting current amounts; however, the circuit MC and the circuit MCr may each include two transistors or four or more transistors for setting current amounts. In addition, the number of holding portions and the number of wirings may be increased and decreased in accordance with the number of transistors.

The operation method of the semiconductor device of one embodiment of the present invention is not limited to the above operation method. For example, as described in Operation method example 2, the input period of signals that are input to the wiring WX1L, the wiring X2L, the wiring X1L2$b$, the wiring X2L2$b$, the wiring X1L3$b$, and the wiring X2L3$b$ may be divided into a plurality of subperiods.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 4

Figure 53:
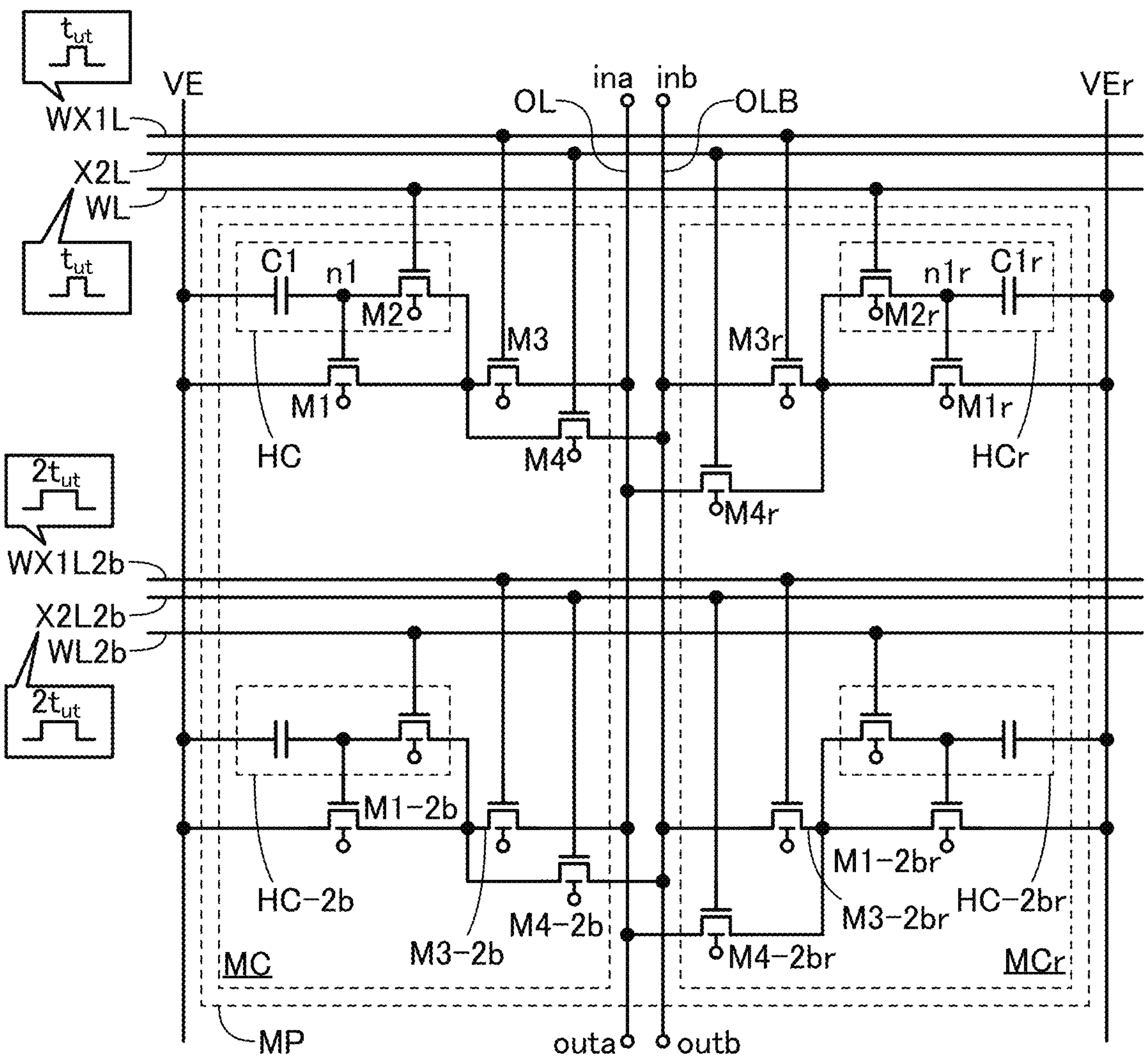
FIG. 53 is a circuit diagram illustrating a configuration example of a circuit included in a semiconductor device.

Described here is an operation method example of the arithmetic circuit 150 in FIG. 11 for which the circuit MP in FIG. 53 is used.

As in Operation method example 1 to Operation method example 3, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example.

FIG. 53 shows a configuration in which the transistor M1-3$b$, the transistor M1-3$br$, the transistor M3-3$b$, the transistor M3-3$br$, the transistor M4-3$b$, the transistor M4-3$br$, the circuit HC-3$b$, and the circuit HC-3$br$ are not provided in the circuit MP illustrated in FIG. 27. Therefore, the wiring WX1L3$b$, the wiring X2L3$b$, and the wiring WL3$b$ are also not provided in the circuit MP in FIG. 53. The sizes, e.g., the W lengths and the L lengths, of the transistor M1, the transistor M1$r$, the transistor M1-2$b$, and the transistor M1-2$br$ are preferably equal to each other. This operation method example is different from the operation example of the circuit MP in FIG. 27 described in Embodiment 2.

Specifically, when a current flows from the circuit AFP to the circuit MP, the input time of a high-level potential to one of the wiring WX1L and the wiring X2L is $t_{ut}$ and the input time of a high-level potential to one of the wiring WX1L2$b$ and the wiring X2L2$b$ is $2t_{ut}$ in the operation. That is, the operation is performed such that when the time during which the transistor M3 and the transistor M3$r$ are in an on state or the transistor M4 and the transistor M4$r$ are in an on state is $t_{ut}$, the time during which the transistor M3-2$b$ and the transistor M3-2$br$ are in an on state or the transistor M4-2$b$ and the transistor M4-2$br$ are in an on state is $2t_{ut}$. Thus, to show the difference in operation between the circuit MP in FIG. 27 and the circuit MP in FIG. 53, FIG. 53 shows schematic views of pulse voltages and the input times around the reference numerals of the wiring WX1L, the wiring X2L, the wiring WX1L2$b$, and the wiring X2L2$b$.

As described in Operation method example 1 and Operation method example 2, the amount of charge flowing from the wiring OL or the wiring OLB to the wiring VE through the transistor M1 is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1$r$ is determined by setting the first data (a weight coefficient) in the circuit MP and setting the time during which the transistor M3$r$ or the transistor M4$r$ is in an on state.

Similarly, the amount of charge flowing from the wiring OL or the wiring OLB to the wiring VE through the transistor M1-2$b$ and the amount of charge flowing from the wiring OL or the wiring OLB to the wiring VEr through the transistor M1-2$br$ are also determined by setting the times during which the transistor M3-2*b*, the transistor M3-2*br*, the transistor M4-2*b*, and the transistor M4-2*br* are in an on state.

Note that VSS or $V_1$ is held as a digital value (a binary value) in each of the circuit HC and the circuit HC-2*b* in FIG. 53. The potential VSS is held in the circuit HC and the circuit HC-2*b* by establishing electrical continuity between the wiring VCN in FIG. 8A and the node n1 of the circuit HC and/or the node n1 of the circuit HC-2*b* in FIG. 53. In addition, the potential $V_1$ is held in the circuit HC and the circuit HC-2*b* by setting a current having the current amount of $I_1$ between the source and the drain of the transistor M1 and/or the transistor M1-2*b*. When the current amount of $I_1$ is set in the transistor M1 and the transistor M1-2*b*, the voltages held in the circuit HC and the circuit HC-2*b* might be different from each other owing to variations in transistor characteristics caused in the manufacturing process of the transistor M1 and the transistor M1-2*b*, for example.

In a manner similar to the above, VSS or $V_1$ is held as a digital value (a binary value) in each of the circuit HCr and the circuit HC-2*br*.

Here, the first data (a weight coefficient) set in the circuit MP is defined.

In the case where "+1" is set in the circuit MP as the first data (a weight coefficient), for example, the transistor M1 is set such that the current amount of $I_1$ is supplied, and VSS is held in the circuit HC-2*b*, the circuit HCr, and the circuit HC-2*br*. The first terminal of the transistor M1 is electrically connected to the wiring OL through the transistor M3 and electrically connected to the wiring OLB through the transistor M4; thus, in the case where a high-level potential is input to one of the wiring WX1L and the wiring X2L, the amount of charge flowing from the wiring OL or the wiring OLB to the wiring VE through the transistor M1 is $t_{ut}\times I_1$. Here, $t_{ut}\times I_1=Q_{ut}$ is satisfied. Since the transistor M1*r*, the transistor M1-2*b*, and the transistor M1-2*br* are in an off state, the amount of current flowing between the sources and the drains of the transistor M1*r*, the transistor M1-2*b*, and the transistor M1-2*br* is 0.

In the case where "+2" is set in the circuit MP as the first data (a weight coefficient), the transistor M1-2*b* is set such that the current amount of $I_1$ is supplied, and VSS is held in the circuit HC, the circuit HCr, and the circuit HC-2*br*. The first terminal of the transistor M1-2*b* is electrically connected to the wiring OL through the transistor M3-2*b* and electrically connected to the wiring OLB through the transistor M4-2*b*; thus, in the case where a high-level potential is input to one of the wiring WX1L2*b* and the wiring X2L2*b*, the amount of charge flowing from the wiring OL or the wiring OLB to the wiring VE through the transistor M1-2*b* is $2t_{ut}\times I_1=2Q_{ut}$. Since the transistor M1, the transistor M1*r*, and the transistor M1-2*br* are in an off state, the amount of current flowing between the sources and the drains of the transistor M1, the transistor M1*r*, and the transistor M1-2*br* is 0.

In the case where "+3" is set in the circuit MP as the first data (a weight coefficient), the transistor M1 and the transistor M1-2*b* are set such that the current amount of $I_1$ is supplied, and VSS is held in the circuit HCr and the circuit HC-2*br*. As described above, the amount of charge flowing from the wiring OL or the wiring OLB to the wiring VE through the transistor M1 is $t_{ut}\times I_1$ in the case where a high-level potential is input to one of the wiring WX1L and the wiring X2L, and the amount of charge flowing from the wiring OL or the wiring OLB to the wiring VE through the transistor M1 is $2t_{ut}\times I_1$ in the case where a high-level potential is input to one of the wiring WX1L2*b* and the wiring X2L2*b*. Thus, the amount of charge flowing from the wiring OL or the wiring OLB to the wiring VE through the circuit MC is $t_{ut}\times I_1+2t_{ut}\times I_1=3Q_{ut}$. Since the transistor M1*r* and the transistor M1-2*br* are in an off state, the amount of current flowing between the sources and the drains of the transistor M1*r* and the transistor M1-2*br* is 0.

In the case where the first data (a weight coefficient) is "−1", the transistor M1*r* is set such that the current amount of $I_1$ is supplied, and VSS is held in the circuit HC, the circuit HC-2*b*, and the circuit HC-2*br*. The first terminal of the transistor M1*r* is electrically connected to the wiring OLB through the transistor M3*r* and electrically connected to the wiring OL through the transistor M4*r*; thus, in the case where a high-level potential is input to one of the wiring WX1L and the wiring X2L, the amount of charge flowing from the wiring OL or the wiring OLB to the wiring VEr through the transistor M1*r* is $t_{ut}\times I_1$. Here, $t_{ut}\times I_1=Q_{ut}$ is satisfied. Since the transistor M1*r*, the transistor M1-2*b*, and the transistor M1-2*br* are in an off state, the amount of current flowing between the sources and the drains of the transistor M1, the transistor M1-2*b*, and the transistor M1-2*br* is 0.

In the case where "−2" is set in the circuit MP as the first data (a weight coefficient), the transistor M1-2*br* is set such that the current amount of $I_1$ is supplied, and VSS is held in the circuit HC, the circuit HCr, and the circuit HC-2*b*. The first terminal of the transistor M1-2*br* is electrically connected to the wiring OLB through the transistor M3-2*br* and electrically connected to the wiring OL through the transistor M4-2*br*; thus, in the case where a high-level potential is input to one of the wiring WX1L2*b* and the wiring X2L2*b*, the amount of charge flowing from the wiring OL or the wiring OLB to the wiring VEr through the transistor M1-2*br* is $2t_{ut}\times I_1=2Q_{ut}$. Since the transistor M1, the transistor M1*r*, and the transistor M1-2*b* are in an off state, the amount of current flowing between the sources and the drains of the transistor M1, the transistor M1*r*, and the transistor M1-2*b* is 0.

In the case where "−3" is set in the circuit MP as the first data (a weight coefficient), the transistor M1*r* and the transistor M1-2*br* are each set such that the current amount of $I_1$ is supplied, and VSS is held in the circuit HC and the circuit HC-2*b*. As described above, the amount of charge flowing from the wiring OL or the wiring OLB to the wiring VEr through the transistor M1*r* is $t_{ut}\times I_1$ in the case where a high-level potential is input to one of the wiring WX1L and the wiring X2L, and the amount of charge flowing from the wiring OL or the wiring OLB to the wiring VEr through a transistor M1*r*-2*br* is $2t_{ut}\times I_1$ in the case where a high-level potential is input to one of the wiring WX1L2*b* and the wiring X2L2*b*. Thus, the amount of charge flowing from the wiring OL or the wiring OLB to the wiring VEr through the circuit MCr is $t_{ut}\times I_1+2t_{ut}\times I_1=3Q_{ut}$. Since the transistor M1 and the transistor M1-2*b* are in an off state, the amount of current flowing between the sources and the drains of the transistor M1 and the transistor M1-2*b* is 0.

In the case where the first data (a weight coefficient) is "0", VSS is held in the circuit HC, the circuit HCr, the circuit HC-2*b*, and the circuit HC-2*br*. Thus, the amount of current flowing between the sources and the drains of the transistor M1, the transistor M1*r*, the transistor M1-2*b*, and the transistor M1-2*br* is 0.

That is, a digital value (a binary value) is held in the circuit HC, the circuit HCr, the circuit HC-2*b*, and the circuit HC-2*br*, the input period of a high-level potential to one of the wiring WX1L and the wiring X2L is set to $t_{ut}$, and the input period of a high-level potential to one of the wiring WX1L2*b* and the wiring X2L2*b* is set to $2t_{ut}$, whereby the first data (a weight coefficient) having multiple levels (in this operation example, seven levels "−3", "−2", "−1", "0", "+1", "+2", and "+3") can be expressed.

Note that in this operation example, the second data (e.g., a signal of a neuron here) input to the circuit MP is defined as follows, for example: a high-level potential is input to the wiring WX1L and the wiring X1L2*b* and a low-level potential is input to the wiring X2L and the wiring X2L2*b* when the second data is "+1"; a low-level potential is input to the wiring WX1L and the wiring X1L2*b* and a high-level potential is input to the wiring X2L and the wiring X2L2*b* when the second data is "−1"; and a low level potential is input to the wiring WX1L, the wiring X1L2*b*, the wiring X2L, and the wiring X2L2*b* when the second data is "0".

Here, attention is focused on the integrator circuit of the circuit ACTF. When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is set to any one of "+3", "+2", "+1", "0", "−1", "−2", and "−3" and the second data (a value of a signal of a neuron) is defined as described above.

TABLE 10

| | | Value of signal of neuron | | |
|---|---|---|---|---|
| | | −1 (WX1L: low, X2L: high) | 0 (WX1L: low, X2L: low) | +1 (WX1L: high, X2L: low) |
| Weight coefficient | −3 | $Q_{OL} = 3Q_{ut}$, $Q_{OLB} = 0$ | $Q_{OL} = 0$, $Q_{OLB} = 0$ | $Q_{OL} = 0$, $Q_{OLB} = 3Q_{ut}$ |
| | −2 | $Q_{OL} = 2Q_{ut}$, $Q_{OLB} = 0$ | $Q_{OL} = 0$, $Q_{OLB} = 0$ | $Q_{OL} = 0$, $Q_{OLB} = 2Q_{ut}$ |
| | −1 | $Q_{OL} = Q_{ut}$, $Q_{OLB} = 0$ | $Q_{OL} = 0$, $Q_{OLB} = 0$ | $Q_{OL} = 0$, $Q_{OLB} = Q_{ut}$ |
| | 0 | $Q_{OL} = 0$, $Q_{OLB} = 0$ | $Q_{OL} = 0$, $Q_{OLB} = 0$ | $Q_{OL} = 0$, $Q_{OLB} = 0$ |
| | +1 | $Q_{OL} = 0$, $Q_{OLB} = Q_{ut}$ | $Q_{OL} = 0$, $Q_{OLB} = 0$ | $Q_{OL} = Q_{ut}$, $Q_{OLB} = 0$ |
| | +2 | $Q_{OL} = 0$, $Q_{OLB} = 2Q_{ut}$ | $Q_{OL} = 0$, $Q_{OLB} = 0$ | $Q_{OL} = 2Q_{ut}$, $Q_{OLB} = 0$ |
| | +3 | $Q_{OL} = 0$, $Q_{OLB} = 3Q_{ut}$ | $Q_{OL} = 0$, $Q_{OLB} =0$ | $Q_{OL} = 3Q_{ut}$, $Q_{OLB} = 0$ |

By setting the first data (a weight coefficient) and the second data (a value of a signal of a neuron) as described above, the charge amount $Q_{OL}$ with which a current flows from the wiring OL to the circuit MC or the circuit MCr and the charge amount $Q_{OLB}$ with which a current flows from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−3" to "+3", the second data (a value of a signal of a neuron) is any one of "−1", "0", and "+1", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ with which a current flows from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ with which a current flows from the wiring OLB to the circuit MC or the circuit MCr in the above table.

Although the first data (a weight coefficient) set in the circuit MP is "+3", "+2", "+1", "0", "−1", "−2", or "−3" in the above operation example, the first data (a weight coefficient) may be used as an analog value or the like by adjusting the input time of a high-level potential to the wiring WX1L, the wiring X2L, the wiring WX1L2*b*, and the wiring X2L2*b*. Thus, the circuit MP can perform the product-sum operation of the first data (a weight coefficient) that is an analog value or the like and the multilevel second data (a value of a signal of a neuron) and/or arithmetic operation of an activation function.

In the semiconductor device of one embodiment of the present invention, the configuration of the circuit MP is not limited to that in FIG. 53. For example, in the circuit MP in FIG. 53, the circuit MC includes two transistors of the transistor M1 and the transistor M1-2*b* and the circuit MCr includes two transistors of the transistor M1*r* and the transistor M1-2*br* as transistors for setting current amounts; however, the circuit MC and the circuit MCr may each include three or more transistors for setting current amounts. In addition, the number of holding portions and the number of wirings may be increased and decreased in accordance with the number of transistors.

The operation method of the semiconductor device of one embodiment of the present invention is not limited to the above. For example, as described in Operation method example 2, the input period of signals that are input to the wiring WX1L, the wiring X2L, the wiring WX1L2*b*, and the wiring X2L2*b* may be divided into a plurality of subperiods or may be shortened or lengthened. In the latter case, as a specific example, the input time of signals input to the wiring WX1L and the wiring X2L is $At_{ut}$(A is a real number greater than 0) and the input time of signals input to the wiring WX1L2*b* and the wiring X2L2*b* is $2At_{ut}$ in the above operation example, whereby product-sum operation of the first data and the second data can be performed with the second data (a value of a signal of a neuron) having an analog value or multiple levels other than three levels of "−1", "0", and "+1".

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 5

Figure 54:
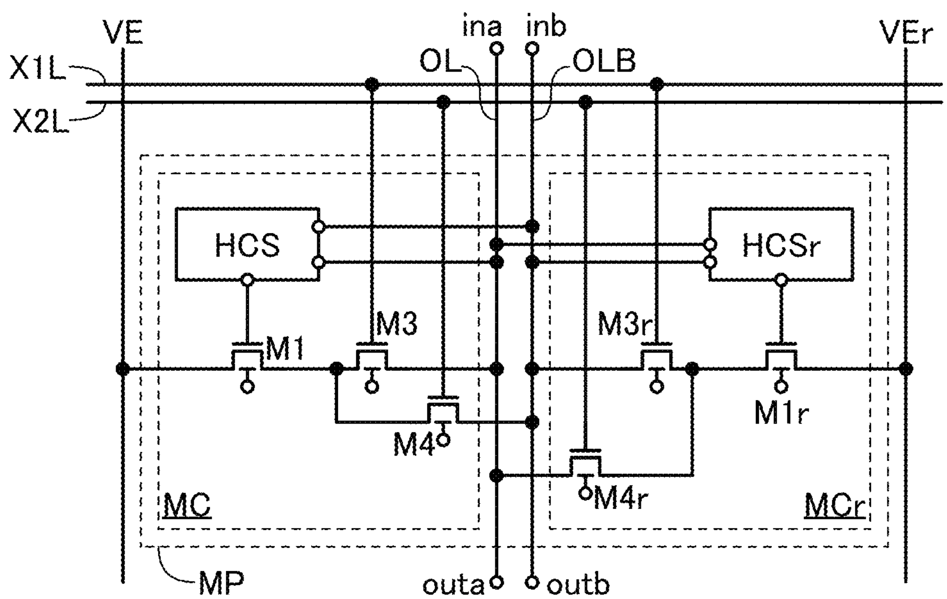
FIG. 54 is a circuit diagram illustrating a configuration example of a circuit included in a semiconductor device.

Described here is an operation method example of the arithmetic circuit 150 in FIG. 11 for which the circuit MP in FIG. 54 is used.

As in Operation method example 1 to Operation method example 4, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example.

FIG. 54 shows a configuration in which the transistor M1-2*b*, the transistor M1-2*br*, the transistor M1-3*b*, the transistor M1-3*br*, the transistor M3-2*b*, the transistor M3-2*br*, the transistor M3-3*b*, the transistor M3-3*br*, the transistor M4-2*b*, the transistor M4-2*br*, the transistor M4-3*b*, the transistor M4-3*br*, the circuit HC-2*b*, the circuit HC-2*br*, the circuit HC-3*b*, and the circuit HC-3*br* are not provided in the circuit MP illustrated in FIG. 29. Therefore, the wiring X1L2*b*, the wiring X2L2*b*, the wiring X1L3*b*, and the wiring X2L3*b* are not provided in the circuit MP in FIG. 54. This operation method example is different from the operation example of the circuit MP in FIG. 29 described in Embodiment 2.

Specifically, in inputting the second data (e.g., a value of a signal of a neuron here) to the circuit MP, the input time of a high-level potential to one of the wiring X1L and the wiring X2L is set in accordance with the second data (a value of a signal of a neuron). That is, the time during which the transistor M3 and the transistor M3*r* are in an on state or the transistor M4 and the transistor M4*r* are in an on state is set.

As described in Operation method example 1, the amount of charge flowing from the wiring OL or the wiring OLB to the wiring VE through the transistor M1 is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1*r* is determined by setting the first data (a weight coefficient) in the circuit MP and setting the time during which the transistor M3*r* or the transistor M4*r* is in an on state.

For example, given that the input time of a high-level potential to the wiring X1L is $t_{ut}$ when the second data (a value of a signal of a neuron) is "+1", and that a high-level potential is applied to the wiring X1L and a low-level potential is applied to the wiring X2L, the second data (a value of a signal of a neuron) of the other cases can be defined as in the following table. Note that the following table only shows integers from "−3" to "+3".

TABLE 11

| Signal | X1L | X2L |
|---|---|---|
| −3 | low | high ($3t_{ut}$) |
| −2 | low | high ($2t_{ut}$) |
| −1 | low | high ($t_{ut}$) |
| 0 | low | low |
| +1 | high ($t_{ut}$) | low |
| +2 | high ($2t_{ut}$) | low |
| +3 | high ($3t_{ut}$) | low |

As described in Configuration example 5 in Embodiment 2, the circuit HCS and the circuit HCSr can each have a configuration including an SRAM or a configuration including a NOSRAM. Here, a potential having a binary value (a digital value) is held in the circuit HCS and the circuit HCSr. Thus, for example, a high-level potential (e.g., VDDL here) is held in the circuit HCS and a low-level potential (e.g., VSS here) is held in the circuit HCSr when the first data (a weight coefficient) set in the circuit MP is "+1"; a low-level potential is held in the circuit HCS and a high-level potential is held in the circuit HCSr when the first data (a weight coefficient) set in the circuit MP is "−1"; and a low-level potential is held in the circuit HCS and a low-level potential is held in the circuit HCSr when the first data (a weight coefficient) set in the circuit MP is "0".

Note that the amount of current flowing through the transistor M1 is $I_1$ in the case where the voltage VDDL is held in the circuit HCS. The amount of current flowing through the transistor M1 is 0 in the case where the voltage VSS is held in the circuit HCS. Similarly, the amount of current flowing through the transistor M1*r* is $I_1$ in the case where the voltage VDDL is held in the circuit HCSr, and the amount of current flowing through the transistor M1*r* is 0 in the case where the voltage VSS is held in the circuit HCSr.

Next, a specific operation example of the circuit MP in FIG. 54 is described.

The first data (a weight coefficient) of "+1" is set in the circuit MP in advance, for example.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OL to the wiring VE through the transistor M1 is $3t_{ut}\times I_{ut}$. Note that $t_{ut}\times I_{ut}=Q_{ut}$ is satisfied here. Meanwhile, the amount of charge flowing from the wiring OLB to the wiring VEr through the circuit MCr is 0 because the transistor M1*r* is in an off state.

In the case where "−3" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC, so that the amount of charge flowing from the wiring OLB to the wiring VE through the circuit MC is $3t_{ut}\times I_{ut}=3Q_{ut}$ and the amount of charge flowing from the wiring OL to the wiring VEr through the circuit MCr is 0.

In addition, the case is considered where the first data (a weight coefficient) of "−1" is set in the circuit MP in advance, for example.

In the case where "+3" is input to the circuit MP as the second data (a value of a signal of a neuron), the transistor M3*r* is in an on state only for the time $3t_{ut}$ and the transistor M4*r* is in an off state, so that the amount of charge flowing from the wiring OLB to the wiring VEr through the transistor M1*r* is $3t_{ut}\times I_{ut}=3Q_{ut}$. Meanwhile, the amount of charge flowing from the wiring OL to the wiring VE through the circuit MC is 0 because the transistor M1 is in an off state.

In the case where "−3" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC, so that the amount of charge flowing from the wiring OL to the wiring VEr through the circuit MCr is $3t_{ut}\times I_{ut}=3Q_{ut}$ and the amount of charge flowing from the wiring OLB to the wiring VE through the circuit MC is 0.

Here, attention is focused on the integrator circuit of the circuit ACTF. When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is "+1" or "−1" and the second data (a value of a signal of a neuron) is defined as described above.

TABLE 12

| | | Value of signal of neuron | | | | | | |
|---|---|---|---|---|---|---|---|---|
| | | −3 (X1L: low, X2L: high, $3t_{ut}$) | −2 (X1L: low, X2L: high, $2t_{ut}$) | −1 (X1L: low, X2L: high, $t_{ut}$) | 0 (X1L: low, X2L: low) | +1 (X1L: high, X2L: low, $t_{ut}$) | +2 (X1L: high, X2L: low, $2t_{ut}$) | +3 (X1L: high, X2L: low, $3t_{ut}$) |
| Weight coefficient | −1 | $Q_{OL}=3Q_1$, $Q_{OLB}=0$ | $Q_{OL}=2Q_1$, $Q_{OLB}=0$ | $Q_{OL}=Q_1$, $Q_{OLB}=0$ | $Q_{OL}=0$, $Q_{OLB}=0$ | $Q_{OL}=0$, $Q_{OLB}=Q_1$ | $Q_{OL}=0$, $Q_{OLB}=2Q_1$ | $Q_{OL}=0$, $Q_{OLB}=3Q_1$ |
| | 0 | $Q_{OL}=0$, $Q_{OLB}=0$ | $Q_{OL}=0$, $Q_{OLB}=0$ | $Q_{OL}=0$, $Q_{OLB}=0$ | $Q_{OL}=0$, $Q_{OLB}=0$ | $Q_{OL}=0$, $Q_{OLB}=0$ | $Q_{OL}=0$, $Q_{OLB}=0$ | $Q_{OL}=0$, $Q_{OLB}=0$ |
| | +1 | $Q_{OL}=0$, $Q_{OLB}=3Q_1$ | $Q_{OL}=0$, $Q_{OLB}=2Q_1$ | $Q_{OL}=0$, $Q_{OLB}=Q_1$ | $Q_{OL}=0$, $Q_{OLB}=0$ | $Q_{OL}=Q_1$, $Q_{OLB}=0$ | $Q_{OL}=2Q_1$, $Q_{OLB}=0$ | $Q_{OL}=3Q_1$, $Q_{OLB}=0$ |

When the second data (a value of a signal of a neuron) is an integer or a real number other than "−3", "−2", "−1", "0", "+1", "+2", and "+3", the input time of a high-level potential to one of the wiring X1L and the wiring X2L is set in accordance with the integer or the real number. For example, by setting the input time to $a\times t_{ut}$, where a is a positive real number, the second data (a value of a signal of a neuron) can be processed as an analog value.

Accordingly, the multilevel second data (a value of a signal of a neuron) can be supplied to the circuit MP, as in Operation method example 1 to Operation method example 3.

Figure 55A:
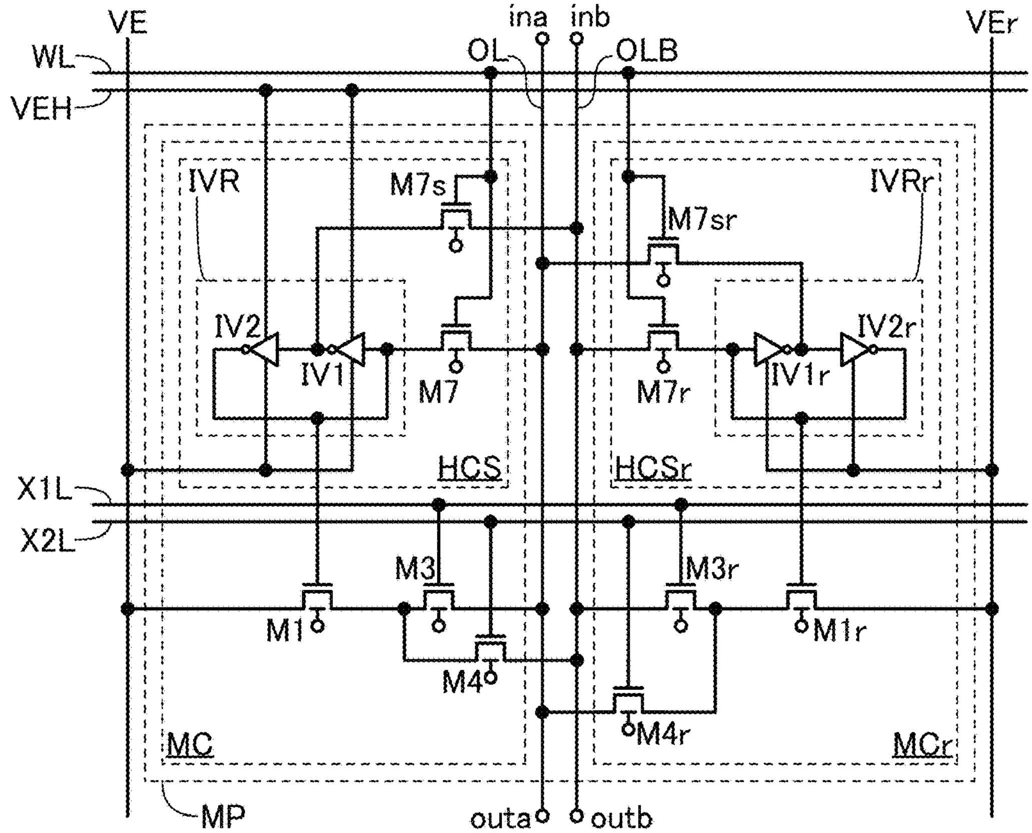
FIG. 55A and FIG. 55B are circuit diagrams each illustrating a configuration example of a circuit included in a semiconductor device.

Note that as described above, the circuit HCS and the circuit HCSr included in the circuit MP in FIG. 54 can each have a configuration including an SRAM. FIG. 55A shows a specific example showing the details of the circuit MP in FIG. 54, in which the circuit HCS and the circuit HCSr each have a configuration including an SRAM. For the reference numerals shown in FIG. 55A, the method for holding the first data (a weight coefficient), and the like, the description of the circuit MP in FIG. 30 is referred to.

Figure 55B:
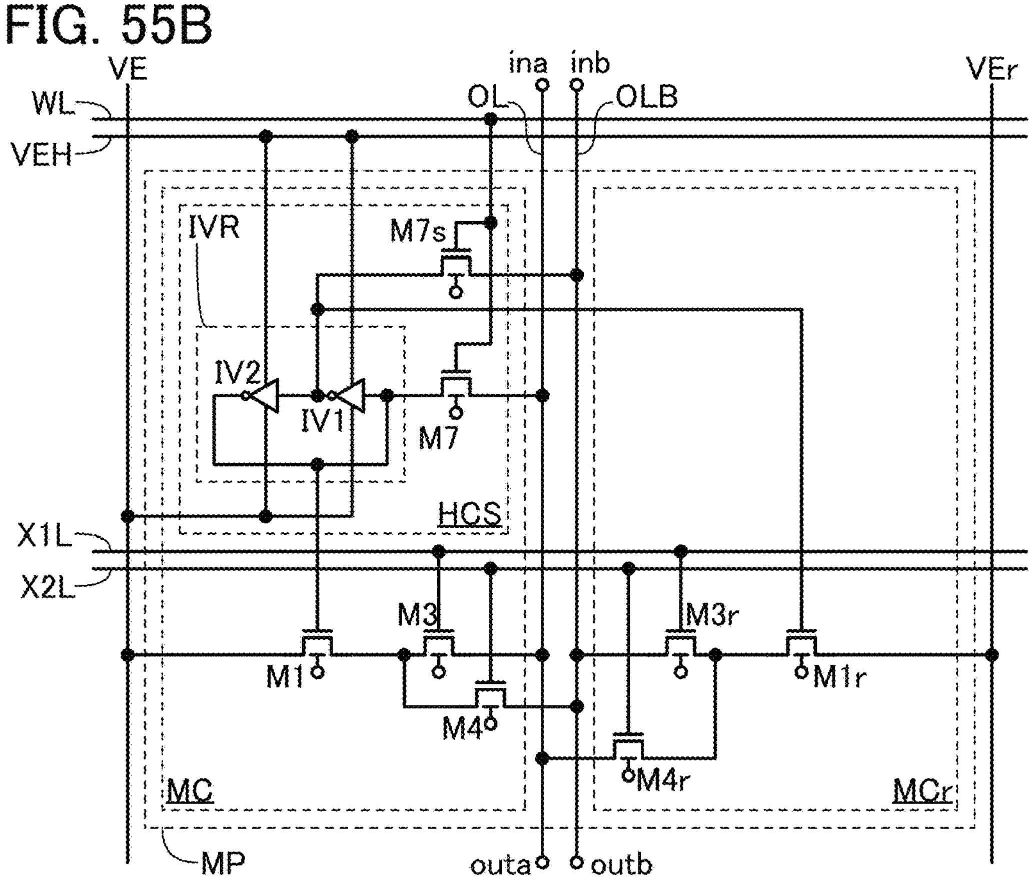

In the case where one of a low-level potential and a high-level potential is held in the circuit HCS and the other of the low-level potential and the high-level potential is held in the circuit HCSr in the circuit MP in FIG. 55A, that is, in the case where the circuit HCS and the circuit HCSr do not need to hold the same potential, the configuration of the circuit MP in FIG. 55A can be changed into that of the circuit MP in FIG. 55B. The circuit MP in FIG. 55B has a configuration in which the circuit MC includes the circuit HCS and the inverter loop circuit IVR included in the circuit HCS supplies, to the transistor M1*r*, an inverted signal of a signal supplied to the gate of the transistor M1. In this case, for example, the first data (a weight coefficient) set in the circuit MP can be "+1" when a high-level potential is supplied to the gate of the transistor M1 (when a low-level potential is supplied to the gate of the transistor M1*r*), and the first data (a weight coefficient) set in the circuit MP can be "−1" when a low-level potential is supplied to the gate of the transistor M1 (when a high-level potential is supplied to the gate of the transistor M1*r*).

Figure 56A:
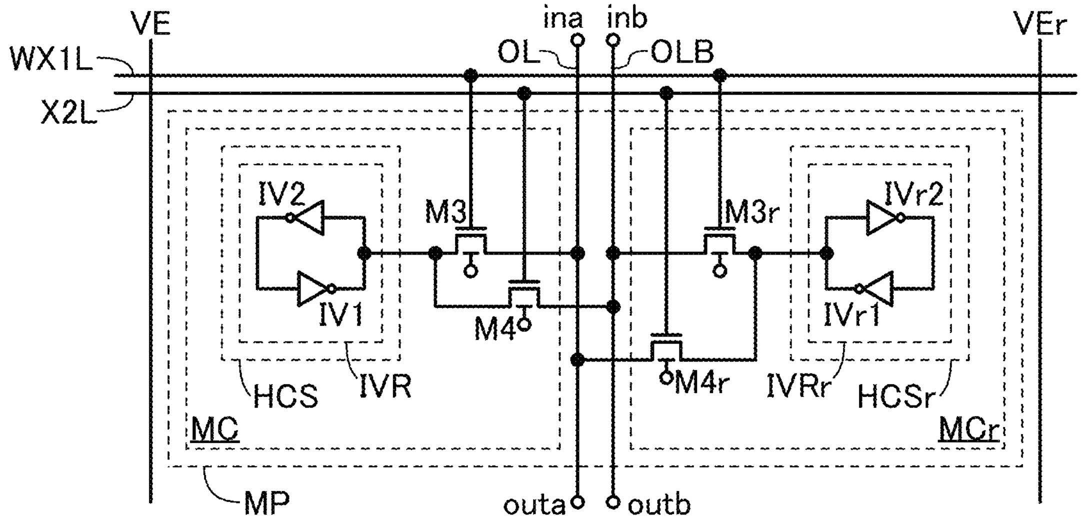
FIG. 56A to FIG. 56C are circuit diagrams each illustrating a configuration example of a circuit included in a semiconductor device.

FIG. 56A shows an example of a configuration that includes the inverter loop circuit IVR in the circuit HCS and the circuit HCSr and is different from that of the circuit MP in FIG. 55A. In the circuit MP illustrated in FIG. 56A, the circuit MC includes the transistor M3, the transistor M4, and the circuit HCS including the inverter loop circuit IVR and the circuit MCr includes the transistor M3*r*, the transistor M4*r*, and the circuit HCSr including the inverter loop circuit IVRr. The inverter loop circuit IVR includes the inverter circuit IV1 and the inverter circuit IV2, and the inverter loop circuit IVRr includes an inverter circuit IV1*r* and an inverter circuit IV2*r*.

The output terminal of the inverter circuit IV1 is electrically connected to the input terminal of the inverter circuit IV2, the first terminal of the transistor M3, and the first terminal of the transistor M4, and the output terminal of the inverter circuit IV2 is electrically connected to the input terminal of the inverter circuit IV1. The second terminal of the transistor M3 is electrically connected to the wiring OL, and the gate of the transistor M3 is electrically connected to the wiring WX1L. The second terminal of the transistor M4 is electrically connected to the wiring OLB, and the gate of the transistor M4 is electrically connected to the wiring X2L. An output terminal of the inverter circuit IV1*r* is electrically connected to an input terminal of the inverter circuit IV2*r*, the first terminal of the transistor M3*r*, and the first terminal of the transistor M4*r*, and an output terminal of the inverter circuit IV2*r* is electrically connected to an input terminal of the inverter circuit IV1*r*. The second terminal of the transistor M3*r* is electrically connected to the wiring OLB, and the gate of the transistor M3*r* is electrically connected to the wiring WX1L. The second terminal of the transistor M4*r* is electrically connected to the wiring OL, and the gate of the transistor M4*r* is electrically connected to the wiring X2L.

The circuit HCS has a function of holding one of a high-level potential and a low-level potential at the output terminal of the inverter circuit IV1 by the inverter loop circuit IVR, and the circuit HCSr has a function of holding one of a high-level potential and a low-level potential at the output terminal of the inverter circuit IV1*r* by the inverter loop circuit IVRr. Thus, as in FIG. 54 and FIG. 55A, for example, a high-level potential (e.g., VDDL here) is held at the output terminal of the inverter circuit IV1 and a low-level potential (e.g., VSS here) is held at the output terminal of the inverter circuit IV1*r* when the first data (a weight coefficient) set in the circuit MP is "+1"; a low-level potential is held at the output terminal of the inverter circuit IV1 and a high-level potential is held at the output terminal of the inverter circuit IV1*r* when the first data (a weight coefficient) set in the circuit MP is "−1"; and a low-level potential is held at the output terminal of the inverter circuit IV1 and a low-level potential is held at the output terminal of the inverter circuit IV1*r* when the first data (a weight coefficient) set in the circuit MP is "0".

For the input of the second data (a value of a signal of a neuron) to the circuit MP in FIG. 56A, the input time of a high-level potential to one of the wiring WX1L and the wiring X2L is set as in FIG. 54 and FIG. 55A.

The circuit MP in FIG. 56A has a configuration in which a current is made to flow from the wiring OL or the wiring OLB to the circuit MC using a transistor included in the inverter loop circuit IVR of the circuit HCS and a current is made to flow from the wiring OL or the wiring OLB to the circuit MCr using a transistor included in the inverter loop circuit IVRr of the circuit HCSr, which is different from the circuits MP in FIG. 54, FIG. 55A, and FIG. 55B.

Figure 56B:
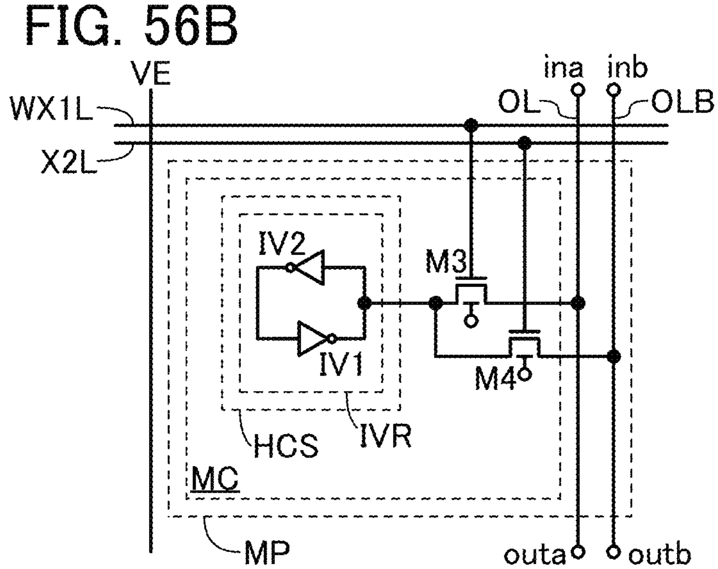

The configuration of the circuit MP in FIG. 56A can be changed into that of the circuit MP illustrated in FIG. 56B. The circuit MP in FIG. 56B has a configuration in which the circuit MCr included in the circuit MP in FIG. 56A is not provided. That is, a configuration is employed in which a current is made to flow from the wiring OL or the wiring OLB to the circuit MC by using the transistor included in the inverter loop circuit IVR of the circuit HCS. In this case, for example, the first data (a weight coefficient) set in the circuit MP can be "+1" when a high-level potential is supplied to the output terminal of the inverter circuit IV1, and the first data (a weight coefficient) set in the circuit MP can be "0" when a low-level potential is supplied to the output terminal of the inverter circuit IV1.

Figure 56C:
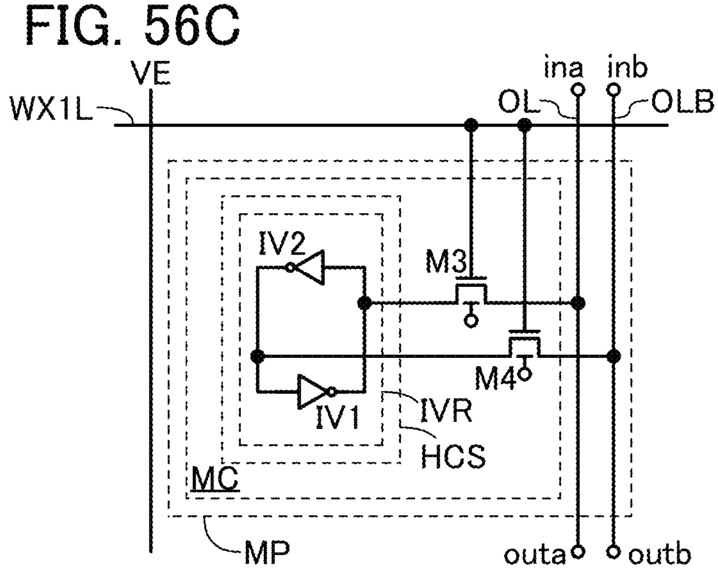

The circuit MP in FIG. 56C has a configuration in which the wiring X2L is not provided in the circuit MP in FIG. 56B and the first terminal of the transistor M4 is electrically connected to the input terminal of the inverter circuit IV1 and the output terminal of the inverter circuit IV2. When the potential of the wiring WX1L is a high-level potential, the inverted signal is output to the wiring OL or the wiring OLB. In this case, for example, the first data (a weight coefficient) set in the circuit MP can be "+1" when a high-level potential is supplied to the output terminal of the inverter circuit IV1, and the first data (a weight coefficient) set in the circuit MP can be "−1" when a low-level potential is supplied to the output terminal of the inverter circuit IV1. As another example, in supplying information (e.g., a current or a voltage) from the circuit MP to the circuit AFP, the second data (a value of a signal of a neuron) input to the circuit MP can be "+1" when a high-level potential is input to the wiring WX1L, and the second data (a value of a signal of a neuron) input to the circuit MP can be "0" when a low-level potential is input to the wiring WX1L.

Note that the circuits MP in FIG. 56A to FIG. 56C can each be used as the circuit MP of the arithmetic circuit 140 illustrated in FIG. 7, for example.

Figure 57A:
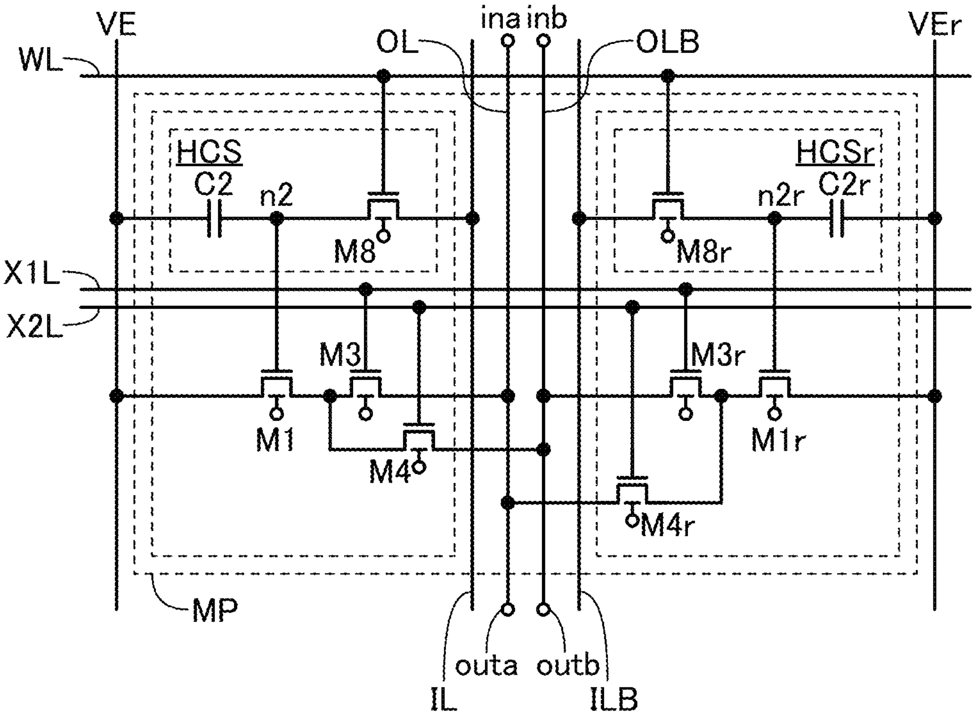
FIG. 57A and FIG. 57B are circuit diagrams each illustrating a configuration example of a circuit included in a semiconductor device.

As described above, the circuit HCS and the circuit HCSr included in the circuit MP in FIG. 54 can each have a configuration including a NOSRAM. FIG. 57A shows a specific example showing the details of the circuit MP in FIG. 54, in which the circuit HCS and the circuit HCSr each have a configuration including a NOSRAM. Note that in the circuit MP in FIG. 54, the circuit HCS is electrically connected to the wiring OL and the wiring OLB, and the circuit HCSr is electrically connected to the wiring OL and the wiring OLB; whereas in the circuit MP in FIG. 57A, the wiring IL and the wiring ILB are provided for the circuit MP in FIG. 54, the circuit HCS is electrically connected to the wiring IL, and the circuit HCSr is electrically connected to the wiring ILB. For the reference numerals shown in FIG. 57A, the method for holding the first data (a weight coefficient), and the like, the description of the circuit MP in FIG. 34 is referred to.

Figure 57B:
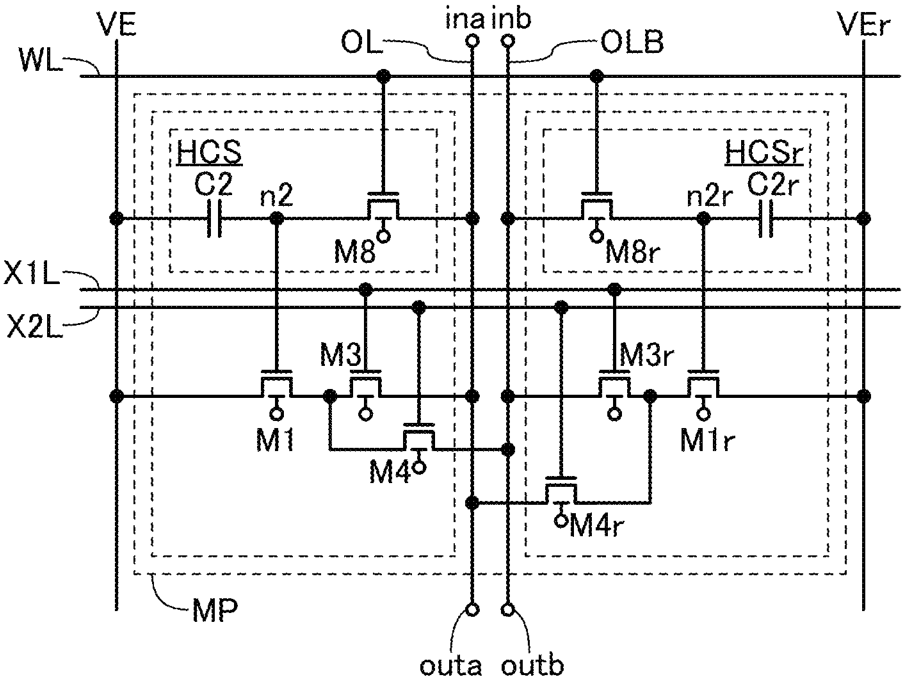

In the circuit MP in FIG. 57A, the wiring IL and the wiring OL may be combined into one wiring and/or the wiring ILB and the wiring OLB may be combined into one wiring. The circuit MP in FIG. 57B has a configuration in which the wiring IL and the wiring OL are combined into one wiring OL and the wiring ILB and the wiring OLB are combined into one wiring OLB.

Figure 58:
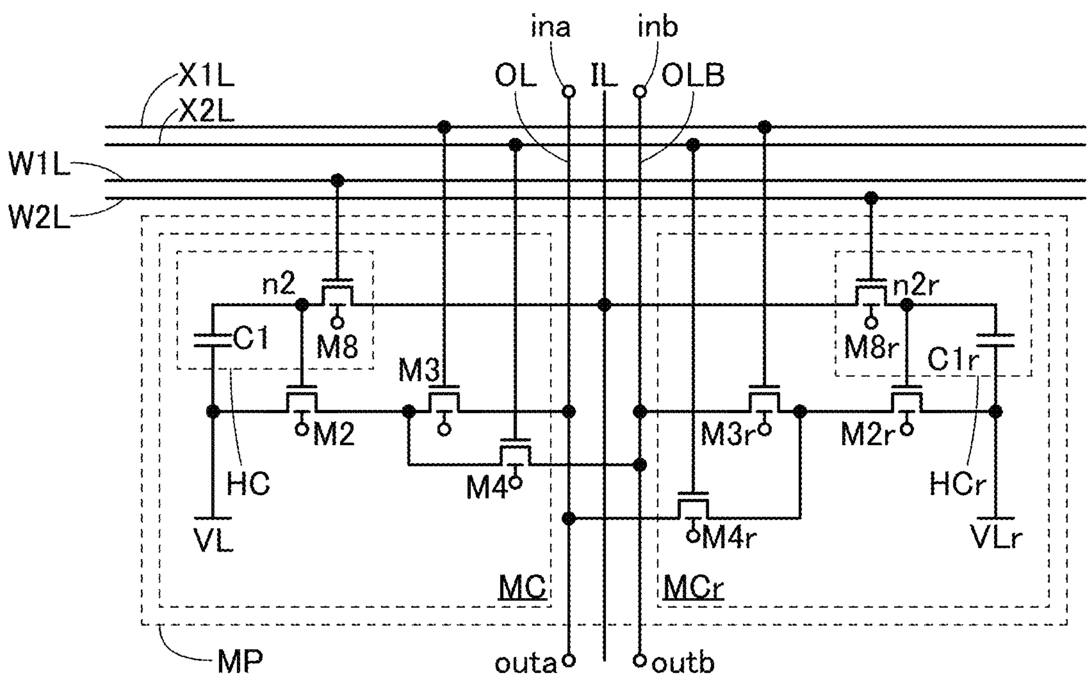
FIG. 58 is a circuit diagram illustrating a configuration example of a circuit included in a semiconductor device.

Alternatively, in the circuit MP in FIG. 57A, the wiring IL and the wiring ILB may be combined into one wiring. The circuit MP in FIG. 58 has a configuration in which the wiring IL and the wiring ILB are combined into one wiring IL. Note that as a wiring corresponding to the wiring WL of the circuit MP in FIG. 57, the wiring W1L and the wiring W2L are electrically connected to the circuit MP illustrated in FIG. 58. Specifically, the wiring W1L is electrically connected to the gate of the transistor M8 in the circuit MC, and the wiring W2L is electrically connected to a gate of the transistor M8*r* in the circuit MCr. The wiring W1L and the wiring W2L each function as a signal line for selecting one of the circuit MC and the circuit MCr in writing data to one of the circuit MC and the circuit MCr from the wiring IL. Note that when the transistor M8 is one of an n-channel transistor and a p-channel transistor and the transistor M8*r* is the other of the n-channel transistor and the p-channel transistor, the wiring W1L and the wiring W2L can be combined into one wiring in some cases (not illustrated).

Figure 59A:
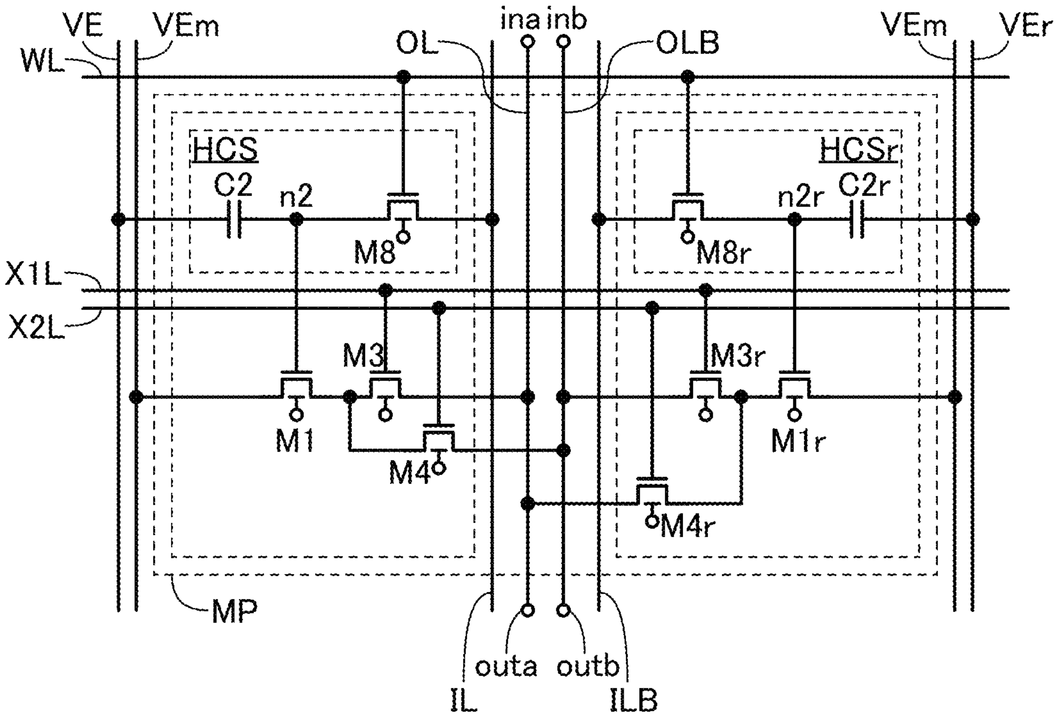
FIG. 59A and FIG. 59B are circuit diagrams each illustrating a configuration example of a circuit included in a semiconductor device.

To apply different voltages to the second terminal of the capacitor C2 and the first terminal of the transistor M1 in the circuit MP in FIG. 57A, the configuration of the circuit MP in FIG. 57A is changed into that of the circuit MP illustrated in FIG. 59A. In the circuit MP in FIG. 59A, the wiring VE is electrically connected to the second terminal of the capacitor C2, the wiring VEm is electrically connected to the first terminal of the transistor M1, the wiring VEr is electrically connected to the second terminal of the capacitor C2*r*, and the wiring VEmr is electrically connected to the first terminal of the transistor M1, as in the circuit MP in FIG. 16A. This configuration enables different potentials to be applied to the first terminal of the transistor M1, the second terminal of the capacitor C2, the first terminal of the transistor M1*r*, and the second terminal of the capacitor C2*r*. Similarly, to apply different voltages to the second terminal of the capacitor C2 and the first terminal of the transistor M1 in the circuit MP in FIG. 57B, the configuration is changed into that of the circuit MP illustrated in FIG. 59B. Note that the circuit configuration of the circuit MP in FIG. 59B may be the same as that of the circuit MP in FIG. 16A.

The operation method of the semiconductor device of one embodiment of the present invention is not limited to the above. For example, as described in Operation method example 2, the input period of signals that are input to the wiring X1L (the wiring WX1L in FIG. 56A and FIG. 56B) and the wiring X2L may be divided into a plurality of subperiods in the circuits MP in FIG. 54 to FIG. 58.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 6

Figure 60A:
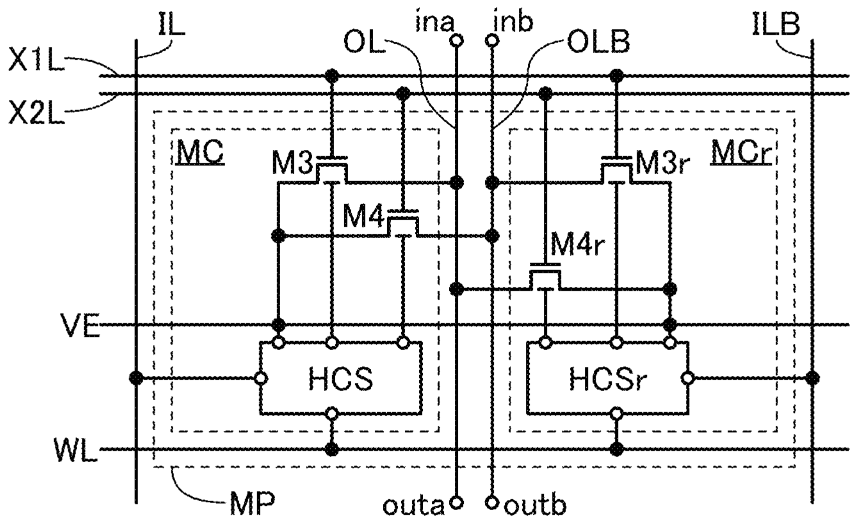
FIG. 60A and FIG. 60B are circuit diagrams each illustrating a configuration example of a circuit included in a semiconductor device.

Described here is an operation method example of the arithmetic circuit 120 in FIG. 3 for which the circuit MP in FIG. 60A is used.

As in Operation method example 1 to Operation method example 5, to avoid complexity of description, a current flowing through the wiring OL and the wiring OLB is changed by only one circuit MP electrically connected to the wiring OL and the wiring OLB. The wiring VE electrically connected to the circuit MP supplies VSS as a constant voltage to the circuit MP. The circuit ACTF[1] to the circuit ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example.

In FIG. 60A, the circuit MC included in the circuit MP includes the transistor M3, the transistor M4, and the circuit HCS. Specifically, the first terminal of the transistor M3 is electrically connected to the first terminal of the transistor M4 and the circuit HCS. The gate of the transistor M3 is electrically connected to the wiring X1L, a back gate of the transistor M3 is electrically connected to the circuit HCS, and the second terminal of the transistor M3 is electrically connected to the wiring OL. The gate of the transistor M4 is electrically connected to the wiring X2L, a back gate of the transistor M4 is electrically connected to the circuit HCS, and the second terminal of the transistor M4 is electrically connected to the wiring OLB. The circuit HCS is electrically connected to the wiring IL and the wiring WL.

In the circuit MP in FIG. 60A, the circuit MCr has substantially the same circuit configuration as the circuit MC. Thus, "r" is added to the reference numerals of the circuit elements and the like included in the circuit MCr to differentiate them from the circuit elements and the like included in the circuit MC. The second terminal of the transistor M3*r* is electrically connected to the wiring OLB, and the second terminal of the transistor M4*r* is electrically connected to the wiring OL.

For the structures of the transistor M3, the transistor M4, the transistor M3*r*, and the transistor M4*r*, the description of the transistor M3, the transistor M4, the transistor M3*r*, and the transistor M4*r*, which is mentioned elsewhere, is referred to.

The circuit HCS and the circuit HCSr can be, for example, an SRAM, a NOSRAM, or the like, like the circuit HCS and the circuit HCSr included in the circuit MP in FIG. 29. The circuit HCS and the circuit HCSr have a function of holding a potential corresponding to the first data (e.g., a weight coefficient) set in the circuit MP.

Figure 60B:
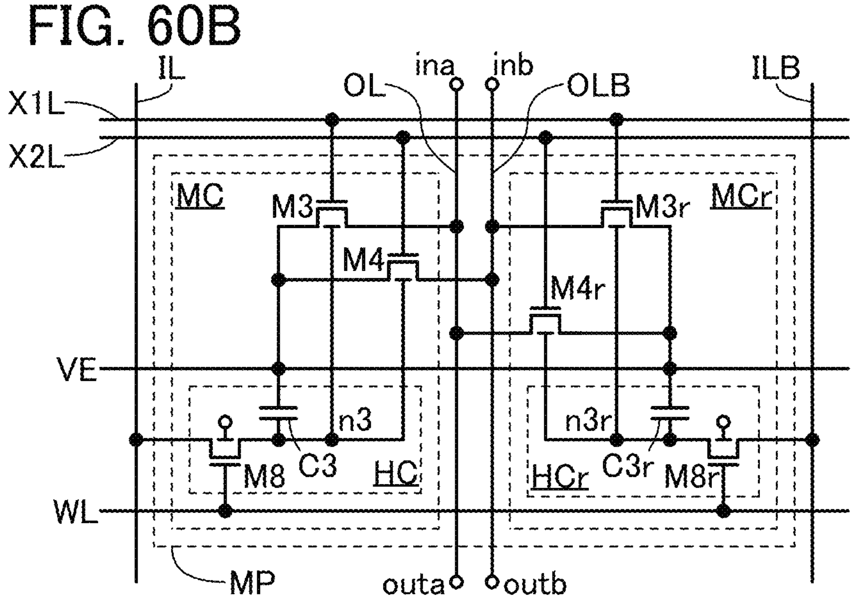

As a specific example, FIG. 60B illustrates a circuit configuration in the case where a NOSRAM is used for each of the circuit HCS and the circuit HCSr. The circuit HCS includes the transistor M8 and the capacitor C3. The first terminal of the transistor M8 is electrically connected to the wiring IL; the second terminal of the transistor M8 is electrically connected to the first terminal of the capacitor C3, the back gate of the transistor M3, and the back gate of the transistor M4; and the gate of the transistor M8 is electrically connected to the wiring WL. The second terminal of the capacitor C3 is electrically connected to the wiring VE.

The wiring X1L and the wiring X2L illustrated in FIG. 60A and FIG. 60B can be, for example, the wiring X1L[i] and the wiring X2L[i] of the arithmetic circuit 120 illustrated in FIG. 3. The wirings WL illustrated in FIG. 60A and FIG. 60B can be, for example, the wiring WLS[i] in the arithmetic circuit 120 illustrated in FIG. 3. The wiring IL and the wiring ILB illustrated in FIG. 60A and FIG. 60B can be, for example, a wiring IL[j] and the wiring IL[j] in the arithmetic circuit 120 illustrated in FIG. 3. The wiring OL and the wiring OLB illustrated in FIG. 60A and FIG. 60B can be, for example, the wiring OL[j] and the wiring OLB[j] in the arithmetic circuit 120 illustrated in FIG. 3.

The wiring VE functions as a wiring that supplies a constant voltage. The constant voltage can be the ground potential or a low-level potential, for example.

Figure 61A:
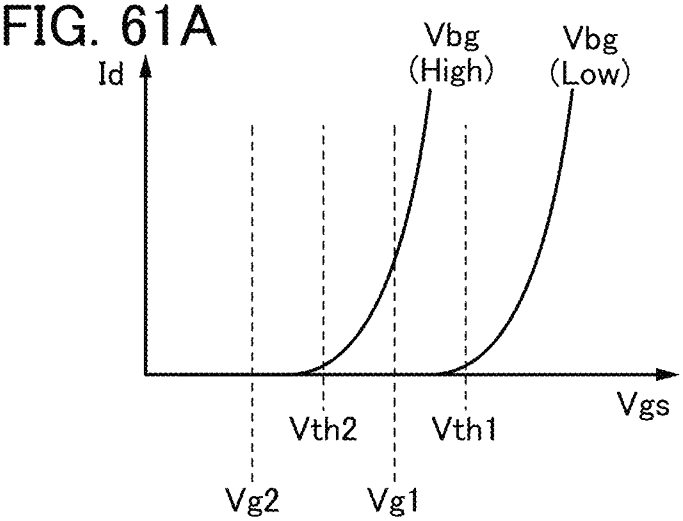
FIG. 61A and FIG. 61B are diagrams each showing voltage-current characteristics of a transistor included in a semiconductor device.

Here, the operation characteristics of the transistor M3, the transistor M3*r*, the transistor M4, and the transistor M4*r* included in the circuit MP are described. FIG. 61A is a graph simply showing the characteristics of the gate-source voltage and the drain current of any one of the transistor M3, the transistor M3*r*, the transistor M4, and the transistor M4*r* included in the circuit MP in FIG. 60A. The horizontal axis represents a gate-source voltage Vgs of the transistor, and the vertical axis represents a drain current Id of the transistor. Note that the vertical axis shown in FIG. 60A has a liner scale.

In FIG. 60A, for example, a potential applied to the gate of the transistor is denoted by Vg and a potential applied to the back gate of the transistor is denoted by Vbg. In addition, a constant potential applied to the source of the transistor is 0 V, for example.

FIG. 61A shows two curved lines: one of the curved lines represents the characteristics of the gate-source voltage Vgs and the drain current Id when Vbg of the transistor is a high-level potential (shown as High in FIG. 61A); and the other curved line represents the characteristics of on the gate-source voltage Vgs and the drain current Id when Vbg of the transistor is a low-level potential (shown as Low in FIG. 61A). FIG. 61A shows that a threshold voltage Vth2 of the transistor when Vbg is a high-level potential is lower than a threshold voltage Vth1 of the transistor when Vbg is a low-level potential. That is, Vgs (which can be replaced with Vg because the source drain is set to 0 V) needed to turn on the transistor can be changed by changing Vbg of the transistor.

Here, Vg of the transistor is set so that the transistor is turned on when Vbg of the transistor is a high-level potential and that the transistor is turned off when Vbg of the transistor is a low-level potential. In FIG. 61A, Vg of the transistor in this case is shown as Vg1. That is, Vg1 is higher than the threshold voltage Vth2 of the transistor where Vbg is a high-level potential, and lower than Vth1 of the transistor where Vbg is a low-level potential.

Alternatively, Vg of the transistor is set so that the transistor is turned off when Vbg of the transistor is a high-level potential and that the transistor is turned off when Vbg of the transistor is a low-level potential. In FIG. 61A, Vg of the transistor in this case is shown as Vg2. That is, Vg2 is lower than the threshold voltage Vth2 of the transistor M3 (the transistor M4) where Vbg is a high-level potential.

For example, as shown in FIG. 60A, the gate potentials Vg of the transistor M3 and the transistor M3*r* are supplied from the wiring X1L. Thus, Vg1 and Vg2 can be potentials supplied from the wiring X1L. Similarly, the gate voltages Vg of the transistor M4 and the transistor M4*r* are supplied from the wiring X2L. Thus, Vg1 and Vg2 can be potentials supplied from the wiring X2L. In this specification and the like, Vg1 and Vg2 can be replaced with a high-level potential and a low-level potential, respectively.

In this specification and the like, a "low-level potential" and a "high-level potential" do not represent specified potentials, and specific potentials may vary depending on wirings. Thus, high-level potentials applied to the back gates of the transistor M3, the transistor M3*r*, the transistor M4, and the transistor M4*r* may be potentials different from high-level potentials (Vg1) applied to the wiring X1L and the wiring X2L. Similarly, low-level potentials applied to the back gates of the transistor M3, the transistor M3*r*, the transistor M4, and the transistor M4*r* may be potentials different from low-level potentials (Vg2) applied to the wiring X1L and the wiring X2L. For example, high-level potentials applied to the back gates of the transistor M3, the transistor M3*r*, the transistor M4, and the transistor M4*r* may be the same as the source potentials of the transistor M3, the transistor M3*r*, the transistor M4, and the transistor M4*r*. Alternatively, for example, low-level potentials applied to the back gates of the transistor M3, the transistor M3*r*, the transistor M4, and the transistor M4*r* may be potentials lower than the source potentials of the transistor M3, the transistor M3*r*, the transistor M4, and the transistor M4*r*. Thus, for example, in the case where the source potentials of the transistor M3, the transistor M3*r*, the transistor M4, and the transistor M4*r* are 0 V, low-level potentials applied to the back gates of the transistor M3, the transistor M3*r*, the transistor M4, and the transistor M4*r* are negative potentials and may be higher than or equal to −11 V and lower than or equal to −2 V, preferably around −3 V, for example.

Figure 61B:
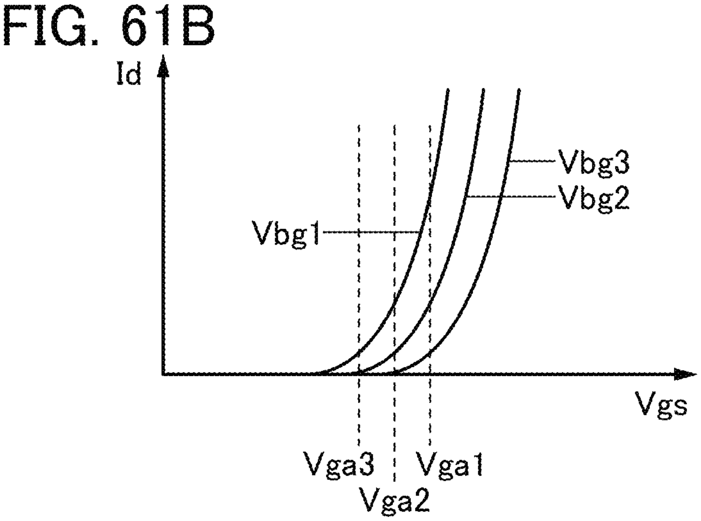

Note that in the above-described operation example, potentials (Vg1 and Vg2) supplied to the wiring X1L and the wiring X2L and the back gate potentials of the transistor M3, the transistor M3*r*, the transistor M4, and the transistor M4*r* are described as binary values (digital values), but one embodiment of the present invention is not limited thereto. For example, as shown in FIG. 61B, the drain current Id of the transistor can be increased and decreased by changing the back gate potential of the transistor to any one of Vbg1, Vbg2, and Vbg3 in the case where the gate of the transistor is Vga1. Here, the case of the circuit MP in FIG. 60A is considered. The drain currents Id of the transistor M3, the transistor M3*r*, the transistor M4, and the transistor M4*r* are changed by changing the back gate potentials of the transistor M3, the transistor M3*r*, the transistor M4, and the transistor M4*r* while the gate potentials of the transistor M3, the transistor M3*r*, the transistor M4, and the transistor M4*r* are fixed, whereby the amount of current flowing through the wiring OL and the wiring OLB can be increased and decreased. In other words, the circuit MP can perform arithmetic operation utilizing analog values by changing the back gate potentials of the transistor M3, the transistor M3*r*, the transistor M4, and the transistor M4*r* as analog values.

As shown in FIG. 60A and FIG. 60B, potentials supplied to the back gates of the transistor M3 and the transistor M4 can be a potential held in the circuit HCS. Moreover, potentials supplied to the back gates of the transistor M3*r* and the transistor M4*r* can be a potential held in the circuit HCSr. That is, the circuit HCS and the circuit HCSr each hold a potential corresponding to the first data (e.g., a weight coefficient) set in the circuit MP.

For example, as shown in FIG. 61B, in the case where the back gate potential of the transistor is set to any one of Vbg1, Vbg2, and Vbg3 and the gate potential of the transistor is changed to any one of Vga1, Vga2, and Vga3, the drain current Id of the transistor can be increased and decreased. When the case of the circuit MP in FIG. 60A is considered, the drain currents Id of the transistor M3, the transistor M3*r*, the transistor M4, and the transistor M4*r* are changed by changing the gate potentials of the transistor M3, the transistor M3*r*, the transistor M4, and the transistor M4*r* while the back gate potentials of the transistor M3, the transistor M3*r*, the transistor M4, and the transistor M4*r* are fixed, whereby the amount of current flowing through the wiring OL and the wiring OLB can be increased and decreased. In other words, the circuit MP can perform arithmetic operation utilizing analog values by changing the gate potentials of the transistor M3, the transistor M3*r*, the transistor M4, and the transistor M4*r* as analog values. Alternatively, the drain currents Id of the transistor M3, the transistor M3*r*, the transistor M4, and the transistor M4*r* may be changed by changing the source electrode potentials as analog values while the gate potentials and the back gate potentials of the transistor M3, the transistor M3*r*, the transistor M4, and the transistor M4*r* are fixed (not illustrated).

Alternatively, in inputting the second data (e.g., a value of a signal of a neuron here) to the circuit MP in FIG. 60A, a high-level potential may be input to one of the wiring X1L and the wiring X2L, a low-level potential may be input to the other of the wiring X1L and the wiring X2L, and the input time of the high-level potential input to one of the wiring X1L and the wiring X2L may be set in accordance with the second data (a value of a signal of a neuron), as in the above-described operation method example. Furthermore, the input period of a high-level potential may be divided into a plurality of subperiods, for example. Since the second data can be treated as a multilevel value or an analog value in this method, the product of the first data having a binary value, a multilevel value, or an analog value and the second data having a binary value, a multilevel value, or an analog value can be calculated.

Figure 59B:
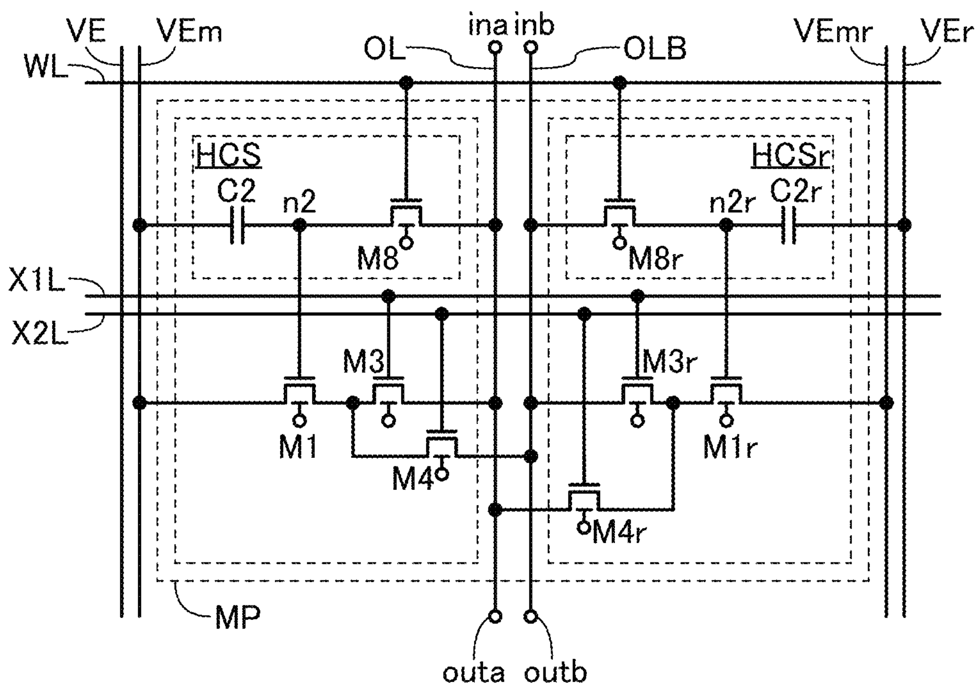

In FIG. 60B, the wiring VE is electrically connected to the first terminal of the transistor M3, the first terminal of the transistor M4, the first terminal of the transistor M3*r*, the first terminal of the transistor M4*r*, the second terminal of the capacitor C3, and the second terminal of the capacitor C3*r*; in the case where different potentials are intended to be supplied to the circuit elements, different wirings, such as the wiring VE, the wiring VEm, the wiring VEr, and the wiring VEmr in FIG. 59A, FIG. 59B, and the like, are electrically connected to the circuit elements.

In FIG. 59A and FIG. 59B, operation similar to the above can be performed in some cases even when the gate and the back gate of the transistor M3 are replaced with each other. Moreover, operation similar to the above can be performed in some cases even when the gate and the back gate of each of the transistor M3*r*, the transistor M4, and the transistor M4*r* are replaced with each other.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 120 in FIG. 3. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 120 in FIG. 3 is used as an example in this operation example, operation similar to that of this operation example can be performed by changing the arithmetic circuit to another one according to circumstances. For example, when the wiring IL and the wiring OL are combined into one wiring OL and the wiring ILB and the wiring OLB are combined into one wiring OLB, the circuits MP in FIG. 59A and FIG. 59B can also be used for the arithmetic circuit 140 in FIG. 7, the arithmetic circuit 150 in FIG. 11, and the like.

Note that this operation method example can be combined with any of the other operation method examples and the like described in this specification as appropriate.

Operation Method Example 7

Figure 62:
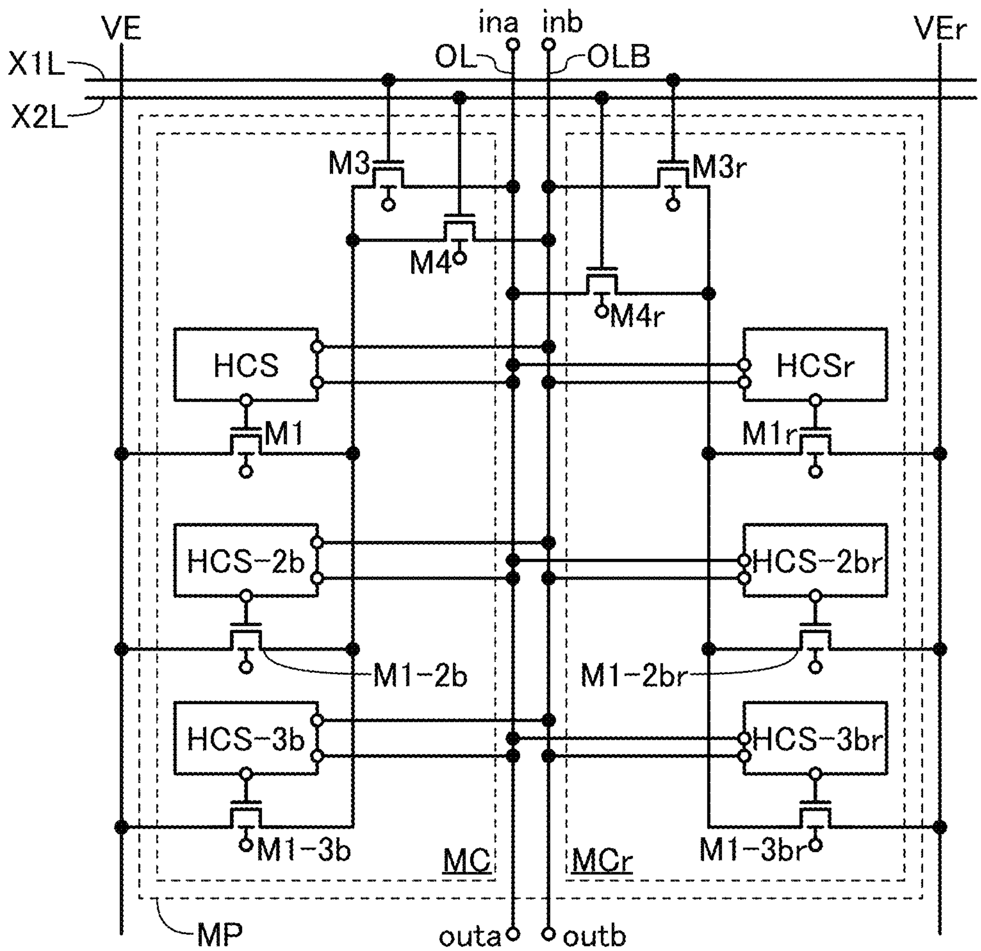
FIG. 62 is a circuit diagram illustrating a configuration example of a circuit included in a semiconductor device.

Described here is an operation method example of the arithmetic circuit 150 in FIG. 11 for which the circuit MP in FIG. 62 is used.

As in Operation method example 1 to Operation method example 6, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example.

FIG. 62 shows a circuit configuration similar to that of the circuit MP illustrated in FIG. 36. The circuit MP in FIG. 62 has a configuration in which the circuit HCS, the circuit HCS-2*b*, and the circuit HCS-3*b* are electrically connected to the wiring OLB and the circuit HCSr, the circuit HCS-2*br*, and the circuit HCS-3*br* are electrically connected to the wiring OL. This operation method example is different from the operation example of the circuit MP in FIG. 36 described in Embodiment 2.

Specifically, the input time of a high-level potential to one of the wiring X1L and the wiring X2L is set in accordance with the second data (e.g., a value of a signal of a neuron here) in the circuit MP, as in Operation method example 5. That is, the time during which the transistor M3 and the transistor M3*r* are in an on state or the transistor M4 and the transistor M4*r* are in an on state is set.

As described in Operation method example 1, the amount of charge flowing from the wiring OL or the wiring OLB to the wiring VE through the transistor M1 is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1*r* is determined by setting the first data (a weight coefficient) in the circuit MP and setting the time during which the transistor M3*r* or the transistor M4*r* is in an on state.

The amount of charge flowing from the wiring OL or the wiring OLB to the wiring VE through the transistor M1-2*b* and the amount of charge flowing from the wiring OL or the wiring OLB to the wiring VEr through the transistor M1-2*br* are also determined by setting the times during which the transistor M3, the transistor M3*r*, the transistor M4, and the transistor M4*r* are in an on state.

Thus, the second data (a value of a signal of a neuron) in the circuit MP in FIG. 62 can be defined in a manner similar to that of the second data (a value of a signal of a neuron) in the circuit MP in FIG. 54.

As described in Configuration example 6 in Embodiment 2, the circuit HCS, the circuit HCS-2*b*, the circuit HCS-3*b*, the circuit HCSr, the circuit HCS-2*br*, and the circuit HCS-3*br* illustrated in FIG. 62 can each have a configuration including an SRAM or a configuration including a NOSRAM, for example. Here, a potential having a binary value (a digital value) is held in the circuit HCS, the circuit HCS-2*b*, the circuit HCS-3*b*, the circuit HCSr, the circuit HCS-2*br*, and the circuit HCS-3*br*.

When the ratios of the W lengths to the L lengths of the transistor M1 and the transistor M1*r* are each W/L, the ratios of the W lengths to the L lengths of the transistor M1-2*b* and the transistor M1-2*br* are each 2 W/L, and the ratios of the W lengths to the L lengths of the transistor M1-3*b* and the transistor M1-3*br* are each 4 W/L.

Thus, for the first data (e.g., a weight coefficient here) set in the circuit MP, the contents of Configuration example 6 in Embodiment 2 can be referred to. Specifically, for example, the first data (a weight coefficient) set in the circuit MP is determined in accordance with currents flowing through the transistor M1, the transistor M1*r*, the transistor M1-2*b*, the transistor M1-2*br*, the transistor M1-3*b*, and the transistor M1-3*br*. In other words, the first data (a weight coefficient) set in the circuit MP is determined in accordance with potentials held in the circuit HCS, the circuit HCS-2*b*, the circuit HCS-3*b*, the circuit HCSr, the circuit HCS-2*br*, and the circuit HCS-3*br*. From the above, by holding potentials in the circuit HCS, the circuit HCS-2*b*, the circuit HCS-3*b*, the circuit HCSr, the circuit HCS-2*br*, and the circuit HCS-3*br* as in the following table, the first data (a weight coefficient) to be set in the circuit MP can be set.

TABLE 13

| Weight coefficient | HCS | HCSr | HCS-2b | HCS-2br | HCS-3b | HCS-3br |
|---|---|---|---|---|---|---|
| +1 | VDDL | VSS | VSS | VSS | VSS | VSS |
| +2 | VSS | VSS | VDDL | VSS | VSS | VSS |
| +3 | VDDL | VSS | VDDL | VSS | VSS | VSS |
| +4 | VSS | VSS | VSS | VSS | VDDL | VSS |
| +5 | VDDL | VSS | VSS | VSS | VDDL | VSS |
| +6 | VSS | VSS | VDDL | VSS | VDDL | VSS |
| +7 | VDDL | VSS | VDDL | VSS | VDDL | VSS |
| −1 | VSS | VDDL | VSS | VSS | VSS | VSS |
| −2 | VSS | VSS | VSS | VDDL | VSS | VSS |
| −3 | VSS | VDDL | VSS | VDDL | VSS | VSS |
| −4 | VSS | VSS | VSS | VSS | VSS | VDDL |
| −5 | VSS | VDDL | VSS | VSS | VSS | VDDL |
| −6 | VSS | VSS | VSS | VDDL | VSS | VDDL |
| −7 | VSS | VDDL | VSS | VDDL | VSS | VDDL |
| 0 | VSS | VSS | VSS | VSS | VSS | VSS |

Note that the amount of current flowing through the transistor M1 is $I_1$ in the case where the voltage VDDL is held in the circuit HCS. Since the ratio of the W length to the L length of the transistor M1-2*b* is twice as high as the ratio of the W length to the L length of the transistor M1, the amount of current flowing through the transistor M1-2*b* is $2I_1$ in the case where the voltage VDDL is held in the circuit HCS-2*b*. Since the ratio of the W length to the L length of the transistor M1-3*b* is four times as high as the ratio of the W length to the L length of the transistor M1, the amount of current flowing through the transistor M1-3*b* is $4I_1$ in the case where the voltage VDDL is held in the circuit HCS-3*b*. Similarly, the amount of current flowing through the transistor M1*r* is $I_1$ in the case where the voltage VDDL is held in the circuit HCSr, the amount of current flowing through the transistor M1-2*br* is $2I_1$ in the case where the voltage VDDL is held in the circuit HCS-2*br*, and the amount of current flowing through the transistor M1-3*br* is $4I_1$ in the case where the voltage VDDL is held in the circuit HCS-3*br*. Note that the amount of current flowing through the transistor M1, the transistor M1*r*, the transistor M1-2*b*, the transistor M1-2*br*, the transistor M1-3*b*, and the transistor M1-3*br* is 0 in the case where the voltage VSS is held in each of the circuit HCS, the circuit HCSr, the circuit HCS-2*b*, the circuit HCS-2*br*, the circuit HCS-3*b*, and the circuit HCS-2*br*.

Next, a specific operation example of the circuit MP in FIG. 62 is described.

The first data (a weight coefficient) of "+7" is set in the circuit MP in advance, for example. At this time, the current of ut flows between the source and the drain of the transistor M1, the current of $2I_{ut}$ flows between the source and the drain of the transistor M1-2*b*, and the current of $4I_{ut}$ flows between the source and the drain of the transistor M1-3*b*.

In the case where "+3" is input to the circuit MP as the second data (a value of a signal of a neuron), the transistor M3 is in an on state only for the time $3t_{ut}$ and the transistor M4 is in an off state, so that the amount of charge flowing from the wiring OL to the wiring VE through the circuit MC is $3t_{ut}\times I_{ut}+3t_{ut}\times 2I_{ut}+3t_{ut}\times 4I_{ut}=21t_{ut}\times I_{ut}$. Note that $t_{ut}\times I_{ut}=Q_{ut}$ is satisfied here. That is, the amount of charge flowing from the wiring OL to the wiring VE through the circuit MC is $21t_{ut}\times I_{ut}=21Q_{ut}$. Meanwhile, the amount of charge flowing from the wiring OLB to the wiring VEr through the circuit MCr is 0 because the transistor M1*r*, the transistor M1-2*br*, and the transistor M1-3*br* are in an off state.

In the case where "−3" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OLB to the wiring VE through the circuit MC is $21t_{ut}\times I_{ut}=21Q_{ut}$ and the amount of charge flowing from the wiring OL to the wiring VEr through the circuit MCr is 0.

The case is considered where the first data (a weight coefficient) of "−7" is set in the circuit MP in advance, for example. At this time, the current of $I_1$ flows between the source and the drain of the transistor M1*r*, the current of $2I_1$ flows between the source and the drain of the transistor M1-2*br*, and the current of $4I_1$ flows between the source and the drain of the transistor M1-3*br*.

In the case where "+3" is input to the circuit MP as the second data (a value of a signal of a neuron), the transistor M3*r* is in an on state only for the time $3t_{ut}$ and the transistor M4*r* is in an off state, so that the amount of charge flowing from the wiring OLB to the wiring VEr through the circuit MCr is $3t_{ut}\times I_{ut}+3t_{ut}\times 2I_{ut}+3t_{ut}\times 4I_{ut}=21t_{ut}\times I_{ut}$. That is, the amount of charge flowing from the wiring OLB to the wiring VEr through the circuit MCr is $21t_{ut}\times I_{ut}=21Q_{ut}$. Meanwhile, the amount of charge flowing from the wiring OL to the wiring VE through the circuit MC is 0 because the transistor M1, the transistor M1-2*b*, and the transistor M1-3*b* are in an off state.

In the case where "−3" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OL to the wiring VEr through the circuit MCr is $21t_{ut}\times I_{ut}=21Q_{ut}$ and the amount of charge flowing from the wiring OLB to the wiring VE through the circuit MC is 0.

The combination of potentials held in the circuit HCS, the circuit HCS-2b, the circuit HCS-3b, the circuit HCSr, the circuit HCS-2br, and the circuit HCS-3br is changed by changing the first data (a weight coefficient) set in the circuit MP, and accordingly the amount of current flowing through each of the transistor M1, the transistor M1r, the transistor M1-2b, the transistor M1-2br, the transistor M1-3b, and the transistor M1-3br changes. Thus, the amount of charge flowing from the wiring OL or the wiring OLB to the wiring VE through the circuit MC and the amount of charge flowing from the wiring OL or the wiring OLB to the wiring VEr through the circuit MCr can be determined in accordance with the first data (a weight coefficient).

In the case where the first data (a weight coefficient) of "0" is set in the circuit MP in advance, the transistor M1, the transistor M1r, the transistor M1-2b, the transistor M1-2br, the transistor M1-3b, and the transistor M1-3br are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where "0" is input to the circuit MP as the second data (a value of a signal of a neuron), a low-level potential is input to the wiring X1L and the wiring X2L, and thus the transistor M3, the transistor M3r, the transistor M4, and the transistor M4r are turned off. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the amount of charge flowing through the wiring OL and the wiring OLB.

By setting the first data (a weight coefficient) and the second data (a value of a signal of a neuron) as described above, the charge amount $Q_{OL}$ with which a current flows from the wiring OL to the circuit MC or the circuit MCr and the charge amount $Q_{OLB}$ with which a current flows from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "+7" and the second data (a value of a signal of a neuron) is "+3", $Q_{OL}=21Q_{ut}$ and $Q_{OLB}=0$ are satisfied. In this case, a current flows from the wiring OL to the circuit MC or the circuit MCr, and thus the result of the product is a positive value. Accordingly, "+21" can be calculated from the charge amount $Q_{OL}$ as the result of the product of the first data (a weight coefficient) and the second data (a value of a signal of a neuron), for example, by replacing $Q_{ut}$ with "+1" in the charge amount $Q_{OL}$ with which a current flows from the wiring OL to the circuit MC or the circuit MCr. Alternatively, for example, when the first data (a weight coefficient) is "−7" and the second data (a value of a signal of a neuron) is "+3", $Q_{OL}=0$ and $Q_{OLB}=21Q_{ut}$ are satisfied. In this case, a current flows from the wiring OLB to the circuit MC or the circuit MCr, and thus the result of the product is a negative value. Accordingly, "−21" can be calculated from the charge amount $Q_{OLB}$ as the result of the product of the first data (a weight coefficient) and the second data (a value of a signal of a neuron), for example, by replacing $Q_{ut}$ with "−1" in the charge amount $Q_{OLB}$ with which a current flows from the wiring OLB to the circuit MC or the circuit MCr.

When the second data (a value of a signal of a neuron) is an integer or a real number other than "−3", "−2", "−1", "0", "+1", "+2", and "+3", the input time of a high-level potential to one of the wiring X1L and the wiring X2L is set in accordance with the integer or the real number. For example, by setting the input time to $a \times t_{ut}$, where a is a positive real number, the second data (a value of a signal of a neuron) can be processed as an analog value.

Accordingly, the multilevel second data (a value of a signal of a neuron) can be supplied to the circuit MP, as in Operation method example 1 to Operation method example 3 and Operation method example 5.

In the semiconductor device of one embodiment of the present invention, the configuration of the circuit MP is not limited to that in FIG. 62. For example, in the circuit MP in FIG. 62, the circuit MC includes three transistors of the transistor M1, the transistor M1-2b, and the transistor M1-3b and the circuit MCr includes three transistors of the transistor M1r, the transistor M1-2br, and the transistor M1-3br as transistors for setting current amounts; however, the circuit MC and the circuit MCr may each include two transistors or four or more transistors for setting current amounts. In addition, the number of holding portions and the number of wirings may be increased and decreased in accordance with the number of transistors.

The operation method of the semiconductor device of one embodiment of the present invention is not limited to the above. For example, as described in Operation method example 2, the input period of signals that are input to the wirings X1L and X2L may be divided into a plurality of subperiods in the circuit MP in FIG. 62.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 8

Figure 63:
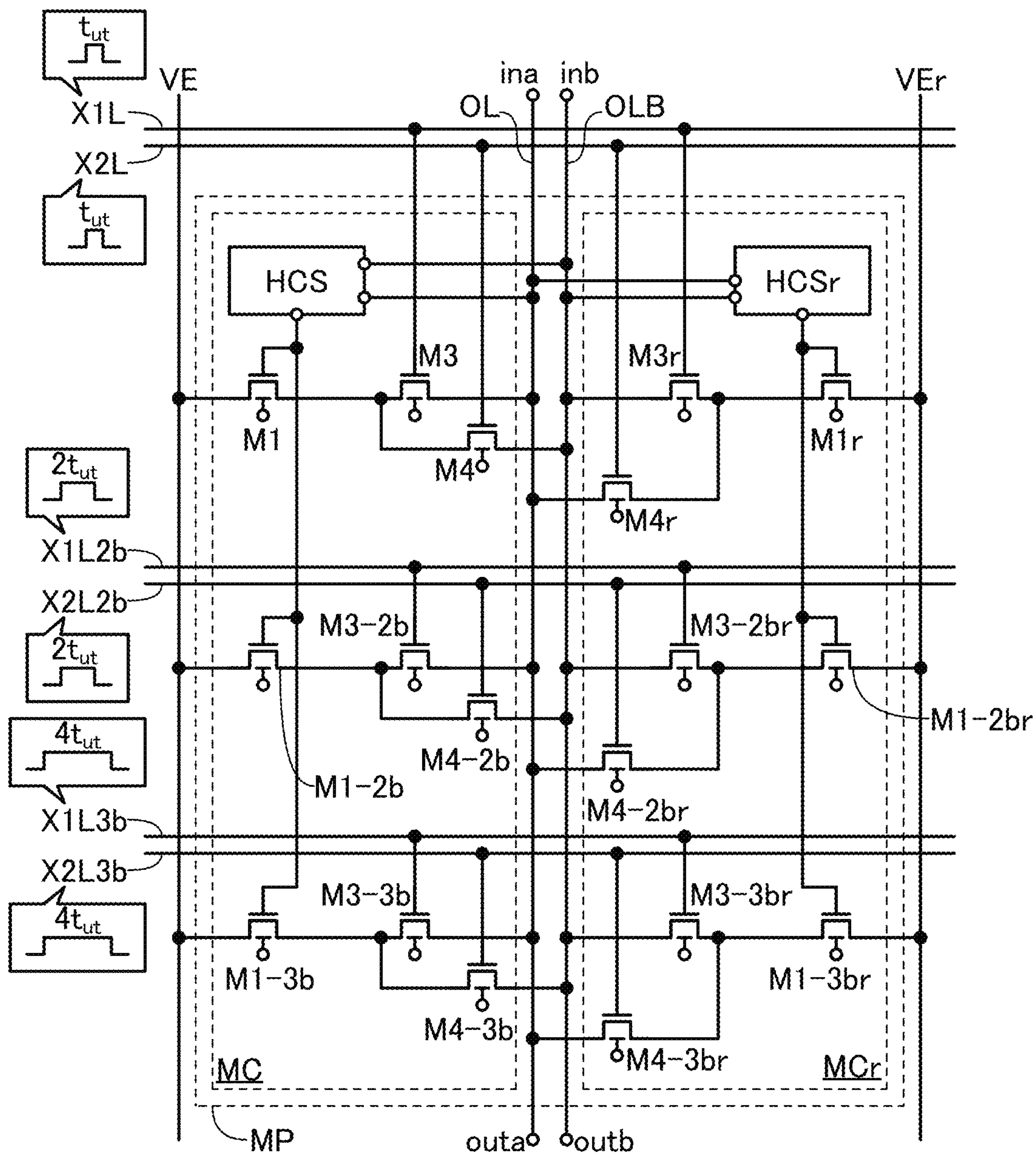
FIG. 63 is a circuit diagram illustrating a configuration example of a circuit included in a semiconductor device.

Described here is an operation method example of the arithmetic circuit 150 in FIG. 11 for which the circuit MP in FIG. 63 is used.

As in Operation method example 1 to Operation method example 7, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuits ACTF[1] to ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example.

FIG. 63 shows a circuit configuration similar to that of the circuit MP illustrated in FIG. 29. Note that the sizes, e.g., the W lengths and the L lengths, of the transistor M1, the transistor M1*r*, the transistor M1-2*b*, the transistor M1-2*br*, the transistor M1-3*b*, and the transistor M1-3*br* are preferably equal to each other. This operation method example is different from the operation example of the circuit MP in FIG. 29 described in Embodiment 2.

Specifically, as in the circuit MP in FIG. 51, in inputting the second data (e.g., a value of a signal of a neuron here) to the circuit MP, when the input time of a high-level potential to one of the wiring X1L and the wiring X2L is $t_{ut}$, the input time of a high-level potential to one of the wiring X1L2*b* and the wiring X2L2*b* is $2t_{ut}$ and the input time of a high-level potential to one of the wiring X1L3*b* and the wiring X2L3*b* is $4t_{ut}$ in the operation. That is, the operation is performed such that when the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$ and the time during which the transistor M3-3*b* and the transistor M3-3*br* are in an on state or the transistor M4-3*b* and the transistor M4-3*br* are in an on state is $4t_{ut}$. Thus, to show the difference in operation between the circuit MP in FIG. 29 and the circuit MP in FIG. 63, FIG. 63 shows schematic views of pulse voltages and the input times around the reference numerals of the wiring X1L, the wiring X2L, the wiring X1L2*b*, the wiring X2L2*b*, the wiring X1L3*b*, and the wiring X2L3*b*.

As described in Operation method example 1 and Operation method example 2, the amount of charge flowing from the wiring OL or the wiring OLB to the wiring VE through the transistor M1 is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1*r* is determined by setting the first data (a weight coefficient) in the circuit MP and setting the time during which the transistor M3*r* or the transistor M4*r* is in an on state.

Similarly, the amount of charge flowing from the wiring OL or the wiring OLB to the wiring VE through the transistor M1-2*b* and the amount of charge flowing from the wiring OL or the wiring OLB to the wiring VEr through the transistor M1-2*br* are also determined by setting the times during which the transistor M3-2*b*, the transistor M3-2*br*, the transistor M4-2*b*, and the transistor M4-2*br* are in an on state. In addition, the amount of charge flowing from the wiring OL or the wiring OLB to the wiring VE through the transistor M1-3*b* and the amount of charge flowing from the wiring OL or the wiring OLB to the wiring VEr through the transistor M1-3*br* are also determined by setting the times during which the transistor M3-3*b*, the transistor M3-3*br*, the transistor M4-3*b*, and the transistor M4-3*br* are in an on state.

Thus, the second data (a value of a signal of a neuron) in the circuit MP in FIG. 63 can be defined, for example, in a manner similar to that of the second data (a value of a signal of a neuron) in the circuit MP in FIG. 51 described in Operation method example 3.

As described in Configuration example 5 in Embodiment 2, the circuit HCS and the circuit HCSr illustrated in FIG. 63 can each have a configuration including an SRAM or a configuration including a NOSRAM. Here, a potential having a binary value (a digital value) is held in the circuit HCS and the circuit HCSr. Thus, for example, a high-level potential (e.g., VDDL here) is held in the circuit HCS and a low-level potential (e.g., VSS here) is held in the circuit HCSr when the first data (a weight coefficient) set in the circuit MP is "+1"; a low-level potential is held in the circuit HCS and a high-level potential is held in the circuit HCSr when the first data (a weight coefficient) set in the circuit MP is "−1"; and a low-level potential is held in the circuit HCS and a low-level potential is held in the circuit HCSr when the first data (a weight coefficient) set in the circuit MP is "0".

Note that the amount of current flowing through the transistor M1 is $I_1$ in the case where the voltage VDDL is held in the circuit HCS. The amount of current flowing through the transistor M1 is 0 in the case where the voltage VSS is held in the circuit HCS. Similarly, the amount of current flowing through the transistor M1*r* is $I_{ut}$ in the case where the voltage VDDL is held in the circuit HCSr, and the amount of current flowing through the transistor M1*r* is 0 in the case where the voltage VSS is held in the circuit HCSr.

In the circuit MC, the sizes of the transistor M1, the transistor M1-2*b*, and the transistor M1-3*b* are equal to each other, the gates of the transistor M1, the transistor M1-2*b*, and the transistor M1-3*b* are electrically connected to the circuit HCS, and the first terminals of the transistor M1, the transistor M1-2*b*, and the transistor M1-3*b* are electrically connected to the wiring VE; thus, almost equal currents flow between the sources and the drains of the transistor M1, the transistor M1-2*b*, and the transistor M1-3*b*. Therefore, the amount of current flowing between the sources and the drains of the transistor M1-2*b* and the transistor M1-3*b* is $I_{ut}$ as in the transistor M1. In addition, the sizes of the transistor M1*r*, the transistor M1-2*br*, and the transistor M1-3*br* are equal to that of the transistor M1, the gates of the transistor M1*r*, the transistor M1-2*br*, and the transistor M1-3*br* are electrically connected to the circuit HCSr, and the first terminals of the transistor M1*r*, the transistor M1-2*br*, and the transistor M1-3*br* are electrically connected to the wiring VEr; thus, a current flowing between the source and the drain of each of the transistor Mir, the transistor M1-2*br*, and the transistor M1-3*br* is equal to a current flowing between the source and the drain of the transistor M1. Therefore, the amount of current flowing between the source and the drain of each of the transistor Mir, the transistor M1-2*br*, and the transistor M1-3*br* is $I_{ut}$ as in the transistor M1.

Next, a specific operation example of the circuit MP in FIG. 63 is described.

The first data (a weight coefficient) of "+1" is set in the circuit MP in advance, for example.

In the case where "+7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1 is $t_{ut}\times I_{ut}$. Note that $t_{ut}\times I_{ut}=Q_{ut}$ is satisfied here. Similarly, the transistor M3-2*b* is in an on state only for the time $2t_{ut}$ and the transistor M4-2*b* is in an off state, so that the amount of charge flowing from the wiring OL to the wiring VE through the transistor M1-2*b* is $2t_{ut}\times I_{ut}=2Q_{ut}$. The transistor M3-3*b* is in an on state only for the time $4t_{ut}$ and the transistor M4-3*b* is in an off state, so that the amount of charge flowing from the wiring OL to the wiring VE through the transistor M1-3*b* is $4t_{ut}\times I_{ut}=4Q_{ut}$. Thus, the amount of charge flowing from the wiring OL to the wiring VE through the circuit MC is $Q_{ut}+2Q_{ut}+4Q_{ut}=7Q_{ut}$. Meanwhile, the amount of charge flowing from the wiring OLB to the wiring VEr through the circuit MCr is 0 because the transistor M1*r*, the transistor M1-2*br*, and the transistor M1-3*br* are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OLB to the wiring VE through the circuit MC is $Q_{ut}+2Q_{ut}+4Q_{ut}=7Q_{ut}$ and the amount of charge flowing from the wiring OL to the wiring VEr through the circuit MCr is 0.

In addition, the case is considered where the first data (a weight coefficient) of "−1" is set in the circuit MP in advance, for example.

In the case where "+7" is input to the circuit MP as the second data (a value of a signal of a neuron), the transistor M3*r* is in an on state only for the time $t_{ut}$ and the transistor M4*r* is in an off state, so that the amount of charge flowing from the wiring OLB to the wiring VEr through the transistor M1*r* is $t_{ut}\times I_{ut}=Q_{ut}$. Similarly, the transistor M4-2*br* is in an on state only for the time $2t_{ut}$ and the transistor M3-2*br* is in an off state, so that the amount of charge flowing from the wiring OLB to the wiring VEr through the transistor M1-2*br* is $2t_{ut}\times I_{ut}=2Q_{ut}$. The transistor M4-3*br* is in an on state only for the time $4t_{ut}$ and the transistor M3-3*br* is in an off state, so that the amount of charge flowing from the wiring OLB to the wiring VEr through the transistor M1-3*br* is $4t_{ut}\times I_{ut}=4Q_{ut}$. Thus, the amount of charge flowing from the wiring OLB to the wiring VEr through the circuit MCr is $Q_{ut}+2Q_{ut}+4Q_{ut}=7Q_{ut}$. Meanwhile, the amount of charge flowing from the wiring OL to the wiring VE through the circuit MC is 0 because the transistor M1, the transistor M1-2*b*, and the transistor M1-3*b* are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OL to the wiring VEr through the circuit MCr is $Q_{ut}+2Q_{ut}+4Q_{ut}=7Q_{ut}$ and the amount of charge flowing from the wiring OLB to the wiring VE through the circuit MC is 0.

Thus, by setting the first data (a weight coefficient) of "+1" in the circuit MP and selecting one or more transistors to be turned on from the transistor M3, the transistor M3-2*b*, and the transistor M3-3*b* included in the circuit MP in accordance with the positive second data (a value of a signal of a neuron), the amount of charge flowing from the wiring OL to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VEr through the circuit MCr is 0 at this time. In addition, by setting the first data (a weight coefficient) of "−1" in the circuit MP and selecting one or more transistors to be turned on from the transistor M3*r*, the transistor M3-2*br*, and the transistor M3-3*br* included in the circuit MP in accordance with the positive second data (a value of a signal of a neuron), the amount of charge flowing from the wiring OLB to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VE through the circuit MC is 0 at this time.

In addition, by setting the first data (a weight coefficient) of "+1" in the circuit MP and selecting one or more transistors to be turned on from the transistor M4, the transistor M4-2*b*, and the transistor M4-3*b* included in the circuit MP in accordance with the negative second data (a value of a signal of a neuron), the amount of charge flowing from the wiring OLB to the wiring VE through the circuit MC can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OL to the wiring VEr through the circuit MCr is 0 at this time. In addition, by setting the first data (a weight coefficient) of "−1" in the circuit MP and selecting one or more transistors to be turned on from the transistor M4*r*, the transistor M4-2*br*, and the transistor M4-3*br* included in the circuit MP in accordance with the negative second data (a value of a signal of a neuron), the amount of charge flowing from the wiring OL to the wiring VEr through the circuit MCr can be any one of $Q_{ut}$, $2Q_{ut}$, $3Q_{ut}$, $4Q_{ut}$, $5Q_{ut}$, $6Q_{ut}$, and $7Q_{ut}$. Note that the amount of charge flowing from the wiring OLB to the wiring VE through the circuit MC is 0 at this time.

In the case where the first data (a weight coefficient) of "0" is set in the circuit MP in advance, the transistor M1, the transistor M1*r*, the transistor M1-2*b*, the transistor M1-2*br*, the transistor M1-3*b*, and the transistor M1-3*br* are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where the second data (a value of a signal of a neuron) of "0" is input to the circuit MP, the transistor M3, the transistor M3-2*b*, the transistor M3-3*b*, the transistor M4, the transistor M4-2*b*, the transistor M4-3*b*, the transistor M3*r*, the transistor M3-2*br*, the transistor M3-3*br*, the transistor M4*r*, the transistor M4-2*br*, and the transistor M4-3*br* are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, attention is focused on the integrator circuit of the circuit ACTF. When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is "+1" or "−1" and the second data (a value of a signal of a neuron) is defined as described above.

TABLE 14

| Weight coefficient | Value of signal of neuron | Weight coefficient × Signal | Charge amount $Q_{OL}$ supplied through wiring OL | Charge amount $Q_{OLB}$ supplied through wiring OLB |
|---|---|---|---|---|
| +1 | 0 | 0 | 0 | 0 |
| +1 | +1 | +1 | $Q_{ut}$ | 0 |
| +1 | +2 | +2 | $2Q_{ut}$ | 0 |
| +1 | +3 | +3 | $3Q_{ut}$ | 0 |
| +1 | +4 | +4 | $4Q_{ut}$ | 0 |
| +1 | +5 | +5 | $5Q_{ut}$ | 0 |
| +1 | +6 | +6 | $6Q_{ut}$ | 0 |
| +1 | +7 | +7 | $7Q_{ut}$ | 0 |
| +1 | −1 | −1 | 0 | $Q_{ut}$ |
| +1 | −2 | −2 | 0 | $2Q_{ut}$ |
| +1 | −3 | −3 | 0 | $3Q_{ut}$ |
| +1 | −4 | −4 | 0 | $4Q_{ut}$ |
| +1 | −5 | −5 | 0 | $5Q_{ut}$ |
| +1 | −6 | −6 | 0 | $6Q_{ut}$ |
| +1 | −7 | −7 | 0 | $7Q_{ut}$ |

TABLE 15

| Weight coefficient | Value of signal of neuron | Weight coefficient × Signal | Charge amount $Q_{OL}$ supplied through wiring OL | Charge amount $Q_{OLB}$ supplied through wiring OLB |
|---|---|---|---|---|
| −1 | 0 | 0 | 0 | 0 |
| −1 | +1 | −1 | 0 | $Q_{ut}$ |
| −1 | +2 | −2 | 0 | $2Q_{ut}$ |
| −1 | +3 | −3 | 0 | $3Q_{ut}$ |
| −1 | +4 | −4 | 0 | $4Q_{ut}$ |
| −1 | +5 | −5 | 0 | $5Q_{ut}$ |
| −1 | +6 | −6 | 0 | $6Q_{ut}$ |
| −1 | +7 | −7 | 0 | $7Q_{ut}$ |
| −1 | −1 | +1 | $Q_{ut}$ | 0 |
| −1 | −2 | +2 | $2Q_{ut}$ | 0 |
| −1 | −3 | +3 | $3Q_{ut}$ | 0 |
| −1 | −4 | +4 | $4Q_{ut}$ | 0 |
| −1 | −5 | +5 | $5Q_{ut}$ | 0 |
| −1 | −6 | +6 | $6Q_{ut}$ | 0 |
| −1 | −7 | +7 | $7Q_{ut}$ | 0 |

By setting the first data (a weight coefficient) and the second data (a value of a signal of a neuron) as described above, the charge amount $Q_{OL}$ with which a current flows from the wiring OL to the circuit MC or the circuit MCr and the charge amount $Q_{OLB}$ with which a current flows from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ with which a current flows from the wiring OL to the circuit MC or the circuit MCr in the above table. Alternatively, for example, in the case where the first data (a weight coefficient) is "−1" or "+1", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ with which a current flows from the wiring OLB to the circuit MC or the circuit MCr in the above table.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

When the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$, and the time during which the transistor M3-3*b* and the transistor M3-3*br* are in an on state or the transistor M4-3*b* and the transistor M4-3*br* are in an on state is $4t_{ut}$, for example, the second data (a value of a signal of a neuron) at the time when a high-level potential is input to the wiring X1L, a low-level potential is input to the wiring X2L, and a low-level potential is input to the wiring X1L2*b*, the wiring X2L2*b*, the wiring X1L3*b*, and the wiring X2L3*b* may be defined as not "+1" but a real number such as "+0.1".

In the semiconductor device of one embodiment of the present invention, the configuration of the circuit MP is not limited to that in FIG. 63. For example, in the circuit MP in FIG. 63, the circuit MC includes three transistors of the transistor M1, the transistor M1-2*b*, and the transistor M1-3*b* and the circuit MCr includes three transistors of the transistor M1*r*, the transistor M1-2*br*, and the transistor M1-3*br* as transistors for setting current amounts; however, the circuit MC and the circuit MCr may each include two transistors or four or more transistors for setting current amounts.

The semiconductor device of one embodiment of the present invention and the operation method of the semiconductor device are not limited to the above. Although the sizes of the transistor M1, the transistor M1*r*, the transistor M1-2*b*, the transistor M1-2*br*, the transistor M1-3*b*, and the transistor M1-3*br* of the circuit MP in FIG. 63 are equal to each other in the above description, the ratios of the W lengths to the L lengths of the transistor M1 and the transistor M1*r* may each be W/L and the ratios of the W lengths to the L lengths of the transistor M1-2*b*, the transistor M1-2*br*, the transistor M1-3*b*, and the transistor M1-3*br* may each be 2 W/L, as in the circuit MP in FIG. 52. Given that a current having the current amount of $I_1$ flows between the source and the drain of the transistor M1 in the case where the potential VDDL is held in the circuit HCS, the current amount of $2I_1$ is supplied between the sources and the drains of the transistor M1-2*b* and the transistor M1-3*b* because the ratio of the W length to the L length of the transistor M1-2*b* and the ratio of the W length to the L length of the transistor M1-3*b* are each twice as high as the ratio of the W length to the L length of the transistor M1. Similarly, given that a current having the current amount of $I_1$ flows between the source and the drain of the transistor M1*r* in the case where the potential VDDL is held in the circuit HCSr, the current amount of $2I_1$ is supplied between the sources and the drains of the transistor M1-2*br* and the transistor M1-3*br* because the ratio of the W length to the L length of the transistor M1-2*br* and the ratio of the W length to the L length of the transistor M1-3*br* are each twice as high as the ratio of the W length to the L length of the transistor M1*r*.

Figure 64:
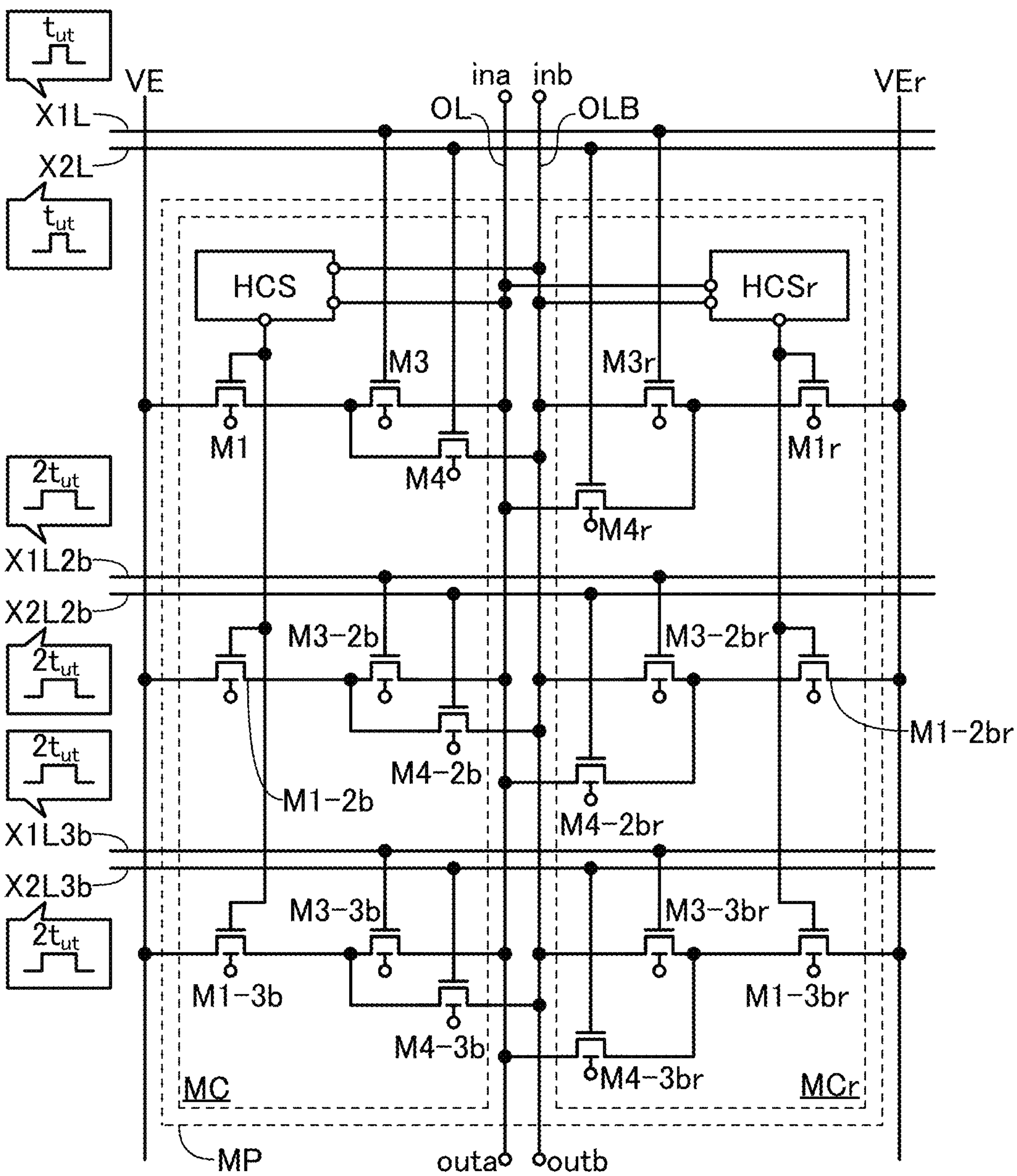
FIG. 64 is a circuit diagram illustrating a configuration example of a circuit included in a semiconductor device.

Here, the time during which the transistor M3 and the transistor M3*r* are in an on state or the transistor M4 and the transistor M4*r* are in an on state is $t_{ut}$, the time during which the transistor M3-2*b* and the transistor M3-2*br* are in an on state or the transistor M4-2*b* and the transistor M4-2*br* are in an on state is $2t_{ut}$, and the time during which the transistor M3-3*b* and the transistor M3-3*br* are in an on state or the transistor M4-3*b* and the transistor M4-3*br* are in an on state is $2t_{ut}$. That is, in inputting the second data (a value of a signal of a neuron) to the circuit MP, the input time of a high-level potential to one of the wiring X1L and the wiring X2L is $t_{ut}$, the input time of a high-level potential to one of the wiring X1L2*b* and the wiring X2L2*b* is $2t_{ut}$, and the input time of a high-level potential to one of the wiring X1L3*b* and the wiring X2L3*b* is $2t_{ut}$. The circuit MP in FIG. 64 shows schematic views of pulse voltages and the input times, which are different from those in FIG. 63, around the reference numerals of the wiring X1L, the wiring X2L, the wiring X1L2*b*, the wiring X2L2*b*, the wiring X1L3*b*, and the wiring X2L3*b*.

When the potential VDDL is held in the circuit HCS and a current having the current amount of $I_{ut}$ flows between the source and the drain of the transistor M1, one of the transistor M3-3*b* and the transistor M4-3*b* is in an on state only for the time $2t_{ut}$ and the other of the transistor M3-3*b* and the transistor M4-3*b* is in an off state, so that the amount of charge flowing from the wiring OL or the wiring OLB to the wiring VE through the transistor M1-3*b* is $2t_{ut}\times 2I_{ut}=4Q_{ut}$. Note that the conditions of the amount of charge flowing from the wiring OL to the wiring VE through the transistor M1 and the amount of charge flowing from the wiring OL to the wiring VE through the transistor M1-2*b* are the same as those of the above-described operation example, and thus the description is omitted.

When the potential VDDL is held in the circuit HCSr and i a current having the current amount of $I_1$ flows between the source and the drain of the transistor M1*r*, one of the transistor M3-3*br* and the transistor M4-3*br* is turned on only for the time $2t_{ut}$ and the other of the transistor M3-3*br* and the transistor M4-3*br* is turned off, so that the amount of charge flowing from the wiring OL or the wiring OLB to the wiring VEr through the transistor M1-3*br* is $2t_{ut}\times 2I_{ut}=4Q_{ut}$. Note that the conditions of the amount of charge flowing from the wiring OLB to the wiring VEr through the transistor M1*r* and the amount of charge flowing from the wiring OLB to the wiring VEr through the transistor M1-2*br* are the same as those of the above-described operation example, and thus the description is omitted.

As described above, the sizes of the transistor M1, the transistor M1*r*, the transistor M1-2*b*, the transistor M1-2*br*, the transistor M1-3*b*, and the transistor M1-3*br* and the input time of a high-level potential to each of the wiring X1L, the wiring X2L, the wiring X1L2*b*, the wiring X2L2*b*, the wiring X1L3*b*, and the wiring X2L3*b* are appropriately changed, whereby the operation can be similar to that of the operation example of the circuit MP shown in FIG. 63.

In the semiconductor device of one embodiment of the present invention, the configuration of the circuit MP is not limited to that in FIG. 63 and FIG. 64. For example, in the circuit MP in FIG. 63, there are three transistors of the transistor M1, the transistor M1-2*b*, and the transistor M1-3*b* through which a current corresponding to a potential held in the circuit HCS flows, and there are three transistors of the transistor M1*r*, the transistor M1-2*br*, and the transistor M1-3*br* through which a current corresponding to a potential held in the circuit HCSr flows; however, the circuit MC and the circuit MCr may each include two transistors or four or more transistors for setting the current amount corresponding to the held potential. In addition, the number of holding portions and the number of wirings may be increased and decreased in accordance with the number of transistors.

The operation method of the semiconductor device of one embodiment of the present invention is not limited to the above. For example, as described in Operation method example 2, the input period of signals that are input to the wiring X1L, the wiring X2L, the wiring X1L2*b*, the wiring X2L2*b*, the wiring X1L3*b*, and the wiring X2L3*b* may be divided into a plurality of subperiods in the circuits MP in FIG. 63 and FIG. 64.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{(k)}$ of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Operation Method Example 9

Figure 65:
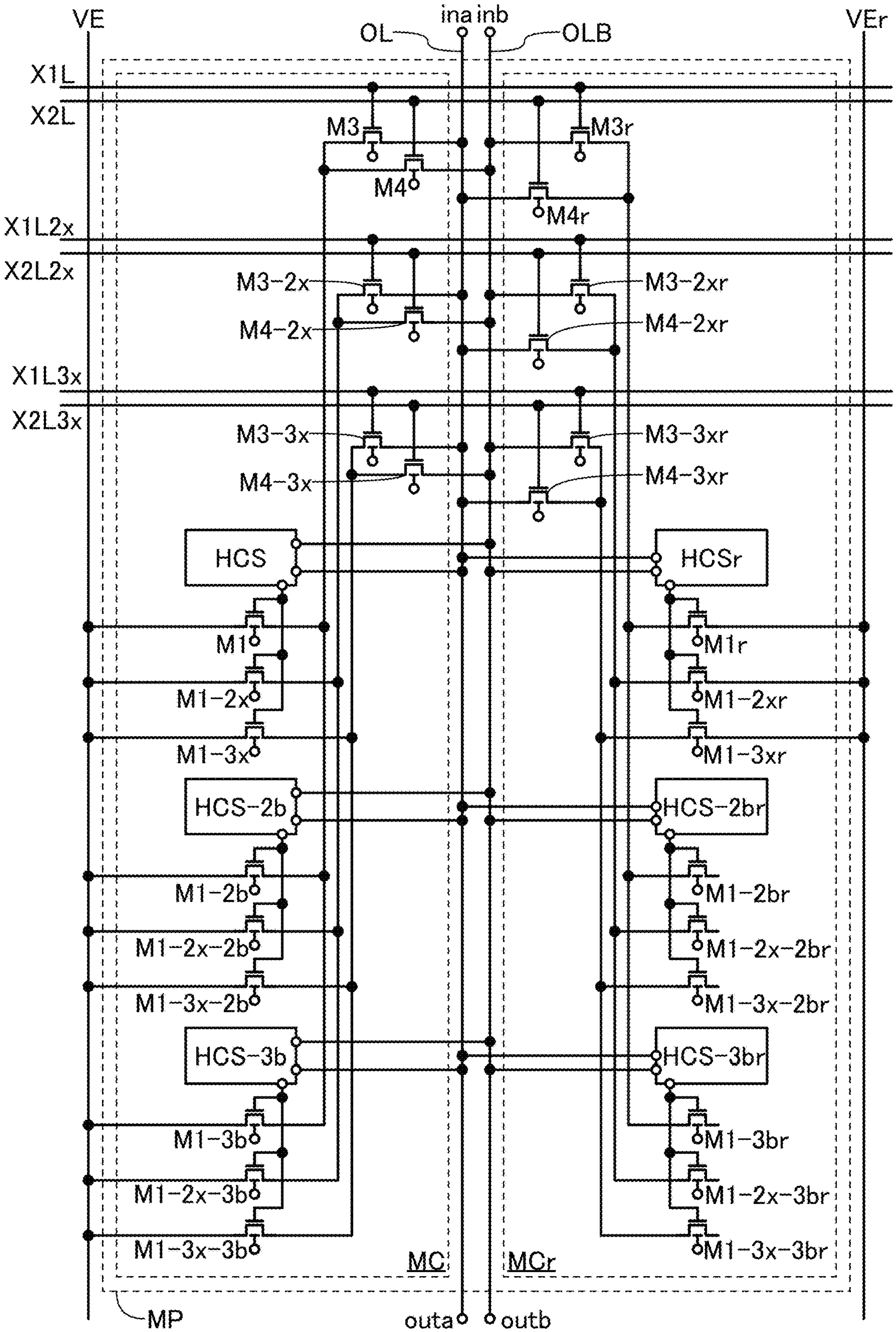
FIG. 65 is a circuit diagram illustrating a configuration example of a circuit included in a semiconductor device.

Described here is an operation method of the arithmetic circuit 150 in FIG. 11 for which the circuit MP in FIG. 65 is used.

As in Operation method example 1 to Operation method example 8, to avoid complexity of description, a current flowing through the wiring OL and the wiring OLB is changed by only one circuit MP electrically connected to the wiring OL and the wiring OLB. The wiring VE and the wiring VEr electrically connected to the circuit MP each supply VSS as a constant voltage to the circuit MP. The circuit ACTF[1] to the circuit ACTF[n] included in the circuit AFP are each the circuit ACTF having a configuration of an integrator circuit (or a current-charge (IQ) converter circuit), for example. The circuit ACTF may have a configuration in which the load LEa and the load LEb in the circuit ACTF[j] in FIG. 6E are each a capacitor or the like, for example. Although the case where three transistors (e.g., three transistors of the transistor M1, a transistor M1-2*x*, and a transistor M1-3*x*) are connected to one holding portion (e.g., the circuit HCS) is described as an example, one embodiment of the present invention is not limited thereto. A given number of transistors may be provided for each holding portion. Similarly, although three transistors (the transistor M3, the transistor M3-2*x*, and a transistor M3-3*x* and the transistor M4, the transistor M4-2*x*, and a transistor M4-3*x*) are shown as transistors that are included in the circuit MC and electrically connected to the wiring OL (the wiring OLB), one embodiment of the present invention is not limited thereto, and a given number of transistors may be provided. In addition, although the case of three holding portions (e.g., the circuit HCS, the circuit HCS-2*b*, and the circuit HCS-3*b*) is described, one embodiment of the present invention is not limited thereto. A given number of holding portions may be provided.

In the circuit MP in FIG. 65, the circuit MC includes the transistor M1, the transistor M1-2*x*, the transistor M1-3*x*, the transistor M1-2*b*, a transistor M1-2*x*-2*b*, a transistor M1-3*x*-2*b*, the transistor M1-3*b*, a transistor M1-2*x*-3*b*, a transistor M1-3*x*-2*b*, the transistor M3, the transistor M3-2*x*, the transistor M3-3*x*, the transistor M4, the transistor M4-2*x*, the transistor M4-3*x*, the circuit HCS, the circuit HCS-2*b*, and the circuit HCS-3*b*.

Note that the sizes, e.g., the W lengths and the L lengths, of the transistor M1, the transistor M1-2*x*, and the transistor M1-3*x* are preferably equal to each other. The sizes of the transistor M1-2*b*, the transistor M1-2*x*-2*b*, and the transistor M1-3*x*-2*b* are preferably equal to each other. The sizes of the transistor M1-3*b*, the transistor M1-2*x*-3*b*, and the transistor M1-3*x*-3*b* are preferably equal to each other.

Furthermore, when the ratios of the W lengths to the L lengths of the transistor M1, the transistor M1-2*x*, and the transistor M1-3*x* are each W/L, the ratios of the W lengths to the L lengths of the transistor M1-2*b*, the transistor M1-2*x*-2*b*, and the transistor M1-3*x*-2*b* are each preferably 2 W/L and the ratios of the W lengths to the L lengths of the transistor M1-3*b*, the transistor M1-2*x*-3*b*, and the transistor M1-3*x*-3*b* are each preferably 4 W/L. That is, the ratios W/L of the W lengths to the L lengths of the transistors (e.g., the transistor M1, the transistor M1-2*b*, and the transistor M1-3*b*) whose gates are electrically connected to the holding portions (e.g., the circuit HCS, the circuit HCS-2*b*, and the circuit HCS-3*b*) can be increased to be a power of two in accordance with the number of holding portions.

In this specification and the like, unless otherwise specified, the transistor M1, the transistor M1-2*x*, the transistor M1-3*x*, the transistor M1-2*b*, the transistor M1-2*x*-2*b*, the transistor M1-3*x*-2*b*, the transistor M1-3*b*, the transistor M1-2*x*-3*b*, and the transistor M1-3*x*-3*b* in an on state may operate in a saturation region in the end. In other words, the gate voltage, the source voltage, and the drain voltage of each of the above transistors may be appropriately biased to voltages in the range where the transistor operates in a saturation region. However, one embodiment of the present invention is not limited thereto. These transistors may operate in a linear region so that the amplitude value of a voltage to be supplied is decreased. To reduce the amount of current flowing through these transistors, the above transistors may operate in a subthreshold region. Alternatively, the transistor M1, the transistor M1-2*x*, the transistor M1-3*x*, the transistor M1-2*b*, the transistor M1-2*x*-2*b*, the transistor M1-3*x*-2*b*, the transistor M1-3*b*, the transistor M1-2*x*-3*b*, and the transistor M1-3*x*-3*b* may operate around the boundary between the saturation region and the subthreshold region. Note that in the case where the first data (a weight coefficient) is an analog value, for example, the above transistors may operate in the linear region, the saturation region, and the subthreshold region depending on the cases in accordance with the magnitude of the first data (weight coefficient). Alternatively, the transistor M1, the transistor M1-2*x*, the transistor M1-3*x*, the transistor M1-2*b*, the transistor M1-2*x*-2*b*, the transistor M1-3*x*-2*b*, the transistor M1-3*b*, the transistor M1-2*x*-3*b*, and the transistor M1-3*x*-3*b* may operate in both the linear region and the saturation region, may operate in both the subthreshold region and the linear region, or may operate in both the saturation region and the subthreshold region.

In this specification and the like, unless otherwise specified, the transistor M3, the transistor M3-2*x*, the transistor M3-3*x*, the transistor M4, the transistor M4-2*x*, and the transistor M4-3*x* in an on state may operate in a linear region in the end. In other words, the gate voltage, the source voltage, and the drain voltage of each of the above transistors may be appropriately biased to voltages in the range where the transistor operates in the linear region. However, one embodiment of the present invention is not limited thereto. For example, the transistor M3, the transistor M3-2*x*, the transistor M3-3*x*, the transistor M4, the transistor M4-2*x*, and the transistor M4-3*x* in an on state may operate in a saturation region or may operate in a subthreshold region. Alternatively, they may operate around the boundary between the saturation region and the subthreshold region. Alternatively, the transistor M3, the transistor M3-2*x*, the transistor M3-3*x*, the transistor M4, the transistor M4-2*x*, and the transistor M4-3*x* may operate in both the linear region and the saturation region, may operate in both the saturation region and the subthreshold region, may operate in both the subthreshold region and the linear region, or may operate in the linear region, the saturation region, and the subthreshold region.

Like the circuit HCS included in the circuit MP in FIG. 29, the circuit HCS, the circuit HCS-2*b*, and the circuit HCS-3*b* each have a function of receiving information (a potential, a current, or the like) input from one or both of the wiring OL and the wiring OLB and holding a potential corresponding to the information. In addition, the circuit HCS has a function of applying the held potential to the gate of the transistor electrically connected to the circuit HCS. The circuit HCS, the circuit HCS-2*b*, and the circuit HCS-3*b* can each have a configuration including an SRAM or a configuration including a NOSRAM, for example. The circuit HCS, the circuit HCS-2*b*, and the circuit HCS-3*b* included in the circuit MP in FIG. 65 each hold one of a high-level potential (e.g., VDDL here) and a low-level potential (e.g., VSS here) as a digital value (a binary value).

Note that the gates of the transistor M1-2*b*, the transistor M1-2*x*-2*b*, and the transistor M1-3*x*-2*b* are electrically connected to the circuit HCS-2*b*. The gates of the transistor M1-3*b*, the transistor M1-2*x*-3*b*, and the transistor M1-3*x*-2*b* are electrically connected to the circuit HCS-3*b*.

When VDDL held in the circuit HCS is input to the gates of the transistor M1, the transistor M1-2*x*, and the transistor M1-3*x*, the amount of current flowing between the sources and the drains of the transistor M1, the transistor M1-2*x*, and the transistor M1-3*x* is $I_{ut}$. Since the ratios of the W lengths to the L lengths of the transistor M1-2*b*, the transistor M1-2*x*-2*b*, and the transistor M1-3*x*-2*b* are each twice as high as the ratio of the W length to the L length of the transistor M1, the amount of current flowing between the sources and the drains of the transistor M1-2*b*, the transistor M1-2*x*-2*b*, and the transistor M1-3*x*-2*b* is $2I_{ut}$ when VDDL held in the circuit HCS-2*b* is input to the gates of the transistor M1-2*b*, the transistor M1-2*x*-2*b*, and the transistor M1-3*x*-2*b*. Since the ratios of the W lengths to the L lengths of the transistor M1-3*b*, the transistor M1-2*x*-3*b*, and the transistor M1-3*x*-3*b* are each four times as high as the ratio of the W length to the L length of the transistor M1, the amount of current flowing between the sources and the drains of the transistor M1-3*b*, the transistor M1-2*x*-3*b*, and the transistor M1-3*x*-3*b* is $4I_{ut}$ when VDDL held in the circuit HCS-3*b* is input to the gates of the transistor M1-3*b*, the transistor M1-2*x*-3*b*, and the transistor M1-3*x*-3*b*.

The first terminals of the transistor M1, the transistor M1-2*x*, the transistor M1-3*x*, the transistor M1-2*b*, the transistor M1-2*x*-2*b*, the transistor M1-3*x*-2*b*, the transistor M1-3*b*, the transistor M1-2*x*-3*b*, and the transistor M1-3*x*-2*b* are electrically connected to the wiring VE. The gates of the transistor M1, the transistor M1-2*x*, and the transistor M1-3*x* are electrically connected to the circuit HCS.

The second terminals of the transistor M1, the transistor M1-2*b*, and the transistor M1-3*b* are electrically connected to the first terminal of the transistor M3 and the first terminal of the transistor M4. The second terminals of the transistor M1-2*x*, the transistor M1-2*x*-2*b*, and the transistor M1-2*x*-3*b* are electrically connected to the first terminal of the transistor M3-2*x* and the first terminal of the transistor M4-2*x*. The second terminals of the transistor M1-3*x*, the transistor M1-3*x*-2*b*, and the transistor M1-3*x*-3*b* are electrically connected to a first terminal of the transistor M3-3*x* and a first terminal of the transistor M4-3*x*.

The gate of the transistor M3 is electrically connected to the wiring X1L, and the gate of the transistor M4 is electrically connected to the wiring X2L. The gate of the transistor M3-2*x* is electrically connected to the wiring X1L2*x*, and the gate of the transistor M4-2*x* is electrically connected to the wiring X2L2*x*. The gate of the transistor M3-3*x* is electrically connected to the wiring X1L3*x*, and the gate of the transistor M4-3*x* is electrically connected to the wiring X2L3*x*.

The second terminals of the transistor M3, the transistor M3-2*x*, and the transistor M3-3*x* are electrically connected to the wiring OL, and the second terminals of the transistor M4, the transistor M4-2*x*, and the transistor M4-3*x* are electrically connected to the wiring OLB.

Note that in the circuit MP in FIG. 65, the circuit MCr has substantially the same circuit configuration as the circuit MC. Thus, "r" is added to the reference numerals of the circuit elements and the like included in the circuit MCr to differentiate them from the circuit elements and the like included in the circuit MC. In addition, the second terminals of the transistor M3*r*, the transistor M3-2*xr*, and the transistor M3-3*xr* are electrically connected to the wiring OLB, and the second terminals of the transistor M4, the transistor M4-2*x*, and the transistor M4-3*x* are electrically connected to the wiring OL.

The first data (e.g., a weight coefficient here) set in the circuit MP in FIG. 65 is described. The first data (a weight coefficient) set in the circuit MP in FIG. 65 can be defined by a combination of potentials held in the circuit HCS, the circuit HCS-2*b*, the circuit HCS-3*b*, the circuit HCSr, the circuit HCS-2*br*, and the circuit HCS-3*br*. Specifically, as in the circuit MP in FIG. 62 described in Operation method example 7, the first data (a weight coefficient) can be set by holding a predetermined potential in each of the circuit HCS, the circuit HCS-2*b*, the circuit HCS-3*b*, the circuit HCSr, the circuit HCS-2*br*, and the circuit HCS-3*br*. Accordingly, the first data (a weight coefficient) in the circuit MP in FIG. 65 can be defined, for example, in a manner similar to that of the first data (a weight coefficient) in the circuit MP in FIG. 62 described in Operation method example 7.

Next, the second data (e.g., a value of a signal of a neuron here) input to the circuit MP is described. Assume that, in inputting the second data (a value of a signal of a neuron) to the circuit MP, the input time of a high-level potential to one of the wiring X1L and the wiring X2L is $t_{ut}$, the input time of a high-level potential to one of the wiring X1L2*x* and the wiring X2L2*x* is $2t_{ut}$, and the input time of a high-level potential to one of the wiring X1L3*x* and the wiring X2L3*x* is $4t_{ut}$ in the operation. That is, the operation is performed such that when the time during which the transistor M3 and the transistor M3*r* are in an on state or the transistor M4 and the transistor M4*r* are in an on state is $t_{ut}$, the time during which the transistor M3-2*x* and the transistor M3-2*xr* are in an on state or the transistor M4-2*x* and the transistor M4-2*xr* are in an on state is $2t_{ut}$ and the time during which the transistor M3-3*x* and the transistor M3-3*xr* are in an on state or the transistor M4-3*x* and the transistor M4-3*xr* are in an on state is $4t_{ut}$.

As described in Operation method example 1 and Operation method example 2, the amount of charge flowing from the wiring OL or the wiring OLB to the wiring VE through the transistor M1, the transistor M1-2*b*, and the transistor M1-3*b* is determined by setting the first data (e.g., a weight coefficient here) in the circuit MP and setting the time during which the transistor M3 or the transistor M4 is in an on state. In addition, the amount of charge flowing from the wiring OL or the wiring OLB to the wiring VEr through the transistor M1*r*, the transistor M1-2*br*, and the transistor M1-3*br* is determined by setting the first data (a weight coefficient) in the circuit MP and setting the time during which the transistor M3*r* or the transistor M4*r* is in an on state.

Similarly, the amount of charge flowing from the wiring OL or the wiring OLB to the wiring VE through the transistor M1-2*x*, the transistor M1-2*x*-2*b*, and the transistor M1-2*x*-3*b* and the amount of charge flowing from the wiring OL or the wiring OLB to the wiring VEr through the transistor M1-2*xr*, the transistor M1-2*x*-2*br*, and the transistor M1-2*x*-3*br* are also determined by setting the times during which the transistor M3-2$x$, the transistor M3-2$xr$, the transistor M4-2$x$, and the transistor M4-2$xr$ are in an on state. In addition, the amount of charge flowing from the wiring OL or the wiring OLB to the wiring VE through the transistor M1-3$x$, the transistor M1-3$x$-2$b$, and the transistor M1-3$x$-3$b$ and the amount of charge flowing from the wiring OL or the wiring OLB to the wiring VEr through the transistor M1-3$xr$, the transistor M1-3$x$-2$br$, and the transistor M1-3$x$-3$br$ are also determined by setting the times during which the transistor M3-3$x$, the transistor M3-3$xr$, the transistor M4-3$x$, and the transistor M4-3$xr$ are in an on state.

Thus, the second data (a value of a signal of a neuron) in the circuit MP in FIG. 65 can be defined in a manner similar to that of the second data (a value of a signal of a neuron) in the circuit MP in FIG. 51 described in Operation method example 3.

When the first data (a weight coefficient) and the second data (a value of a signal of a neuron) are determined as described above, the product of the first data (a weight coefficient) and the second data (a value of a signal of a neuron) can be expressed by the charge amount with which a current flowing from the wiring OL to the circuit MC or the circuit MCr and the charge amount with which a current flowing from the wiring OLB to the circuit MC or the circuit MCr.

Next, a specific operation example of the circuit MP in FIG. 65 is described.

The first data (a weight coefficient) of "+7" is set in the circuit MP in advance, for example. At this time, the current of ut flows between the sources and the drains of the transistor M1, the transistor M1-2$x$, and the transistor M1-3$x$, the current of $2I_{ut}$ flows between the sources and the drains of the transistor M1-2$b$, the transistor M1-2$x$-2$b$, and the transistor M1-3$x$-2$b$, and the current of $4I_{ut}$ flows between the sources and the drains of the transistor M1-3$b$, the transistor M1-2$x$-3$b$, and the transistor M1-3$x$-3$b$. Meanwhile, the amount of current flowing between the sources and the drains of the transistor M1$r$, the transistor M1-2$xr$, the transistor M1-3$xr$, the transistor M1-2$br$, the transistor M1-2$x$-2$br$, the transistor M1-3$x$-2$br$, the transistor M1-3$br$, the transistor M1-2$x$-3$br$, and the transistor M1-3$x$-3$br$ is 0.

In the case where "+7" is input to the circuit MP as the second data (a value of a signal of a neuron), the transistor M3 is in an on state only for the time $t_{ut}$ and the transistor M4 is in an off state, so that the amount of charge flowing from the wiring OL to the wiring VE through the transistor M1, the transistor M1-2$b$, and the transistor M1-3$b$ is $t_{ut}\times I_{ut}+t_{ut}\times 2I_{ut}+t_{ut}\times 4I_{ut}=7t_{ut}\times I_{ut}$. Note that $t_{ut}\times I_{ut}=Q_{ut}$ is satisfied here. In addition, the transistor M3-2$x$ is in an on state only for the time $2t_{ut}$ and the transistor M4-2$x$ is in an off state, so that the amount of charge flowing from the wiring OL to the wiring VE through the transistor M1-2$x$, the transistor M1-2$x$-2$b$, and the transistor M1-2$x$-3$b$ is $2t_{ut}\times I_{ut}+2t_{ut}\times 2I_{ut}+2t_{ut}\times 4I_{ut}=14t_{ut}\times I_{ut}$. In addition, the transistor M3-3$x$ is in an on state only for the time $4t_{ut}$ and the transistor M4-3$x$ is in an off state, so that the amount of charge flowing from the wiring OL to the wiring VE through the transistor M1-3$x$, the transistor M1-3$x$-2$b$, and the transistor M1-3$x$-3$b$ is $4t_{ut}\times I_{ut}+4t_{ut}\times 2I_{ut}+4t_{ut}\times 4I_{ut}=28t_{ut}\times I_{ut}$. Thus, the amount of charge flowing from the wiring OL to the wiring VE through the circuit MC is $7Q_{ut}+14Q_{ut}+28Q_{ut}=49Q_{ut}$. Meanwhile, the amount of charge flowing from the wiring OLB to the wiring VEr through the circuit MCr is 0 because the transistor M1$r$, the transistor M1-2$xr$, the transistor M1-3$xr$, the transistor M1-2$br$, the transistor M1-2$x$-2$br$, the transistor M1-3$x$-2$br$, the transistor M1-3$br$, the transistor M1-2$x$-3$br$, and the transistor M1-3$x$-3$br$ are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OLB to the wiring VE through the circuit MC is $7Q_{ut}+14Q_{ut}+28Q_{ut}=49Q_{ut}$ and the amount of charge flowing from the wiring OL to the wiring VEr through the circuit MCr is 0.

Here, the first data (a weight coefficient) of "−7" is set in the circuit MP in advance, for example. At this time, the current of ut flows between the sources and the drains of the transistor M1$r$, the transistor M1-2$xr$, and the transistor M1-3$xr$; the current of $2I_{ut}$ flows between the sources and the drains of the transistor M1-2$br$, the transistor M1-2$x$-2$br$, and the transistor M1-3$x$-2$br$; and the current of $4I_{ut}$ flows between the sources and the drains of the transistor M1-3$br$, the transistor M1-2$x$-3$br$, and the transistor M1-3$x$-3$br$. Meanwhile, the amount of current flowing between the sources and the drains of the transistor M1, the transistor M1-2$x$, the transistor M1-3$x$, the transistor M1-2$b$, the transistor M1-2$x$-2$b$, the transistor M1-3$x$-2$b$, the transistor M1-3$b$, the transistor M1-2$x$-3$b$, and the transistor M1-3$x$-3$b$ is 0.

In the case where "+7" is input to the circuit MP as the second data (a value of a signal of a neuron), the transistor M3$r$ is in an on state only for the time $t_{ut}$ and the transistor M4$r$ is in an off state, so that the amount of charge flowing from the wiring OLB to the wiring VEr through the transistor M1$r$, the transistor M1-2$br$, and the transistor M1-3$br$ is $t_{ut}\times I_{ut}+t_{ut}\times 2I_{ut}+t_{ut}\times 4I_{ut}=7t_{ut}\times I_{ut}$. Note that $t_{ut}\times I_{ut}=Q_{ut}$ is satisfied here. In addition, the transistor M3-2$xr$ is in an on state only for the time $2t_{ut}$ and the transistor M4-2$xr$ is in an off state, so that the amount of charge flowing from the wiring OL to the wiring VEr through the transistor M1-2$xr$, the transistor M1-2$x$-2$br$, and the transistor M1-2$x$-3$br$ is $2t_{ut}\times I_{ut}+2t_{ut}\times 2I_{ut}+2t_{ut}\times 4I_{ut}=14t_{ut}\times I_{ut}$. In addition, the transistor M3-3$xr$ is in an on state only for the time $4t_{ut}$ and the transistor M4-3$xr$ is in an off state, so that the amount of charge flowing from the wiring OLB to the wiring VEr through the transistor M1-3$xr$, the transistor M1-3$x$-2$br$, and the transistor M1-3$x$-3$br$ is $4t_{ut}\times I_{ut}+4t_{ut}\times 2I_{ut}+4t_{ut}\times 4I_{ut}=28t_{ut}\times I_{ut}$. Thus, the amount of charge flowing from the wiring OLB to the wiring VEr through the circuit MCr is $7Q_{ut}+14Q_{ut}+28Q_{ut}=49Q_{ut}$. Meanwhile, the amount of charge flowing from the wiring OL to the wiring VE through the circuit MC is 0 because the transistor M1, the transistor M1-2$x$, the transistor M1-3$x$, the transistor M1-2$b$, the transistor M1-2$x$-2$b$, the transistor M1-3$x$-2$b$, the transistor M1-3$b$, the transistor M1-2$x$-3$b$, and the transistor M1-3$x$-3$b$ are in an off state.

In the case where "−7" is input to the circuit MP as the second data (a value of a signal of a neuron), electrical continuity is established between the wiring OLB and the circuit MC and between the wiring OL and the circuit MCr, and electrical continuity is not established between the wiring OLB and the circuit MCr and between the wiring OL and the circuit MC; hence, the amount of charge flowing from the wiring OLB to the wiring VE through the circuit MC is $7Q_{ut}+14Q_{ut}+28Q_{ut}=49Q_{ut}$ and the amount of charge flowing from the wiring OL to the wiring VEr through the circuit MCr is 0.

Thus, by setting the positive first data (a weight coefficient) of any one of seven levels "+1" to "+7" in the circuit MP and selecting one or more transistors to be turned on from the transistor M3, the transistor M3-2*x*, and the transistor M3-3*x* included in the circuit MP in accordance with the positive second data (a value of a signal of a neuron), the amount of charge flowing from the wiring OL to the wiring VE through the circuit MC can be any one of "$Q_{ut}$" to "$49Q_{ut}$" in steps of $Q_{ut}$. Note that the amount of charge flowing from the wiring OLB to the wiring VEr through the circuit MCr is 0 at this time. In addition, by setting the negative first data (a weight coefficient) of any one of seven levels "−7" to "−1" in the circuit MP and selecting one or more transistors to be turned on from the transistor M3*r*, the transistor M3-2*xr*, and the transistor M3-3*xr* included in the circuit MP in accordance with the positive second data (a value of a signal of a neuron), the amount of charge flowing from the wiring OLB to the wiring VEr through the circuit MCr can be any one of "$Q_{ut}$" to "$49Q_{ut}$" in steps of $Q_{ut}$. Note that the amount of charge flowing from the wiring OL to the wiring VE through the circuit MC is 0 at this time.

In addition, by setting the positive first data (a weight coefficient) of any one of seven levels "+1" to "+7" in the circuit MP and selecting one or more transistors to be turned on from the transistor M4, the transistor M4-2*x*, and the transistor M4-3*x* included in the circuit MP in accordance with the negative second data (a value of a signal of a neuron), the amount of charge flowing from the wiring OLB to the wiring VE through the circuit MC can be any one of "$Q_{ut}$" to "$49Q_{ut}$" in steps of $Q_{ut}$. Note that the amount of charge flowing from the wiring OL to the wiring VEr through the circuit MCr is 0 at this time. In addition, by setting the negative first data (a weight coefficient) of any one of seven levels "−7" to "−1" in the circuit MP and selecting one or more transistors to be turned on from the transistor M4*r*, the transistor M4-2*xr*, and the transistor M4-3*xr* included in the circuit MP in accordance with the negative second data (a value of a signal of a neuron), the amount of charge flowing from the wiring OL to the wiring VEr through the circuit MCr can be any one of "$Q_{ut}$" to "$49Q_{ut}$" in steps of $Q_{ut}$. Note that the amount of charge flowing from the wiring OLB to the wiring VE through the circuit MC is 0 at this time.

In the case where the first data (a weight coefficient) of "0" is set in the circuit MP in advance, the transistor M1, the transistor M1-2*x*, the transistor M1-3*x*, the transistor M1-2*b*, the transistor M1-2*x*-2*b*, the transistor M1-3*x*-2*b*, the transistor M1-3*b*, the transistor M1-2*x*-3*b*, the transistor M1-3*x*-3*b*, the transistor M1*r*, the transistor M1-2*xr*, the transistor M1-3*xr*, the transistor M1-2*br*, the transistor M1-2*x*-2*br*, the transistor M1-3*x*-2*br*, the transistor M1-3*br*, the transistor M1-2*x*-3*br*, and the transistor M1-3*x*-3*br* are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

In the case where the second data (a value of a signal of a neuron) of "0" is input to the circuit MP, the transistor M3, the transistor M3-2*x*, the transistor M3-3*x*, the transistor M4, the transistor M4-2*x*, the transistor M4-3*x*, the transistor M3*r*, the transistor M3-2*xr*, the transistor M3-3*xr*, the transistor M4*r*, the transistor M4-2*xr*, and the transistor M4-3*xr* are in an off state. Thus, a current does not flow from the wiring OL or the wiring OLB to the wiring VE through the circuit MC, and a current does not flow from the wiring OL or the wiring OLB to the wiring VEr through the circuit MCr. In other words, the amount of charge flowing through the wiring OL and the wiring OLB is 0.

Here, attention is focused on the integrator circuit of the circuit ACTF. When a current flows from the wiring OL or the wiring OLB to the wiring VE through the circuit MC or when a current flows from the wiring OL or the wiring OLB to the wiring VEr through the circuit MCr, the switch SWO and the switch SWOB are turned on and the switch SWI, the switch SWIB, the switch SWL, the switch SWLB, the switch SWH, and the switch SWHB are turned off in FIG. 8A so that electrical continuity is established between the circuit AFP and each of the wiring OL and the wiring OLB, whereby the amount of charge flowing through the wiring OL and the wiring OLB can be accumulated in the capacitor of the integrator circuit included in the circuit ACTF. As a result, the circuit ACTF can output the signal $z_j^{(k)}$ of a neuron, which corresponds to the charge amount $Q_{OL}$ supplied through the wiring OL and the charge amount $Q_{OLB}$ supplied through the wiring OLB.

The following table shows the charge amount $Q_{OL}$ supplied through the wiring OL and the charge amount $Q_{OLB}$ supplied through the wiring OLB in the case of the above operation example where the first data (a weight coefficient) is any one of "−7" to "+7" except for "0" and the second data (a value of a signal of a neuron) is any one of "−7" to "+7" except for "0". When at least one of the first data (a weight coefficient) and the second data (a value of a signal of a neuron) is "0", $Q_{OL}$=0 and $Q_{OLB}$=0 are satisfied.

TABLE 16

| | | Value of signal of neuron | | | | | | |
|---|---|---|---|---|---|---|---|---|
| | | +1 | +2 | +3 | +4 | +5 | +6 | +7 |
| Weight coefficient | +1 | $Q_{OL} = Q_{ut}$, $Q_{OLB} = 0$ | $Q_{OL} = 2Q_{ut}$, $Q_{OLB} = 0$ | $Q_{OL} = 3Q_{ut}$, $Q_{OLB} = 0$ | $Q_{OL} = 4Q_{ut}$, $Q_{OLB} = 0$ | $Q_{OL} = 5Q_{ut}$, $Q_{OLB} = 0$ | $Q_{OL} = 6Q_{ut}$, $Q_{OLB} = 0$ | $Q_{OL} = 7Q_{ut}$, $Q_{OLB} = 0$ |
| | +2 | $Q_{OL} = 2Q_{ut}$, $Q_{OLB} = 0$ | $Q_{OL} = 4Q_{ut}$, $Q_{OLB} = 0$ | $Q_{OL} = 6Q_{ut}$, $Q_{OLB} = 0$ | $Q_{OL} = 8Q_{ut}$, $Q_{OLB} = 0$ | $Q_{OL} = 10Q_{ut}$, $Q_{OLB} = 0$ | $Q_{OL} = 12Q_{ut}$, $Q_{OLB} = 0$ | $Q_{OL} = 14Q_{ut}$, $Q_{OLB} = 0$ |
| | +3 | $Q_{OL} = 3Q_{ut}$, $Q_{OLB} = 0$ | $Q_{OL} = 6Q_{ut}$, $Q_{OLB} = 0$ | $Q_{OL} = 9Q_{ut}$, $Q_{OLB} = 0$ | $Q_{OL} = 12Q_{ut}$, $Q_{OLB} = 0$ | $Q_{OL} = 15Q_{ut}$, $Q_{OLB} = 0$ | $Q_{OL} = 18Q_{ut}$, $Q_{OLB} = 0$ | $Q_{OL} = 21Q_{ut}$, $Q_{OLB} = 0$ |
| | +4 | $Q_{OL} = 4Q_{ut}$, $Q_{OLB} = 0$ | $Q_{OL} = 8Q_{ut}$, $Q_{OLB} = 0$ | $Q_{OL} = 12Q_{ut}$, $Q_{OLB} = 0$ | $Q_{OL} = 16Q_{ut}$, $Q_{OLB} = 0$ | $Q_{OL} = 20Q_{ut}$, $Q_{OLB} = 0$ | $Q_{OL} = 24Q_{ut}$, $Q_{OLB} = 0$ | $Q_{OL} = 28Q_{ut}$, $Q_{OLB} = 0$ |
| | +5 | $Q_{OL} = 5Q_{ut}$, $Q_{OLB} = 0$ | $Q_{OL} = 10Q_{ut}$, $Q_{OLB} = 0$ | $Q_{OL} = 15Q_{ut}$, $Q_{OLB} = 0$ | $Q_{OL} = 20Q_{ut}$, $Q_{OLB} = 0$ | $Q_{OL} = 25Q_{ut}$, $Q_{OLB} = 0$ | $Q_{OL} = 30Q_{ut}$, $Q_{OLB} = 0$ | $Q_{OL} = 35Q_{ut}$, $Q_{OLB} = 0$ |
| | +6 | $Q_{OL} = 6Q_{ut}$, $Q_{OLB} = 0$ | $Q_{OL} = 12Q_{ut}$, $Q_{OLB} = 0$ | $Q_{OL} = 18Q_{ut}$, $Q_{OLB} = 0$ | $Q_{OL} = 24Q_{ut}$, $Q_{OLB} = 0$ | $Q_{OL} = 30Q_{ut}$, $Q_{OLB} = 0$ | $Q_{OL} = 36Q_{ut}$, $Q_{OLB} = 0$ | $Q_{OL} = 42Q_{ut}$, $Q_{OLB} = 0$ |
| | +7 | $Q_{OL} = 7Q_{ut}$, $Q_{OLB} = 0$ | $Q_{OL} = 14Q_{ut}$, $Q_{OLB} = 0$ | $Q_{OL} = 21Q_{ut}$, $Q_{OLB} = 0$ | $Q_{OL} = 28Q_{ut}$, $Q_{OLB} = 0$ | $Q_{OL} = 35Q_{ut}$, $Q_{OLB} = 0$ | $Q_{OL} = 42Q_{ut}$, $Q_{OLB} = 0$ | $Q_{OL} = 49Q_{ut}$, $Q_{OLB} = 0$ |

TABLE 17

| | | Value of signal of neuron | | | | | | |
|---|---|---|---|---|---|---|---|---|
| | | −7 | −6 | −5 | −4 | −3 | −2 | −1 |
| Weight coefficient | +1 | $Q_{OL} = 0$, $Q_{OLB} = 7Q_{ut}$ | $Q_{OL} = 0$, $Q_{OLB} = 6Q_{ut}$ | $Q_{OL} = 0$, $Q_{OLB} = 5Q_{ut}$ | $Q_{OL} = 0$, $Q_{OLB} = 4Q_{ut}$ | $Q_{OL} = 0$, $Q_{OLB} = 3Q_{ut}$ | $Q_{OL} = 0$, $Q_{OLB} = 2Q_{ut}$ | $Q_{OL} = 0$, $Q_{OLB} = Q_{ut}$ |
| | +2 | $Q_{OL} = 0$, $Q_{OLB} = 14Q_{u}$ | $Q_{OL} = 0$, $Q_{OLB} = 12Q_{u}$ | $Q_{OL} = 0$, $Q_{OLB} = 10Q_{u}$ | $Q_{OL} = 0$, $Q_{OLB} = 8Q_{ut}$ | $Q_{OL} = 0$, $Q_{OLB} = 6Q_{ut}$ | $Q_{OL} = 0$, $Q_{OLB} = 4Q_{ut}$ | $Q_{OL} = 0$, $Q_{OLB} = 2Q_{ut}$ |
| | +3 | $Q_{OL} = 0$, $Q_{OLB} = 21Q_{u}$ | $Q_{OL} = 0$, $Q_{OLB} = 18Q_{u}$ | $Q_{OL} = 0$, $Q_{OLB} = 15Q_{u}$ | $Q_{OL} = 0$, $Q_{OLB} = 12Q_{u}$ | $Q_{OL} = 0$, $Q_{OLB} = 9Q_{ut}$ | $Q_{OL} = 0$, $Q_{OLB} = 6Q_{ut}$ | $Q_{OL} = 0$, $Q_{OLB} = 3Q_{ut}$ |
| | +4 | $Q_{OL} = 0$, $Q_{OLB} = 28Q_{u}$ | $Q_{OL} = 0$, $Q_{OLB} = 24Q_{u}$ | $Q_{OL} = 0$, $Q_{OLB} = 20Q_{u}$ | $Q_{OL} = 0$, $Q_{OLB} = 16Q_{u}$ | $Q_{OL} = 0$, $Q_{OLB} = 12Q_{u}$ | $Q_{OL} = 0$, $Q_{OLB} = 8Q_{ut}$ | $Q_{OL} = 0$, $Q_{OLB} = 4Q_{ut}$ |
| | +5 | $Q_{OL} = 0$, $Q_{OLB} = 35Q_{u}$ | $Q_{OL} = 0$, $Q_{OLB} = 30Q_{u}$ | $Q_{OL} = 0$, $Q_{OLB} = 25Q_{u}$ | $Q_{OL} = 0$, $Q_{OLB} = 20Q_{u}$ | $Q_{OL} = 0$, $Q_{OLB} = 15Q_{u}$ | $Q_{OL} = 0$, $Q_{OLB} = 10Q_{u}$ | $Q_{OL} = 0$, $Q_{OLB} = 5Q_{ut}$ |
| | +6 | $Q_{OL} = 0$, $Q_{OLB} = 42Q_{u}$ | $Q_{OL} = 0$, $Q_{OLB} = 36Q_{u}$ | $Q_{OL} = 0$, $Q_{OLB} = 30Q_{u}$ | $Q_{OL} = 0$, $Q_{OLB} = 24Q_{u}$ | $Q_{OL} = 0$, $Q_{OLB} = 18Q_{u}$ | $Q_{OL} = 0$, $Q_{OLB} = 12Q_{u}$ | $Q_{OL} = 0$, $Q_{OLB} = 6Q_{ut}$ |
| | +7 | $Q_{OL} = 0$, $Q_{OLB} = 49Q_{u}$ | $Q_{OL} = 0$, $Q_{OLB} = 42Q_{u}$ | $Q_{OL} = 0$, $Q_{OLB} = 35Q_{u}$ | $Q_{OL} = 0$, $Q_{OLB} = 28Q_{u}$ | $Q_{OL} = 0$, $Q_{OLB} = 21Q_{u}$ | $Q_{OL} = 0$, $Q_{OLB} = 14Q_{u}$ | $Q_{OL} = 0$, $Q_{OLB} = 7Q_{ut}$ |

TABLE 18

| | | Value of signal of neuron | | | | | | |
|---|---|---|---|---|---|---|---|---|
| | | +1 | +2 | +3 | +4 | +5 | +6 | +7 |
| Weight coefficient | −7 | $Q_{OL} = 0$, $Q_{OLB} = 7Q_{ut}$ | $Q_{OL} = 0$, $Q_{OLB} = 14Q_{u}$ | $Q_{OL} = 0$, $Q_{OLB} = 21Q_{u}$ | $Q_{OL} = 0$, $Q_{OLB} = 28Q_{u}$ | $Q_{OL} = 0$, $Q_{OLB} = 35Q_{u}$ | $Q_{OL} = 0$, $Q_{OLB} = 42Q_{u}$ | $Q_{OL} = 0$, $Q_{OLB} = 49Q_{u}$ |
| | −6 | $Q_{OL} = 0$, $Q_{OLB} = 6Q_{ut}$ | $Q_{OL} = 0$, $Q_{OLB} = 12Q_{u}$ | $Q_{OL} = 0$, $Q_{OLB} = 18Q_{u}$ | $Q_{OL} = 0$, $Q_{OLB} = 24Q_{u}$ | $Q_{OL} = 0$, $Q_{OLB} = 30Q_{u}$ | $Q_{OL} = 0$, $Q_{OLB} = 36Q_{u}$ | $Q_{OL} = 0$, $Q_{OLB} = 42Q_{u}$ |
| | −5 | $Q_{OL} = 0$, $Q_{OLB} = 5Q_{ut}$ | $Q_{OL} = 0$, $Q_{OLB} = 10Q_{u}$ | $Q_{OL} = 0$, $Q_{OLB} = 15Q_{u}$ | $Q_{OL} = 0$, $Q_{OLB} = 20Q_{u}$ | $Q_{OL} = 0$, $Q_{OLB} = 25Q_{u}$ | $Q_{OL} = 0$, $Q_{OLB} = 30Q_{u}$ | $Q_{OL} = 0$, $Q_{OLB} = 35Q_{u}$ |
| | −4 | $Q_{OL} = 0$, $Q_{OLB} = 4Q_{ut}$ | $Q_{OL} = 0$, $Q_{OLB} = 8Q_{ut}$ | $Q_{OL} = 0$, $Q_{OLB} = 12Q_{u}$ | $Q_{OL} = 0$, $Q_{OLB} = 16Q_{u}$ | $Q_{OL} = 0$, $Q_{OLB} = 20Q_{u}$ | $Q_{OL} = 0$, $Q_{OLB} = 24Q_{u}$ | $Q_{OL} = 0$, $Q_{OLB} = 28Q_{u}$ |
| | −3 | $Q_{OL} = 0$, $Q_{OLB} = 3Q_{ut}$ | $Q_{OL} = 0$, $Q_{OLB} = 6Q_{ut}$ | $Q_{OL} = 0$, $Q_{OLB} = 9Q_{ut}$ | $Q_{OL} = 0$, $Q_{OLB} = 12Q_{u}$ | $Q_{OL} = 0$, $Q_{OLB} = 15Q_{u}$ | $Q_{OL} = 0$, $Q_{OLB} = 18Q_{u}$ | $Q_{OL} = 0$, $Q_{OLB} = 21Q_{u}$ |
| | −2 | $Q_{OL} = 0$, $Q_{OLB} = 2Q_{ut}$ | $Q_{OL} = 0$, $Q_{OLB} = 4Q_{ut}$ | $Q_{OL} = 0$, $Q_{OLB} = 6Q_{ut}$ | $Q_{OL} = 0$, $Q_{OLB} = 8Q_{ut}$ | $Q_{OL} = 0$, $Q_{OLB} = 10Q_{u}$ | $Q_{OL} = 0$, $Q_{OLB} = 12Q_{u}$ | $Q_{OL} = 0$, $Q_{OLB} = 14Q_{u}$ |
| | −1 | $Q_{OL} = 0$, $Q_{OLB} = Q_{ut}$ | $Q_{OL} = 0$, $Q_{OLB} = 2Q_{ut}$ | $Q_{OL} = 0$, $Q_{OLB} = 3Q_{ut}$ | $Q_{OL} = 0$, $Q_{OLB} = 4Q_{ut}$ | $Q_{OL} = 0$, $Q_{OLB} = 5Q_{ut}$ | $Q_{OL} = 0$, $Q_{OLB} = 6Q_{ut}$ | $Q_{OL} = 0$, $Q_{OLB} = 7Q_{ut}$ |

TABLE 19

| | | Value of signal of neuron | | | | | | |
|---|---|---|---|---|---|---|---|---|
| | | −7 | −6 | −5 | −4 | −3 | −2 | −1 |
| Weight coefficient | −7 | $Q_{OL} = 49Q_{ut}$, $Q_{OLB} = 0$ | $Q_{OL} = 42Q_{ut}$, $Q_{OLB} = 0$ | $Q_{OL} = 35Q_{ut}$, $Q_{OLB} = 0$ | $Q_{OL} = 28Q_{ut}$, $Q_{OLB} = 0$ | $Q_{OL} = 21Q_{ut}$, $Q_{OLB} = 0$ | $Q_{OL} = 14Q_{ut}$, $Q_{OLB} = 0$ | $Q_{OL} = 7Q_{ut}$, $Q_{OLB} = 0$ |
| | −6 | $Q_{OL} = 42Q_{ut}$, $Q_{OLB} = 0$ | $Q_{OL} = 36Q_{ut}$, $Q_{OLB} = 0$ | $Q_{OL} = 30Q_{ut}$, $Q_{OLB} = 0$ | $Q_{OL} = 24Q_{ut}$, $Q_{OLB} = 0$ | $Q_{OL} = 18Q_{ut}$, $Q_{OLB} = 0$ | $Q_{OL} = 12Q_{ut}$, $Q_{OLB} = 0$ | $Q_{OL} = 6Q_{ut}$, $Q_{OLB} = 0$ |
| | −5 | $Q_{OL} = 35Q_{ut}$, $Q_{OLB} = 0$ | $Q_{OL} = 30Q_{ut}$, $Q_{OLB} = 0$ | $Q_{OL} = 25Q_{ut}$, $Q_{OLB} = 0$ | $Q_{OL} = 20Q_{ut}$, $Q_{OLB} = 0$ | $Q_{OL} = 15Q_{ut}$, $Q_{OLB} = 0$ | $Q_{OL} = 10Q_{ut}$, $Q_{OLB} = 0$ | $Q_{OL} = 5Q_{ut}$, $Q_{OLB} = 0$ |
| | −4 | $Q_{OL} = 28Q_{ut}$, $Q_{OLB} = 0$ | $Q_{OL} = 24Q_{ut}$, $Q_{OLB} = 0$ | $Q_{OL} = 20Q_{ut}$, $Q_{OLB} = 0$ | $Q_{OL} = 16Q_{ut}$, $Q_{OLB} = 0$ | $Q_{OL} = 12Q_{ut}$, $Q_{OLB} = 0$ | $Q_{OL} = 8Q_{ut}$, $Q_{OLB} = 0$ | $Q_{OL} = 4Q_{ut}$, $Q_{OLB} = 0$ |
| | −3 | $Q_{OL} = 21Q_{ut}$, $Q_{OLB} = 0$ | $Q_{OL} = 18Q_{ut}$, $Q_{OLB} = 0$ | $Q_{OL} = 15Q_{ut}$, $Q_{OLB} = 0$ | $Q_{OL} = 12Q_{ut}$, $Q_{OLB} = 0$ | $Q_{OL} = 9Q_{ut}$, $Q_{OLB} = 0$ | $Q_{OL} = 6Q_{ut}$, $Q_{OLB} = 0$ | $Q_{OL} = 3Q_{ut}$, $Q_{OLB} = 0$ |
| | −2 | $Q_{OL} = 14Q_{ut}$, $Q_{OLB} = 0$ | $Q_{OL} = 12Q_{ut}$, $Q_{OLB} = 0$ | $Q_{OL} = 10Q_{ut}$, $Q_{OLB} = 0$ | $Q_{OL} = 8Q_{ut}$, $Q_{OLB} = 0$ | $Q_{OL} = 6Q_{ut}$, $Q_{OLB} = 0$ | $Q_{OL} = 4Q_{ut}$, $Q_{OLB} = 0$ | $Q_{OL} = 2Q_{ut}$, $Q_{OLB} = 0$ |
| | −1 | $Q_{OL} = 7Q_{ut}$, $Q_{OLB} = 0$ | $Q_{OL} = 6Q_{ut}$, $Q_{OLB} = 0$ | $Q_{OL} = 5Q_{ut}$, $Q_{OLB} = 0$ | $Q_{OL} = 4Q_{ut}$, $Q_{OLB} = 0$ | $Q_{OL} = 3Q_{ut}$, $Q_{OLB} = 0$ | $Q_{OL} = 2Q_{ut}$, $Q_{OLB} = 0$ | $Q_{OL} = Q_{ut}$, $Q_{OLB} = 0$ |

By setting the first data (a weight coefficient) and the second data (a value of a signal of a neuron) as described above, the charge amount $Q_{OL}$ with which a current flows from the wiring OL to the circuit MC or the circuit MCr and the charge amount $Q_{OLB}$ with which a current flows from the wiring OLB to the circuit MC or the circuit MCr are determined in accordance with the result of the product of the first data (a weight coefficient) and the second data (a value of a signal of a neuron). In the case where the result of the product of the first data (a weight coefficient) and the second data (a value of a signal of a neuron) is a positive value, a current flows from the wiring OL to the circuit MC or the circuit MCr, and in the case where the result of the product of the first data (a weight coefficient) and the second data (a value of a signal of a neuron) is a negative value, a current flows from the wiring OLB to the circuit MC or the circuit MCr. That is, the product of the first data (a weight coefficient) and the second data (a value of a signal of a neuron) can be calculated from the charge amount $Q_{OL}$ and the charge amount $Q_{OLB}$. For example, in the case where the first data (a weight coefficient) is any one of "−7" to "+7", the second data (a value of a signal of a neuron) is any one of "−7" to "+7", and the product of the first data (a weight coefficient) and the second data (a value of a signal of a neuron) is a positive number, the product of the first data (a weight coefficient) and the second data (a value of a signal of a neuron) can be calculated from the charge amount $Q_{OL}$ by replacing $Q_{ut}$ with "+1" in the charge amount $Q_{OL}$ with which a current flows from the wiring OL to the circuit MC or the circuit MCr in the above table. Alternatively, for example, in the case where the first data (a weight coefficient) is any one of "−7" to "+7", the second data (a value of a signal of a neuron) is any one of "−7" to "+7", and the product of the first data (a weight coefficient) and the second data (a value of a signal of a neuron) is a negative number, the product of the first data (a weight coefficient) and the second data (a value of a signal of a neuron) can be calculated from the charge amount $Q_{OLB}$ by replacing $Q_{ut}$ with "−1" in the charge amount $Q_{OLB}$ with which a current flows from the wiring OLB to the circuit MC or the circuit MCr in the above table.

One embodiment of the present invention is not limited to the above definition. Although the second data (a value of a signal of a neuron) is defined above as a positive multilevel value, a negative multilevel value, or 0, the second data (a value of a signal of a neuron) can be processed as an analog value by using not a discrete value but a continuous value as the input period (by setting the input period to $a \times t_{ut}$, where a is a positive real number).

In the semiconductor device of one embodiment of the present invention, the configuration of the circuit MP is not limited to that in FIG. 65. For example, in the circuit MP in FIG. 65, there are six circuits of the circuit HCS, the circuit HCS-2*b*, the circuit HCS-3*b*, the circuit HCSr, the circuit HCS-2*br*, and the circuit HCS-3*br* that hold potentials, and each of the circuits is electrically connected to the gates of three transistors (e.g., the transistor M1, the transistor M1-2*x*, and the transistor M1-3*x*); however, the number of circuits holding potentials and the number of transistors may be increased and decreased in accordance with the values that the first data (a weight coefficient) and the second data (a value of a signal of a neuron) can have. In addition, the number of holding portions and the number of wirings may be increased and decreased in accordance with the number of transistors.

The operation method of the semiconductor device of one embodiment of the present invention is not limited to the above. For example, as described in Operation method example 2, the input period of signals that are input to the wiring X1L, the wiring X2L, the wiring X1L2*b*, the wiring X2L2*b*, the wiring X1L3*b*, and the wiring X2L3*b* may be divided into a plurality of subperiods in the circuit MP in FIG. 65.

In this operation method example, the case is considered where only one circuit MP is electrically connected to the wiring OL and the wiring OLB to avoid complexity of description; however, a plurality of circuits MP may be electrically connected to the wiring OL and the wiring OLB as in the arithmetic circuit 150 in FIG. 11. In this case, the sum of the amounts of charges input from the wiring OL and the wiring OLB to the plurality of circuits MP can be accumulated in the capacitor of the integrator circuit included in the circuit ACTF, which enables the circuit ACTF to output the signal $z_j^{k}$) of a neuron corresponding to the amounts of charges flowing through the wiring OL and the wiring OLB.

Although the arithmetic circuit 150 in FIG. 11 is used as an example in this operation example, operation similar to that of this operation example can be performed by changing the arithmetic circuit to another one according to circumstances.

Note that this operation method example can be combined with any of the other operation method examples and the like described in this specification as appropriate.

Note that this embodiment can be combined with any of the other embodiments in this specification as appropriate.

Embodiment 4

As an example, this embodiment describes a structure example of a semiconductor device for conducting arithmetic operation performed in a convolutional neural network (CNN). Note that as the semiconductor device, the semiconductor device described in any of the above embodiments can be used.

<Convolutional Neural Network>

Figure 66:
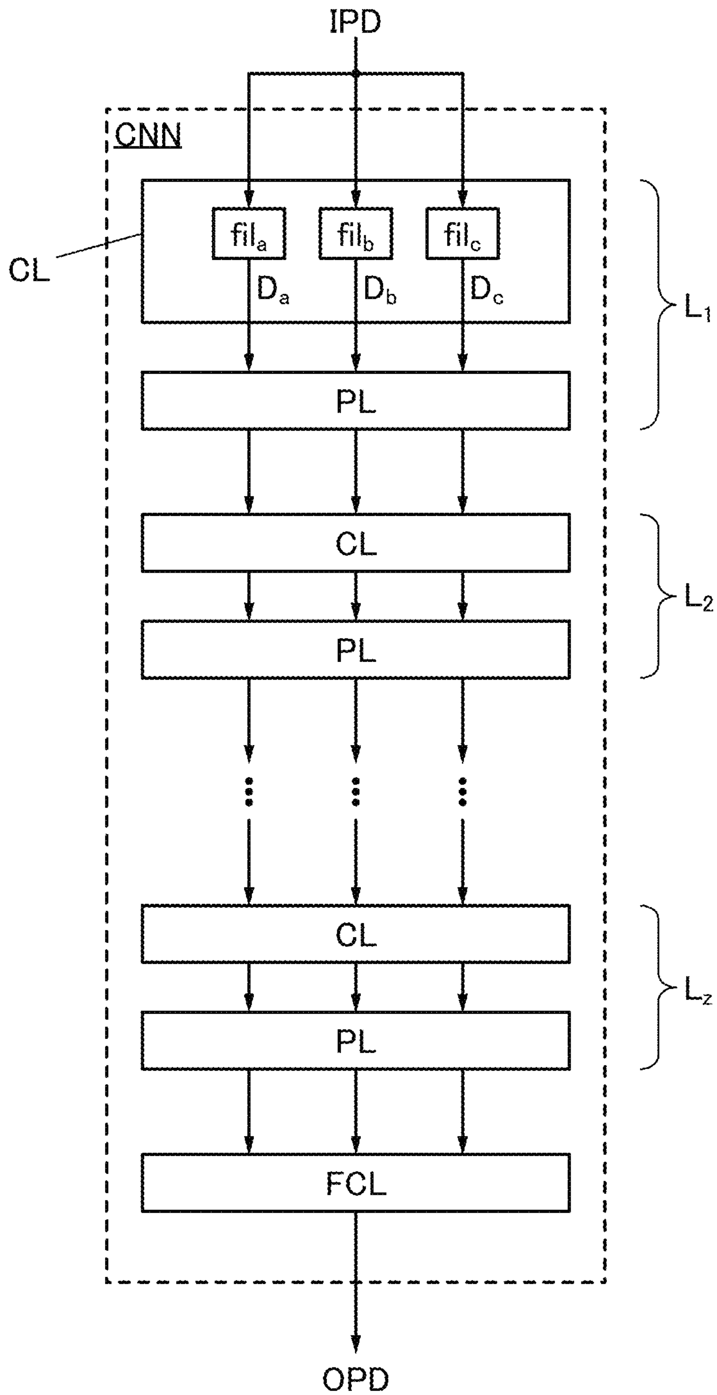
FIG. 66 is a block diagram illustrating a structure example of CNN.

A CNN is one of calculation models used for feature extraction of an image or the like. FIG. 66 illustrates a structure example of the CNN. The CNN is formed of a convolutional layer CL, a pooling layer PL, a fully connected layer FCL, and the like. The CNN performs feature extraction on image data IPD by input of the image data IPD.

The convolutional layer CL has a function of performing convolutional processing on the image data. The convolutional processing is performed by repeating product-sum operation using a partial region of the image data and the filter value of a weight filter. By the convolution in the convolutional layer CL, a feature of an image is extracted.

For the convolutional processing, one or a plurality of weight filters can be used. In the case of using a plurality of weight filters, a plurality of features of the image data can be extracted. FIG. 66 illustrates an example in which three filters (a filter $fil_a$, a filter $fil_b$, and a filter $fil_c$) are used as weight filters. The image data input to the convolutional layer CL is subjected to filter processing using the filters $fil_a$, $fil_b$, and $fil_c$, so that image data $D_a$, $D_b$, and $D_c$ are generated.

For example, arithmetic operation with an activation function may be performed on the image data $D_a$, $D_b$, and $D_c$ that have been subjected to convolution. As the activation function, a ReLU (Rectified Linear Units) or the like can be used, for example. A ReLU is a function that outputs "0" when an input value is negative and outputs the input value as it is when the input value is greater than or equal to "0". Alternatively, as the activation function, a sigmoid function, a tan h function, or the like can be used as well.

The image data $D_a$, $D_b$, and $D_c$ that have been subjected to the convolution (it does not matter whether arithmetic operation with an activation function has been performed) are output to the pooling layer PL, for example. The pooling layer PL has a function of performing pooling on the image data input from the convolutional layer CL. Pooling is processing in which the image data is partitioned into a plurality of regions and predetermined data extracted from each of the regions are arranged in a matrix to form new data. By the pooling, the image data can be reduced while the features extracted by the convolutional layer CL remain. As the pooling processing, max pooling, average pooling, Lp pooling, or the like can be used.

In the CNN, feature extraction is performed using the above convolutional processing and pooling processing, for example. Note that the CNN may include a plurality of convolutional layers CL and/or a plurality of pooling layers PL. FIG. 66 illustrates, as an example, a structure in which z layers L (a layer $L_1$ to a layer $L_z$) (here, z is an integer greater than or equal to 1) each of which includes the convolutional layer CL and the pooling layer PL are provided and the convolutional processing and the pooling processing are performed z times. In this case, feature extraction can be performed in each layer L, which may enable more advanced feature extraction. Note that FIG. 66 illustrates the layer $L_1$, the layer $L_2$, and the layer $L_z$, and the other layers L are omitted.

Although FIG. 66 illustrates an example where the layer $L_1$ to the layer $L_z$ each include the convolutional layer CL and the pooling layer PL, the structure of the CNN is not limited thereto. For example, one or more layers selected from the layer $L_1$ to the layer $L_z$ included in the CNN may include only one of the convolutional layer CL and the pooling layer PL. For example, in the CNN, the convolutional layers CL may be successively provided, or the pooling layers PL may be successively provided.

The fully connected layer FCL has a function of determining an image using the image data obtained through convolution and pooling, for example. The fully connected layer FCL has a structure in which all nodes in one layer are connected to all nodes in the next layer. The image data output from the convolutional layer CL or the pooling layer PL is a two-dimensional feature map and is unfolded into a one-dimensional feature map when input to the fully connected layer FCL. Then, data OPD obtained as a result of inference by the fully connected layer FCL is output.

Note that the structure of the CNN is not limited to the structure in FIG. 66. For example, one pooling layer PL may be provided for a plurality of convolutional layers CL. In the case where position information of the extracted feature is desired to be left as much as possible, a smaller number of pooling layers PL are provided.

In the case of classifying images using the output data from the fully connected layer FCL, an output layer electrically connected to the fully connected layer FCL may be provided. The output layer can output a classification class using a softmax function or the like as a likelihood function.

The CNN can perform supervised learning using image data as learning data and teacher data. In the supervised learning, a backpropagation method can be used, for example. Owing to the learning in the CNN, the filter value of the weight filter, the weight coefficient of the fully connected layer, or the like can be optimized.

<Convolutional Processing>

Next, a specific example of the convolutional processing performed in the convolutional layer CL is described.

Figure 67A:
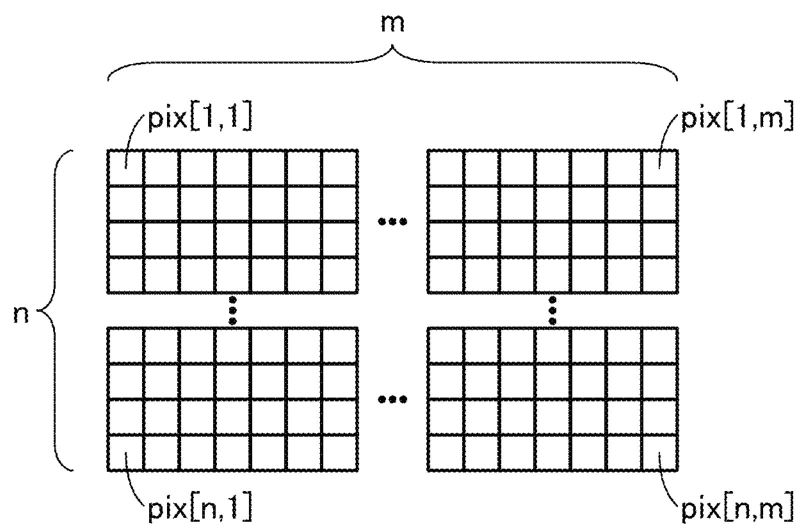
FIG. 67A is a diagram illustrating an arrangement example of pixels.

FIG. 67A illustrates a plurality of pixels pix arranged in a matrix of n rows and m columns (here, n and m are each an integer greater than or equal to 1). In pixels pix[1,1] to pix[n,m], g[1,1] to g[n,m] are stored as image data, respectively.

Figure 67B:
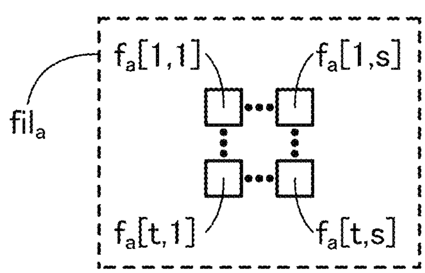
FIG. 67B is a diagram illustrating a structure example of a filter.

The convolution is performed by the product-sum operation using the image data g and the filter value of a weight filter. FIG. 67B illustrates the filter $fil_a$ with t rows and s columns (here, t is an integer greater than or equal to 1 and less than or equal to n, and s is an integer greater than or equal to 1 and less than or equal to m). A filter value $f_a$[1,1] to a filter value $f_a$[t,s] are assigned to the respective addresses of the filter $fil_a$.

In the case of performing feature extraction by convolution, data showing certain features (referred to as feature data) can be stored as the filter value $f_a$[1,1] to the filter value $f_a$[t,s]. Then, in the feature extraction, the feature data and image data are compared with each other. In addition, in the case of performing image processing such as edge processing or blurring processing by convolution, parameters necessary for the image processing can be stored as the filter value $f_a$[1,1] to the filter value $f_a$[t,s]. As an example, the operation in the case of performing feature extraction is described in detail below.

Figure 68A:
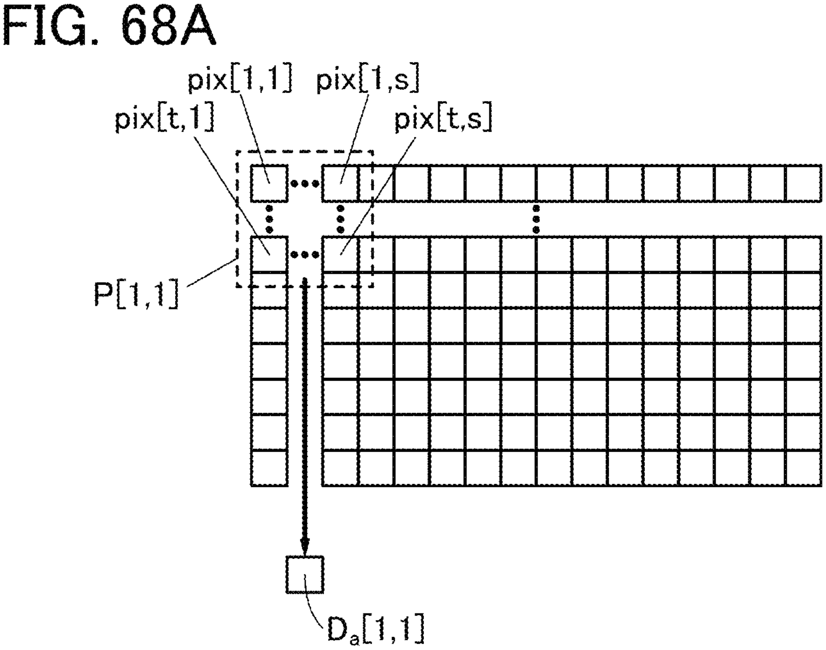
FIG. 68A and FIG. 68B are diagrams illustrating an example of convolutional processing.
Figure 68B:
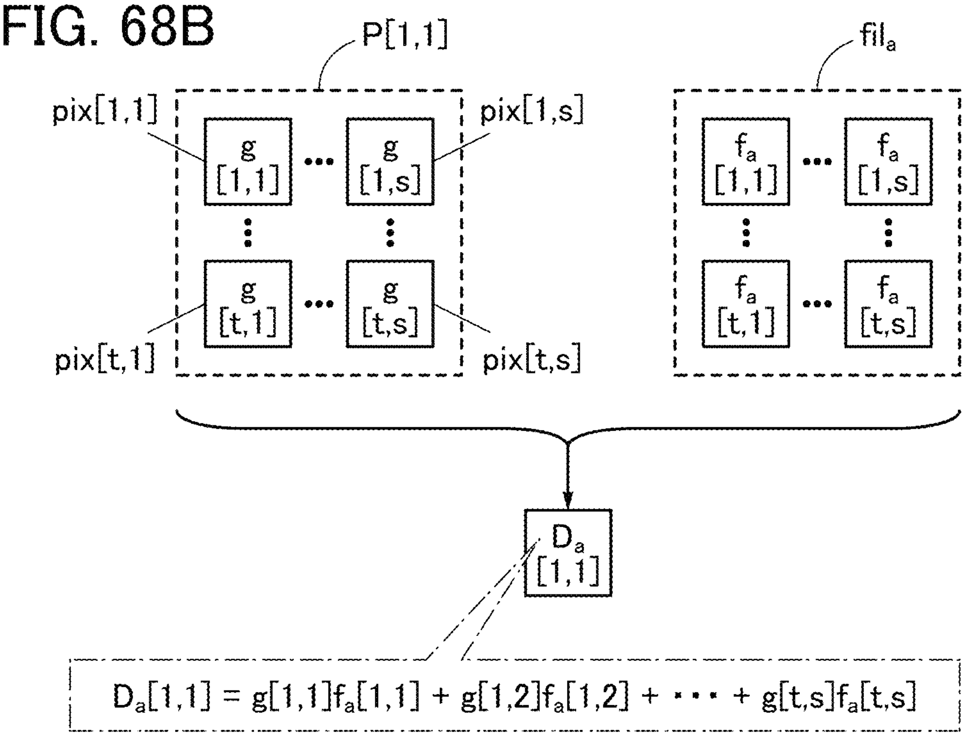

FIG. 68A illustrates a state where filter processing using the filter $fil_a$ is performed on a pixel region P[1,1] whose corners are the pixel pix[1,1], the pixel pix[1,*s*], the pixel pix[t,1], and the pixel pix[t,s] to obtain data $D_a$[1,1]. This filter processing is, as illustrated in FIG. 67B, processing in which pixel image data included in one pixel pix included in the pixel region P[1,1] is multiplied by the filter value $f_a$ of the filter $fil_a$ that corresponds to the address of the pixel pix, and the multiplication results for the pixels pix are added up together. In other words, the product-sum operation using image data g[v,w] (here, v is an integer greater than or equal to 1 and less than or equal to t, and w is an integer greater than or equal to 1 and less than or equal to s) and the filter value $f_a$[v,w] is performed in all the pixels pix included in the pixel region P[1,1]. The data $D_a$[1,1] can be expressed by the following formula.

[Formula 7]

$$D_a[1,1] = \sum_{v=1}^{t}\sum_{w=1}^{s} g[v,w]\cdot f_a[v,w] \tag{4.1}$$

Figure 69:
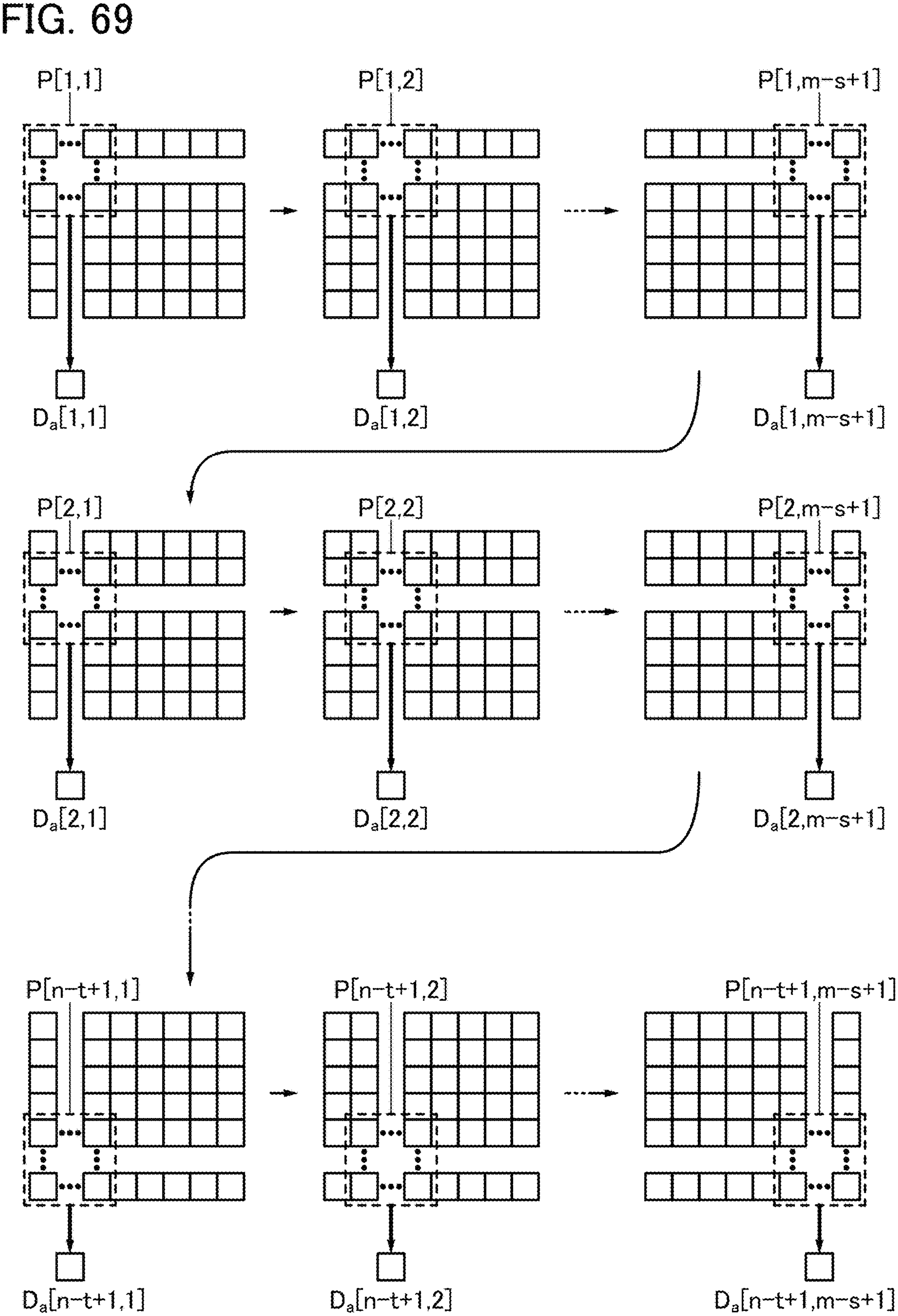
FIG. 69 is a diagram illustrating an example of convolutional processing.

After that, the above product-sum operation is sequentially performed also in other pixel regions. Specifically, for example, the filter processing is performed on a pixel region P[1,2] whose corners are the pixel pix[1,2], the pixel pix[1, *s*+1], the pixel pix[t,2], and the pixel pix[t,s+1] to obtain data $D_a$[1,2], as illustrated in FIG. 69. Subsequently, the data $D_a$ is obtained in each pixel region P in a similar manner while the pixel region P is moved pixel-column by pixel-column.

Then, data $D_a$[1,*m*−s+1] is obtained from a pixel region P[1,*m*−s+1] whose corners are the pixel pix[1,*m*−s+1], the pixel pix[1,*m*], the pixel pix[t,m−s+1], and the pixel pix[t, m]. After the data $D_a$ is obtained in each of the pixel regions in one row, i.e., the pixel region P[1,1] to the pixel region P[1,*m*−s+1], the pixel region P is moved by one pixel row and the data $D_a$ is sequentially obtained in the pixel row in a similar manner, for example. FIG. 69 illustrates a state where data $D_a$[2,1] to data $D_a$[2,*m*−s+1] are obtained from a pixel region P[2,1] to a pixel region P[2,*m*−s+1].

When the above operation is repeated and data $D_a$[n−t+1,m−s+1] is obtained from a pixel region P[n−t+1,m−s+1] whose corners are the pixel pix[n−t+1,m−s+1], the pixel pix[n−t+1,m], the pixel pix[n,m−s+1], and the pixel pix[n, m], the filter processing using the filter $fil_a$ on all pixel regions P is completed.

In such a manner, the pixel region P having pixels arranged in a matrix of t rows and s columns is selected from the pixel pix[1,1] to the pixel pix[n,m] and the filter processing using the filter $fil_a$ is performed on the pixel region P. Data $D_a$[x,y] obtained by performing the filter processing using the filter $fil_a$ on a pixel region P whose corners are the pixel pix[x,y] (here, x is an integer greater than or equal to 1 and less than or equal to n−t+1, and y is an integer greater than or equal to 1 and less than or equal to m−s+1), the pixel pix[x,y+s−1], the pixel pix[x+t−1,y], and the pixel pix[x+t−1,y+s−1] can be expressed by the following formula.

[Formula 8]

$$D_a[x, y] = \sum_{v=1}^{t}\sum_{w=1}^{s} g[x+v-1, y+w-1]\cdot f_a[v, w] \tag{4.2}$$

Figure 70:
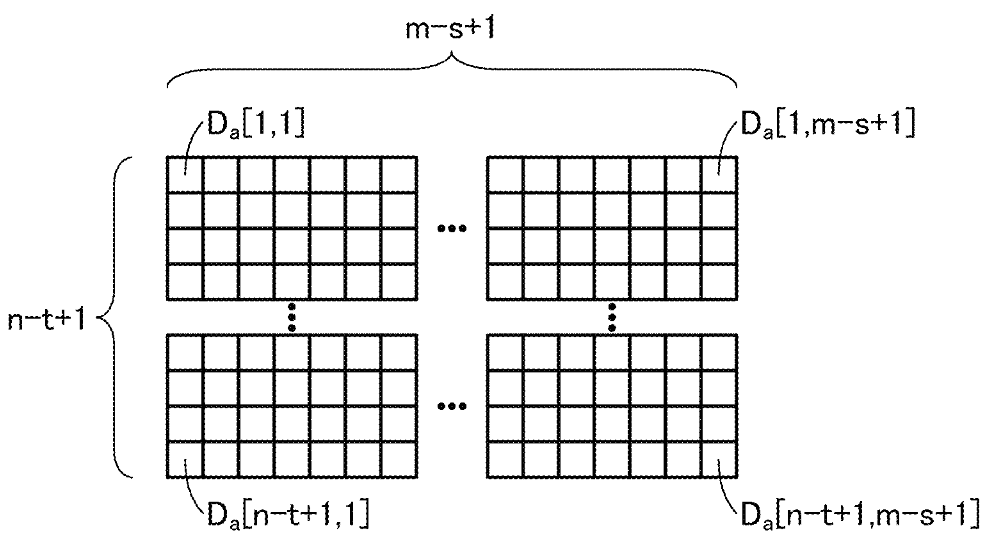
FIG. 70 is a diagram illustrating a structure example of a feature map.

As described above, the data $D_a$[1,1] to $D_a$[n−t+1,m−s+1] can be obtained when the filter processing using the filter $fil_a$ is performed on all the pixel regions P in t rows and s columns that can be selected from the pixel pix[1,1] to the pixel pix[n,m]. Then, the data $D_a$[1,1] to the data $D_a$[n−t+1,m−s+1] are arranged in a matrix in accordance with the addresses, so that a feature map (a depth map depending on the case) illustrated in FIG. 70 can be obtained.

In the above manner, the convolutional processing is performed by the product-sum operation using the image data and the filter values to extract the feature of an image.

Note that in the case where a plurality of filters fil are provided in the convolutional layer CL as illustrated in FIG. 66, the above convolutional processing is performed for each filter fil.

Although described here is an example in which the pixel region P is moved by one pixel column and one pixel row, a moving distance (sometimes referred to as a stride) of the pixel region P can be set freely. For example, the pixel region P may be moved by two rows and two columns or may be moved by one row and three columns. As another example, the pixel region P may be moved in the column direction by a number greater than or equal to the number of columns in the pixel region P and/or moved in the row direction by a number greater than or equal to the number of rows in the pixel region P. That is, the moving distance may be set so that the moved pixel region P does not overlap the pixel region P at the original position.

The size of the image data can be, for example, 8K UHD (7680×4320), 4K UHD (3840×2160), FHD (1920×1080), HD (1280×720), SD (720×480), or the like. Moreover, as for the size of the image data, the number of rows may be a number greater than 0, a number greater than or equal to 50, a number greater than or equal to 100, or a number greater than or equal to 500; and the number of columns may be a number greater than 0, a number greater than or equal to 50, a number greater than or equal to 100, or a number greater than or equal to 500. Note that the lower limit of the number of rows and the lower limit of the number of columns can be individually and freely selected.

As for the size of a filter (the range of a pixel region) used in convolutional processing, for example, the number of rows may be a number greater than 0, a number greater than or equal to 3, a number greater than or equal to 5, a number greater than or equal to 10, a number greater than or equal to 50, or a number greater than or equal to 100; and the number of columns may be a number greater than 0, a number greater than or equal to 3, a number greater than or equal to 5, a number greater than or equal to 10, a number greater than or equal to 50, or a number greater than or equal to 100. Note that the lower limit of the number of rows and the lower limit of the number of columns can be individually and freely selected.

<Operation Example of Semiconductor Device>

Next, the case where the above-described convolutional processing is performed in the semiconductor device described in the above embodiment is described.

Here, as an example, an operation example where the arithmetic circuit 110 in FIG. 2 described in Embodiment 1 performs the above-described convolutional processing is described with reference to a block diagram illustrated in FIG. 71. Although the description is made here using the block diagram illustrated in FIG. 71, a variety of circuits described in the above embodiments can be used without limitation to the block diagram illustrated in FIG. 71. Note that the convolutional processing here is performed on image data of n rows and m columns (g[1,1] to g[n,m]) by using a weight filter of t rows and s columns. The description of FIG. 67B is referred to for the weight filter of t rows and s columns, and the description of FIG. 67A is referred to for the image data of n rows and m columns.

Moreover, the convolutional processing here is performed using u weight filters (u is an integer greater than or equal to 1). Thus, the u weight filters are referred to as a filter $fil_1$ to a filter $fil_u$.

Figure 71:
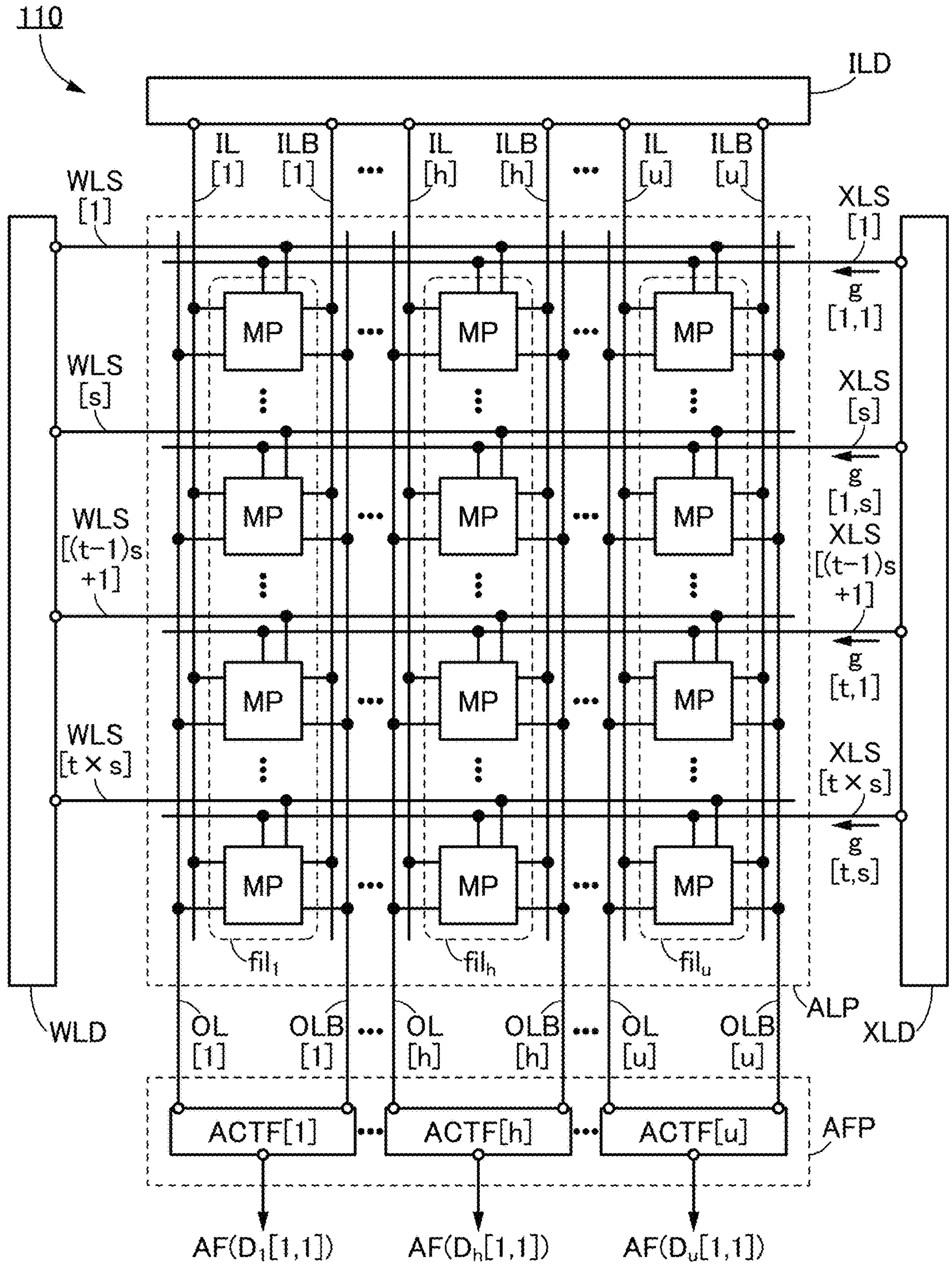
FIG. 71 is a block diagram illustrating an example of a semiconductor device that performs convolutional processing.

In the arithmetic circuit 110 in FIG. 71, at least t x s circuits MP are arranged in the column direction (vertical direction), for example, in the array portion ALP. The number of circuits MP arranged in the row direction (horizontal direction) of the array portion ALP can be the number of weight filters, for example. Thus, when the number of weight filters is u, the circuits MP included in the array portion ALP of the arithmetic circuit 110 in FIG. 71 are arranged in a matrix of (t×s) rows and u columns. The value of the weight filter is stored in each circuit MP, for example. For example, the values of one weight filter of t rows and s columns are stored in t×s circuits MP arranged as one column in the vertical direction. Since the t×s circuits MP arranged as one column in the vertical direction correspond to one weight filter of t rows and s columns, weight filters stored in the circuits MP of u columns correspond to the u weight filters.

Although [x,y] is added as the address to the reference numerals of the circuits MP in FIG. 2, [x,y] is not added to the reference numerals of the circuits MP in FIG. 71.

In the arithmetic circuit 110 in FIG. 71, the array portion ALP includes the circuits MP of t×s rows, for example, and thus t×s wirings WLS and t×s wirings XLS are provided. FIG. 71 illustrates the wiring WLS[1], the wiring WLS[s], the wiring WLS[(t−1)s+1], and the wiring WLS[t×s] as some of the t×s wirings WLS and the wiring XLS[1], the wiring XLS[s], the wiring XLS[(t−1)s+1], and the wiring XLS[t×s] as some of the t×s wirings XLS.

The wiring WLS[1] to the wiring WLS[t×s] are electrically connected to the circuit WLD. The wiring XLS[1] to the wiring WLS[t×s] are electrically connected to the circuit XLD. Note that the description of the circuit WLD and the circuit XLD in FIG. 2 is referred to for the circuit WLD and the circuit XLD included in the arithmetic circuit 110 in FIG. 71.

In particular, the circuit XLD of the arithmetic circuit 110 in FIG. 71 has a function of inputting image data to the wiring XLS[1] to the wiring XLS[t×s]. Specifically, FIG. 71 illustrates an example in which the circuit XLD outputs the image data g[1,1] to g[t,s] included in the pixel region P[1,1] illustrated in FIG. 68A to the wiring XLS[1] to the wiring XLS[t×s], respectively.

In the arithmetic circuit 110 in FIG. 71, u wirings IL, u wirings ILB, u wirings OL, and u wirings OLB are provided, for example, because the array portion ALP includes the circuits MP of u columns. FIG. 71 illustrates the wiring IL[1], the wiring IL[h] (here, h is an integer greater than or equal to 1 and less than or equal to u), and the wiring IL[u] as some of the u wirings IL, and illustrates the wiring ILB[1], the wiring ILB[h], and the wiring ILB[u] as some of the u wirings ILB. Moreover, FIG. 71 illustrates the wiring OL[1], the wiring OL[h], and the wiring OL[u] as some of the u wirings OL, and illustrates the wiring OLB[1], the wiring OLB[h], and the wiring OLB[u] as some of the u wirings OLB. For example, in the case where the values of the weight filter do not have a negative value or do not have a positive value, any one of the wiring OL and the wiring OLB is not necessarily provided. For example, in the case where the values of the weight filter do not have a negative value or do not have a positive value, any one of the wiring IL and the wiring ILB is not necessarily provided.

The wiring IL[1] to the wiring IL[u] and the wiring ILB[1] to the wiring ILB[u] are electrically connected to the circuit ILD. The wiring OL[1] to the wiring OL[u] and the wiring OL[1] to the wiring OL[u] are electrically connected to the circuit AFP. Note that the description of the circuit ILD and the circuit AFP in FIG. 2 is referred to for the circuit ILD and the circuit AFP included in the arithmetic circuit 110 in FIG. 71.

Specifically, the wiring OL[1] and the wiring OLB[1] are electrically connected to the circuit ACTF[1] included in the circuit AFP. The wiring OL[h] and the wiring OLB[h] are electrically connected to the circuit ACTF[h] included in the circuit AFP. The wiring OL[u] and the wiring OLB[u] are electrically connected to the circuit ACTF[u] included in the circuit AFP. Note that the description of the circuit ACTF[1] to the circuit ACTF[n] in FIG. 2 is referred to for the circuit ACTF[1] to the circuit ACTF[u] included in the circuit AFP in FIG. 71. The circuit ACTF[1] to the circuit ACTF[u] in FIG. 71 may have not only a function of converting a difference in the amount of current flowing through the wiring OL and the wiring OLB into a signal such as a voltage, but also a function of performing arithmetic operation with a ReLU function, a sigmoid function, a tan h function, or the like on the difference in the amount of current, the voltage, or the like.

Next, the circuit MP included in the array portion ALP of the arithmetic circuit 110 in FIG. 71 is described.

In the circuit MP of the array portion ALP, the filter value of a weight filter is held, for example. The filter value of the weight filter can be, for example, a binary value of "0" and "+1", a binary value of "−1" and "+1", a ternary value of "−1", "0", and "+1", a multilevel value greater than a ternary value, or an analog value, as described in the above embodiment.

Here, assume that filter values included in the filter $fil_1$ are held in the circuits MP in the first column of the array portion ALP, filter values included in the filter $fil_h$ are held in the circuits MP in the h-th column of the array portion ALP, and filter values included in the filter $fil_u$ are held in the circuits MP in the u-th column of the array portion ALP.

For example, given that the filter value in a v-th row and a w-th column (here, v is an integer greater than or equal to 1 and less than or equal to t, and w is an integer greater than or equal to 1 and less than or equal to s) of the filter $fil_1$ is $f_1$[v,w], $f_1$[1,1] is held in the circuit MP in the first row and the first column of the array portion ALP, $f_1$[1,*s*] is held in the circuit MP in the s-th row and the first column of the array portion ALP, $f_1$[t,1] is held in the circuit MP in the (t−1)s+1-th row and the first column of the array portion ALP, and $f_1$[t,s] is held in the circuit MP in the t×s-th row and the first column of the array portion ALP. As a similar example, given that the filter value in the v-th row and the w-th column of the filter $fil_h$ is $f_h$[v,w], $f_h$[1,1] is held in the circuit MP in the first row and the h-th column of the array portion ALP, $f_h$[1,*s*] is held in the circuit MP in the s-th row and the h-th column of the array portion ALP, $f_h$[t, 1] is held in the circuit MP in the (t−1)s+1-th row and the h-th column of the array portion ALP, and $f_h$[t,s] is held in the circuit MP in the t×s-th row and the h-th column of the array portion ALP. As a similar example, given that the filter value in the v-th row and the w-th column of the filter $fil_u$ is $f_u$[v,w], $f_u$[1,1] is held in the circuit MP in the first row and the u-th column of the array portion ALP, $f_u$[1,*s*] is held in the circuit MP in the s-th row and the u-th column of the array portion ALP, $f_u$[t,1] is held in the circuit MP in the (t−1)s+1-th row and the u-th column of the array portion ALP, and $f_u$[t,s] is held in the circuit MP in the t×s-th row and the u-th column of the array portion ALP. That is, the filter $fil_h$ of v rows and w columns has a total of v×w values, for example. These values are stored in a total of v×w circuits MP arranged in the vertical direction in the h-th column. Note that in the case where the number of columns of the circuits MP in the array portion ALP is larger than the number of filters fil, a value of 0 is held in the circuits MP in a surplus column. Specifically, a voltage that does not allow a current to flow from the circuit MP to the wiring IL and the wiring ILB is held. Thus, a current is not output from the circuit MP to the wiring IL and the wiring ILB, so that power consumption can be reduced.

When the filter value of the weight filter is held in each of the circuits MP in the array portion ALP, t×s image data to be subjected to convolutional processing among g[1,1] to g[n,m] are input as image data to the wiring XLS[1] to the wiring XLS[t×s].

For example, g[1,1] to g[1,*s*] included in the pixel region P[1,1] of the image data targeted for convolutional processing are input to the wiring XLS[1] to the wiring XLS[s], respectively. Moreover, g[t,1] to g[t,s] are input to the wiring XLS[(t−1)s+1] to the wiring XLS[t×s], respectively. In other words, the image data of the pixel region P[1,1] illustrated in FIG. 68A and FIG. 69 are input to the wiring XLS[1] to the wiring XLS[t×s].

As described in the above embodiment, when the second data (image data in this description) is input from the wiring XLS while the first data (a filter value in this description) is held in the circuit MP, product-sum operation of the first data and the second data is performed. The result of the product-sum operation is determined in accordance with a difference in the amount of current flowing through the wiring OL and the wiring OLB.

Accordingly, in the first column of the array portion ALP, product-sum operation of image data included in the pixel region P[1,1] of the image data and the weight filter $fil_1$ ($f_1$[1,1] to $f_1$[t,s]) is performed. Specifically, a current flows to the circuit ACTF[1] from the circuits MP positioned in the first column of the array portion ALP through the wiring OL[1] and the wiring OLB[1]. Given that the result of the product-sum operation is the data $D_1$[1,1], the data $D_1$[1,1] has a value corresponding to the difference in amount of current flowing through the wiring OL[1] and the wiring OLB[1]. The data $D_1$[1,1] may be subjected to arithmetic operation with an activation function by a circuit included in the circuit ACTF[1]. FIG. 71 illustrates, with the data $D_1$[1,1] subjected to an activation function as AF($D_1$[1,1]), a state where AF($D_1$[1,1]) is output from the circuit ACTF [1] for convenience.

Similarly, in the h-th column of the array portion ALP, product-sum operation of image data included in the pixel region P[1,1] of the image data and the weight filter $fil_h$ ($f_h$[1,1] to $f_h$[t,s]) is performed. Given that the result of the product-sum operation is the data Dh[1,1], the data $D_h$[1,1] has a value corresponding to the difference in amount of current flowing through the wiring OL[h] and the wiring OLB[h]. Moreover, in the u-th column of the array portion ALP, product-sum operation of image data included in the pixel region P[1,1] of the image data and the weight filter $fil_u$ ($f_u$[1,1] to $f_u$[t,s]) is performed. Given that the result of the product-sum operation is the data $D_u$[1,1], the data $D_u$[1,1] has a value corresponding to the difference in amount of current flowing through the wiring OL[u] and the wiring OLB[u]. FIG. 71 illustrates, with the data $D_h$[1,1] and the data $D_u$[1,1] subjected to an activation function as AF($D_h$[1,1]) and AF($D_u$[1,1]), a state where AF($D_h$[1,1]) is output from the circuit ACTF[h] and AF($D_u$[1,1]) is output from the circuit ACTF[u] for convenience.

The data $D_1$[1,1] to the data $D_u$[1,1] can each be represented by Formula (4.2). By inputting one set of image data for a plurality of weight filters in this manner, a plurality of product-sum operations can be performed concurrently. Thus, power consumption can be reduced, and arithmetic operation can be performed at high speed.

In the arithmetic circuit 110 illustrated in FIG. 71, as an example, the circuit XLD outputs g[1,1] to g[t,s] as image data included in the pixel region P[1,1] to the wiring XLS[1] to the wiring XLS[t×s], respectively; however, the circuit XLD may be configured to sequentially switch the pixel regions P and output image data different from g[1,1] to g[t,s] to the wiring XLS[1] to the wiring XLS[t×s].

Figure 72:
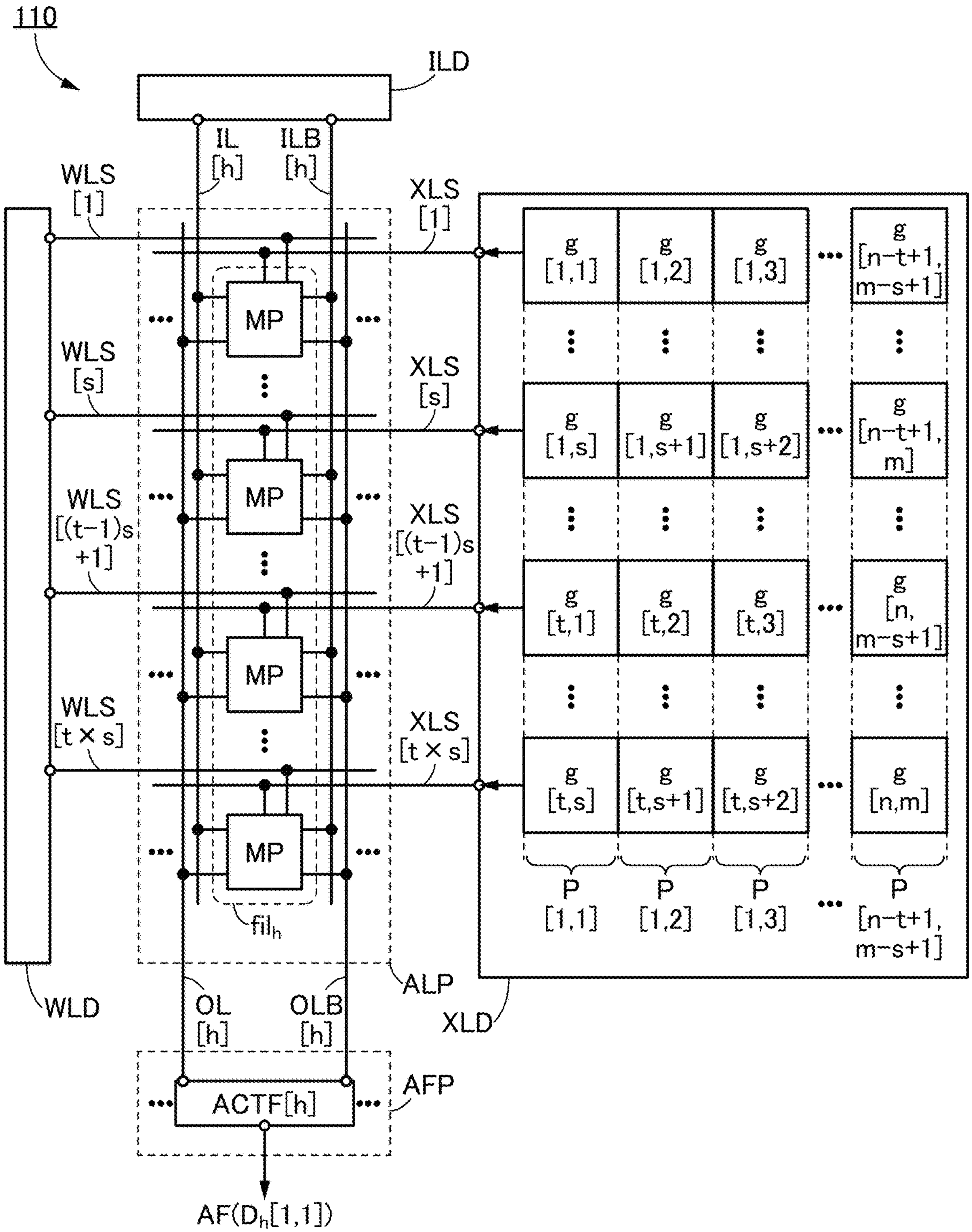
FIG. 72 is a block diagram illustrating an example of a semiconductor device that performs convolutional processing.

For example, the arithmetic circuit 110 illustrated in FIG. 72 is considered. In the arithmetic circuit 110 in FIG. 72, only the circuits MP in the h-th column in the array portion ALP in the arithmetic circuit 110 in FIG. 71 are shown. The arithmetic circuit 110 in FIG. 72 also shows image data that are included in the pixel regions P and sequentially output from the circuit XLD.

For example, when first product-sum operation is performed, the circuit XLD outputs g[1,1] to g[t,s] as image data included in the pixel region P[1,1] to the wiring XLS[1] to the wiring XLS[t×s], respectively. Thus, the arithmetic circuit 110 generates the data $D_h$[1,1], which is the result of the product-sum operation of the filter $fil_h$ and g[1,1] to g[t,s], in the h-th column of the array portion ALP. At the same time, the data $D_1$[1,1], which is the result of the product-sum operation of the weight filter $fil_1$ and g[1,1] to g[t,s], is generated in the first column of the array portion ALP, and the data $D_u$[1,1], which is the result of the product-sum operation of the filter $fil_u$ and g[1,1] to g[t,s], is generated in the u-th column of the array portion ALP. Note that FIG. 72 illustrates a state where AF($D_h$[1,1]) is output from the circuit ACTF[h].

Then, when second product-sum operation is performed, the circuit XLD outputs g[1,2] to g[t,s+1] as image data included in the pixel region P[1,2] to the wiring XLS[1] to the wiring XLS[t×s], respectively. Thus, the arithmetic circuit 110 generates the data $D_h$[1,2], which is the result of the product-sum operation of the filter $fil_h$ and g[1,2] to g[t,s+1], in the h-th column of the array portion ALP. Similarly, the arithmetic circuit 110 generates the data $D_1$[1,2], which is the result of the product-sum operation of the weight filter $fil_1$ and g[1,2] to g[t,s+1], in the first column of the array portion ALP, and the arithmetic circuit 110 generates the data $D_u$[1,2], which is the result of the product-sum operation of the filter $fil_u$ and g[1,2] to g[t,s+1], in the u-th column of the array portion ALP.

That is, by changing the pixel region output from the circuit XLD every time one product-sum operation is performed, the results of the product-sum operations of different pixel regions and the filter $fil_1$ to the filter $fil_u$ can be output. Here, when all of the pixel region P[1,1] to the pixel region P[n-s+1,m-t+1] that the image data g[1,1] to g[n,m] can have are sequentially output from the circuit XLD, convolutional processing with the filter $fil_1$ to the filter $fil_u$ can be performed on the pixel region P[1,1] to the pixel region P[n−s+1,m−t+1]. Thus, the arithmetic circuit 110 generates the data $D_1$[1,1] to the data $D_1$[n−s+1,m−t+1], which are the results of the product-sum operation of the pixel region P[1,1] to the pixel region P[n−s+1,m−t+1] and the filter $fil_1$, in the first column of the array portion ALP. Similarly, the arithmetic circuit 110 generates the data $D_h$[1,1] to the data $D_h$[n−s+1,m−t+1], which are the results of the product-sum operation of the pixel region P[1,1] to the pixel region P[n−s+1,m−t+1] and the filter $fil_h$, in the h-th column of the array portion ALP, and generates the data $D_u$[1,1] to the data $D_u$[n−s+1,m−t+1], which are the results of the product-sum operation of the pixel region P[1,1] to the pixel region P[n−s+1,m−t+1] and the filter $fil_u$, in the u-th column of the array portion ALP.

Accordingly, convolutional processing on g[1,1] to g[n, m] included in the image data can be performed, as in a manner similar to that of the processing illustrated in FIG. 69. Note that in general, the value of the weight filter is not often changed after once determined. Therefore, when the value input to the circuit MP once is held, it is not necessary to rewrite the value. Consequently, power consumption can be reduced. Meanwhile, image data is changed every time a target subjected to convolutional processing is changed. For example, for moving images, image data is changed every specific cycle.

Note that the image data g[1,1] to g[n,m] discussed in this embodiment may be zero-padded data. Using zero-padded data increases the number of arithmetic operations, so that a feature can be extracted in a portion around the image data.

Note that in the semiconductor device described in the above embodiment, the second data transmitted from the circuit XLD can be a negative value, “0”, or a positive value. Thus, when image data is transmitted as the second data, “0” can be a reference value for the image data. For example, in the case of grayscale, the minimum value (a negative value) can be black, the maximum value (a positive value) can be a white, and gray in the middle can be “0”. Alternatively, when image data is transmitted as the second data, “0” can be the minimum value or the maximum value of the image data. For example, in the case of a generally dark image, “0” can be black and the maximum value (a positive value) can be white. As a result, the use of a negative value can be eliminated. In that case, a circuit such as one illustrated in FIG. 40 can be used. Note that in the case where data is “0”, a current does not flow, so that power consumption can be reduced. Thus, for example, in the case of a generally bright image, “0” can be white and the minimum value (a negative value) can be black. As a result, the use of a positive value can be eliminated. Also in that case, a circuit such as one illustrated in FIG. 40 can be used.

The second data (image data) transmitted from the circuit XLD can be treated as a multilevel value or an analog value by the method described in the above embodiment, for example, by using the circuit MP illustrated in any of FIG. 26 to FIG. 35, FIG. 39, and the like. In addition, the second data (image data) transmitted from the circuit XLD can be treated as a multilevel value or an analog value also by setting the length of the input time of a signal supplied from the circuit XLD to the wiring XLS, as described in Embodiment 3, FIG. 51 to FIG. 53, FIG. 63 to FIG. 65, and the like.

The above description shows an example where the value of the weight filter is held in the circuit MP of the array portion ALP in the arithmetic circuit 110, image data is input to the wiring XLS[1] to the wiring XLS[t×s] from the circuit XLD, and convolutional processing is performed on the image data; however, the operation method of the semiconductor device of one embodiment of the present invention is not limited thereto. For example, in the case where convolutional processing is performed in the arithmetic circuit 110, image data may be held in the circuit MP of the array portion ALP in the arithmetic circuit 110, the value of the weight filter may be input to the wiring XLS[1] to the wiring XLS[t×s] from the circuit XLD, and arithmetic operation may be performed.

Figure 73:
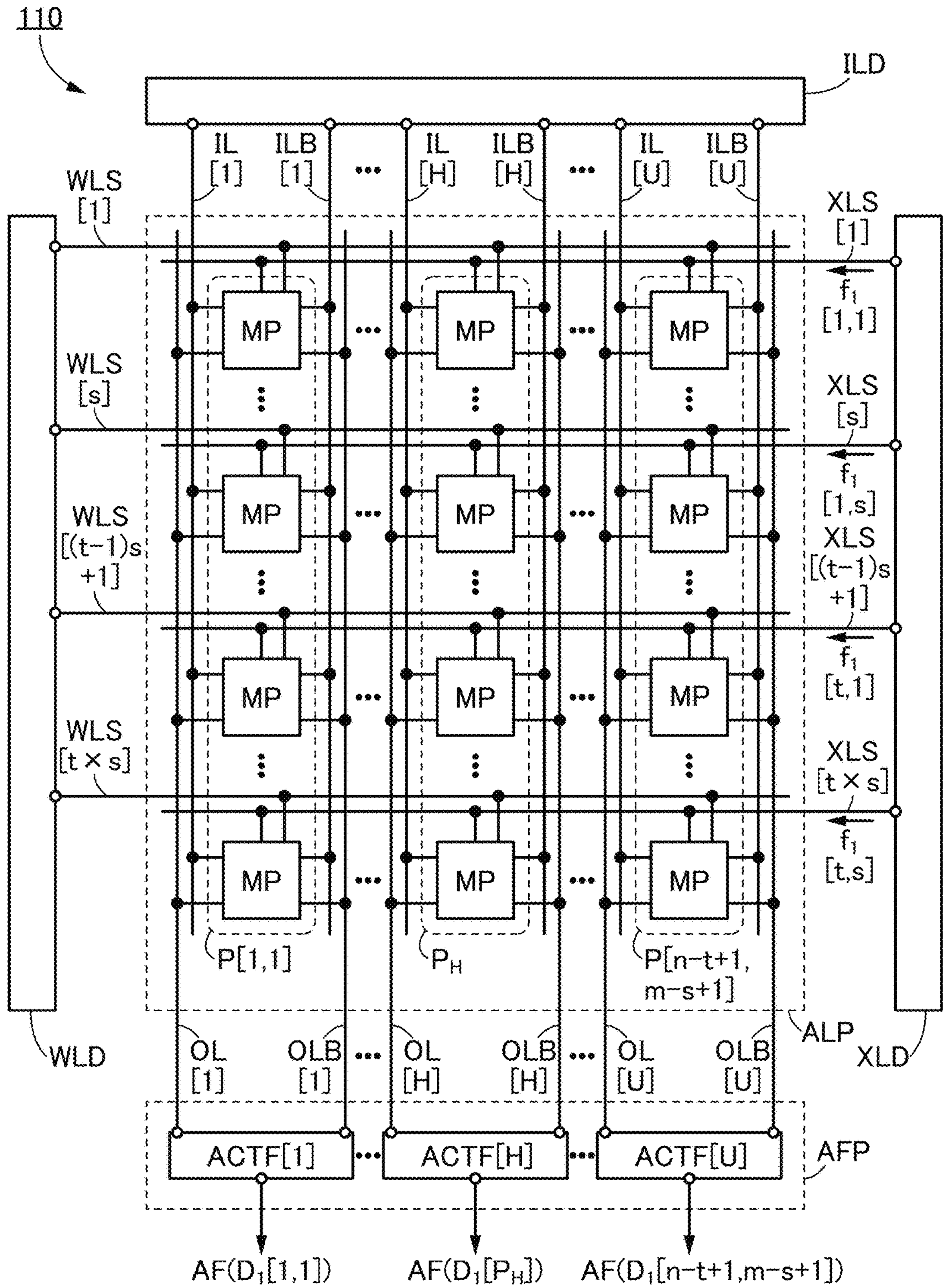
FIG. 73 is a block diagram illustrating an example of a semiconductor device that performs convolutional processing.

FIG. 73 illustrates the arithmetic circuit 110 that performs such operation. In the arithmetic circuit 110 in FIG. 73, at least t×s circuits MP are arranged in the column direction (vertical direction) of the array portion ALP, for example. The number of circuits MP arranged in the row direction (horizontal direction) of the array portion ALP of the arithmetic circuit 110 in FIG. 73 can be, for example, the number of pixel regions determined by the size of an image subjected to convolutional processing and convolutional processing conditions (e.g., the size of the weight filter and the stride). For example, in the case where the number of pixels in an image is n×m, the weight filter has t rows and s columns, and the stride is 1 as shown in FIG. 67A, FIG. 67B, FIG. 68A, FIG. 68B, and FIG. 69, the number of circuits MP arranged in the row direction of the array portion ALP is (n−t+1)×(m−s+1). Note that here, (n−t+1)×(m−s+1)=U is satisfied. In other words, the circuits MP included in the array portion ALP of the arithmetic circuit 110 in FIG. 73 are arranged in a matrix of t×s rows and U columns.

Thus, the arithmetic circuit 110 in FIG. 73 differs from the arithmetic circuit 110 in FIG. 71 in that the array portion ALP includes the circuits MP of U columns. Accordingly, U wirings IL, U wirings ILB, U wirings OL, and U wirings OLB are provided in the arithmetic circuit 110 in FIG. 73. FIG. 73 illustrates the wiring IL[1], the wiring IL[H] (here, H is an integer greater than or equal to 1 and less than or equal to U), and the wiring IL[j] as some of the U wirings IL, and illustrates the wiring ILB[1], the wiring ILB[H], and the wiring ILB[j] as some of the U wirings ILB. Moreover, FIG. 71 illustrates the wiring OL[1], the wiring OL[H], and the wiring OL[j] as some of the U wirings OL, and illustrates the wiring OLB[1], the wiring OLB[H], and the wiring OLB[j] as some of the U wirings OLB. The circuit AFP includes U circuits ACTF.

As described above, image data included in an image subjected to convolutional processing are held in the circuits MP of the array portion ALP.

Here, assume that the image data g[1,1] to g[t,s] included in the pixel region P[1,1] are held in the circuits MP in the first column of the array portion ALP, the image data included in the H-th pixel region (denoted as PH in FIG. 73) are held in the circuits MP in the H-th column of the array portion ALP, and the image data g[n−t+1,m−s+1] to g[n,m] included in the pixel region P[n−t+1,m−s+1] are held in the circuits MP in the U-th column of the array portion ALP.

For example, g[1,1] is held in the circuit MP in the first row and the first column of the array portion ALP, g[1,*s*] is held in the circuit MP in the s-th row and the first column of the array portion ALP, g[t,1] is held in the circuit MP in the (t−1)s+1-th row and the first column of the array portion ALP, and g[t,s] is held in the circuit MP in the t×s-th row and the first column of the array portion ALP. As a similar example, g[n−t+1,m−s+1] is held in the circuit MP in the first row and the U-th column of the array portion ALP, g[n−t+1,m] is held in the circuit MP in the s-th row and the U-th column of the array portion ALP, g[n,m−s+1] is held in the circuit MP in the (t−1)s+1-th row and the U-th column of the array portion ALP, and g[n,m] is held in the circuit MP in the t×s-th row and the U-th column of the array portion ALP.

When image data is held in each of the circuits MP of the array portion ALP, $f_1$[1,1] to $f_1$[t,s] are input to the wiring XLS[1] to the wiring XLS[t×s], respectively, as filter values included in the filter $fil_1$ used for convolutional processing.

For example, $f_1$[1,1] to $f_1$[1,*s*] included in the filter $fil_1$ used for convolutional processing are input to the wiring XLS[1] to the wiring XLS[s], respectively. Moreover, $f_1$[t,1] to $f_1$[t,s] are input to the wiring XLS[(t−1)s+1] to the wiring XLS[t×s], respectively. In other words, the filter values included in the filter $fil_1$ used for the convolutional processing in FIG. 68A and FIG. 69 are input to the wiring XLS[1] to the wiring XLS[t×s].

As described in the above embodiment, when the second data (a filter value in this description) is input from the wiring XLS while the first data (image data in this description) is held in the circuit MP, product-sum operation of the first data and the second data is performed. The result of the product-sum operation is determined in accordance with a difference in the amount of current flowing through the wiring OL and the wiring OLB.

Accordingly, in the first column of the array portion ALP, product-sum operation of image data included in the pixel region P[1,1] of the image data and the weight filter $fil_1$ ($f_1$[1,1] to $f_1$[t,s]) is performed. Specifically, a current flows to the circuit ACTF[1] from the circuits MP positioned in the first column of the array portion ALP through the wiring OL[1] and the wiring OLB[1]. Given that the result of the product-sum operation is the data $D_1$[1,1], the data $D_1$[1,1] has a value corresponding to the difference in amount of current flowing through the wiring OL[1] and the wiring OLB[1]. FIG. 73 illustrates, with the data $D_1$[1,1] subjected to an activation function as AF($D_1$[1,1]), a state where AF($D_1$[1,1]) is output from the circuit ACTF[1] for convenience.

Similarly, in the H-th column of the array portion ALP, product-sum operation of image data included in the pixel region PH of the image data and the weight filter $fil_1$ ($f_1$[1,1] to $f_1$[t,s]) is performed. Given that the result of the product-sum operation is the data $D_1$[PH], the data $D_1$[PH] has a value corresponding to the difference in amount of current flowing through the wiring OL[H] and the wiring OLB[H]. Moreover, in the U-th column of the array portion ALP, product-sum operation of image data included in the pixel region P[n−t+1,m−s+1] of the image data and the weight filter $fil_1$ ($f_1$[1,1] to $f_1$[t,s]) is performed. Given that the result of the product-sum operation is the data $D_1$[n−t+1,m−s+1], the data $D_1$[n−t+1,m−s+1] has a value corresponding to the difference in amount of current flowing through the wiring OL[j] and the wiring OLB[j]. FIG. 73 illustrates, with the data $D_1$[PH] and the data $D_1$[n−t+1,m−s+1] subjected to an activation function as AF($D_1$[PH]) and AF($D_1$[n−t+1,m−s+1]), a state where AF($D_1$[PH]) is output from the circuit ACTF[h] and AF($D_1$[n−t+1,m−s+1]) is output from the circuit ACTF[u] for convenience.

The data $D_1$[1,1] to the data $D_1$[n−t+1,m−s+1] can each be represented by Formula (4.2).

In the arithmetic circuit 110 illustrated in FIG. 73, as an example, the circuit XLD outputs $f_1$[1,1] to $f_1$[t,s] as the filter values included in the weight filter $fil_1$ to the wiring XLS[1] to the wiring XLS[t×s], respectively; however, the circuit XLD may be configured to switch the weight filter $fil_1$ to another weight filter sequentially so that $f_1$[1,1] to $f_1$[t,s] are output to the wiring XLS[1] to the wiring XLS[t×s].

Figure 74:
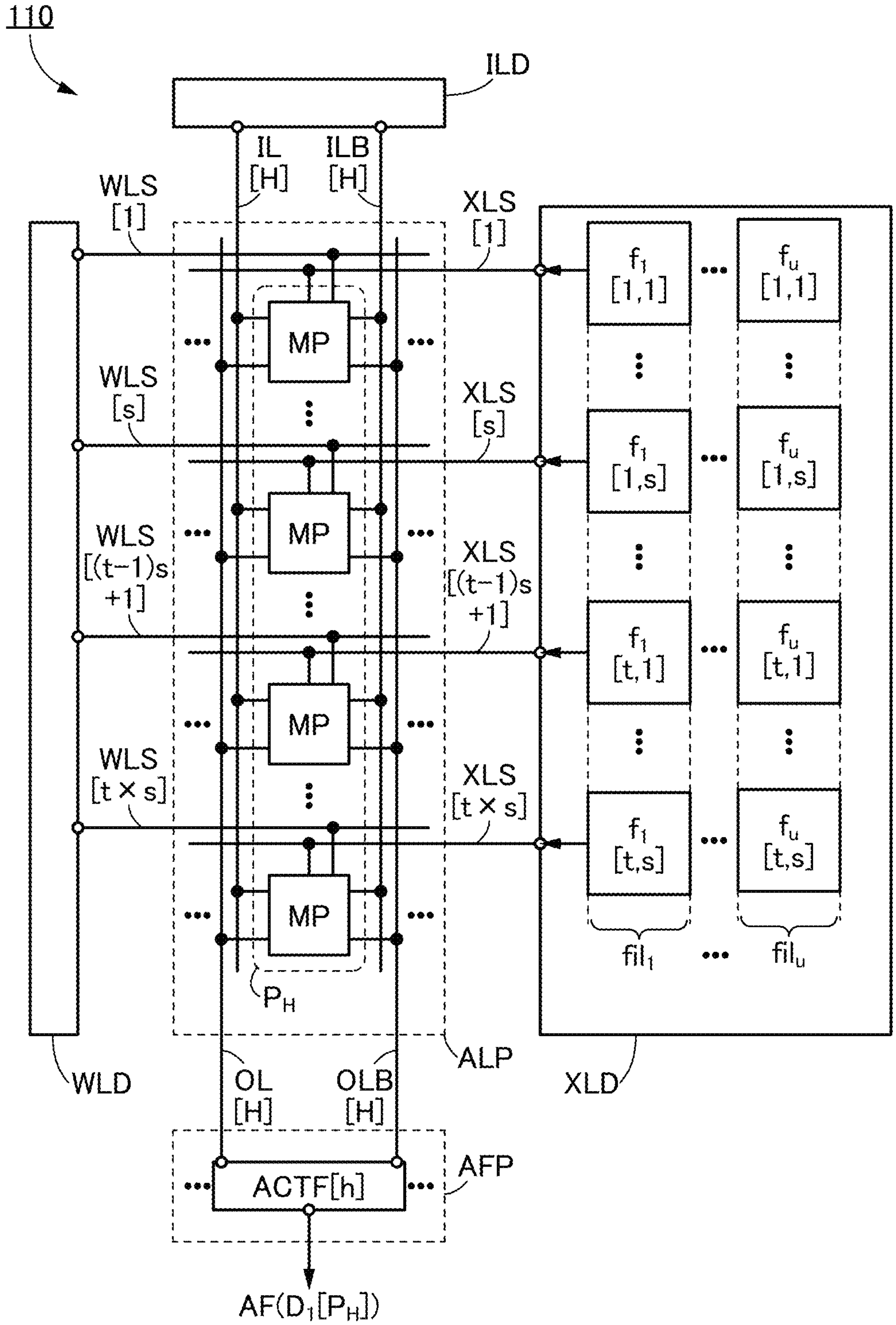
FIG. 74 is a block diagram illustrating an example of a semiconductor device that performs convolutional processing.

For example, the arithmetic circuit 110 illustrated in FIG. 74 is considered. In the arithmetic circuit 110 in FIG. 74, only the circuits MP in the H-th column in the array portion ALP in the arithmetic circuit 110 in FIG. 73 are shown. The arithmetic circuit 110 in FIG. 74 also shows the filter values that are included in the weight filters $fil_1$ to $fil_u$ and sequentially output from the circuit XLD.

For example, when first product-sum operation is performed, the circuit XLD outputs $f_1$[1,1] to $f_1$[t,s] as the filter values included in the weight filter $fil_1$ to the wiring XLS[1] to the wiring XLS[t×s], respectively. Thus, the arithmetic circuit 110 generates the data $D_1$[PH], which is the result of the product-sum operation of the filter $fil_1$ and the image data included in the pixel region PH, in the H-th column of the array portion ALP. At the same time, the data $D_1$[1,1], which is the result of the product-sum operation of the weight filter $fil_1$ and g[1,1] to g[t,s], is generated in the first column of the array portion ALP, and the data $D_1$[n−t+1,m−s+1], which is the result of the product-sum operation of the filter $fil_1$ and g[n−t+1,m−s+1] to g[n,m], is generated in the U-th column of the array portion ALP.

Then, when second product-sum operation is performed, the circuit XLD outputs $f_2$[1,1] to $f_2$[t,s] as the filter values included in the weight filter $fil_2$ (not illustrated) to the wiring XLS[1] to the wiring XLS[t×s], respectively. Thus, the arithmetic circuit 110 generates the data D2[PH], which is the result of the product-sum operation of the filter $fil_2$ and the image data included in the pixel region PH, in the H-th column of the array portion ALP. Similarly, the arithmetic circuit 110 generates the data D2[1,1], which is the result of the product-sum operation of the weight filter $fil_2$ and g[1,1] to g[t,s], in the first column of the array portion ALP, and the arithmetic circuit 110 generates the data D2[n−t+1,m−s+1], which is the result of the product-sum operation of the filter $fil_2$ and g[n−t+1,m−s+1] to g[n,m], in the U-th column of the array portion ALP.

That is, by changing the weight filter output from the circuit XLD every time one product-sum operation is performed, the results of the product-sum operations of different weight filters and the pixel region P[1,1] to the pixel region P[n−s+1,m−t+1] can be output. Here, by outputting the weight filters $fil_1$ to $fil_u$ sequentially from the circuit XLD, convolutional processing with the filter $fil_1$ to the filter $fil_u$ can be performed on the pixel region P[1,1] to the pixel region P[n−s+1,m−t+1]. Thus, the arithmetic circuit 110 generates the data $D_1$[1,1] to the data $D_u$[1,1], which are the results of the product-sum operation of the pixel region P[1,1] and the filter $fil_1$ to the filter $fil_u$, in the first column of the array portion ALP. Similarly, the arithmetic circuit 110 generates the data $D_1$[PH] to the data $D_u$[PH], which are the results of the product-sum operation of the pixel region PH and the filter $fil_1$ to the filter $fil_u$, in the H-th column of the array portion ALP, and generates the data $D_1$[n−s+1,m−t+1] to the data $D_u$[n−s+1,m−t+1], which are the results of the product-sum operation of the pixel region P[n−s+1,m−t+1] and the filter $fil_1$ to the filter $fil_u$, in the U-th column of the array portion ALP.

Accordingly, convolutional processing on g[1,1] to g[n, m] included in the image data can be performed, as in a manner similar to that of the processing illustrated in FIG. 69.

<Configuration Example of Semiconductor Device>

In the above operation example, the operation of performing convolutional processing using the arithmetic circuit 110 is described; convolutional processing on images can also be performed using the arithmetic circuit 120, the arithmetic circuit 130, the arithmetic circuit 140, the arithmetic circuit 150, the arithmetic circuit 160, and the arithmetic circuit 170.

In the above-described arithmetic circuit, the filter value of the weight filter (or image data) may be held in the circuit MP by the method of setting the amount of current flowing between the source and the drain of the transistor M1, which is described in Embodiment 1, the method using an SRAM or a NOSRAM described in Embodiment 2, or the like.

Arithmetic operation such as convolutional processing and a neural network can also be performed using a circuit other than the arithmetic circuits described in the above embodiments and the circuits MP included in the arithmetic circuits. Described here is a circuit that is other than the circuits discussed in the above embodiments and can perform arithmetic operation such as convolutional processing and a neural network.

Figure 75A:
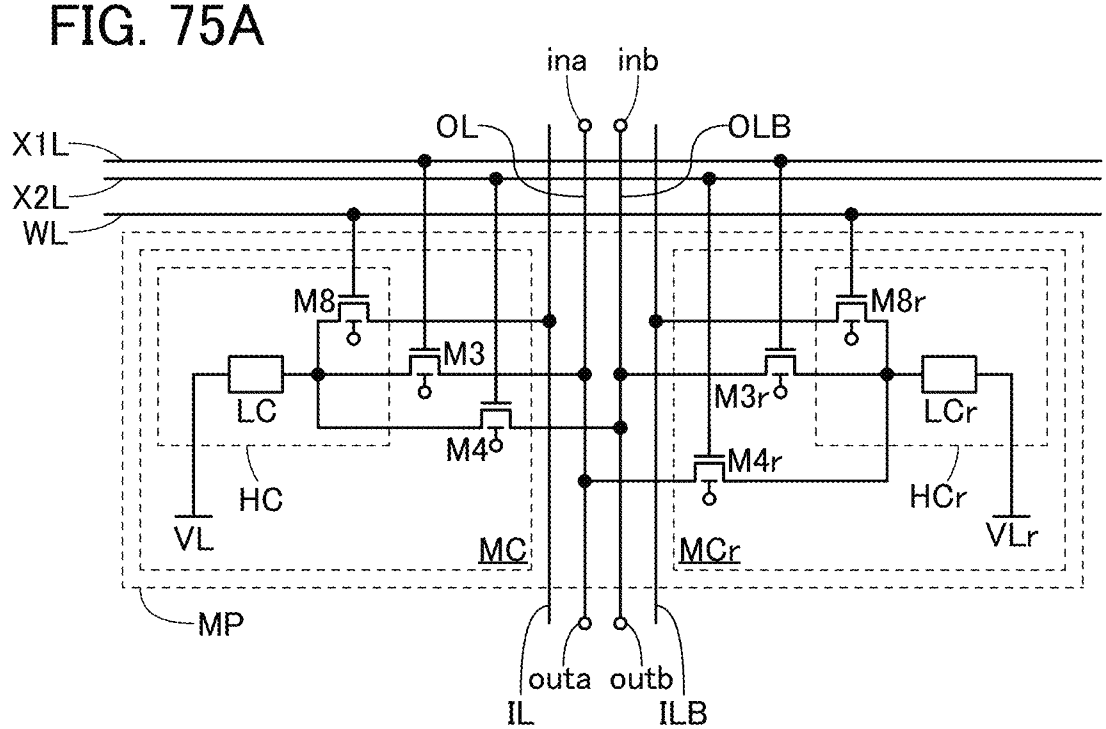
FIG. 75A and FIG. 75B are circuit diagrams each illustrating a configuration example of a circuit included in a semiconductor device.

FIG. 75A illustrates an example of a configuration of the circuit MP that is not described in the above embodiments. The circuit MP illustrated in FIG. 75A can hold the first data (a weight coefficient or a filter value of a weight filter (or image data)) like the other circuits MP. The circuit MP illustrated in FIG. 75A can be used as the circuits MP of the arithmetic circuits in FIG. 2 to FIG. 4 and FIG. 12, for example.

In the circuit MP in FIG. 75A, the circuit MC includes the circuit HC, the transistor M3, and the transistor M4. The circuit HC includes a load circuit LC and the transistor M8.

In the circuit MC of the circuit MP in FIG. 75A, a first terminal of the load circuit LC is electrically connected to the second terminal of the transistor M8, the first terminal of the transistor M3, and the first terminal of the transistor M4, and a second terminal of the load circuit LC is electrically connected to the wiring VL. The first terminal of the transistor M8 is electrically connected to the wiring IL, the second terminal of the transistor M3 is electrically connected to the wiring OL, and the second terminal of the transistor M4 is electrically connected to the wiring OLB. The gate of the transistor M8 is electrically connected to the wiring WL, the gate of the transistor M3 is electrically connected to the wiring X1L, and the gate of the transistor M4 is electrically connected to the wiring X2L.

The wiring X1L and the wiring X2L illustrated in FIG. 75A can be, for example, the wiring X1L[i] and the wiring X2L[i] of the arithmetic circuit 120 illustrated in FIG. 3. The wirings WL illustrated in FIG. 75A can be, for example, the wiring WLS[i] in the arithmetic circuit 120 illustrated in FIG. 3. The wiring IL and the wiring ILB illustrated in FIG. 75A can be, for example, the wiring IL[j] and the wiring IL[j] in the arithmetic circuit 120 illustrated in FIG. 3. The wiring OL and the wiring OLB illustrated in FIG. 75A can be, for example, the wiring OL[j] and the wiring OLB[j] in the arithmetic circuit 120 illustrated in FIG. 3.

The circuit MCr of the circuit MP in FIG. 75A has substantially the same circuit configuration as the circuit MC. Thus, "r" is added to the reference numerals of the circuit elements included in the circuit MCr to differentiate them from the circuit elements included in the circuit MC. In addition, the first terminal of the transistor M8*r* is electrically connected to the wiring ILB, the second terminal of the transistor M3*r* is electrically connected to the wiring OLB, and the second terminal of the transistor M4*r* is electrically connected to the wiring OL.

For the structures of the transistor M3, the transistor M4, the transistor M8, the transistor M3*r*, the transistor M4*r*, and the transistor M8*r*, the description of the transistor M3, the transistor M4, the transistor M8, the transistor M3r, the transistor M4r, and the transistor M8r, which is mentioned elsewhere, is referred to.

Here, the wiring VL and the wiring VLr each function as a wiring for supplying a constant voltage VCNS. VCNS can be, for example, aground potential (GND) or a low potential in a range where the load circuit LC and a load circuit LCr operate normally.

The load circuit LC and the load circuit LCr are each a circuit capable of changing a resistance between a first terminal and a second terminal, for example. By changing the resistance between the first terminal and the second terminal of each of the load circuit LC and the load circuit LCr, the amount of current flowing between the first terminal and the second terminal of each of the load circuit LC and the load circuit LCr can be changed.

Here, a method for changing the resistance between the first terminal and the second terminal of each of the load circuit LC and the load circuit LCr in the circuit MP in FIG. 75A is described. First, a low-level potential is input to the wiring X1L and the wiring X2L to turn off the transistor M3, the transistor M3r, the transistor M4, and the transistor M4r. Next, a high-level potential is input to the wiring WL to turn on the transistor M8 and the transistor M8r and the potential of the wiring IL (the wiring ILB) is changed, so that the resistance between the first terminal and the second terminal of the load circuit LC (the load circuit LCr) is set. For example, there is a method where a potential for resetting the resistance between the first terminal and the second terminal of the load circuit LC (the load circuit LCr) is input to the wiring IL (the wiring ILB), and then a potential at which the resistance between the first terminal and the second terminal of the load circuit LC (the load circuit LCr) is set to a desired value is input to the wiring IL (the wiring ILB). After the resistance between the first terminal and the second terminal of the load circuit LC (the load circuit LCr) is set to a desired value, a low-level potential is input to the wiring WL to turn off the transistor M8 and the transistor M8r.

Figure 76A:
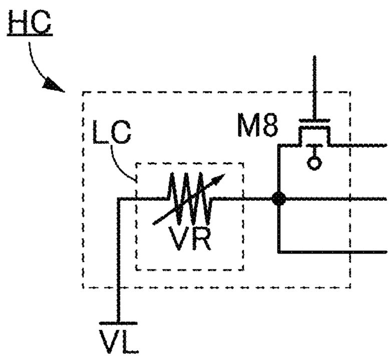
FIG. 76A to FIG. 76D are circuit diagrams each illustrating a configuration example of a circuit included in a semiconductor device.
Figure 76B:
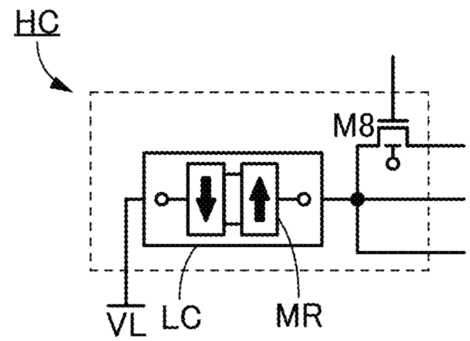
Figure 76C:
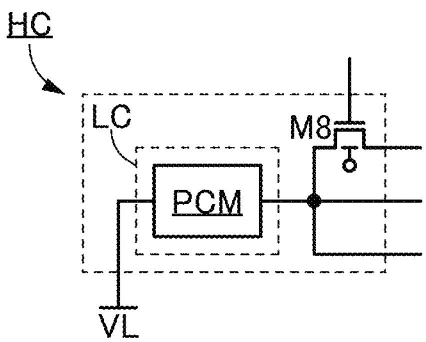

For example, as the load circuit LC and the load circuit LCr, a variable resistor VR included in an ReRAM (Resistive Random Access Memory) or the like can be used, as illustrated in FIG. 76A. As another example, the load circuit LC and the load circuit LCr can be the load circuit LC including an MTJ (Magnetic Tunnel Junction) element MR included in an MRAM (Magnetoresistive Random Access Memory) or the like, as illustrated in FIG. 76B. As another example, as the load circuit LC and the load circuit LCr, a resistor containing a phase-change material that is used for a phase-change memory (PCM) or the like (referred to as a phase-change memory PCM in this specification and the like for convenience) can be used, as illustrated in FIG. 76C.

Figure 76D:
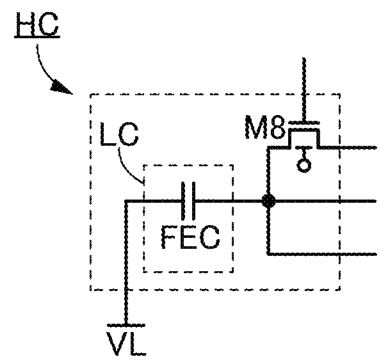

As another example, as the load circuit LC and the load circuit LCr, a ferroelectric capacitor FEC that is sandwiched between a pair of electrodes and used in an FeRAM (Ferroelectric Random Access Memory) or the like can be used, as illustrated in FIG. 76D. In FIG. 76D, a first terminal of the ferroelectric capacitor FEC is electrically connected to the wiring VL, and a second terminal of the ferroelectric capacitor FEC is electrically connected to the second terminal of the transistor M8, the first terminal of the transistor M3 (not illustrated in FIG. 76D but illustrated in FIG. 75A), and the first terminal of the transistor M4 (not illustrated in FIG. 76D but illustrated in FIG. 75A).

Note that in this case, the wiring VL functions not as a wiring for supplying a constant voltage but as a plate line for polarizing a ferroelectric film of the ferroelectric capacitor or inverting the polarization of the ferroelectric film.

To write the first data to the ferroelectric capacitor FEC, for example, writing is performed by turning on the transistor M8 to apply a voltage to the wiring IL and the wiring VL, thereby polarizing the ferroelectric film included in the ferroelectric capacitor FEC. To read the first data from the ferroelectric capacitor FEC, reading is performed by inputting a voltage corresponding to the second data to the wiring X1L and the wiring X2L to turn on or off the transistor M3 and the transistor M4 and then applying a pulse voltage to the wiring VL. In the ferroelectric capacitor FEC, whether the first data is “0” or “1” is determined depending on whether polarization inversion is caused by a pulse voltage from the wiring VL. When polarization inversion is caused in the ferroelectric film of the ferroelectric capacitor FEC, a current flows to the wiring OL through the transistor M3 or to the wiring OLB through the transistor M4. The amount of current flowing through the wiring OL and the wiring OLB can be obtained, for example, by using the circuit ACTF having a configuration of an integrator circuit (or a current-charge (IQ) converter circuit).

According to the above, with the use of the circuit MP in FIG. 75A, the result of the product of the first data and the second data can be output as the current amount to the wiring OL and the wiring OLB, in a manner similar to those of the circuits MP included in the arithmetic circuits described in the above embodiments. In addition, when a plurality of circuits MP are electrically connected to each other along the wiring OL and the wiring OLB as in the arithmetic circuits described in the above embodiments, the total sum of currents output from the plurality of circuits MP flows through the wiring OL and the wiring OLB. By obtaining the difference in the amount of current flowing through the wiring OL and the wiring OLB, the value of the product-sum of the first data held in the circuits MP and the second data input to the circuits MP can be calculated.

Figure 75B:
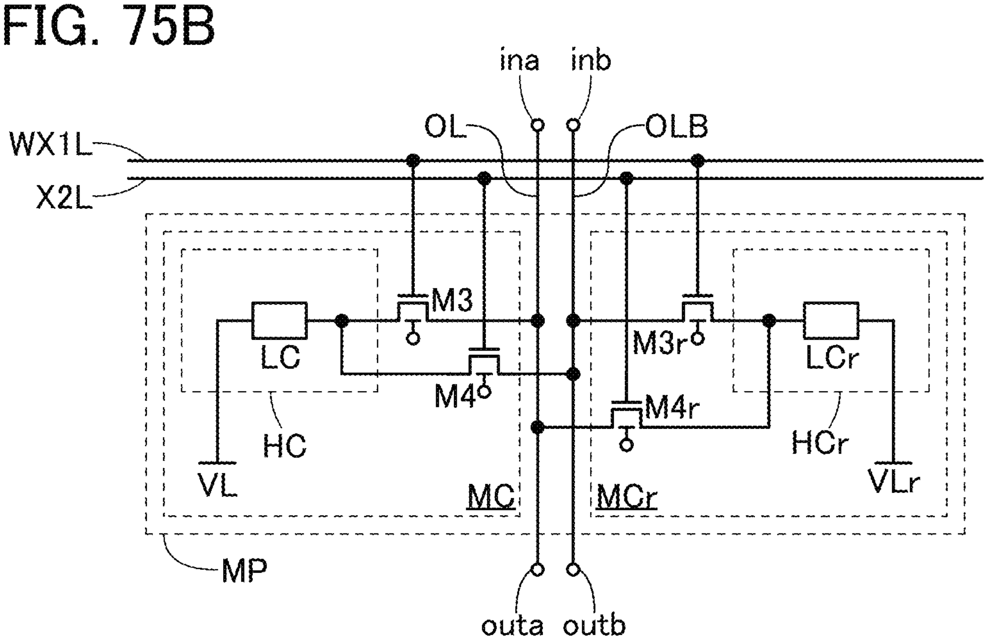

The circuit MP according to one embodiment of the present invention including the load circuit LC and the load circuit LCr is not limited to having the configuration illustrated in FIG. 75A, and the configuration of the circuit MP in FIG. 75A can be changed according to circumstances. As a modification example of the circuit MP in FIG. 75A, a circuit configuration in which the wiring IL, the wiring ILB, the transistor M8, and the transistor M8r are not provided in the circuit MP in FIG. 75A can be employed. FIG. 75B is a circuit diagram illustrating the circuit configuration, which can be used for the circuits MP of the arithmetic circuits illustrated in FIG. 7, FIG. 11, and FIG. 14, for example.

Note that this embodiment can be combined with any of the other embodiments in this specification as appropriate.

Embodiment 5

This embodiment describes structure examples of the semiconductor device described in the above embodiment and structure examples of transistors that can be used in the semiconductor device described in the above embodiment.

<Structure Example of Semiconductor Device>

Figure 77:
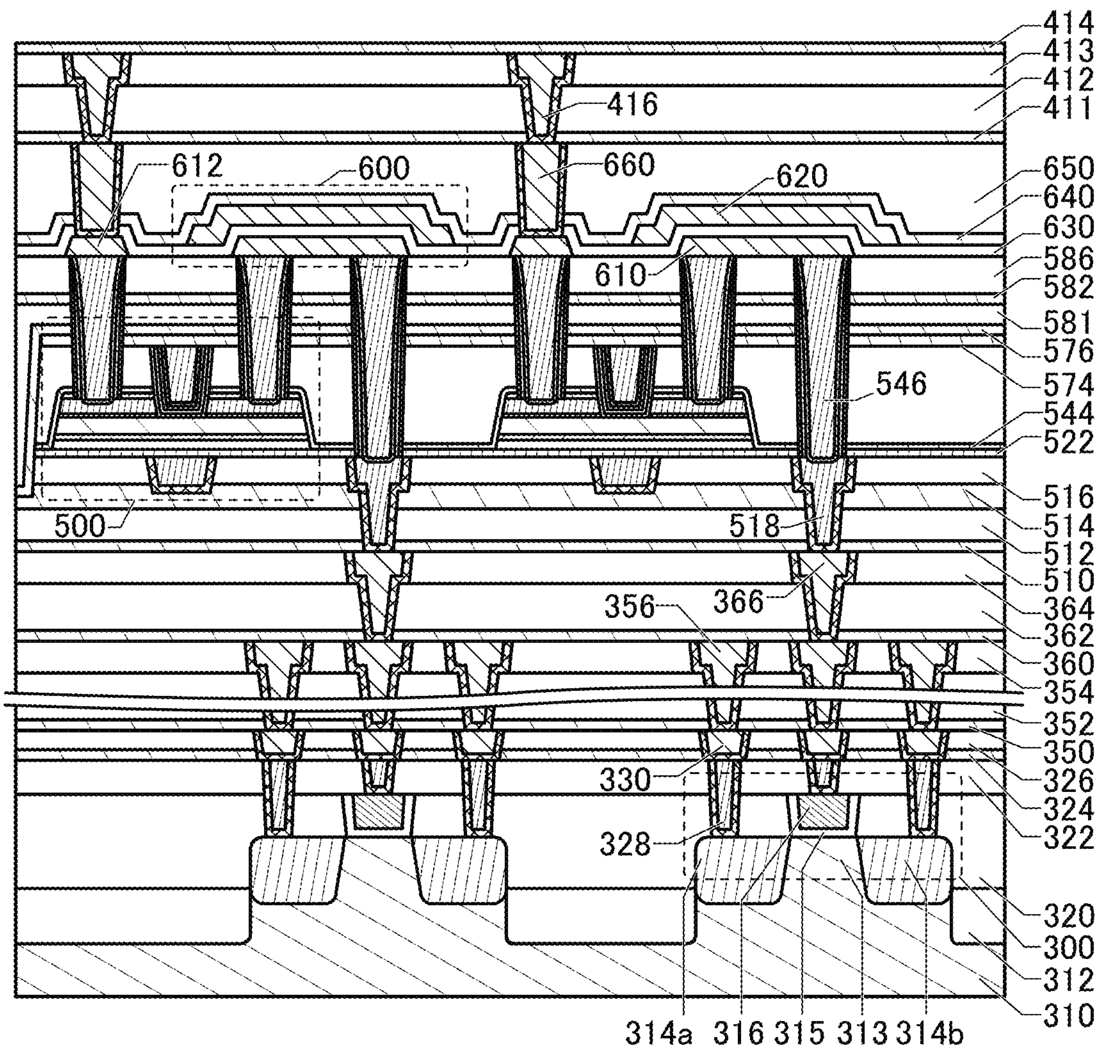
FIG. 77 is a schematic cross-sectional view illustrating a structure example of a semiconductor device.
Figure 78A:
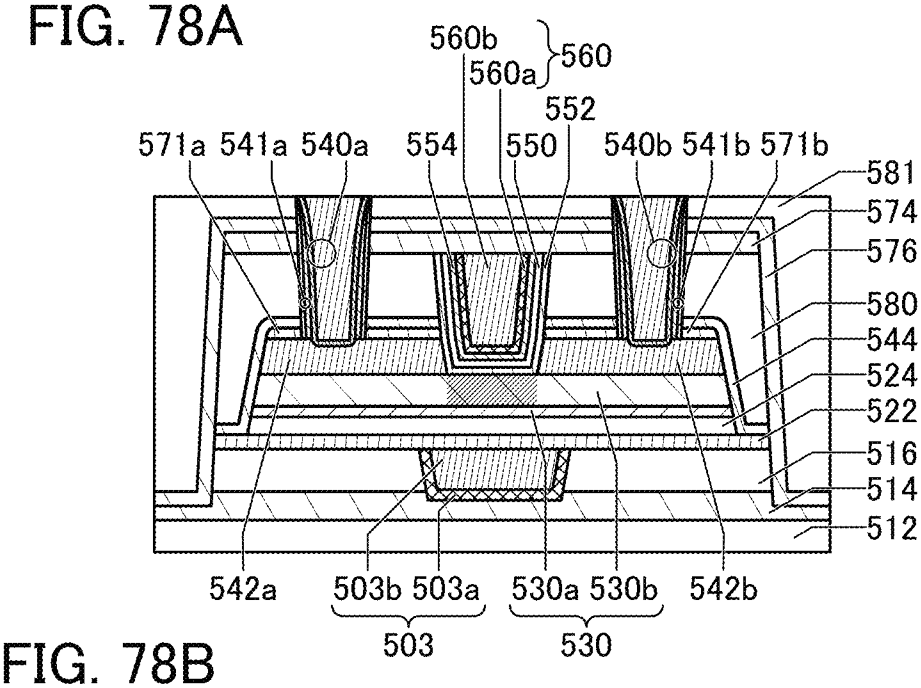
FIG. 78A to FIG. 78C are schematic cross-sectional views each illustrating a structure example of a transistor.
Figure 78B:
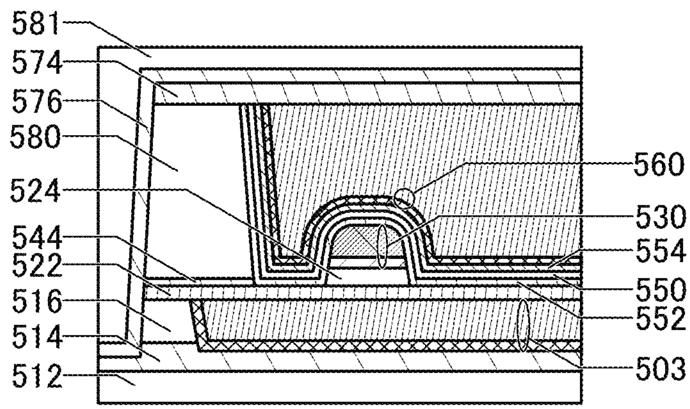
Figure 78C:
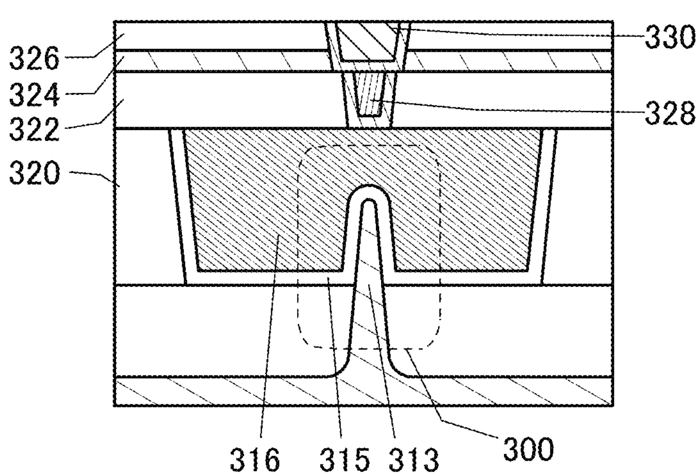

FIG. 77 illustrates an example of the semiconductor device described in the above embodiment, and the semiconductor device includes a transistor 300, a transistor 500, and a capacitor 600. FIG. 78A is a cross-sectional view of the transistor 500 in the channel length direction, FIG. 78B is a cross-sectional view of the transistor 500 in the channel width direction, and FIG. 78C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a transistor included in a semiconductor device, for example, the arithmetic circuit 110, the arithmetic circuit 120, the arithmetic circuit 130, the arithmetic circuit 140, the arithmetic circuit 150, the arithmetic circuit 160, the arithmetic circuit 170, or the like described in the above embodiments, whereby a semiconductor device whose operating performance is less likely to degrade even at high temperatures can be obtained. In particular, when the transistor 500 is used as the transistor M2, the transistor M7, the transistor M8, and the transistor M9, for example, to utilize the feature of low off-state current, potentials written to the circuit HC, the circuit HCS, and the like can be held for a long time.

The transistor 500 is provided above the transistor 300, and the capacitor 600 is provided above the transistor 300 and the transistor 500, for example. Note that the capacitor 600 can be the capacitor included in the arithmetic circuit 110, the arithmetic circuit 120, the arithmetic circuit 130, the arithmetic circuit 140, the arithmetic circuit 150, the arithmetic circuit 160, the arithmetic circuit 170, and the like that are described in the above embodiments. Note that depending on a circuit configuration, the capacitor 600 illustrated in FIG. 77 is not necessarily provided.

The transistor 300 is provided on a substrate 310 and includes an element isolation layer 312, a conductor 316, an insulator 315, a semiconductor region 313 that is part of the substrate 310, and a low-resistance region 314*a* and a low-resistance region 314*b* functioning as a source region and a drain region. Note that the transistor 300 can be used as, for example, the transistor included in the arithmetic circuit 110, the arithmetic circuit 120, the arithmetic circuit 130, the arithmetic circuit 140, the arithmetic circuit 150, the arithmetic circuit 160, the arithmetic circuit 170, and the like described in the above embodiments. Specifically, the transistor 300 can be, for example, the transistor included in the comparator CMPa, the comparator CMPb, the operational amplifier OPa, and the operational amplifier OPb included in the circuits ACTF illustrated in FIG. 5A to FIG. 5E and FIG. 6A to FIG. 6E. Note that FIG. 77 illustrates a structure in which a gate of the transistor 300 is electrically connected to one of a source and a drain of the transistor 500 through a pair of electrodes of the capacitor 600; however, depending on the configurations of the arithmetic circuit 110, the arithmetic circuit 120, the arithmetic circuit 130, the arithmetic circuit 140, the arithmetic circuit 150, the arithmetic circuit 160, the arithmetic circuit 170, and the like, a structure in which one of a source and a drain of the transistor 300 is electrically connected to one of the source and the drain of the transistor 500 through the pair of electrodes of the capacitor 600 may be employed, a structure in which one of the source and the drain of the transistor 300 is electrically connected to a gate of the transistor 500 through the pair of electrodes of the capacitor 600 may be employed, or a structure in which the terminals of the transistor 300 are not electrically connected to the terminals of the transistor 500 and the terminals of the capacitor 600 may be employed.

A semiconductor substrate (e.g., a single crystal substrate or a silicon substrate) is preferably used as the substrate 310.

As illustrated in FIG. 78C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 79:
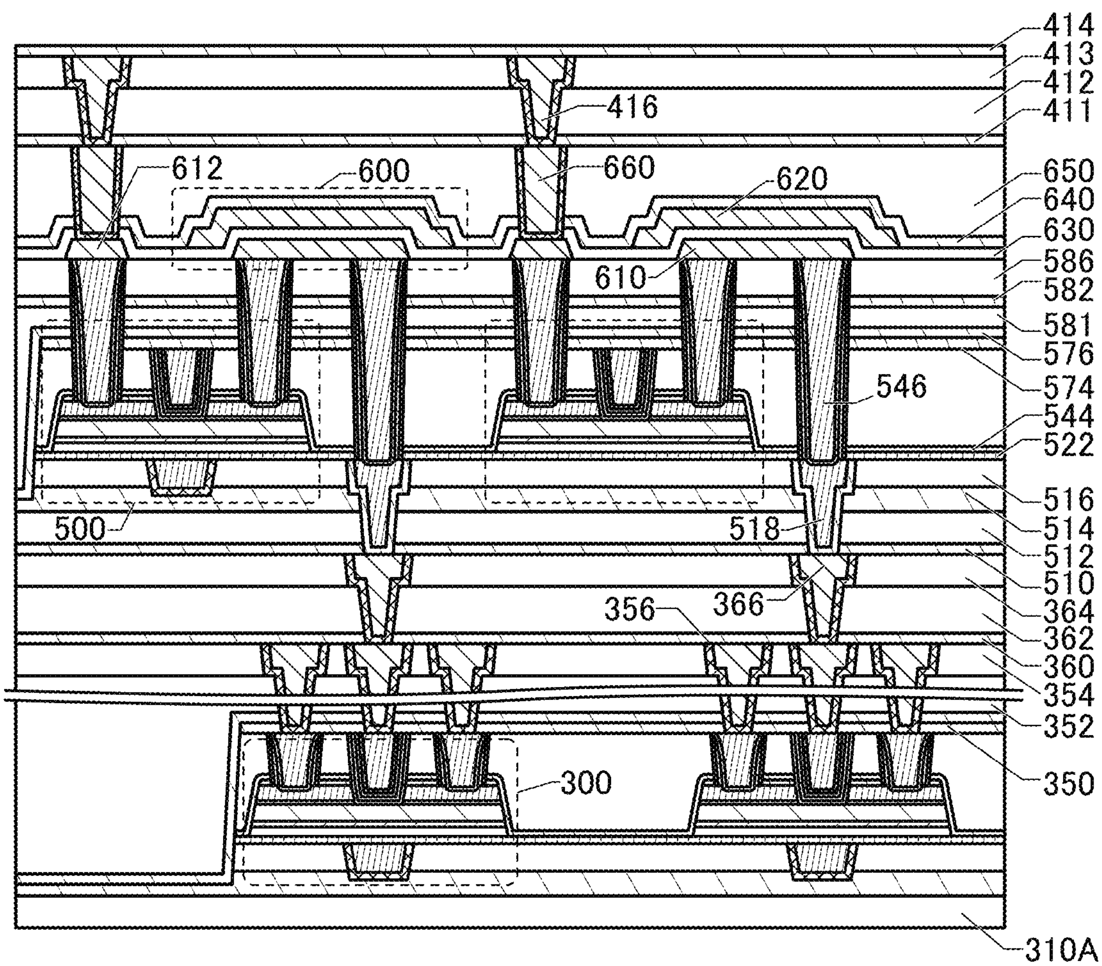
FIG. 79 is a schematic cross-sectional view illustrating a structure example of a semiconductor device.

Note that the transistor 300 illustrated in FIG. 77 is an example and the structure is not limited thereto; an appropriate transistor is used in accordance with a circuit configuration, a driving method, or the like. For example, the transistor 300 may have a planar structure instead of a FIN-type structure illustrated in FIG. 78C. For example, when a semiconductor device is configured as a single-polarity circuit using only OS transistors, the transistor 300 can have a structure similar to that of the transistor 500 using an oxide semiconductor, as illustrated in FIG. 79. Note that the details of the transistor 500 will be described later.

Note that in FIG. 79, the transistor 300 is provided over a substrate 310A; in this case, a semiconductor substrate may be used as the substrate 310A as in the case of the substrate 310 in the semiconductor device in FIG. 77. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. The examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 in FIG. 77, an insulator 320, an insulator 322, an insulator 324, and an insulator 326 are stacked in this order over the substrate 310.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, atop surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 77, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is embedded to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance having a barrier property against oxygen, hydrogen, or the like is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503 illustrated in FIG. 78A and FIG. 78B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 78A and FIG. 78B, the transistor 500 includes the insulator 516 over the insulator 514, the conductor 503 (a conductor 503*a* and a conductor 503*b*) positioned to be embedded in the insulator 514 or the insulator 516, an insulator 522 over the insulator 516 and the conductor 503, an insulator 524 over the insulator 522, an oxide 530*a* over the insulator 524, an oxide 530*b* over the oxide 530*a*, a conductor 542*a* over the oxide 530*b*, an insulator 571*a* over the conductor 542*a*, a conductor 542*b* over the oxide 530*b*, an insulator 571*b* over the conductor 542*b*, an insulator 552 over the oxide 530*b*, an insulator 550 over the insulator 552, an insulator 554 over the insulator 550, a conductor 560 (a conductor 560*a* and a conductor 560*b*) that is positioned over the insulator 554 and overlaps with part of the oxide 530*b*, and an insulator 544 positioned over the insulator 522, the insulator 524, the oxide 530*a*, the oxide 530*b*, the conductor 542*a*, the conductor 542*b*, the insulator 571*a*, and insulator 571*b*. Here, as illustrated in FIG. 78A and FIG. 78B, the insulator 552 is in contact with the top surface of the insulator 522, the side surface of the insulator 524, the side surface of the oxide 530*a*, the side surface and the top surface of the oxide 530*b*, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530*b* is provided in the insulator 580 and the insulator 544. The insulator 552, the insulator 550, the insulator 554, and the conductor 560 are positioned in the opening. The conductor 560, the insulator 552, the insulator 550, and the insulator 554 are provided between the conductor 542*a* and the conductor 542*b* and between the insulator 571*a* and the insulator 571*b* in the channel length direction of the transistor 500. The insulator 554 includes a region in contact with the side surface of the conductor 560 and a region in contact with the bottom surface of the conductor 560.

The oxide 530 preferably includes the oxide 530*a* placed over the insulator 524 and the oxide 530*b* placed over the oxide 530*a*. Including the oxide 530*a* under the oxide 530*b* makes it possible to inhibit diffusion of impurities into the oxide 530*b* from the components formed below the oxide 530*a*.

Although a structure in which two layers, the oxide 530*a* and the oxide 530*b*, are stacked as the oxide 530 in the transistor 500 is described, the present invention is not limited thereto. For example, the oxide 530 may be provided as a single layer of the oxide 530*b* or to have a stacked-layer structure of three or more layers, or the oxide 530*a* and the oxide 530*b* may each have a stacked-layer structure.

The conductor 560 functions as a first gate (also referred to as top gate) electrode, and the conductor 503 functions as a second gate (also referred to as back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542*a* functions as one of a source and a drain, and the conductor 542*b* functions as the other of the source and the drain. At least part of a region of the oxide 530 that overlaps with the conductor 560 functions as a channel formation region.

Figure 80A:
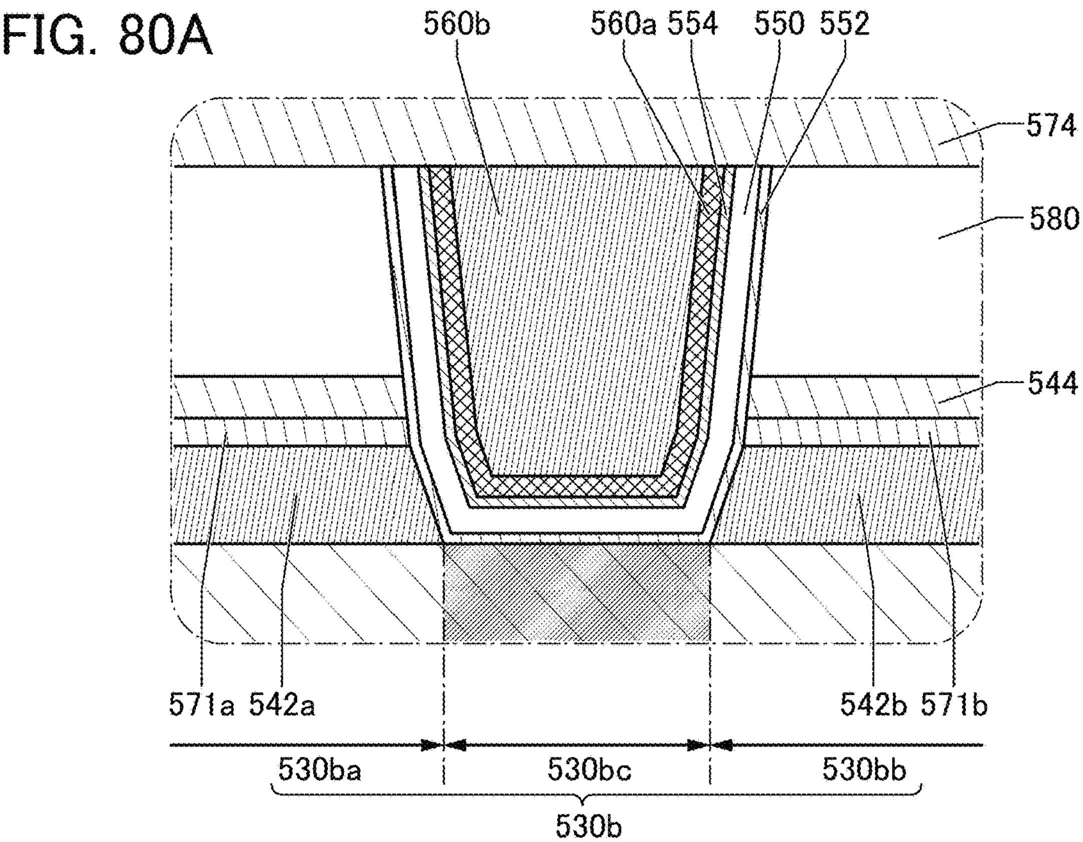
FIG. 80A and FIG. 80B are schematic cross-sectional views each illustrating a structure example of a transistor.

Here, FIG. 80A is an enlarged view of the vicinity of the channel formation region in FIG. 78A. Supply of oxygen to the oxide 530*b* forms the channel formation region in a region between the conductor 542*a* and the conductor 542*b*. Accordingly, as illustrated in FIG. 80A, the oxide 530*b* includes a region 530*bc* functioning as the channel formation region of the transistor 500 and a region 530*ba* and a region 530*bb* that are provided to sandwich the region 530*bc* and function as a source region and a drain region. At least part of the region 530*bc* overlaps with the conductor 560. In other words, the region 530*bc* is provided in the region between the conductor 542*a* and the conductor 542*b*. The region 530*ba* is provided to overlap with the conductor 542*a*, and the region 530*bb* is provided to overlap with the conductor 542*b*.

The region 530*bc* functioning as the channel formation region has a smaller amount of oxygen vacancies (an oxygen vacancy in a metal oxide is sometimes referred to as $V_O$ in this specification and the like) or a lower impurity concentration than the region 530*ba* and the region 530*bb* to be a high-resistance region having a low carrier concentration. Thus, the region 530*bc* can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530*ba* and the region 530*bb* functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530*ba* and the region 530*bb* are each an n-type region having a higher carrier concentration and a lower resistance than the region 530*bc*.

The carrier concentration in the region 530*bc* functioning as the channel formation region is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. Note that the lower limit of the carrier concentration in the region 530*bc* functioning as the channel formation region is not particularly limited and can be, for example, $1\times10^{-9}$ $cm^{-3}$.

Between the region 530*bc* and the region 530*ba* or the region 530*bb*, a region having a carrier concentration that is lower than or substantially equal to the carrier concentrations in the region 530*ba* and the region 530*bb* and higher than or substantially equal to the carrier concentration in the region 530*bc* may be formed. That is, the region functions as a junction region between the region 530*bc* and the region 530*ba* or the region 530*bb*. The hydrogen concentration in the junction region is lower than or substantially equal to the hydrogen concentrations in the region 530*ba* and the region 530*bb* and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 80A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530*a* and the oxide 530*b*) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element Min the metal oxide used as the oxide 530*b* is preferably greater than the atomic ratio of In to the element M in the metal oxide used as the oxide 530*a*.

The oxide 530*a* is provided under the oxide 530*b* in the above manner, whereby impurities and oxygen can be inhibited from diffusing into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

The oxide 530*b* preferably exhibits crystallinity. It is particularly preferable to use a CAAC-OS (c-axis aligned crystalline oxide semiconductor) as the oxide 530*b*.

The CAAC-OS is a metal oxide having a dense structure with high crystallinity and a small amount of impurities and defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Hence, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters ($V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of i-type (intrinsic) or substantially i-type.

As a countermeasure to the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and $V_OH$ in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and $V_OH$ in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can be irradiated with the high-frequency wave such as a microwave or RF. By the effect of the plasma, a microwave, or the like, $V_OH$ in the region 530*bc* can be cut; thus, hydrogen H can be removed from the region 530*bc* and an oxygen vacancy $V_O$ can be filled with oxygen. That is, the reaction "$V_OH \rightarrow H+V_O$" occurs in the region 530*bc*, so that the hydrogen concentration in the region 530*bc* can be reduced. As a result, oxygen vacancies and $V_OH$ in the region 530*bc* can be reduced to lower the carrier concentration.

In the microwave treatment in an oxygen-containing atmosphere, the high-frequency wave such as the microwave or RF, the oxygen plasma, or the like is blocked by the conductor 542*a* and the conductor 542*b* and does not affect the region 530*ba* nor the region 530*bb*. In addition, the effect of the oxygen plasma can be reduced by the insulator 571 and the insulator 580 that are provided to cover the oxide 530*b* and the conductor 542. Hence, a reduction in $V_OH$ and supply of an excess amount of oxygen do not occur in the region 530*ba* and the region 530*bb* in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530*bc*. In addition, the insulator 552 is provided to be in contact with the side surface of the conductor 542 and the surface of the region 530*bc*, thereby preventing oxygen more than necessary from being supplied to the region 530*bc* and preventing the side surface of the conductor 542 from being oxidized. Furthermore, the side surface of the conductor 542 can be inhibited from being oxidized when an insulating film to be the insulator 550 is formed.

The oxygen supplied into the region 530*bc* has any of a variety of forms such as an oxygen atom, an oxygen molecule, and an oxygen radical (also referred to as O radical which is an atom, a molecule, or an ion having an unpaired electron). Note that the oxygen supplied into the region 530*bc* preferably has any one or more of the above forms, and is particularly preferably an oxygen radical. In such a case, the film quality of the insulator 552 and the insulator 550 can be improved, leading to higher reliability of the transistor 500.

In the above manner, oxygen vacancies and $V_OH$ can be selectively removed from the region 530*bc* in the oxide semiconductor, whereby the region 530*bc* can be an i-type or substantially i-type region. Furthermore, supply of an excess amount of oxygen to the region 530*ba* and the region 530*bb* functioning as the source region and the drain region can be inhibited, and the n-type conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can be provided. A semiconductor device having favorable electrical characteristics can be provided.

As illustrated in FIG. 78B, a curved surface may be provided between the side surface of the oxide 530*b* and the top surface of the oxide 530*b* in a cross-sectional view of the transistor 500 in the channel width direction. In other words, an end portion of the side surface and an end portion of the top surface may be curved (hereinafter also referred to as rounded).

The radius of curvature of the curved surface is preferably greater than 0 nm and less than the thickness of the oxide 530*b* in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530*b* with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530*a* is preferably higher than the atomic ratio of the element M to a metal element that is a main component of the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element Min the metal oxide used as the oxide 530*b* is preferably higher than the atomic ratio of In to the element Min the metal oxide used as the oxide 530*a*.

The oxide 530*b* is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530*b* by the source electrode or the drain electrode. This can reduce extraction of oxygen from the oxide 530*b* even when heat treatment is performed; hence, the transistor 500 is stable against high temperatures in the manufacturing process (what is called thermal budget).

Here, the conduction band minimum gradually changes at a junction portion of the oxide 530*a* and the oxide 530*b*. In other words, the conduction band minimum at the junction portion of the oxide 530*a* and the oxide 530*b* continuously changes or is continuously connected. To achieve this, the density of defect states in a mixed layer formed at the interface between the oxide 530*a* and the oxide 530*b* is preferably made low.

Specifically, when the oxide 530*a* and the oxide 530*b* include the same element as a main component in addition to oxygen, a mixed layer with a low density of defect states can be formed. For example, in the case where the oxide 530*b* is an In-M-Zn oxide, an In-M-Zn oxide, an M-Zn oxide, an oxide of the element M, an In—Zn oxide, indium oxide, or the like may be used as the oxide 530*a*.

Specifically, as the oxide 530*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530*b*, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 78A or the like, the insulator 552 formed using aluminum oxide or the like is provided in contact with the top and side surfaces of the oxide 530, whereby indium contained in the oxide 530 is unevenly distributed in some cases at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530*b*, can increase the field-effect mobility of the transistor 500.

When the oxide 530*a* and the oxide 530*b* have the above structure, the density of defect states at the interface between the oxide 530*a* and the oxide 530*b* can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as a function of less easily transmitting the substance). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In such a case, impurities such as water and hydrogen can be inhibited from diffusing to the transistor 500 side from the substrate side through the insulator 512 and the insulator 514. Alternatively, impurities such as water and hydrogen can be inhibited from diffusing to the transistor 500 side from an interlayer insulating film and the like that are positioned on the outer side compared to the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device that have favorable characteristics and high reliability can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ Ωcm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1\times10^{10}$ Ωcm and lower than or equal to $1\times10^{15}$ Ωcm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is positioned to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor **503*a* and the conductor 503*b*. The conductor 503*a* is provided in contact with a bottom surface and a sidewall of the opening. The conductor 503*b* is provided to be embedded in a recessed portion formed in the conductor 503*a*. Here, the upper portion of the conductor 503*b* is substantially level with the upper portion of the conductor 503*a* and the upper portion of the insulator 516**.

Here, for the conductor **503*a***, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material that has a function of inhibiting the diffusion of oxygen (e.g., at least one of an oxygen atom, an oxygen molecule, and the like).

When the conductor **503*a* is formed using a conductive material having a function of inhibiting diffusion of hydrogen, impurities such as hydrogen contained in the conductor 503*b* can be prevented from diffusing into the oxide 530 through the insulator 524 and the like. When the conductor 503*a* is formed using a conductive material having a function of inhibiting diffusion of oxygen, the conductivity of the conductor 503*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 503*a* is a single layer or stacked layers of the above conductive materials. For example, tungsten is used for the conductor 503*a***.

Moreover, the conductor 503*b* is preferably formed using a conductive material containing tungsten, copper, or aluminum as its main component. For example, tungsten is used for the conductor 503*b*.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, a drain current at the time when a potential applied to the conductor 560 is 0 V can be lower in the case where a negative potential is applied to the conductor 503 than in the case where the negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542*a* or the conductor 542*b*. As illustrated in FIG. 78B, it is particularly preferable that the conductor 503 extend to a region outside end portions of the oxide 530*a* and the oxide 530*b* in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 78B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503*a* and the conductor 503*b* is illustrated, the present invention is not limited thereto. For example, the conductor 503 may be provided as a single layer or to have a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in at least one of the insulator 524 and the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as leakage current may arise because of a thinner gate insulator. When a high-k material is used for an insulator functioning as the gate insulator, a gate potential at the time when the transistor operates can be lowered while the physical thickness is maintained. In some cases, a substance with a high permittivity, such as lead zirconate titanate (PZT), strontium titanate ($SrTiO_3$), or $(Ba,Sr)TiO_3$ (BST), can be used for the insulator 522.

Silicon oxide or silicon oxynitride, for example, can be used as appropriate for the insulator 524 that is in contact with the oxide 530.

In a manufacturing process of the transistor 500, heat treatment is preferably performed with the surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O$+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530*a*. In this case, the insulator 544 is in contact with the side surface of the insulator 524 and the top surface of the insulator 522.

The conductor 542*a* and the conductor 542*b* are provided in contact with the top surface of the oxide 530*b*. The conductor 542*a* and the conductor 542*b* function as a source electrode and a drain electrode of the transistor 500.

For the conductor 542 (the conductor 542*a* and the conductor 542*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530*b* or the like diffuses into the conductor 542*a* or the conductor 542*b* in some cases. In particular, when a nitride containing tantalum is used for the conductor 542*a* and the conductor 542*b*, hydrogen contained in the oxide 530*b* or the like is likely to diffuse into the conductor 542*a* or the conductor 542*b*, and the diffused hydrogen is bonded to nitrogen contained in the conductor 542*a* or the conductor 542*b* in some cases. That is, hydrogen contained in the oxide 530*b* or the like is absorbed by the conductor 542*a* or the conductor 542*b* in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571*a* is provided in contact with the top surface of the conductor 542*a*, and the insulator 571*b* is provided in contact with the top surface of the conductor 542*b*. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon, such as silicon nitride, may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure for the insulator 571 because hydrogen can be captured or fixed more effectively in some cases. Accordingly, the transistor 500 and a semiconductor device that have favorable characteristics and high reliability can be manufactured.

The insulator 544 is provided to cover the insulator 524, the oxide 530*a*, the oxide 530*b*, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of a gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 78B, the insulator 552 is provided in contact with the top surface and the side surface of the oxide 530*b*, the side surface of the oxide 530*a*, the side surface of the insulator 524, and the top surface of the insulator 522. That is, the regions of the oxide 530*a*, the oxide 530*b*, and the insulator 524 that overlap with the conductor 560 are covered with the insulator 552 in the cross section in the channel width direction. With this structure, the insulator 552 having a barrier property against oxygen can prevent release of oxygen from the oxide 530*a* and the oxide 530*b* at the time of heat treatment or the like. This can inhibit formation of oxygen vacancies ($V_O$) in the oxide 530*a* and the oxide 530*b*. Therefore, oxygen vacancies ($V_O$) and $V_OH$ formed in the region 530*bc* can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530*a* and the oxide 530*b*. Thus, the region 530*ba* and the region **530*bb* are prevented from being excessively oxidized by oxygen through the region 530*bc*; a reduction in on-state current or field-effect mobility of the transistor 500** can be inhibited.

As illustrated in FIG. 78A, the insulator 552 is provided in contact with the side surfaces of the conductor 542, the insulator 571, and the insulator 580. This can inhibit formation of an oxide film on the side surface of the conductor 542 by oxidation of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that any of the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15.0 nm or less than or equal to 20 nm. Note that any of the above-described lower limits and upper limits can be combined with each other. In that case, at least part of the insulator 550 includes a region having the above-described thickness.

Although FIG. 78A, FIG. 78B, and the like illustrate a single-layer structure of the insulator 550, the present invention is not limited to this structure, and a stacked-layer structure of two or more layers may be employed. For example, as illustrated in FIG. 80B, the insulator 550 may have a stacked-layer structure including two layers of an insulator **550*a* and an insulator 550*b* over the insulator 550*a***.

Figure 80B:
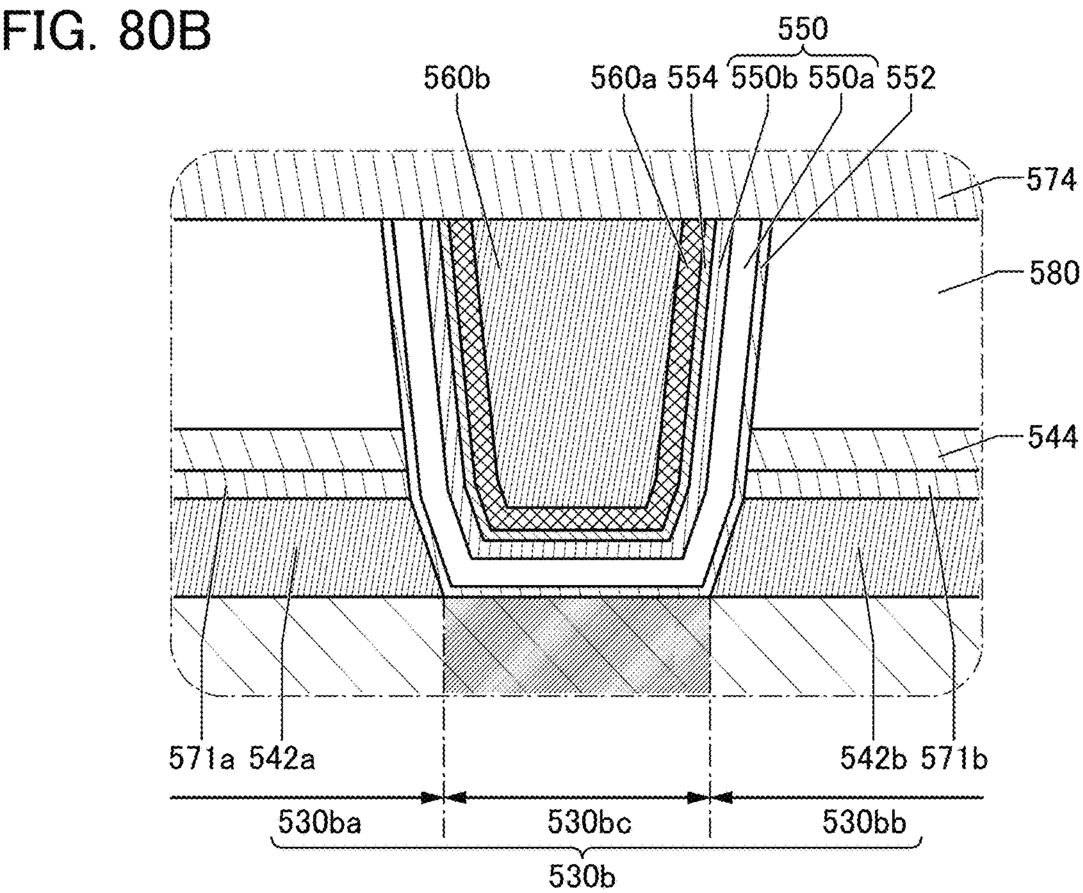

In the case where the insulator 550 has a stacked-layer structure of two layers as illustrated in FIG. 80B, it is preferable that the insulator **550*a* in a lower layer be formed using an insulator that is likely to transmit oxygen and the insulator 550*b* in an upper layer be formed using an insulator having a function of inhibiting oxygen diffusion. With such a structure, oxygen contained in the insulator 550*a* can be inhibited from diffusing into the conductor 560. That is, a reduction in the amount of oxygen supplied to the oxide 530 can be inhibited. In addition, oxidation of the conductor 560 due to oxygen contained in the insulator 550*a* can be inhibited. For example, it is preferable that the insulator 550*a* be provided using any of the above-described materials that can be used for the insulator 550 and the insulator 550*b* be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550*b*. In this case, the insulator 550*b* is an insulator containing at least oxygen and hafnium. The thickness of the insulator 550*b* is preferably greater than or equal to 0.5 nm or greater than or equal to 1.0 nm, and less than or equal to 3.0 nm or less than or equal to 5.0 nm. Note that any of the above-described lower limits and upper limits can be combined with each other. In that case, at least part of the insulator 550*b*** includes a region having the above-described thickness.

In the case where silicon oxide, silicon oxynitride, or the like is used for the insulator **550*a*, the insulator 550*b* may be formed using an insulating material that is a high-k material having a high dielectric constant. The gate insulator having a stacked-layer structure of the insulator 550*a* and the insulator 550*b* can be thermally stable and can have a high dielectric constant. Thus, a gate potential that is applied during the operation of the transistor can be lowered while the physical thickness of the gate insulator is maintained. In addition, the equivalent oxide thickness (EOT) of the insulator functioning as the gate insulator can be reduced. Therefore, the withstand voltage of the insulator 550** can be increased.

The insulator 554 functions as part of the gate insulator. As the insulator 554, a barrier insulating film against hydrogen is preferably used. This can prevent diffusion of impurities such as hydrogen contained in the conductor 560 into the insulator 550 and the oxide **530*b*. As the insulator 554, an insulator that can be used as the insulator 576 described above may be used. For example, silicon nitride deposited by a PEALD method may be used as the insulator 554. In this case, the insulator 554** is an insulator containing at least nitrogen and silicon.

The insulator 554 may have a barrier property against oxygen. Thus, diffusion of oxygen contained in the insulator 550 into the conductor 560 can be inhibited.

The insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that any of the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560*a* and the conductor 560*b* provided over the conductor 560*a*. For example, the conductor 560*a* is preferably provided to cover the bottom surface and the side surface of the conductor 560*b*. As illustrated in FIG. 78A and FIG. 78B, the upper portion of the conductor 560 is substantially level with the upper portion of the insulator 550. Note that although the conductor 560 has a two-layer structure of the conductor 560*a* and the conductor 560*b* in FIG. 78A and FIG. 78B, the conductor 560 may have a single-layer structure or a stacked-layer structure of three or more layers.

For the conductor 560*a*, it is preferable to use a conductive material that has a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material that has a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus a conductor having high conductivity is preferably used for the conductor 560. For example, a conductive material containing tungsten, copper, or aluminum as its main component can be used for the conductor 560*b*. Moreover, the conductor 560*b* may have a stacked-layer structure, for example, a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542*a* and the conductor 542*b* without alignment.

As illustrated in FIG. 78B, in the channel width direction of the transistor 500, with reference to the bottom surface of the insulator 522, the level of the bottom surface of the conductor 560 in a region where the conductor 560 and the oxide 530*b* do not overlap with each other is preferably lower than the level of the bottom surface of the oxide 530*b*. When the conductor 560 functioning as the gate electrode covers the side surface and the top surface of the channel formation region of the oxide 530*b* with the insulator 550 and the like therebetween, the electric field of the conductor 560 can easily act on the entire channel formation region of the oxide 530*b*. Thus, the on-state current of the transistor 500 can be increased and the frequency characteristics of the transistor 500 can be improved. The difference between the level of the bottom surface of the conductor 560 in a region where the oxide 530*a* and the oxide 530*b* do not overlap with the conductor 560 and the level of the bottom surface of the oxide 530*b*, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that any of the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device that have favorable characteristics and high reliability can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon, such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540*a* serving as a plug, and the other of the first terminal and the second terminal of the transistor 500 is electrically connected to a conductor 540*b*. Note that in this specification and the like, the conductor 540*a* and the conductor 540*b* are collectively referred to as the conductor 540.

The conductor 540*a* is provided in a region overlapping with the conductor 542*a*, for example. Specifically, an opening portion is formed in the insulator 571, the insulator 544, the insulator 580, the insulator 574, the insulator 576, and the insulator 581 illustrated in FIG. 78A and in an insulator 582 and an insulator 586 illustrated in FIG. 77 in the region overlapping with the conductor 542*a*, and the conductor 540*a* is provided inside the opening portion. The conductor 540*b* is provided in a region overlapping with the conductor 542*b*, for example. Specifically, an opening portion is formed in the insulator 571, the insulator 544, the insulator 580, the insulator 574, the insulator 576, and the insulator 581 illustrated in FIG. 78A and in the insulator 582 and the insulator 586 illustrated in FIG. 77 in the region overlapping with the conductor 542*b*, and the conductor 540*b* is provided inside the opening portion. Note that the insulator 582 and the insulator 586 will be described later.

As illustrated in FIG. 78A, an insulator 541*a* as an insulator having an impurity barrier property may be provided between the conductor 540*a* and the side surface of the opening portion in the region overlapping with the conductor 542*a*. Similarly, an insulator 541*b* as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as the insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like may be used. For the insulator 541*a* and the insulator 541*b*, for example, an insulator such as silicon nitride, aluminum oxide, or silicon nitride oxide may be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 78A, a first insulator in contact with an inner wall of the opening in the insulator 580 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 77, a conductor 610, a conductor 612, and the like serving as wirings may be provided in contact with the upper portion of the conductor 540*a* and the upper portion of the conductor 540*b*. For the conductor 610 and the conductor 612, a conductive material containing tungsten, copper, or aluminum as its main component is preferably used. Furthermore, the conductor may each have a stacked-layer structure and may be a stack of titanium or titanium nitride and the conductive material, for example. Note that the conductors may be formed to be embedded in an opening provided in an insulator.

The structure of the transistor included in the semiconductor device of one embodiment of the present invention is not limited to that of the transistor 500 illustrated in FIG. 77, FIG. 78A, FIG. 78B, and FIG. 79. The structure of the transistor included in the semiconductor device of one embodiment of the present invention may be changed in accordance with circumstances.

Figure 81:
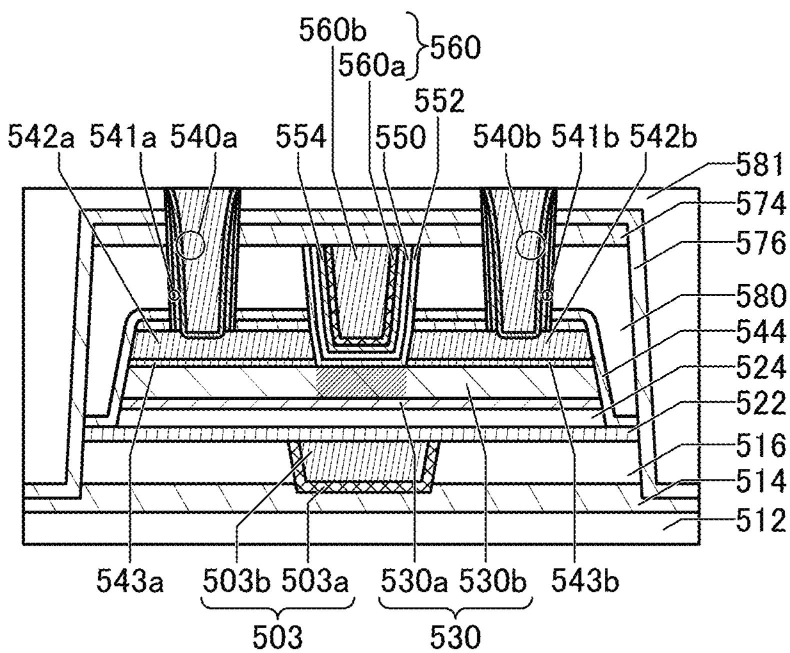
FIG. 81 is a schematic cross-sectional view illustrating a structure example of a transistor.

For example, the transistor 500 illustrated in FIG. 77, FIG. 78A, FIG. 78B, and FIG. 79 may have a structure illustrated in FIG. 81. The transistor in FIG. 81 is different from the transistor 500 illustrated in FIG. 77, FIG. 78A, FIG. 78B, and FIG. 79 in including an oxide 543*a* and an oxide 543*b*. Note that in this specification and the like, the oxide 543*a* and the oxide 543*b* are collectively referred to as an oxide 543. The cross-sectional structure in the channel width direction of the transistor in FIG. 81 can be similar to the cross-sectional structure of the transistor 500 illustrated in FIG. 78B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and the bottom surface of the conductor 542*a*. The oxide 543*b* is preferably in contact with the top surface of the oxide 530*b* and the bottom surface of the conductor 542*b*.

The oxide 543 preferably has a function of inhibiting passage of oxygen. The oxide 543 having a function of inhibiting passage of oxygen is preferably provided between the oxide 530*b* and the conductor 542 functioning as the source electrode or the drain electrode, in which case the electric resistance between the conductor 542 and the oxide 530*b* can be reduced. Such a structure can improve the electrical characteristics, the field-effect mobility, and the reliability of the transistor 500 in some cases.

A metal oxide containing the element M may be used as the oxide 543. The concentration of the element Min the oxide 543 is preferably higher than that in the oxide 530*b*. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that any of the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

An insulator 582 is provided over the insulator 581, and an insulator 586 is provided over the insulator 582.

A substance having a barrier property against oxygen, hydrogen, or the like is preferably used for the insulator 582. Therefore, a material similar to that for the insulator 514 can be used for the insulator 582. For example, a metal oxide such as aluminum oxide, hafnium oxide, or tantalum oxide is preferably used for the insulator 582.

For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 77 and FIG. 79 are described. Note that the capacitor 600 and wirings and/or plugs are provided above the transistor 500 illustrated in FIG. 77 and FIG. 79.

The capacitor 600 includes, for example, a conductor 610, a conductor 620, and an insulator 630.

The conductor 610 is provided over one of the conductor 540*a* and the conductor 540*b*, the conductor 546, and the insulator 586. The conductor 610 has a function of one of the pair of electrodes of the capacitor 600.

A conductor 612 is provided over the other of the conductor 540*a* and the conductor 540*b* and the insulator 586. The conductor 612 has a function of a plug, a wiring, a terminal, or the like that electrically connects the transistor 500 to a circuit element, a wiring, a terminal, and the like that can be provided above the transistor 500. Specifically, for example, the conductor 612 can be the wiring IL or the wiring ILB in the arithmetic circuit 110 and the like described in the above embodiments.

Note that the conductor 612 and the conductor 610 may be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 77; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 serves as a dielectric sandwiched between the pair of electrodes of the capacitor 600.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Alternatively, for the insulator 630, a stacked-layer structure using a material with high dielectric strength, such as silicon oxynitride, and a high permittivity (high-k) material may be used, for example. In the capacitor 600 having such a structure, a sufficient capacitance can be ensured owing to the high permittivity (high-k) insulator, and the dielectric strength can be increased owing to the insulator with high dielectric strength; hence, the electrostatic breakdown of the capacitor 600 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as a leakage current from a transistor and a capacitor might arise because of a thinner gate insulator and a thinner dielectric used in the capacitor. When a high-k material is used as a gate insulator and an insulator functioning as a dielectric used in a capacitor, a gate potential during operation of the transistor can be lowered and capacitance of the capacitor can be ensured while the physical thickness is maintained.

The conductor 620 is provided to overlap with the conductor 610 with the insulator 630 therebetween. The conductor 620 has a function of the other of the pair of electrodes of the capacitor 600. For example, the conductor 620 can be the wiring XLS of the arithmetic circuit 110 and the like described in the above embodiments.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. Moreover, the conductor 620 can be formed using a material that can be used for the conductor 610, for example. Furthermore, the conductor 620 may have a stacked-layer structure of two or more layers, instead of a single-layer structure.

An insulator 640 is provided over the conductor 620 and the insulator 630. As the insulator 640, a film having a barrier property that prevents diffusion of hydrogen or impurities into the region where the transistor 500 is formed is preferably used, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials usable for the insulator 322, for example.

Although the capacitor 600 illustrated in FIG. 77 and FIG. 79 is a planar capacitor, the shape of the capacitor is not limited thereto. For example, the capacitor 600 may be a cylindrical capacitor.

A wiring layer may be provided above the capacitor 600. For example, in FIG. 77, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with an after-mentioned conductor 660.

In the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are preferably formed using an insulator having a barrier property against impurities such as water and hydrogen, for example. Thus, the insulator 411 and the insulator 414 can be formed using any of the materials usable for the insulator 324 or the like, for example.

Like the insulator 326, the insulator 412 and the insulator 413 are preferably formed using an insulator having a relatively low dielectric constant to reduce the parasitic capacitance generated between wirings, for example.

The conductor 612 and the conductor 416 can be provided using materials similar to those for the conductor 328 and the conductor 330, for example.

When a semiconductor device using a transistor including an oxide semiconductor has the structure described in this embodiment, a change in electrical characteristics of the transistor can be inhibited and the reliability can be improved. Alternatively, a semiconductor device using a transistor including an oxide semiconductor can be miniaturized or highly integrated.

Note that this embodiment can be combined with any of the other embodiments in this specification as appropriate.

Embodiment 6

Described in this embodiment is a metal oxide (hereinafter also referred to as an oxide semiconductor) that can be used in the OS transistor described in the above embodiment.

The metal oxide preferably contains at least indium or zinc. It is particularly preferable that indium and zinc be contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classification of the crystal structures of an oxide semiconductor is described using FIG. 82A. FIG. 82A is a diagram showing the classification of crystal structures of an oxide semiconductor, typically IGZO (a metal oxide containing In, Ga, and Zn).

As shown in FIG. 82A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 82A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 82B shows an XRD spectrum, which is obtained by GIXD (Grazing-Incidence XRD) measurement, of a CAAC-IGZO film classified into "Crystalline" (the horizontal axis represents $2\theta$[deg.] and the vertical axis represents intensity in arbitrary unit (a.u.)). Note that a GIXD method is also referred to as a thin film method or a Seemann-Bohlin method. The XRD spectrum that is shown in FIG. 82B and obtained by GIXD measurement is hereinafter simply referred to as an XRD spectrum. The CAAC-IGZO film shown in FIG. 82B has a composition in the neighborhood of In:Ga:Zn=4:2:3 [atomic ratio]. In addition, the thickness of the CAAC-IGZO film shown in FIG. 82B is 500 nm.

As shown in FIG. 82B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 82B, the peak at $2\theta$ of around 310 is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 82C shows a diffraction pattern of A CAAC-IGZO film. FIG. 82C shows a diffraction pattern observed by NBED in which an electron beam is incident in a direction parallel to the substrate. Note that the CAAC-IGZO film shown in FIG. 82C has a composition in the neighborhood of In:Ga:Zn=4:2:3 [atomic ratio]. In the nanobeam electron diffraction method, electron diffraction is performed with a probe diameter of 1 nm.

As shown in FIG. 82C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 82A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Hence, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 7

This embodiment will show examples of a semiconductor wafer where the semiconductor device or the like described in the above embodiment is formed and electronic components incorporating the semiconductor device.

<Semiconductor Wafer>

First, an example of a semiconductor wafer provided with a semiconductor device or the like is described with reference to FIG. 83A.

Figure 83A:
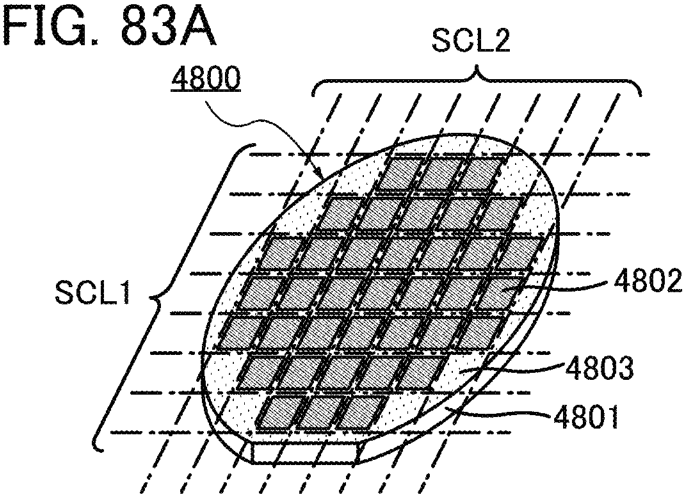
FIG. 83A is a perspective view illustrating an example of a semiconductor wafer.

A semiconductor wafer 4800 illustrated in FIG. 83A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

Figure 83B:
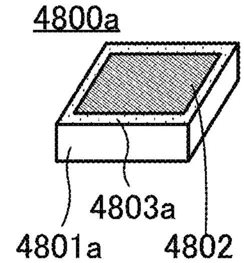
FIG. 83B is a perspective view illustrating an example of a chip.

With the dicing step, a chip 4800*a* illustrated in FIG. 83B can be cut out from the semiconductor wafer 4800. The chip 4800*a* includes a wafer 4801*a*, the circuit portion 4802, and a spacing 4803*a*. Note that it is preferable to make the spacing 4803*a* as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 83A. The element substrate may be a rectangular semiconductor wafer, for example. The shape of the element substrate can be changed as appropriate, depending on a manufacturing process of an element and an apparatus for manufacturing the element.

<Electronic Component>

Figure 83C:
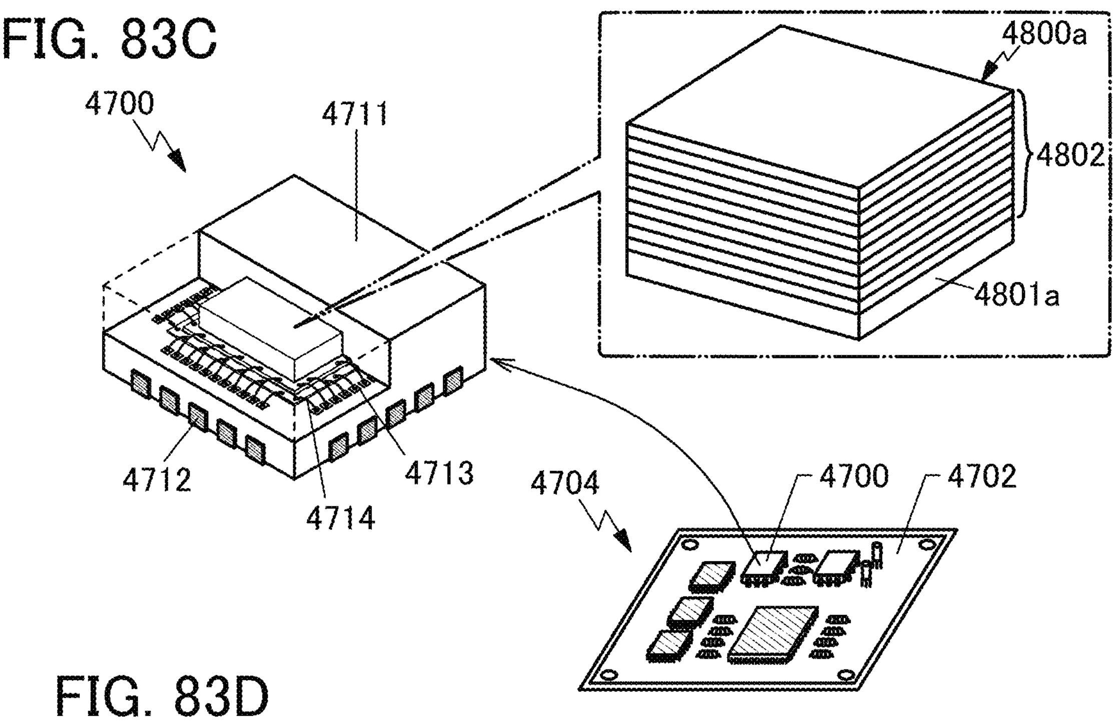
FIG. 83C and FIG. 83D are perspective views illustrating examples of electronic components.

FIG. 83C is a perspective view of an electronic component 4700 and a substrate (a mounting board 4704) on which the electronic component 4700 is mounted. The electronic component 4700 illustrated in FIG. 83C includes the chip 4800*a* in a mold 4711. Note that the chip 4800*a* may have a structure in which the circuit portions 4802 are stacked as illustrated in FIG. 83C. To illustrate the inside of the electronic component 4700, some portions are omitted in FIG. 83C. The electronic component 4700 includes a land 4712 outside the mold 4711. The land 4712 is electrically connected to an electrode pad 4713, and the electrode pad 4713 is electrically connected to the chip 4800*a* through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 83D:
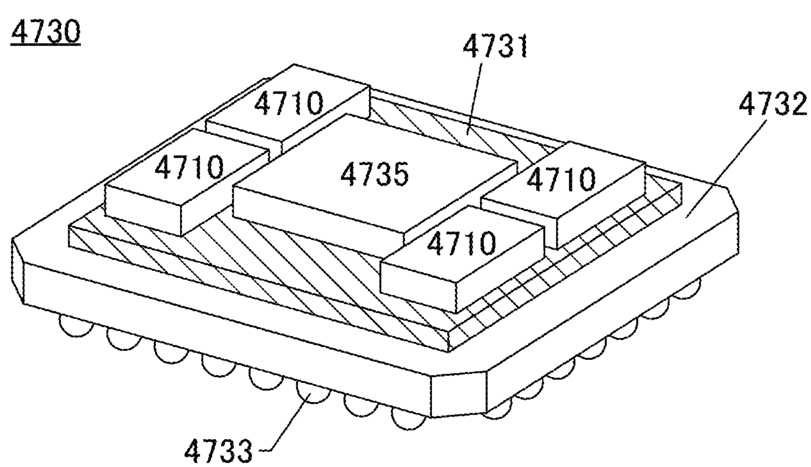

FIG. 83D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor devices described in the above embodiments and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In the case of using a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 83D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 8

Figure 84:
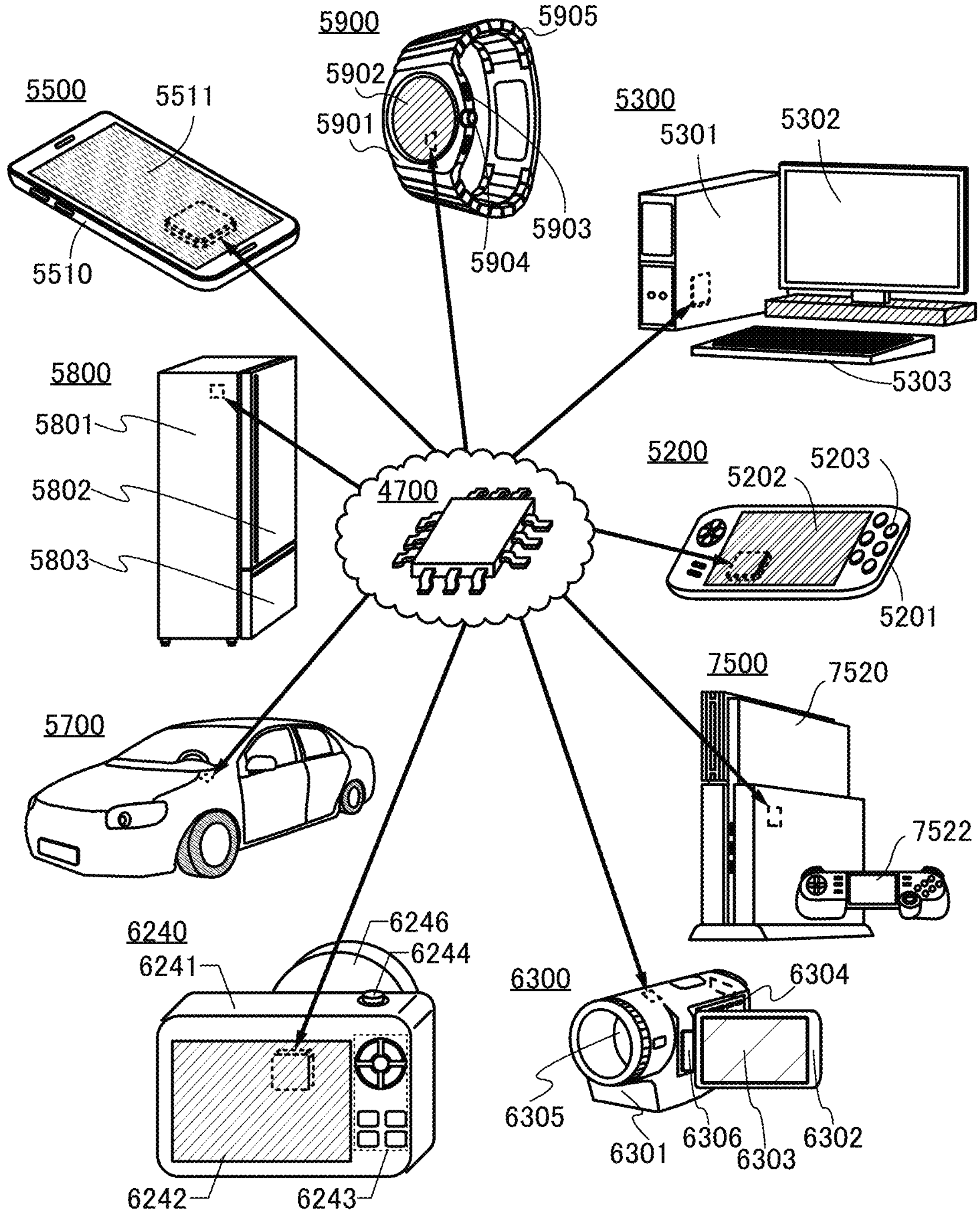
FIG. 84 is a perspective view illustrating examples of electronic devices.

This embodiment will show examples of electronic devices each including the semiconductor device described in the above embodiment. FIG. 84 illustrates electronic devices each including the electronic component 4700 including the semiconductor device.

[Mobile Phone]

An information terminal 5500 illustrated in FIG. 84 is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like. As another example, when an image is obtained by an imaging device (not illustrated) provided in the information terminal 5500, the use of the semiconductor device described in the above embodiment enables convolutional processing on the image. In other words, feature extraction can be performed on the image.

[Wearable Terminal]

FIG. 84 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 84 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500. Examples of the application utilizing artificial intelligence include design-support software, text correction software, and software for automatic menu generation. Furthermore, with the use of the desktop information terminal 5300, novel artificial intelligence can be developed. As another example, when an image is obtained by an imaging device (not illustrated) provided in the information terminal 5500, the use of the semiconductor device described in the above embodiment enables convolutional processing on the image. In other words, feature extraction can be performed on the image.

Note that although FIG. 84 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 84 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as a household appliance in this example, other examples of the household appliance include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machine]

FIG. 84 illustrates a portable game machine 5200 as an example of a game machine. The portable game machine 5200 includes a housing 5201, a display portion 5202, a button 5203, and the like.

FIG. 84 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 84, the controller 7522 can include a display portion that displays a game image, and an input interface besides a button, such as a touch panel, a stick, a rotating knob, or a sliding knob, for example. The shape of the controller 7522 is not limited to that shown in FIG. 84, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

A video of the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Moreover, heat generation from a circuit can be reduced owing to low power consumption; thus, the influence of heat generation on the circuit itself, the peripheral circuit, and the module can be reduced.

Furthermore, when the semiconductor device described in the above embodiment is used for the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 84 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 84 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, display of an image taken by an imaging device provided on the outside of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of a moving vehicle, the moving vehicle is not limited to an automobile. Examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the above embodiment can be used for a camera.

FIG. 84 illustrates a digital camera 6240 as an example of an image capturing device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 is detachable from the housing 6241 for replacement here, the lens 6246 may be integrated with the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Moreover, heat generation from a circuit can be reduced owing to low power consumption; thus, the influence of heat generation on the circuit itself, the peripheral circuit, and the module can be reduced.

Furthermore, when the semiconductor device described in the above embodiment is used in the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like. For example, when an image is obtained by the digital camera 6240, the use of the semiconductor device described in the above embodiment enables convolutional processing on the image. In other words, feature extraction can be performed on the image.

[Video Camera]

The semiconductor device described in the above embodiment can be used for a video camera.

FIG. 84 illustrates a video camera 6300 as an example of an image capturing device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When videos taken by the video camera 6300 are recorded, the videos need to be encoded in accordance with a data recording format. With the use of artificial intelligence, the video camera 6300 can perform the pattern recognition by artificial intelligence in encoding of the videos. By the pattern recognition, difference data on a person, an animal, an object, and the like included in continuously taken image data is calculated, so that the data can be compressed. Moreover, for example, convolutional processing may be performed on the taken image data by using the semiconductor device described in the above embodiment.

[Expansion Device for PC]

The semiconductor device described in the above embodiment can be used in a calculator such as a PC (Personal Computer) and an expansion device for an information terminal.

Figure 85A:
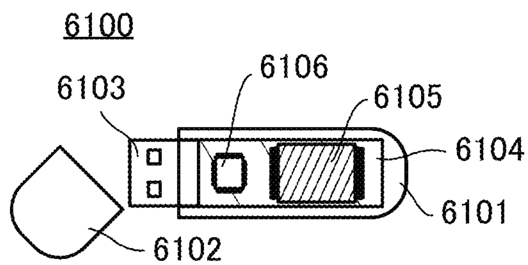
FIG. 85A to FIG. 85C are perspective views illustrating examples of electronic devices.

FIG. 85A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 85A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for a PC and the like can increase the arithmetic processing performance of the PC. Thus, a PC with insufficient processing performance can perform arithmetic operation of artificial intelligence, moving image processing, and the like.

[Broadcasting System]

The semiconductor device described in the above embodiment can be used for a broadcasting system.

Figure 85B:
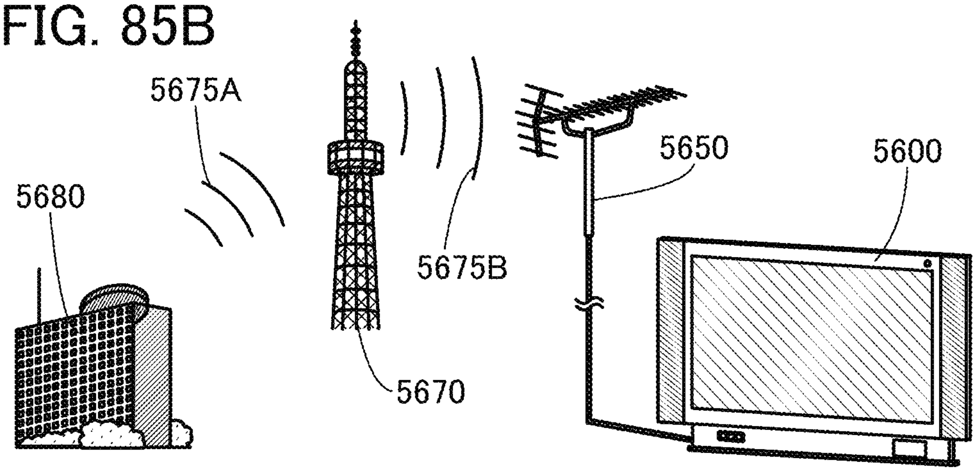

FIG. 85B schematically illustrates data transmission in a broadcasting system. Specifically, FIG. 85B illustrates a path in which a radio wave (a broadcasting signal) transmitted from a broadcast station 5680 reaches a television receiver (TV) 5600 of each household. The TV 5600 includes a receiving device (not illustrated), and the broadcasting signal received by an antenna 5650 is transmitted to the TV 5600 through the receiving device.

Although a UHF (Ultra High Frequency) antenna is illustrated as the antenna 5650 in FIG. 85B, a BS/110° CS antenna, a CS antenna, or the like can also be used as the antenna 5650.

A radio wave 5675A and a radio wave 5675B are broadcasting signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 85B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 85C:
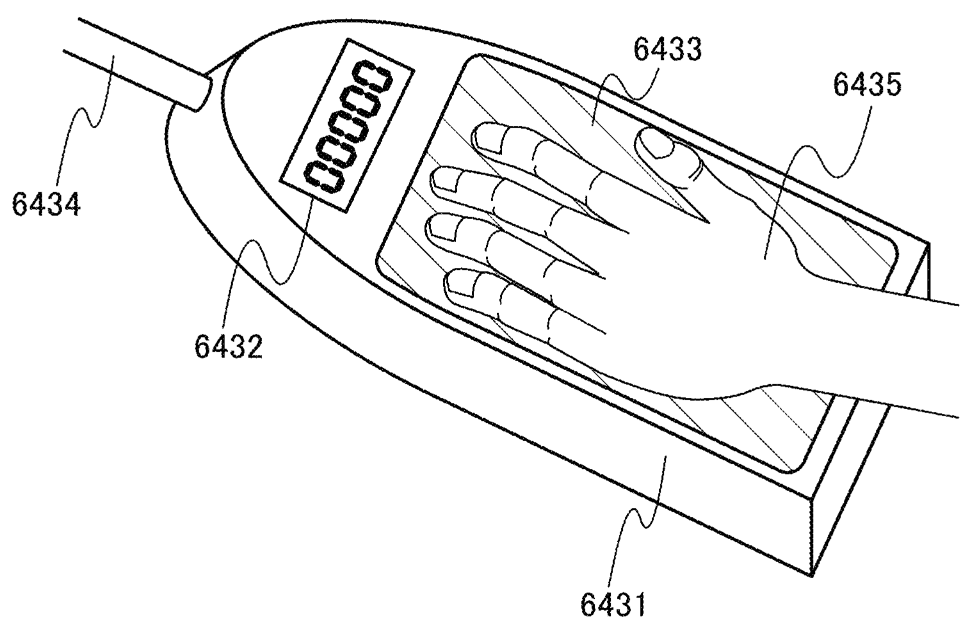

FIG. 85C illustrates a palm print authentication device including a housing 6431, a display portion 6432, a palm print reading portion 6433, and a wiring 6434.

In FIG. 85C, a palm print of a hand 6435 is obtained using the palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

Note that this embodiment can be combined with any of the other embodiments in this specification as appropriate.

REFERENCE NUMERALS

ILD: circuit, WLD: circuit, XLD: circuit, AFP: circuit, ACTF: circuit, MP: circuit, MC: circuit, MCr: circuit, M1: transistor, M1-2b: transistor, M1-2br: transistor, M1-3b: transistor, M1-3br: transistor, M1c: transistor, M1cr: transistor, M1p: transistor, M1pr: transistor, M1r: transistor, M1s: transistor, M1sr: transistor, M1x: transistor, M1xr: transistor, M1x-2b: transistor, M1x-2br: transistor, M1x-3b: transistor, M1x-3br: transistor, M1-2x: transistor, M1-2xr: transistor, M1-3x: transistor, M1-3xr: transistor, M1-2x-2b: transistor, M1-2x-2br: transistor, M1-3x-2b: transistor, M1-3x-2br: transistor, M1-2x-3b: transistor, M1-2x-3br: transistor, M1-3x-3b: transistor, M1-3x-3br: transistor, M2: transistor, M2r: transistor, M2s: transistor, M2sr: transistor, M2-2b: transistor, M2-2br: transistor, M2-3b: transistor, M2-3br: transistor, M3: transistor, M3p: transistor, M3pr: transistor, M3r: transistor, M3s: transistor, M3sr: transistor, M3x: transistor, M3-2b: transistor, M3-2br: transistor, M3-2x: transistor, M3-2xr: transistor, M3-3b: transistor, M3-3br: transistor, M3-3x: transistor, M3-3xr: transistor, M4: transistor, M4p: transistor, M4pr: transistor, M4r: transistor, M4s: transistor, M4sr: transistor, M4-2b: transistor, M4-2br: transistor, M4-2x: transistor, M4-2xr: transistor, M4-3b: transistor, M4-3br: transistor, M4-3x: transistor, M4-3xr: transistor, M5: transistor, M5r: transistor, M6: transistor, M6r: transistor, M6s: transistor, M6sr: transistor, M7: transistor, M7r: transistor, M7s: transistor, M7sr: transistor, M8: transistor, M8r: transistor, M9: transistor, M9r: transistor, M10: transistor, M10r: transistor, M11: transistor, M12: transistor, M12r: transistor, M13: transistor, M13r: transistor, M20: transistor, M20r: transistor, MZ: transistor, CC: capacitor, CE: capacitor, CEB: capacitor, C1: capacitor, C1r: capacitor, C1s: capacitor, C1sr: capacitor, C2: capacitor, C2r: capacitor, C3: capacitor, C3r: capacitor, C4: capacitor, n1: node, n1r: node, n2: node, n2r: node, n3: node, n3r: node, n4: node, n4r: node, ina: node, inb: node, outa: node, outb: node, S01a: switch, S01b: switch, S02a: switch, S02b: switch, S03: switch, SWI: switch, SWIB: switch, SWO: switch, SWOB: switch, SWL: switch, SWLB: switch, SWH: switch, SWHB: switch, SWC1: switch, SWC2: switch, SWC3: switch, AS3: analog switch, AS3r: analog switch, AS4: analog switch, AS4r: analog switch, TW[1]: switching circuit, TW[j]: switching circuit, TW[n]: switching circuit, HC: circuit, HCr: circuit, HCs: circuit, HCsr: circuit, HC-2b: circuit, HC-2br: circuit, HC-3b: circuit, HC-3br: circuit, IV1: inverter circuit, IV1r: inverter circuit, IV2: inverter circuit, IV2r: inverter circuit, INV3: inverter circuit, IVR: inverter loop circuit, IVRr: inverter loop circuit, ISC: current source circuit, ISC1: constant current source circuit, ISC2: constant current source circuit, ISC3: constant current source circuit, HCS: circuit, HCS-2b: circuit, HCS-3b: circuit, HCSr: circuit, HCS-2br: circuit, HCS-3br: circuit, TRF: converter circuit, ADCa: analog-to-digital converter circuit, ADCb: analog-to-digital converter circuit, BS: circuit, BSr: circuit, BMC: circuit, BMCr: circuit, LC: load circuit, LCr: load circuit, TSa: terminal, TSaB: terminal, TSb: terminal, TSb1: terminal, TSb2: terminal, TSb3: terminal, TSbB: terminal, TSbB1: terminal, TSbB2: terminal, TSbB3: terminal, TSc: terminal, TScB: terminal, VinT: terminal, VoutT: terminal, VrefT: terminal, IL: wiring, IL[1]: wiring, IL[j]: wiring, IL[n]: wiring, ILB: wiring, ILB[1]: wiring, ILB[j]: wiring, ILB[n]: wiring, OL: wiring, OL[1]: wiring, OL[j]: wiring, OL[n]: wiring, OLB: wiring, OLB[1]: wiring, OLB[j]: wiring, OLB[n]: wiring, WLS[1]: wiring, WLS[i]: wiring, WLS[m]: wiring, XL: wiring, XLS[1]: wiring, XLS[i]: wiring, XLS[m]: wiring, WLBS: wiring, WXBS: wiring, VAL: wiring, VA: wiring, VAr: wiring, VB: wiring, VSO: wiring, VCN: wiring, VCN2: wiring, VE: wiring, VEr: wiring, VEm: wiring, VEmr: wiring, VF: wiring, VFr: wiring, VrefL: wiring, VL: wiring, VLr: wiring, VLs: wiring, VLsr: wiring, VLm: wiring, VEH: wiring, S1L: wiring, S2L: wiring, Vref1L: wiring, Vref2L: wiring, WL: wiring, W1L: wiring, W2L: wiring, WL2b: wiring, WL3b: wiring, WXL: wiring, WX1L: wiring, WX1L2b: wiring, WX1L3b: wiring, WX1LB: wiring, X1: wiring, X1L: wiring, X1L2b: wiring, X1L2x: wiring, X1L3b: wiring, X1L3x: wiring, X2L: wiring, X2L2b: wiring, X2L2x: wiring, X2L3b: wiring, X2L3x: wiring, X2LB: wiring, CVL: wiring, SCL1: scribe line, SCL2: scribe line, 100: neural network, 110: arithmetic circuit, 120: arithmetic circuit, 130: arithmetic circuit, 140: arithmetic circuit, 150: arithmetic circuit, 160: arithmetic circuit, 170: arithmetic circuit, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411:

insulator, 412: insulator, 413: insulator, 414: insulator, 416: conductor, 500: transistor, 503: conductor, 503*a*: conductor, 503*b*: conductor, 510: insulator, 512: insulator, 514: insulator, 516: insulator, 518: conductor, 522: insulator, 524: insulator, 530: oxide, 530*a*: oxide, 530*b*: oxide, 530*ba*: region, 530*bb*: region, 530*bc*: region, 540*a*: conductor, 540*b*: conductor, 541*a*: insulator, 541*b*: insulator, 542*a*: conductor, 542*b*: conductor, 543*a*: oxide, 543*b*: oxide, 544: insulator, 546: conductor, 550: insulator, 550*a*: insulator, 550*b*: insulator, 552: insulator, 554: insulator, 560: conductor, 560*a*: conductor, 560*b*: conductor, 571*a*: insulator, 571*b*: insulator, 574: insulator, 576: insulator, 580: insulator, 581: insulator, 582: insulator, 586: insulator, 600: capacitor, 610: conductor, 612: conductor, 620: conductor, 630: insulator, 640: insulator, 650: insulator, 660: conductor, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7500: stationary game machine, 7520: main body, 7522: controller

The invention claimed is:

1. A semiconductor device comprising:

a first circuit and a second circuit, wherein the first circuit comprises a first holding portion and a first driving transistor, wherein the second circuit comprises a second holding portion and a second driving transistor, wherein the first circuit is electrically connected to a first input wiring, a second input wiring, a first wiring, and a second wiring, wherein the second circuit is electrically connected to the first input wiring, the second input wiring, the first wiring, and the second wiring, wherein the first holding portion is configured to hold a first potential corresponding to a first current flowing between a source and a drain of the first driving transistor from the first wiring, wherein the second holding portion is configured to hold a second potential corresponding to a second current flowing between a source and a drain of the second driving transistor from the second wiring, wherein the first circuit is configured to output the first current to the first wiring when a first-level potential is input to the first input wiring and a second-level potential is input to the second input wiring, wherein the first circuit is configured to output the first current to the second wiring when the second-level potential is input to the first input wiring and the first-level potential is input to the second input wiring, wherein the first circuit is not configured to output the first current to the first wiring and the second wiring when the second-level potential is input to the first input wiring and the second-level potential is input to the second input wiring, wherein the second circuit is configured to output the second current to the second wiring when the first-level potential is input to the first input wiring and the second-level potential is input to the second input wiring, wherein the second circuit is configured to output the second current to the first wiring when the second-level potential is input to the first input wiring and the first-level potential is input to the second input wiring, wherein the second circuit is not configured to output the second current to the first wiring and the second wiring when the second-level potential is input to the first input wiring and the second-level potential is input to the second input wiring, wherein a current amount of each of the first current and the second current corresponds to a filter value included in a filter used for convolutional processing, and wherein the first-level potential and the second-level potential that are input to the first input wiring and the second input wiring are determined in accordance with image data subjected to the convolutional processing.

2. A semiconductor device comprising:

a first circuit and a second circuit, wherein the first circuit comprises a first holding portion and a first driving transistor, wherein the second circuit comprises a second holding portion and a second driving transistor, wherein the first circuit is electrically connected to a first input wiring, a second input wiring, a first wiring, and a second wiring, wherein the second circuit is electrically connected to the first input wiring, the second input wiring, the first wiring, and the second wiring, wherein the first holding portion is configured to hold a first potential corresponding to a first current flowing between a source and a drain of the first driving transistor from the first wiring, wherein the second holding portion has is configured to hold a second potential corresponding to a second current flowing between a source and a drain of the second driving transistor from the second wiring, wherein the first driving transistor is configured to make the first current corresponding to the held first potential flow between the source and the drain of the first driving transistor, wherein the second driving transistor is configured to make the second current corresponding to the held second potential flow between the source and the drain of the second driving transistor, wherein the first circuit is configured to output the first current to the first wiring in a first period when a first-level potential is input to the first input wiring and a second-level potential is input to the second input wiring, wherein the first circuit is configured to output the first current to the second wiring in the first period when the second-level potential is input to the first input wiring and the first-level potential is input to the second input wiring, wherein the first circuit is not configured to output the first current to the first wiring and the second wiring in the first period when the second-level potential is input to the first input wiring and the second-level potential is input to the second input wiring, wherein the second circuit is configured to output the second current to the second wiring in the first period when the first-level potential is input to the first input wiring and the second-level potential is input to the second input wiring, wherein the second circuit is configured to output the second current to the first wiring in the first period when the second-level potential is input to the first input wiring and the first-level potential is input to the second input wiring, wherein the second circuit is not configured to output the second current to the first wiring and the second wiring in the first period when the second-level potential is input to the first input wiring and the second-level potential is input to the second input wiring, wherein a current amount of each of the first current and the second current corresponds to a filter value included in a filter used for convolutional processing, and wherein the first-level potential and the second-level potential that are input to the first input wiring and the second input wiring and a length of the first period are determined in accordance with image data subjected to the convolutional processing.

3. The semiconductor device according to claim 2, wherein the first period comprises a second period and a third period, wherein the first input wiring is configured to supply the first-level potential or the second-level potential to both the first circuit and the second circuit in the second period, wherein the second input wiring is configured to supply the first-level potential or the second-level potential to both the first circuit and the second circuit in the second period, wherein the first input wiring is configured to supply the first-level potential or the second-level potential to both the first circuit and the second circuit in the third period, wherein the second input wiring is configured to output the first-level potential or the second-level potential to both the first circuit and the second circuit in the third period, and wherein a length of the third period is greater than or equal to 1.8 times and less than or equal to 2.2 times a length of the second period.

4. The semiconductor device according to claim 1, wherein the first circuit comprises a first transistor, a second transistor, a third transistor, and a first capacitor, wherein the second circuit comprises a fourth transistor, a fifth transistor, a sixth transistor, and a second capacitor, wherein the first holding portion comprises the first transistor and the first capacitor, wherein the second holding portion comprises the fourth transistor and the second capacitor, wherein a first terminal of the first transistor is electrically connected to a first terminal of the first capacitor and a gate of the first driving transistor, wherein a second terminal of the first transistor is electrically connected to the first wiring, wherein a first terminal of the first driving transistor is electrically connected to a first terminal of the second transistor and a first terminal of the third transistor, wherein a second terminal of the second transistor is electrically connected to the first wiring, wherein a gate of the second transistor is electrically connected to the first input wiring, wherein a second terminal of the third transistor is electrically connected to the second wiring, wherein a gate of the third transistor is electrically connected to the second input wiring, wherein a first terminal of the fourth transistor is electrically connected to a first terminal of the second capacitor and a gate of the second driving transistor, wherein a second terminal of the fourth transistor is electrically connected to the second wiring, wherein a first terminal of the second driving transistor is electrically connected to a first terminal of the fifth transistor and a first terminal of the sixth transistor, wherein a second terminal of the fifth transistor is electrically connected to the second wiring, wherein a gate of the fifth transistor is electrically connected to the first input wiring, wherein a second terminal of the sixth transistor is electrically connected to the first wiring, and wherein a gate of the sixth transistor is electrically connected to the second input wiring.

5. The semiconductor device according to claim 4, wherein the first circuit comprises a seventh transistor, wherein the second circuit comprises an eighth transistor, wherein a first terminal of the seventh transistor is electrically connected to the first terminal of the first driving transistor, the first terminal of the second transistor, and the first terminal of the third transistor, wherein a second terminal of the seventh transistor is electrically connected to one of the first terminal and the second terminal of the first transistor, wherein a first terminal of the eighth transistor is electrically connected to the first terminal of the second driving transistor, the first terminal of the fifth transistor, and the first terminal of the sixth transistor, wherein a second terminal of the eighth transistor is electrically connected to one of the first terminal and the second terminal of the fourth transistor, and wherein a gate of the first transistor is electrically connected to a gate of the fourth transistor, a gate of the seventh transistor, and a gate of the eighth transistor.

6. The semiconductor device according to claim 1, wherein the first circuit comprises a first transistor, a second transistor, a third transistor, and a first capacitor, wherein the second circuit comprises a fourth transistor, a fifth transistor, a sixth transistor, and a second capacitor, wherein the first holding portion comprises the first transistor and the first capacitor, wherein the second holding portion comprises the fourth transistor and the second capacitor, wherein a first terminal of the first transistor is electrically connected to a first terminal of the first capacitor and a gate of the first driving transistor, wherein a first terminal of the first driving transistor is electrically connected to a second terminal of the first transistor, a first terminal of the second transistor, and a first terminal of the third transistor, wherein a second terminal of the second transistor is electrically connected to the first wiring, wherein a gate of the second transistor is electrically connected to the first input wiring, wherein a second terminal of the third transistor is electrically connected to the second wiring, wherein a gate of the third transistor is electrically connected to the second input wiring, wherein a first terminal of the fourth transistor is electrically connected to a first terminal of the second capacitor and a gate of the second driving transistor, wherein a first terminal of the second driving transistor is electrically connected to a second terminal of the fourth transistor, a first terminal of the fifth transistor, and a first terminal of the sixth transistor, wherein a second terminal of the fifth transistor is electrically connected to the second wiring, wherein a gate of the fifth transistor is electrically connected to the first input wiring, wherein a second terminal of the sixth transistor is electrically connected to the first wiring, and wherein a gate of the sixth transistor is electrically connected to the second input wiring.

7. The semiconductor device according to claim 1, wherein the first circuit comprises a third holding portion and a third driving transistor, wherein the second circuit comprises a fourth holding portion and a fourth driving transistor, wherein the first circuit is electrically connected to a third wiring, wherein the second circuit is electrically connected to the third wiring, wherein the third holding portion is configured to hold a third potential corresponding to a third current flowing between a source and a drain of the third driving transistor from the first wiring, wherein the fourth holding portion is configured to hold a fourth potential corresponding to a fourth current flowing between a source and a drain of the fourth driving transistor from the second wiring, wherein the third driving transistor is configured to make the third current corresponding to the held third potential flow between the source and the drain of the third driving transistor, wherein the fourth driving transistor is configured to make the fourth current corresponding to the held fourth potential flow between the source and the drain of the fourth driving transistor, and wherein the semiconductor device is configured to switch the first current flowing through one of the first wiring and the second wiring to the third current and switch the second current flowing through the other of the first wiring and the second wiring to the fourth current, in accordance with a signal input to the third wiring.

8. The semiconductor device according to claim 1, further comprising:

a third circuit, a fourth circuit, and a fifth circuit, wherein the third circuit is configured to supply the first current corresponding to the filter value, to the first circuit through the first wiring, wherein the third circuit is configured to supply the second current corresponding to the filter value, to the second circuit through the second wiring, wherein the fourth circuit is configured to input the first-level potential or the second-level potential to the first input wiring in accordance with the image data, wherein the fourth circuit is configured to input the first-level potential or the second-level potential to the second input wiring in accordance with the image data, and wherein the fifth circuit is configured to compare currents flowing from the first wiring and the second wiring, and output a potential corresponding to a product of the filter value and the image data from an output terminal of the fifth circuit.

9. An electronic device comprising:

the semiconductor device according to claim 1, and a housing, wherein image feature extraction is performed by the convolutional processing.

* * * * *